US009748510B2

(12) United States Patent
Ito et al.

(10) Patent No.: US 9,748,510 B2
(45) Date of Patent: Aug. 29, 2017

(54) ORGANIC LIGHT-EMITTING DEVICE

(71) Applicant: Samsung Display Co., Ltd., Yongin, Gyeonggi-do (KR)

(72) Inventors: Naoyuki Ito, Yongin (KR); Seul-Ong Kim, Yongin (KR); Youn-Sun Kim, Yongin (KR); Dong-Woo Shin, Yongin (KR); Jung-Sub Lee, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 497 days.

(21) Appl. No.: 14/503,054

(22) Filed: Sep. 30, 2014

(65) Prior Publication Data

US 2015/0318488 A1 Nov. 5, 2015

(30) Foreign Application Priority Data

May 2, 2014 (KR) ........................ 10-2014-0053619

(51) Int. Cl.
*H01L 51/00* (2006.01)
*H01L 51/50* (2006.01)

(52) U.S. Cl.
CPC ...... *H01L 51/5096* (2013.01); *H01L 51/0052* (2013.01); *H01L 51/0061* (2013.01); *H01L 51/0071* (2013.01); *H01L 51/0073* (2013.01); *H01L 51/0074* (2013.01); *H01L 51/0094* (2013.01); *H01L 51/508* (2013.01); *H01L 51/5076* (2013.01); *H01L 51/006* (2013.01); *H01L 51/0054* (2013.01); *H01L 51/0058* (2013.01); *H01L 51/0059* (2013.01); *H01L 51/0067* (2013.01); *H01L 51/0072* (2013.01); *H01L 51/0081* (2013.01); *H01L 51/0085* (2013.01); *H01L 51/5016* (2013.01); *H01L 51/5056* (2013.01); *H01L 51/5072* (2013.01)

(58) Field of Classification Search
CPC ............. H01L 51/5056; H01L 51/5072; H01L 51/5016; H01L 51/508; H01L 51/5076; H01L 51/5096; H01L 51/0052; H01L 51/0073; H01L 51/0074; H01L 51/0061; H01L 51/0094; H01L 51/0071; H01L 51/0072; H01L 51/0067; H01L 51/0058; H01L 51/0054; H01L 51/0059; H01L 51/006; H01L 51/0081; H01L 51/0085
See application file for complete search history.

(56) References Cited

U.S. PATENT DOCUMENTS

| | | | |
|---|---|---|---|
| 2007/0054151 | A1 | 3/2007 | Iwakuma et al. |
| 2011/0037062 | A1 | 2/2011 | Fukumatsu et al. |
| 2011/0260138 | A1 | 10/2011 | Xia et al. |
| 2012/0153268 | A1 | 6/2012 | Kawamura et al. |
| 2013/0001523 | A1 | 1/2013 | Chun et al. |

FOREIGN PATENT DOCUMENTS

| | | | | |
|---|---|---|---|---|
| KR | 10-2011-0007124 A | | 1/2001 | |
| KR | 10-2013-0010056 A | | 1/2013 | |
| KR | 10-2013-0100236 A | | 9/2013 | |
| WO | WO 2007/029403 A1 | | 3/2007 | |
| WO | WO 2011/086941 A1 | | 7/2011 | |
| WO | WO 2012/176818 | * | 12/2012 | ............. H01L 51/50 |
| WO | WO 2012/176818 A1 | | 12/2012 | |

* cited by examiner

*Primary Examiner* — Erich A Lesser
(74) *Attorney, Agent, or Firm* — Lewis Roca Rothgerber Christie LLP

(57) ABSTRACT

An organic light-emitting device includes a first electrode, a second electrode facing the first electrode, and an organic layer disposed between the first electrode and the second electrode and including an emission layer; an electron transport region disposed between the second electrode and the emission layer; a mixed layer disposed between the emission layer and the electron transport region and including a first material and a second material; wherein the first material and the second material are pyrrolidine-based compounds; and triplet energy $Eg_{T1}$ of at least one selected from the first material and the second material is 2.2 eV or greater.

20 Claims, 1 Drawing Sheet

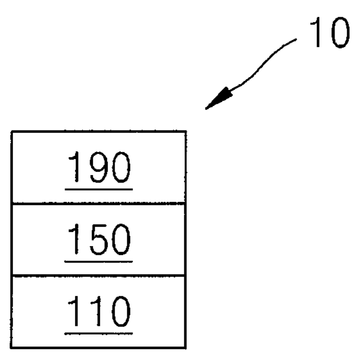
10
190
150
110

ORGANIC LIGHT-EMITTING DEVICE

CROSS-REFERENCE TO RELATED APPLICATION

This application claims priority to and the benefit of Korean Patent Application No. 10-2014-0053619, filed on May 2, 2014, in the Korean Intellectual Property Office, the disclosure of which is incorporated herein in its entirety by reference.

BACKGROUND

1. Field

One or more embodiments of the present invention relate to organic light-emitting devices.

2. Description of the Related Art

Organic light emitting devices are self-emission devices that exhibit wide viewing angles; high contrast ratios; short response time; excellent brightness, driving voltage, and response speed characteristics; and provide multi-coloration.

The organic light-emitting device may have a structure in which a first electrode is formed on a substrate and a hole transport region, an emission layer, an electron transport layer, and a second electrode are sequentially formed on the first electrode.

Holes injected from the first electrode move to the emission layer via the hole transport region and electrons injected from the second electrode move to the emission layer via the electron transport region. Carriers such as holes and electrons are recombined in the emission layer to produce excitons. These excitons change from an excited state to a ground state, thereby generating light.

SUMMARY

Aspects according to one or more embodiments of the present invention are directed toward organic light-emitting devices.

Additional aspects will be set forth in part in the description which follows and, in part, will be apparent from the description, or may be learned by practice of the presented embodiments.

According to one or more embodiments of the present invention, an organic light-emitting device includes a first electrode; a second electrode facing the first electrode; and an organic layer between the first electrode and the second electrode, wherein the organic layer includes an emission layer; an electron transport region between the second electrode and the emission layer; a mixed layer between the emission layer and the electron transport region and including a first material and a second material, wherein the first material and the second material are pyrrolidine-based compounds; and a triplet energy $Eg_{T1}$ of at least one of the first material or the second material is 2.2 eV or greater.

BRIEF DESCRIPTION OF THE DRAWINGS

These and/or other aspects will become apparent and more readily appreciated from the following description of the embodiments, taken in conjunction with the accompanying drawing in which:

The drawing schematically illustrates a structure of an organic light-emitting device according to an embodiment of the present invention.

DETAILED DESCRIPTION

Reference will now be made in more detail to embodiments, examples of which are illustrated in the accompanying drawing, wherein like reference numerals refer to like elements throughout. In this regard, the present embodiments may have different forms and should not be construed as being limited to the descriptions set forth herein. Accordingly, the embodiments are merely described below, by referring to the drawing, to explain aspects of the present description. As used herein, the term "and/or" includes any and all combinations of one or more of the associated listed items. Expressions such as "at least one selected from," when preceding a list of elements, modify the entire list of elements and do not modify the individual elements of the list.

As the invention allows for various changes and numerous embodiments, exemplary embodiments will be illustrated in the drawing and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of the related art are omitted when it is deemed that they may unnecessarily obscure the essence of the invention.

The terms used in the present specification are merely used to describe exemplary embodiments, and are not intended to limit the scope of the the present invention. An expression used in the singular encompasses the expression of the plural, unless it has a clearly different meaning in the context. In the present specification, it is to be understood that the terms such as "including", "having", or "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawing may be exaggerated for convenience of explanation. In other words, since sizes and thicknesses of components in the drawing are arbitrarily illustrated for convenience of explanation, the following embodiments are not limited thereto.

As used herein, the term "organic layer" refers to all single and/or multiple layers disposed between the first electrode and the second electrode in the organic light-emitting device. Materials included in the "organic layer" are not limited to organic materials.

As used herein, the term "pyrrolidine-based compound" refers to all organic compounds including at least one pyrrolidine moiety. The pyrrolidine moiety may be substituted with at least one substituent.

As used herein, the term "electron transporting compound" refers to all compounds having electron mobility of about $1.0\times10^{-7}$ $cm^2/(V\cdot s)$ to about $1.0\times10^{-3}$ $cm^2/(V\cdot s)$. The electron transporting compound may have electron mobility of about $1.0\times10^{-5}$ $cm^2/(V\cdot s)$ or greater.

As used herein, the term "hole transporting compound" refers to all compounds having hole mobility of about $1.0\times10^{-7}$ $cm^2/(V\cdot s)$ to about $1.0\times10^{-3}$ $cm^2/(V\cdot s)$. The hole transport compound may have hole mobility of about $1.0\times10^{-5}$ $cm^2/(V\cdot s)$ or greater.

Although a method of measuring the hole mobility is not limited, a time of flight method may be used (i.e., utilized). The time of flight method includes measuring time properties (transient response time) of transient current that occur due to irradiating light having a wavelength within the absorption wavelength region of the organic layer from an electrode/organic layer/electrode structure, and calculating hole mobility from the formula below.

$$\text{Hole mobility}=(\text{thickness of the organic layer})^2/(\text{transient response time}\cdot\text{applied voltage})$$

The organic light-emitting device includes a first electrode, a second electrode disposed opposite to (facing) the first electrode, and an organic layer that is disposed between the first electrode and the second electrode and includes an emission layer; an electron transport region disposed between the second electrode and the emission layer; a mixed layer disposed between the emission layer and the electron transport region and including a first material and a second material; wherein the first material and the second material are pyrrolidine-based compounds; and triplet energy $Eg_{T1}$ of at least one selected from the first material and the second material is 2.2 eV or greater.

The first material and the second material have different electron transporting capabilities and hole transporting capabilities. A material having relatively greater hole transporting capability among the first material and the second material may play a role in blocking the movement of electrons from the second electrode to the emission layer. A material having relatively greater electron transporting capability among the first material and the second material may play a role in moving electrons from the second electrode to the emission layer, such that a current may flow between the first electrode and the second electrode.

In the organic light-emitting device, some electrons moving from the second electrode to the emission layer may be blocked, such that the number of holes moving from the first electrode to the emission layer and the number of electrons moving from the second electrode to the emission layer may achieve balance. Accordingly, the organic light-emitting device may decrease the number of (surplus) electrons and/or holes that failed to form excitons in the emission layer, and thus, the organic light-emitting device may have long lifespan properties.

Triplet energy of at least one material selected from the first material and the second material may be higher than triplet energy of a host of the emission layer and thus, triplet exciton state in the emission layer may be trapped in the emission layer. When at least one material of the first material and the second material has triplet energy $Eg_{T1}$ of 2.2 eV or greater, the triplet exciton state in the emission layer may be trapped inside the emission layer more effectively.

Triplet energy of the first material and the second material may be 4.0 eV or lower, but it is not limited thereto. Triplet energy of the first material and the second material may be 3.5 eV or lower, but it is not limited thereto.

For example, any one of the first material and the second material may be selected from an electron transporting compound and a hole transporting compound, but it is not limited thereto. The first material may be an electron transporting compound. The second material may be an electron transporting compound. The first material may be a hole transporting compound. The second material may be a hole transporting compound.

In another embodiment, the first material and the second material may be selected from the electron transporting compound and the hole transporting compound, but they are not limited thereto. The first material may be a hole transporting compound and the second material may be an electron transporting compound. The first material may be an electron transporting compound and the second material may be a hole transporting compound.

For example, the electron transport region may include an electron transport layer, and the emission layer and the electron transport layer may be adjacent to each other (for example, in a structure of the emission layer/the mixed layer/the electron transport layer), but it is not limited thereto.

For example, the first material and the second material may be selected from pyrrolidine-based compounds represented by any one of Formulae 1 and 2, but they are not limited thereto:

Formula 1

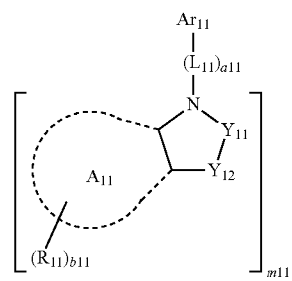

Formula 2

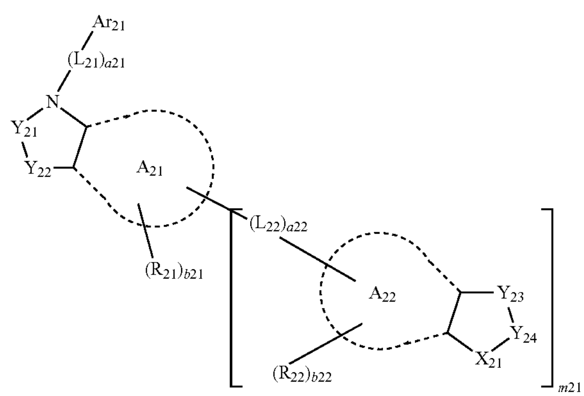

In Formulae 1 and 2, each of two neighboring groups $Y_{11}$ and $Y_{12}$, $Y_{21}$ and $Y_{22}$, and $Y_{23}$ and $Y_{24}$ may be independently carbon atoms that are located at * in Formulae 9-1 to 9-6:

Formula 9-1

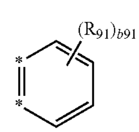

-continued

Formula 9-2

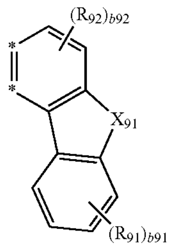

Formula 9-3>

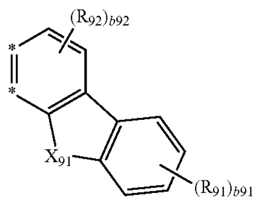

Formula 9-4

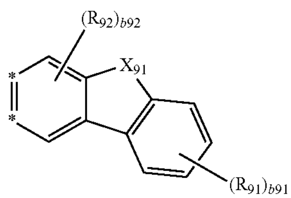

Formula 9-5

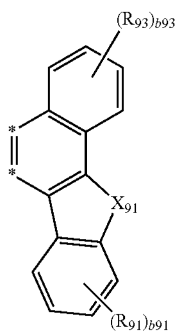

Formula 9-6

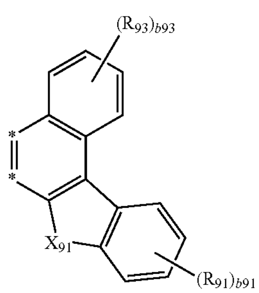

In Formulae 1, 2 and 9-1 to 9-6

$X_{21}$ and $X_{91}$ may be each independently selected from an oxygen atom, a sulfur atom, $N(Q_1)$, $C(Q_1)(Q_2)$, and $Si(Q_1)(Q_2)$;

$A_{11}$, $A_{21}$, and $A_{22}$ may be each independently selected from benzene, naphthalene, dibenzofuran, dibenzothiopene, carbazole, fluorene, benzofuran, benzothiopene, indole, and indene;

$L_{11}$, $L_{21}$ and $L_{22}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic hetero-condensed polycyclic group;

a11, a21 and a22 may be each independently 0, 1, 2, or 3;

$Ar_{11}$, $Ar_{21}$, $R_{11}$, $R_{21}$, $R_{22}$, and $R_{91}$ to $R_{93}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted a monovalent non-aromatic condensed polycyclic group, and a substituted or unsubstituted monovalent non-aromatic hetero-condensed polycyclic group;

b11, b21, b22, b91, and b93 may be each independently 1, 2, 3, or 4;

b92 may be 1 or 2;

m11 and m21 may be each independently 1, 2, or 3;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, and the substituted monovalent non-aromatic hetero-condensed polycyclic group may be selected from:

a deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group, —N($Q_{11}$)($Q_{12}$), —Si($Q_{13}$)($Q_{14}$)($Q_{15}$), and -B($Q_{16}$)($Q_{17}$);

a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryloxy group; a $C_6$-$C_{60}$ arythio group; a $C_1$-$C_{60}$ heteroaryl group; a monovalent non-aromatic condensed polycyclic group; and a monovalent non-aromatic hetero-condensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group, —N($Q_{21}$)($Q_{22}$), —Si($Q_{23}$)($Q_{24}$)($Q_{25}$); and -B($Q_{26}$)($Q_{27}$); and —N($Q_{31}$)($Q_{32}$); —Si($Q_{33}$)($Q_{34}$)($Q_{35}$); and -B($Q_{36}$)($Q_{37}$);

$Q_1$, $Q_2$, $Q_{11}$ to $Q_{17}$, $Q_{21}$ to $Q_{27}$, and $Q_{31}$ to $Q_{37}$ may be each independently selected from a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group.

For example, in Formulae 1 and 2, $A_{11}$, $A_{21}$ and $A_{22}$ may be each independently selected from benzene and naphthalene, but they are not limited thereto.

For example, in Formulae 1 and 2, $L_{11}$, $L_{21}$, and $L_{22}$ may be each independently selected from a phenylene group; a pentalenylene group; an indenylene group; a naphthylene group; an azulenylene group; a heptalenylene group; an indacenylene group; an acenaphthylene group; a fluorenylene group; a spiro-fluorenylene group; a benzofluorenylene group; a dibenzofluorenylene group; a phenalenylene group; a phenanthrenylene group; an anthracenylene group; a fluoranthenylene group; a triphenylenylene group; a pyrenylene group; a chrysenylene group; a naphthacenylene group; a picenylene group; a perylenylene group; a pentaphenylene group; a hexacenylene group; a pentacenylene group; a rubicenylene group; a coronenylene group; an ovalenylene group; a pyrrolylene group; a thiophenylene group; a furanylene group; an imidazolylene group; a pyrazolylene group; a thiazolylene group; an isothiazolylene group; an oxazolylene group; an isooxazolylene group; a pyridinylene group; a pyrazinylene group; a pyrimidinylene group; a pyridazinylene group; an isoindolylene group; an indolylene group; an indazolylene group; a purinylene group; a quinolinylene group; an isoquinolinylene group; a benzoquinolinylene group; a phthalazinylene group; a naphthyridinylene group; a quinoxalinylene group; a quinazolinylene group; a benzoquinazolinylene group; a cinnolinylene group; a carbazolylene group; a phenanthridinylene group; an acridinylene group; a phenanthrolinylene group; a phenazinylene group; a benzoimidazolylene group; a benzofuranylene group; a benzothiophenylene group; a benzothiazolylene group; an isobenzothiazolylene group; a benzooxazolylene group; an isobenzooxazolylene group; a triazolylene group; a tetrazolylene group; an oxadiazolylene group; a triazinylene group; a dibenzofuranylene group; a dibenzothiophenylene group; a benzocarbazolylene group; and a dibenzocarbazolylene group; and a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a benzoquinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group and a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group, but they are not limited thereto.

In another embodiment, in Formulae 1 and 2, $L_{11}$, $L_{21}$, and $L_{22}$ may be each independently selected from a phenylene group; a naphthylene group; a fluorenylene group; a pyridinylene group; a pyrazinylene group; a pyrimidinylene group; a quinolinylene group; an isoquinolinylene group; a benzoquinolinylene group; a phthalazinylene group; a quinoxalinylene group; a quinazolinylene group; a benzoquinazolinylene group; a carbazolylene group; a phenanthridinylene group; a benzofuranylene group; a benzothiophenylene group; a benzothiazolylene group; an isobenzothiazolylene group; a benzooxazolylene group; an isobenzooxazolylene group; a triazinylene group; a dibenzofuranylene group; and a dibenzothiophenylene group; and a phenylene group, a naphthylene group, a fluorenylene group, a pyridinylene group, a pyrazinylene group, a pyrimidinylene group, a quinolinylene group, an isoquinolinylene group, a benzoquinolinylene group, a phthalazinylene group, a quinoxalinylene group, a quinazolinylene group, a benzoquinazolinylene group, a carbazolylene group, a phenanthridinylene group, a benzofuranylene group, a benzothiophenylene group, a benzothiazolylene group, an isobenzothiazolylene group, a benzooxazolylene group, an isobenzooxazolylene group, a triazinylene group, a dibenzofuranylene group, and a dibenzothiophenylene group, each substituted with at least one selected from a deuterium, —F, —Cl, —Br, —I, a methyl group, an ethyl group, an n-propyl group, an isopropyl group, an n-butyl group, an iso-butyl group, a sec-butyl group, a tert-butyl group, a methoxy group, an ethoxy group, a propoxy group, a phenyl group, a naphthyl group, a fluorenyl group, a pyridinyl group, a pyrazinyl group, and a pyrimidinyl group, but they are not limited thereto.

For example, in Formulae 1 and 2, a11, a21, and a22 may be each independently 0 or 1, but they are not limited thereto.

For example, in Formulae 1 and 2, $Ar_{11}$, $Ar_{21}$, $Q_1$, and $Q_2$ may be each independently selected from a methyl group; an ethyl group; an n-propyl group; an isopropyl group; an n-butyl group; an iso-butyl group; a sec-butyl group; a tert-butyl group; a methoxy group; an ethoxy group; a cyclopentyl group; a cyclohexyl group; a phenyl group; a pentalenyl group; an indenyl group; a naphthyl group; an azulenyl group; a heptalenyl group; an indacenyl group; an acenaphthyl group; a fluorenyl group; a spiro-fluorenyl group; a benzofluorenyl group; a dibenzofluorenyl group; a phenalenyl group; a phenanthrenyl group; an anthracenyl group; a fluoranthenyl group; a triphenylenyl group; a pyrenyl group; a chrysenyl group; a naphthacenyl group; a picenyl group; a perylenyl group; a pentaphenyl group; a hexacenyl group; a pentacenyl group; a rubicenyl group; a coronenyl group; an ovalenyl group; a pyrrolyl group; a thiophenyl group; a furanyl group; an imidazolyl group; a pyrazolyl group; a thiazolyl group; an isothiazolyl group; an oxazolyl group; an isooxazolyl group; a pyridinyl group; a pyrazinyl group; a pyrtmidinyl group; a pyridazinyl group; an isoindolyl group; an indolyl group; an indazolyl group; a purinyl group; a quinolinyl group; an isoquinolinyl group; a carbazolyl group; a benzoquinolinyl group; a phthalazinyl group; a naphthyridinyl group; a quinoxalinyl group; a quinazolinyl group; a benzoquinazolinyl group; a cinnolinyl group; a phenanthridinyl group; an acridinyl group; a phenanthrolinyl group; a phenazinyl group; a benzimidazolyl group; a benzofuranyl group; a benzothiophenyl group; an isobenzothiazolyl group; a benzooxazolyl group; an isobenzooxazolyl group; a triazolyl group; a tetrazolyl group; an oxadiazolyl group; a triazinyl group; a dibenzofuranyl group; a dibenzothiophenyl group; a dibenzosilolyl group; a benzocarbazolyl group; and a dibenzocarbazolyl group; and a methyl group, an ethyl group, an n-propyl group, an isopropyl group, an n-butyl group, an iso-butyl group, a sec-butyl group, a tert-butyl group, a methoxy group, an ethoxy group, a cyclopentyl group, a cyclohexyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —N($Q_{31}$)($Q_{32}$), and —Si($Q_{33}$)($Q_{34}$)($Q_{35}$);

$Q_{31}$ to $Q_{35}$ may be each independently selected from a $C_1$-$C_{60}$ alkyl group, a $C_6$-$C_{60}$ aryl group, and a $C_1$-$C_{60}$ heteroaryl group, but they are not limited thereto.

In another embodiment, in Formulae 1 and 2, $Ar_{11}$, $Ar_{21}$, $Q_1$, and $Q_2$ may be each independently selected from a methyl group; an ethyl group; an n-propyl group; an isopropyl group; an n-butyl group; an iso-butyl group; a sec-butyl group; a tert-butyl group; a phenyl group; a naphthyl group; a fluorenyl group; a benzofluorenyl group; a phenanthrenyl group; an anthracenyl group; a triphenylenyl group; a pyrenyl group; a chrysenyl group; a perylenyl group; a hexacenyl group; a pentacenyl group; a pyrrolyl group; a thiophenyl group; a furanyl group; an imidazolyl group; a pyrazolyl group; a thiazolyl group; an oxazolyl group; a pyridinyl group; a pyrazinyl group; a pyrimidinyl group; an indolyl group; a quinolinyl group; an isoquinolinyl group; a carbazolyl group; a benzoquinolinyl group; a quinoxalinyl group; a quinazolinyl group; a benzoquinazolinyl group; a phenanthridinyl group; an acridinyl group; a phenanthrolinyl group; a phenazinyl group; a benzimidazolyl group; a benzofuranyl group; a benzothiophenyl group; a benzooxazolyl group; a triazolyl group; a tetrazolyl group; a triazinyl group; a dibenzofuranyl group; and a dibenzothiophenyl group; and a methyl group, an ethyl group, an n-propyl group, an isopropyl group, an n-butyl group, an iso-butyl group, a sec-butyl group, a tert-butyl group, a phenyl group, a naphthyl group, a fluorenyl group, a benzofluorenyl group, a phenanthrenyl group, an anthracenyl group, a triphenylenyl group, a pyrenyl group, a chrysenyl group, a perylenyl group, a hexacenyl group, a pentacenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a quinoxalinyl group, a quinazolinyl group, a benzoquinazolinyl group, a phenanthridinyl group, an acridinyl group, a phenanthrolinyl group, a phenazinyl group, a benzimidazolyl group, a benzofuranyl group, a benzothiophenyl group, a benzooxazolyl group, a triazolyl group, a tetrazolyl group, a triazinyl group, a dibenzofuranyl group, and a dibenzothiophenyl group, each substituted with at least one selected from a deuterium, —F, —Cl, —Br, —I, a $C_1$-$C_{20}$ alkyl group, a $C_1$-$C_{20}$ alkoxy group, a phenyl group, a naphthyl group, a fluorenyl group, a pyridinyl group, a pyrazinyl group, a pyrimidinyl group, a quinolinyl group, an isoquinolinyl group, a carbazolyl group, —N($Q_{31}$)($Q_{32}$), and —Si($Q_{33}$)($Q_{34}$)($Q_{35}$); and $Q_{31}$ to $Q_{35}$ may be each independently selected from a methyl group, an ethyl group, an n-propyl group, a tert-butyl group, a phenyl group, a naphthyl group, and a pyridinyl group, but they are not limited thereto.

For example, in Formulae 1 and 2, $R_{11}$, $R_{21}$, $R_{22}$, and $R_{91}$ to $R_{93}$ may be each independently selected from a hydrogen, a deuterium, —F, —Cl, —Br, —I, a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic hetero-condensed polycyclic group, but they are not limited thereto.

In another embodiment, in Formulae 1 and 2, $R_{11}$, $R_{21}$, $R_{22}$ and $R_{91}$ to $R_{93}$ may be each independently selected from a hydrogen, a deuterium, —F, —Cl, —Br, —I, a methyl group, an ethyl group, an n-propyl group, an isopropyl group, an n-butyl group, an iso-butyl group, a sec-butyl group, a tert-butyl group, a phenyl group, a naphthyl group, a pyridyl group, a pyrimidyl group, a pyrazinyl group, a fluorenyl group, and a carbazole group, but they are not limited thereto.

For example, in Formulae 1 and 2, m11 and m21 may be each independently 1 or 2, but they are not limited thereto.

In an embodiment, the first material and the second material may be selected from pyrrolidine-based compounds represented by any one of Formulae 1-1 to 1-11, but they are not limited thereto:

Formula 1-1

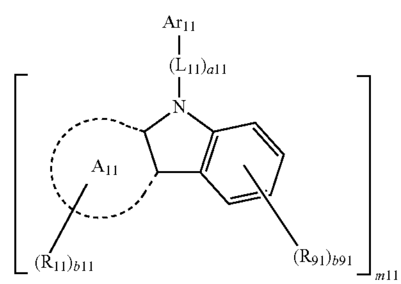

Formula 1-2

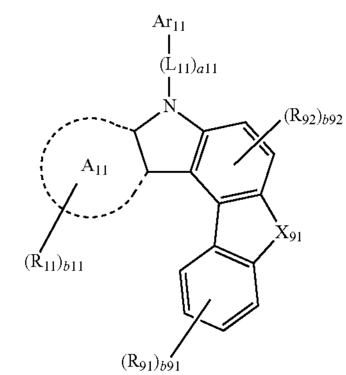

Formula 1-3

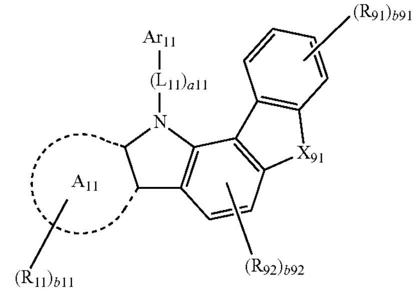

-continued

Formula 1-4

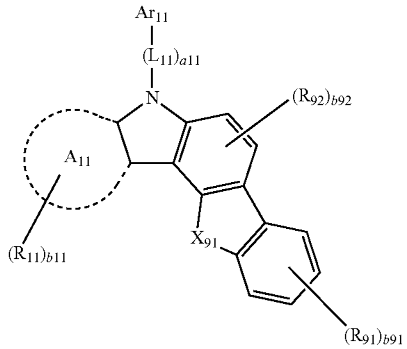

Formula 1-5

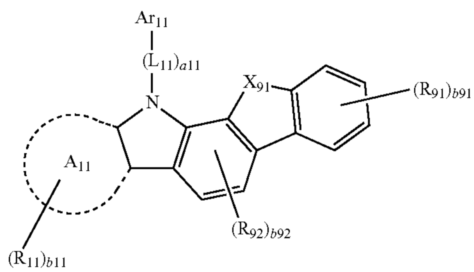

Formula 1-6

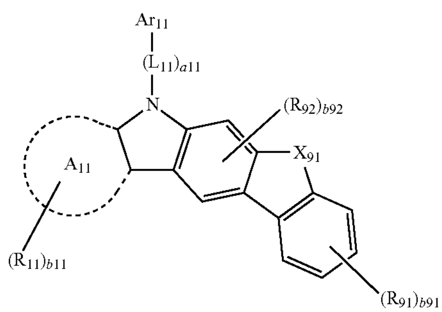

Formula 1-7

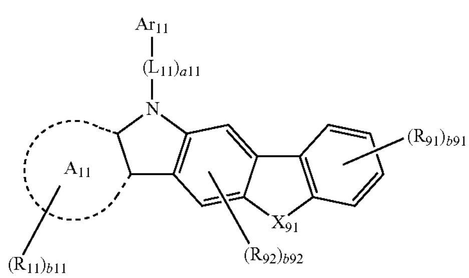

Formula 1-8

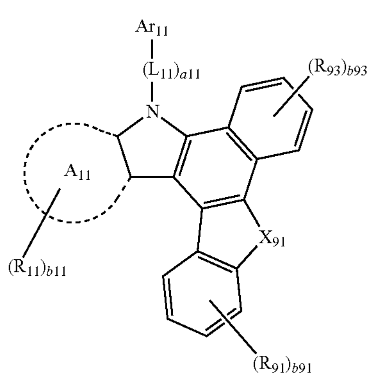

-continued

Formula 1-9

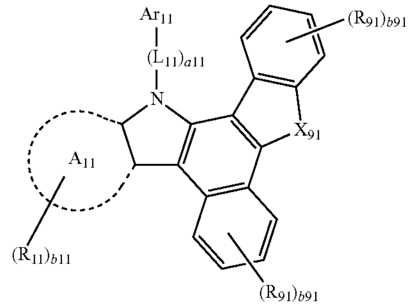

Formula 1-10

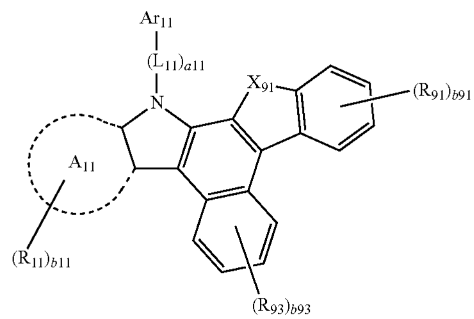

Formula 1-11

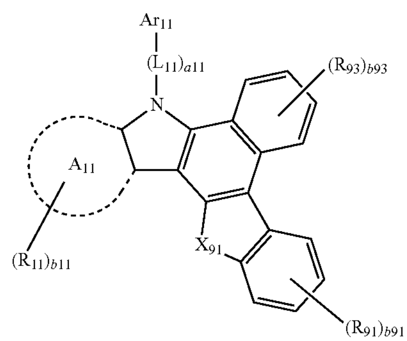

In Formulae 1-1 to 1-11, $A_{11}$, $X_{91}$, $Ar_{11}$, $L_{11}$, a11, $R_{11}$, $R_{91}$ to $R_{93}$, b11, and b91 to b93 may be referred to the descriptions of Formulae 1 and 9-1 to 9-6.

In another embodiment, the first material and the second material may be selected from pyrrolidine-based compounds represented by any one of Formulae 1-1 to 1-11, but they are not limited thereto:

Formula 1-1

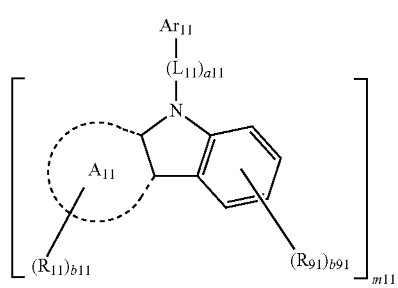

-continued
Formula 1-2
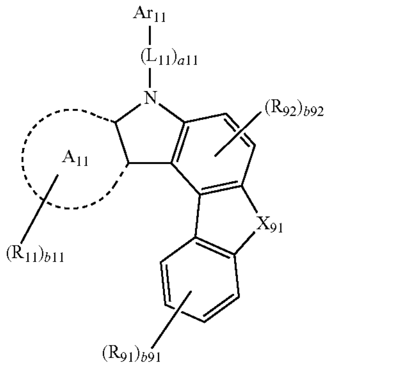
Formula 1-3
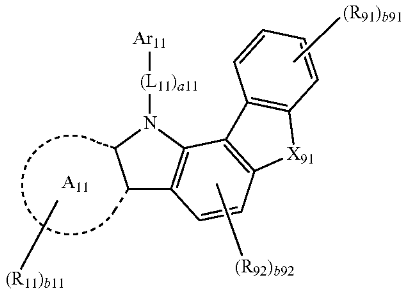
Formula 1-4
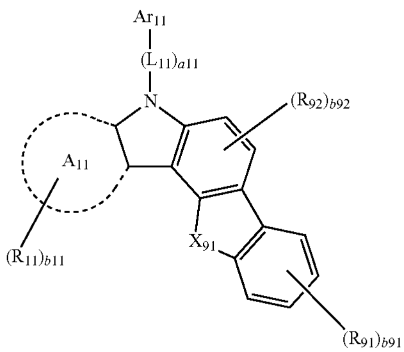
Formula 1-5
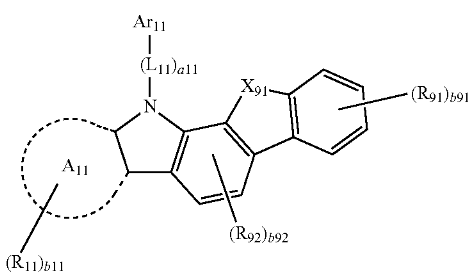
Formula 1-6
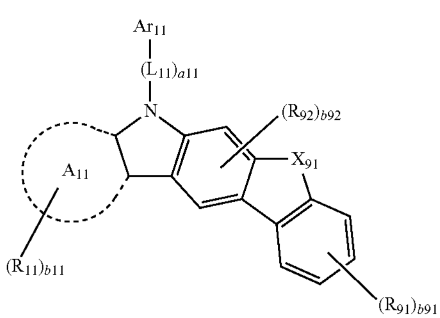
-continued
Formula 1-7
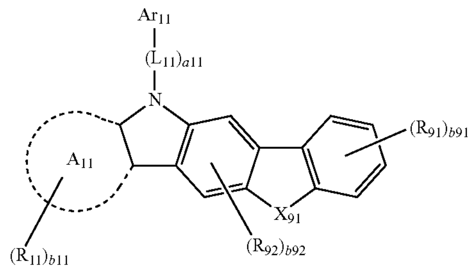
Formula 1-8
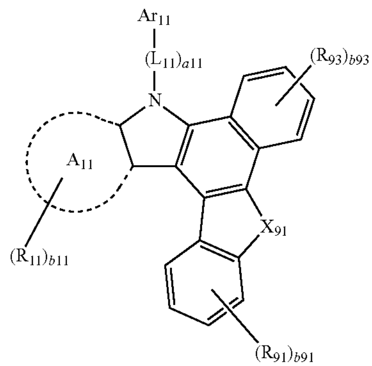
Formula 1-9
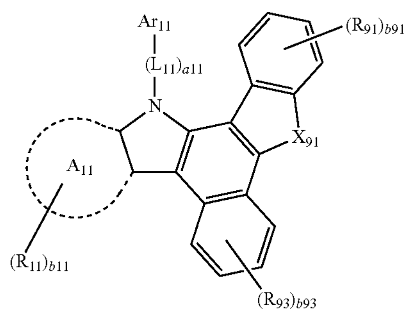
Formula 1-10
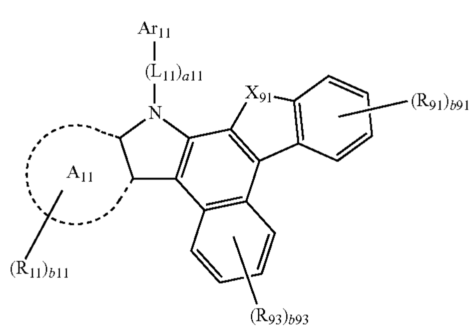

-continued
Formula 1-11
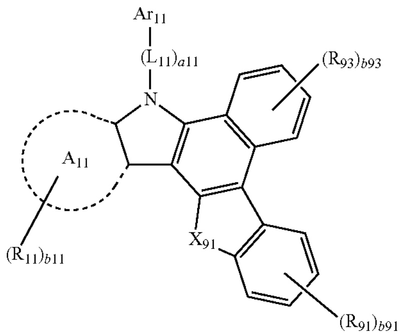
In Formulae 1-1 to 1-11,
$A_{11}$ may be selected from benzene and naphthalene;
$X_{91}$, $Ar_{11}$, $L_{11}$, a11, $R_{11}$, $R_{91}$ to $R_{93}$, b11, b91 to b93, and m11 may be the same as referred to in the descriptions of Formulae 1 and 9-1 to 9-6.
In another embodiment, the first material and the second material may be selected from pyrrolidine-based compounds represented by any one of Formulae 2-1 to 2-7:
Formula 2-1
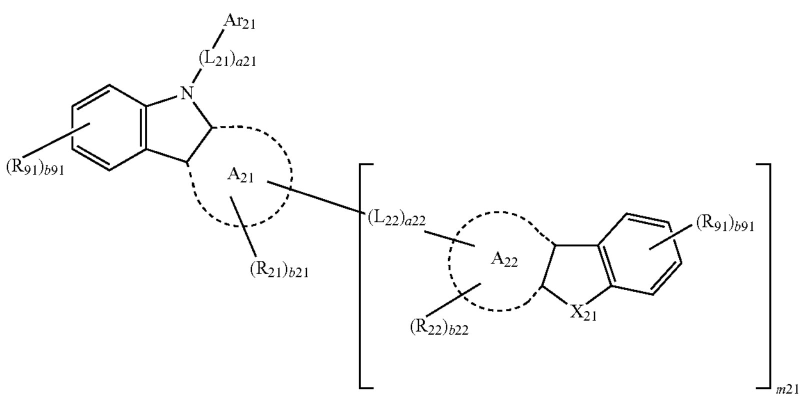
Formula 2-2
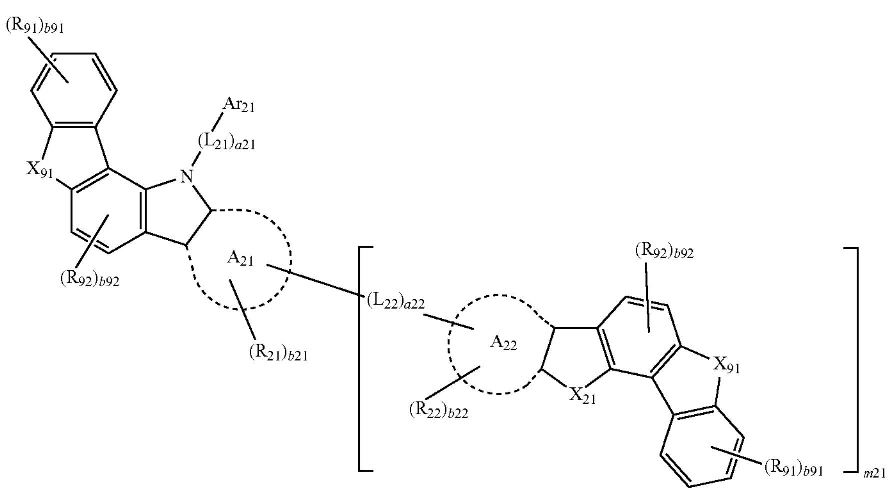

-continued
Formula 2-3
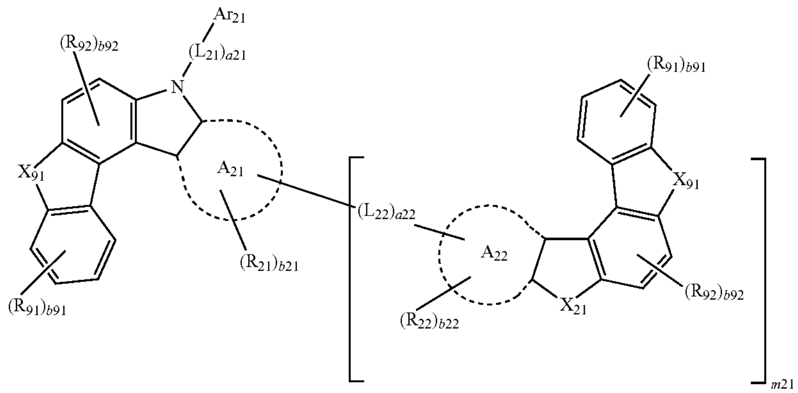
Formula 2-4
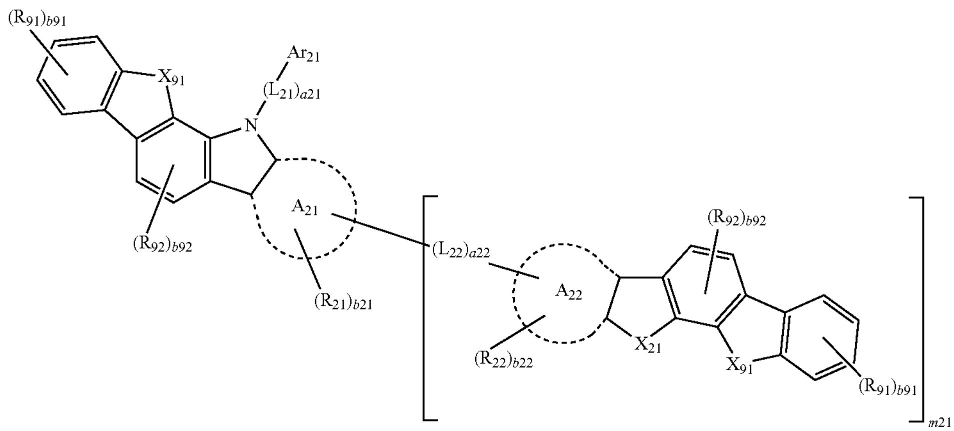
Formula 2-5
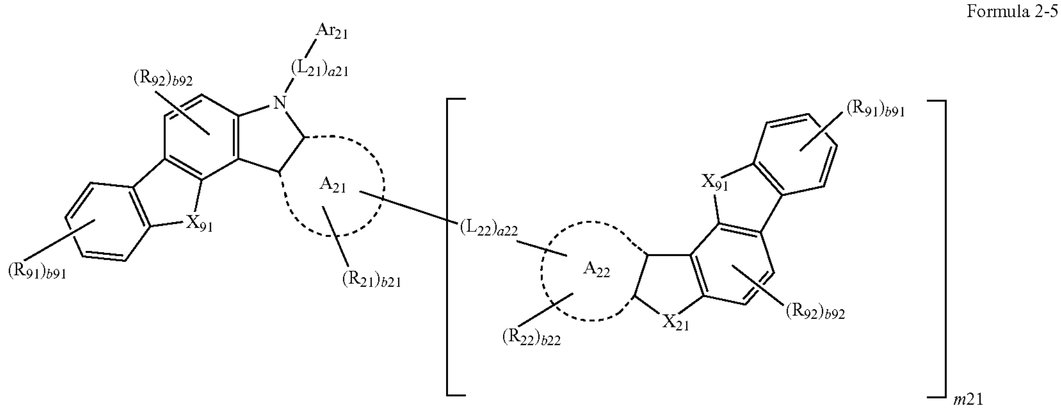
Formula 2-6
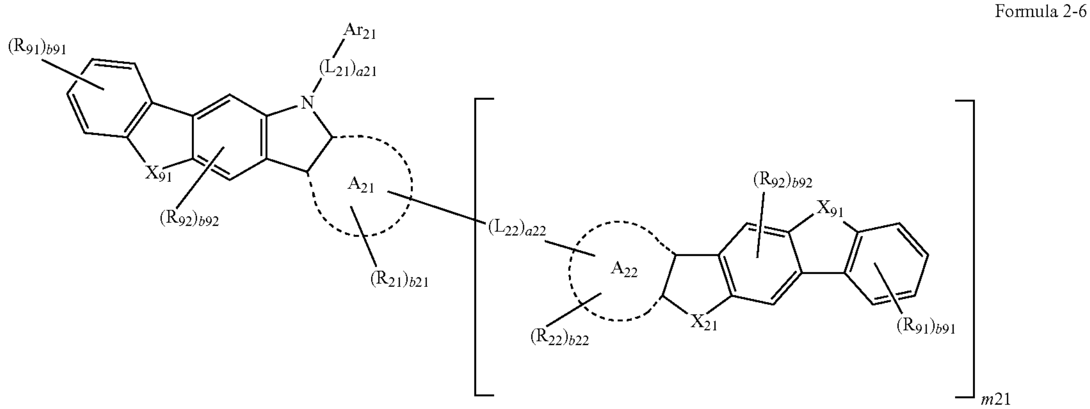

-continued
Formula 2-7
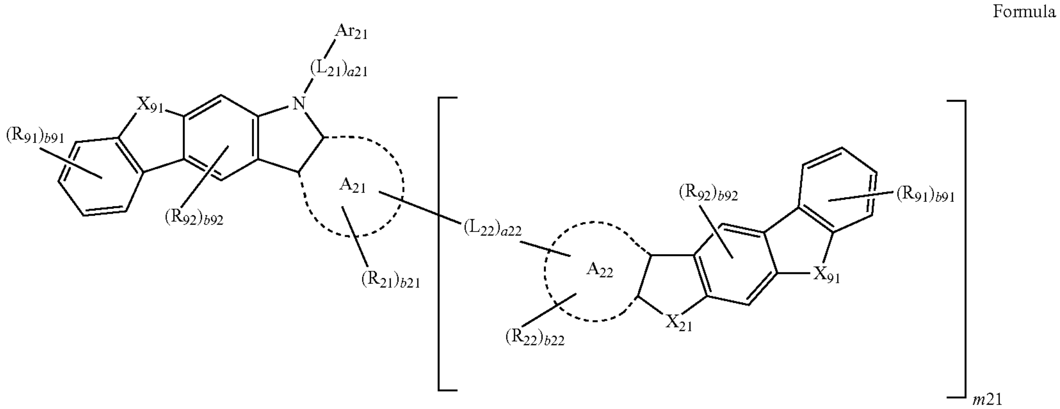
In Formulae 2-1 to 2-7,
$X_{21}$, $X_{91}$, $A_{21}$, a22, $Ar_{21}$, $L_{11}$, $L_{22}$, a11, a22, $R_{21}$, $R_{22}$, $R_{91}$, $R_{92}$, b21, b22, b91, b92, and m21 may be referred to the descriptions of Formulae 2 and 9-1 to 9-6.
In another embodiment, the first material and the second material may be selected from pyrrolidine-based compounds represented by any one of Formulae 2-1A to 2-7A, but they are not limited thereto:
Formula 2-1A
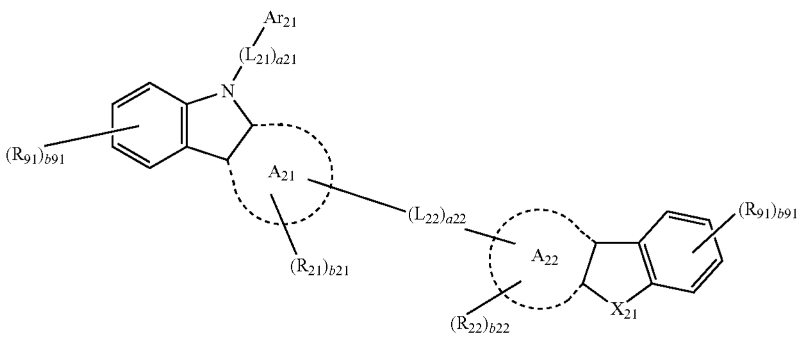
Formula 2-2A
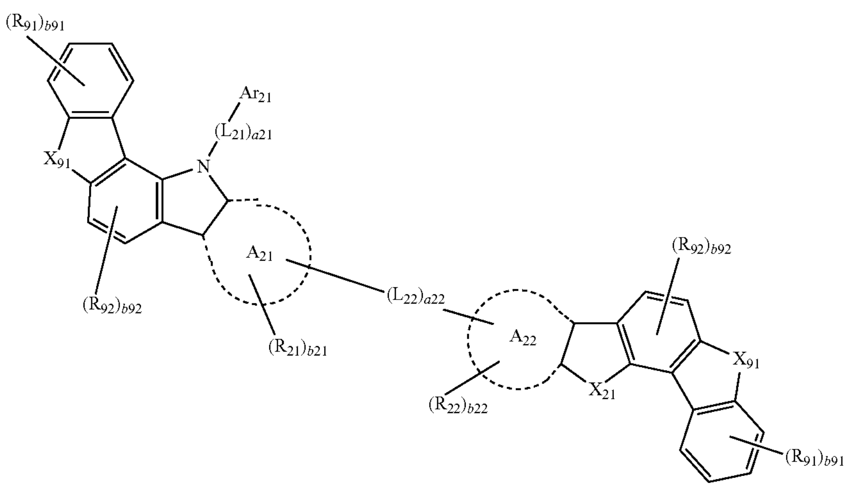

-continued
Formula 2-3A
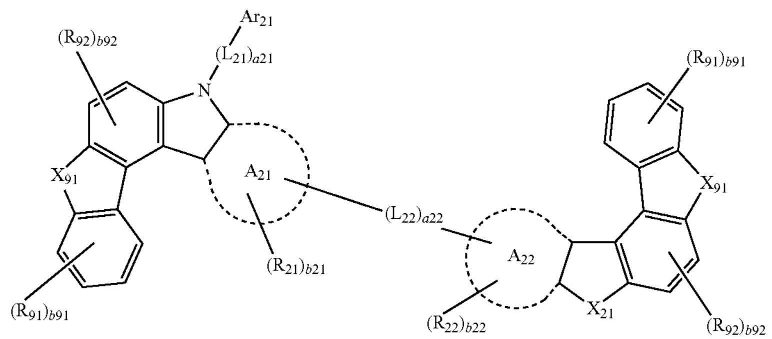
Formula 2-4A
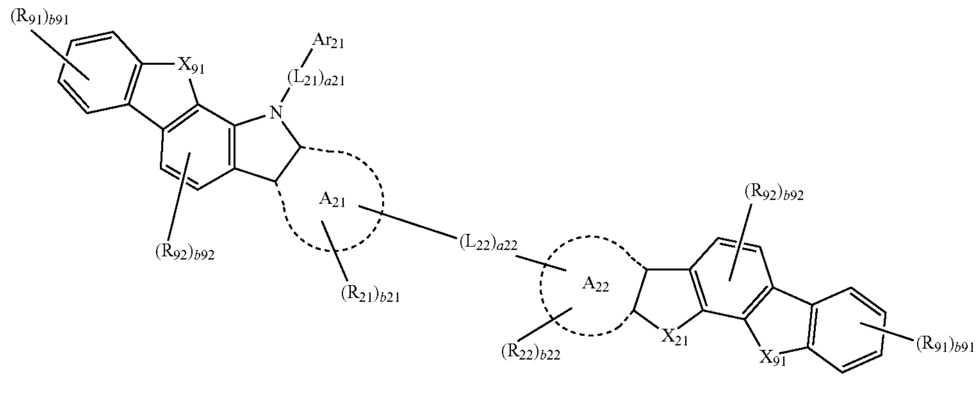
Formula 2-5A
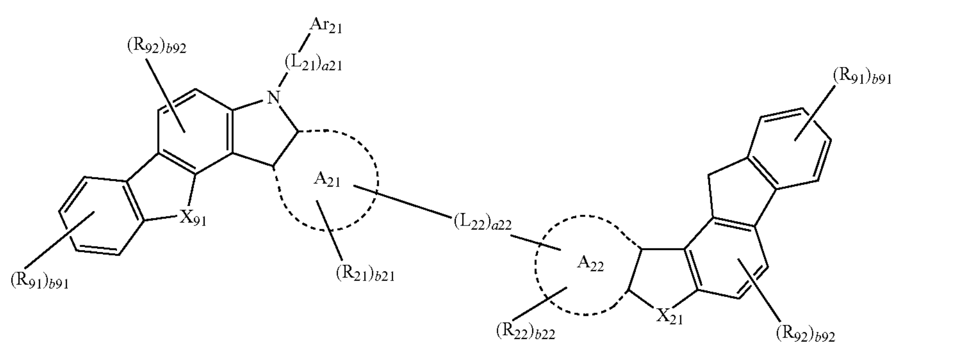
Formula 2-6A
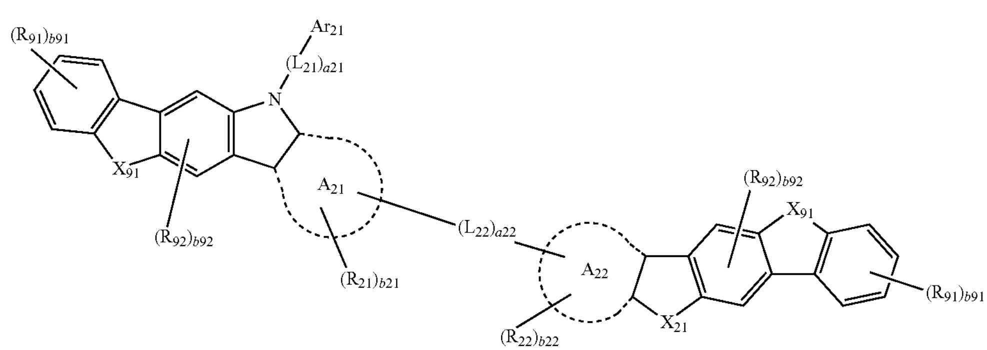

-continued
Formula 2-7A
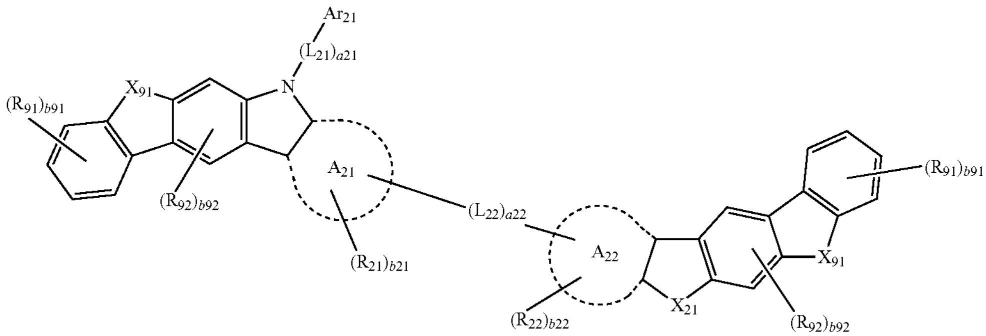
in Formulae 2-1A to 2-7A,
$X_{21}$, $X_{91}$, $A_{21}$, a22, $Ar_{21}$, $L_{11}$, $L_{22}$, a11, a22, $R_{21}$, $R_{22}$, $R_{91}$, $R_{92}$, b21, b22, b91, and b92 may be as described with reference to Formulae 2 and 9-1 to 9-6.
In another example, the first material and the second material may be selected from the compounds below, but they are not limited thereto:
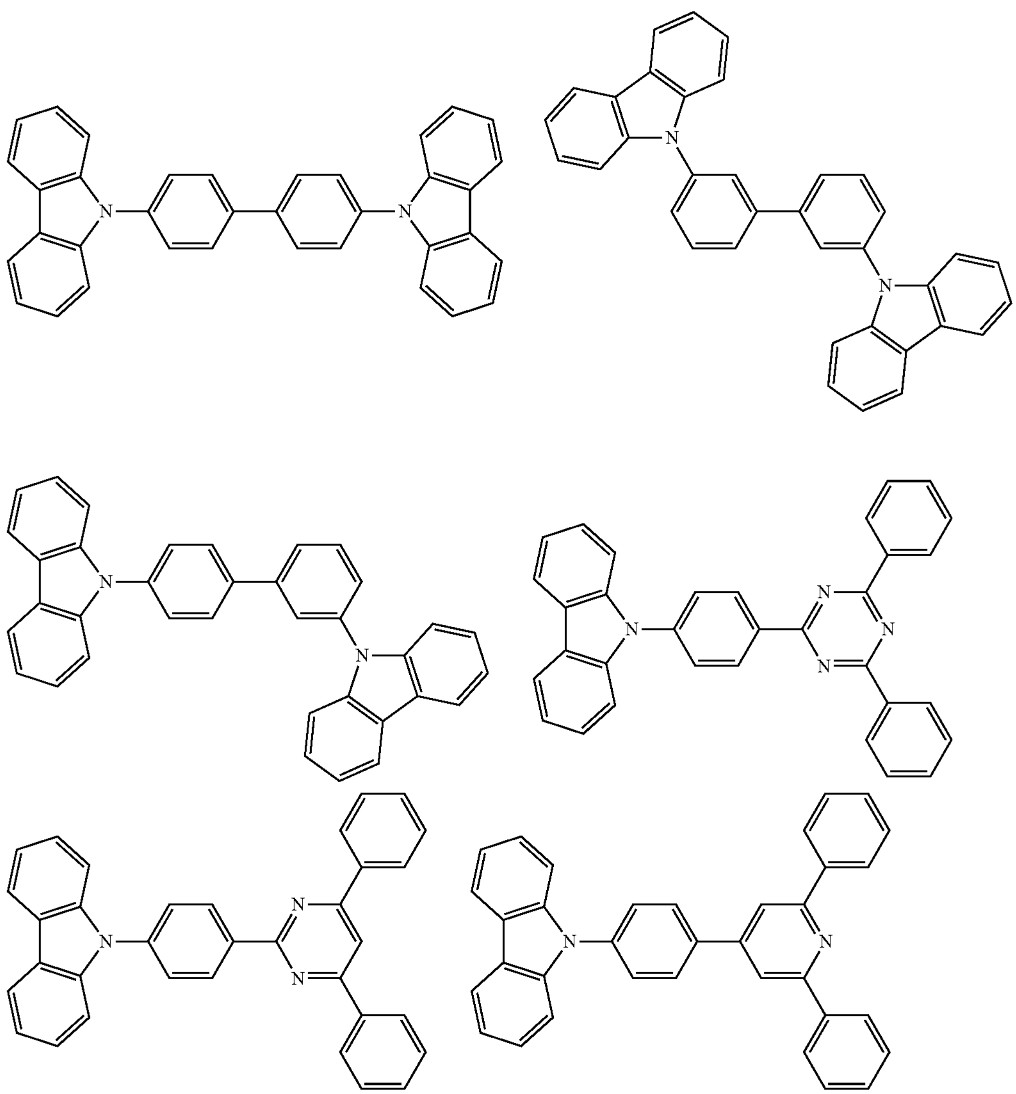

-continued
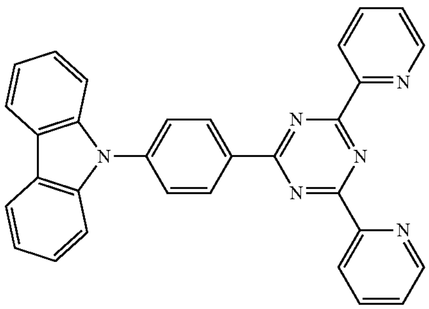
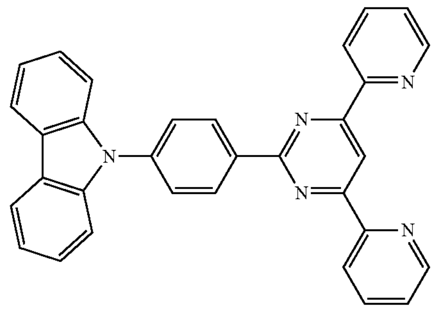
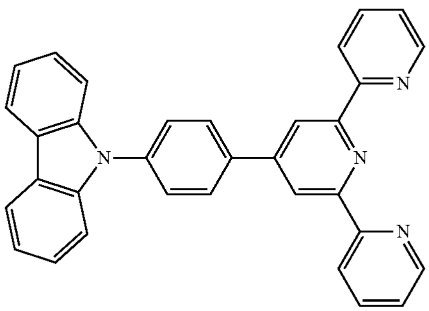
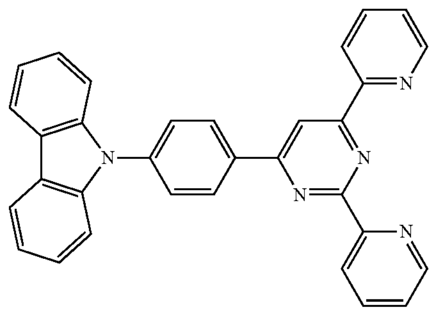
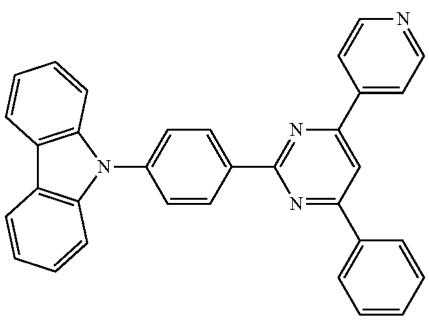
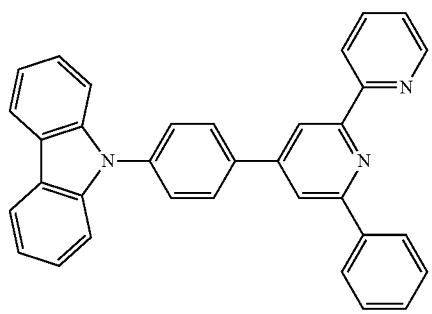
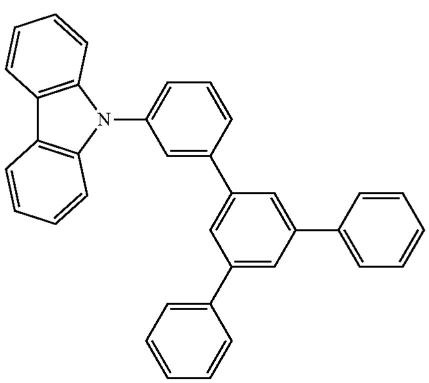
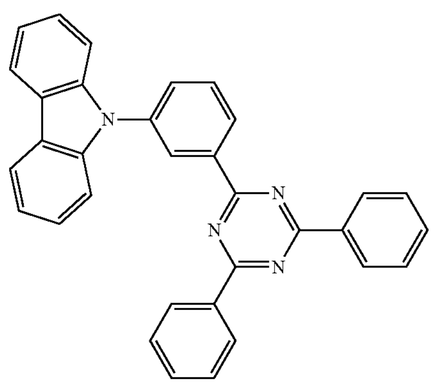
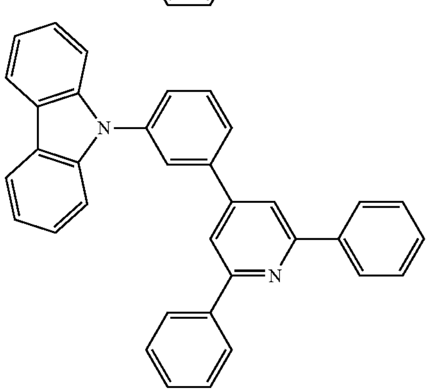
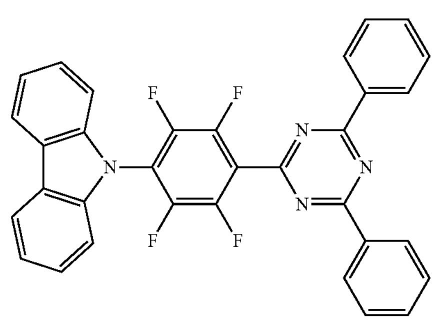

-continued
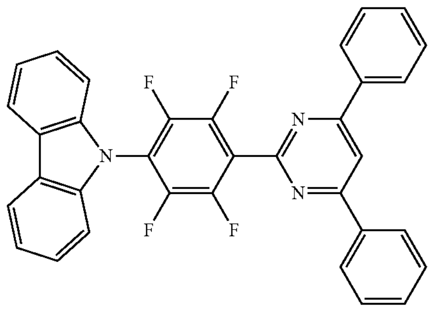
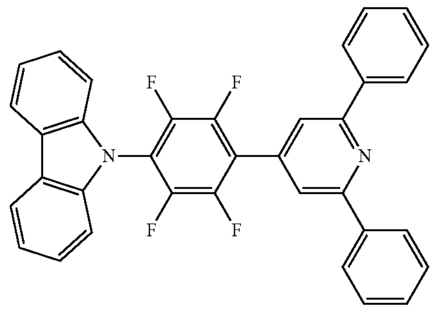
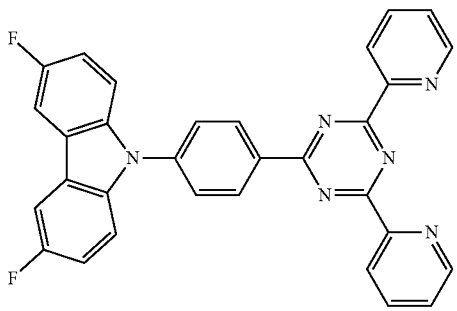
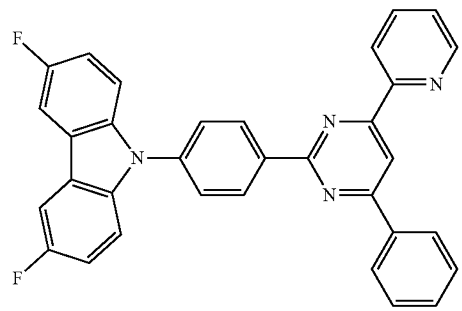
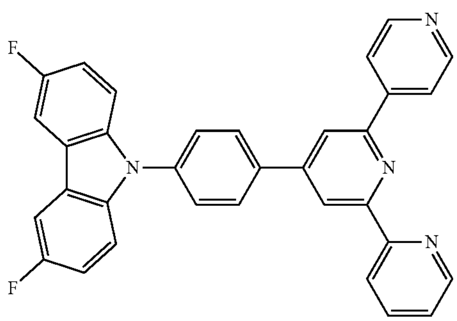
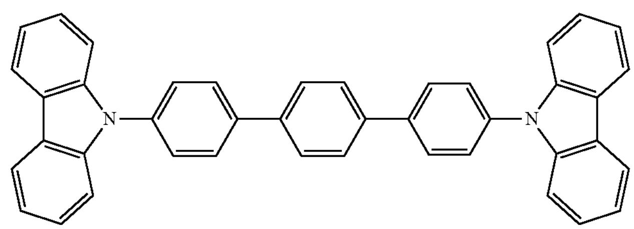
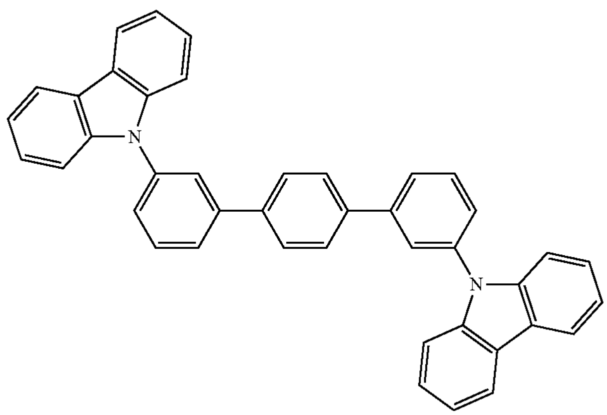
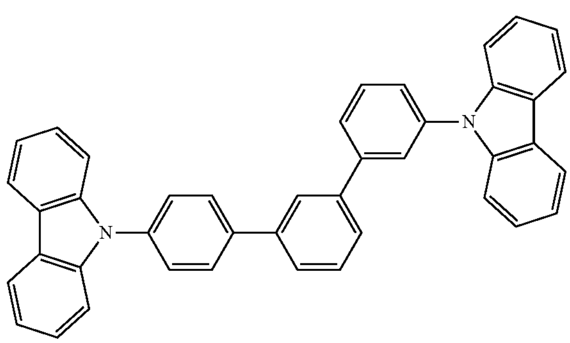

-continued
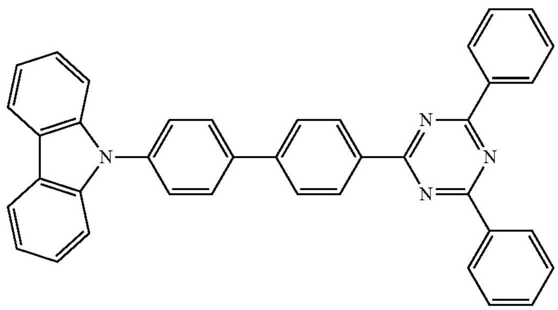
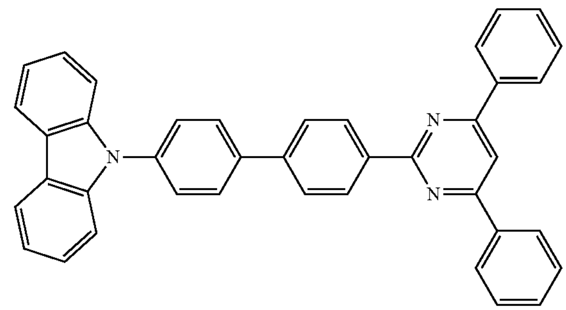
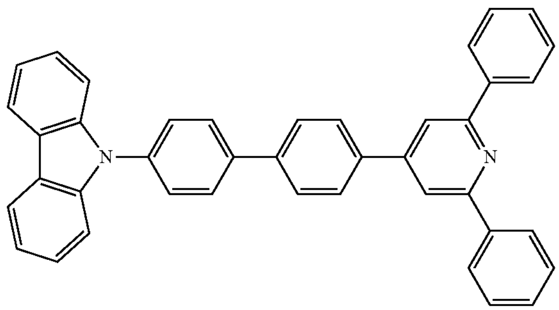
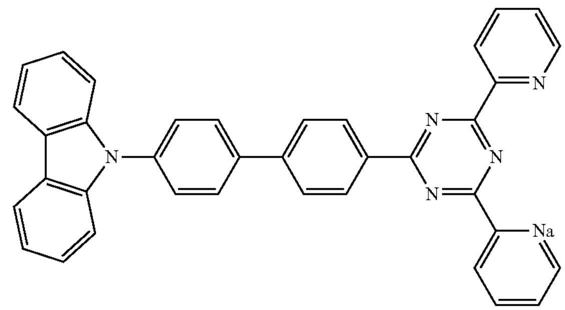
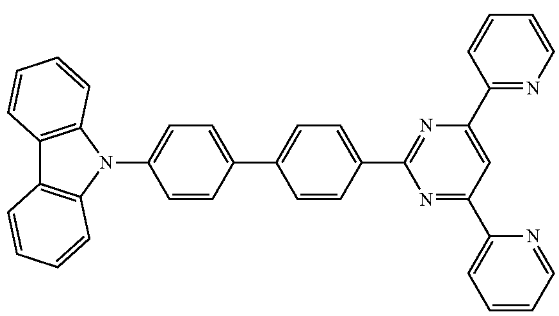
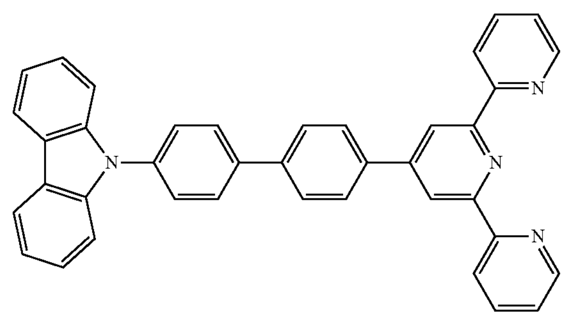
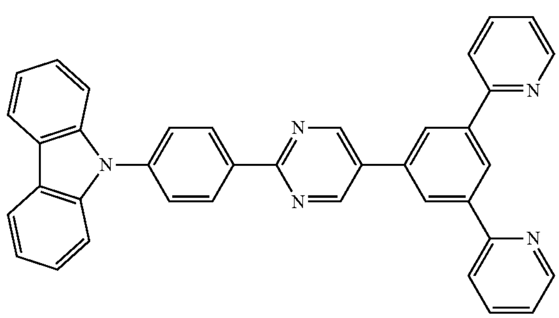
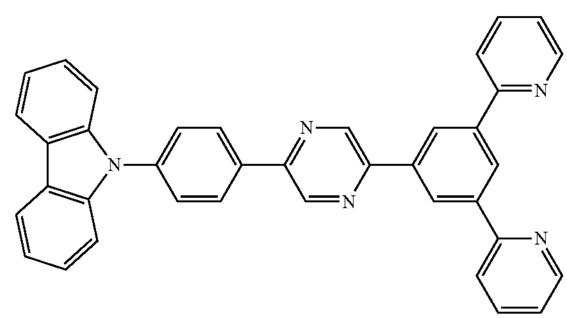
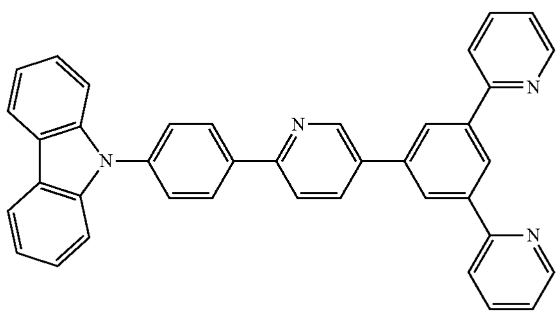
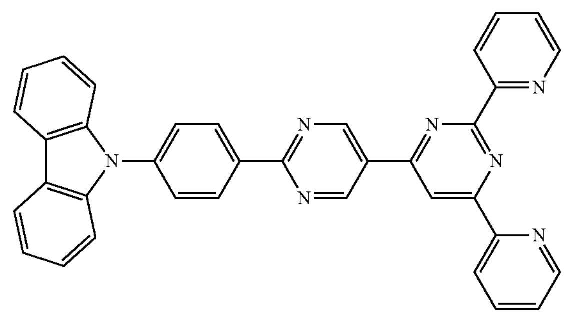

-continued
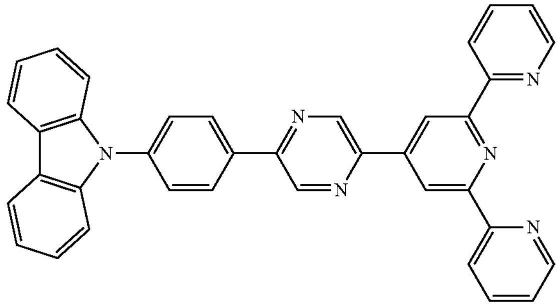
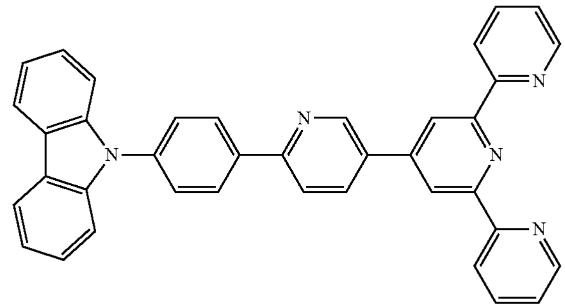
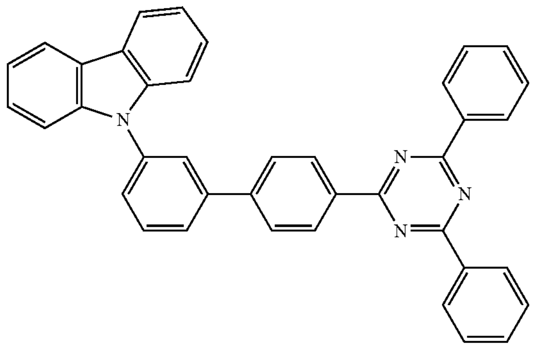
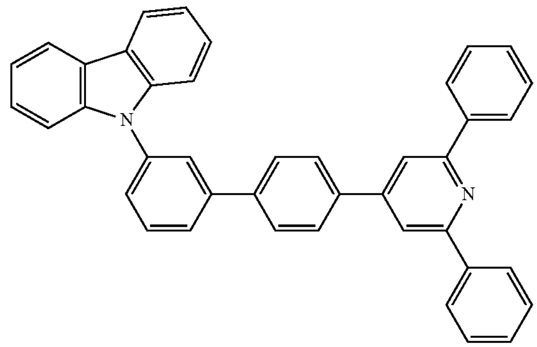
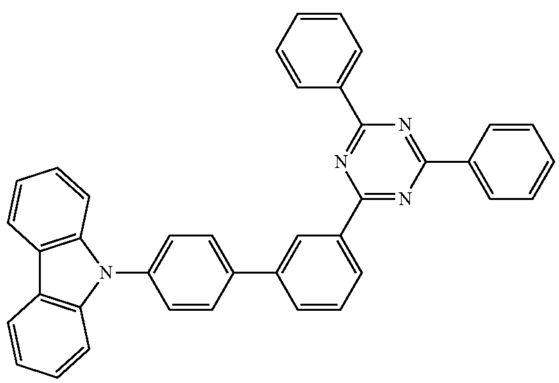
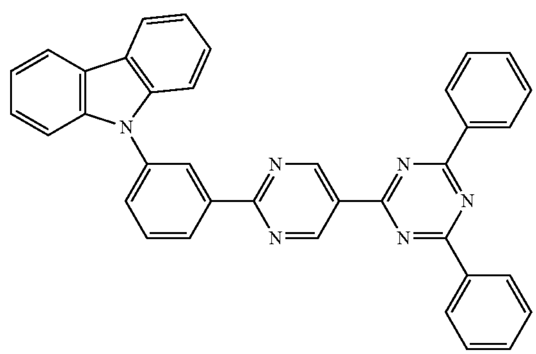
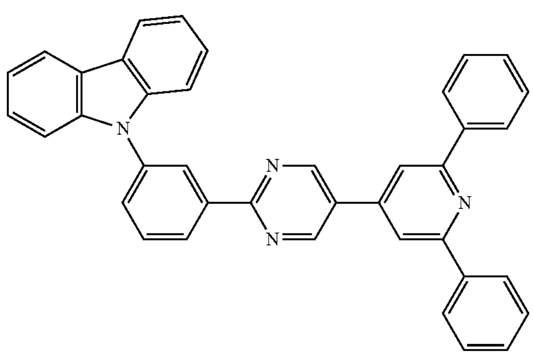
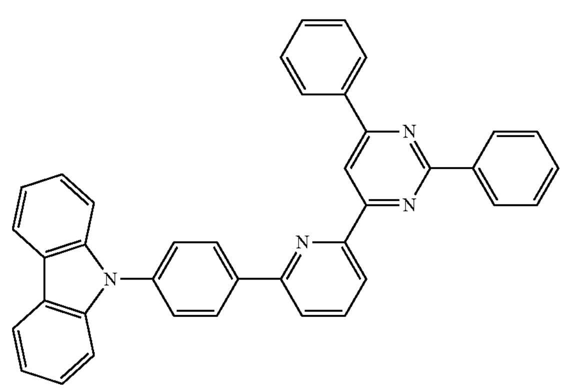

-continued
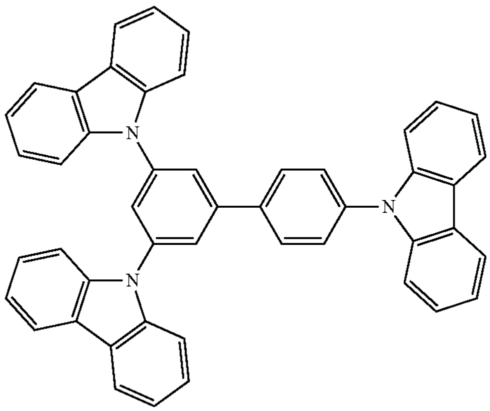
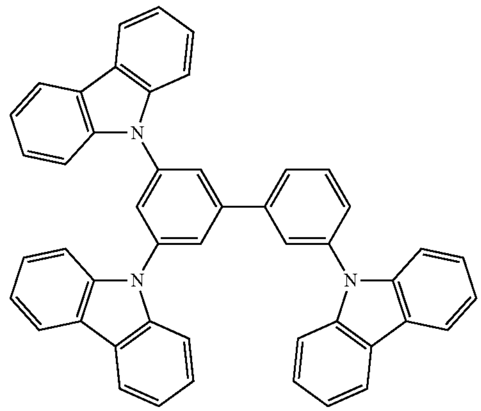
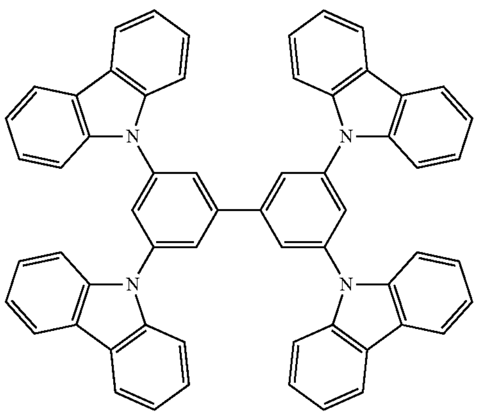
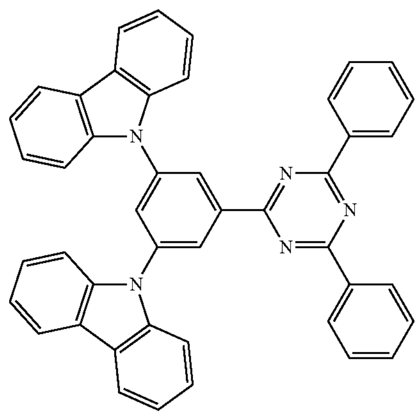
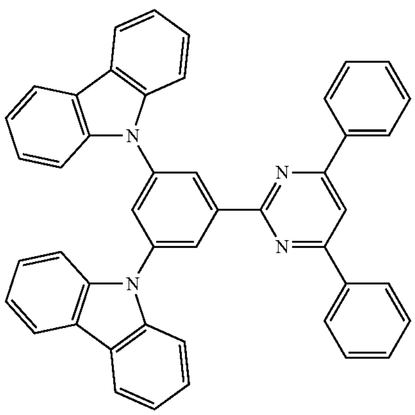
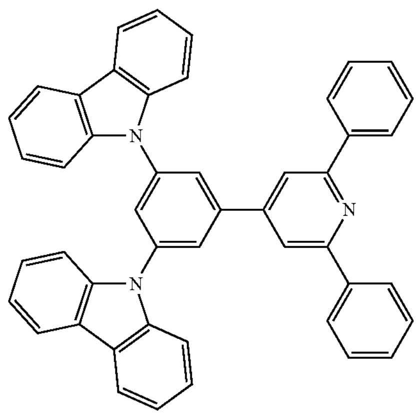
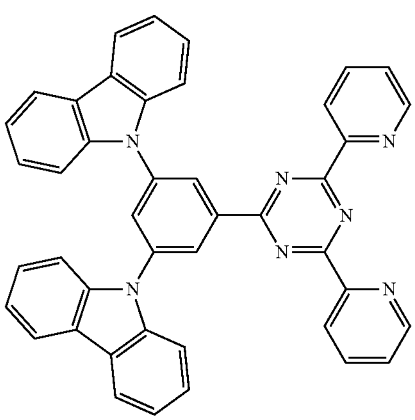
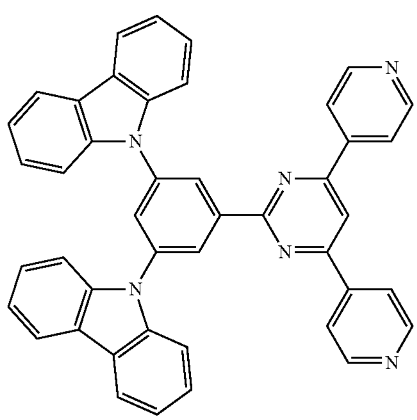

-continued
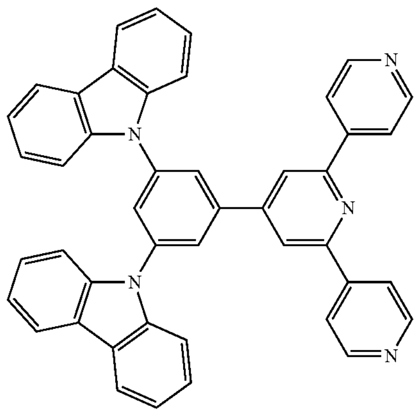
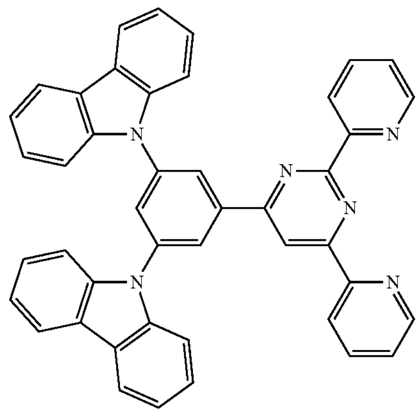
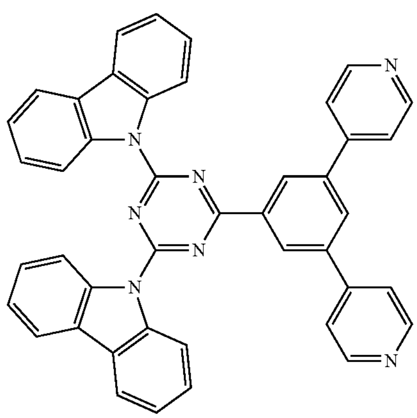
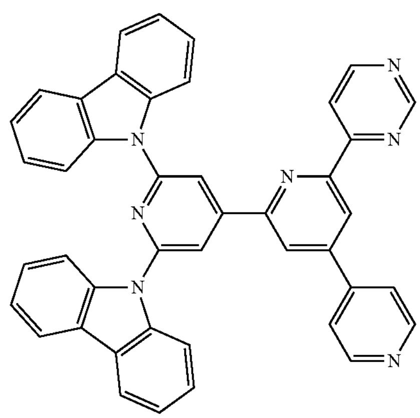
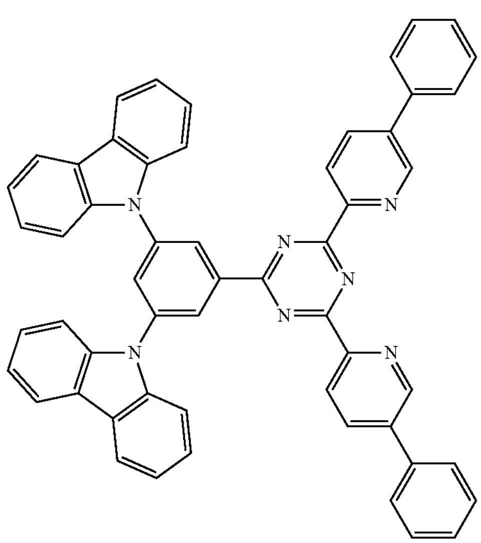
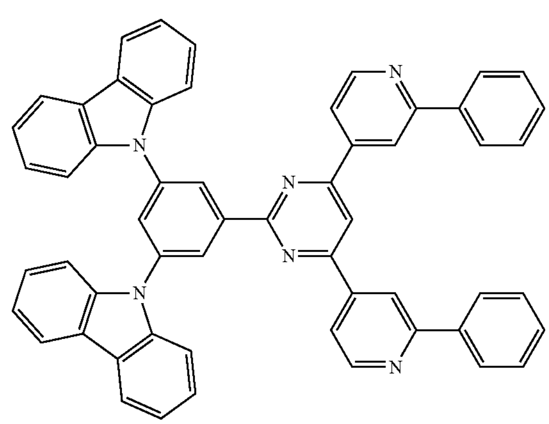

-continued
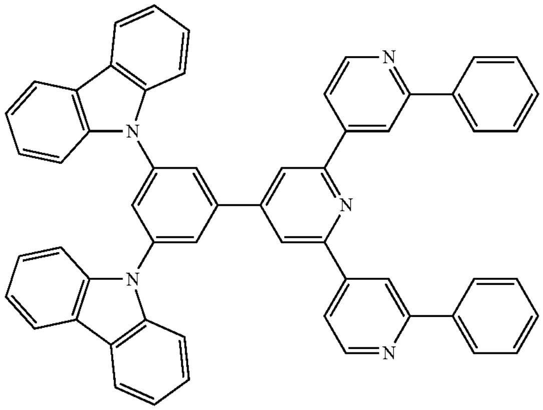
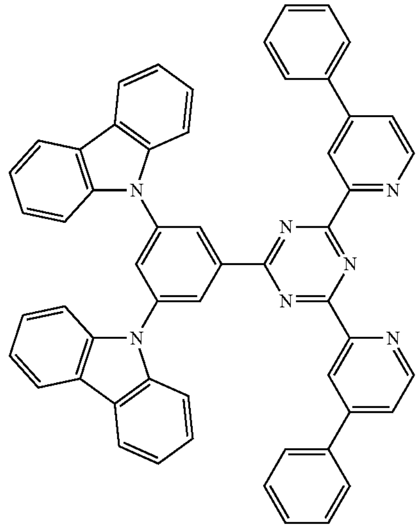
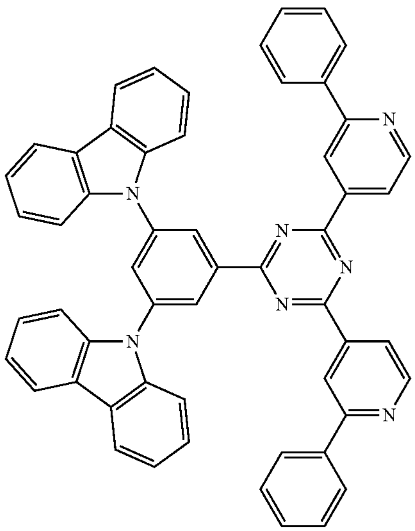
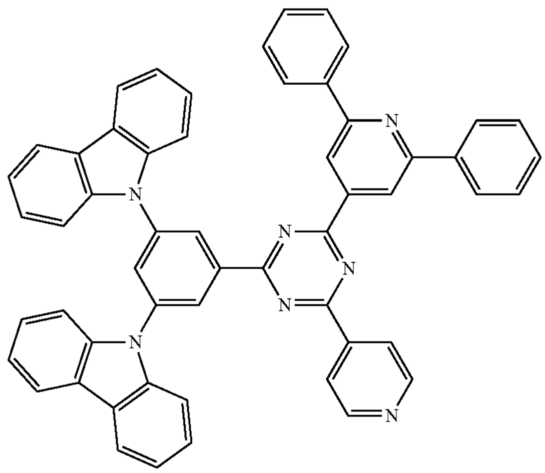
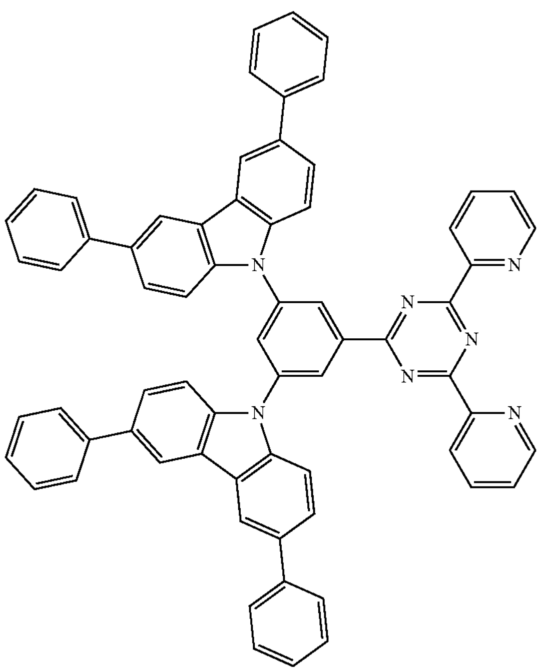
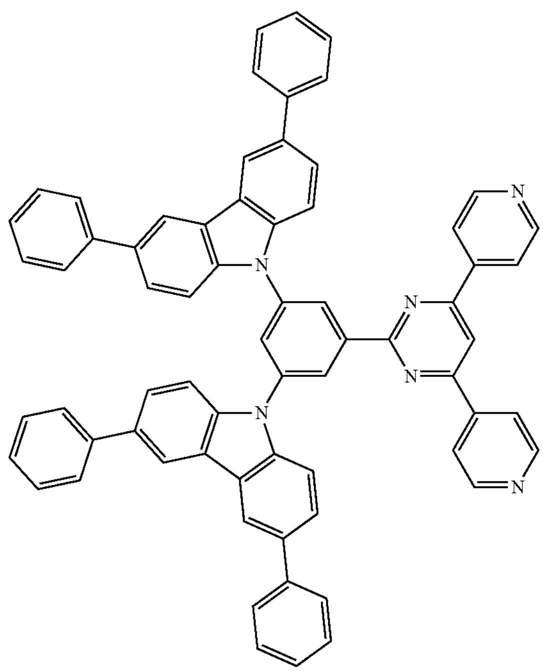

-continued
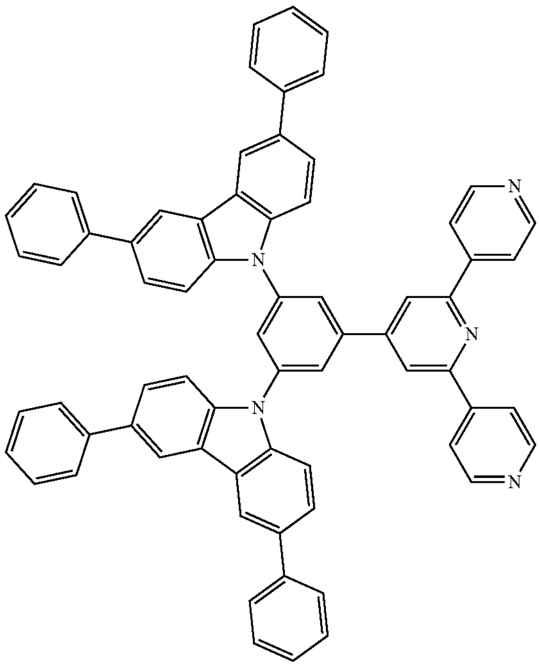
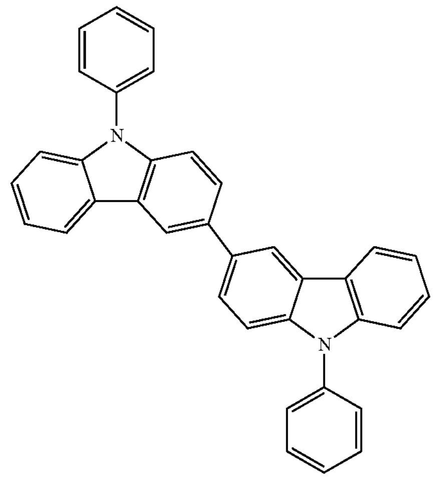
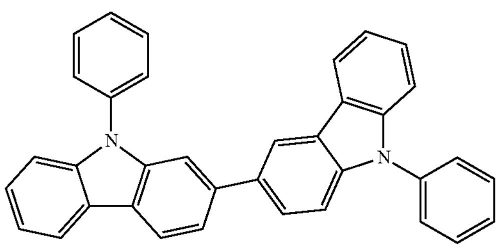
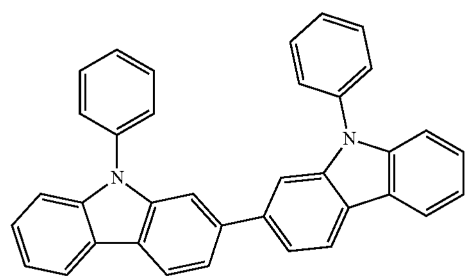
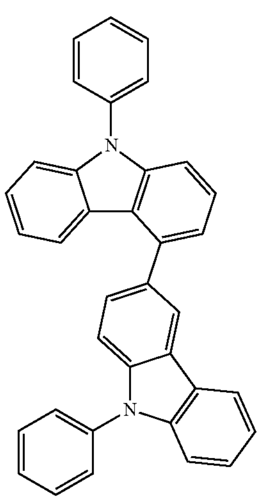
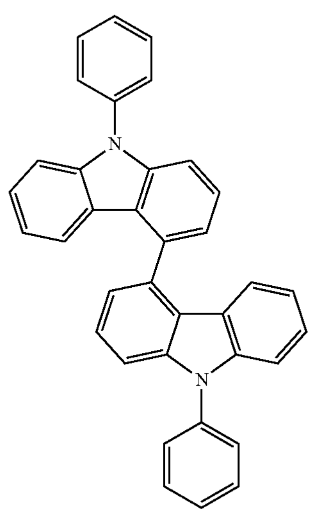
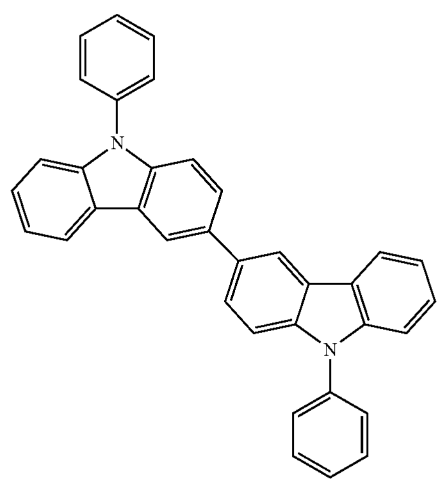

-continued
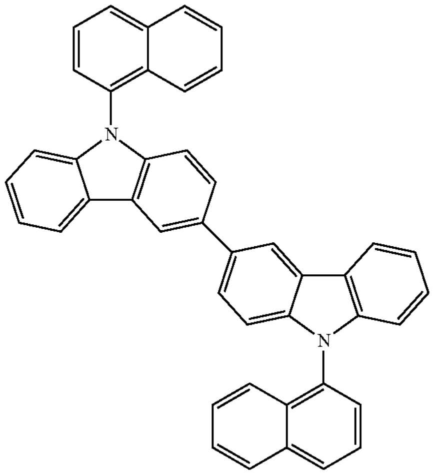
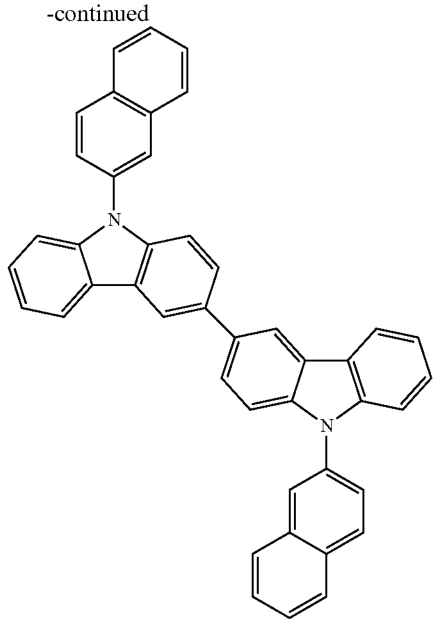
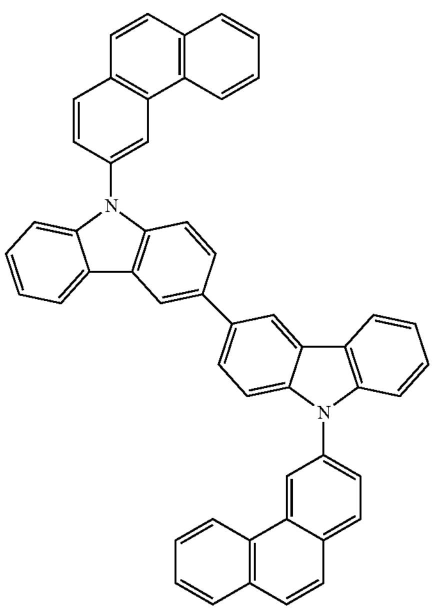
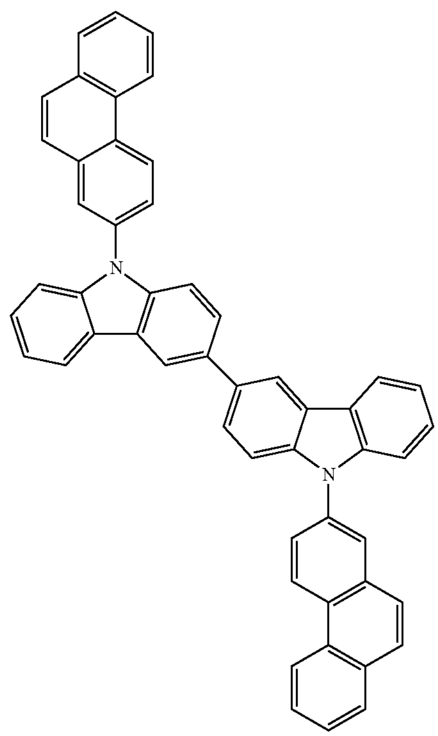

-continued
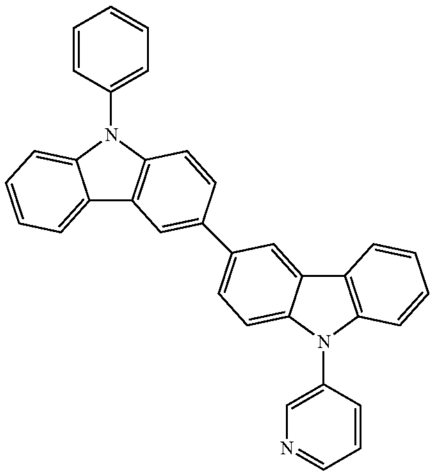
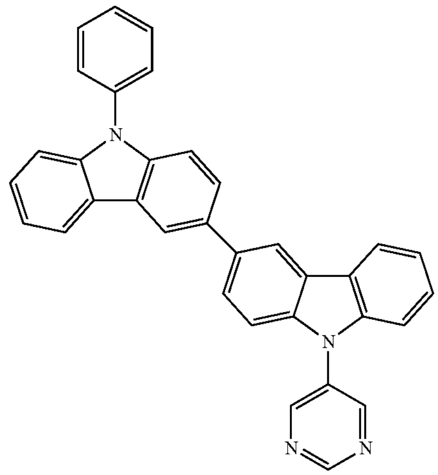
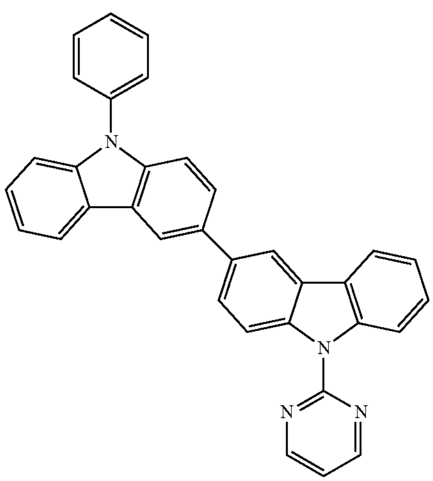
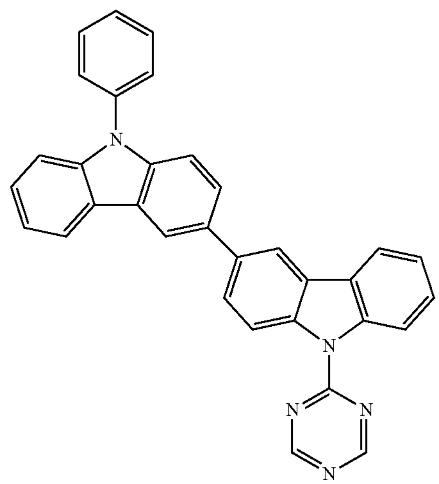
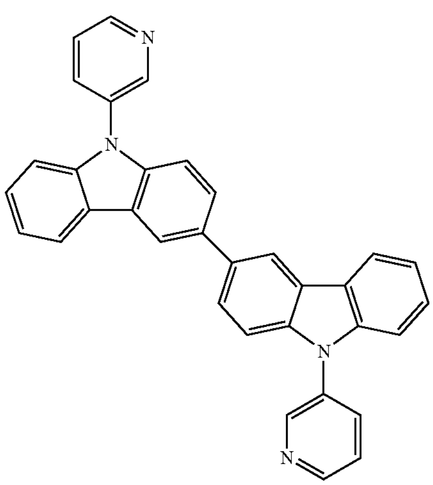
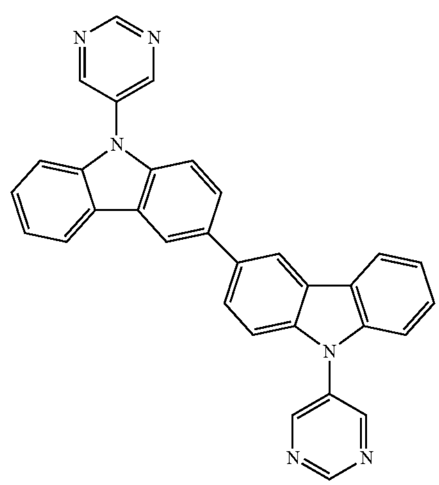

-continued
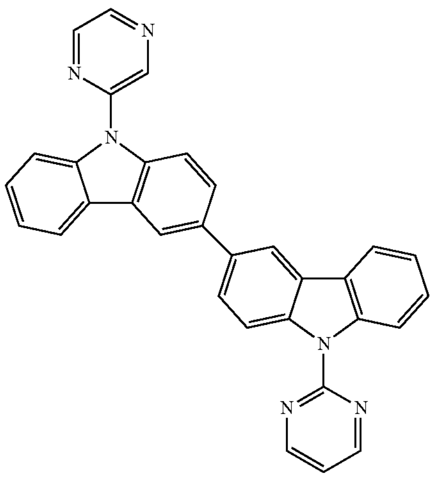
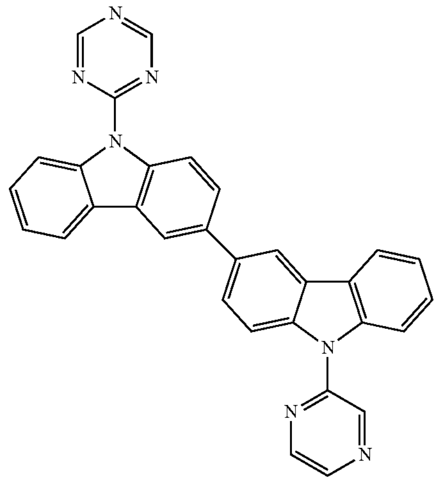
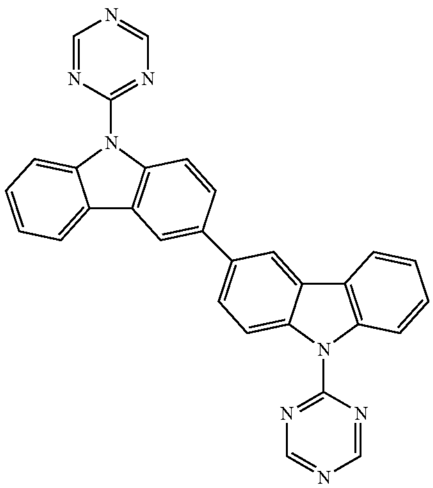
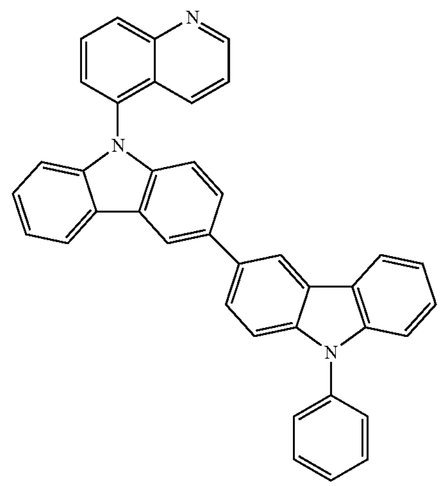
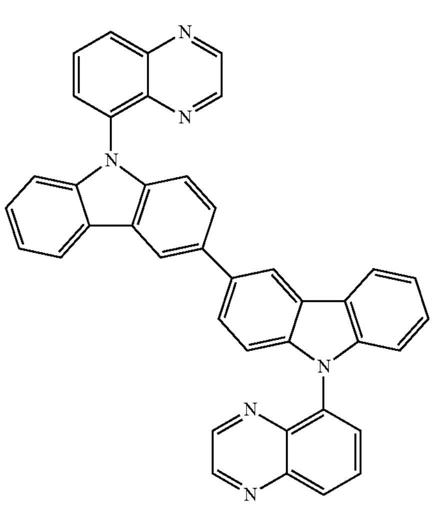
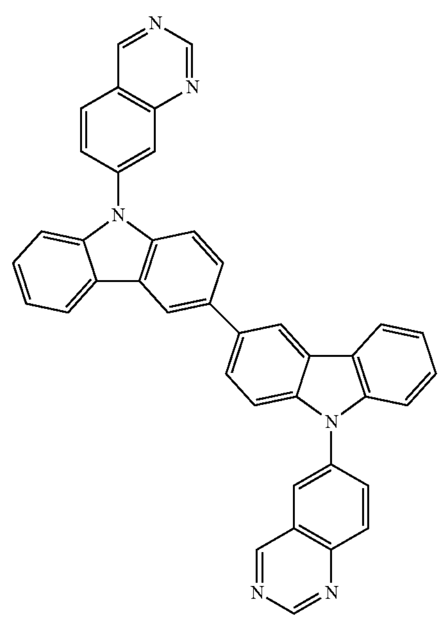

-continued
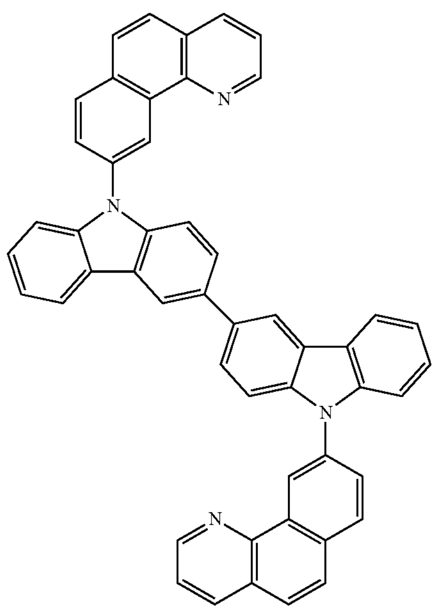
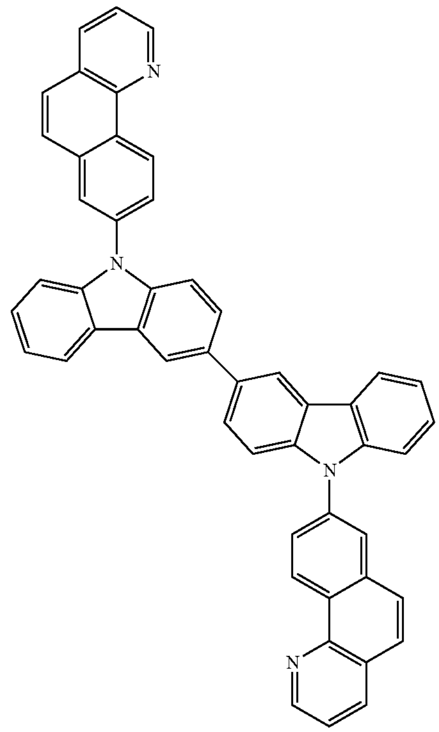
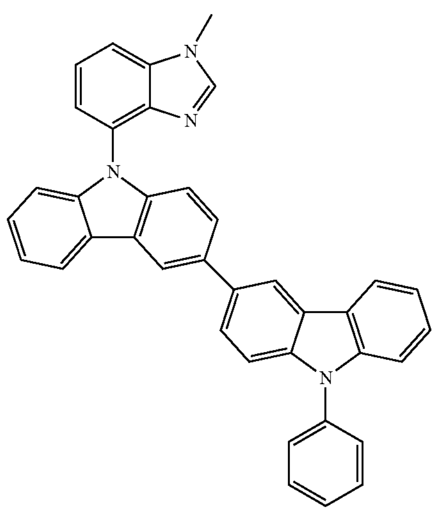
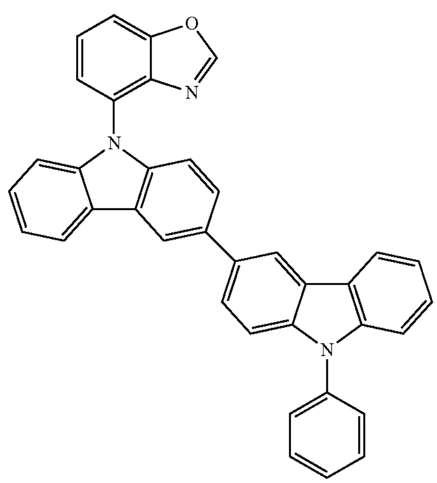

-continued
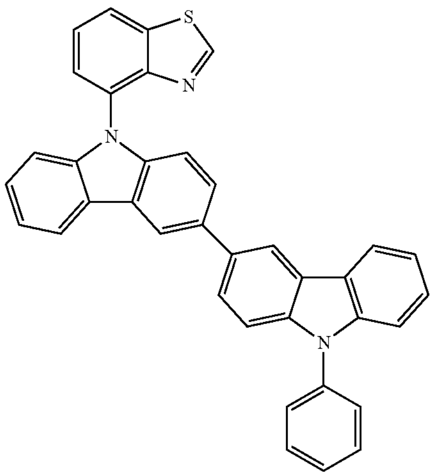
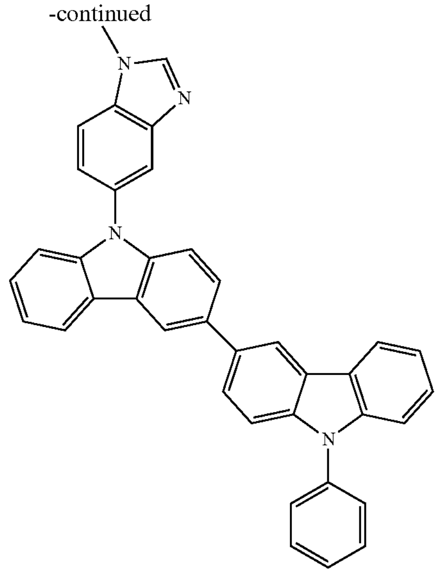
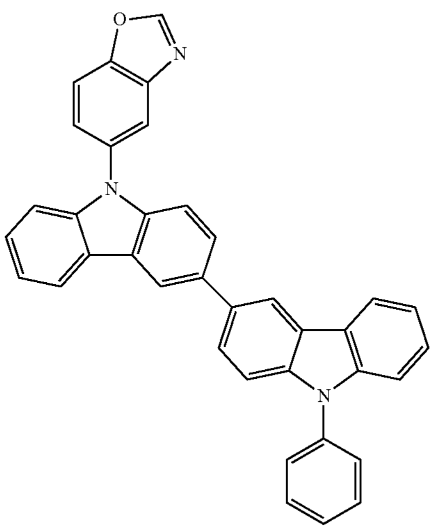
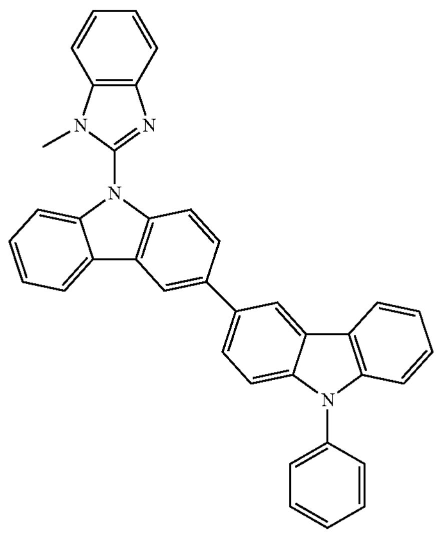
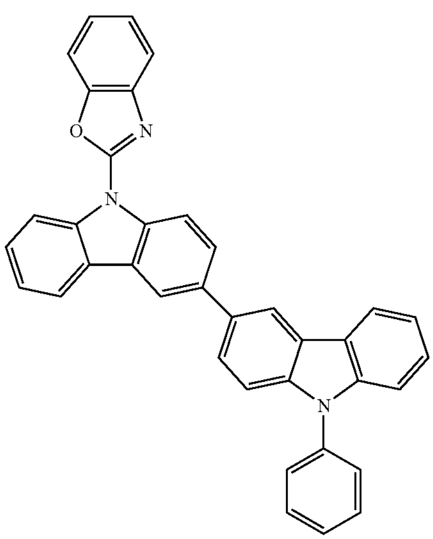
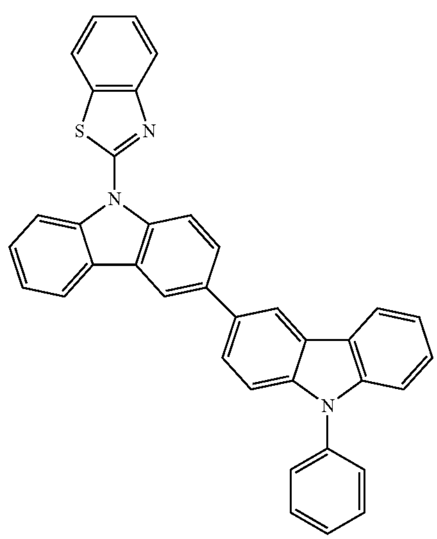

-continued
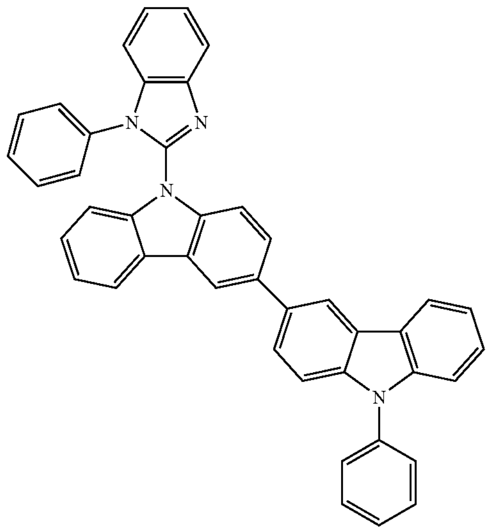
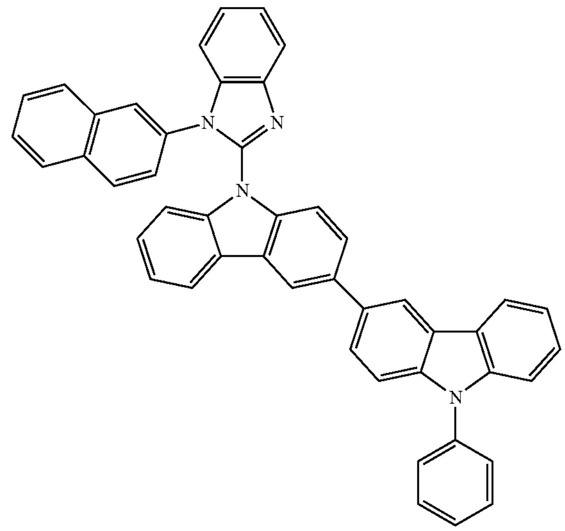
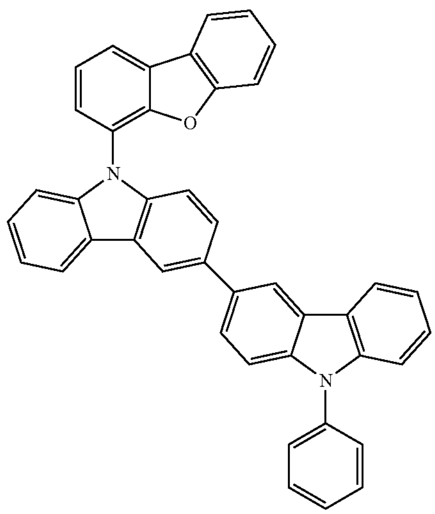
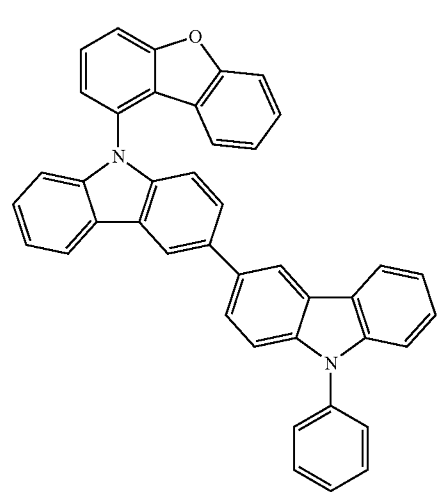
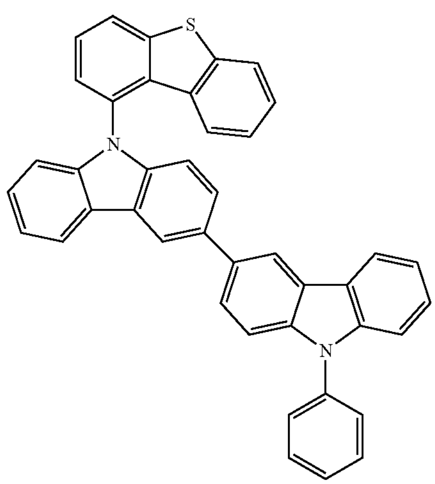
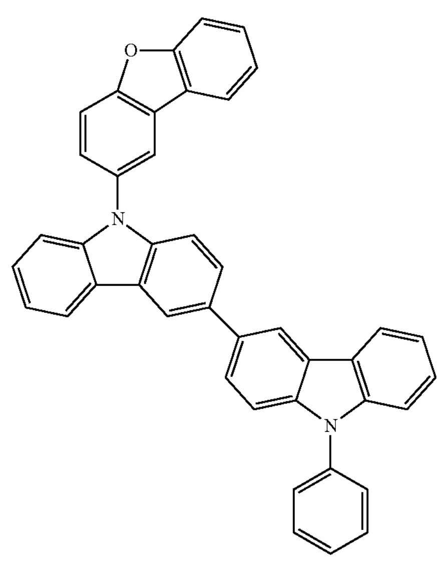

-continued
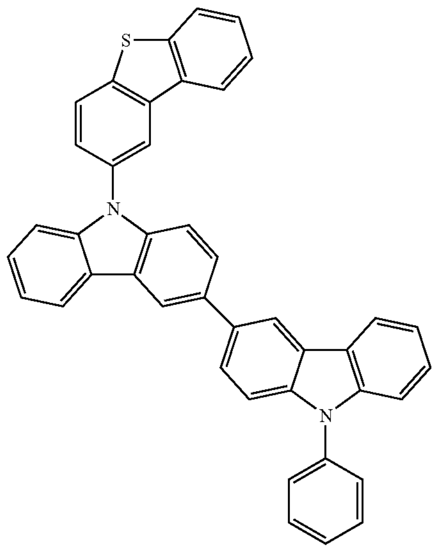
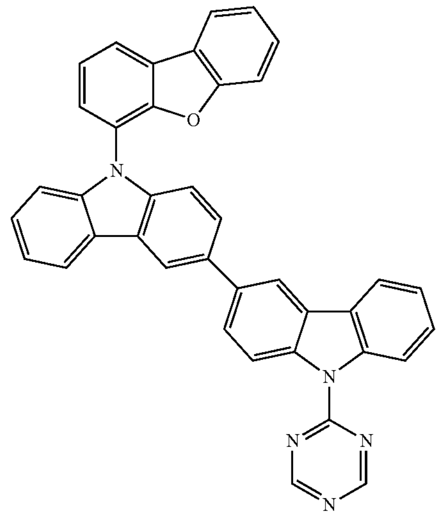
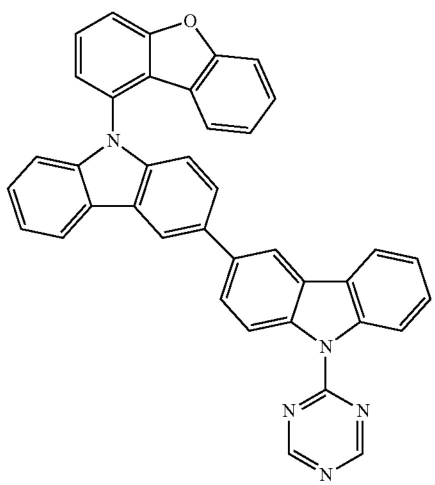
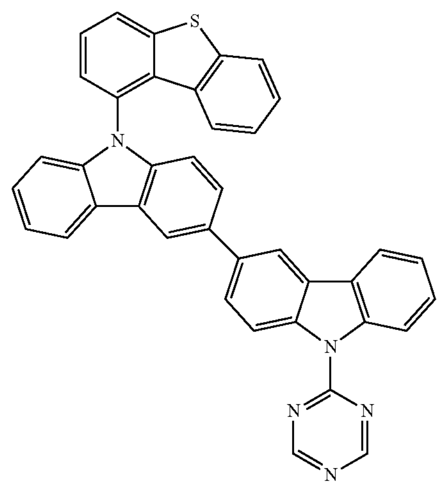
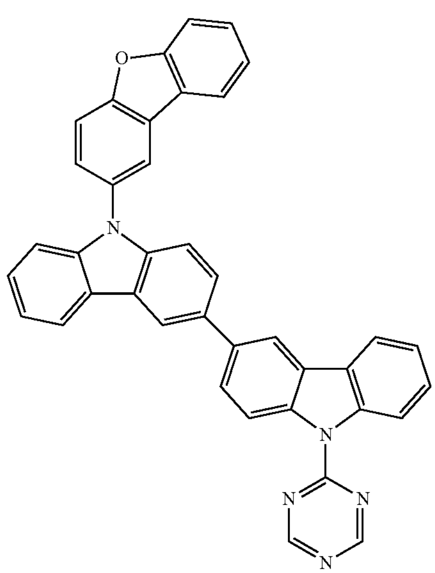
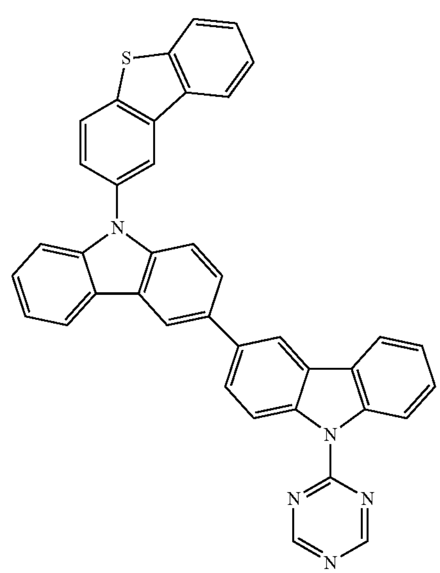

-continued
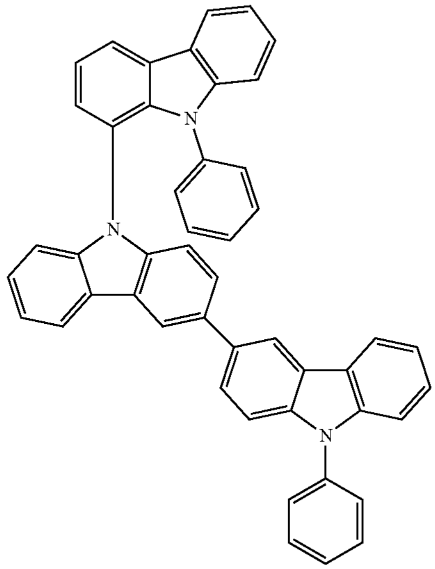
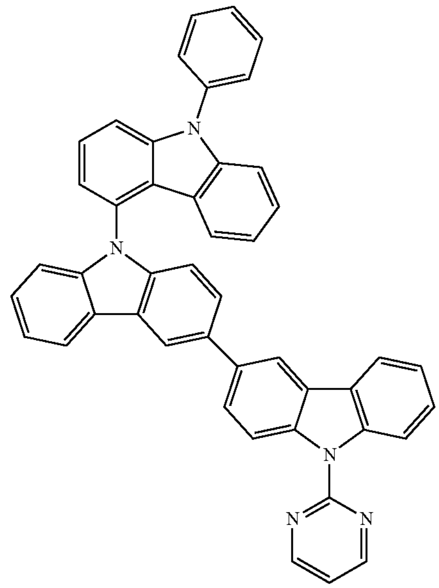
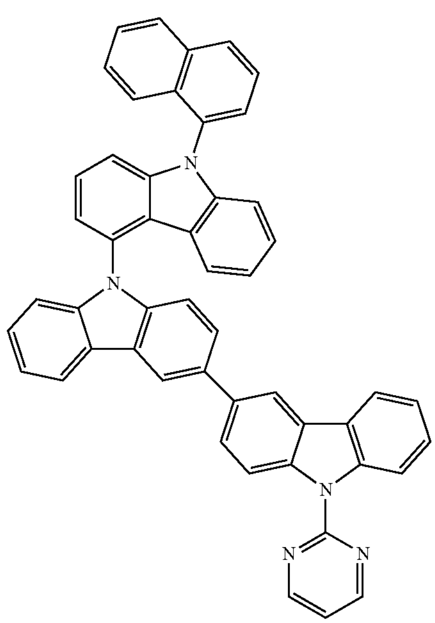
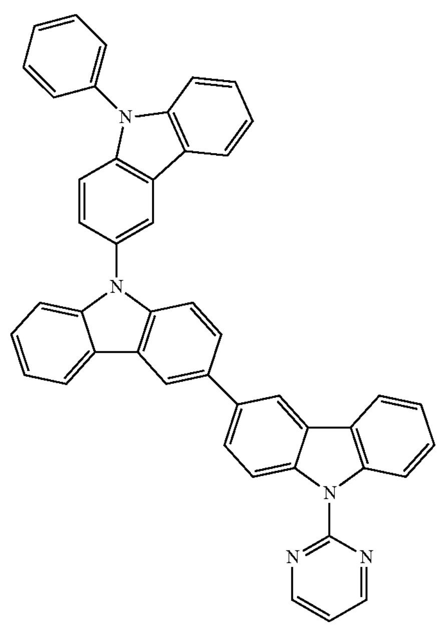

-continued
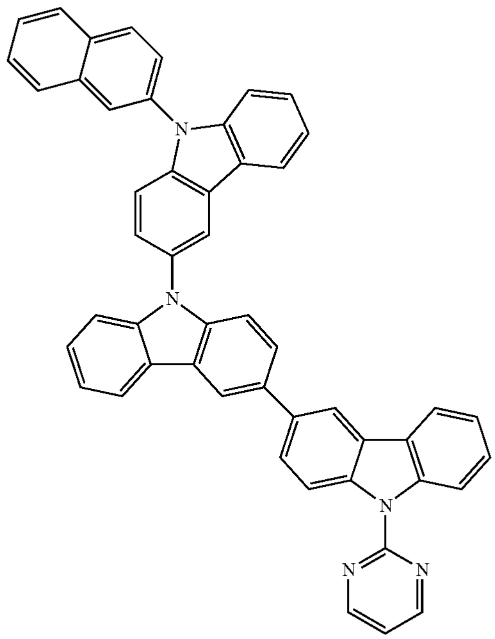
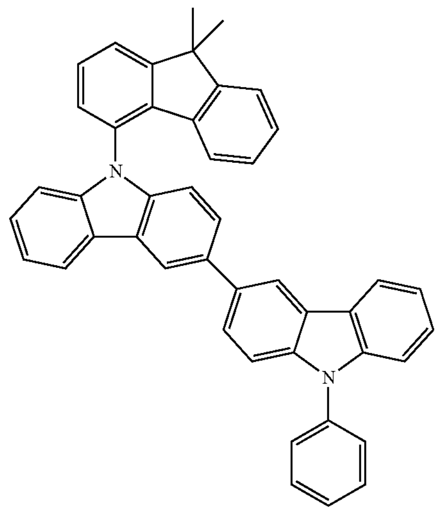
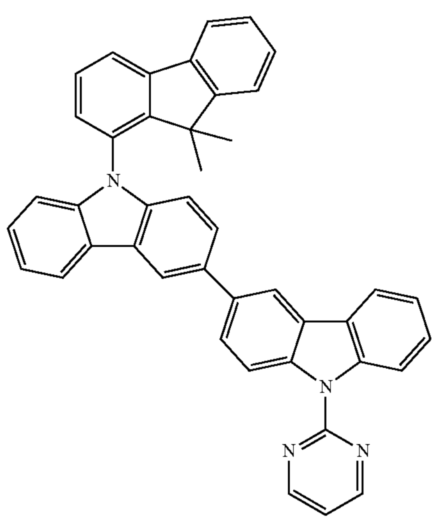
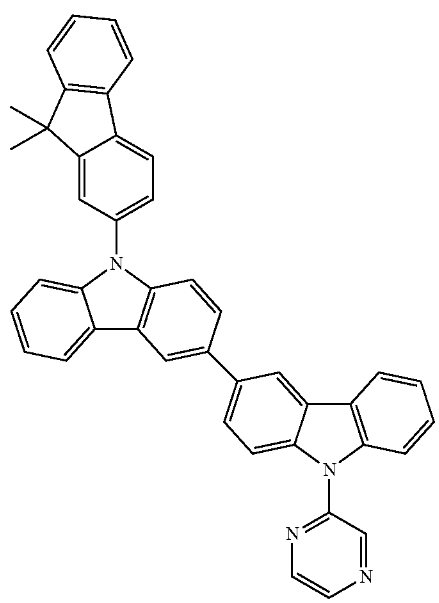

-continued
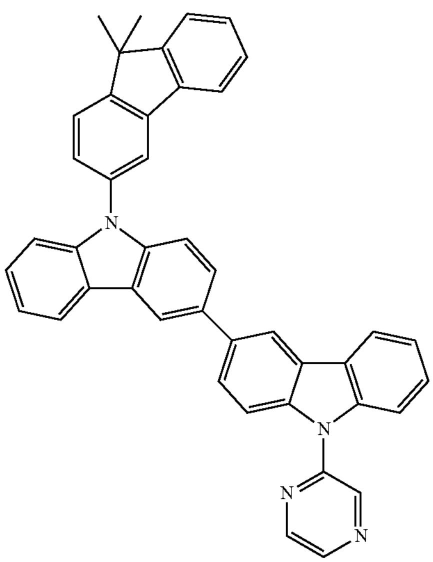
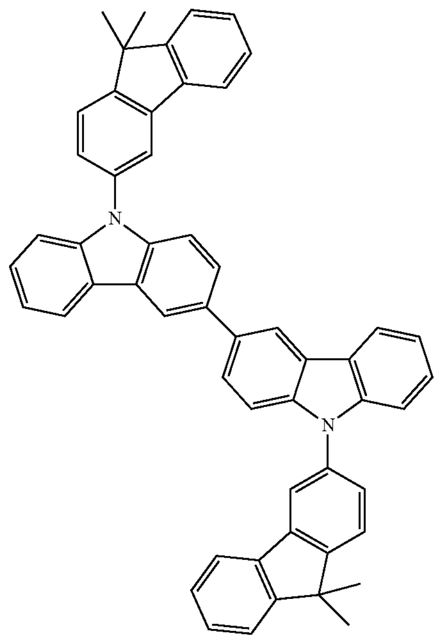
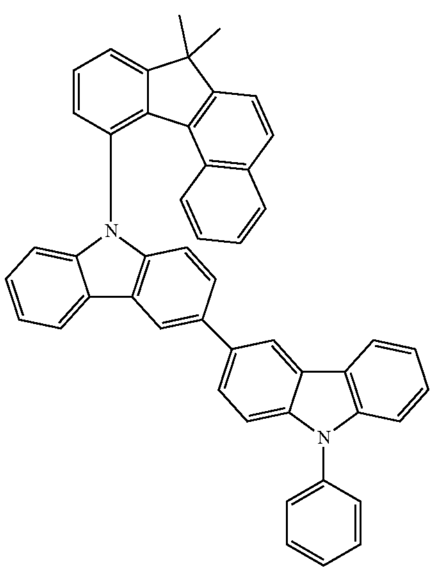
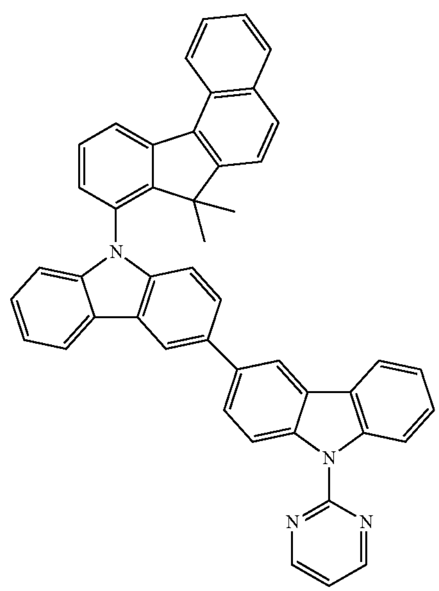

-continued
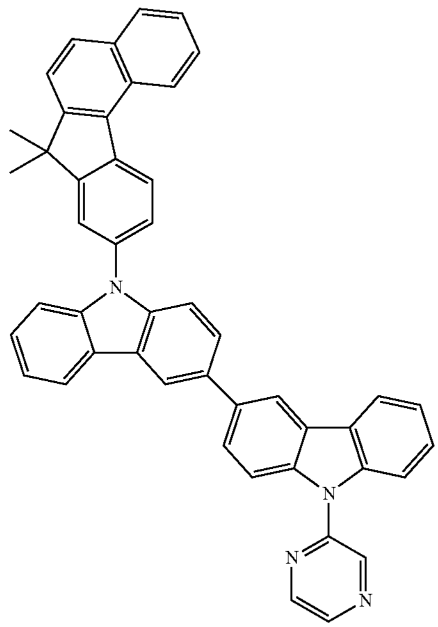
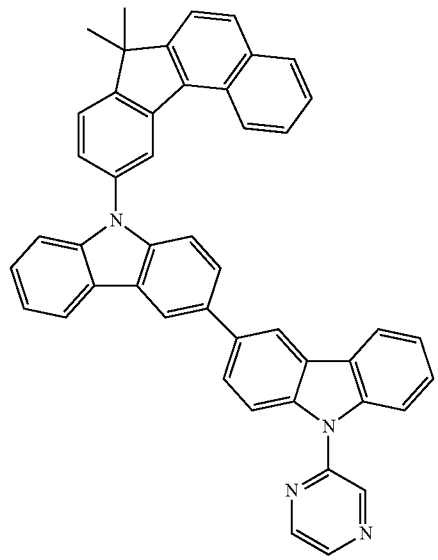
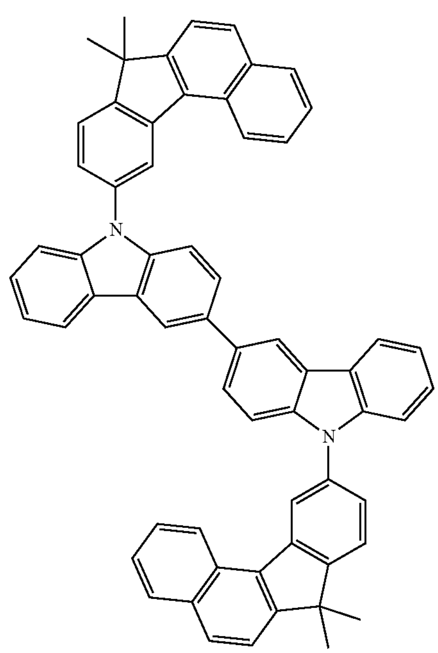
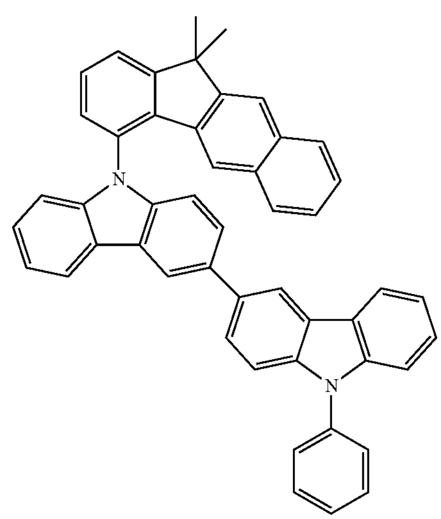

-continued
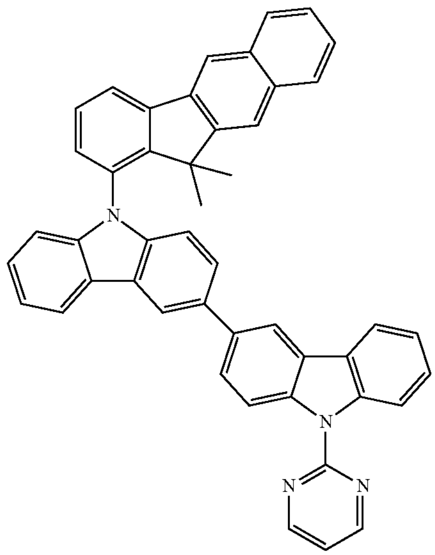
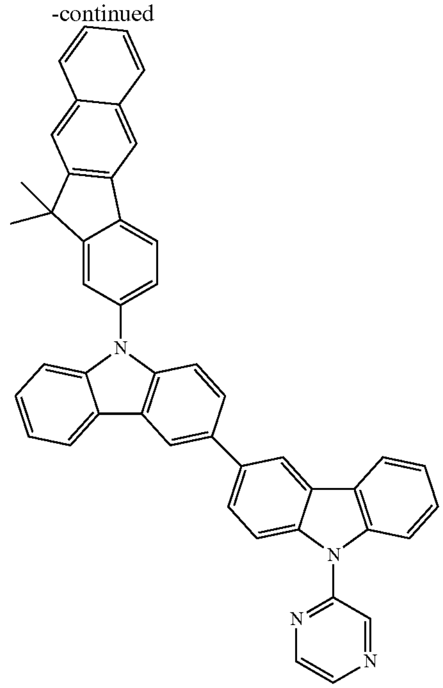
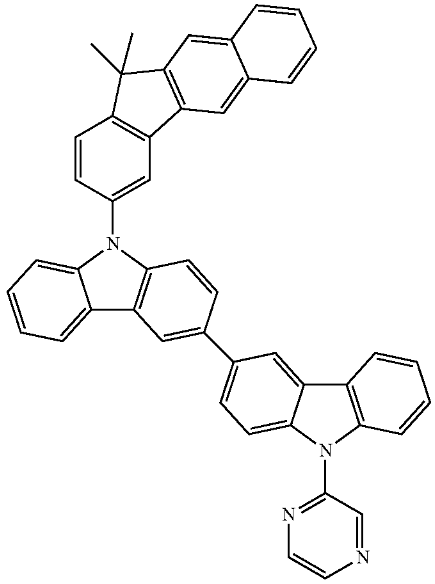
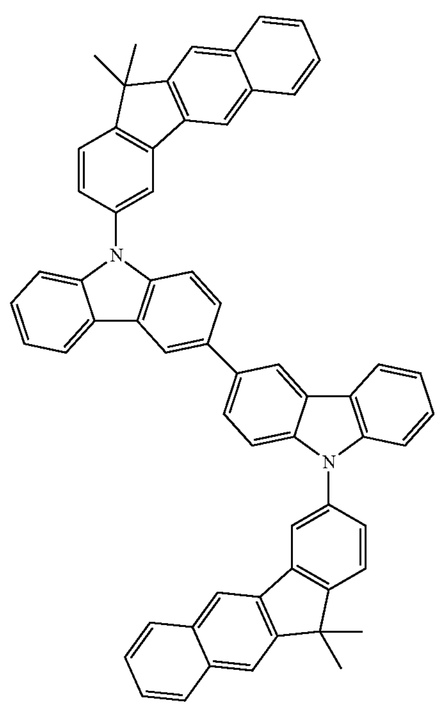

-continued
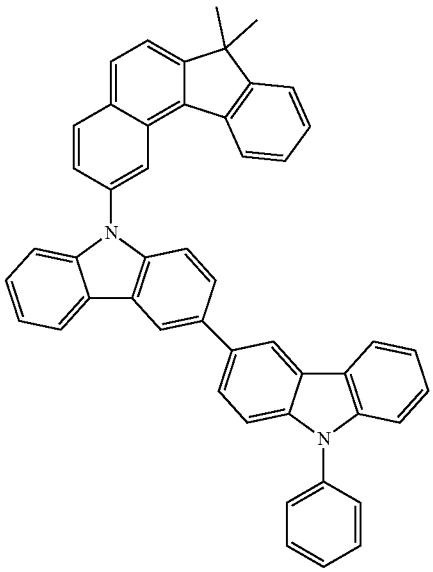
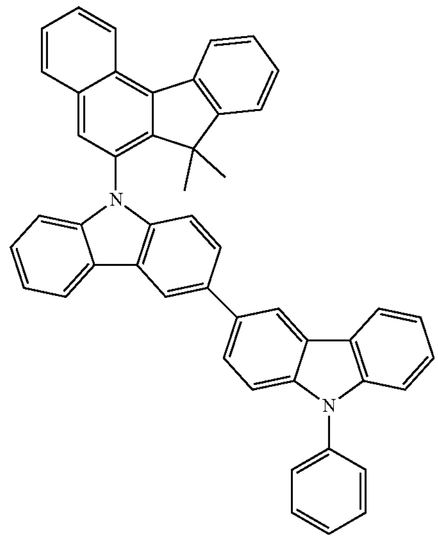
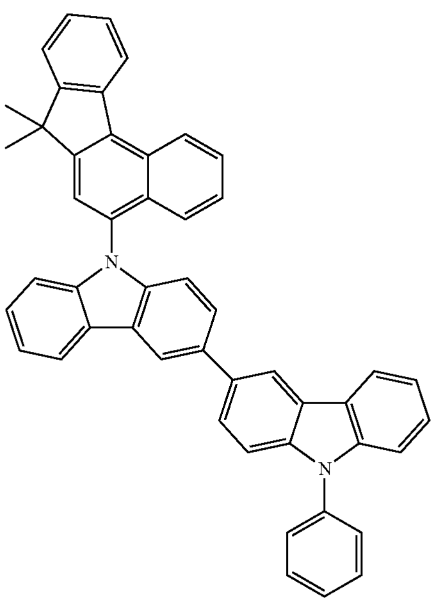
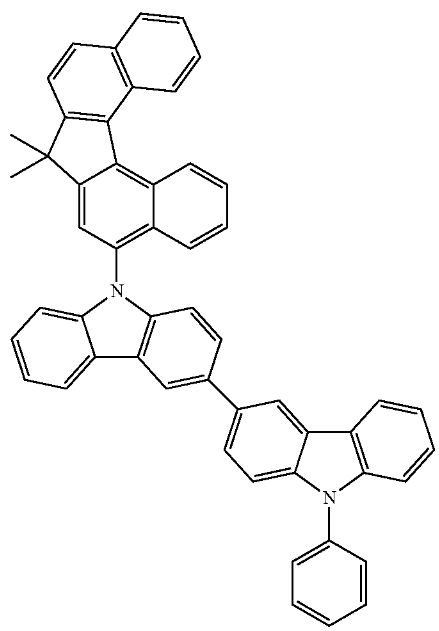

-continued
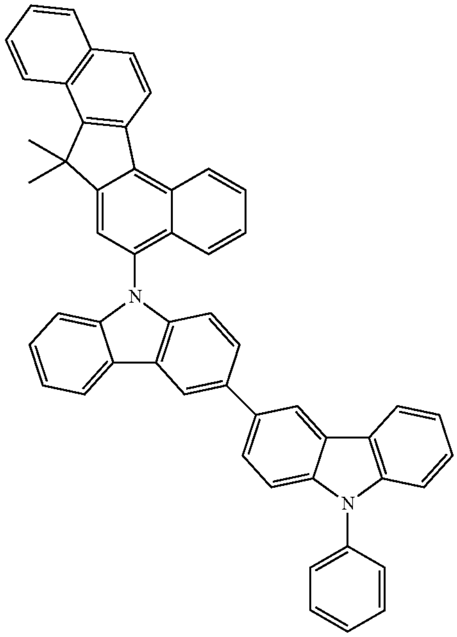
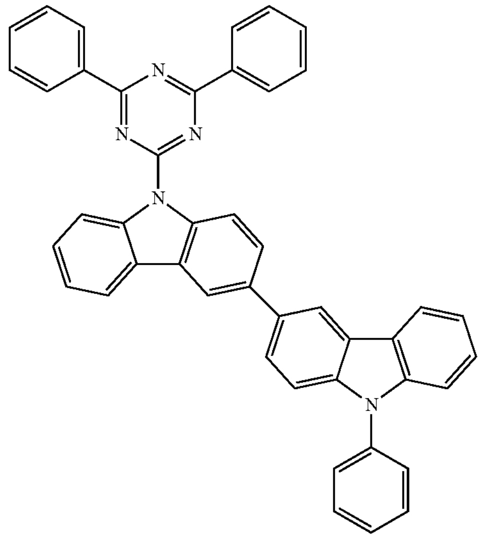
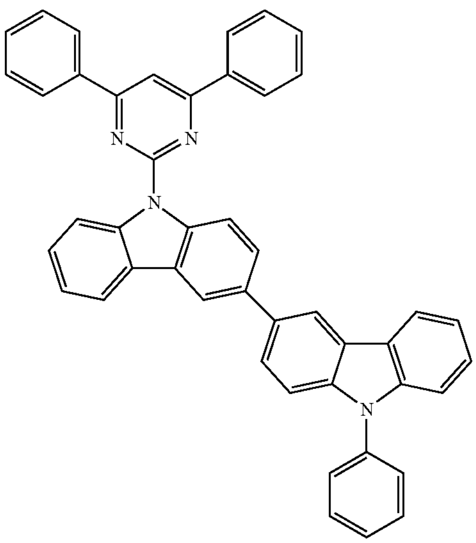
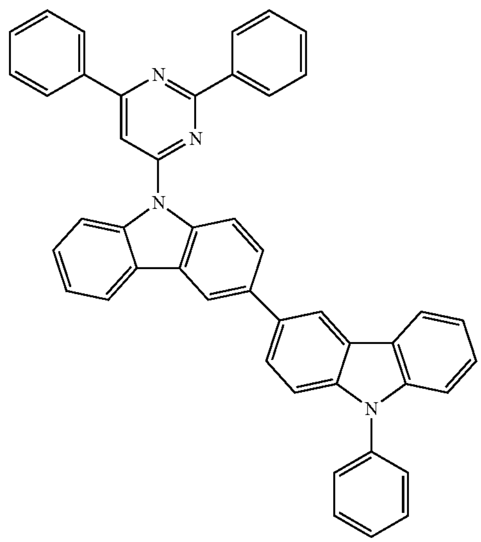
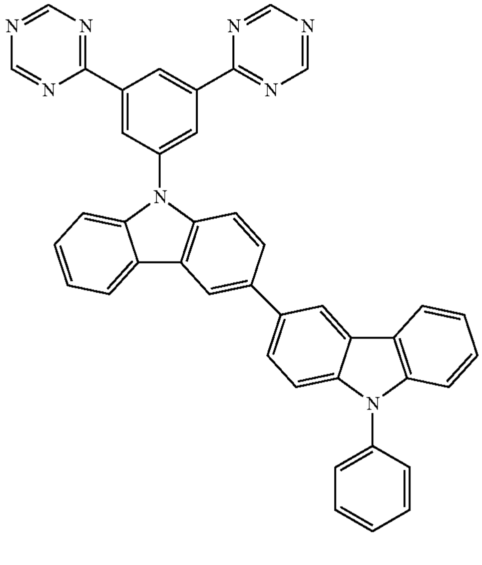
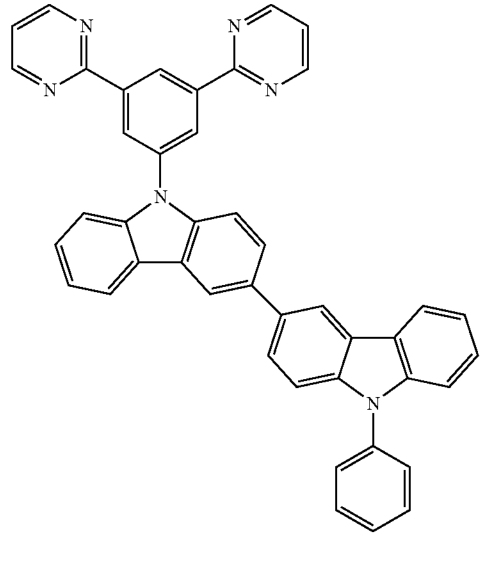

-continued
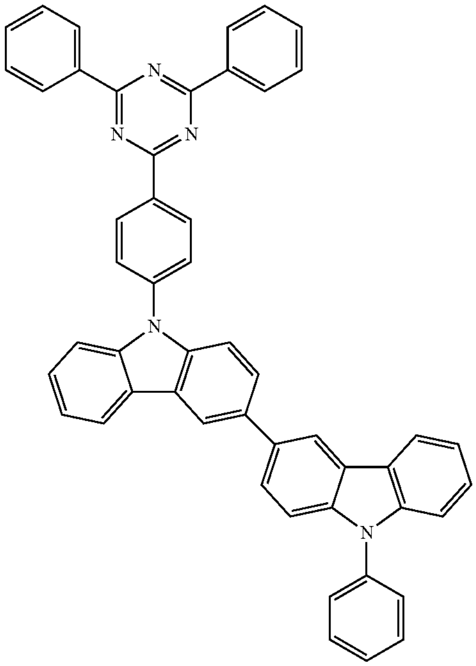
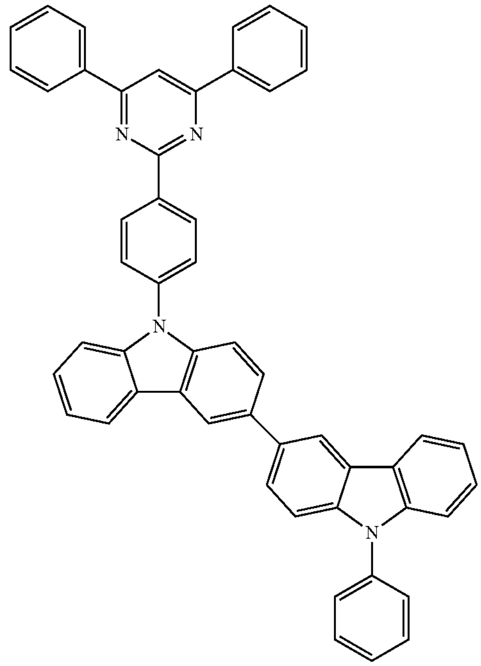
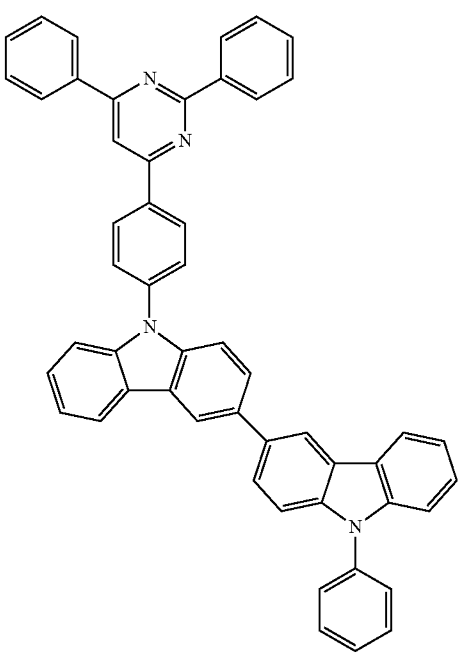
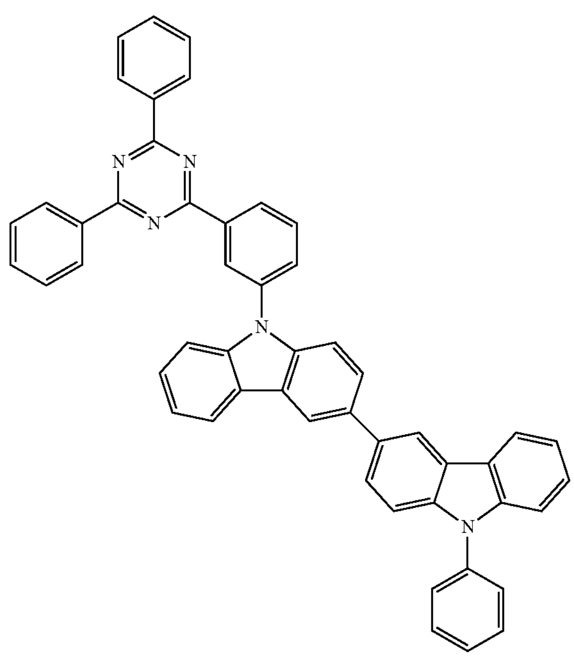

-continued
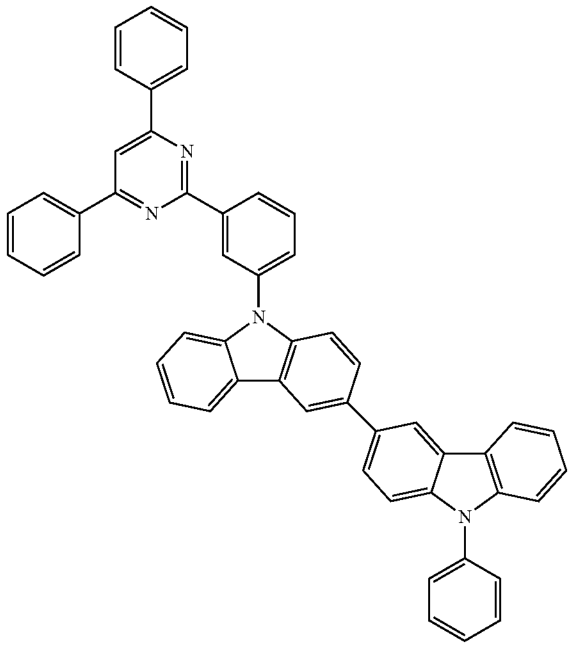
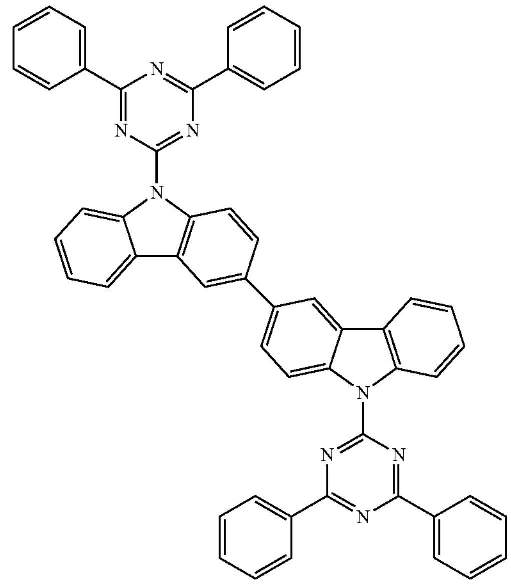
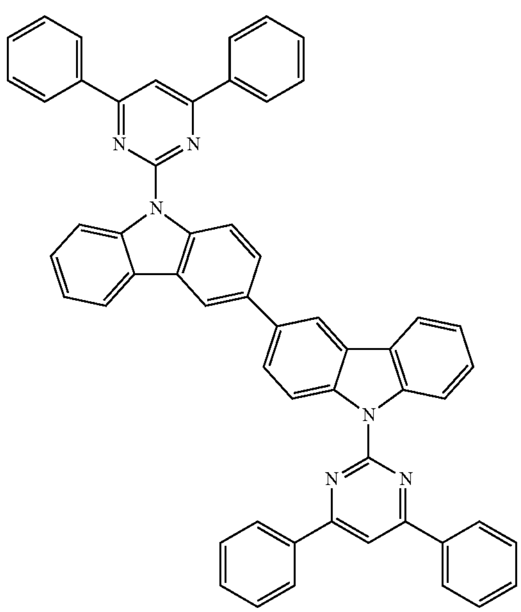
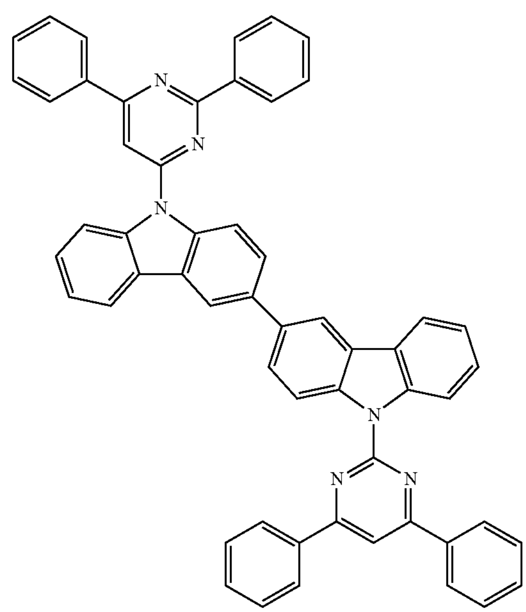

-continued
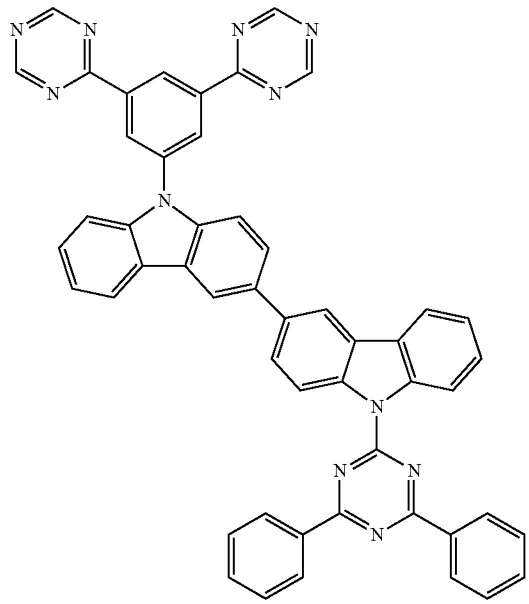
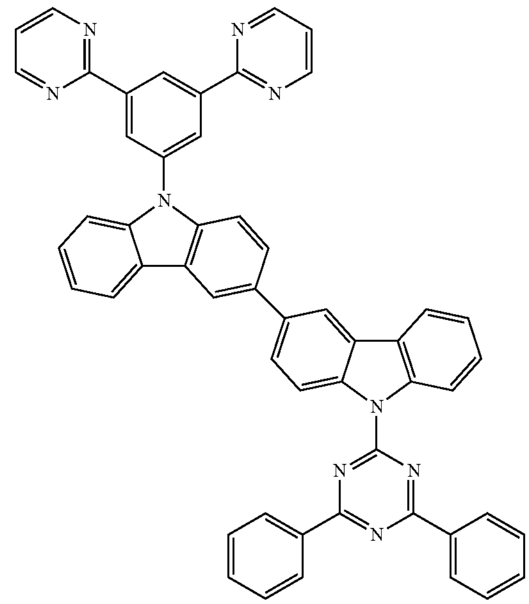
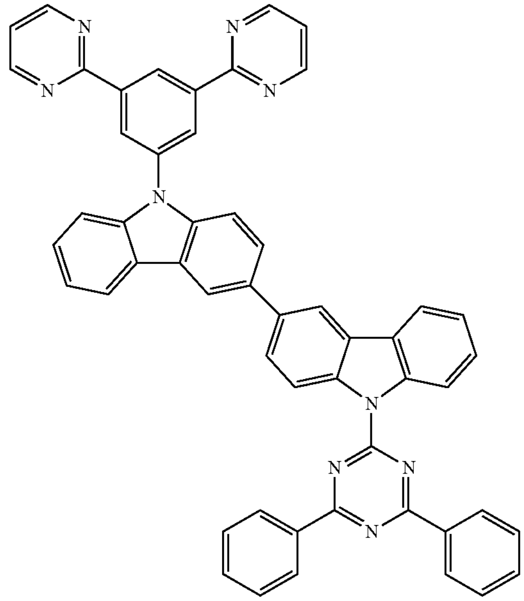
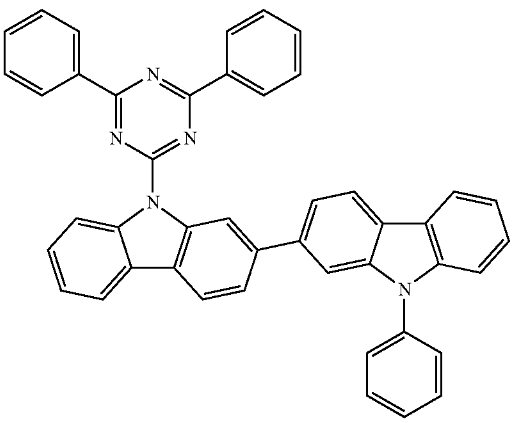
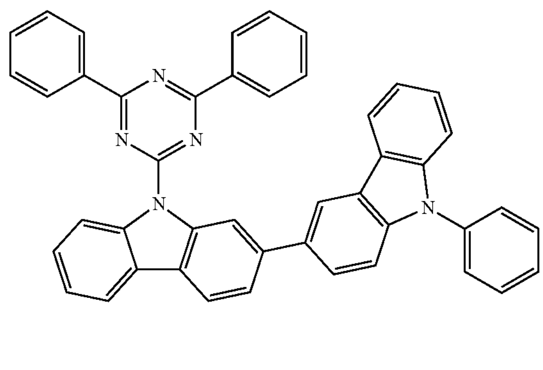
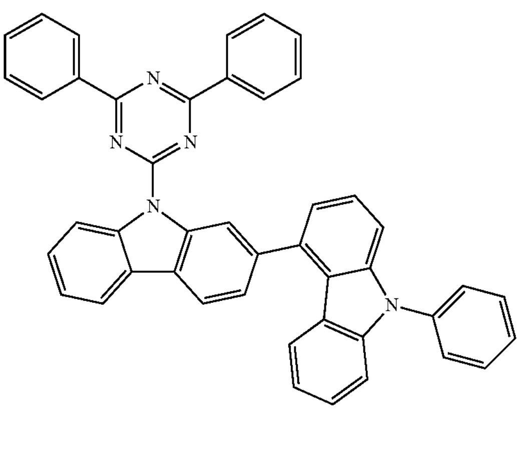

-continued
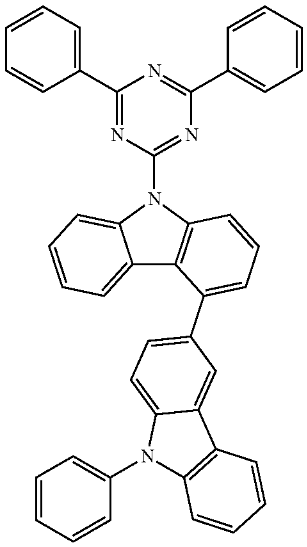
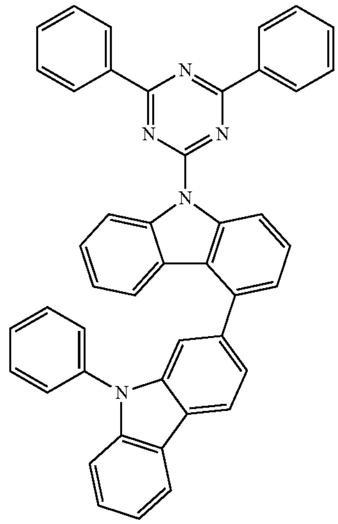
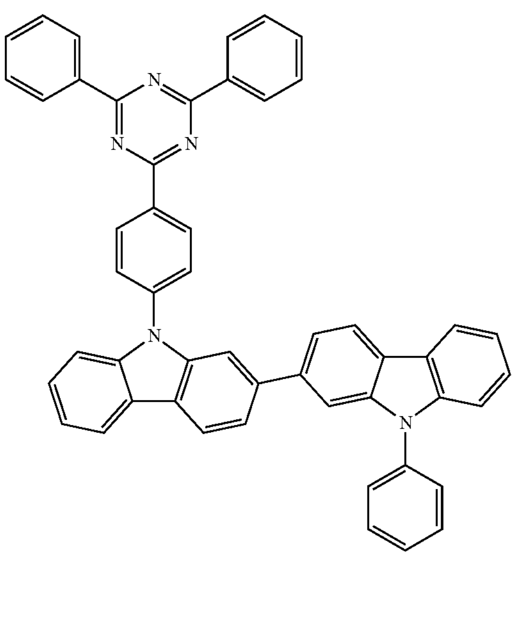
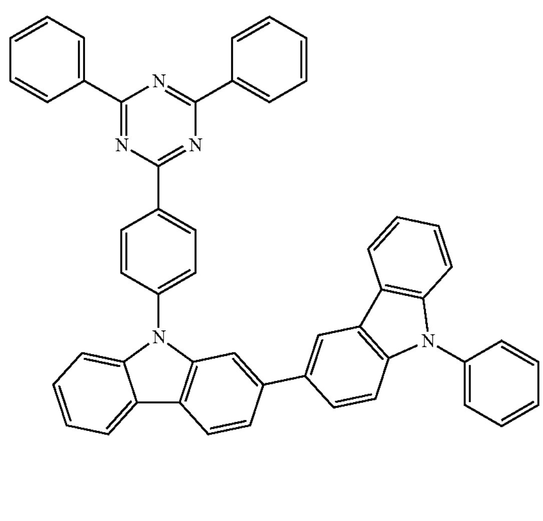

-continued
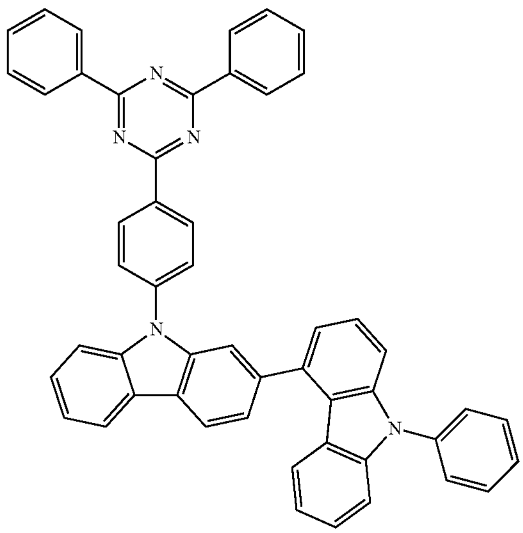
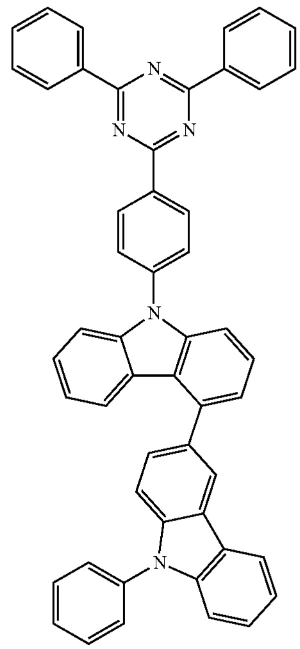
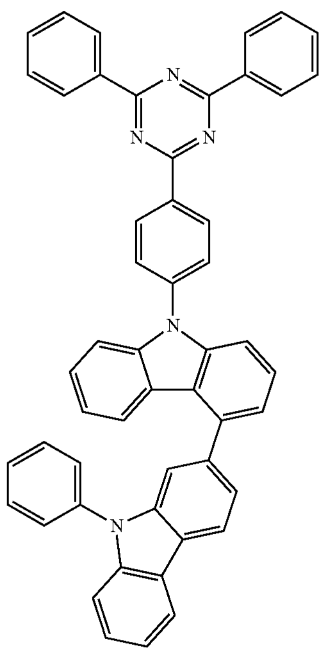
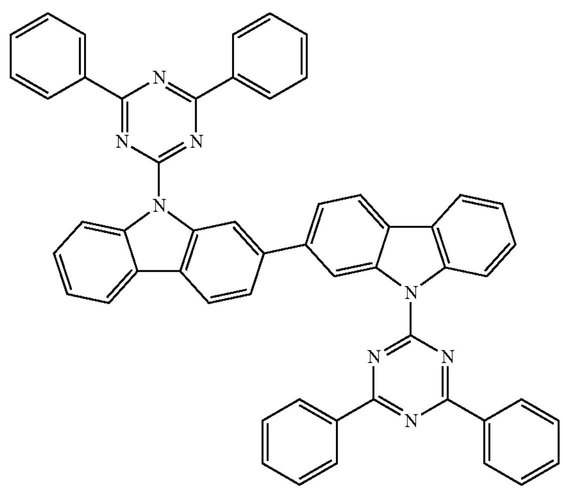
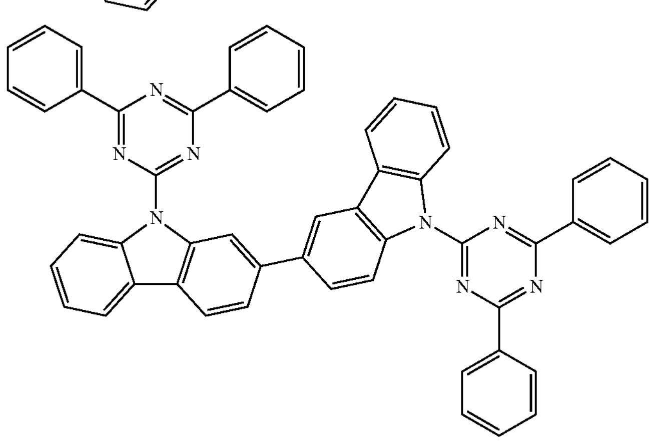

-continued
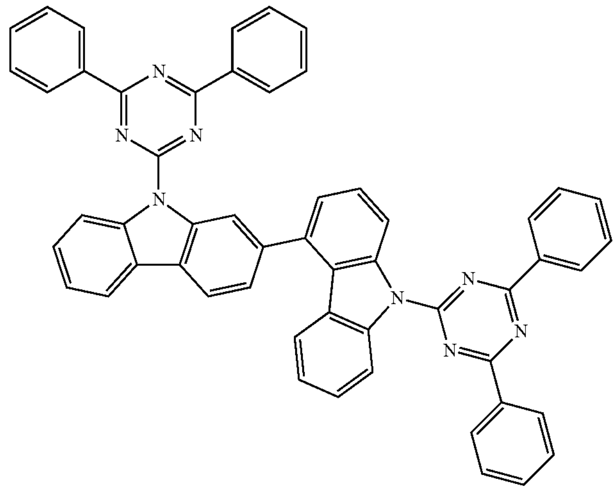
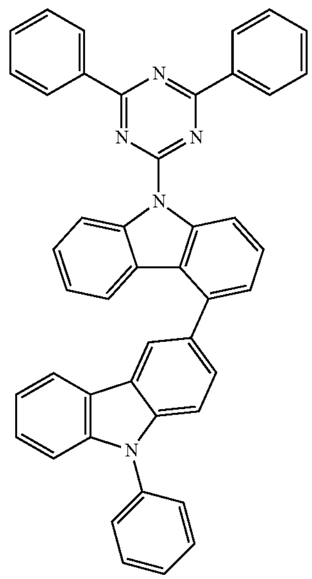
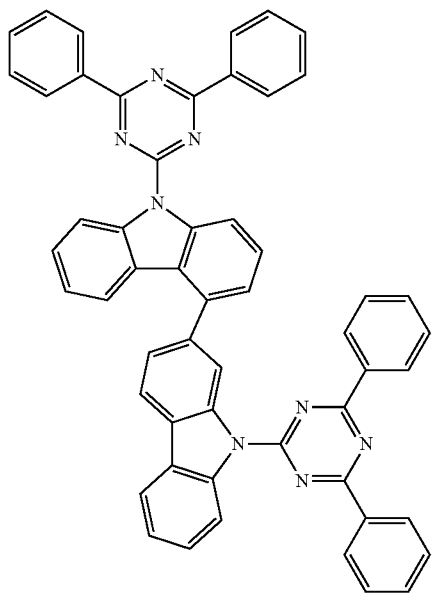
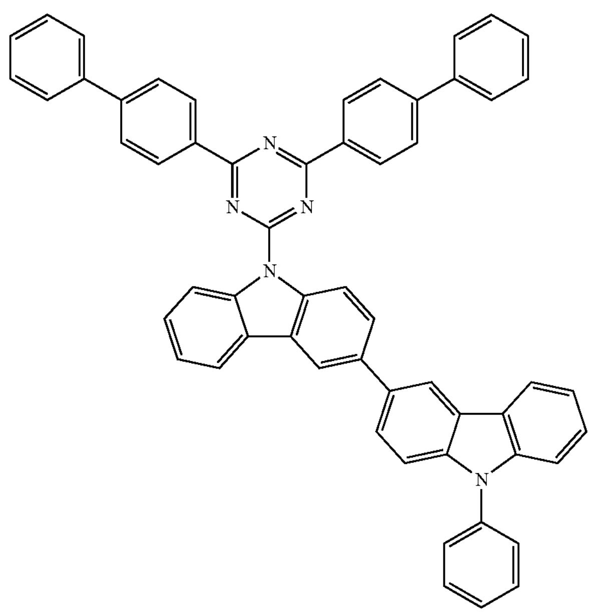

-continued
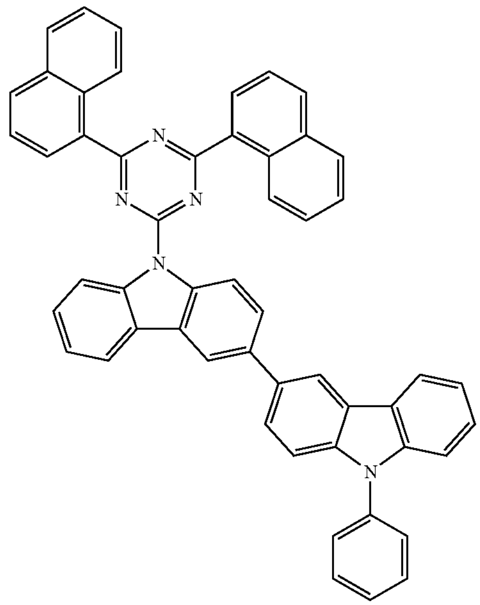
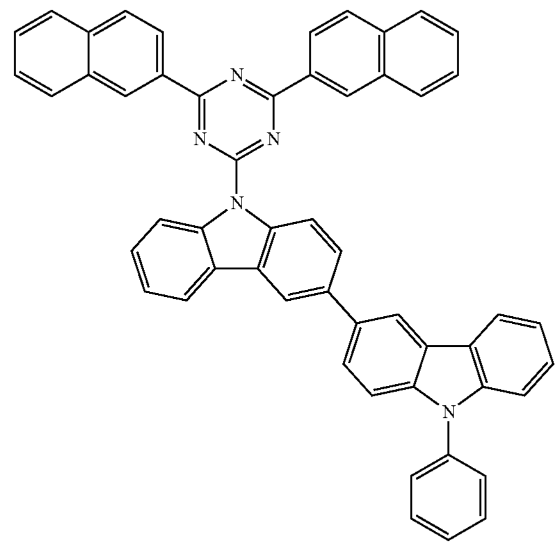
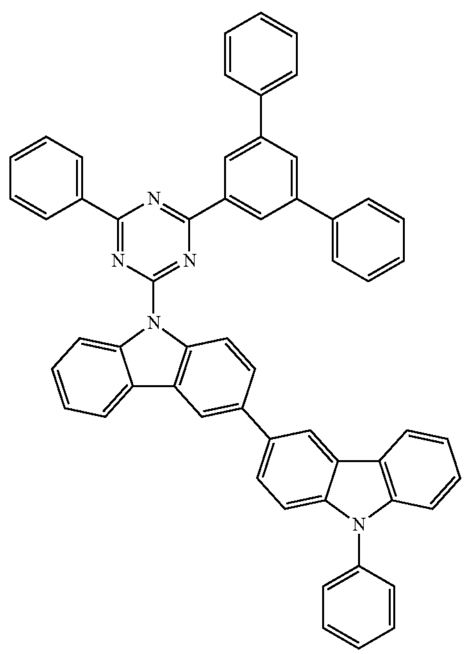
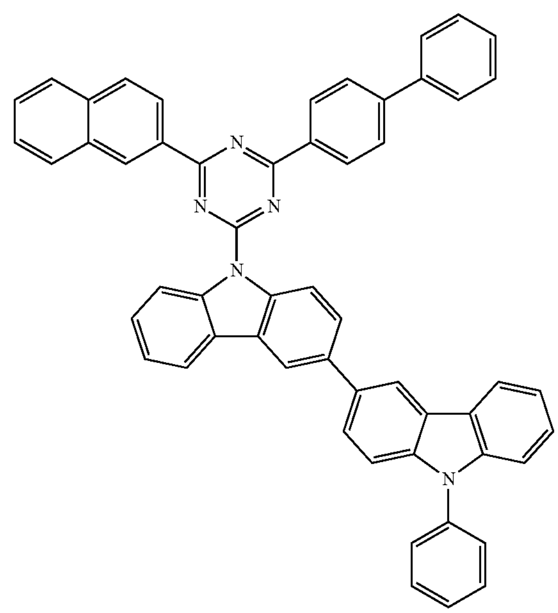

-continued
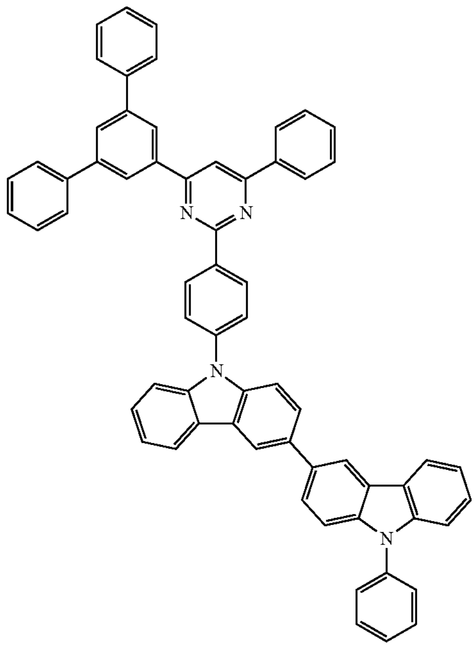
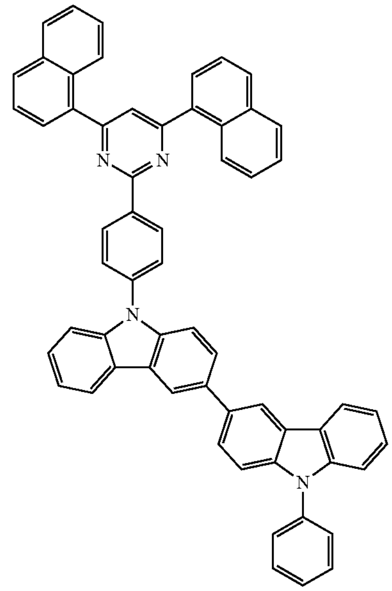
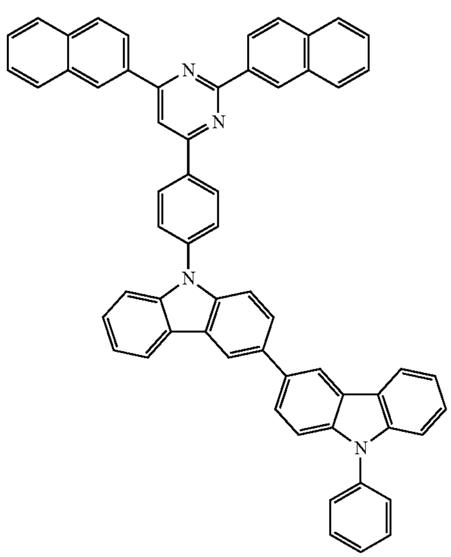
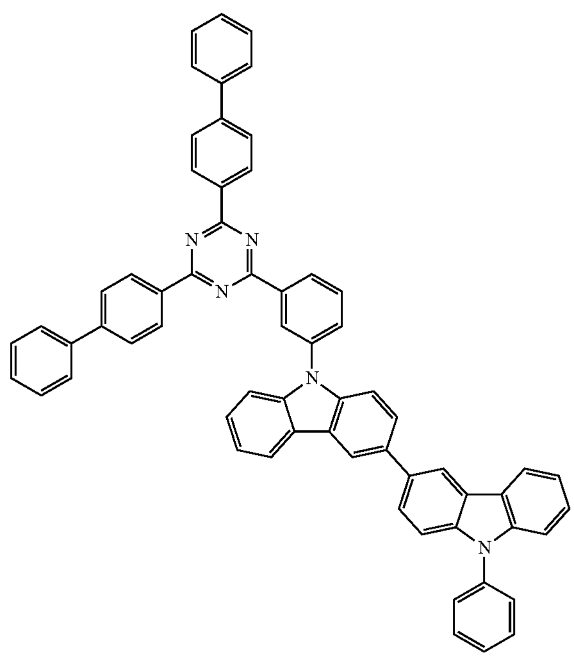

-continued
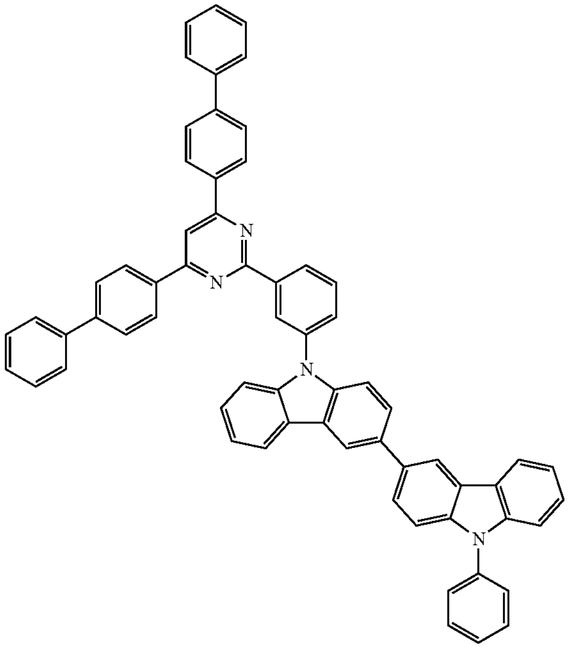
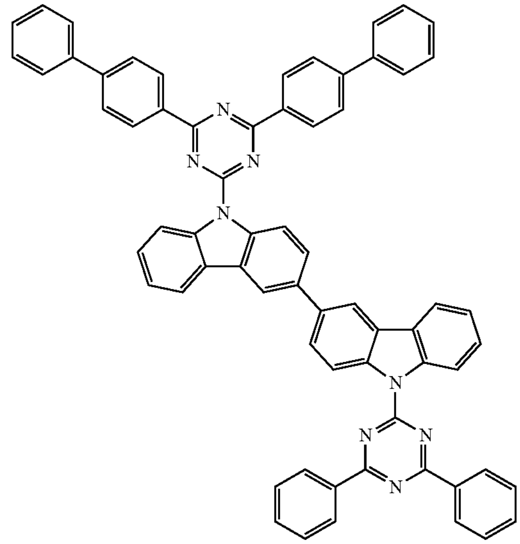
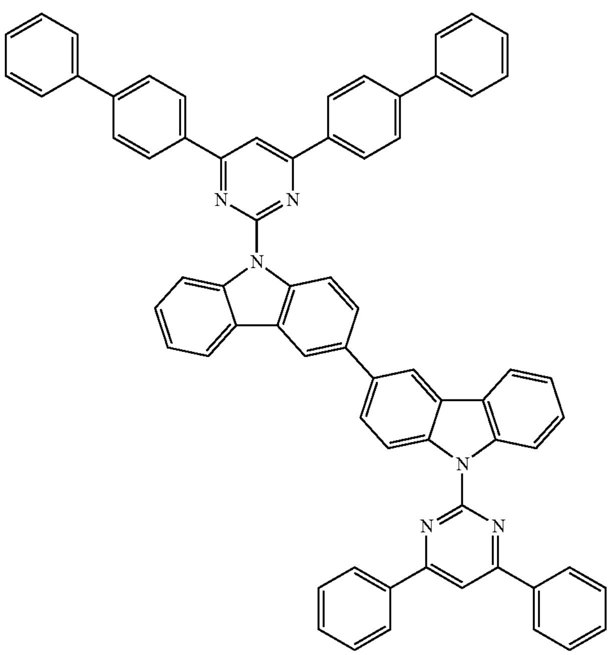

-continued
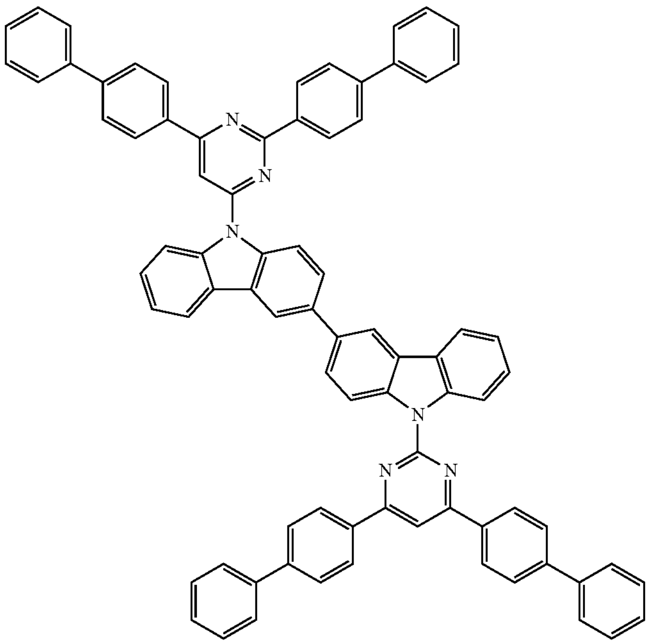
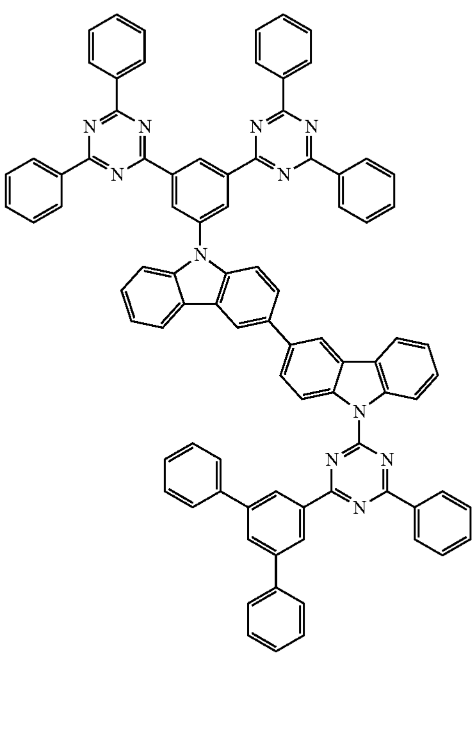
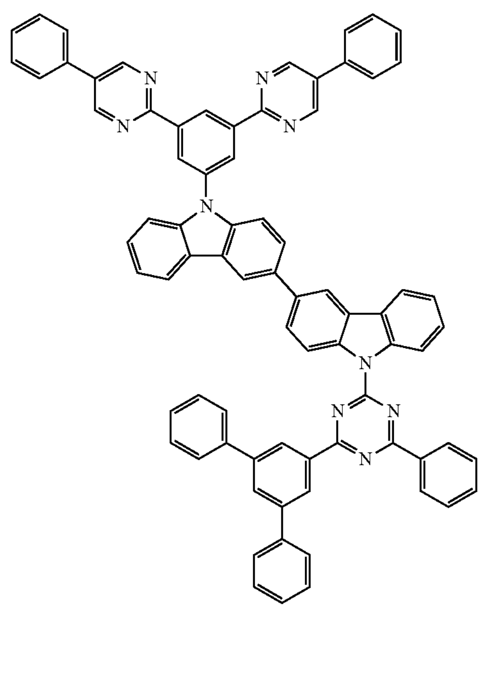

-continued
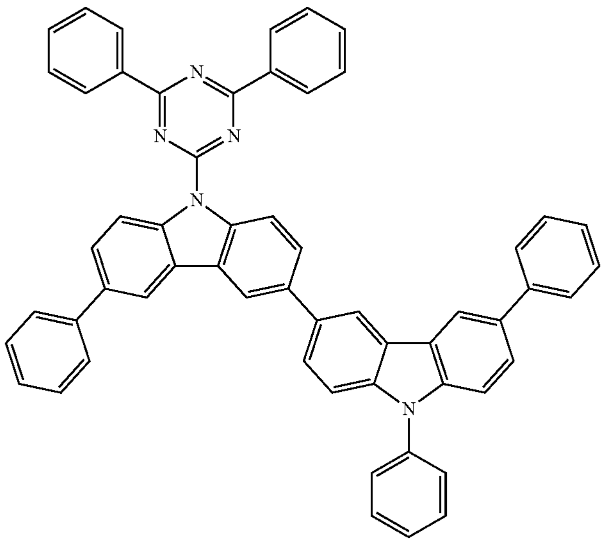
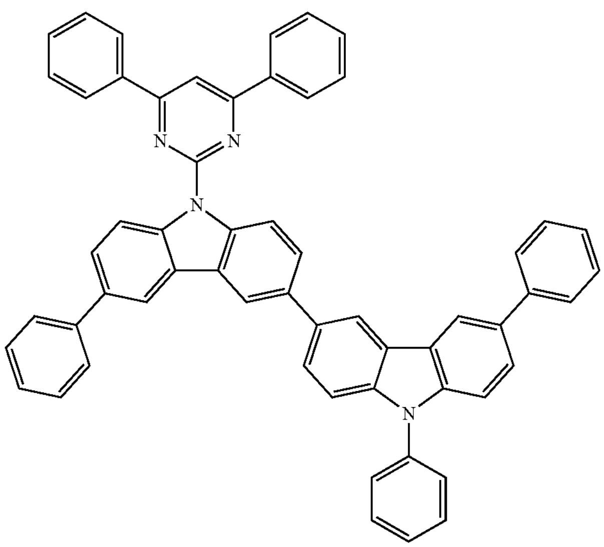
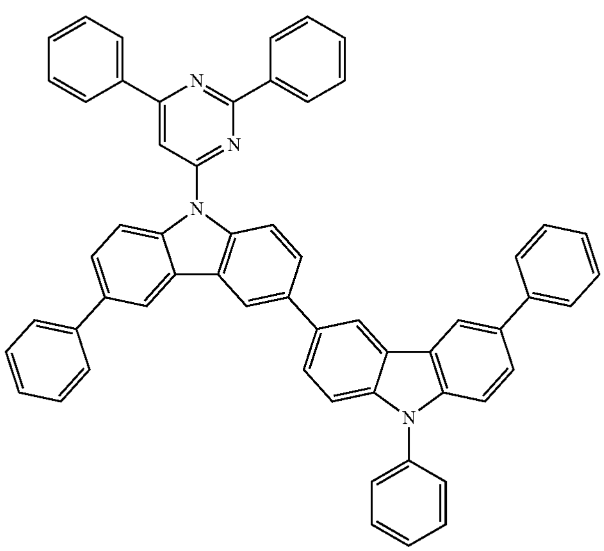

-continued
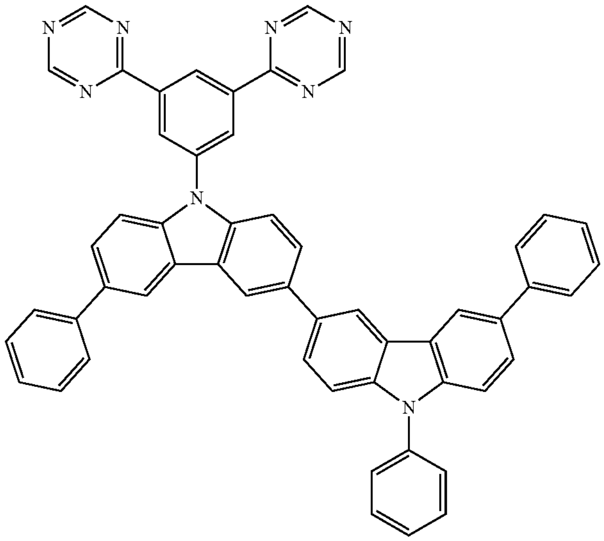
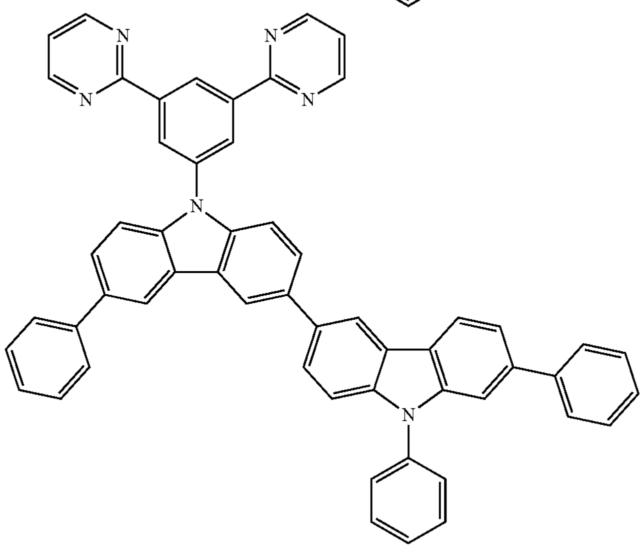
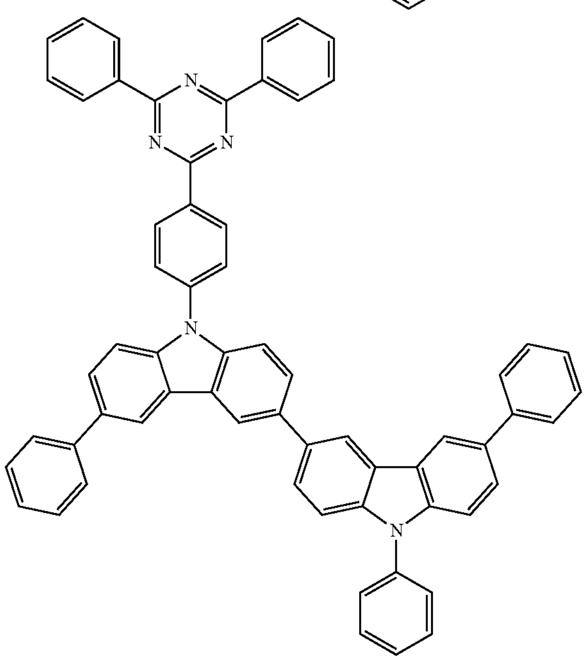

-continued
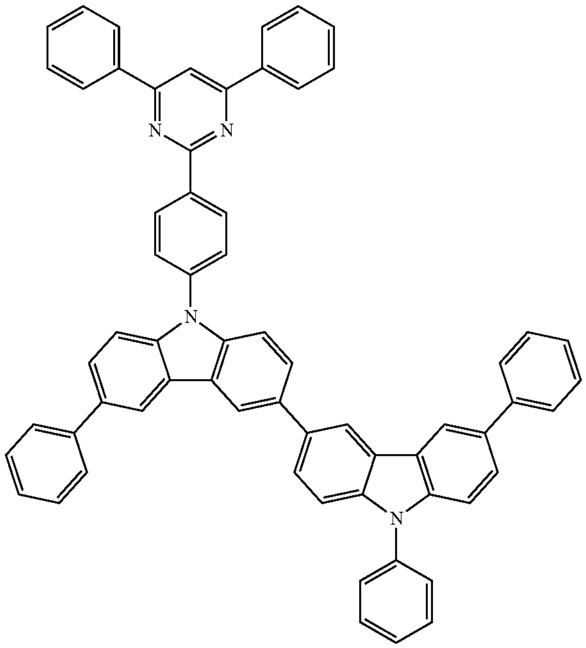
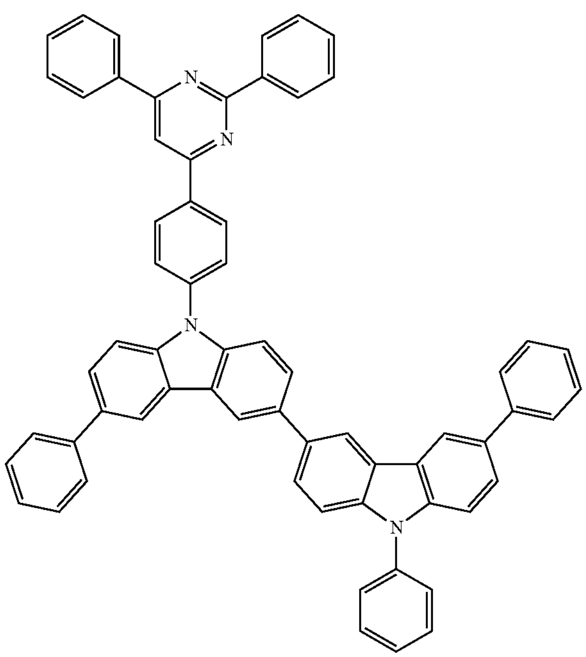

-continued
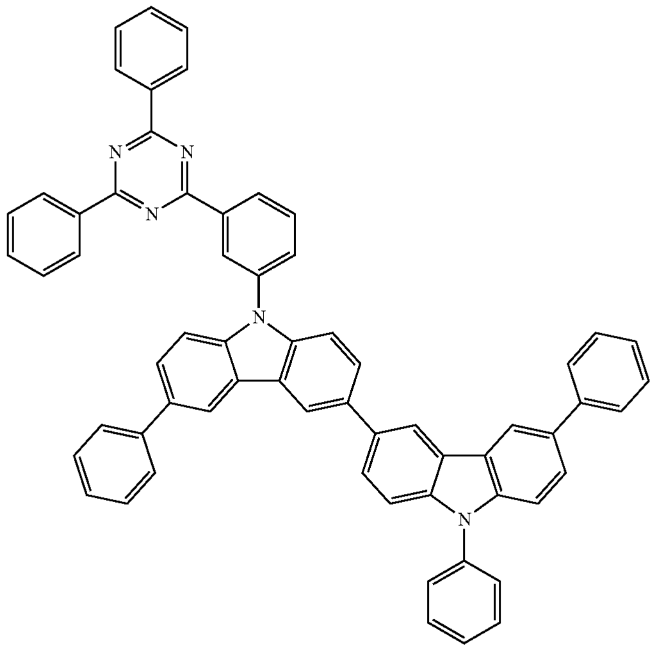
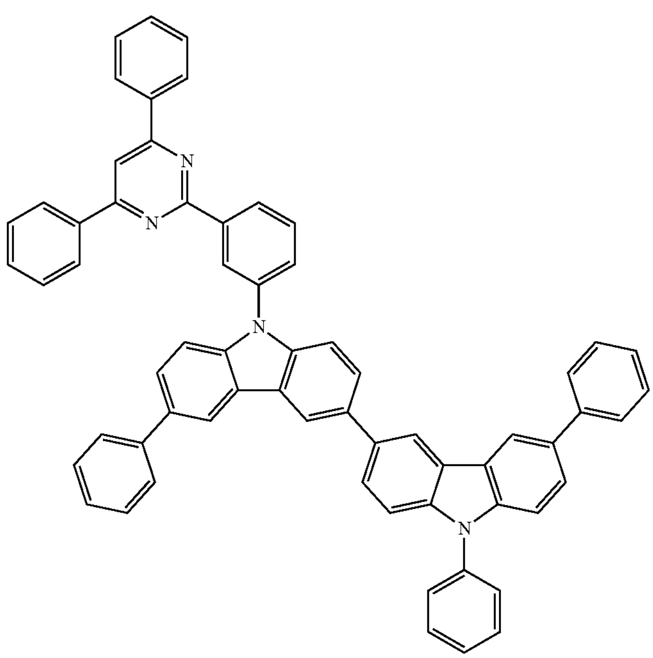

-continued
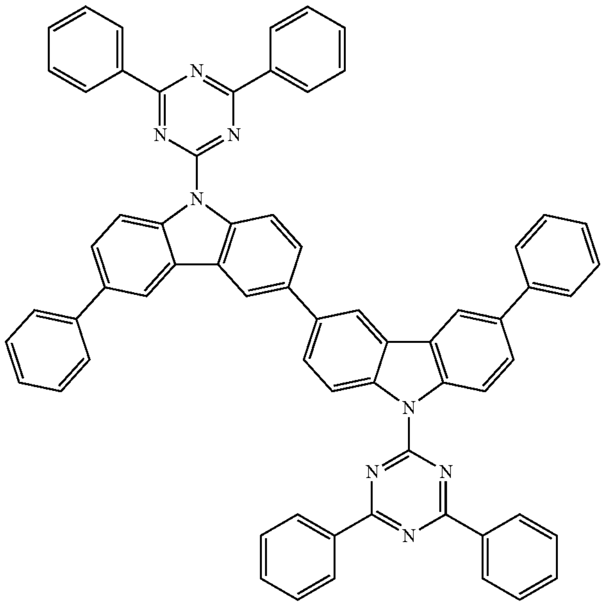
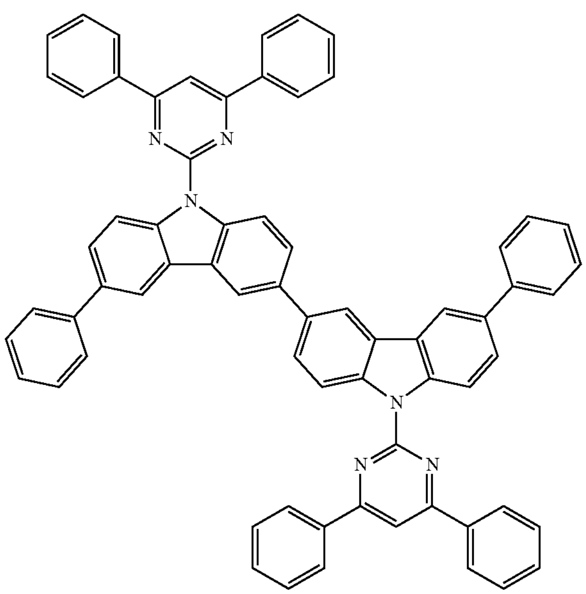

-continued
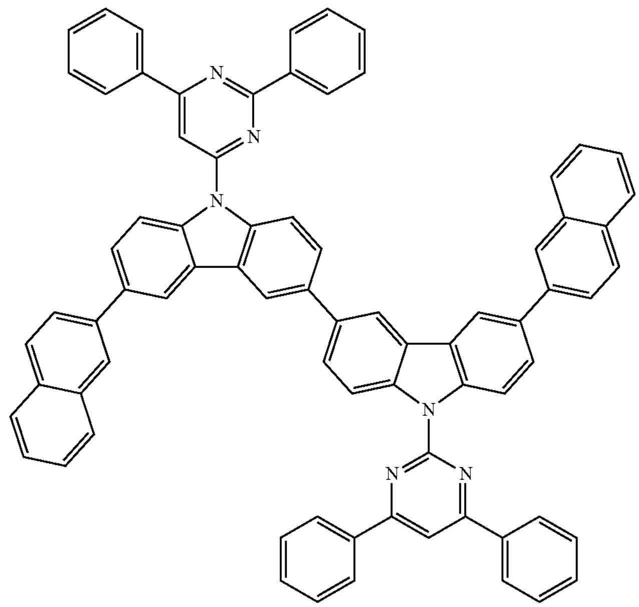
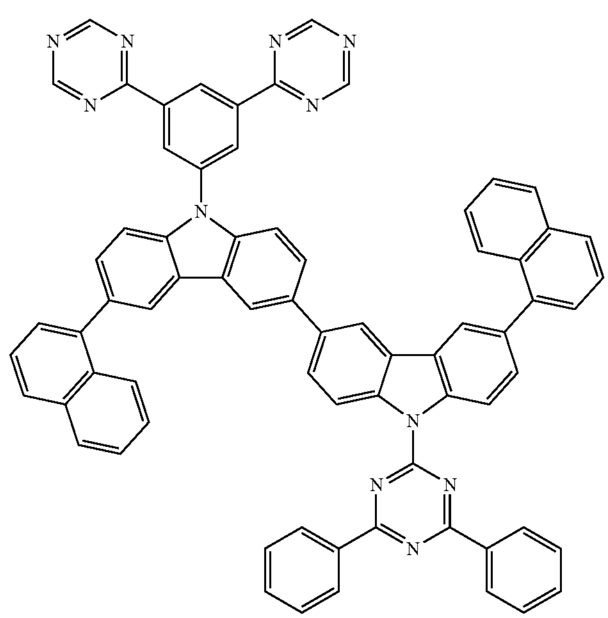

-continued
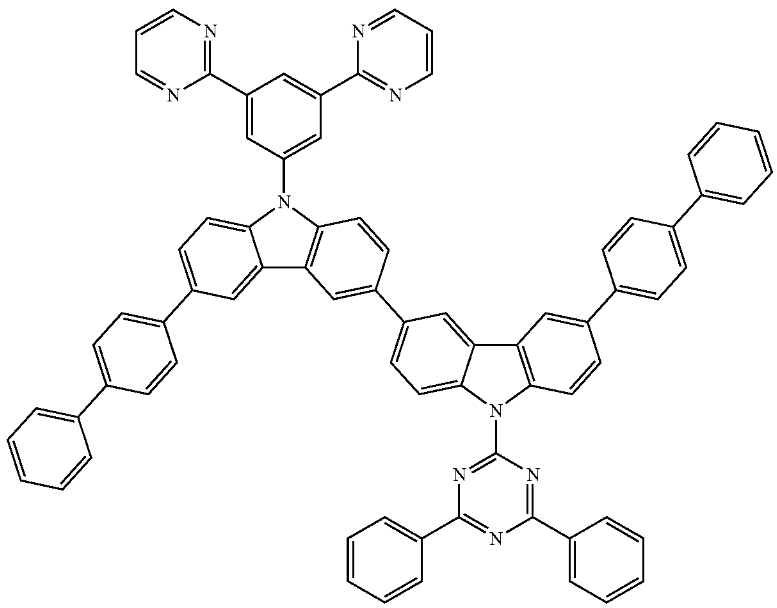
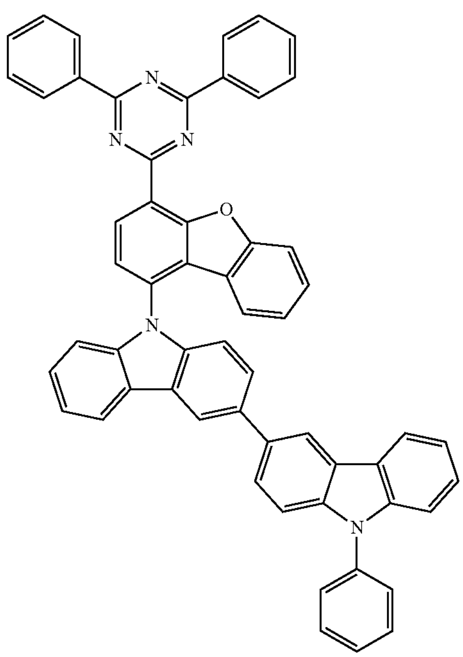
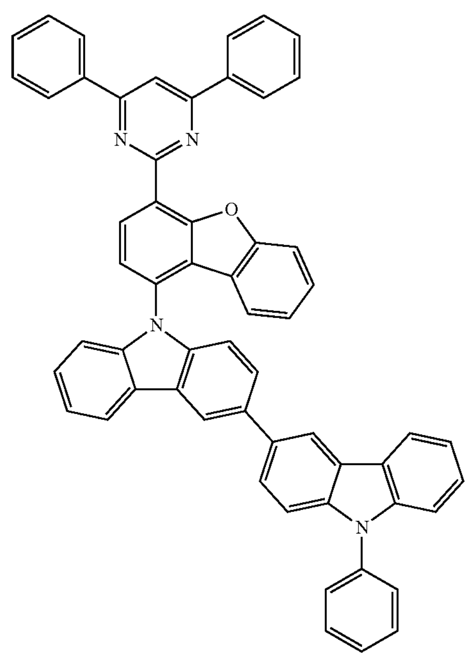

-continued
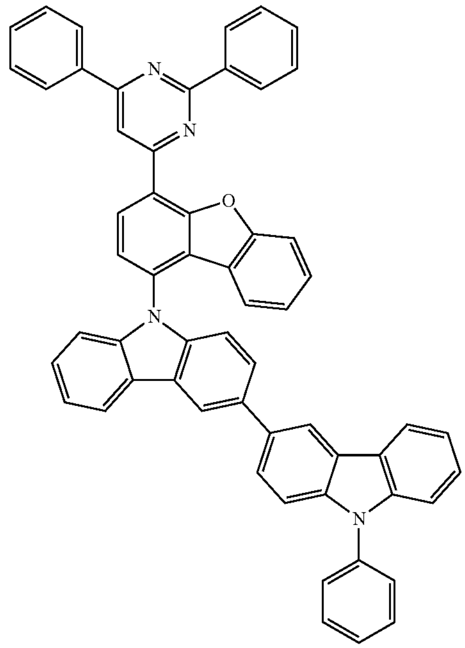
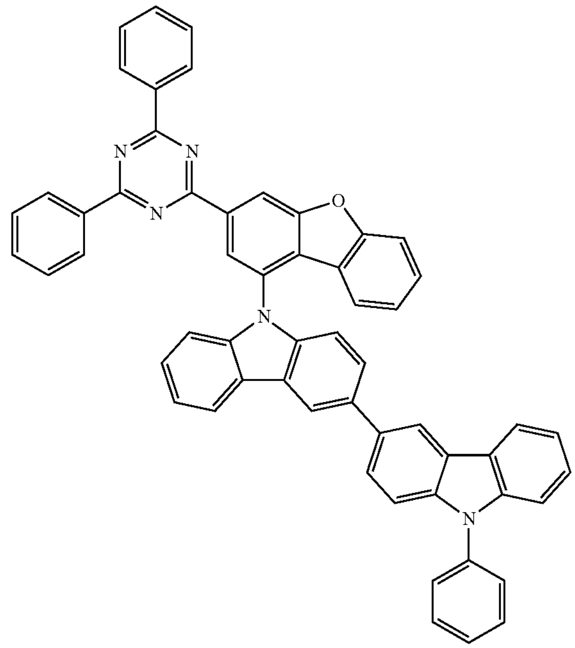
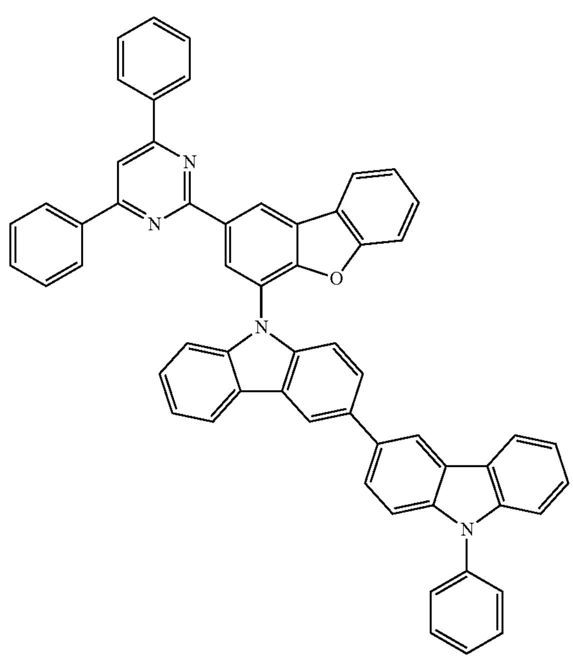
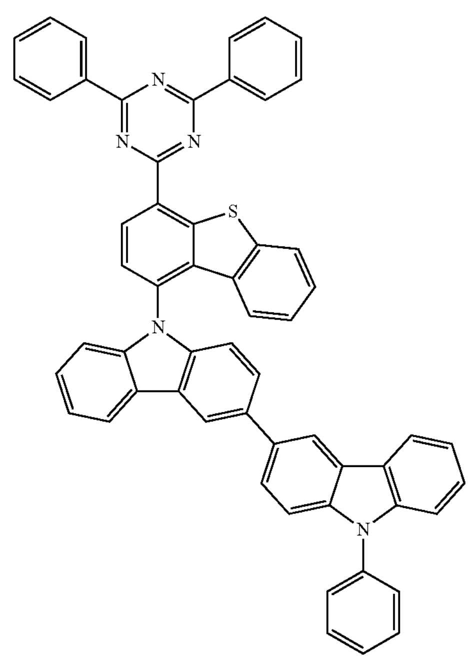

-continued
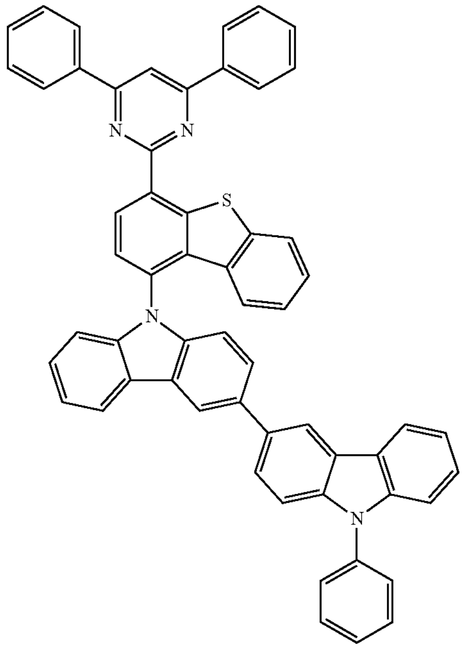
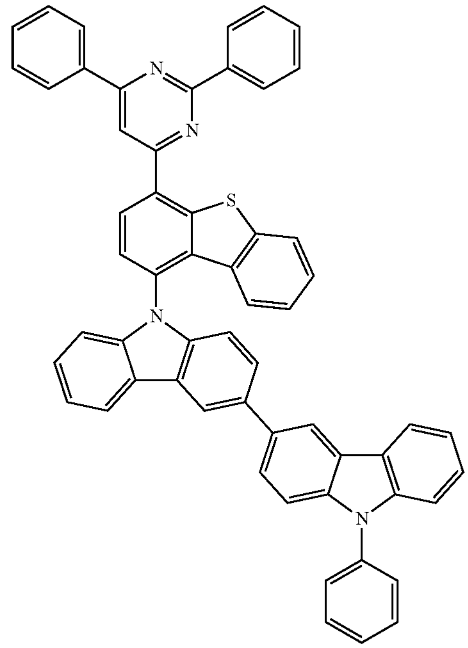
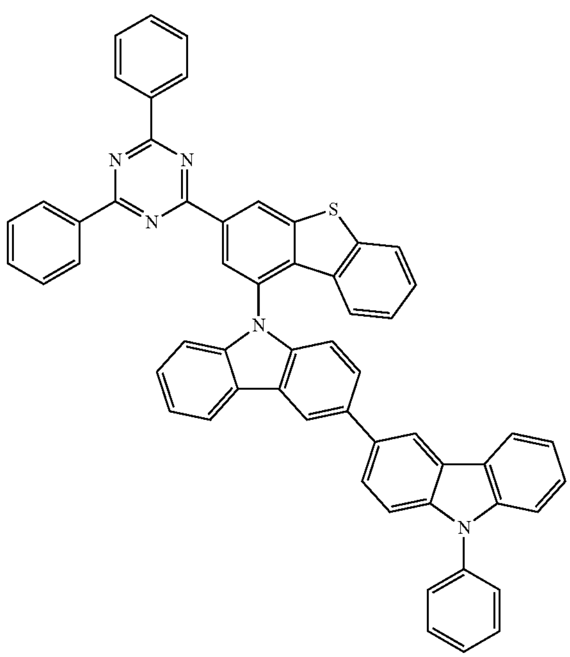

-continued
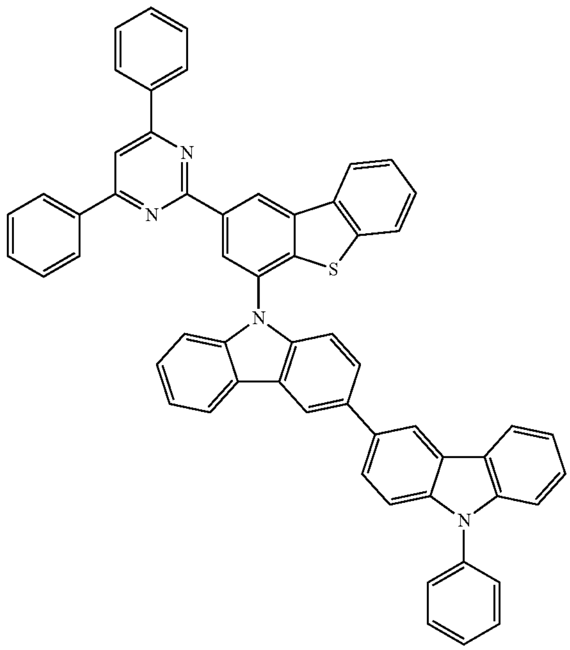
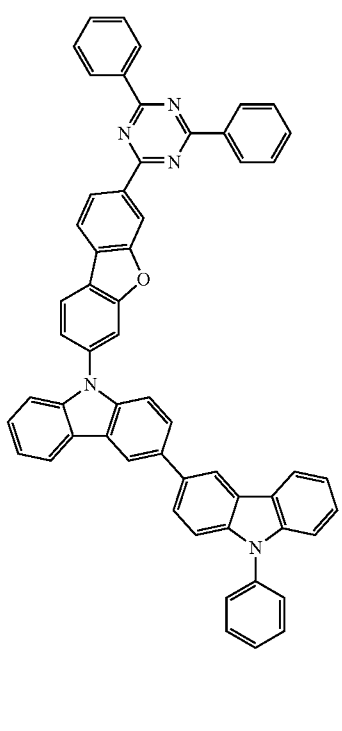
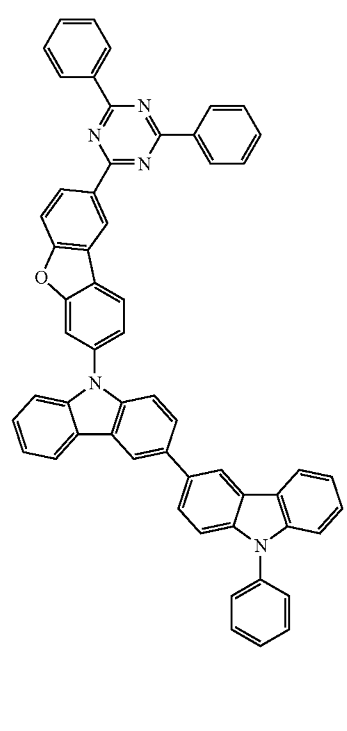

-continued
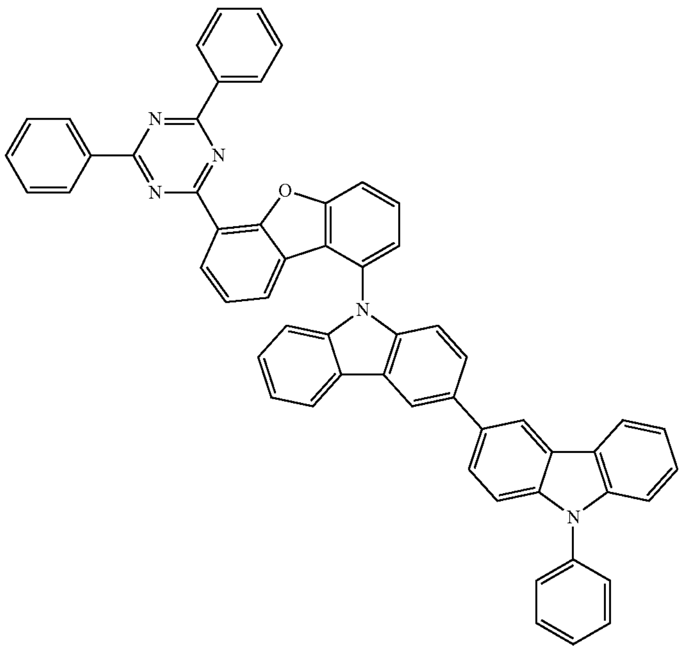
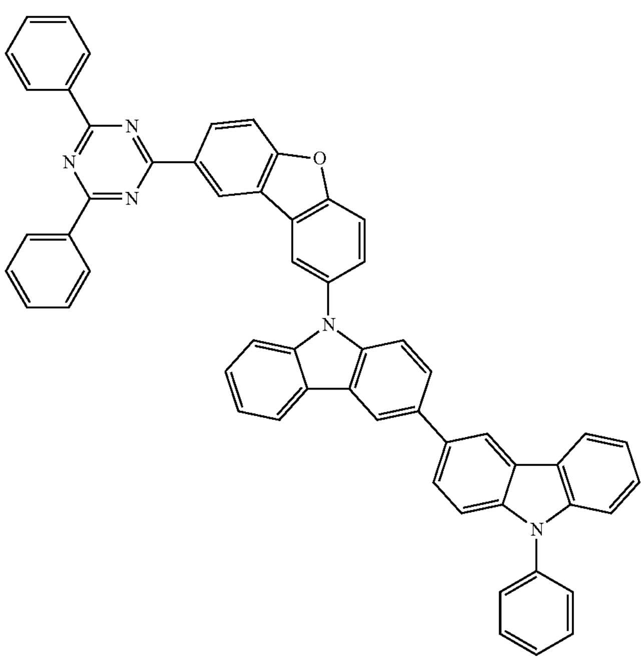

-continued
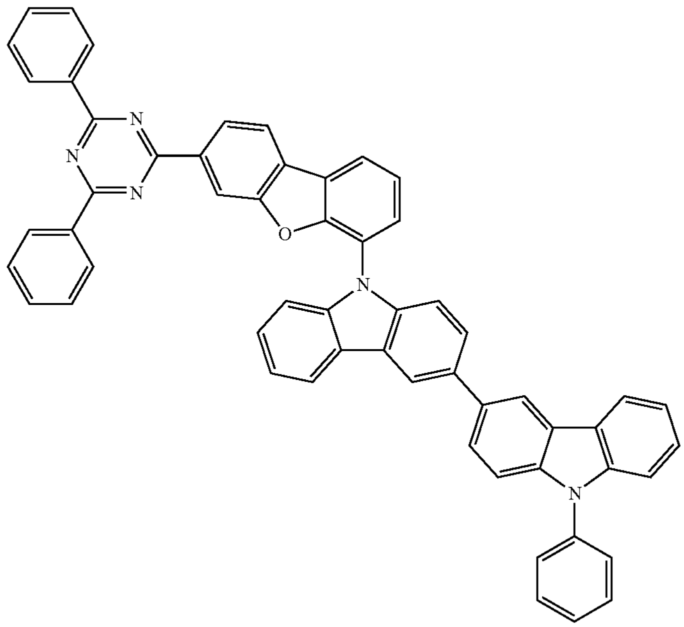
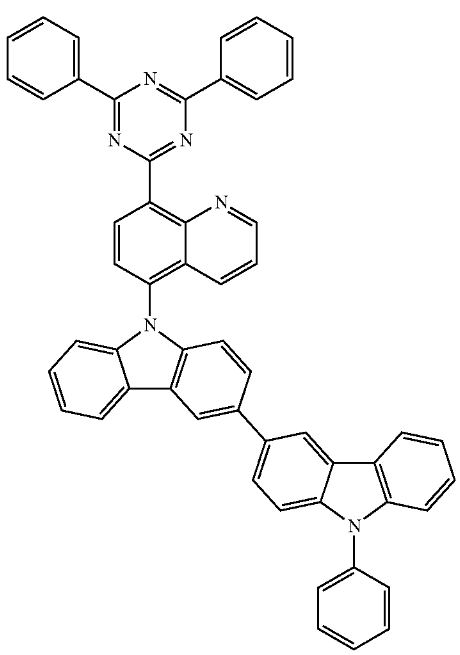
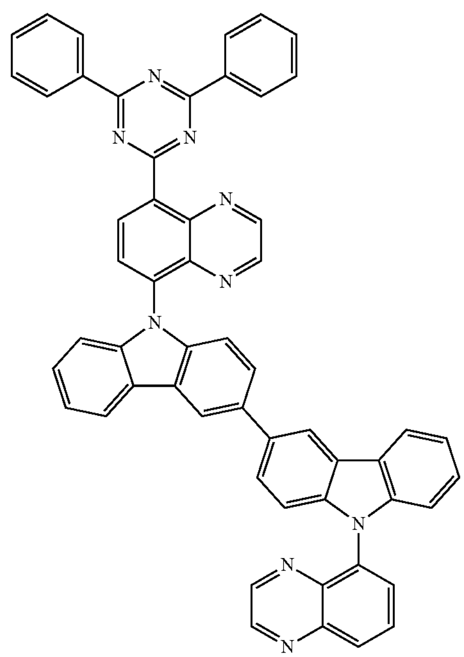

-continued
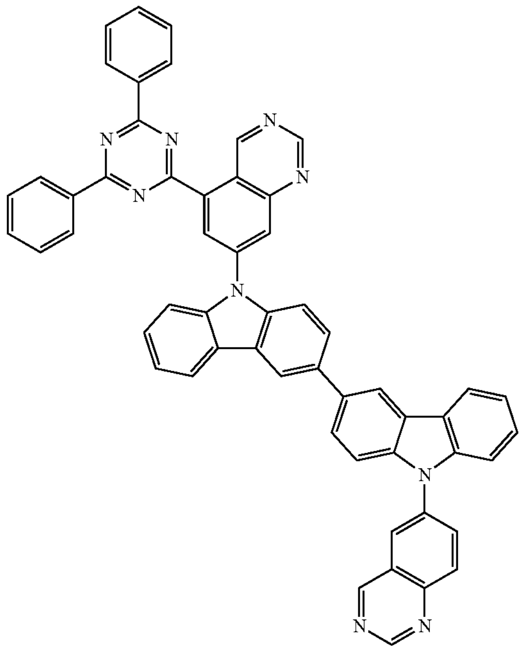
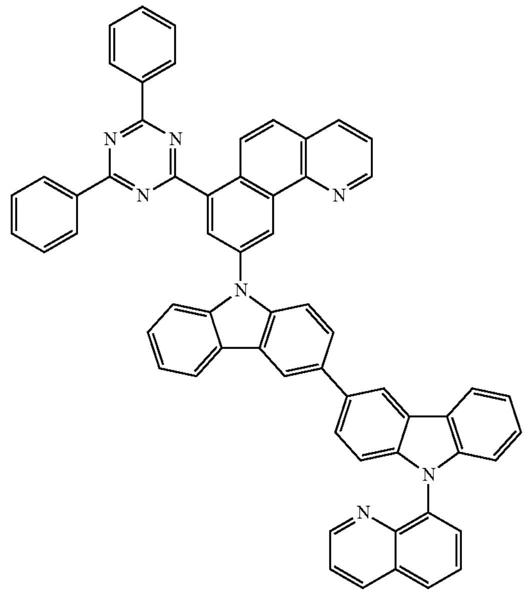
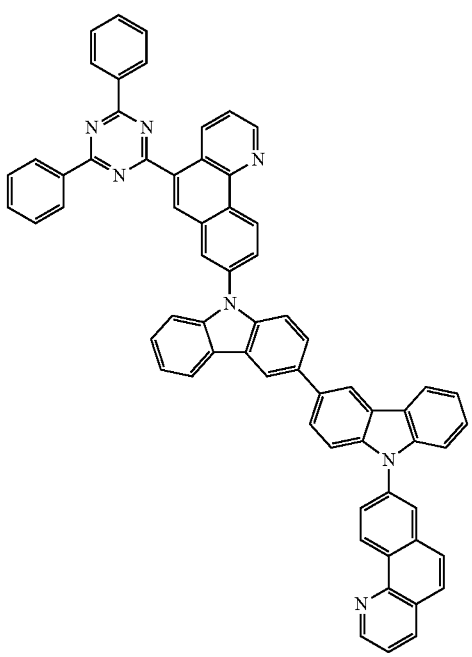
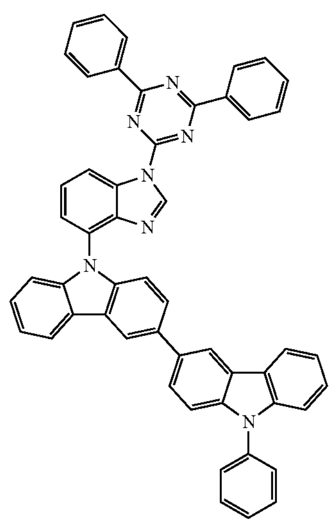

-continued
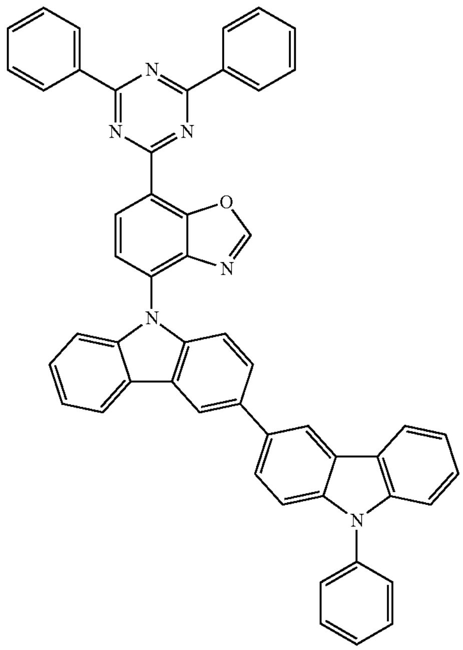
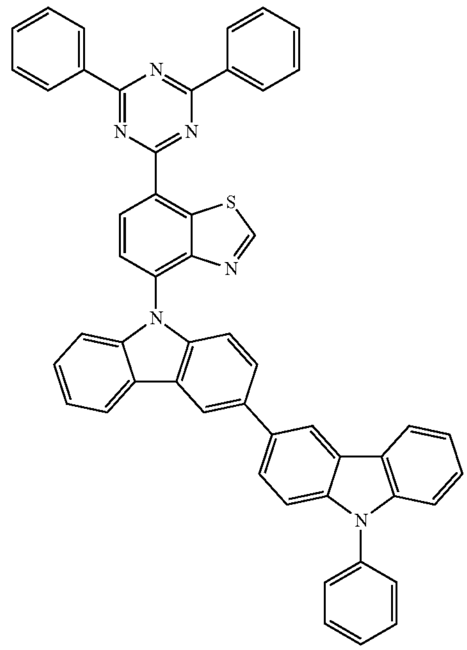
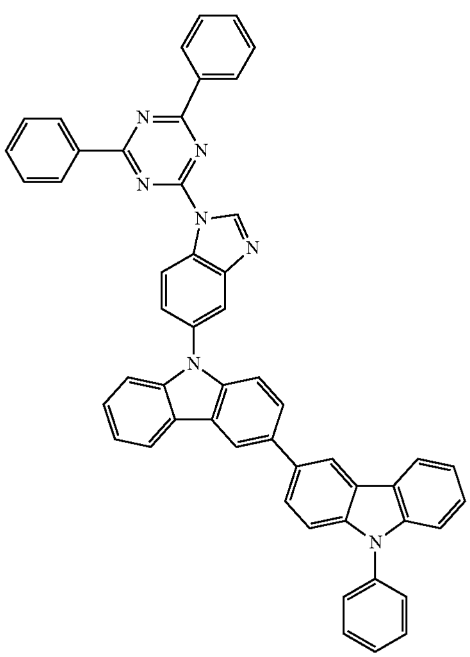
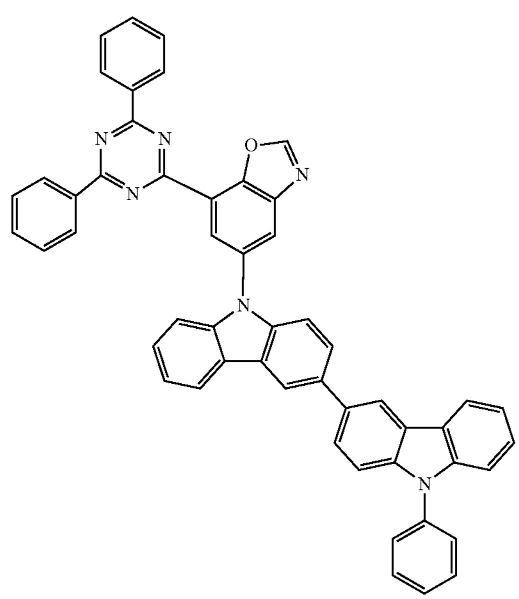

-continued
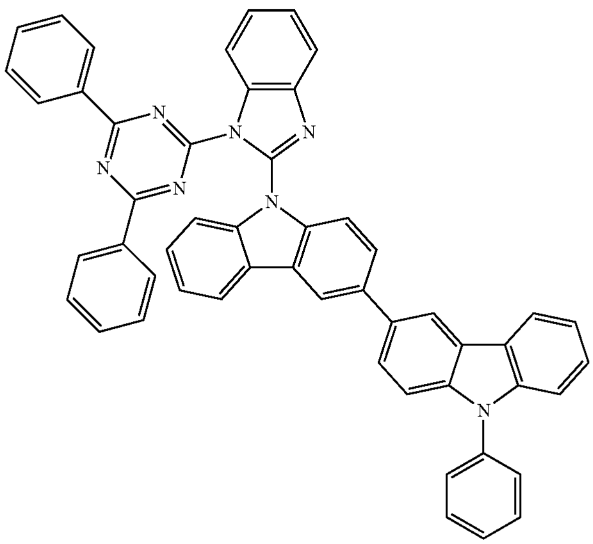
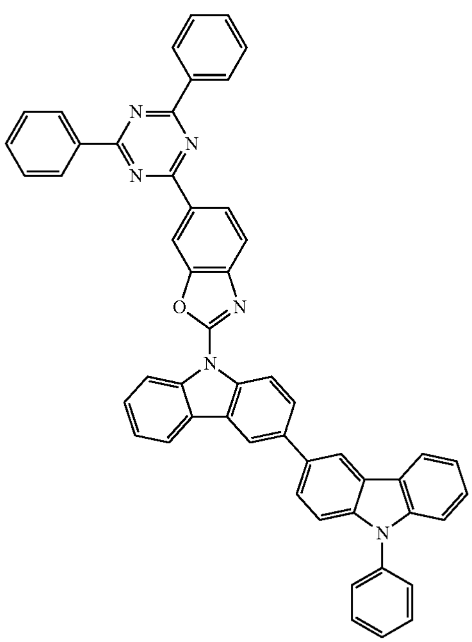
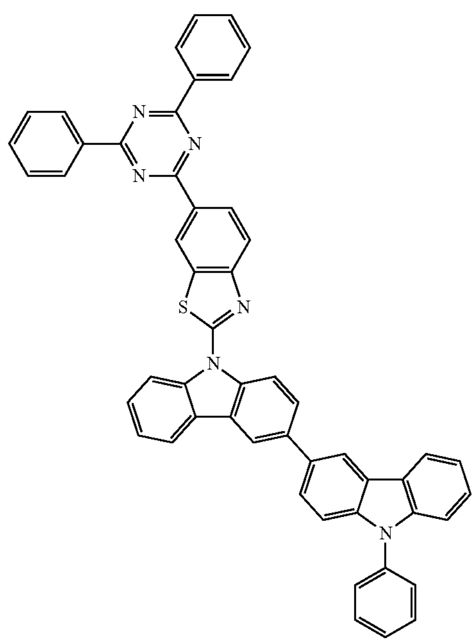

-continued
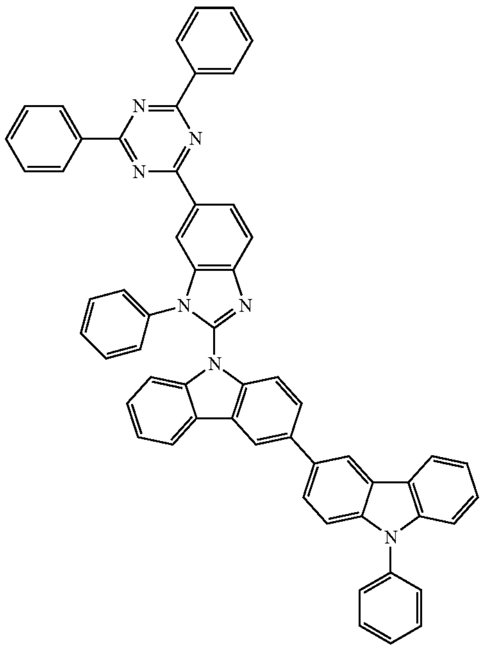
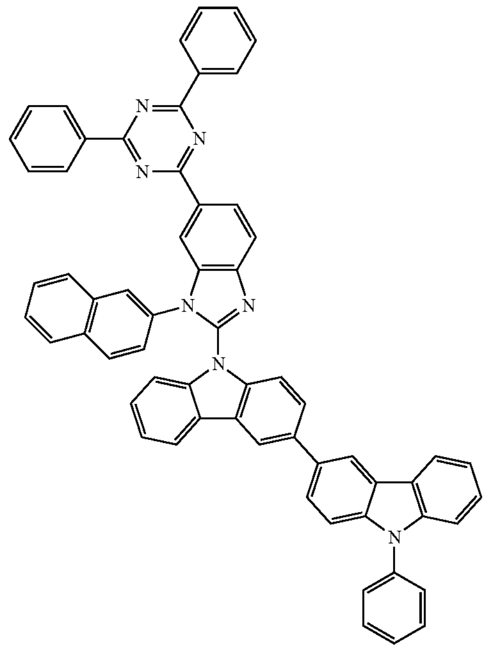
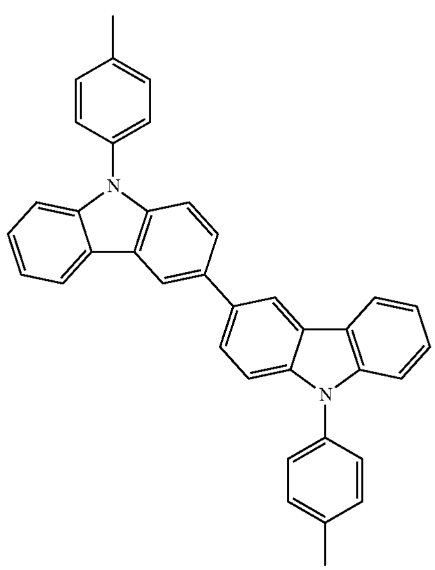
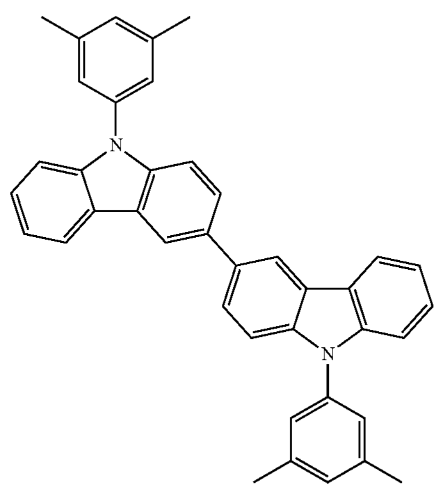

-continued
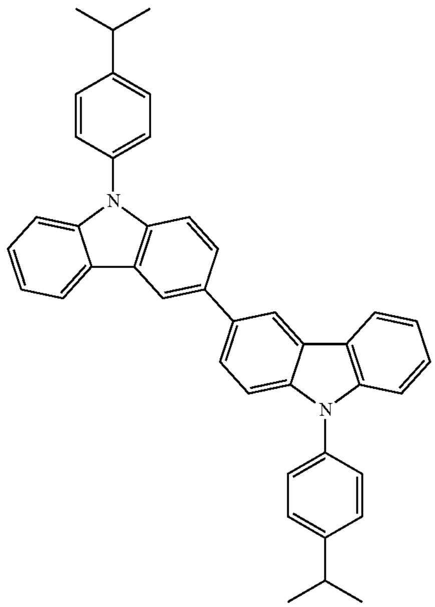
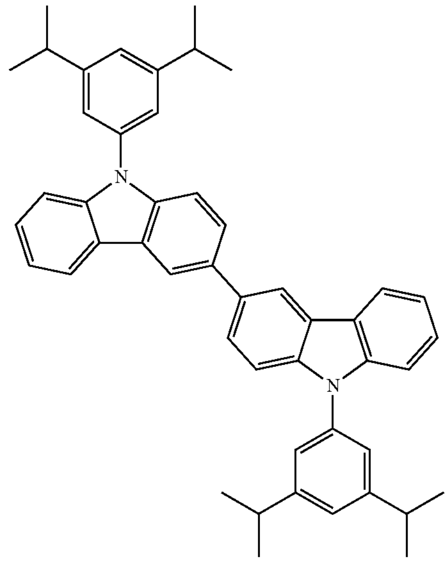
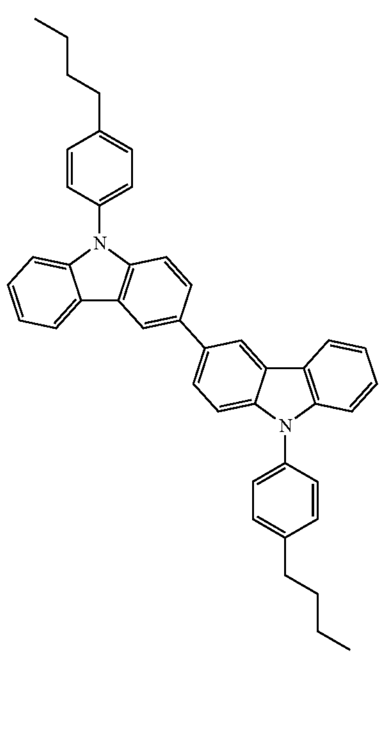
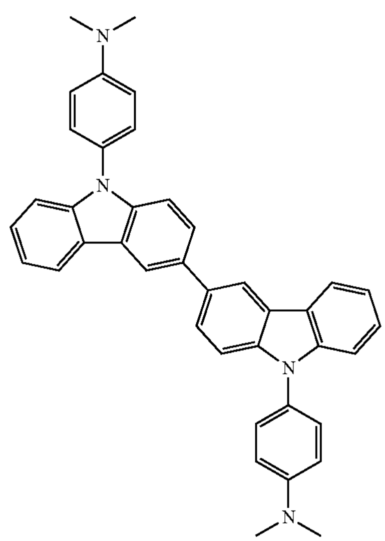

-continued
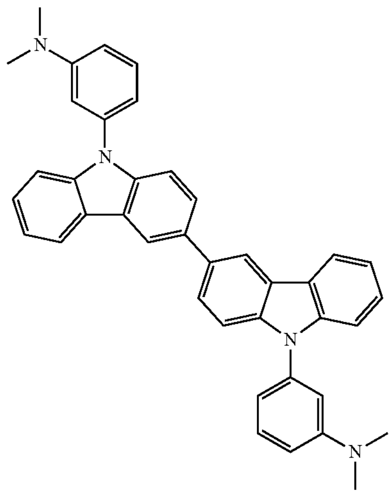
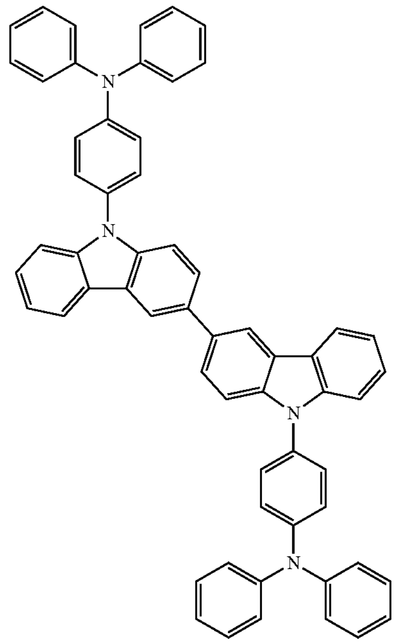
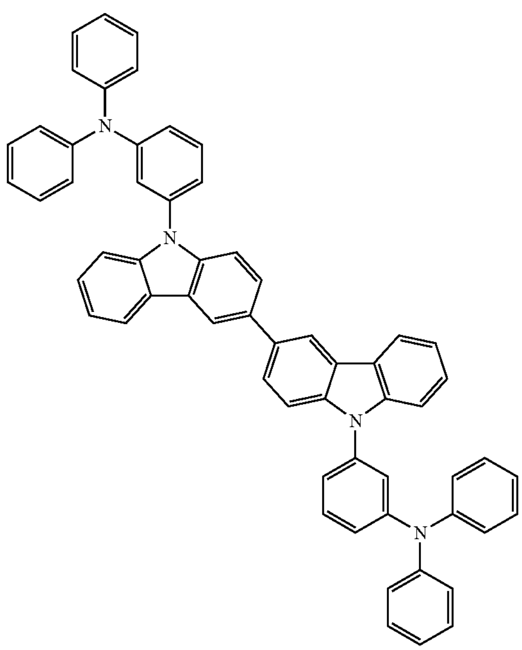
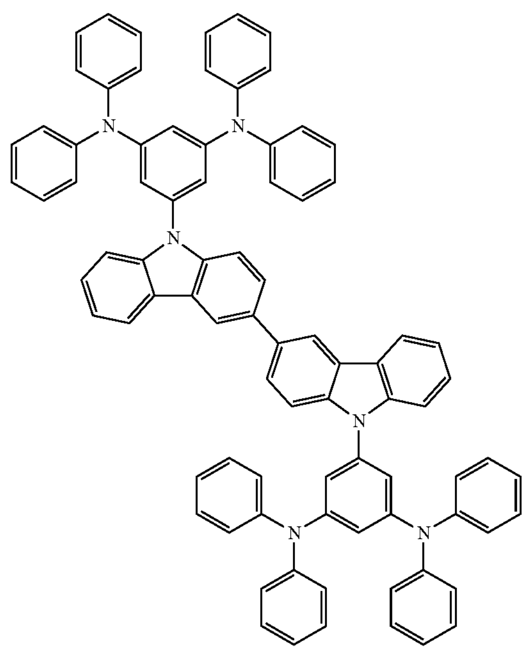

-continued
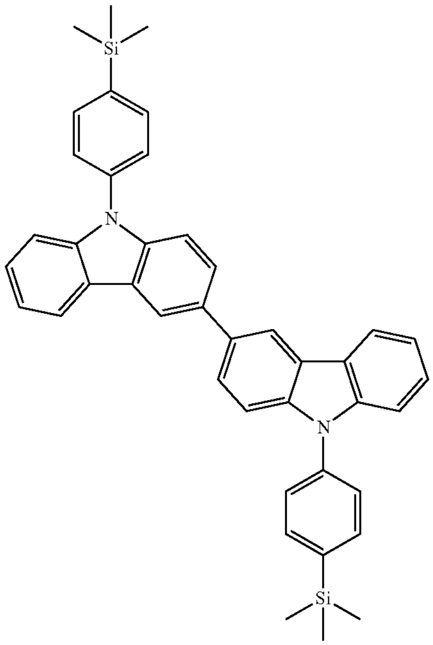
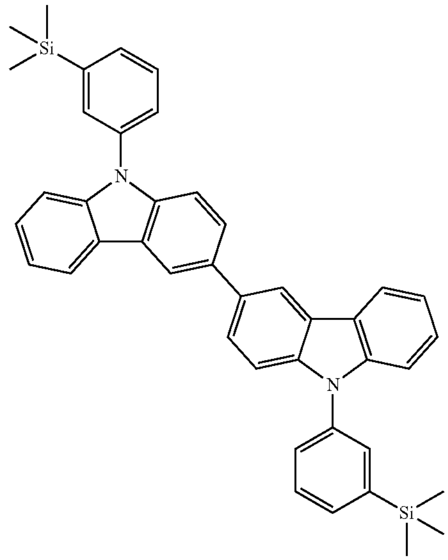
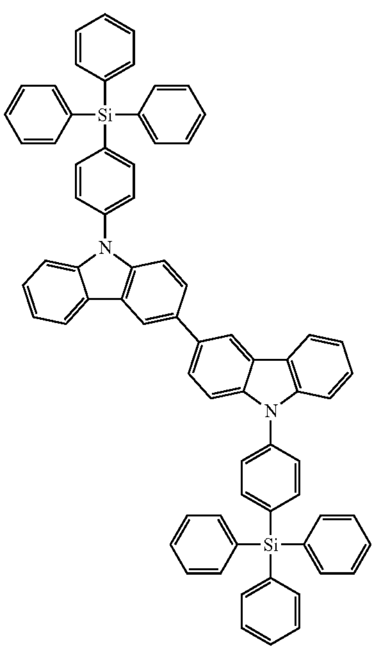
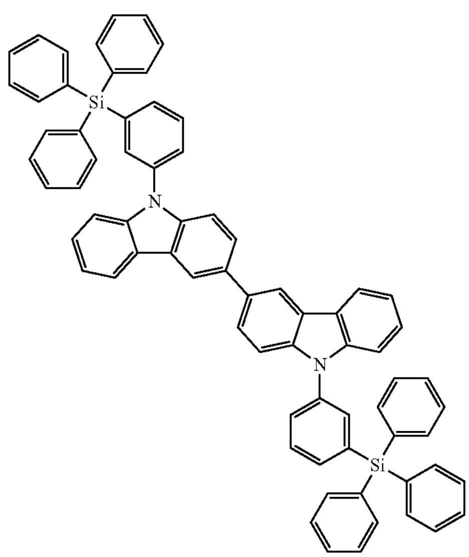

-continued
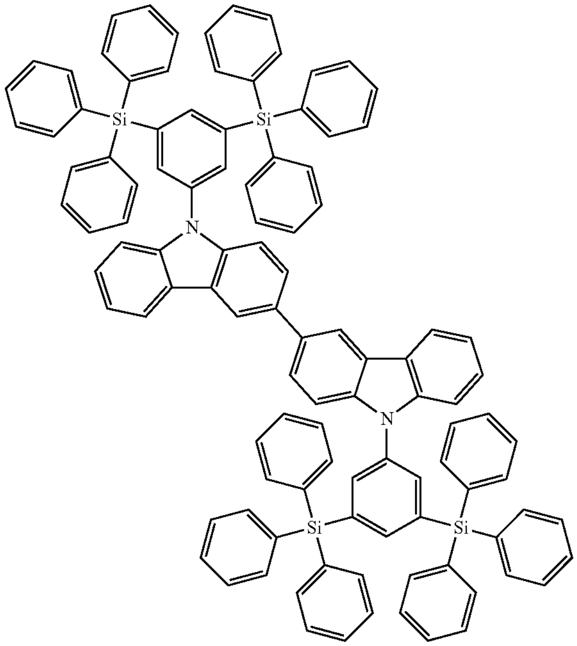
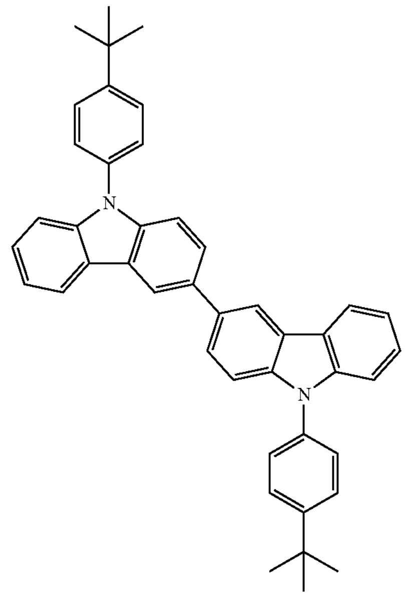
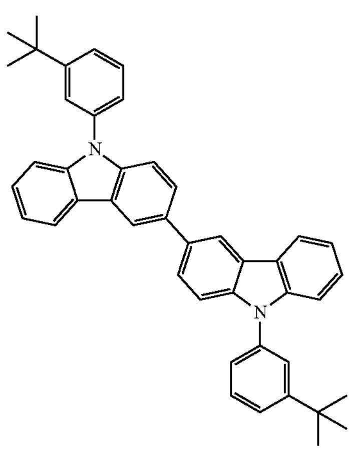
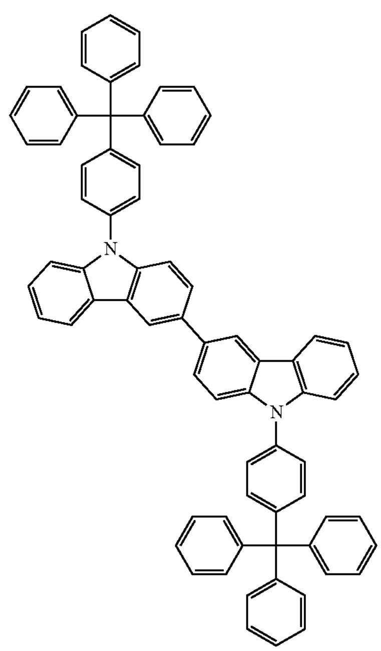

-continued
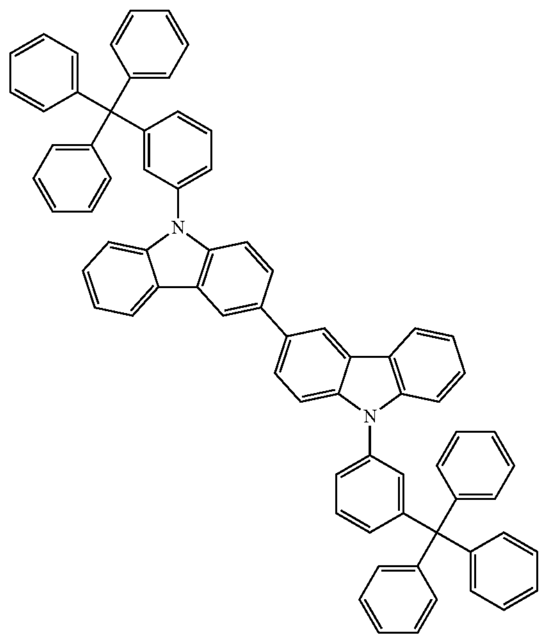
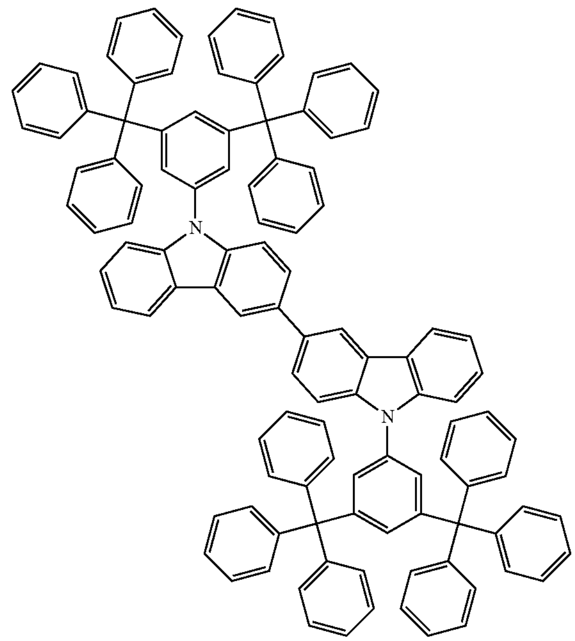
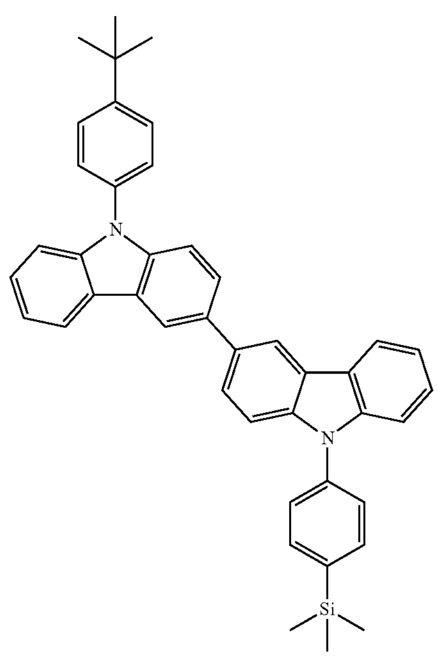
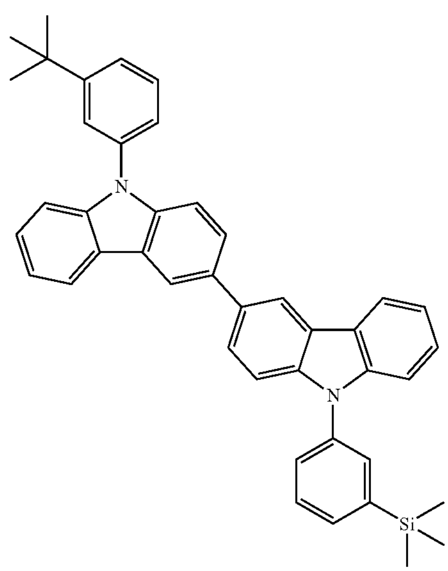

-continued
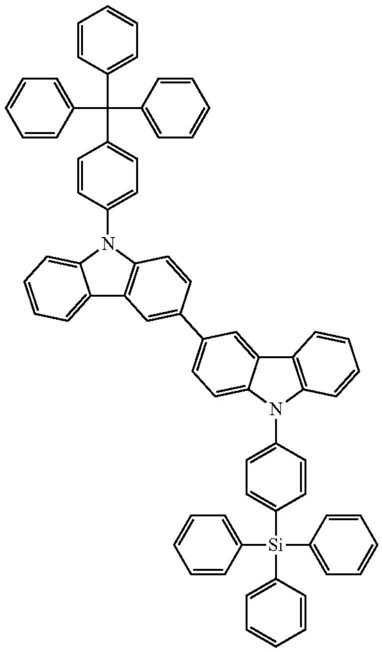
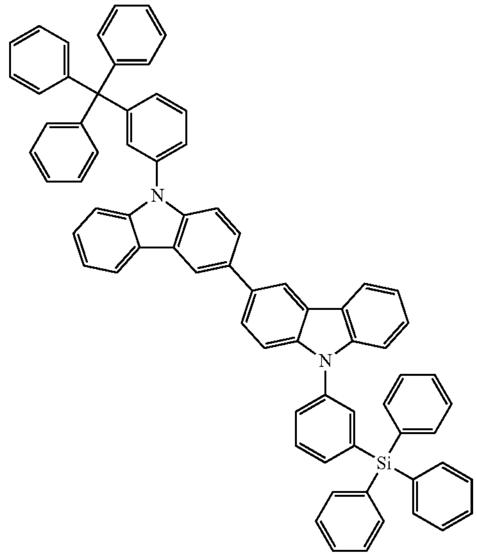
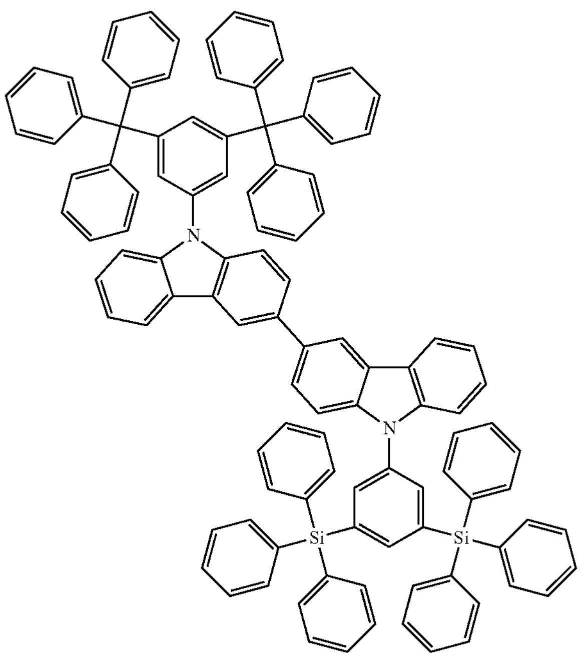

-continued
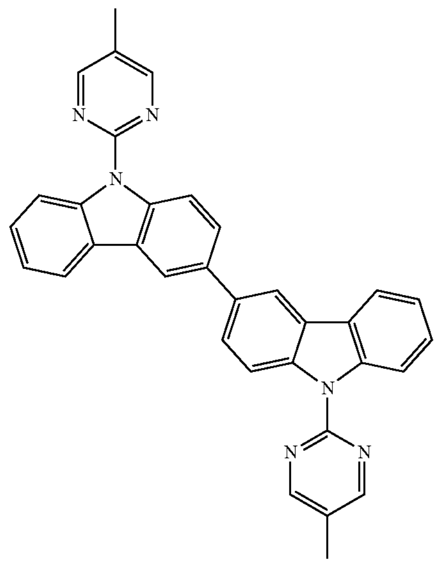
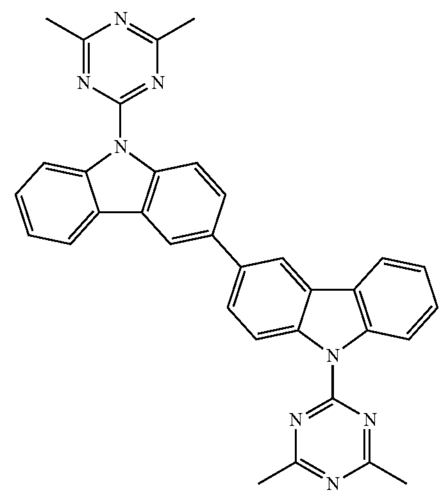
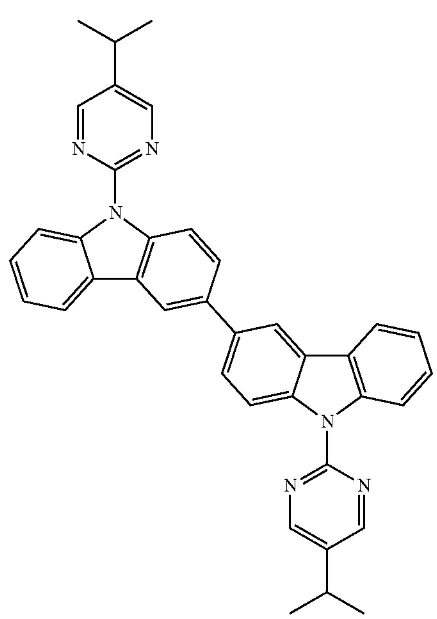
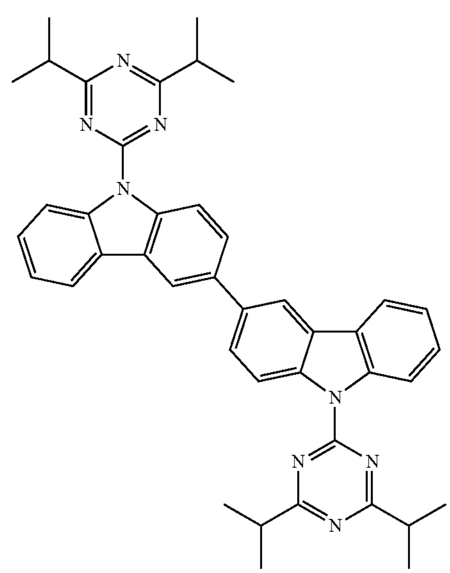

-continued
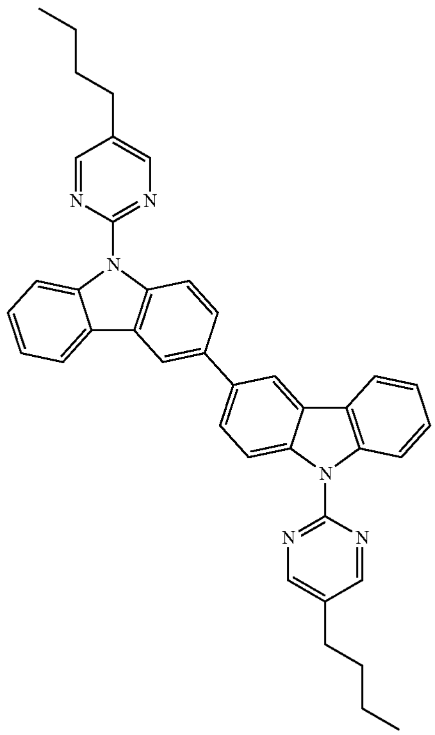
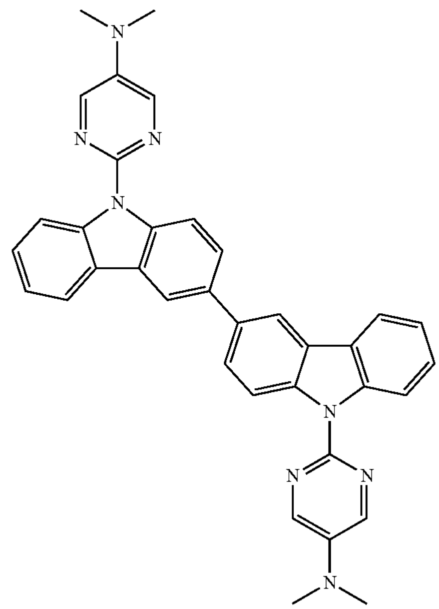
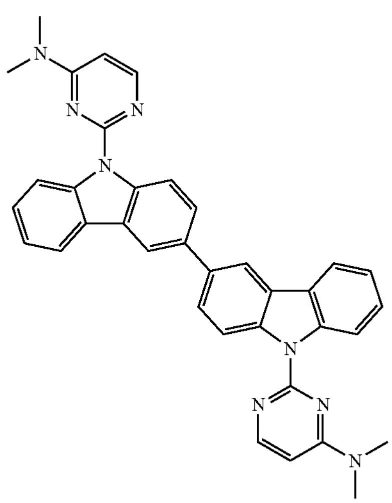
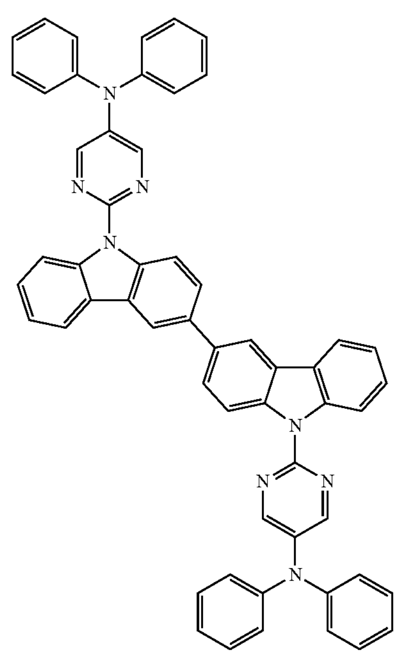

-continued
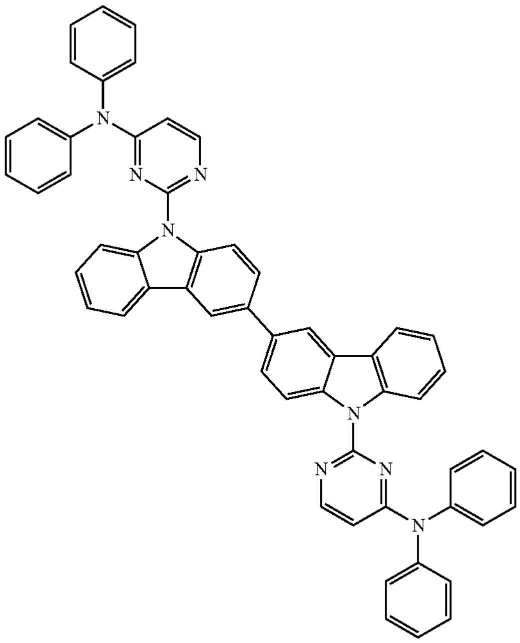
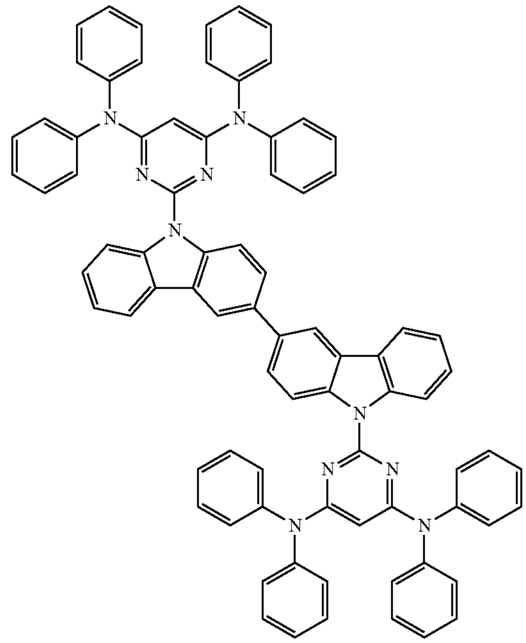
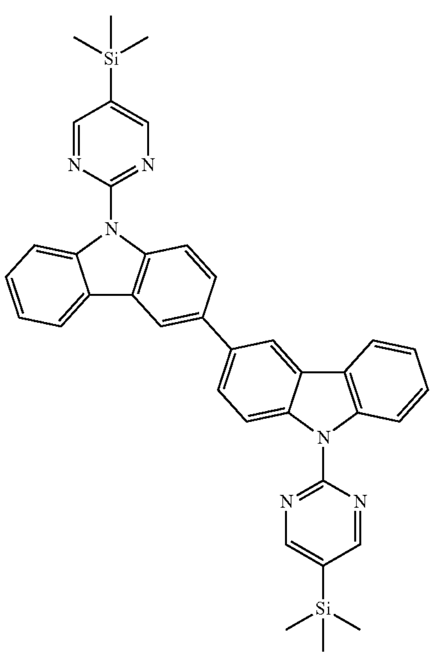
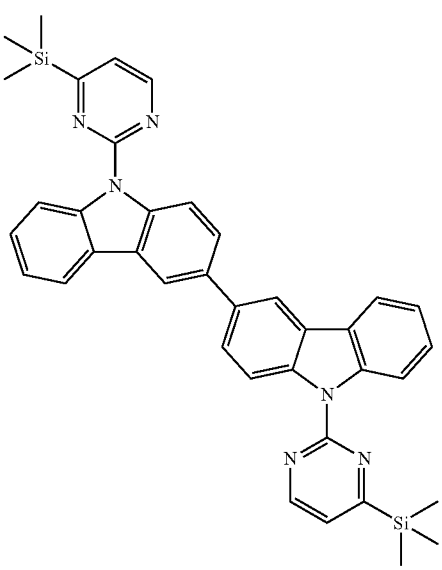

-continued
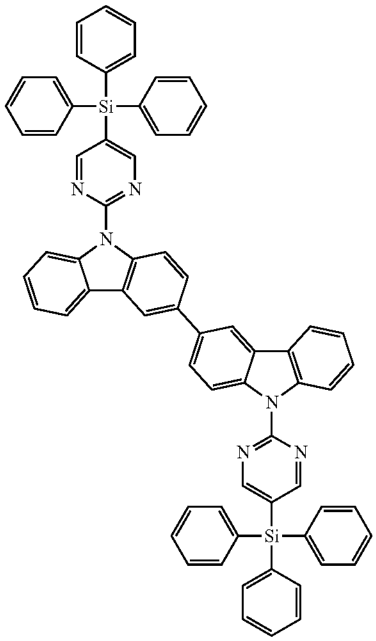
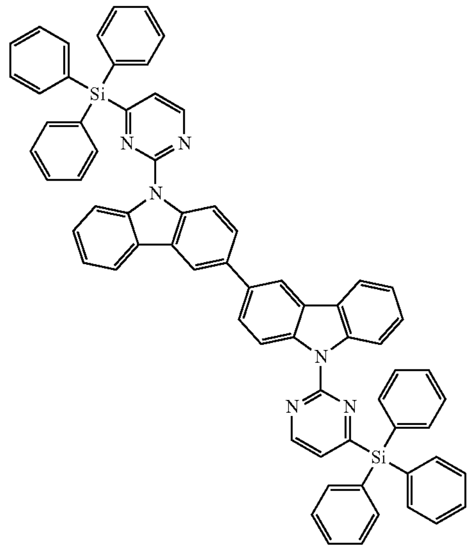
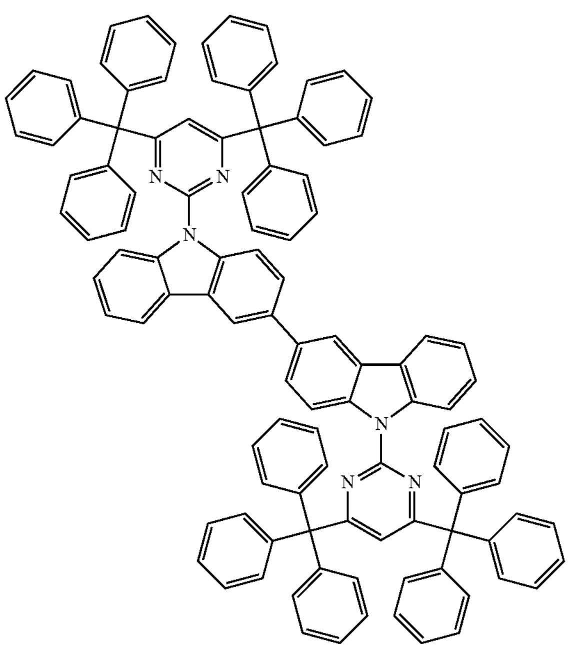

-continued
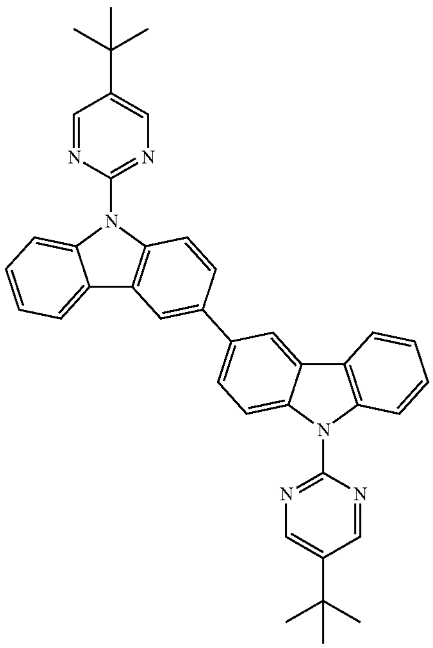
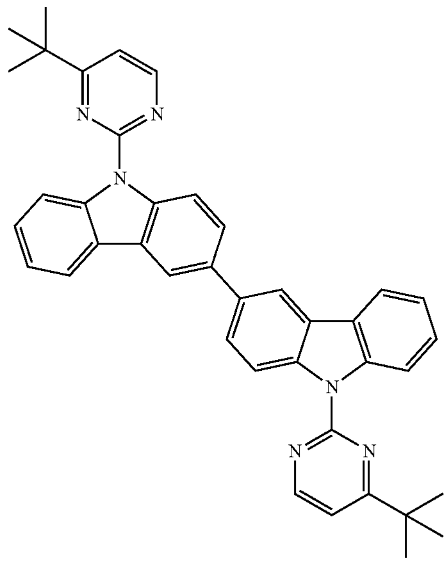
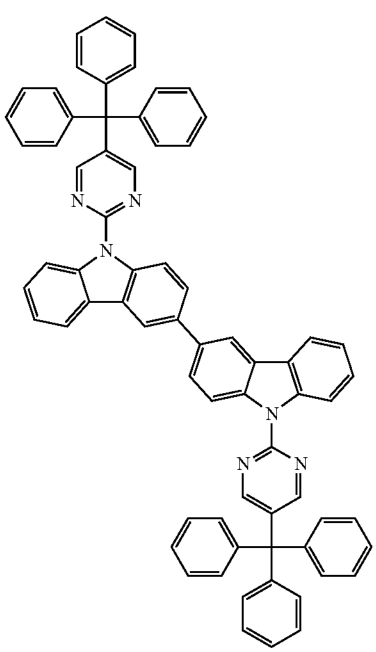
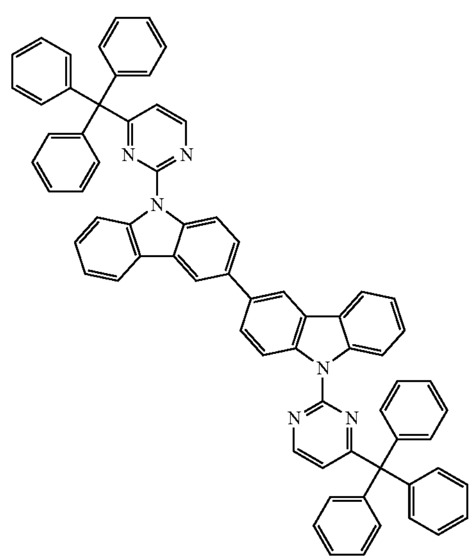

-continued
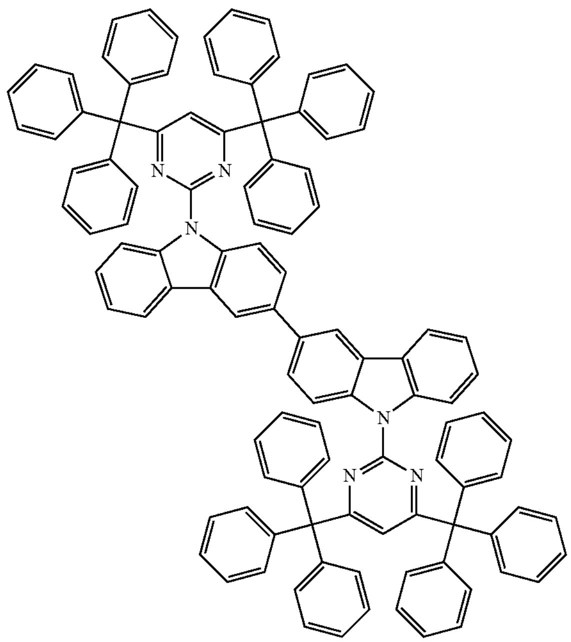
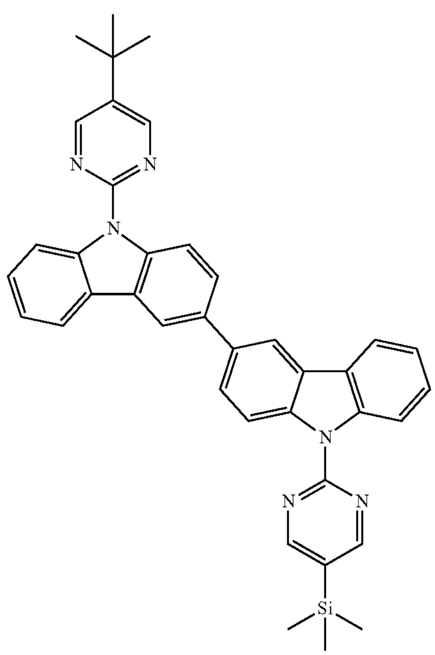
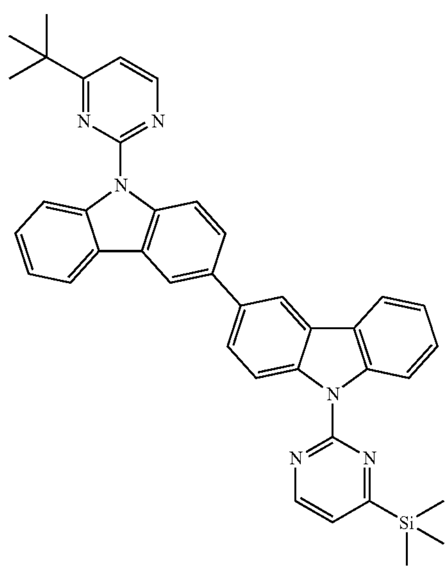

-continued
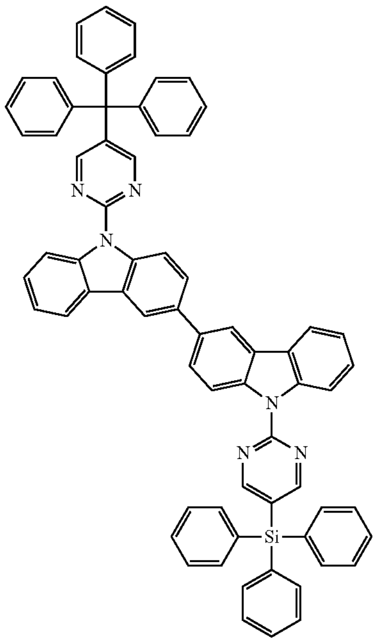
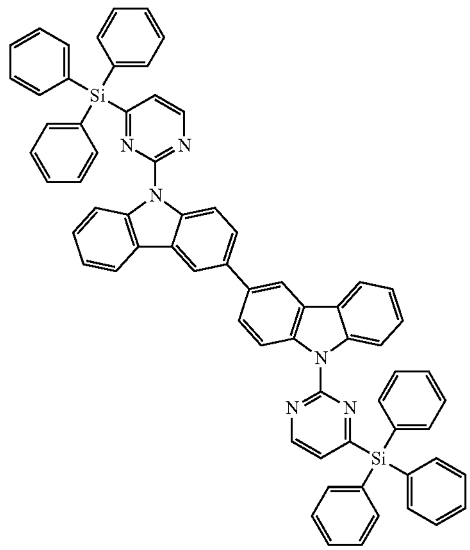
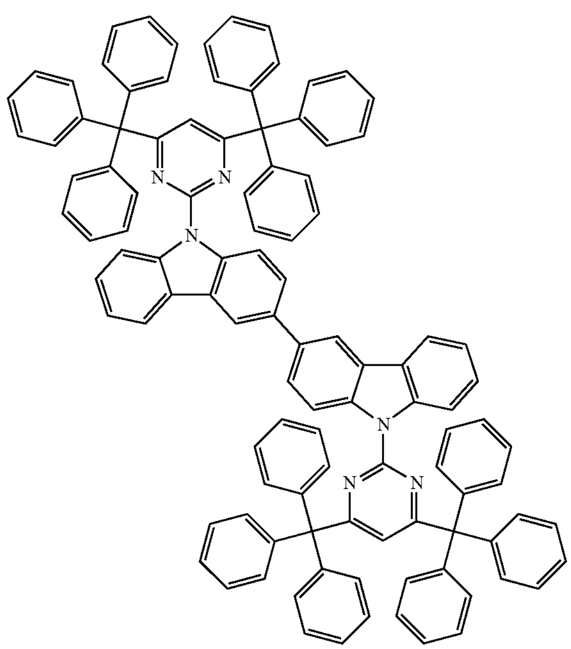 [SMILES: c1ccc(C(c2ccccc2)(c2ccccc2)c2cc(C(c3ccccc3)(c3ccccc3)c3ccccc3)nc(-n3c4ccccc4c4cc(-c5ccc6c(c5)c5ccccc5n6-c5nc(C(c6ccccc6)(c6ccccc6)c6ccccc6)cc(C(c6ccccc6)(c6ccccc6)c6ccccc6)n5)ccc43)n2)cc1]

-continued
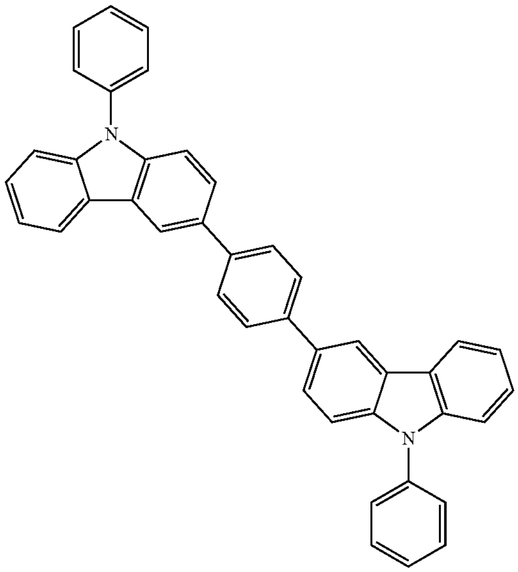
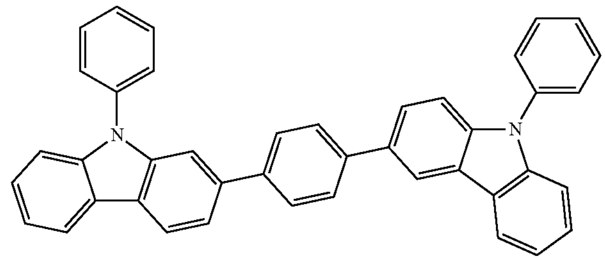
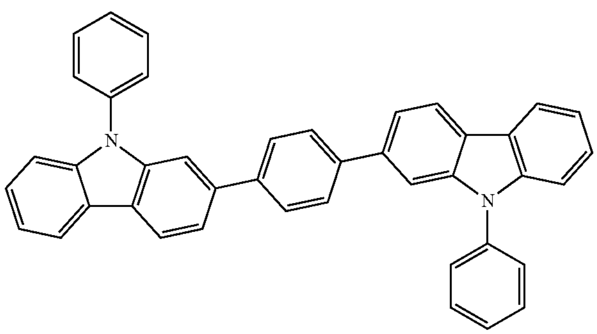
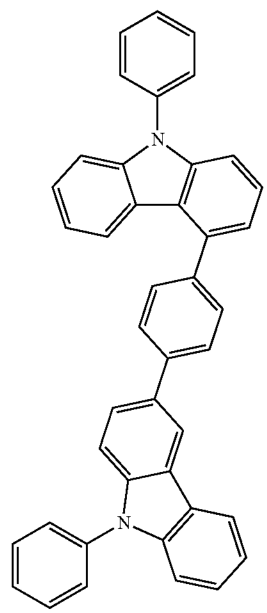
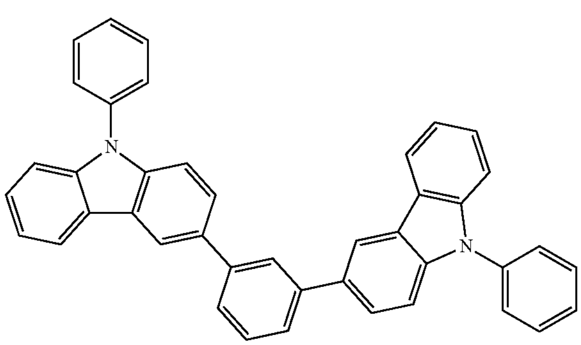

-continued
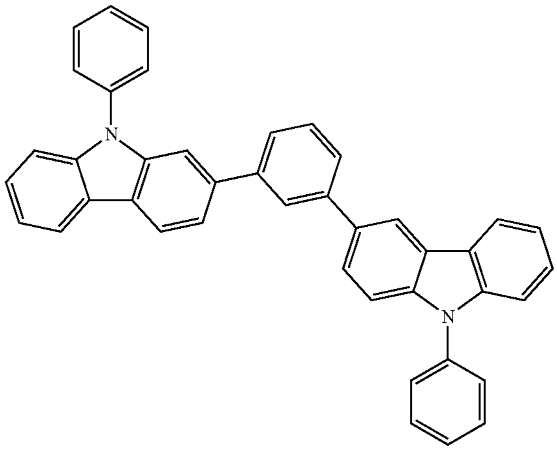
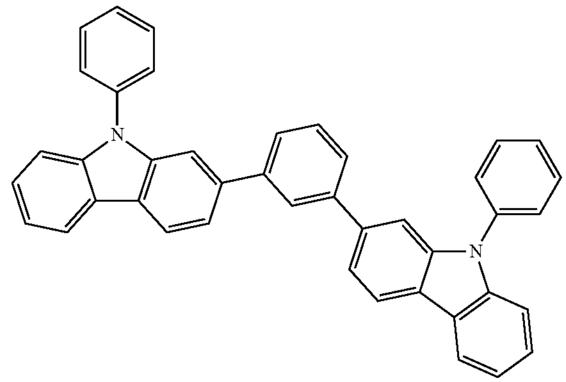
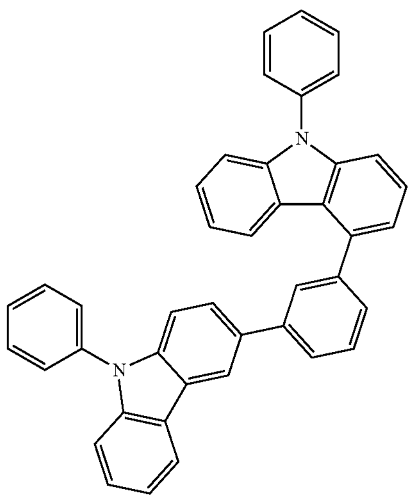
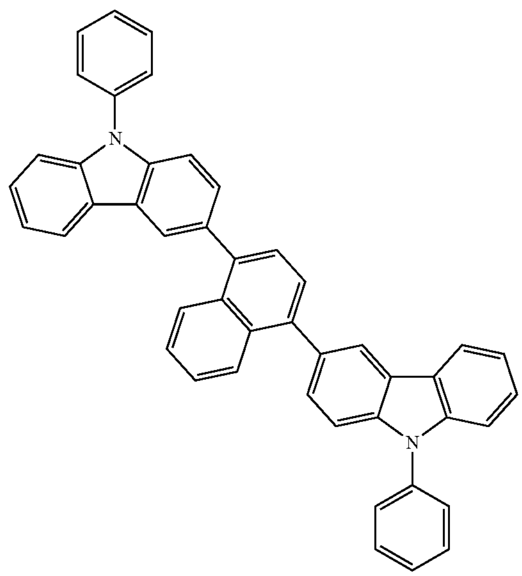
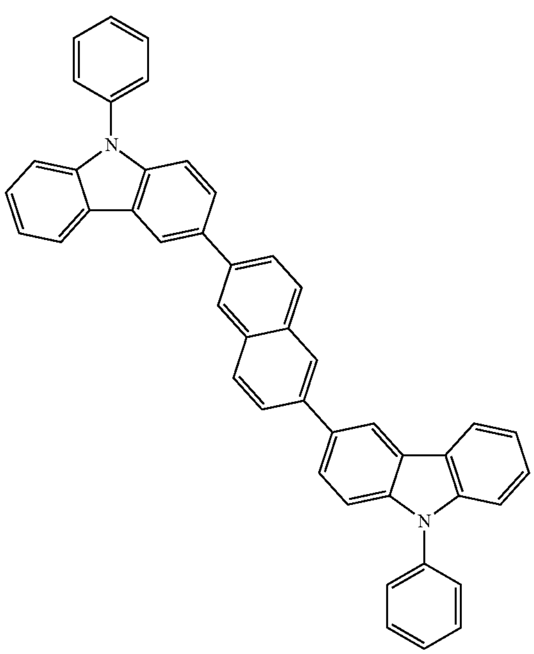
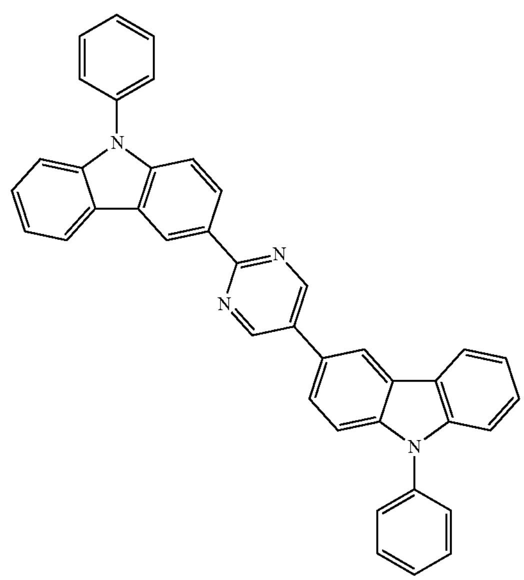

-continued
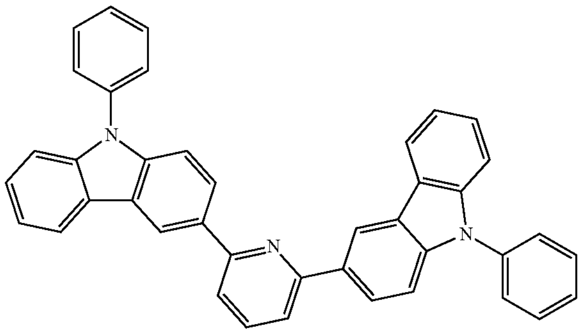
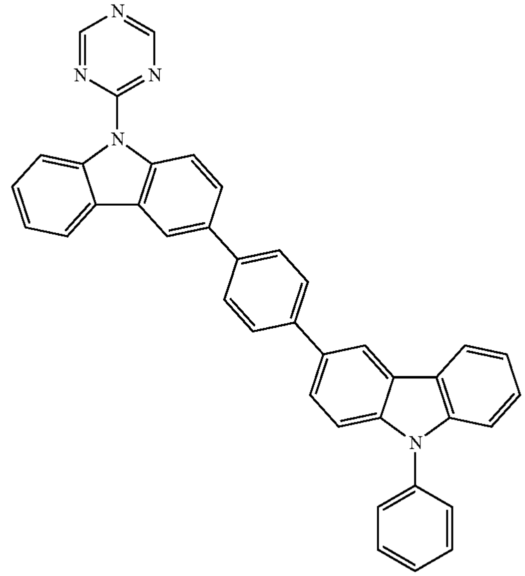
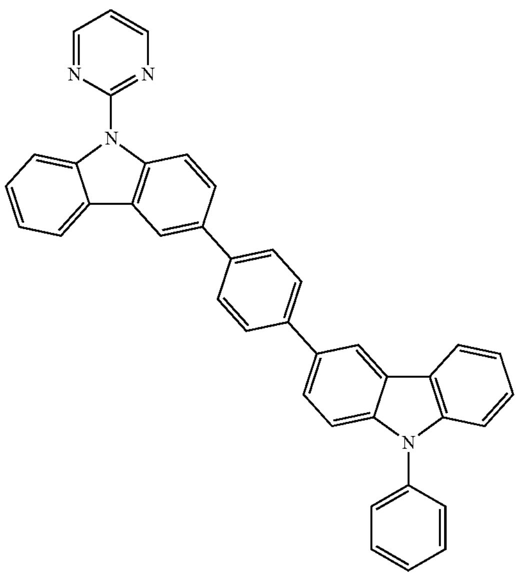
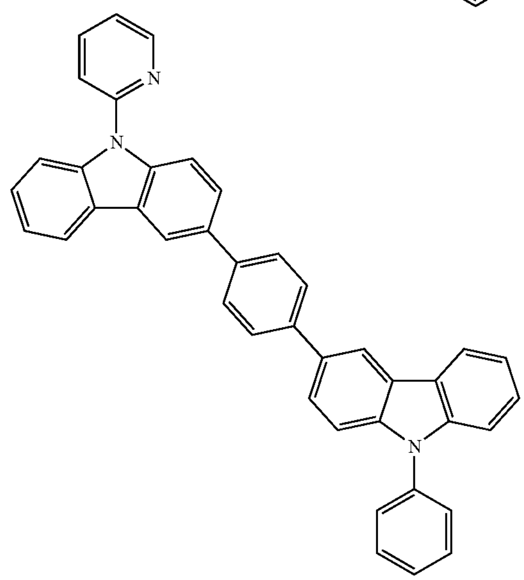
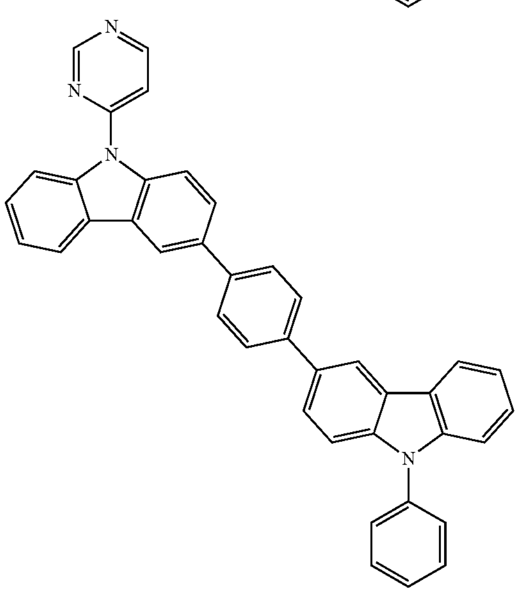
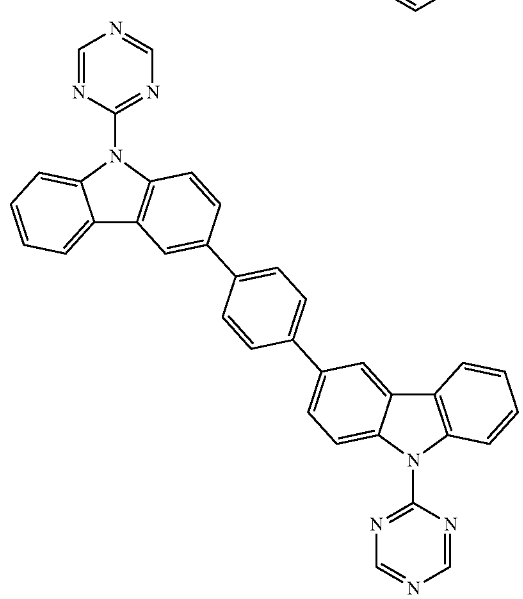

-continued
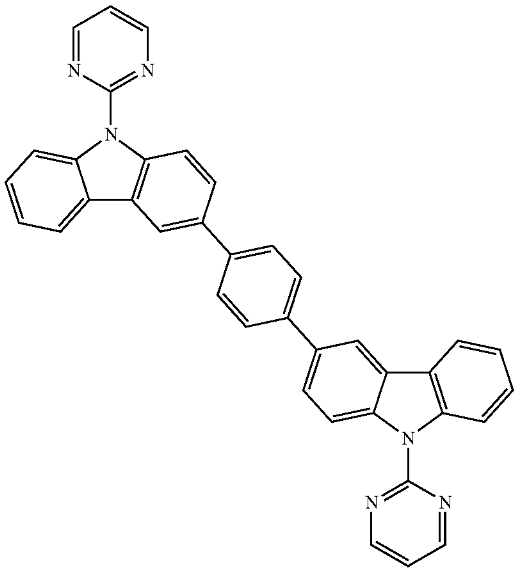
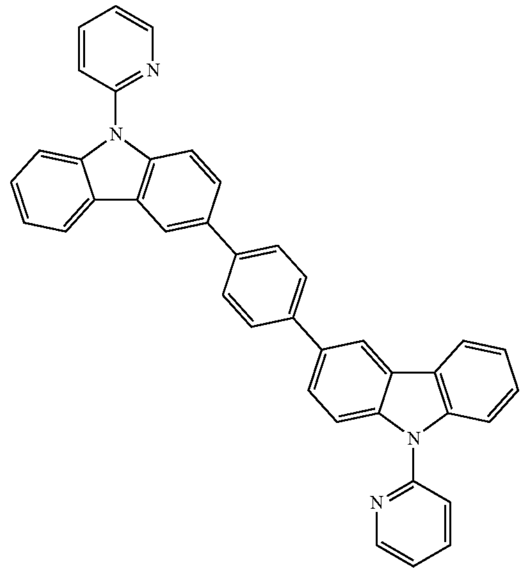
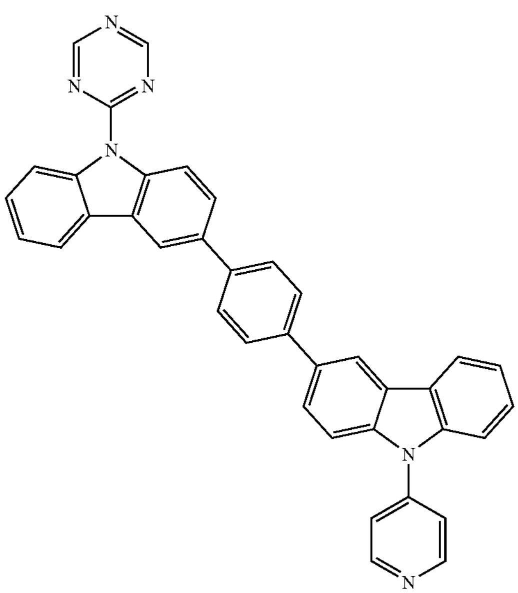
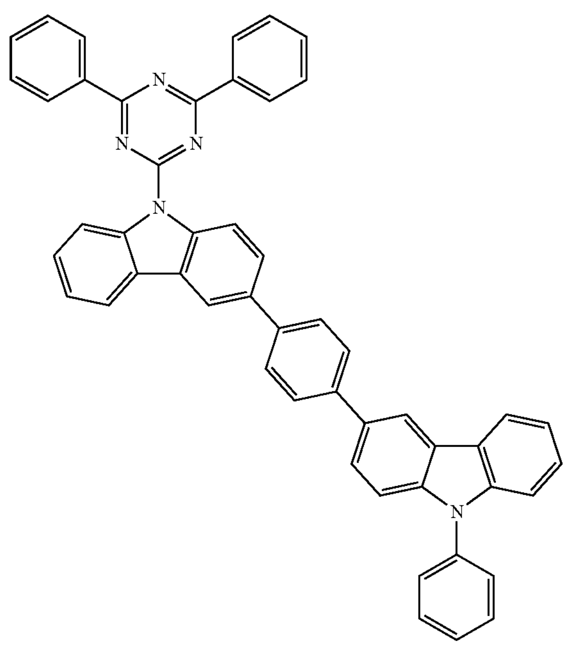

-continued
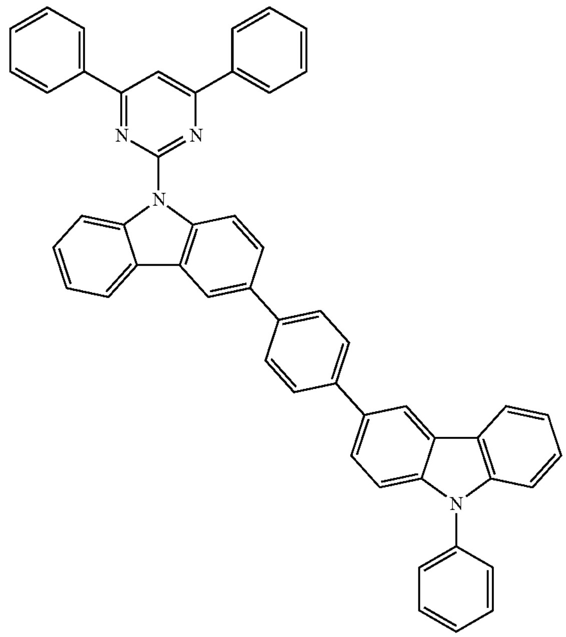
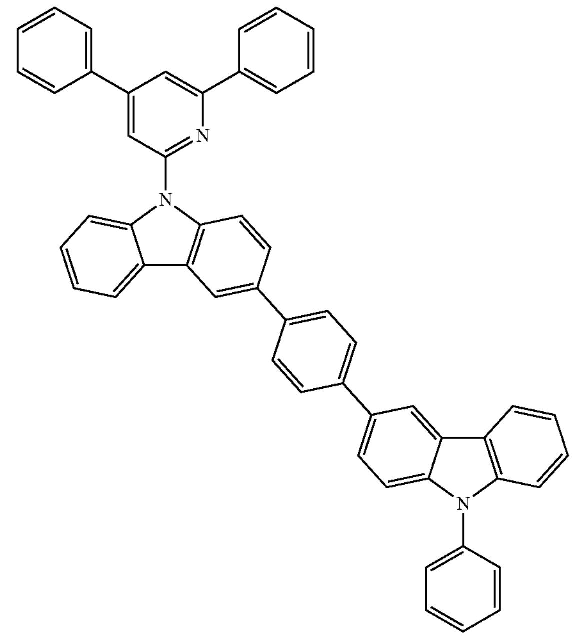
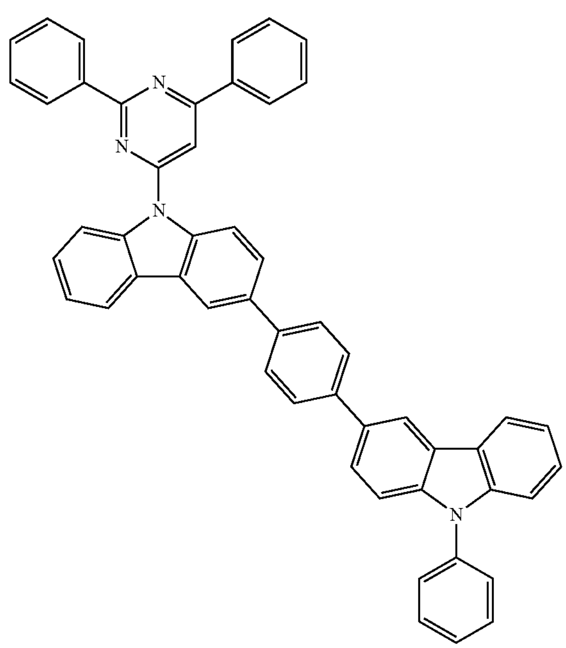
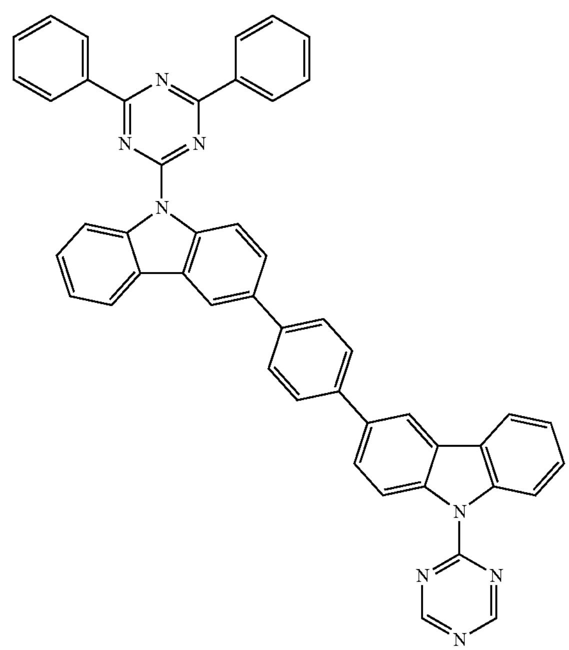

-continued
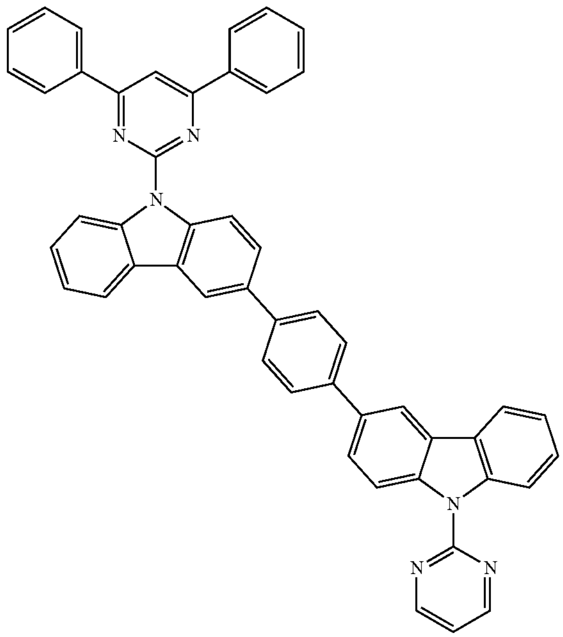
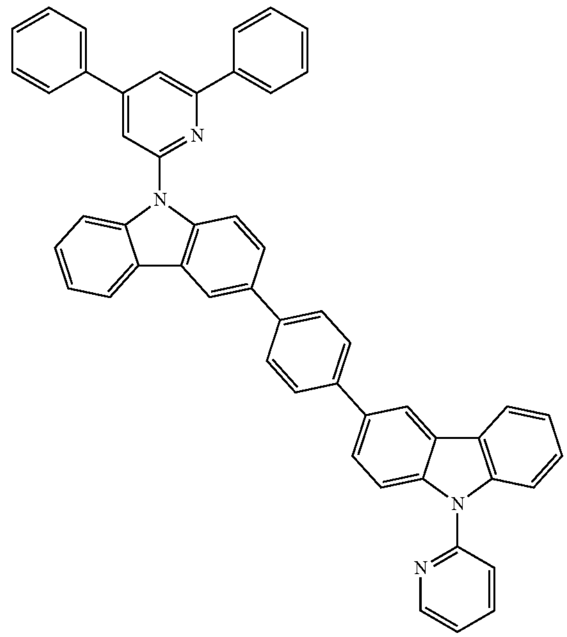
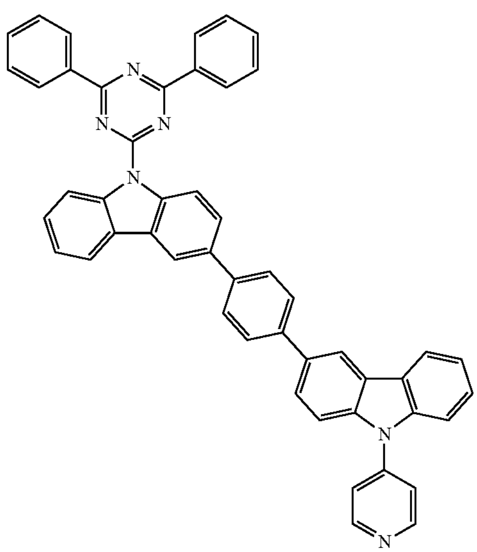
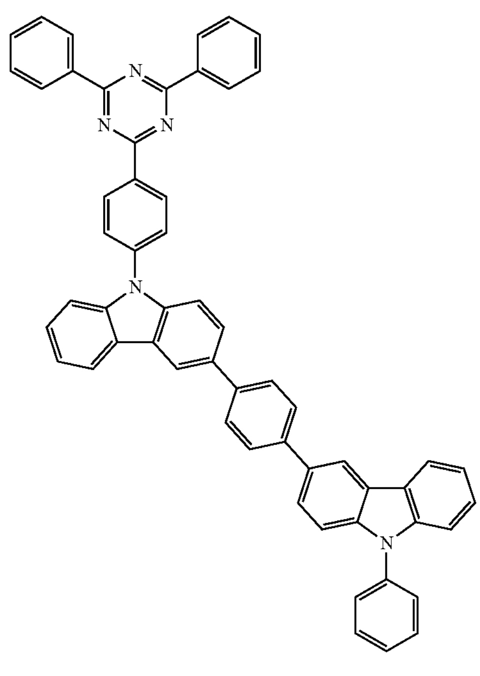

-continued
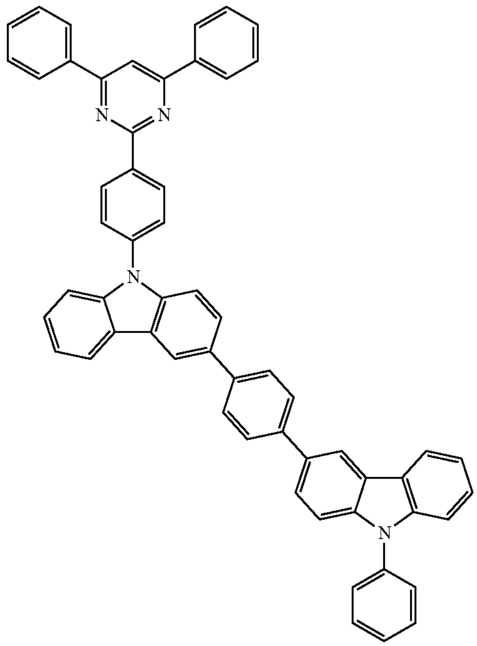
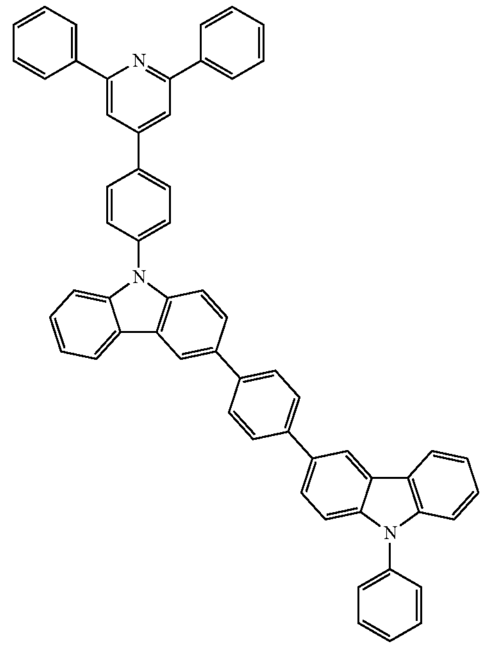
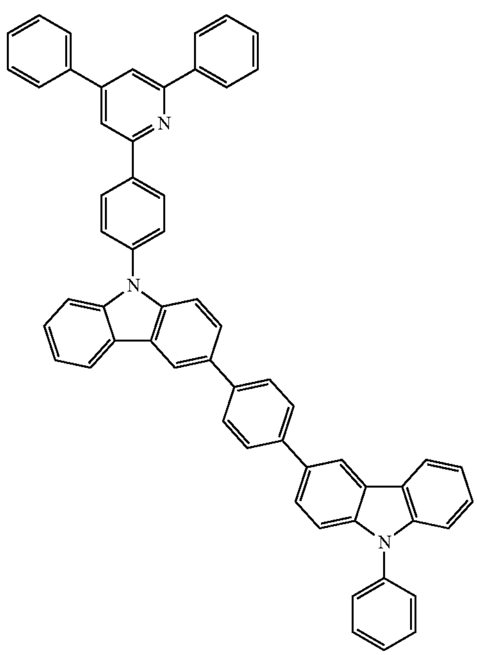
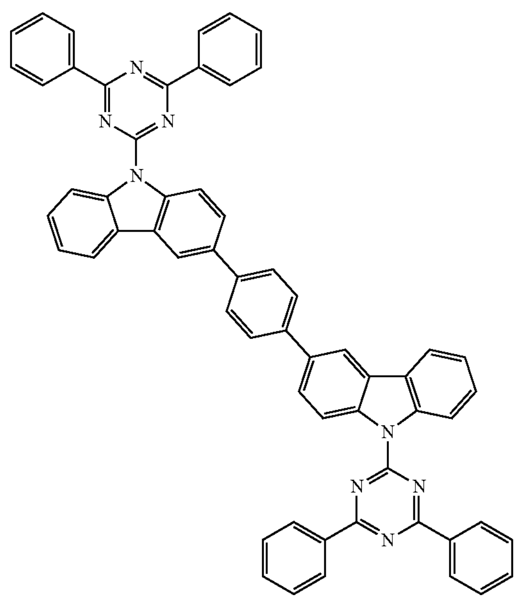

-continued
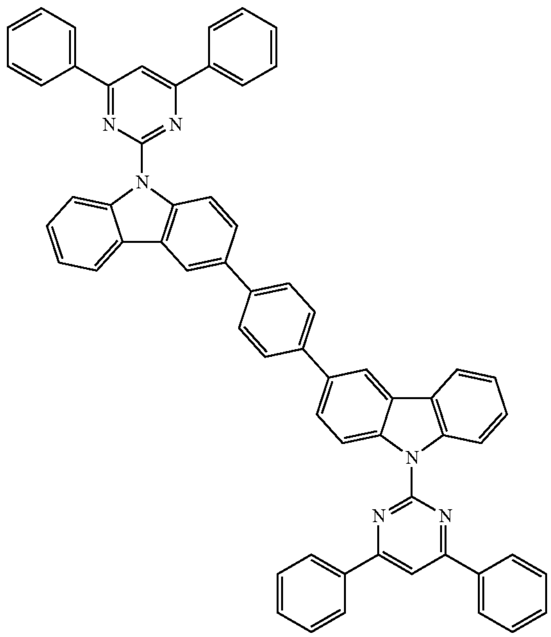
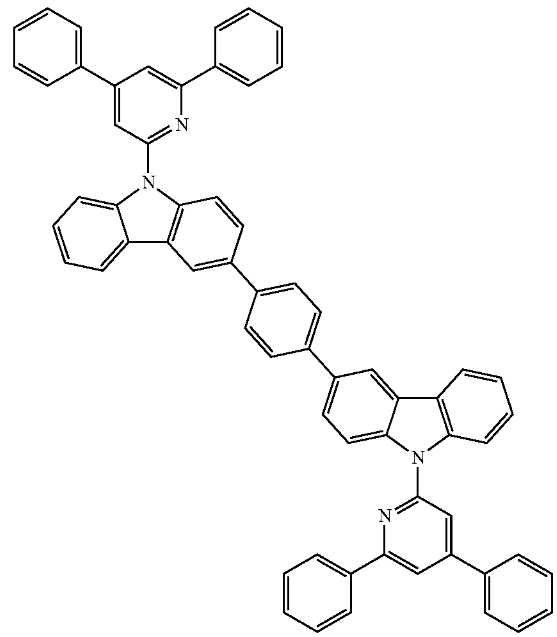
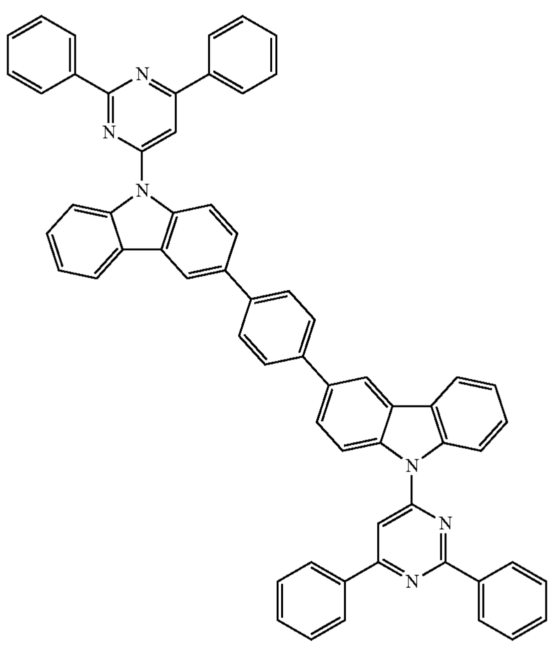
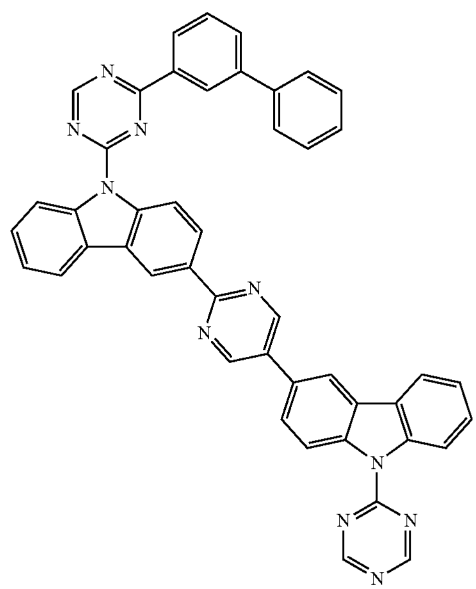

-continued
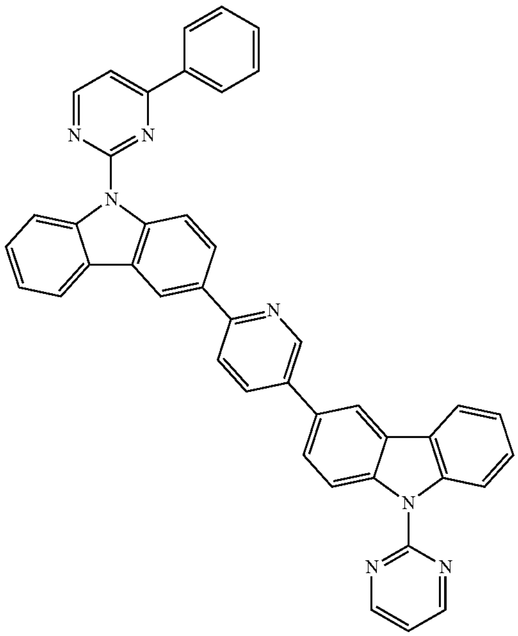
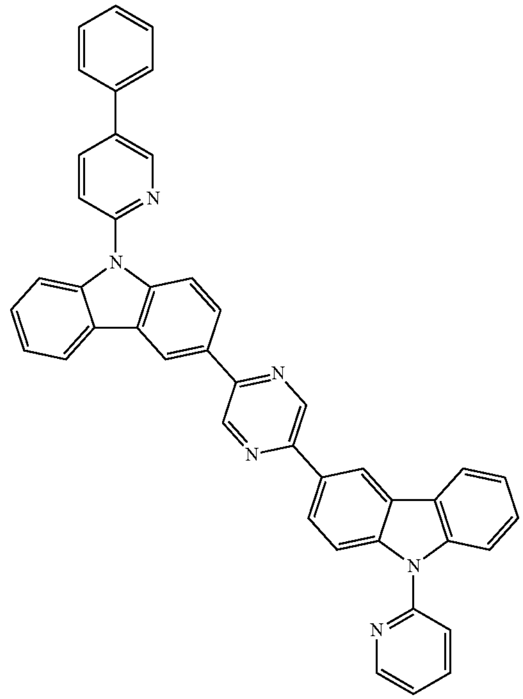
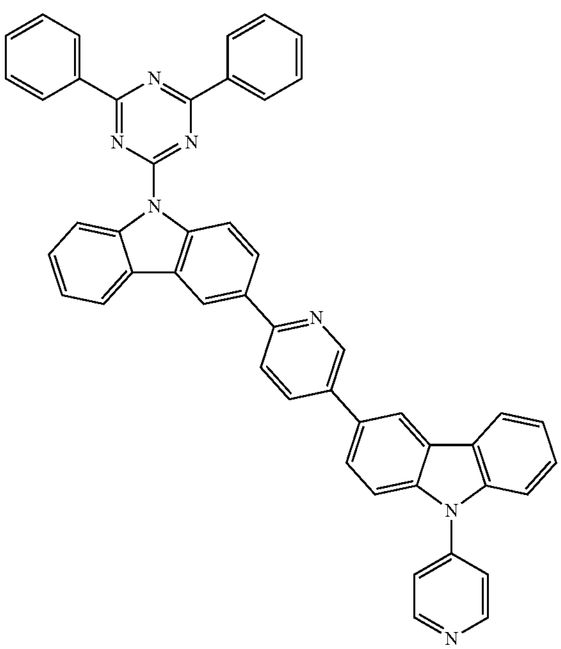
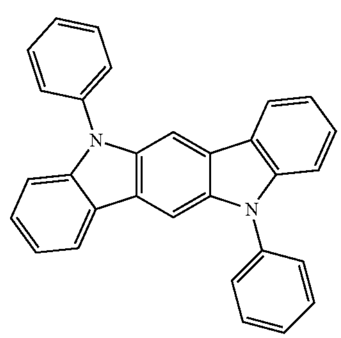

-continued
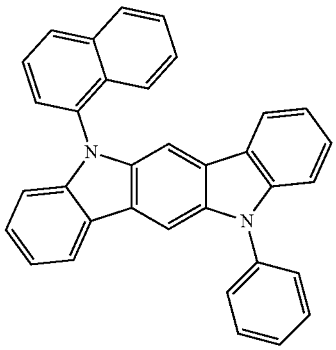
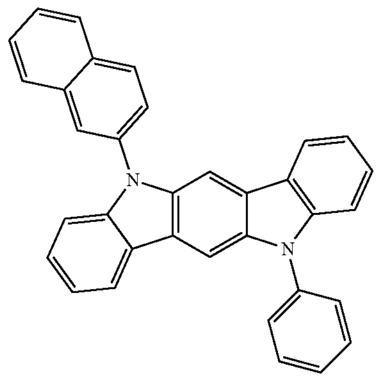
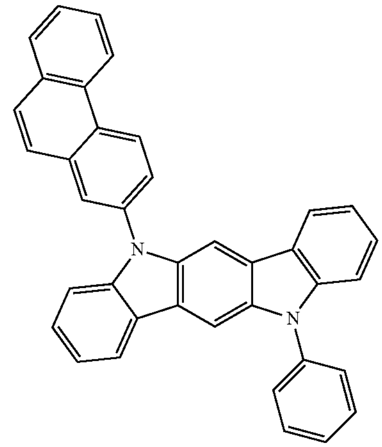
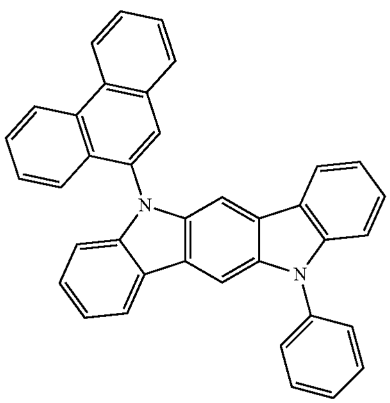
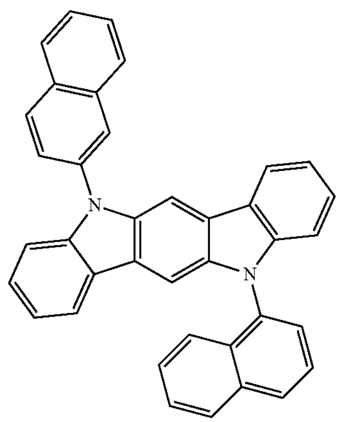
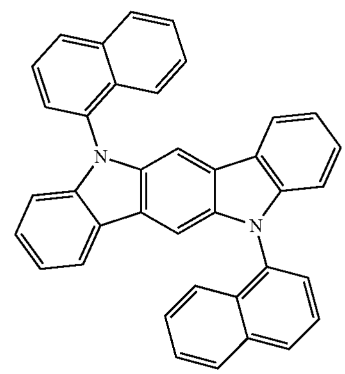
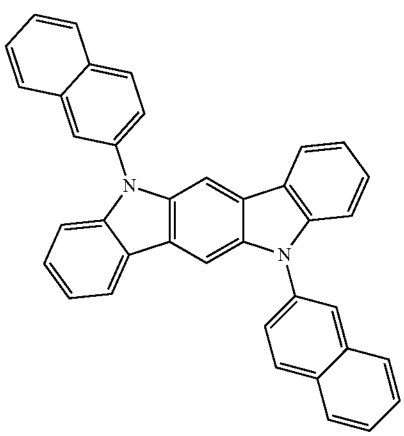
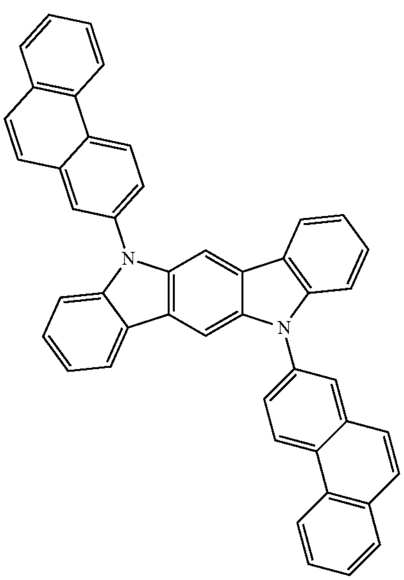

-continued
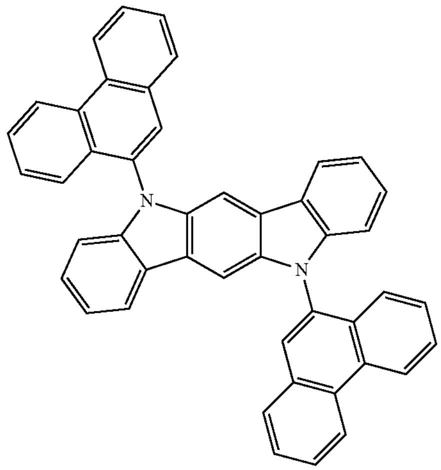
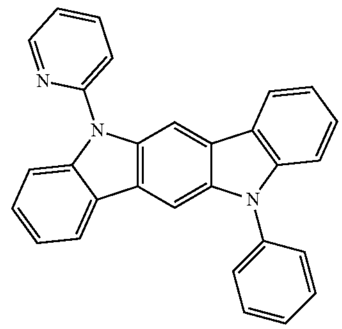
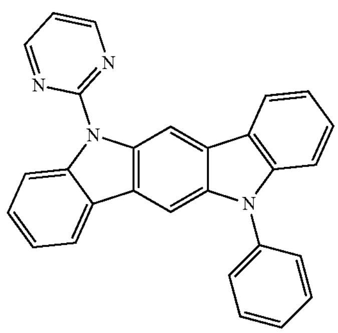
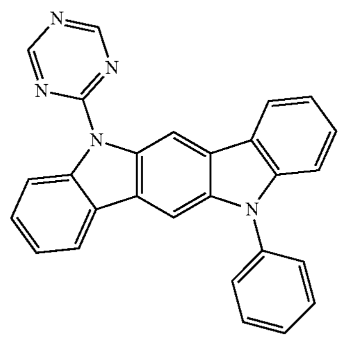
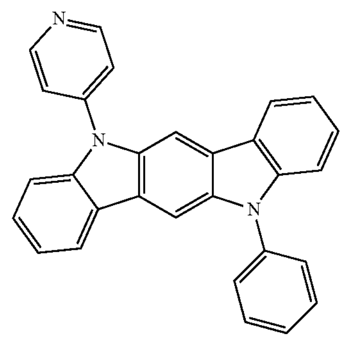
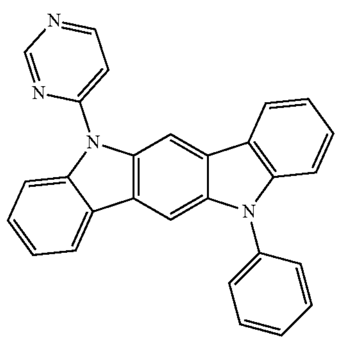
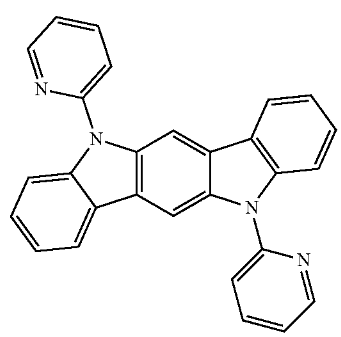
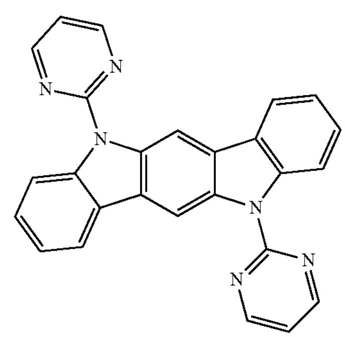
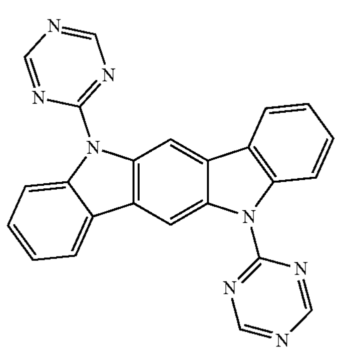
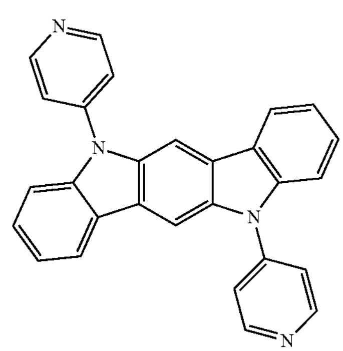
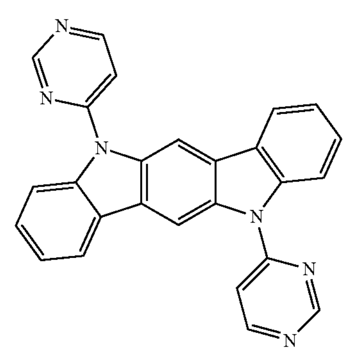

-continued
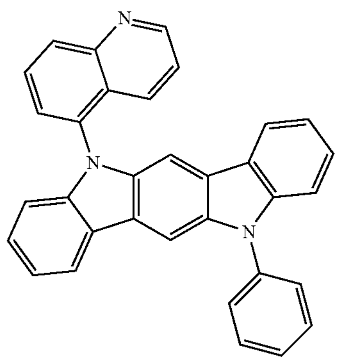
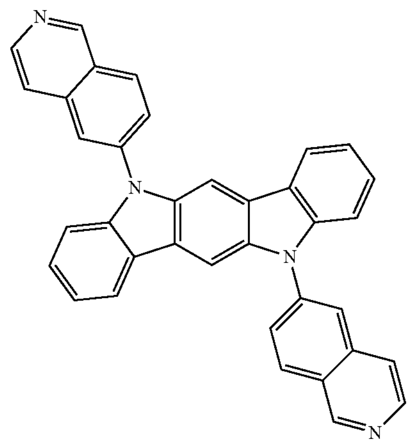
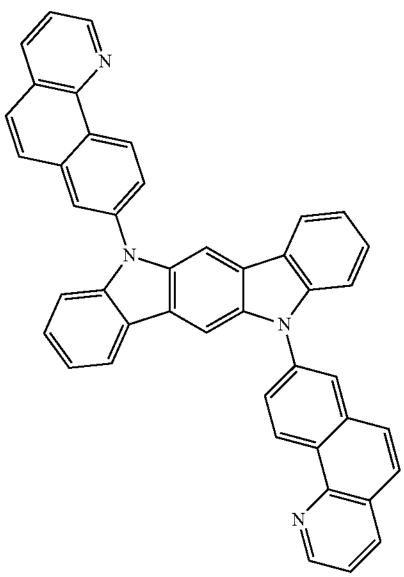
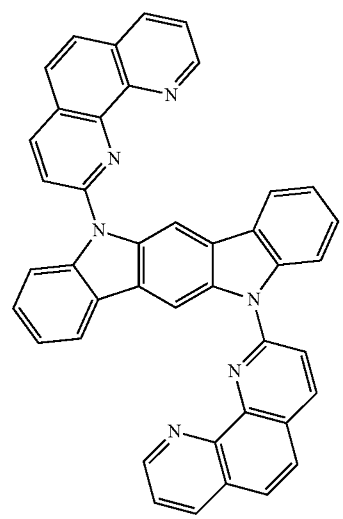
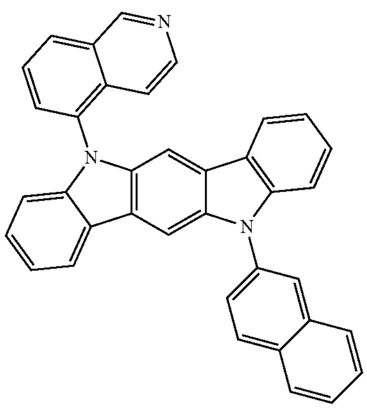
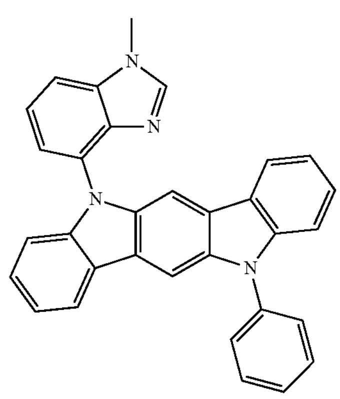
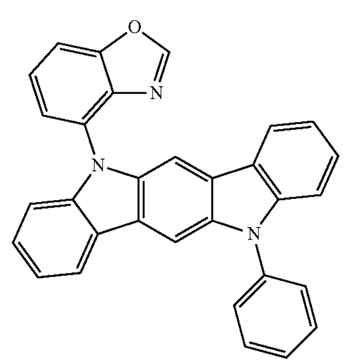

-continued
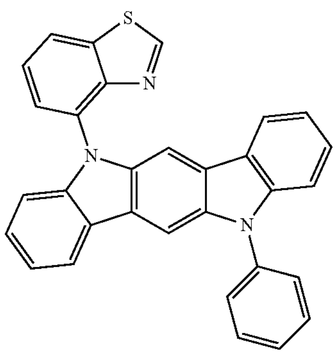
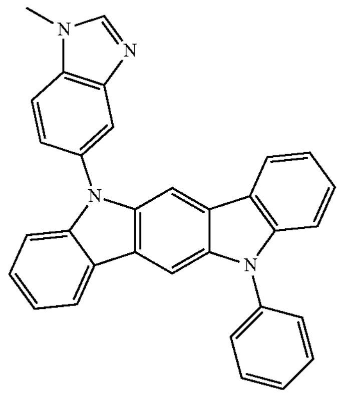
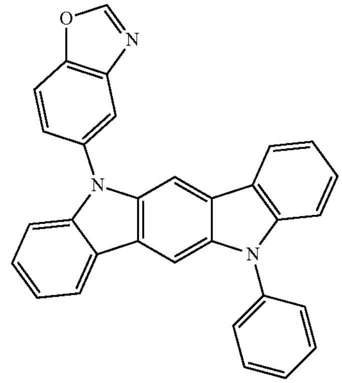
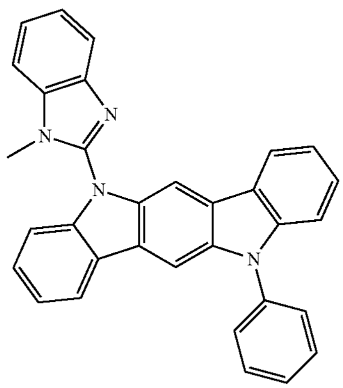
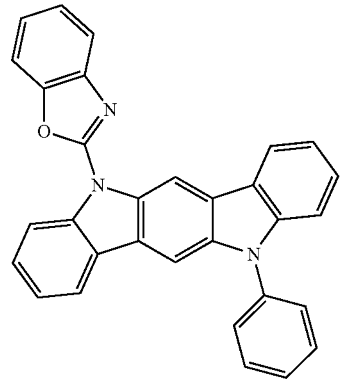
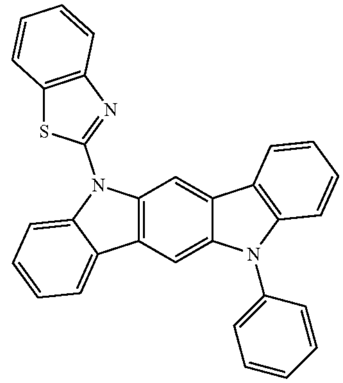
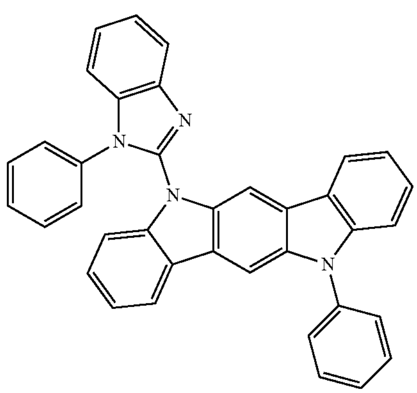
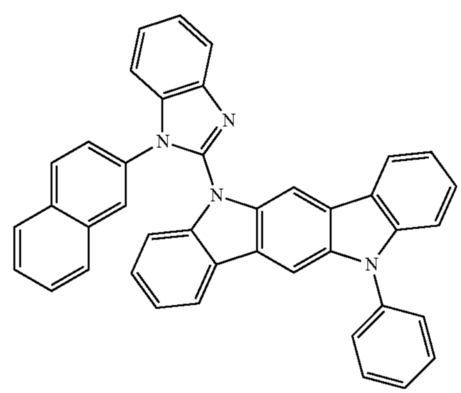
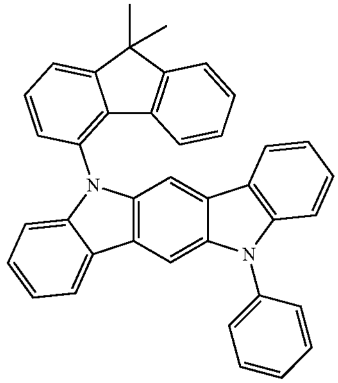
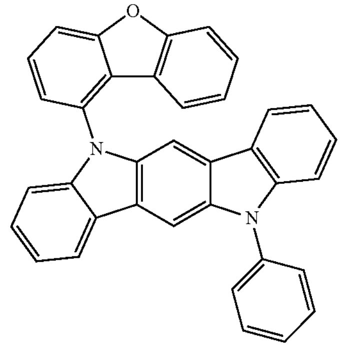
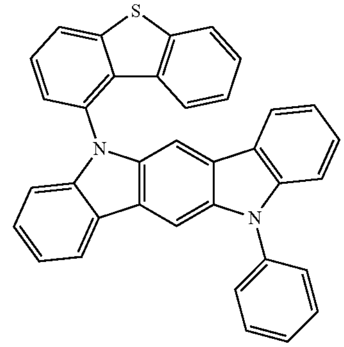

-continued
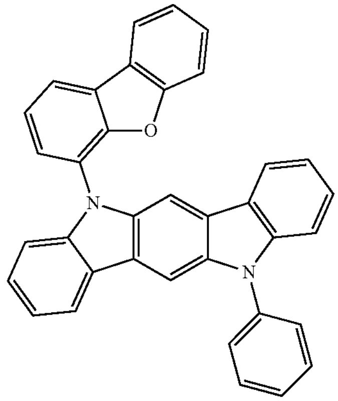
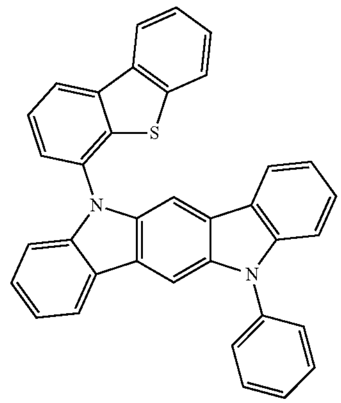
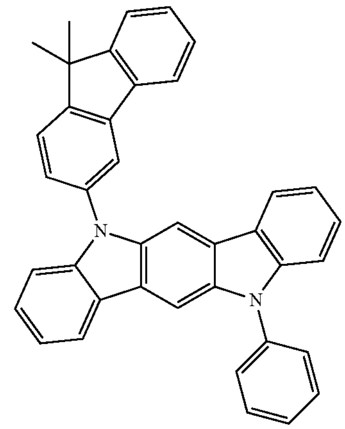
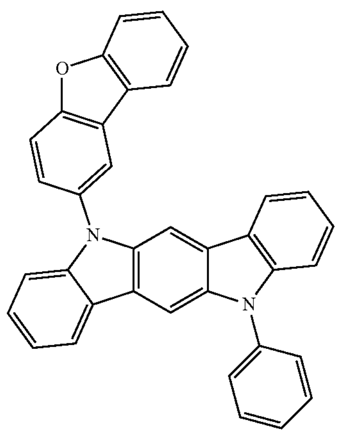
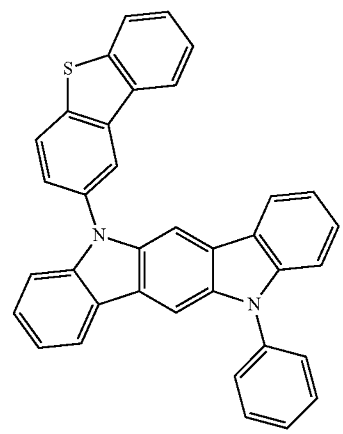
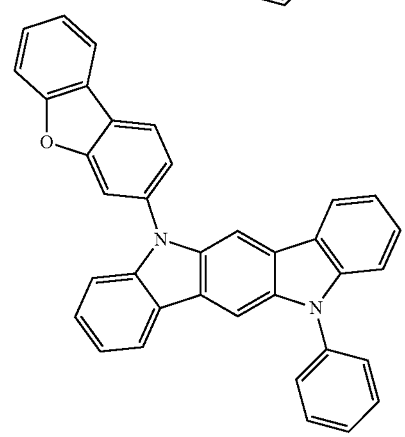
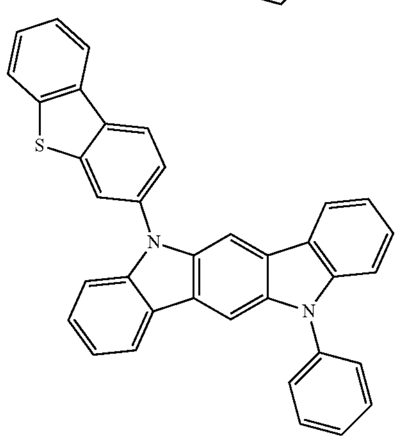
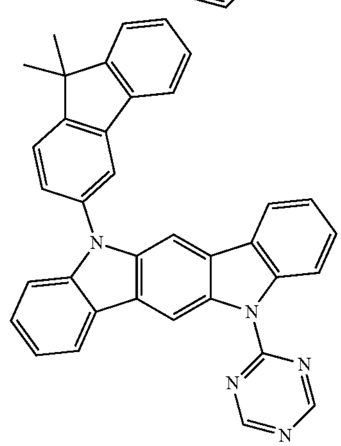
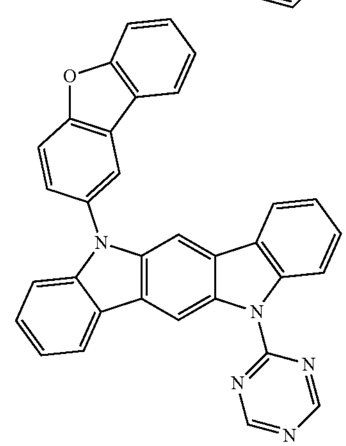
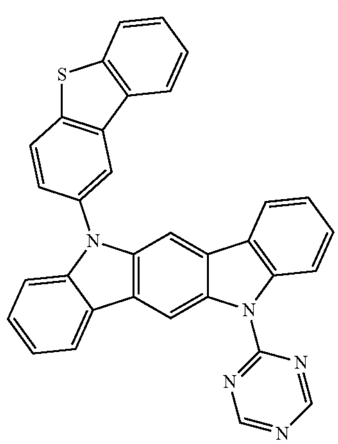
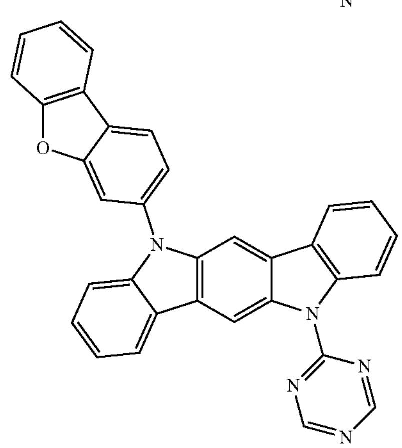

-continued
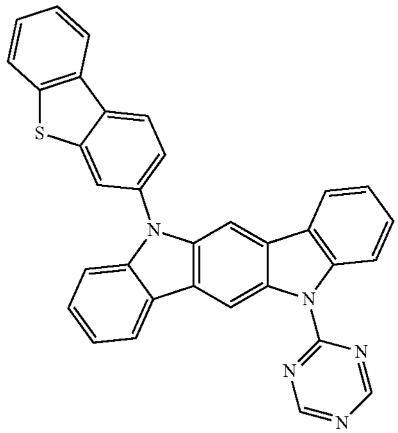
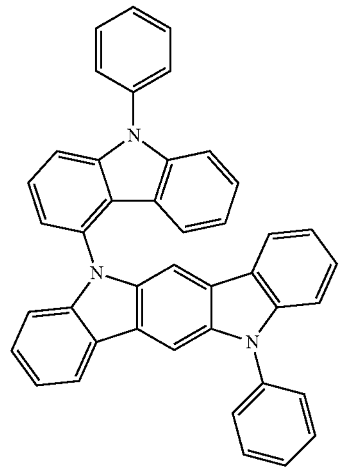
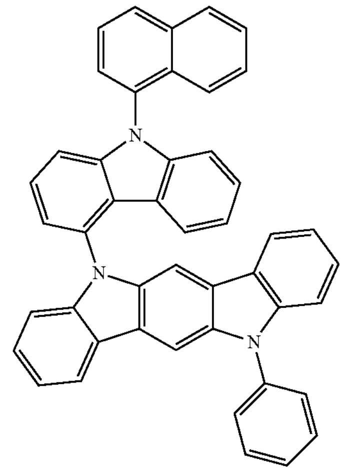
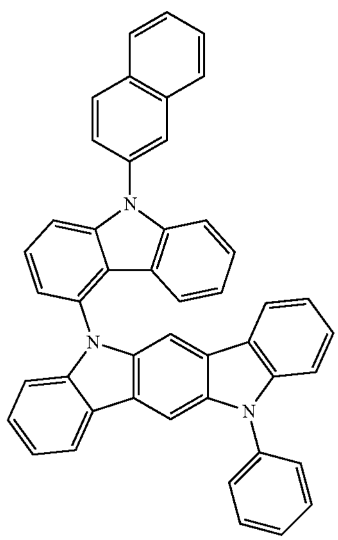
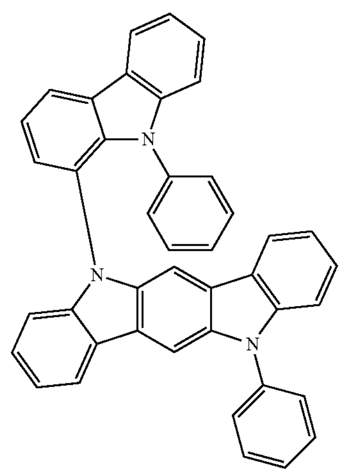
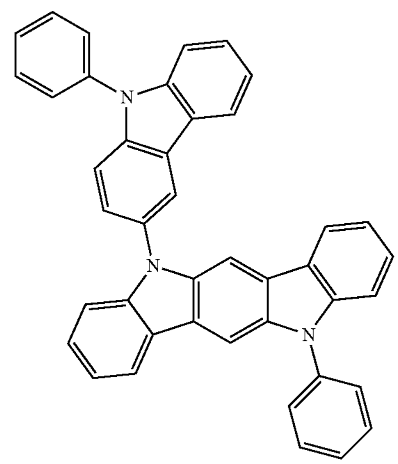
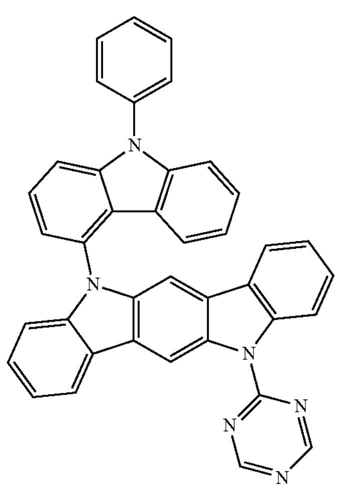
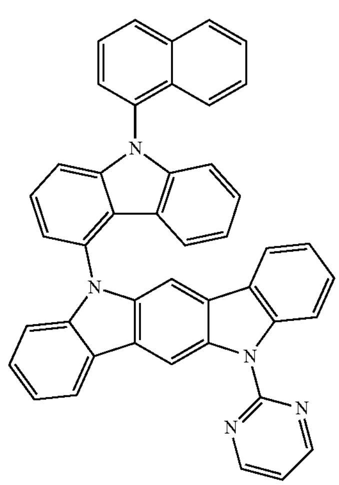
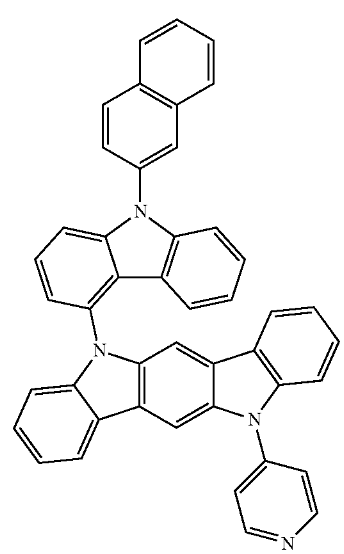

-continued
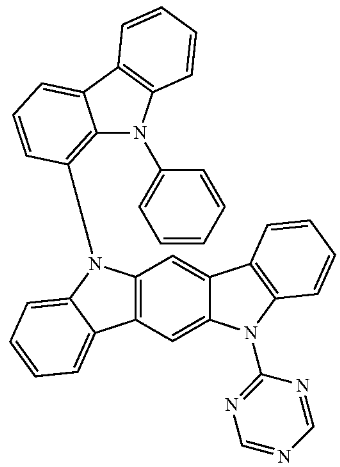
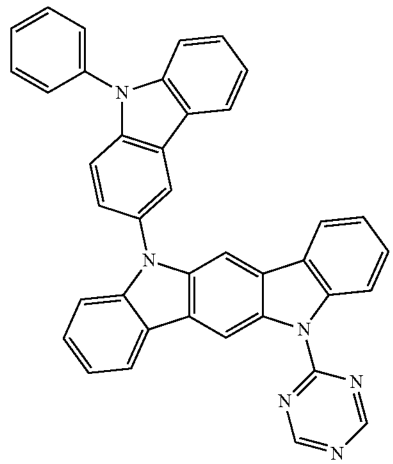
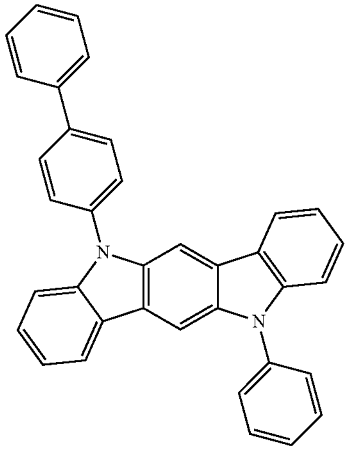
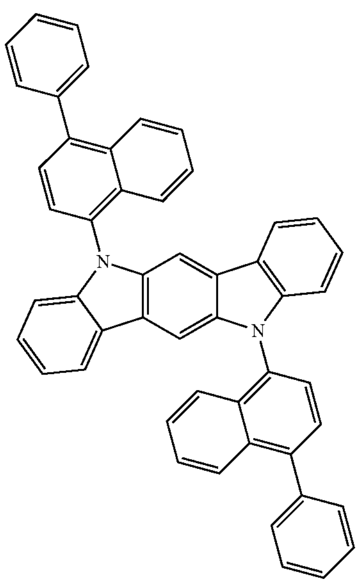
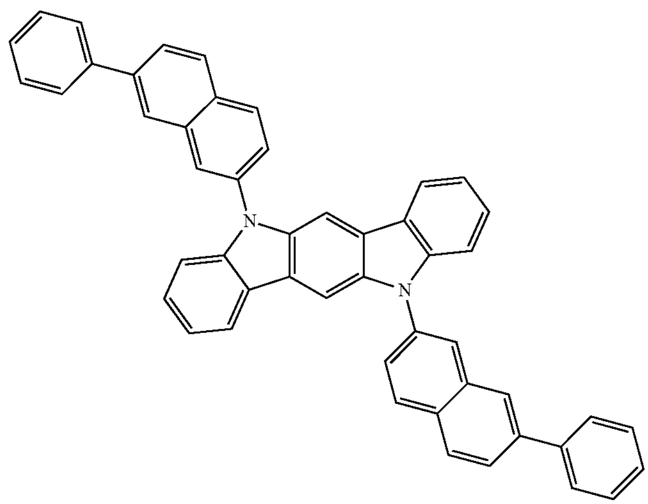
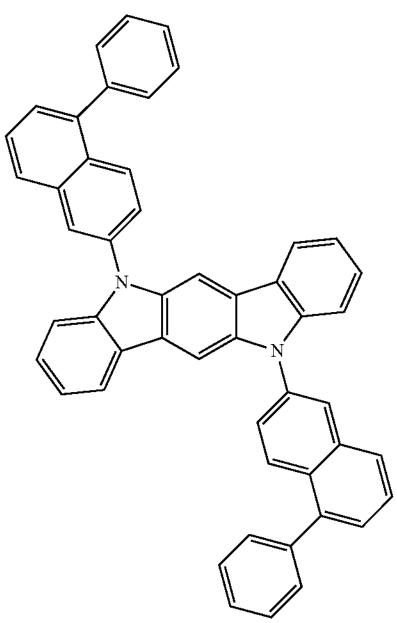
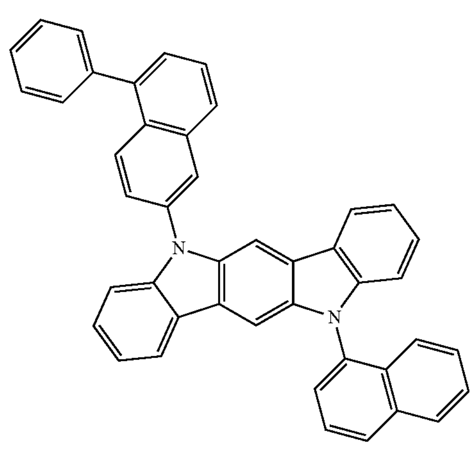

-continued
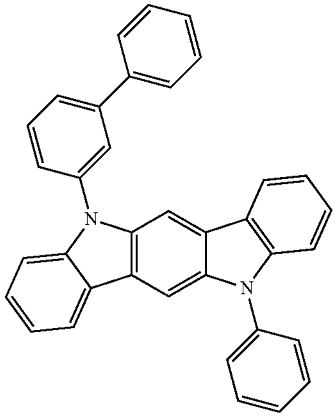
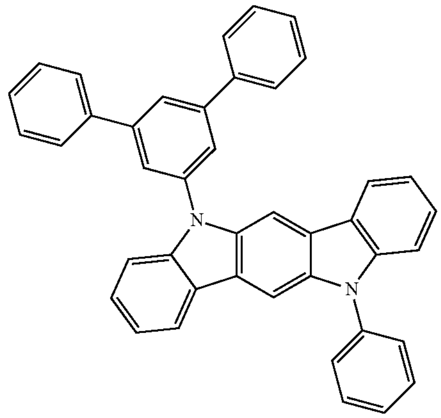
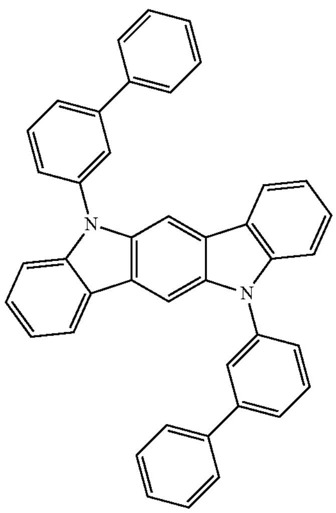
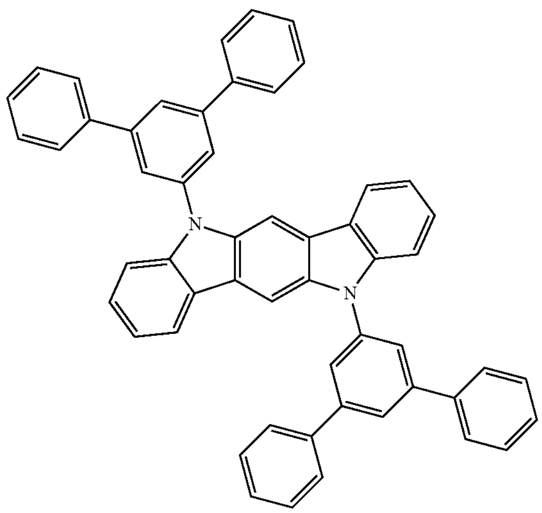
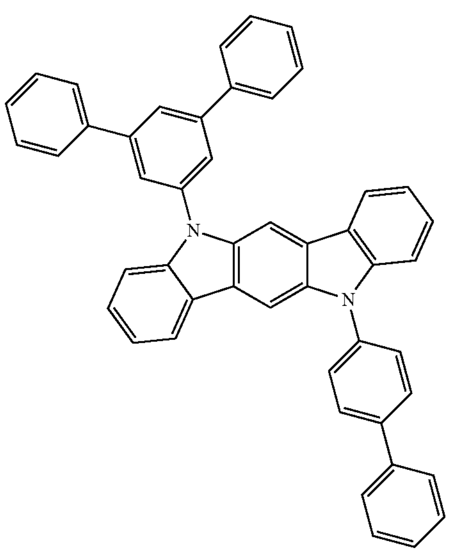
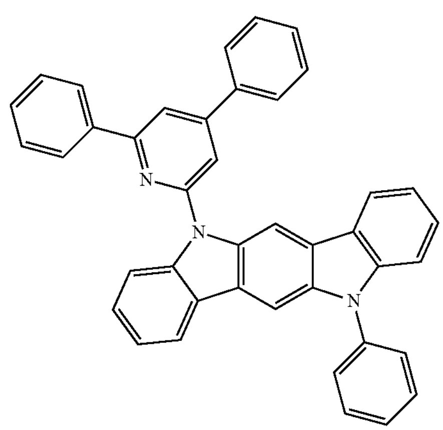

-continued
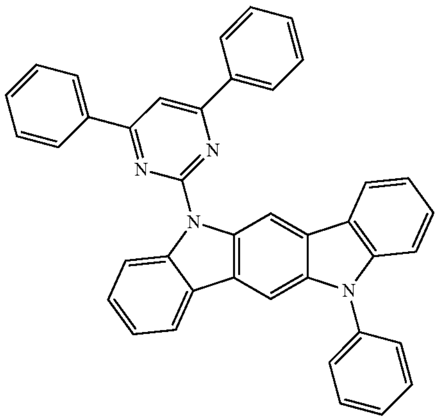
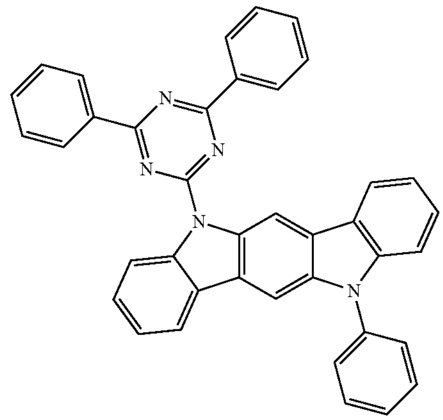
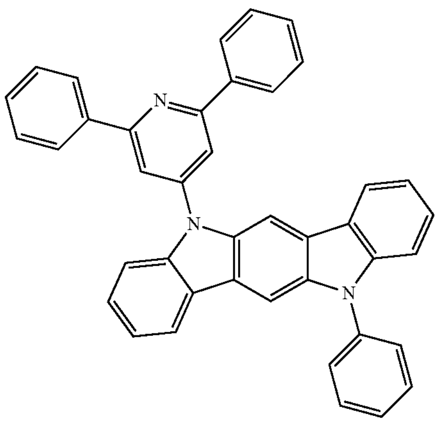
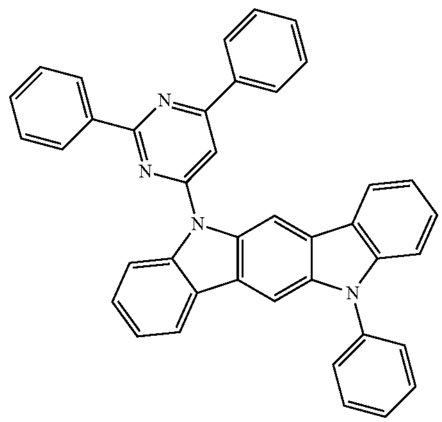
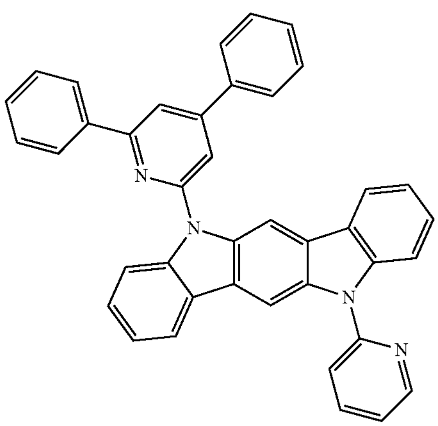
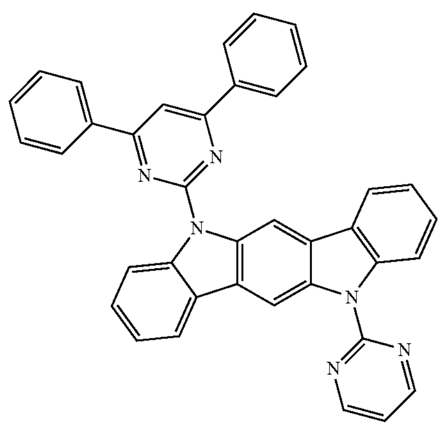
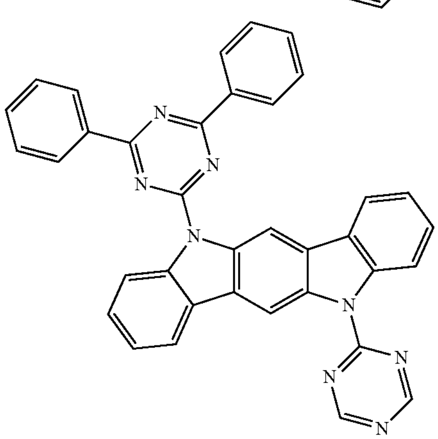
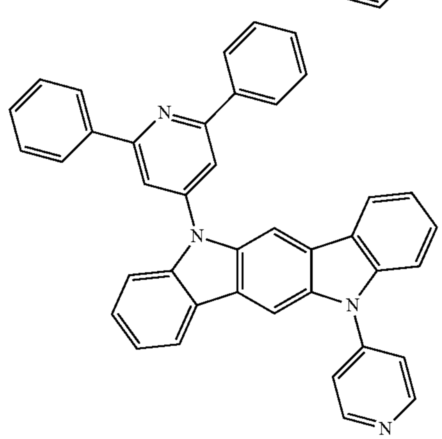

-continued
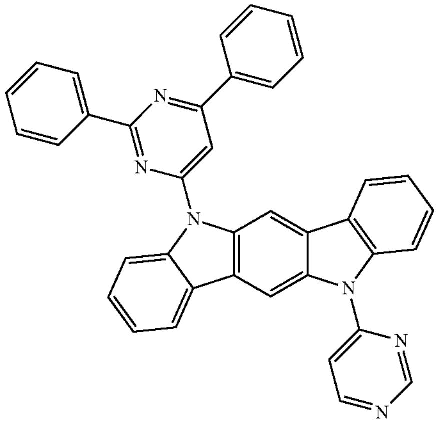
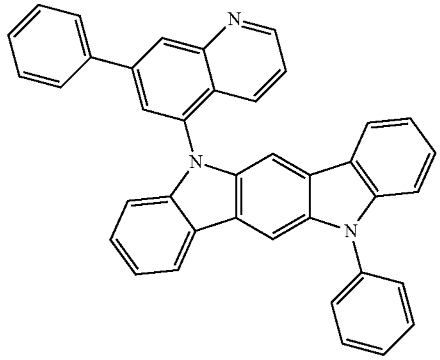
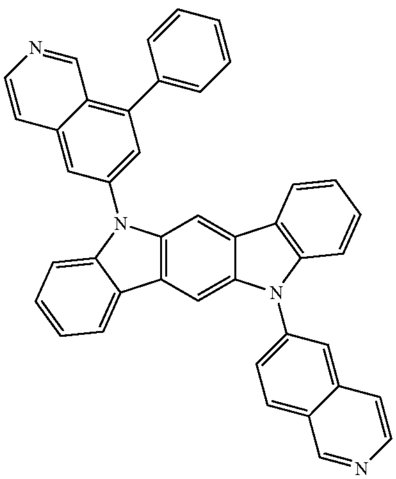
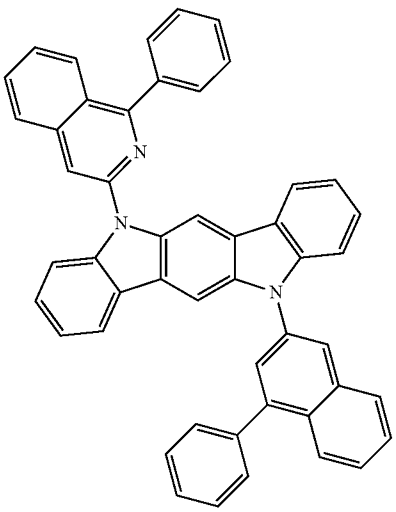
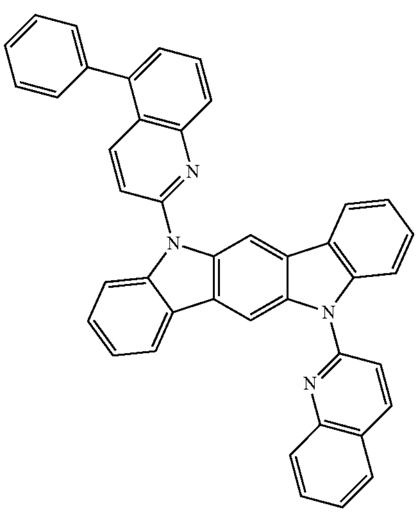
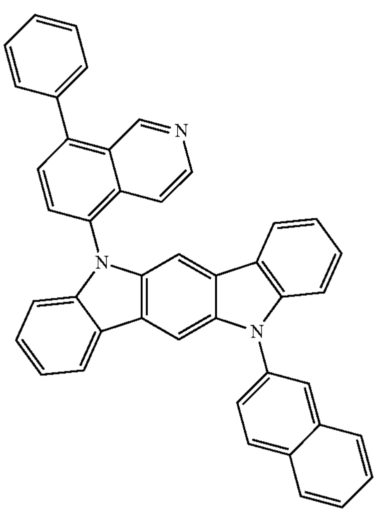

-continued
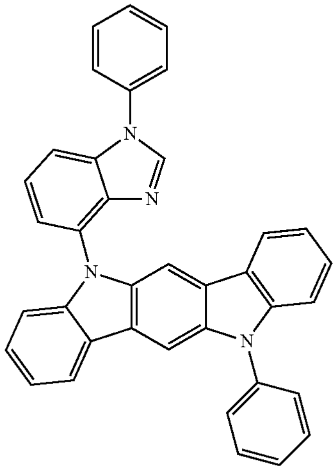
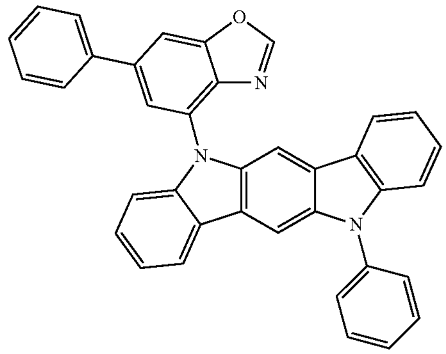
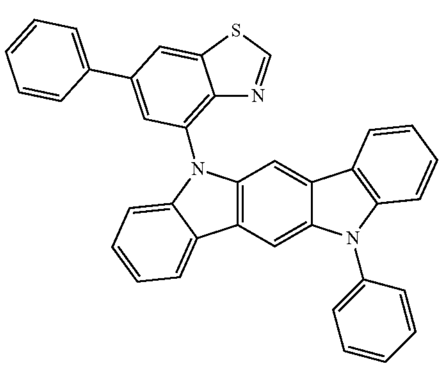
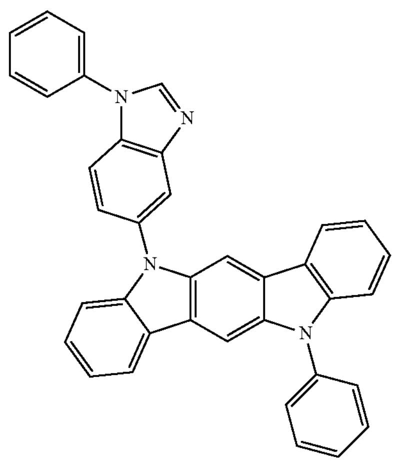
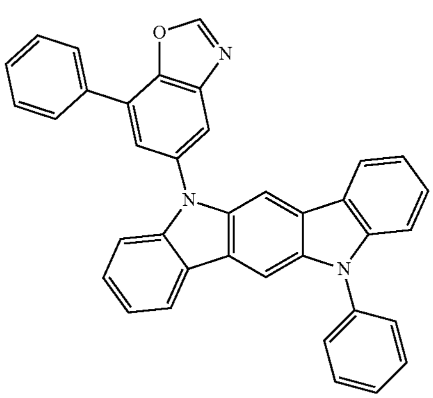
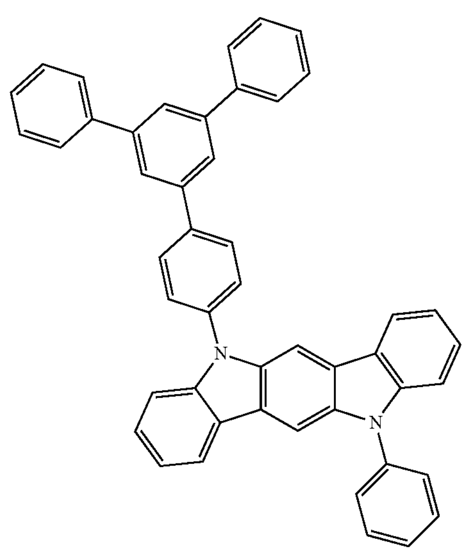

-continued
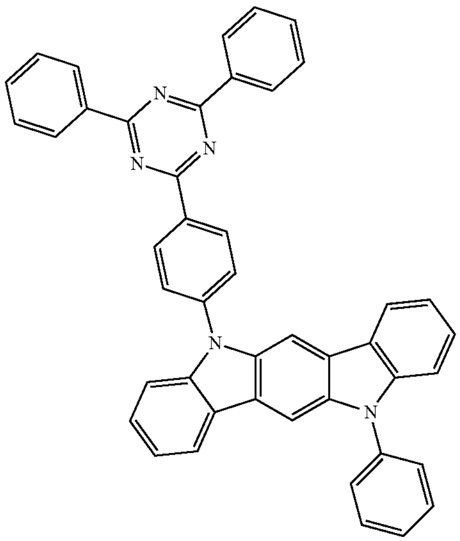
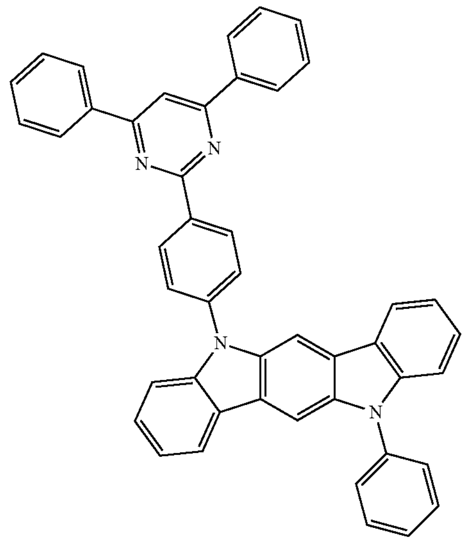
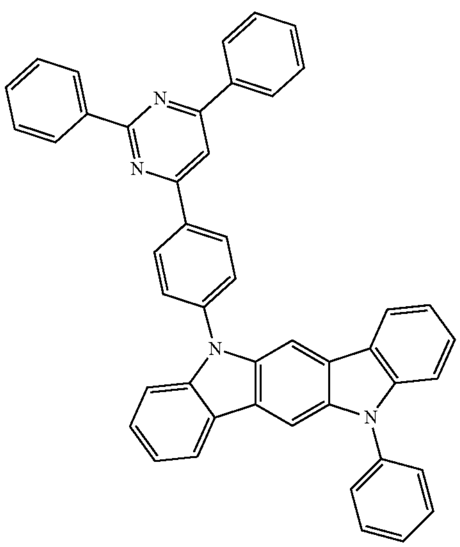
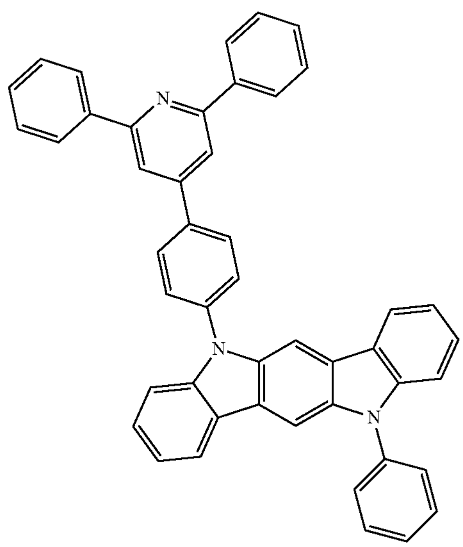
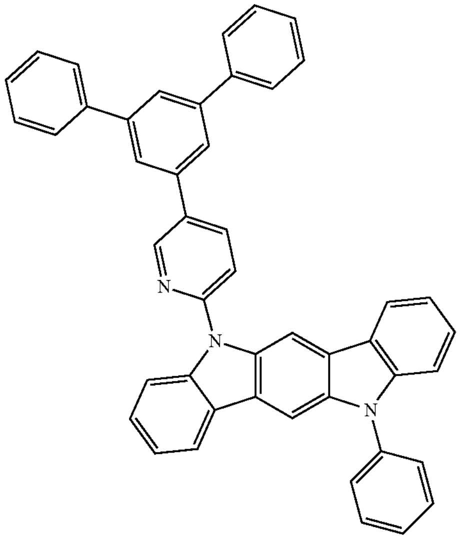
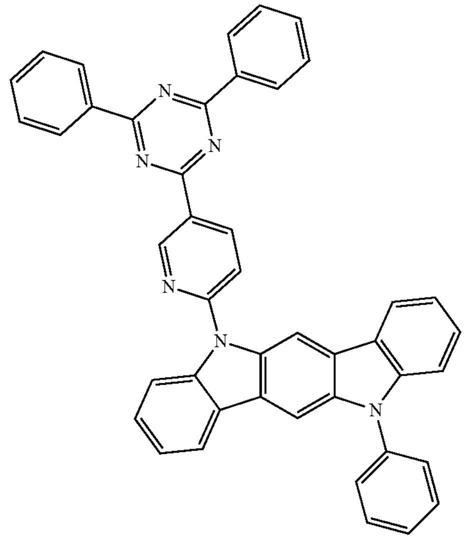

-continued
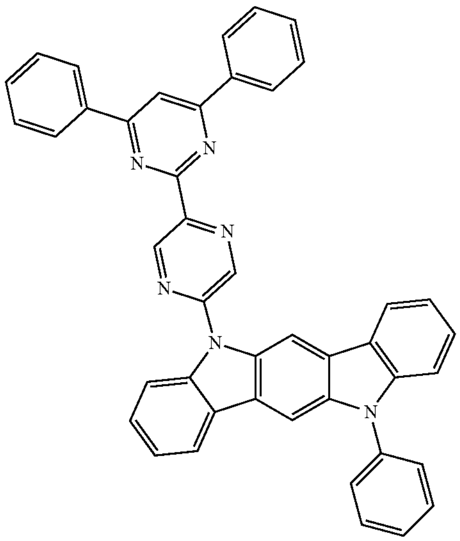
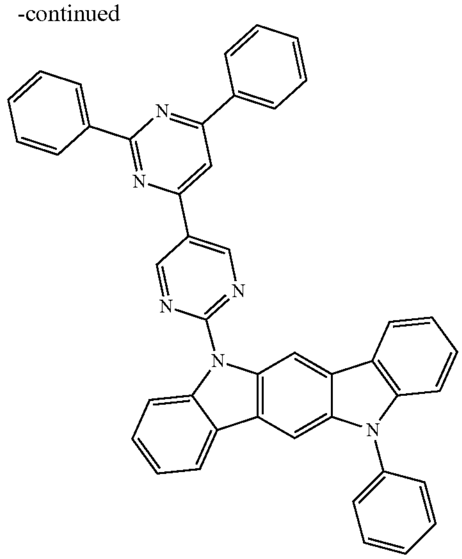
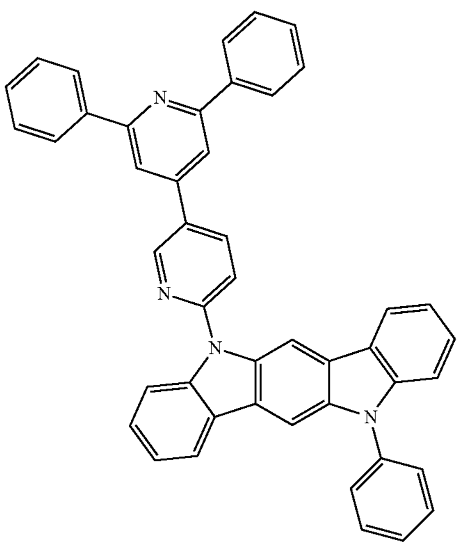
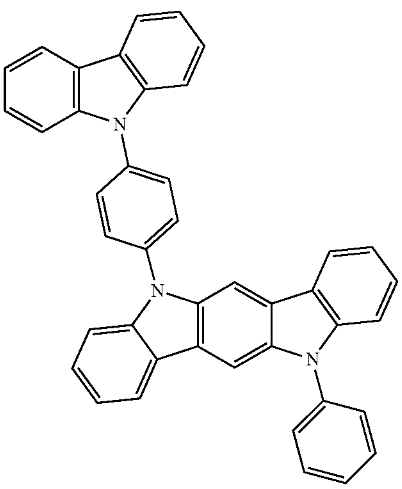
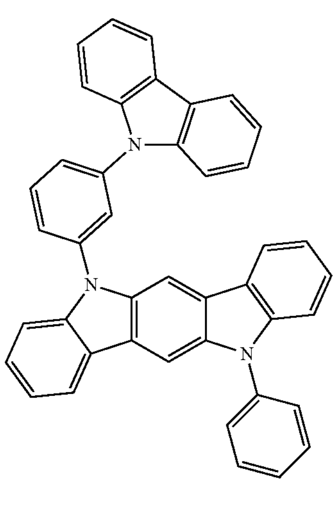
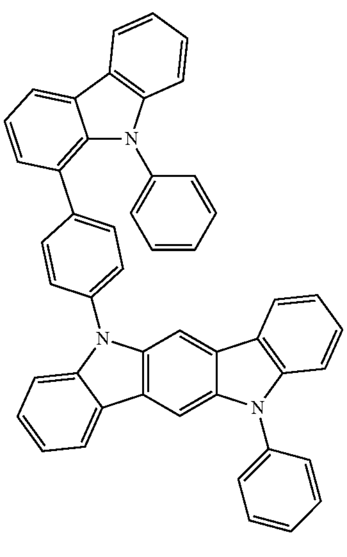
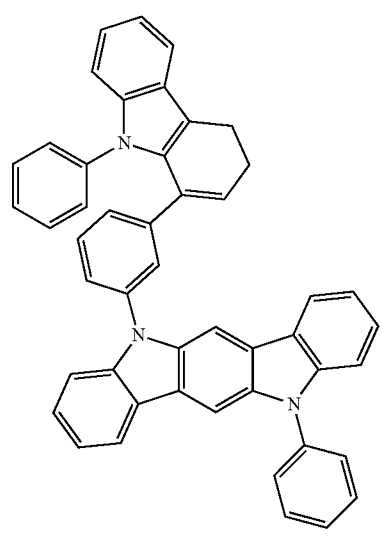

-continued
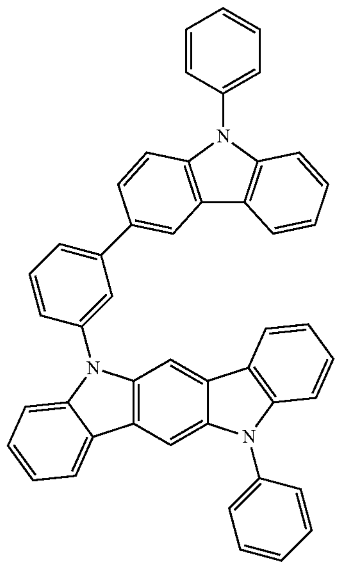
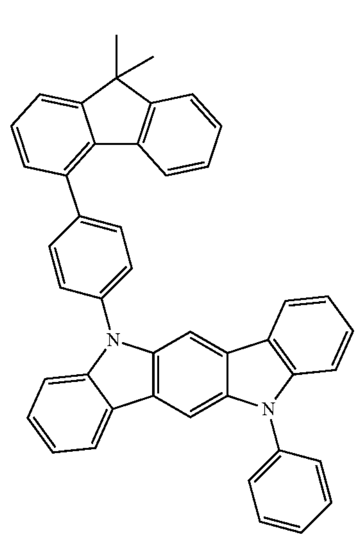
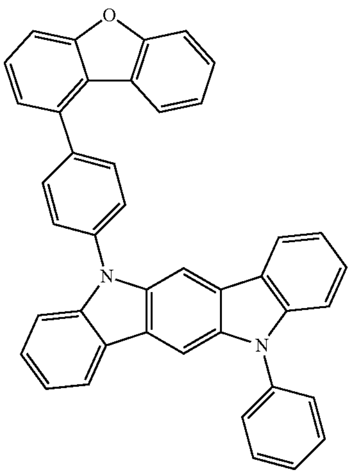
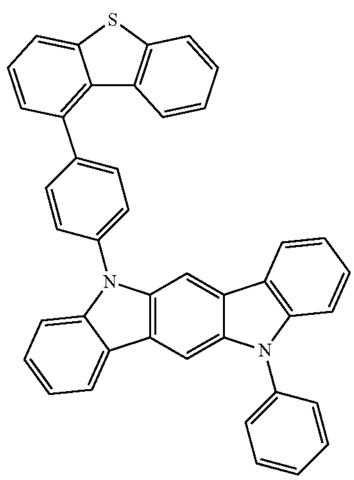
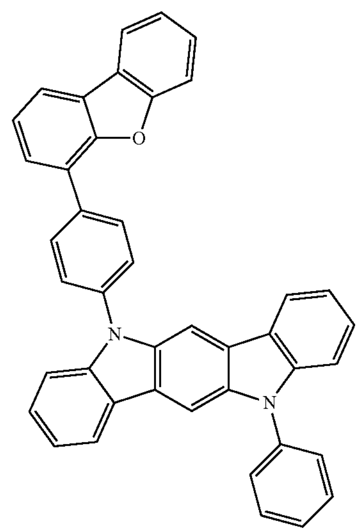
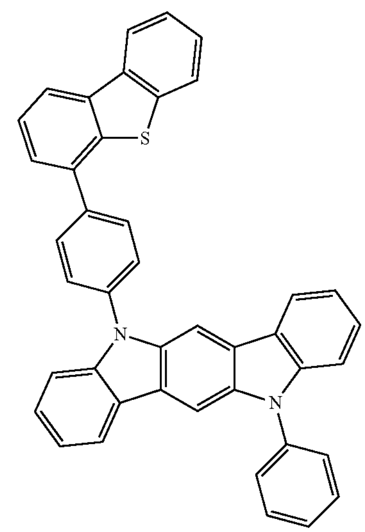
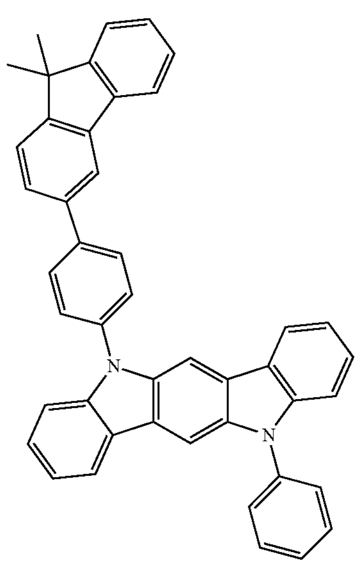
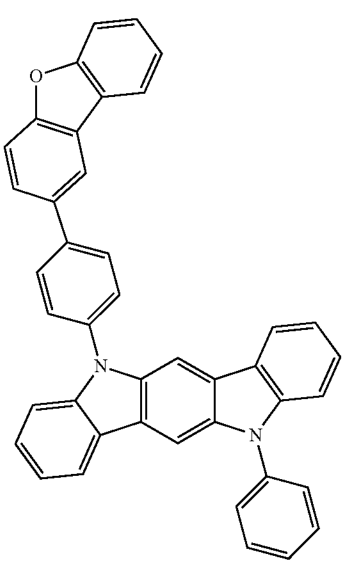
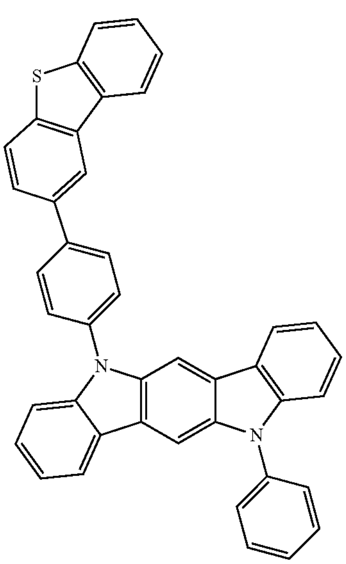

-continued
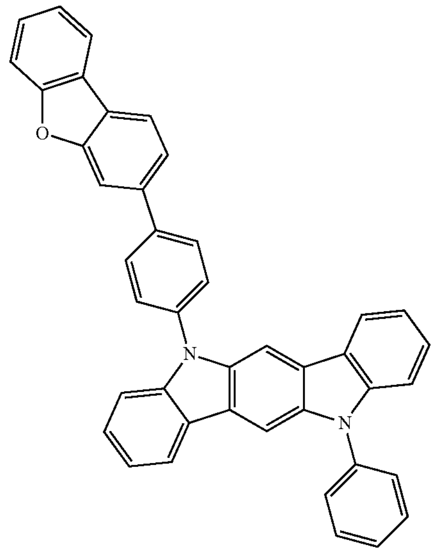
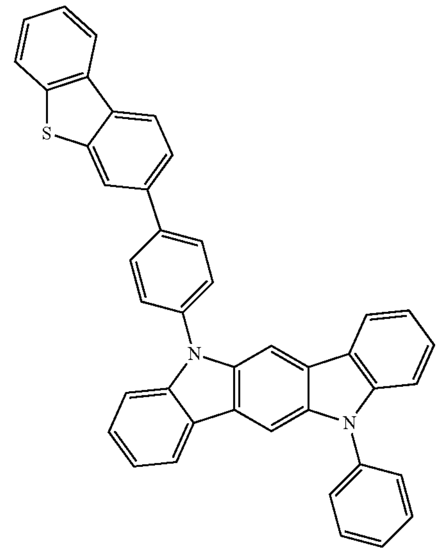
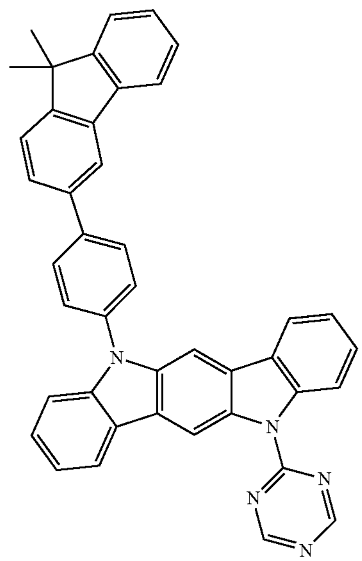
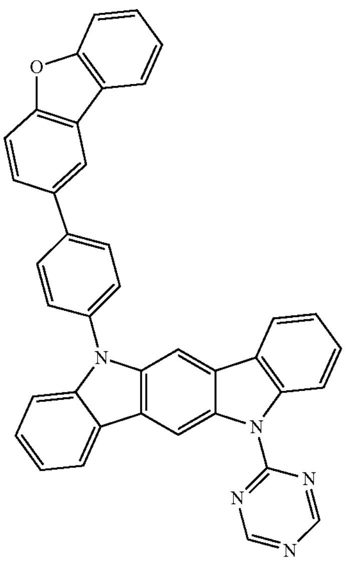
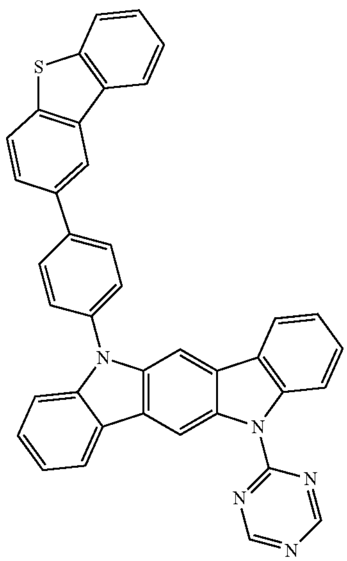
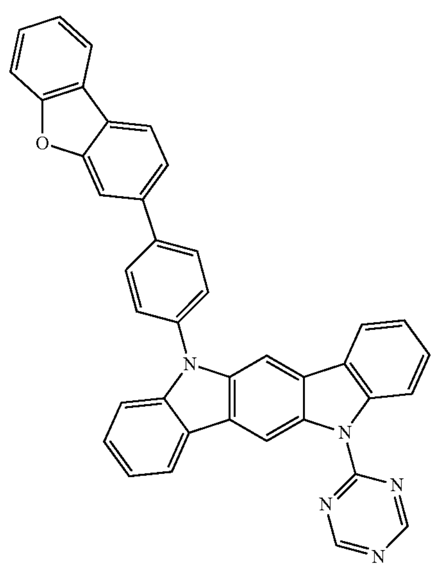
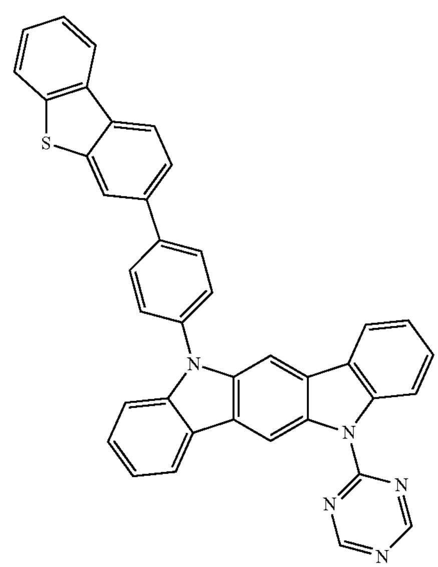

-continued
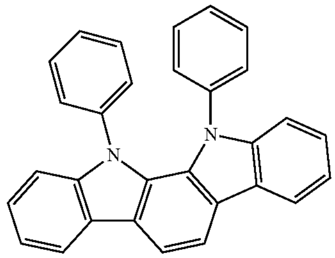
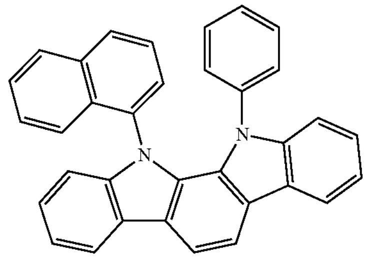
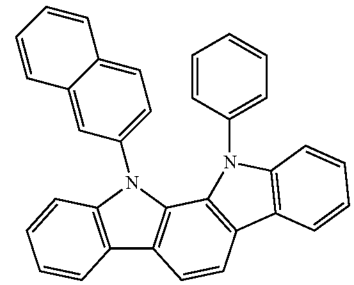
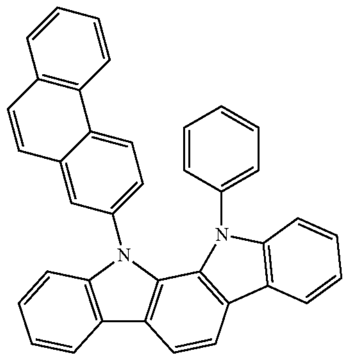
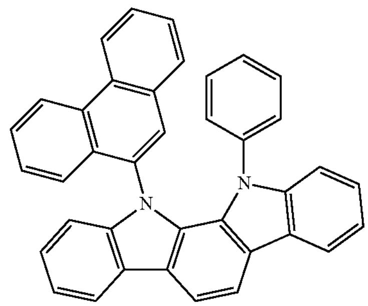
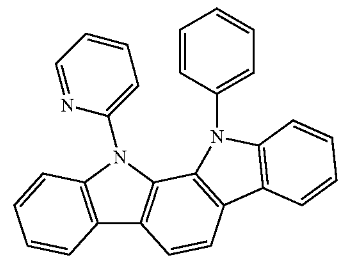
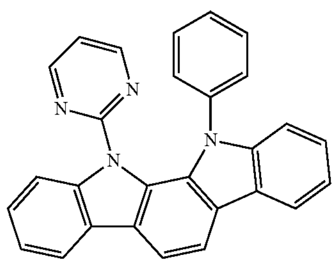
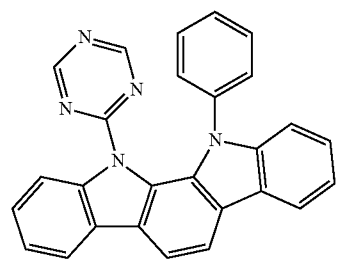
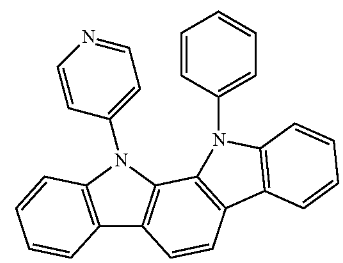
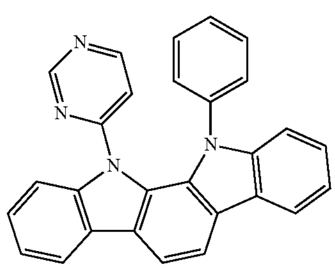
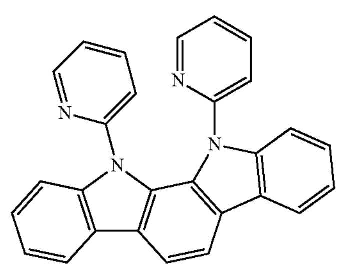
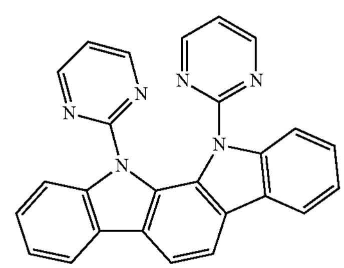
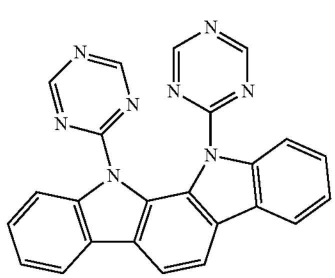
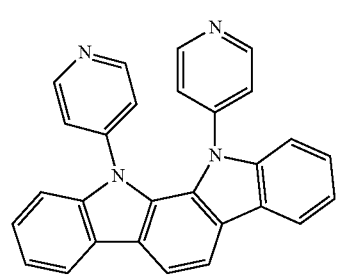
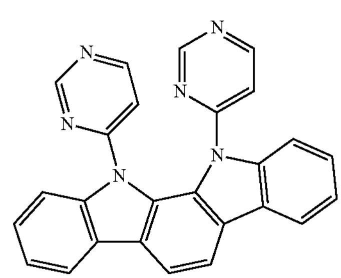

-continued
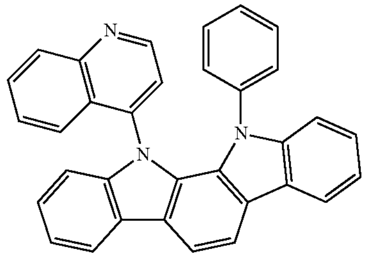
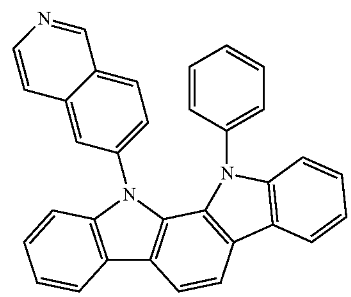
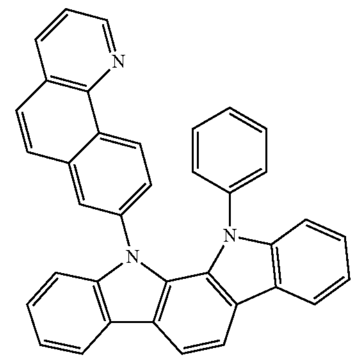
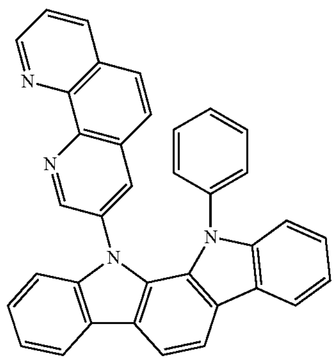
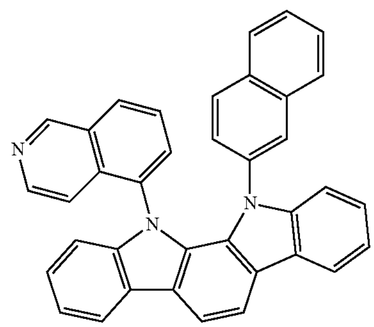
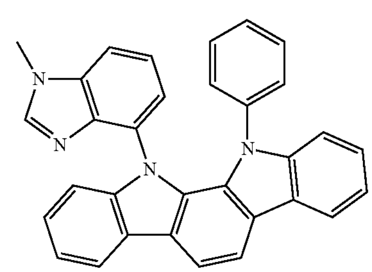
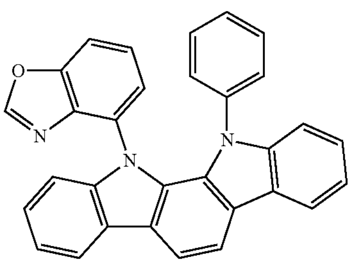
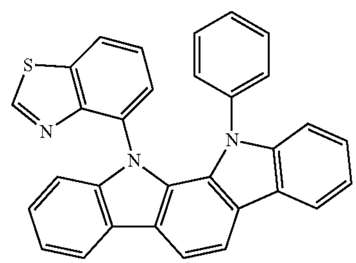
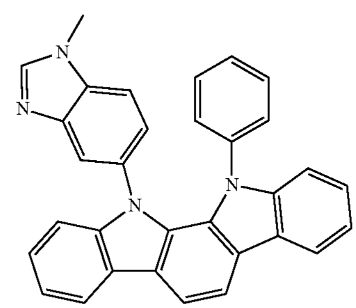
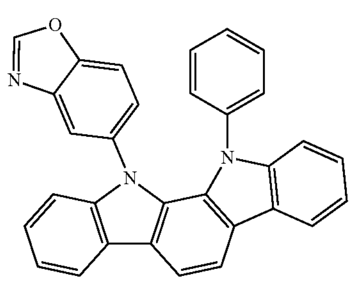
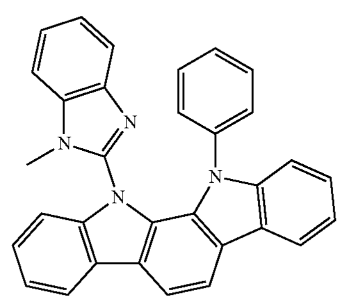
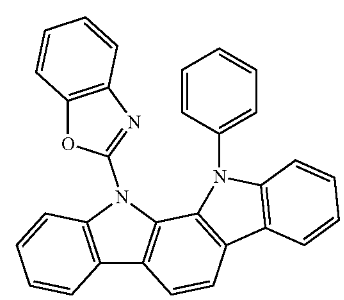
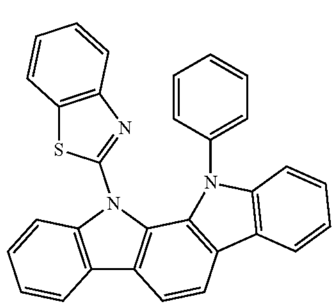
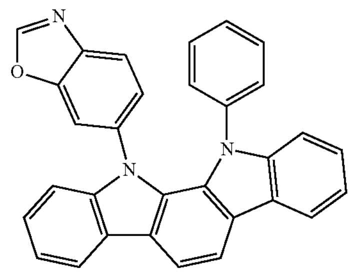
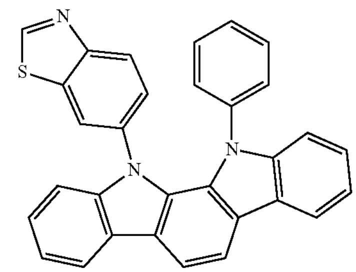

-continued
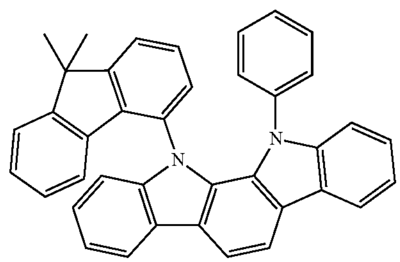
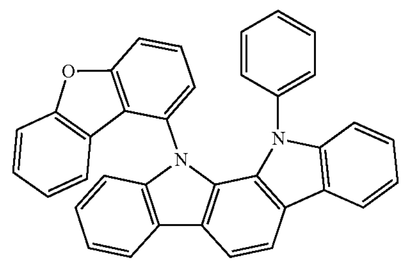
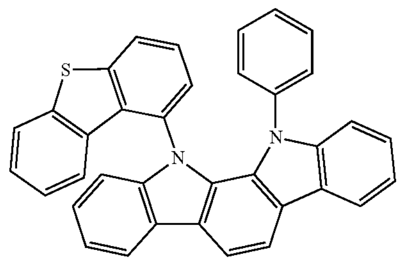
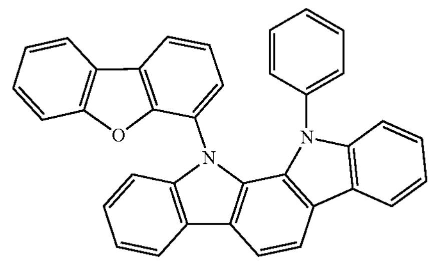
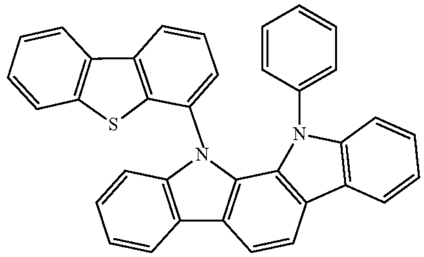
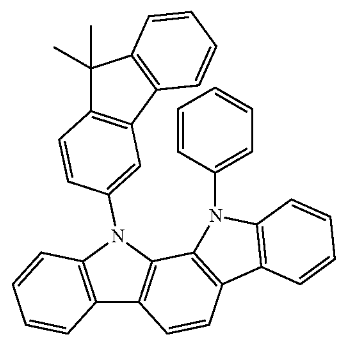
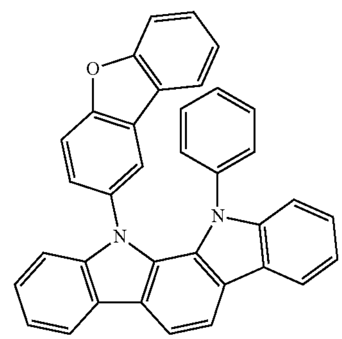
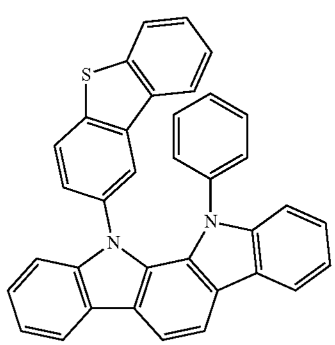
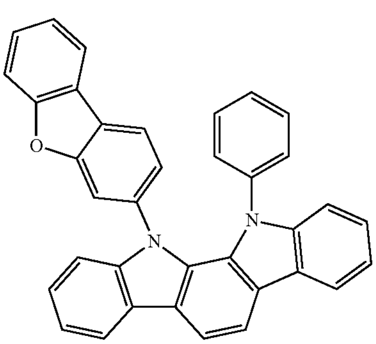
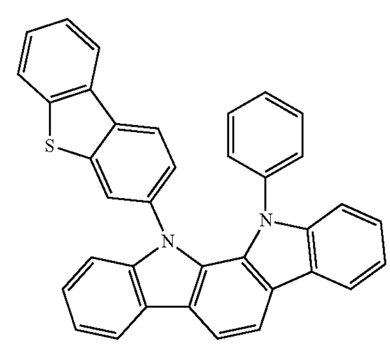
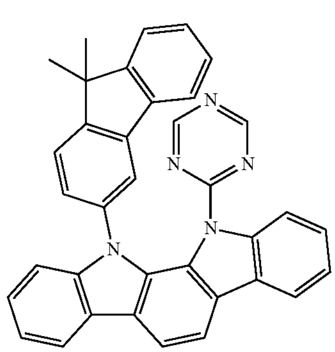
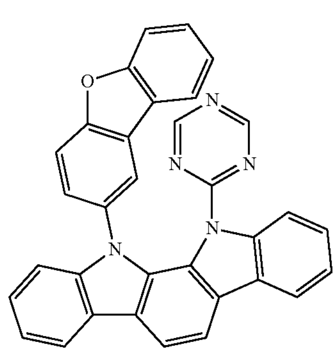
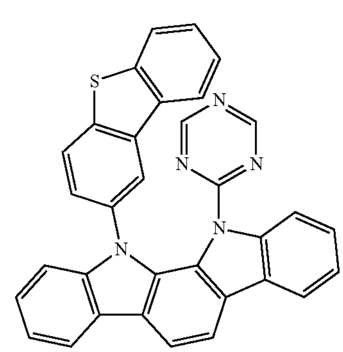

-continued
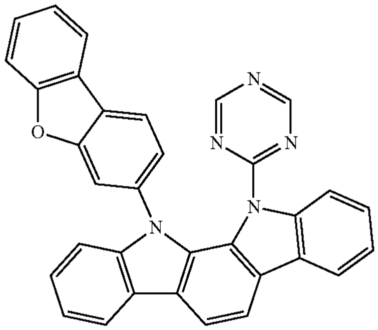
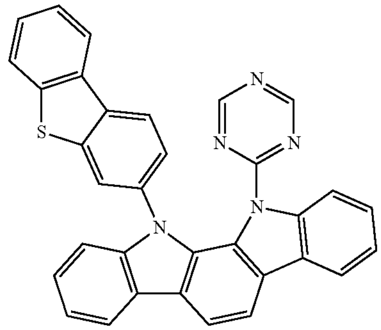
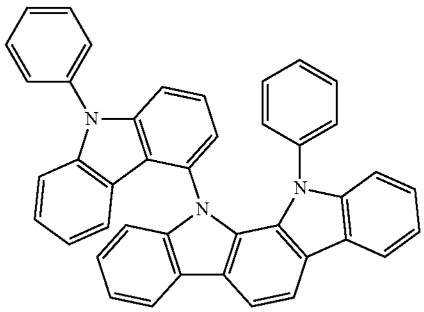
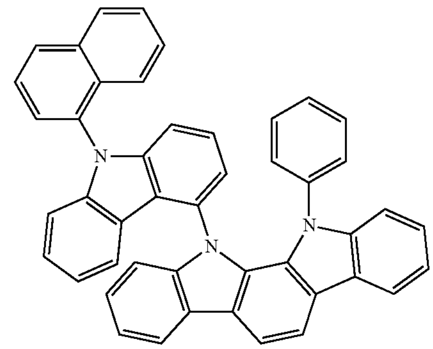
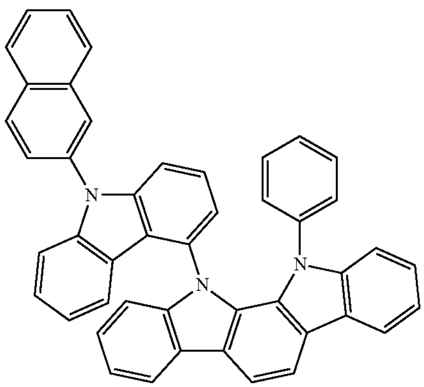
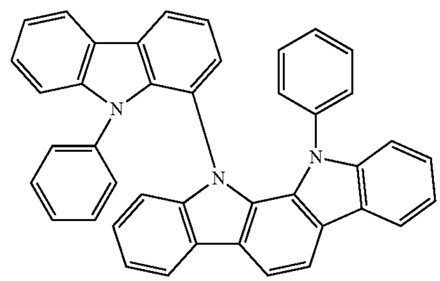
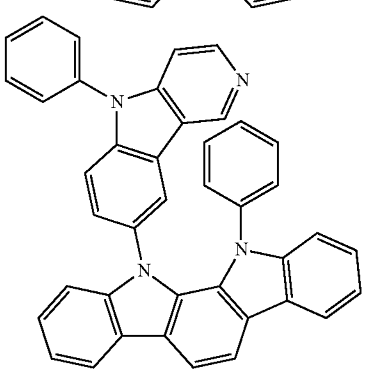
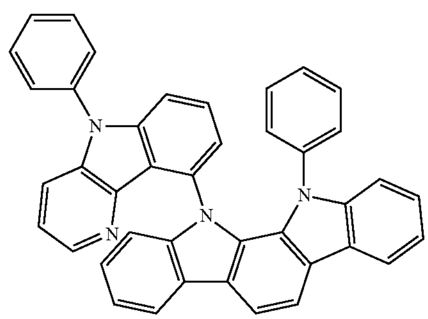
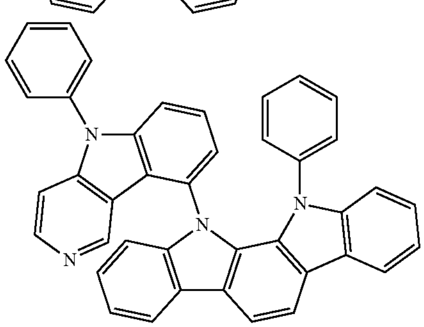
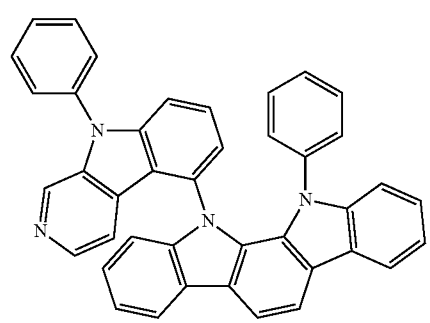

-continued
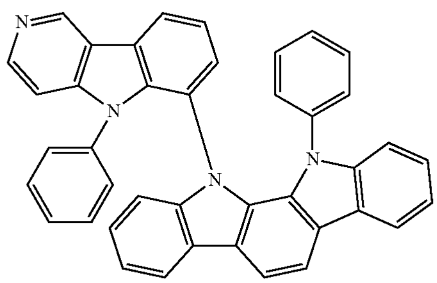
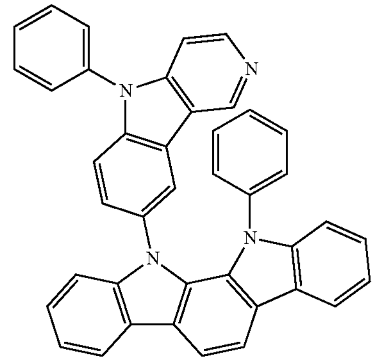
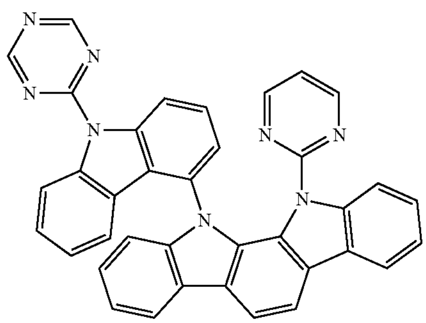
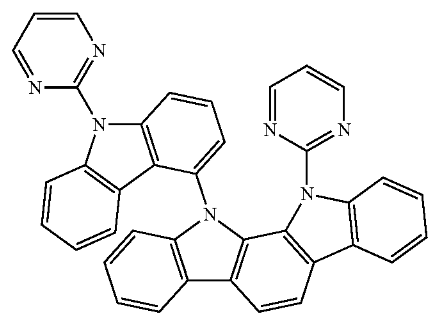
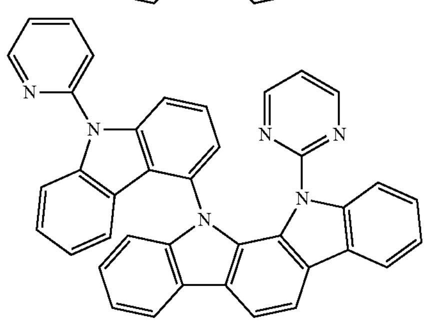
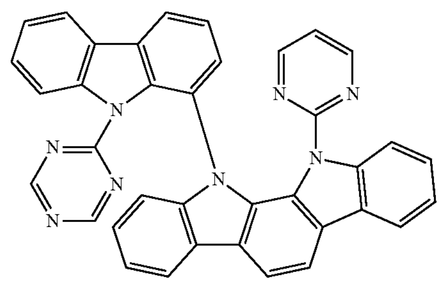
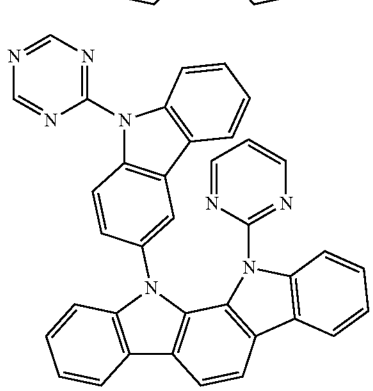
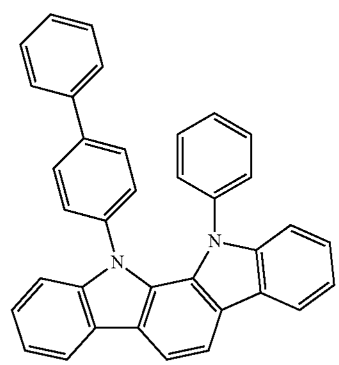
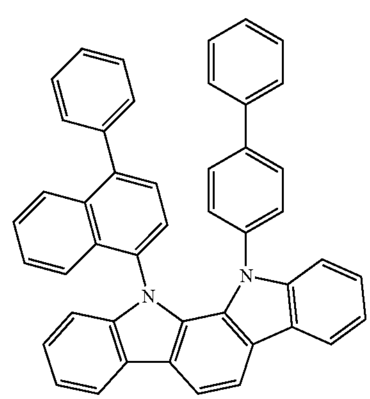
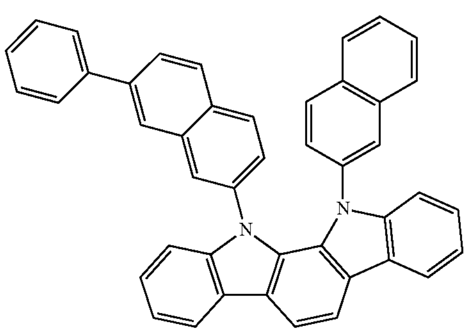
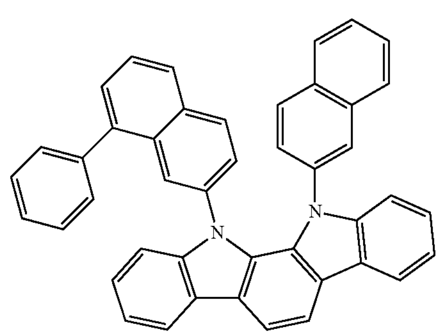

-continued
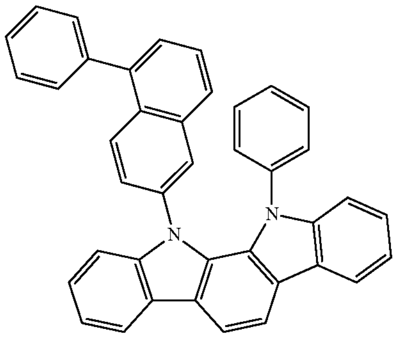
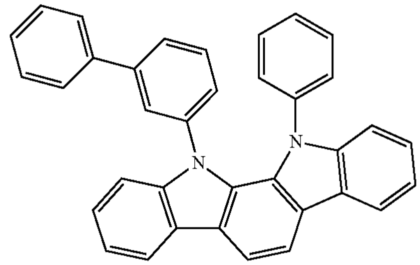
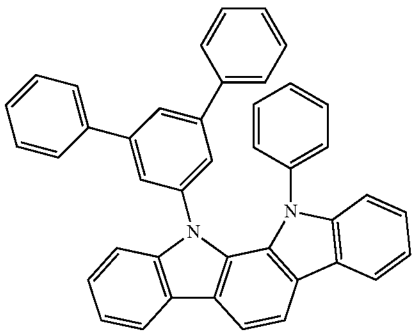
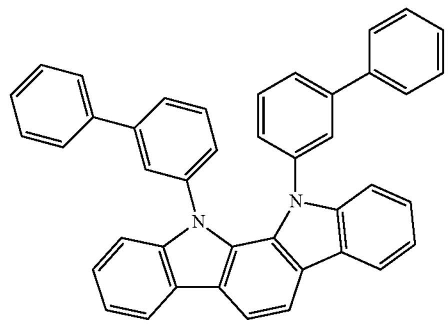
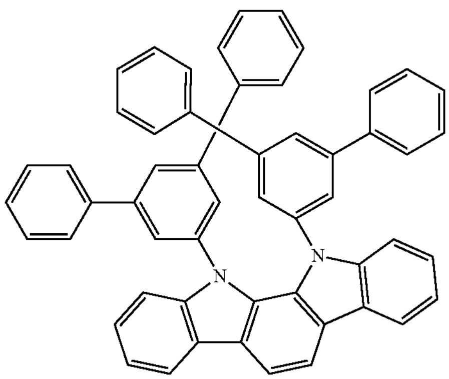
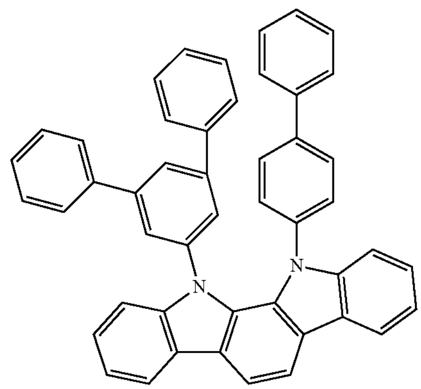
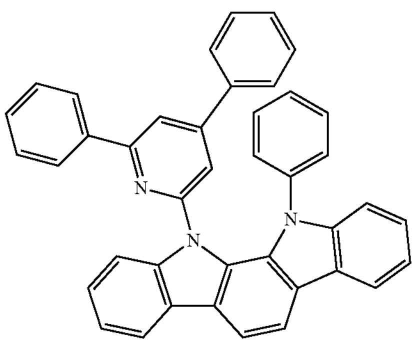
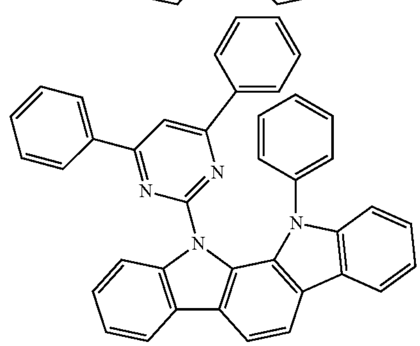
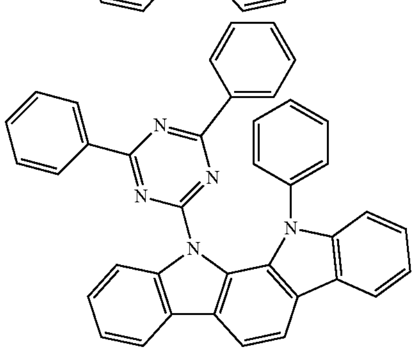
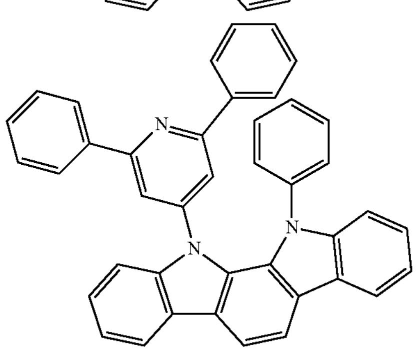

-continued
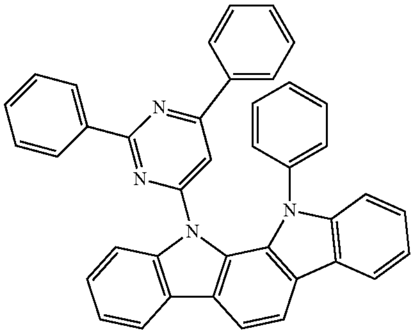
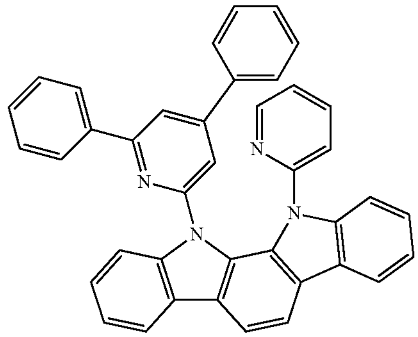
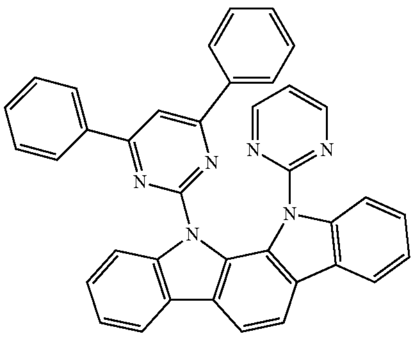
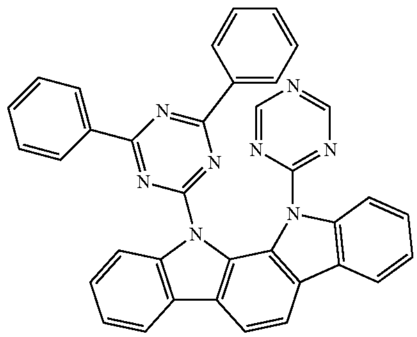
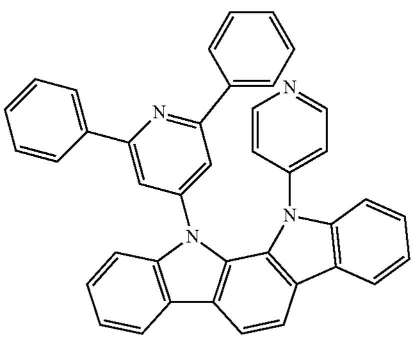
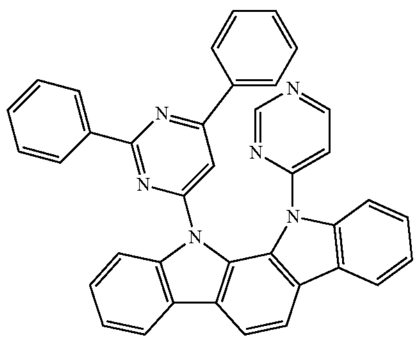
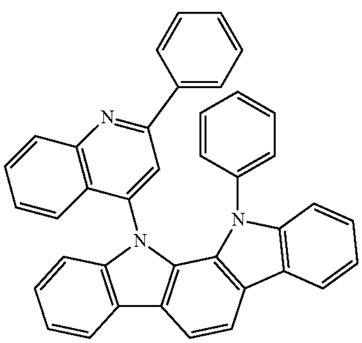
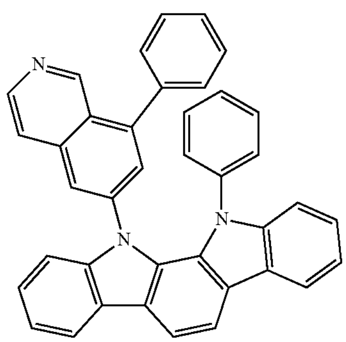
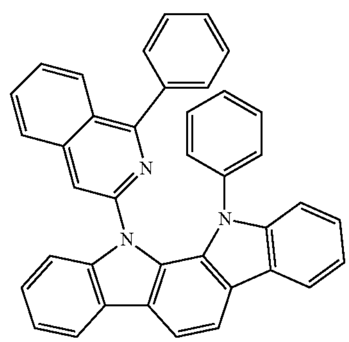
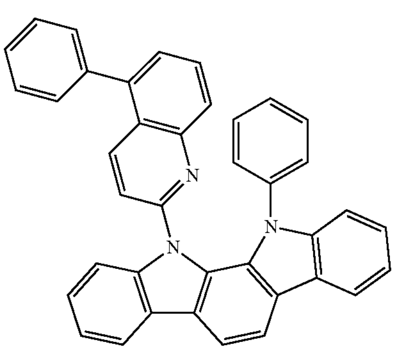
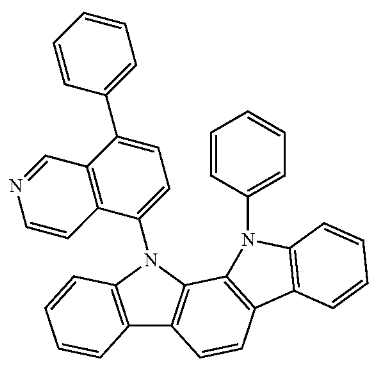

-continued
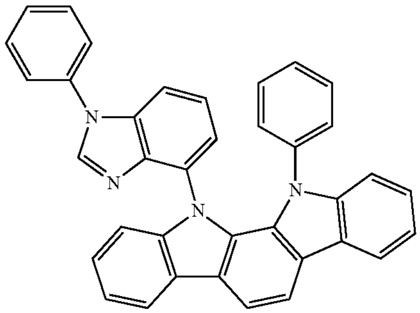
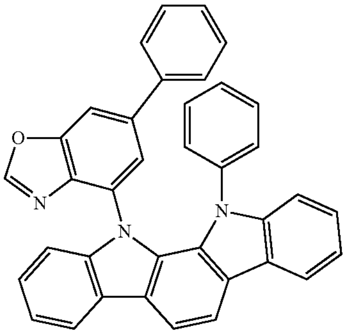
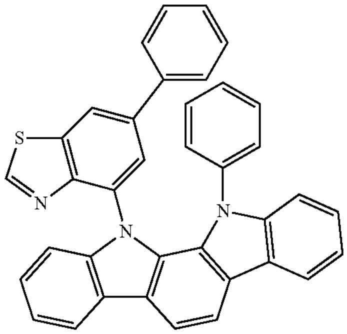
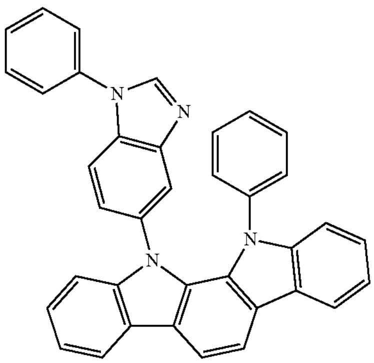
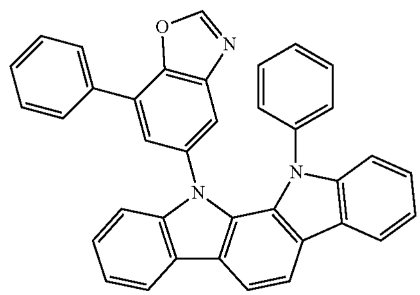
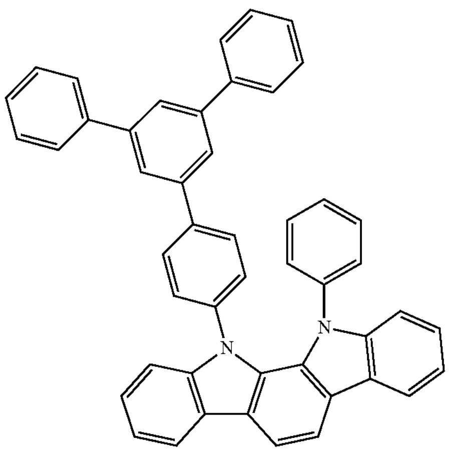
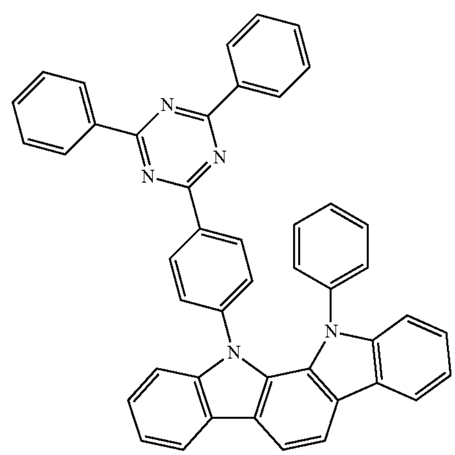
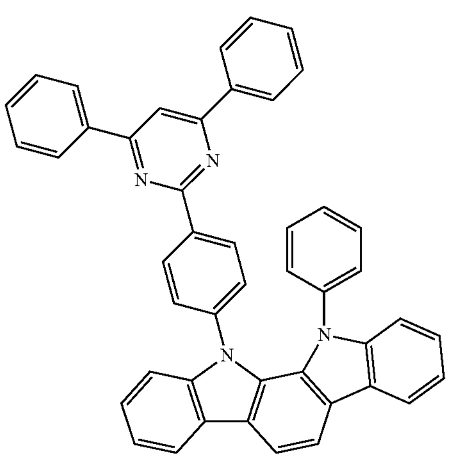
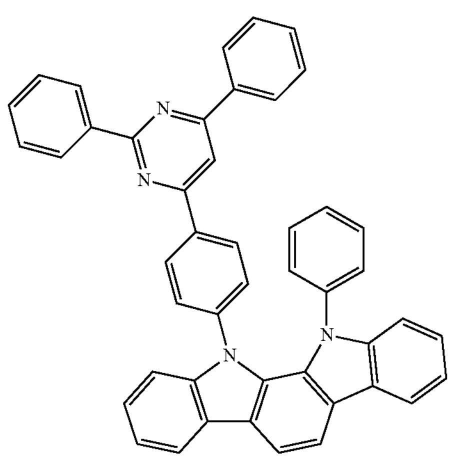

-continued
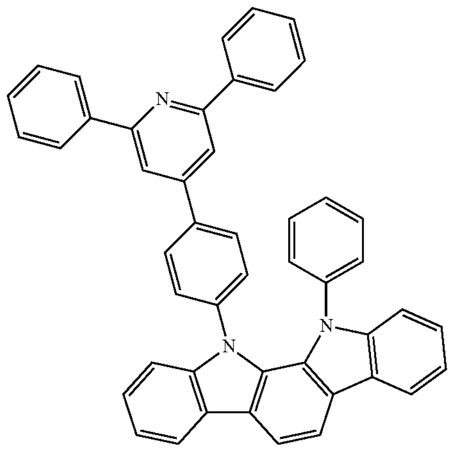
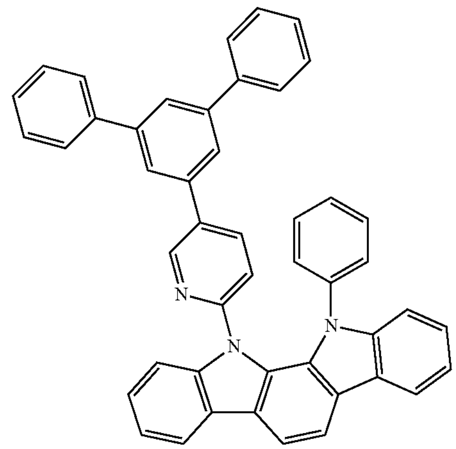
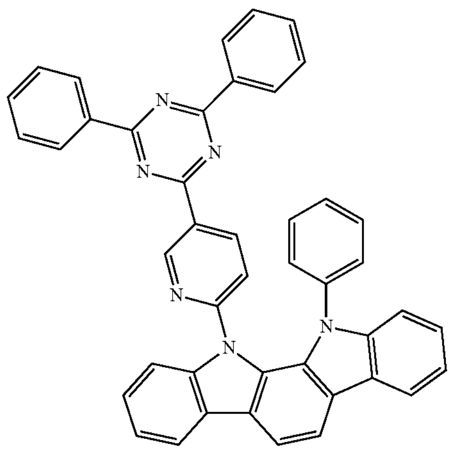
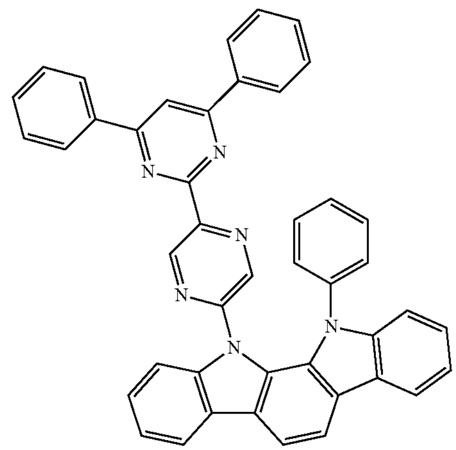
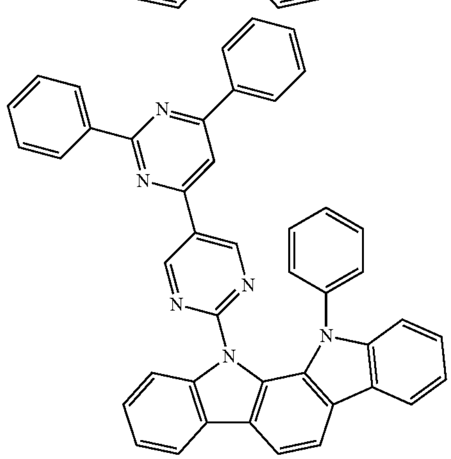
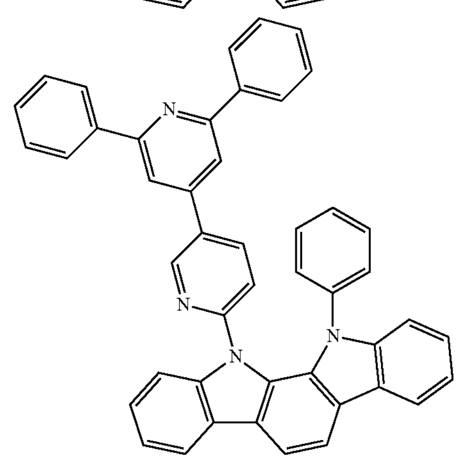
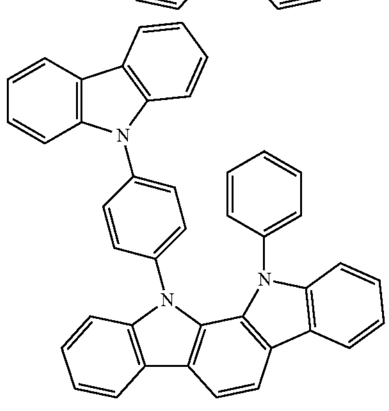
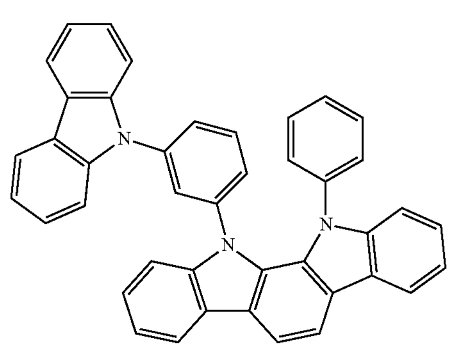

-continued
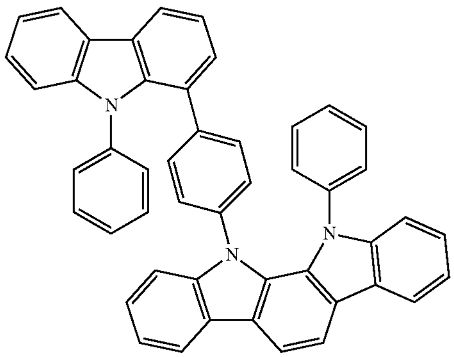
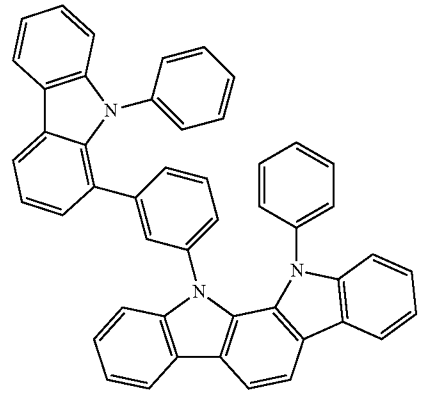
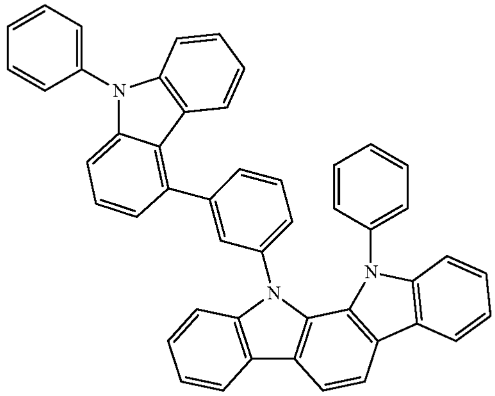
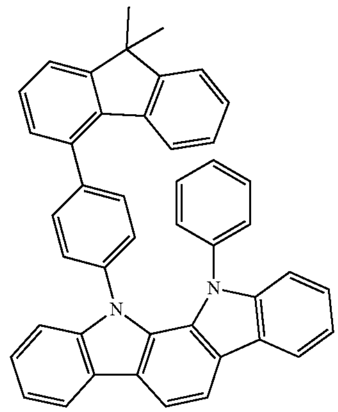
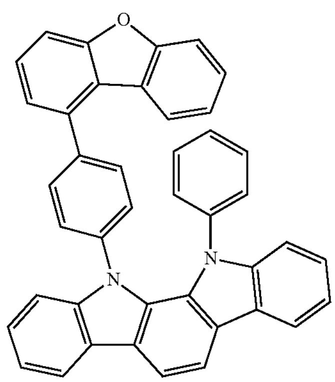
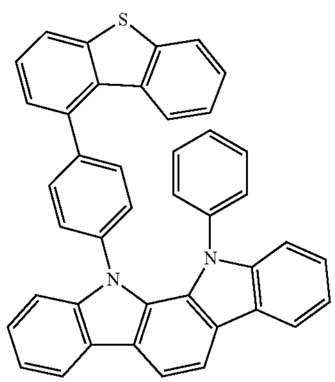
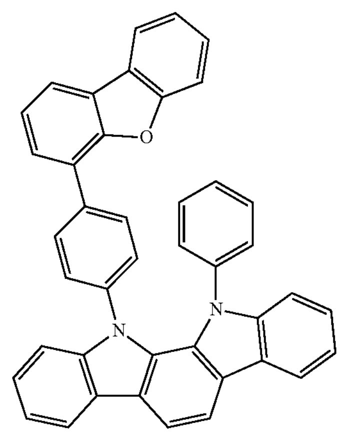
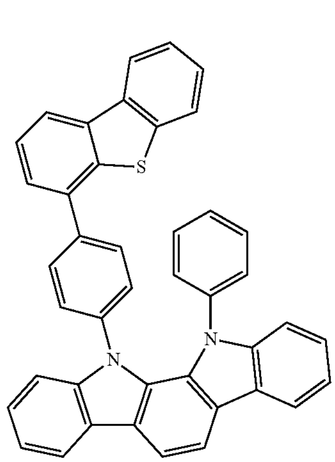
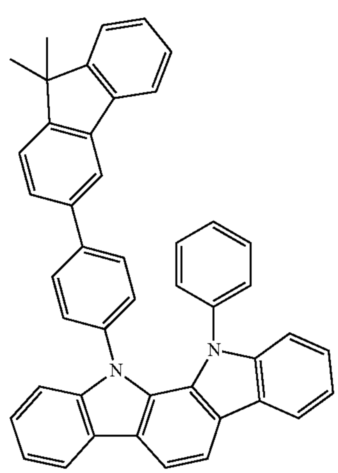
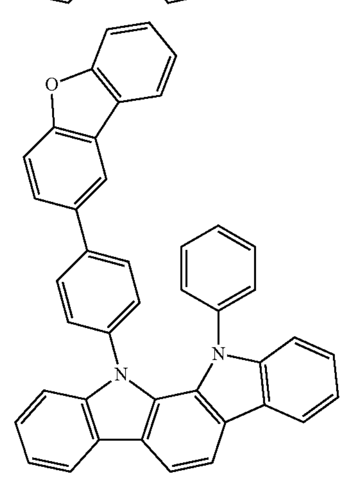

-continued
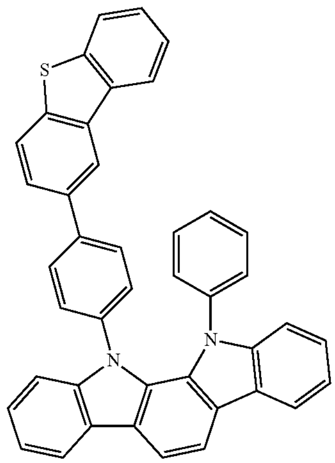
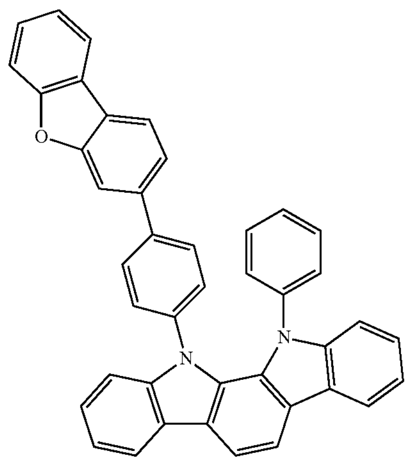
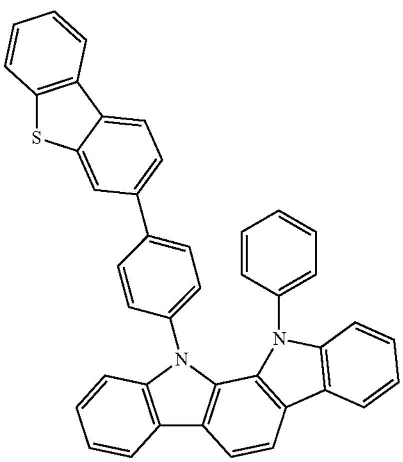
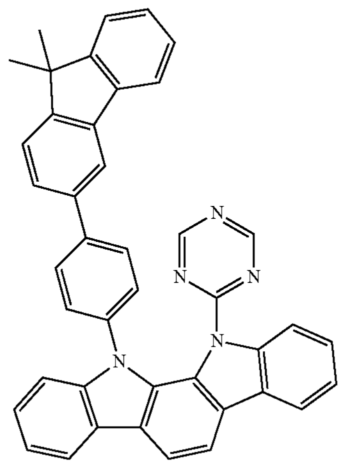
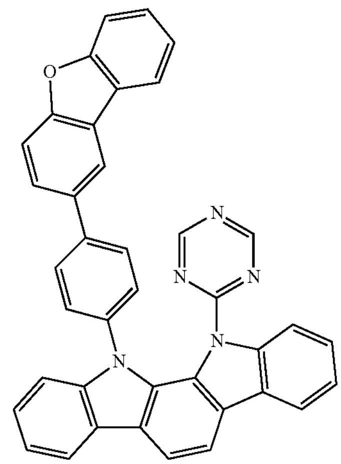
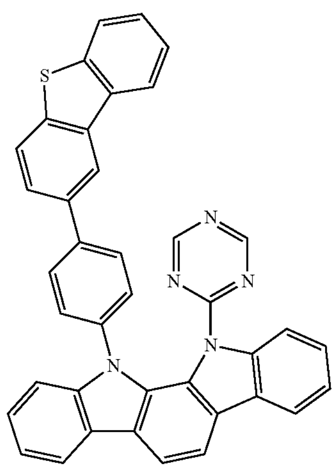
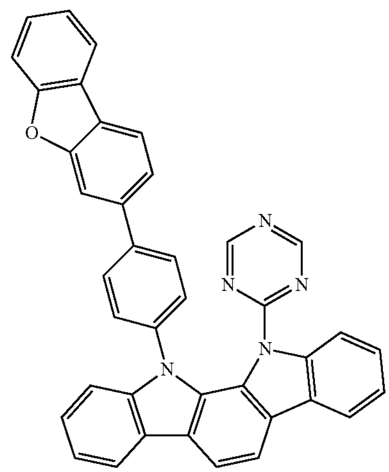
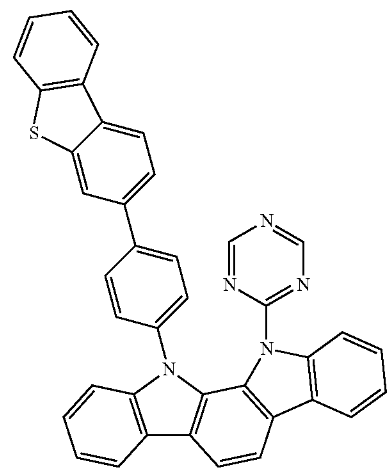
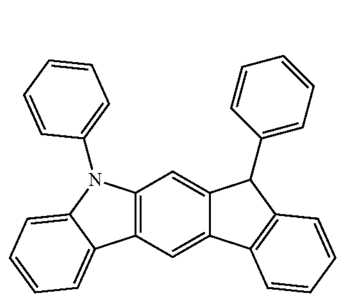
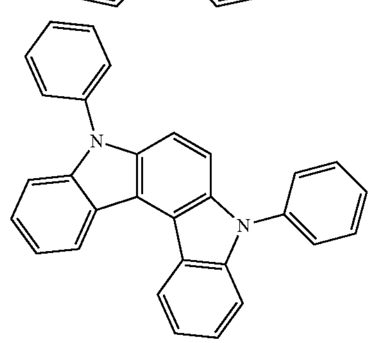
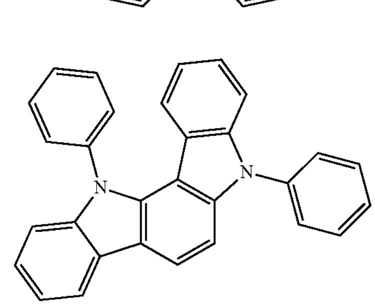

-continued
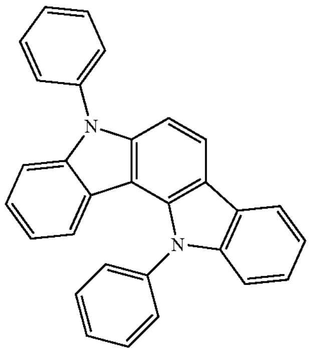
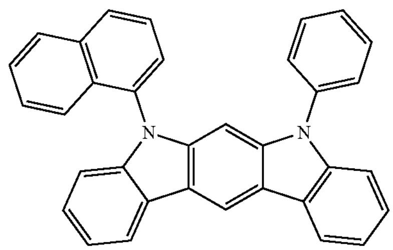
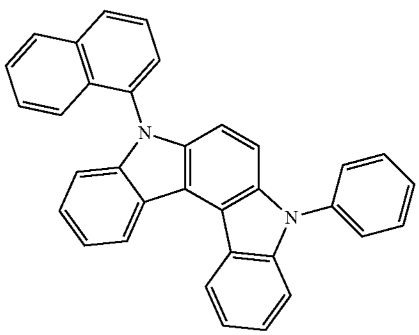
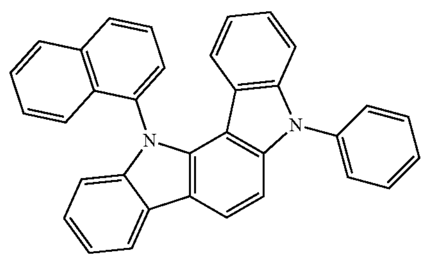
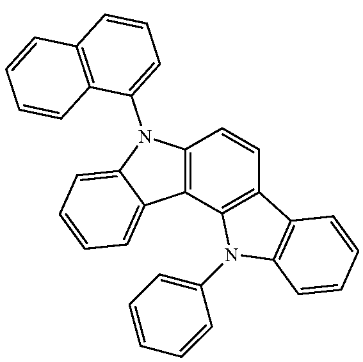
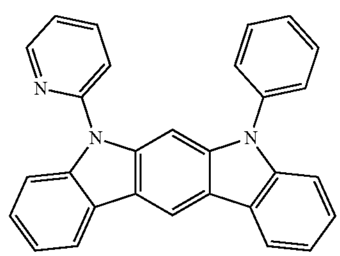
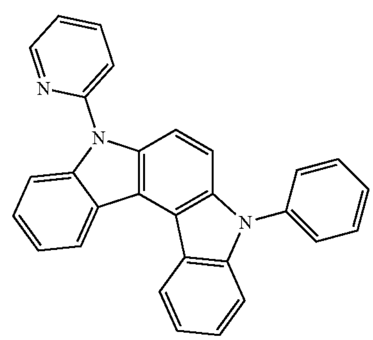
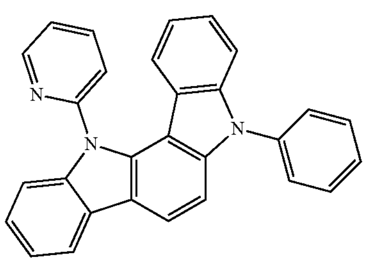
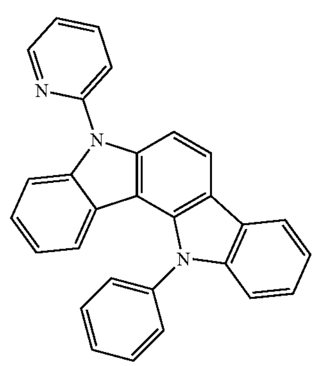
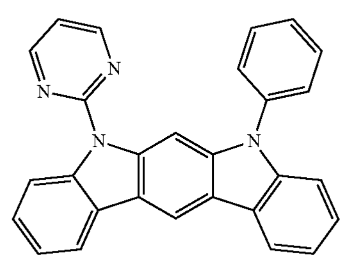

-continued
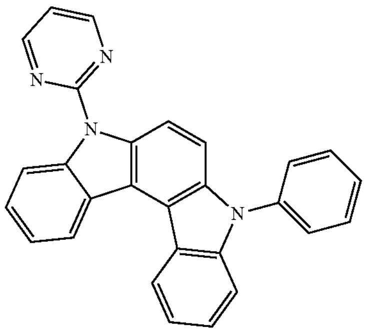
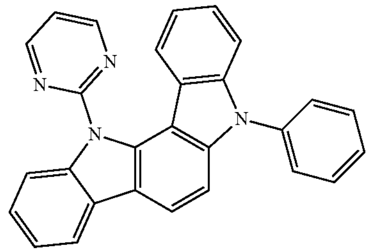
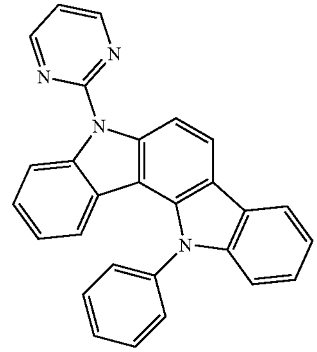
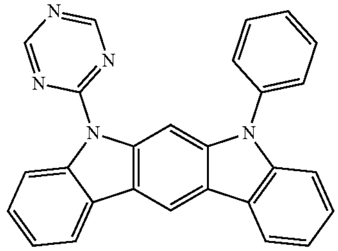
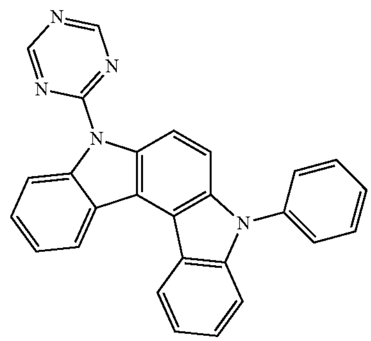
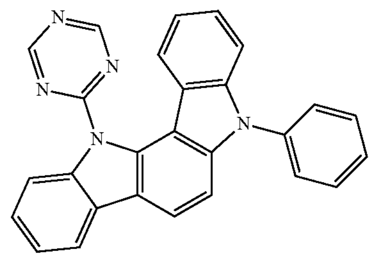
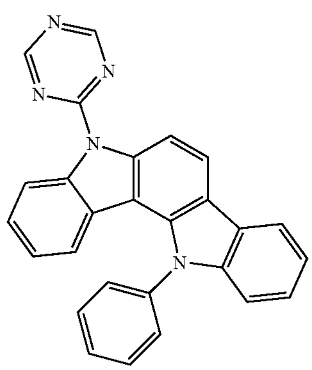
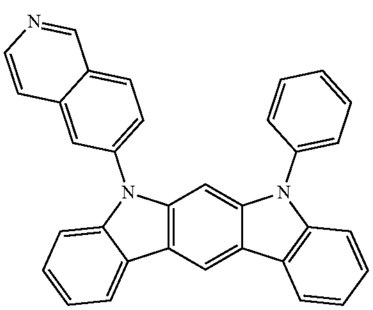
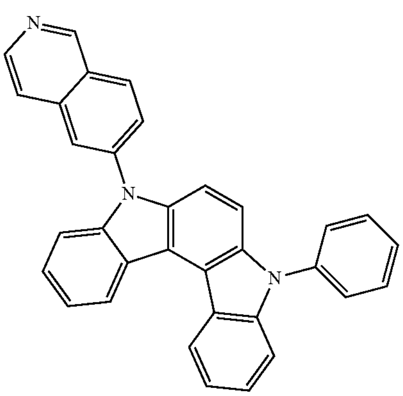
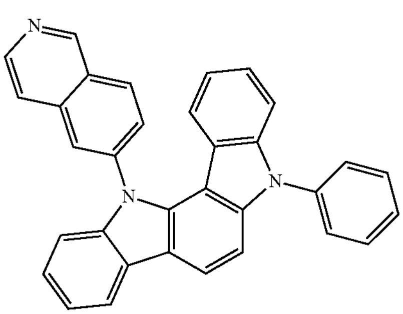
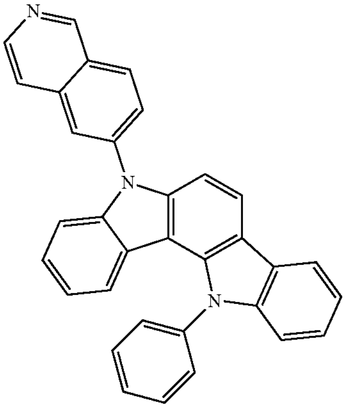

-continued
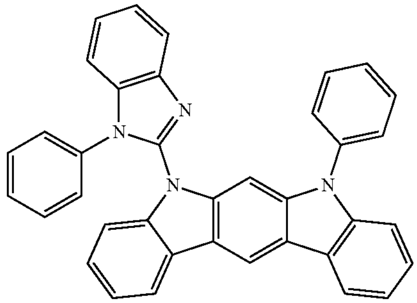
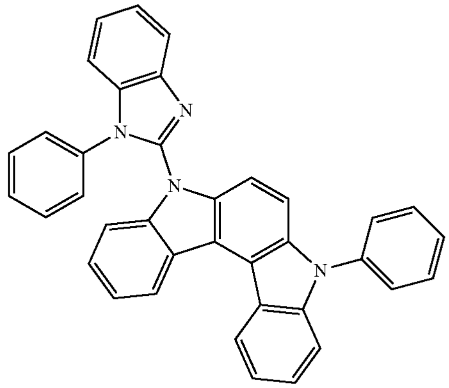
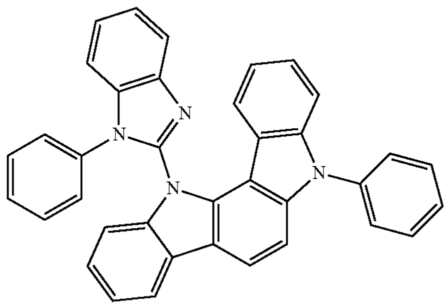
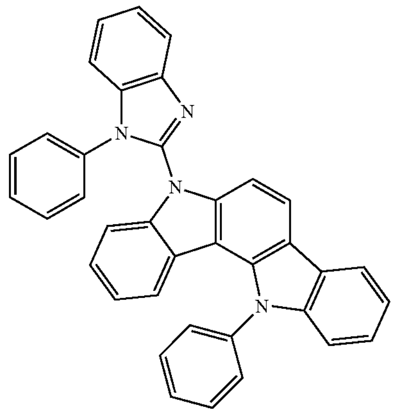
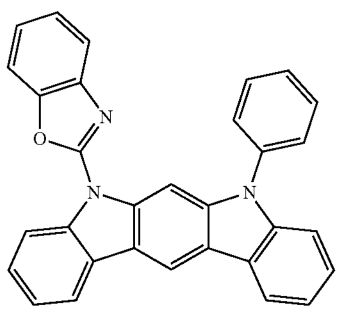
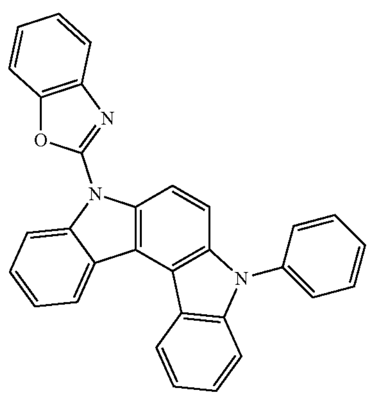
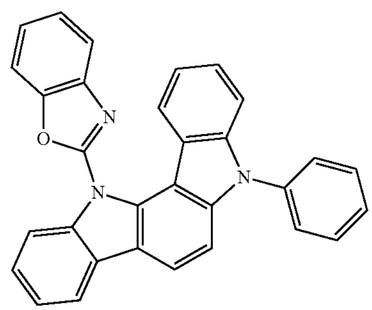
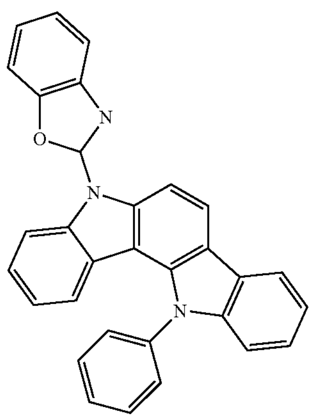
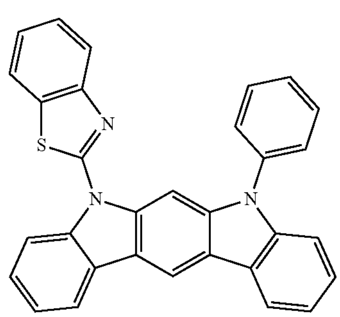
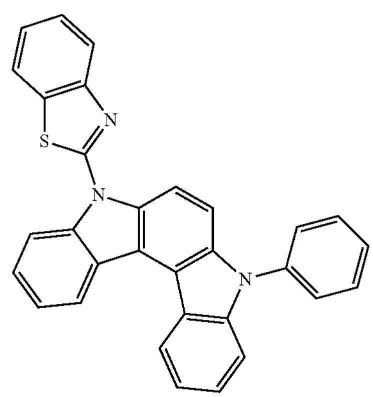

-continued
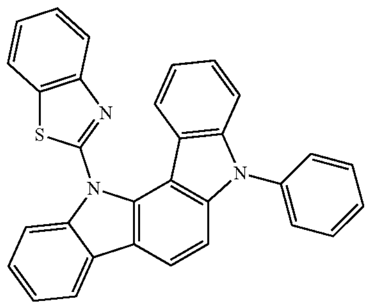
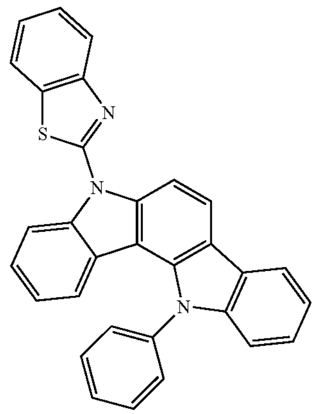
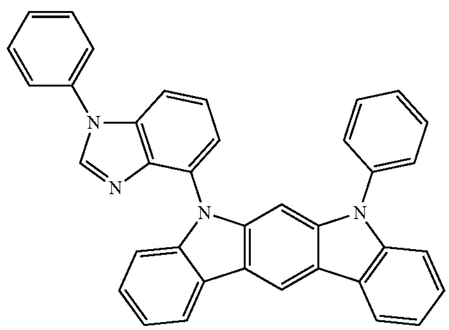
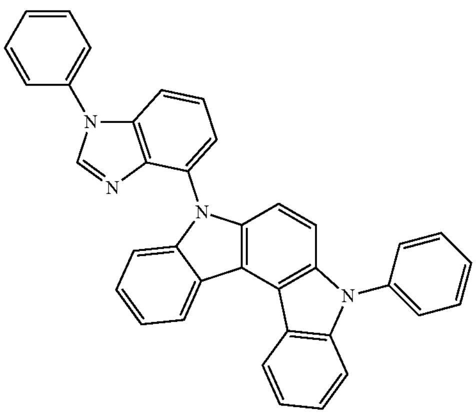
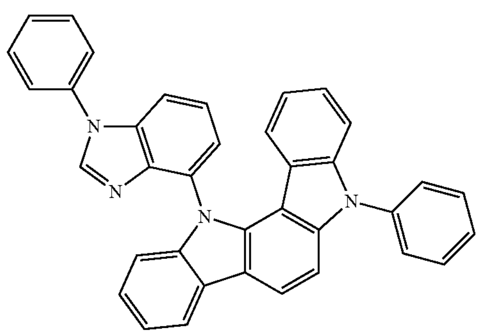
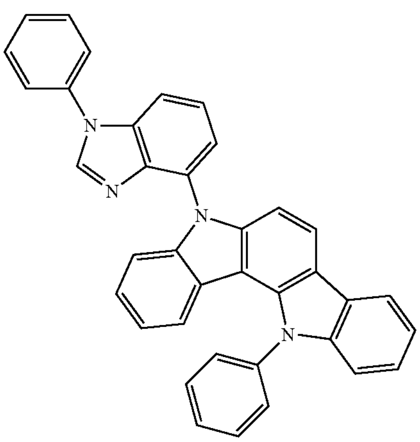
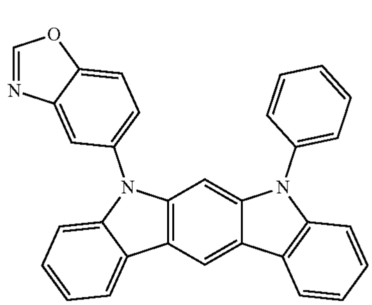
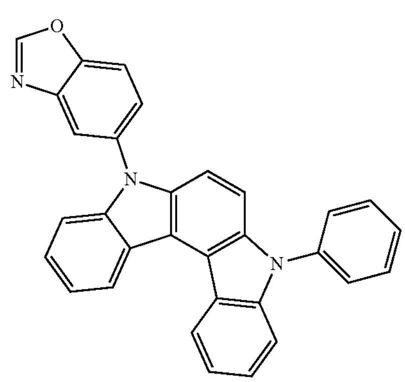

-continued
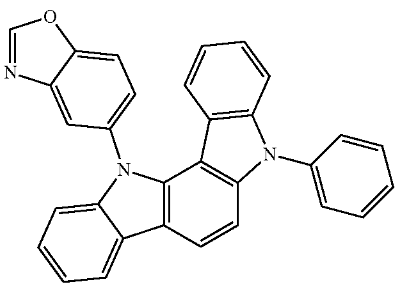
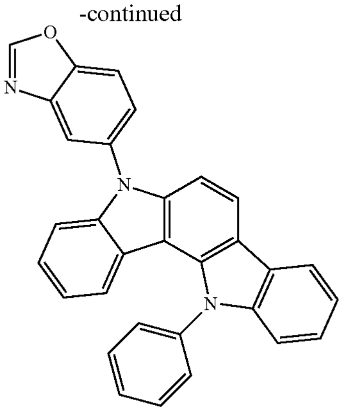
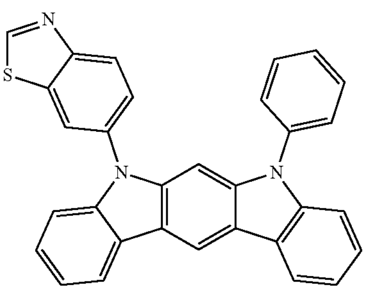
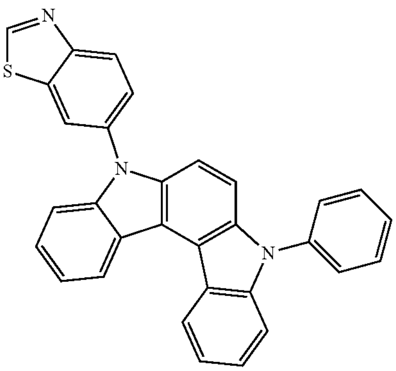
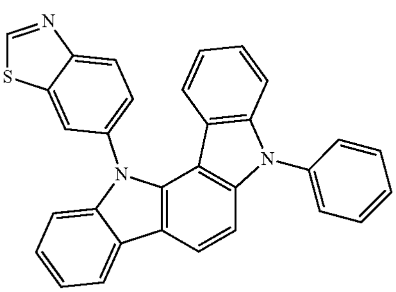
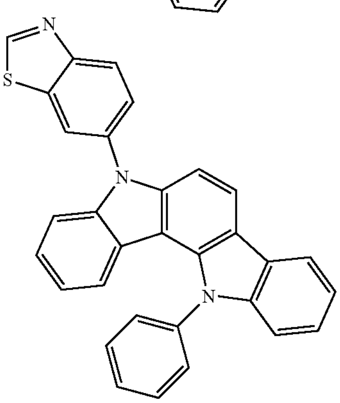
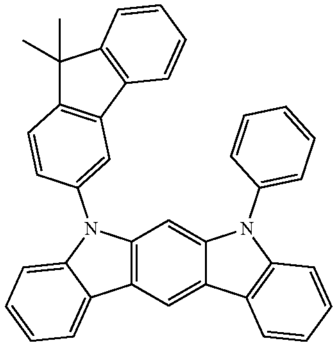
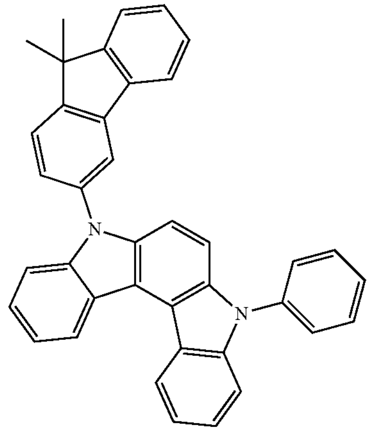
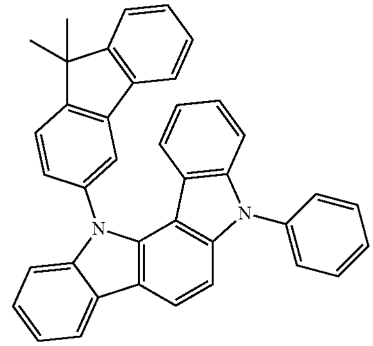

-continued
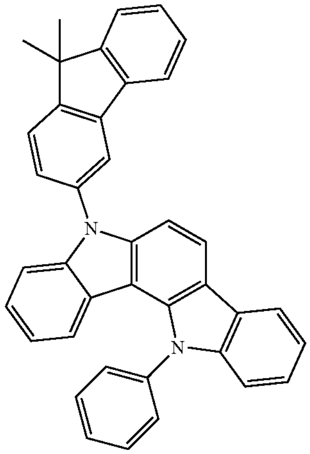
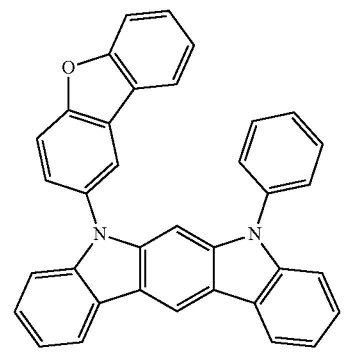
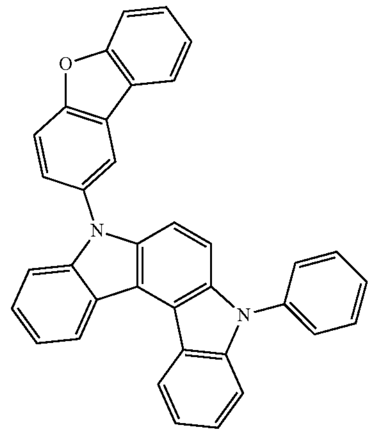
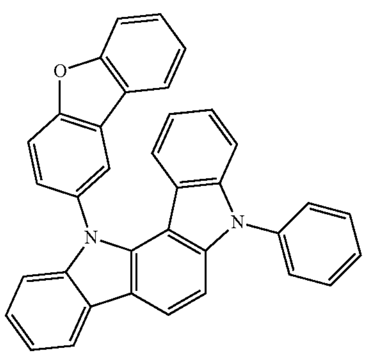
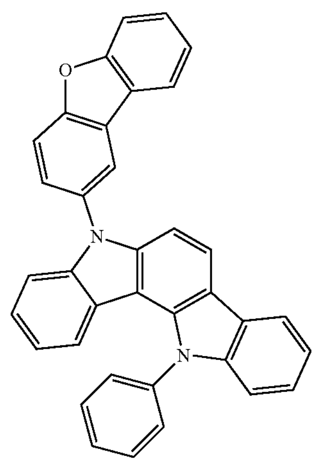
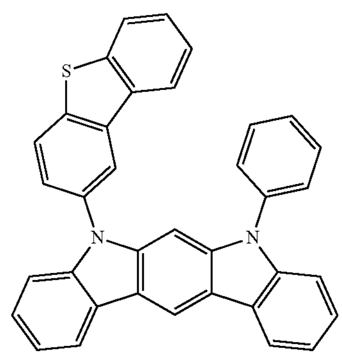
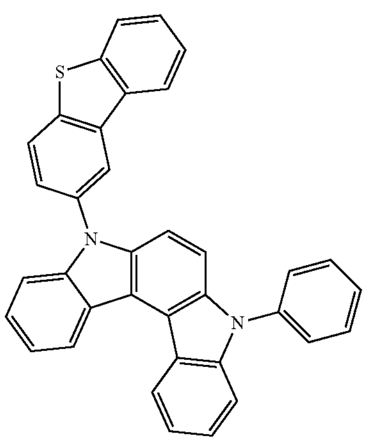
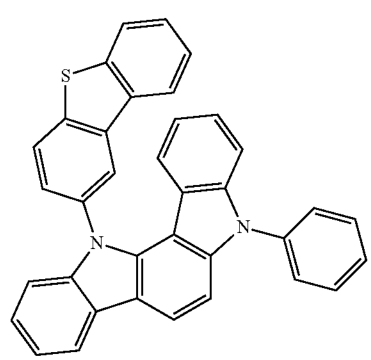
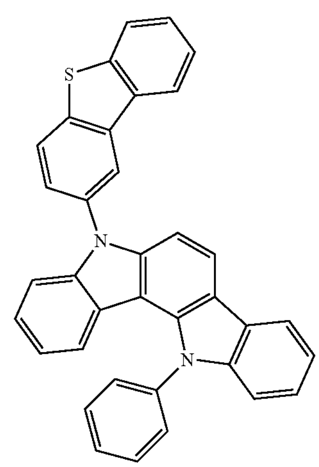

-continued
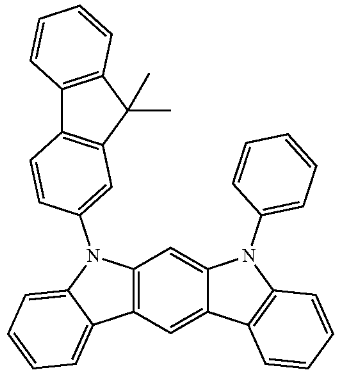
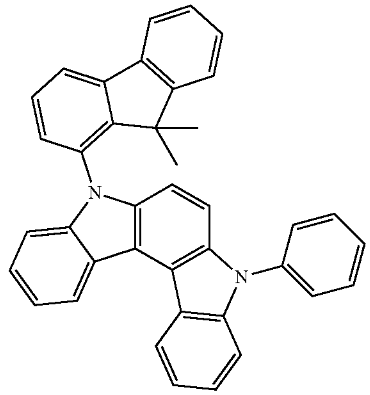
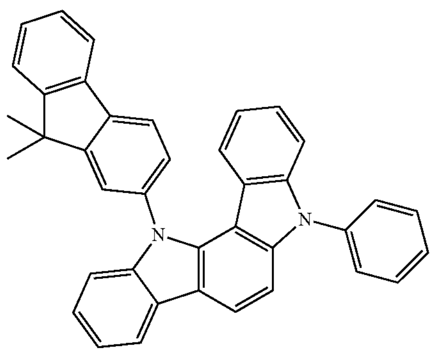
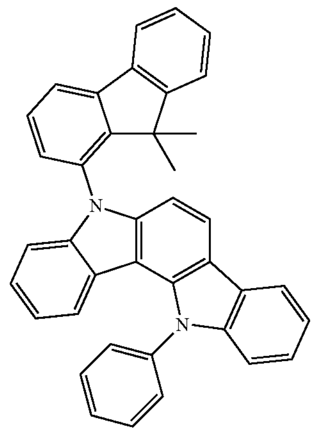
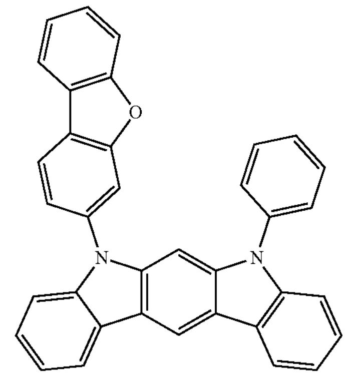
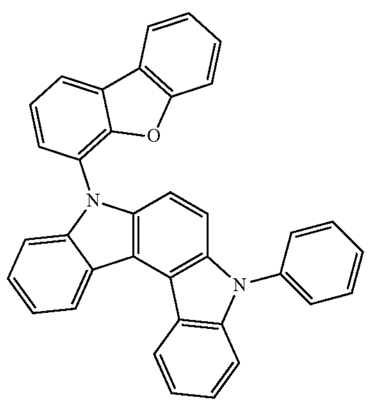
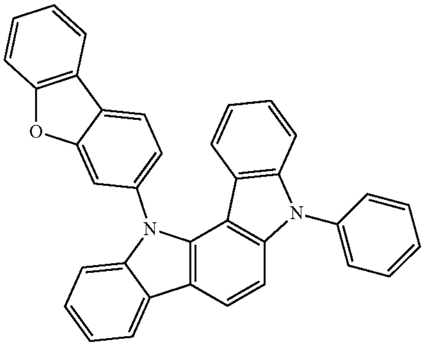
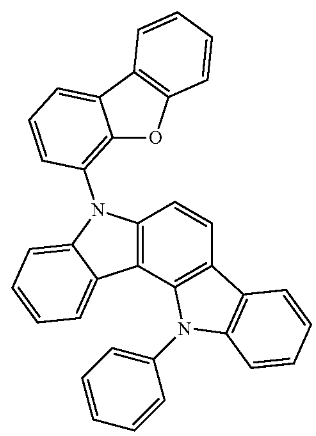
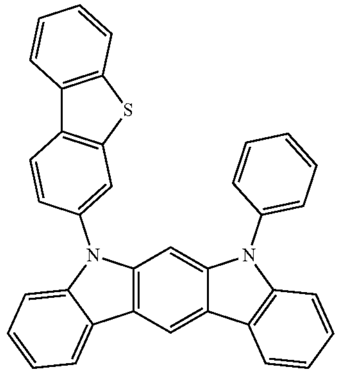
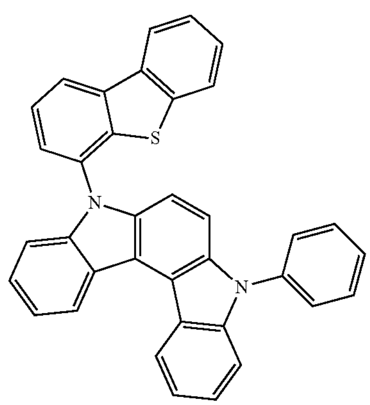

-continued
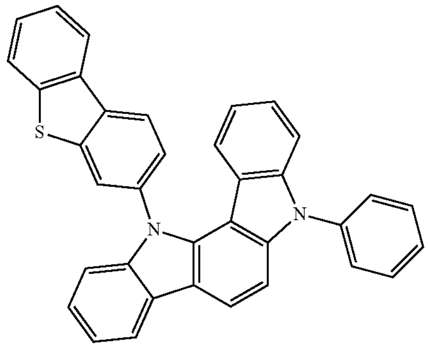
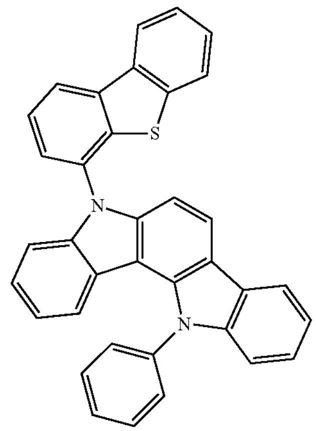
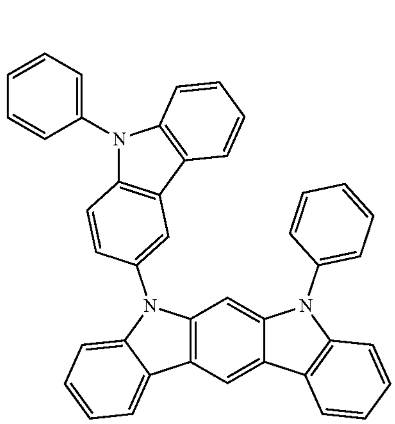
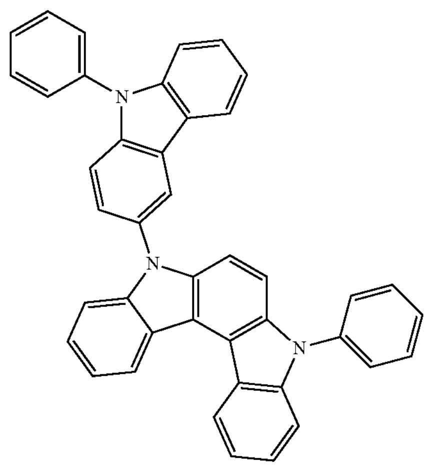
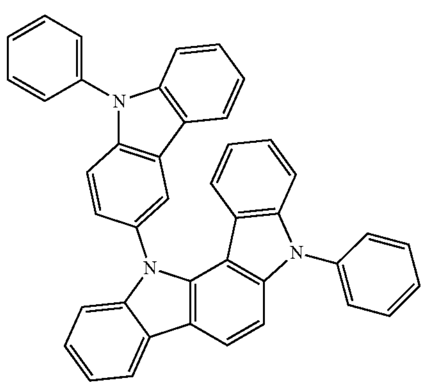
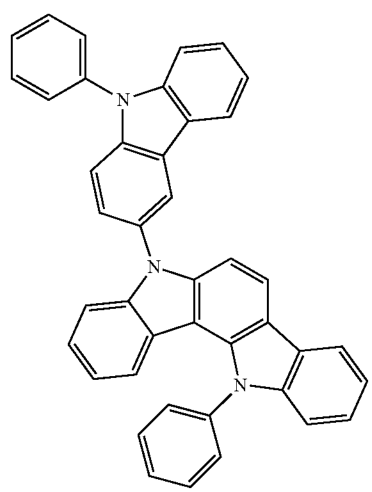

-continued
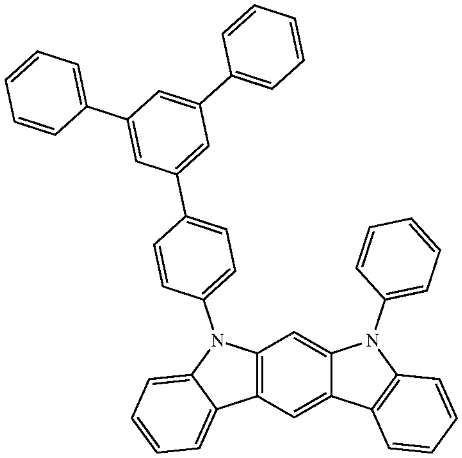
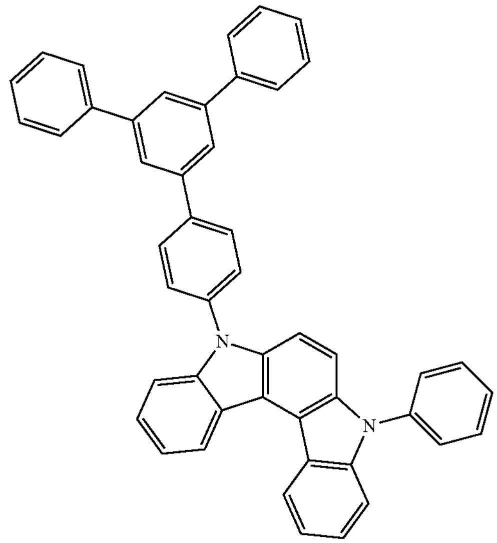
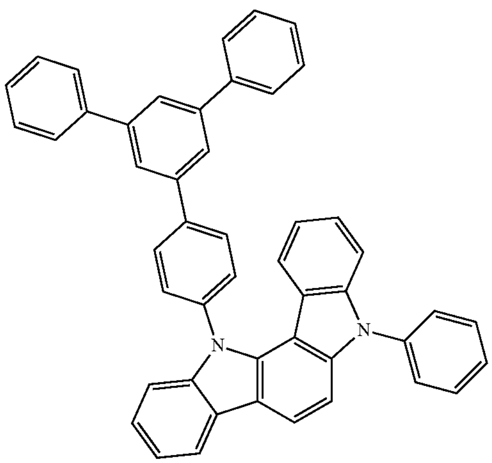
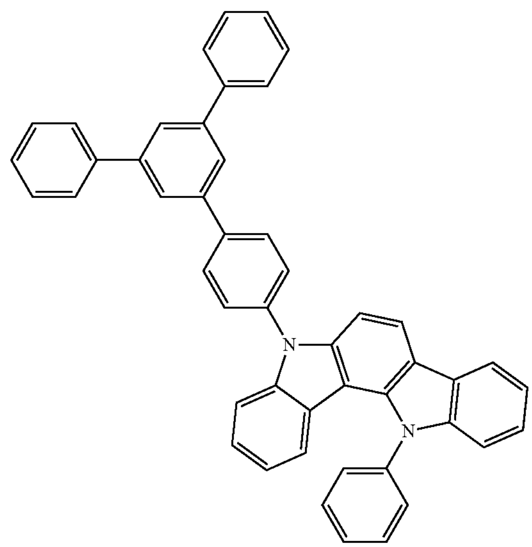
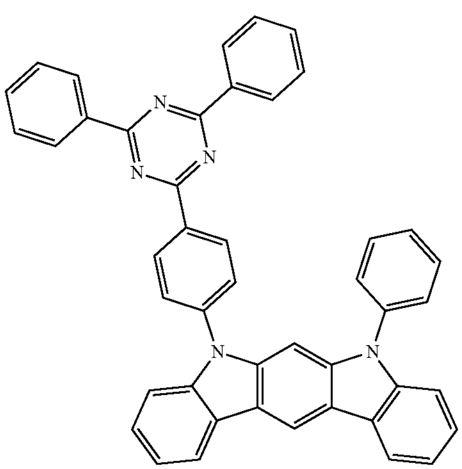
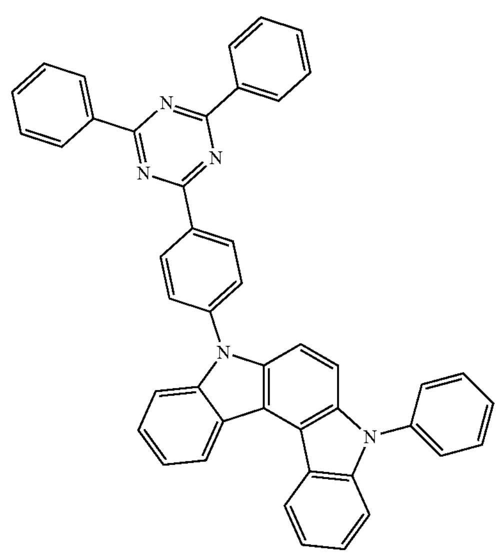

-continued
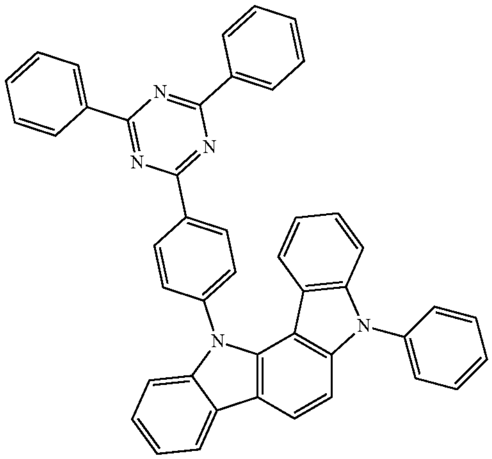
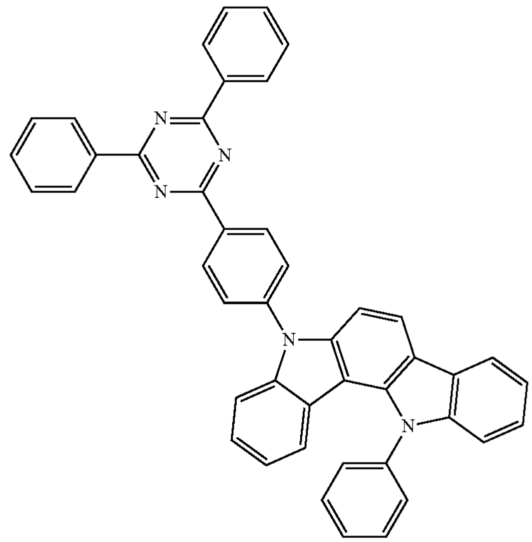
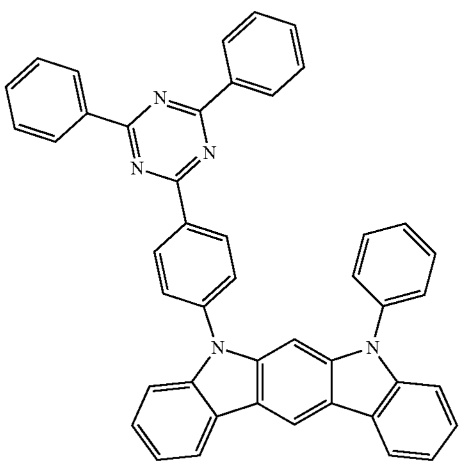
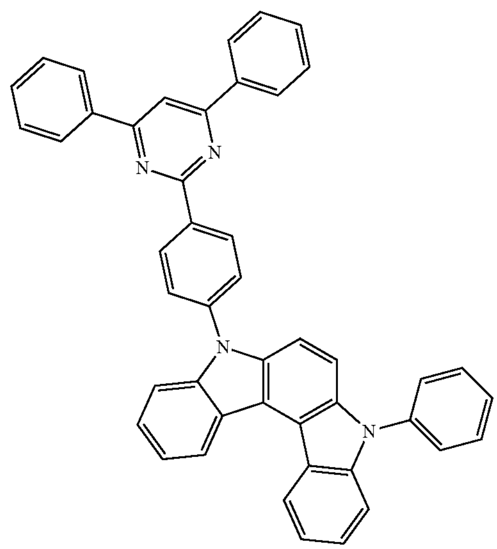
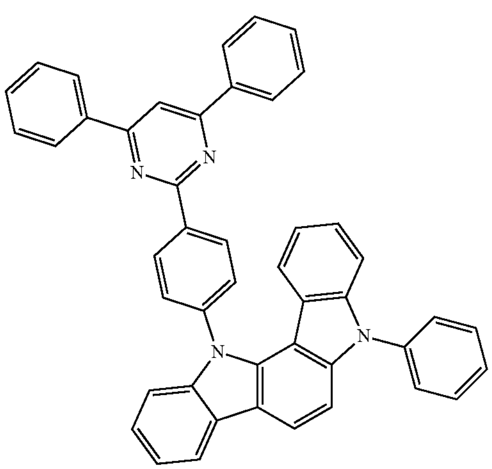
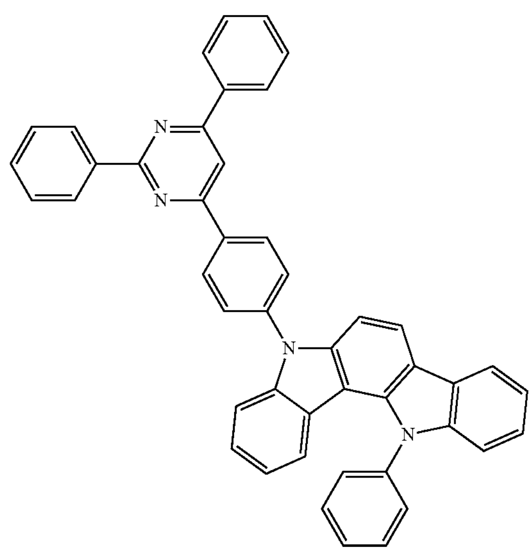

-continued
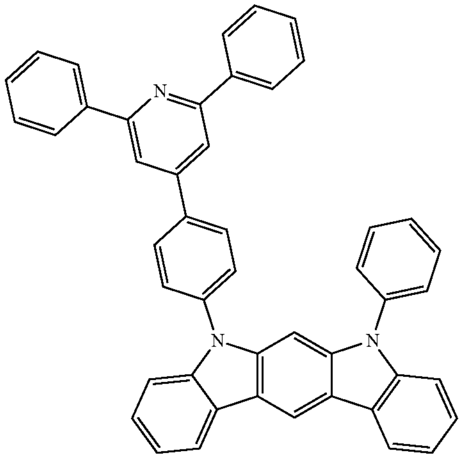
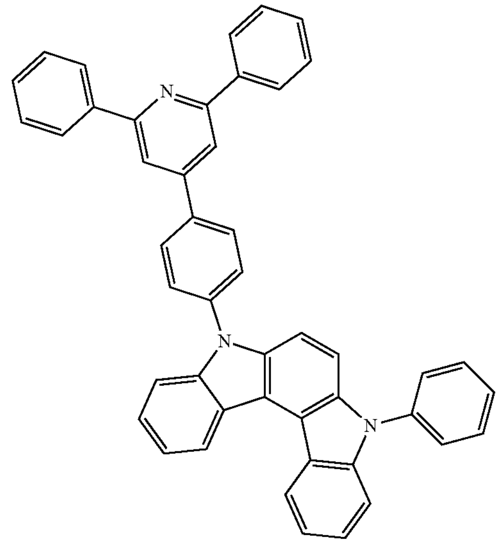
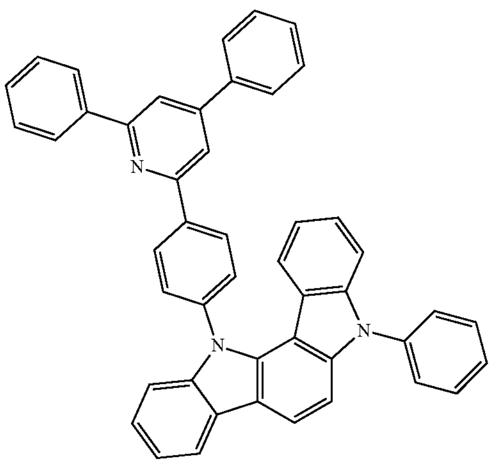
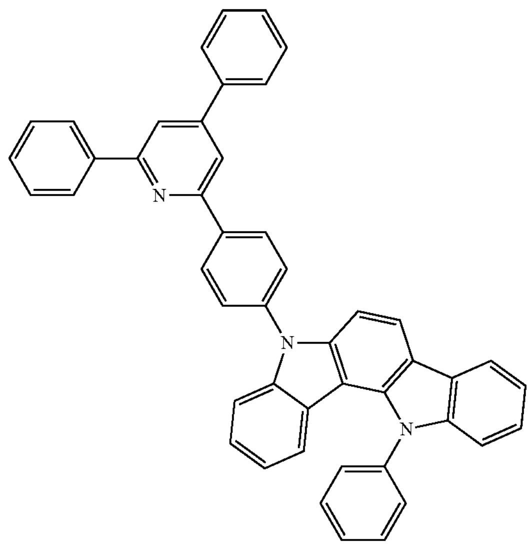
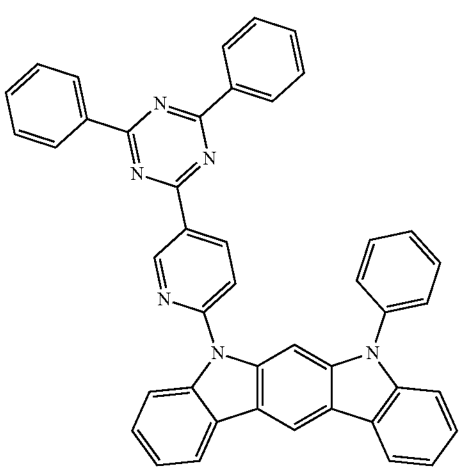
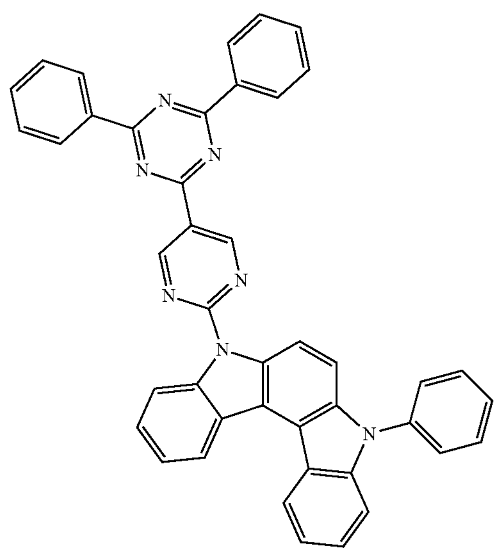

-continued
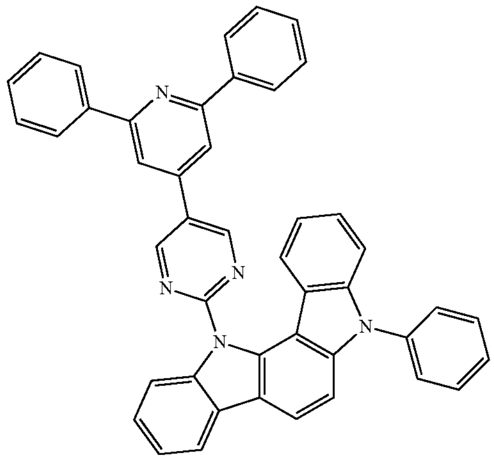
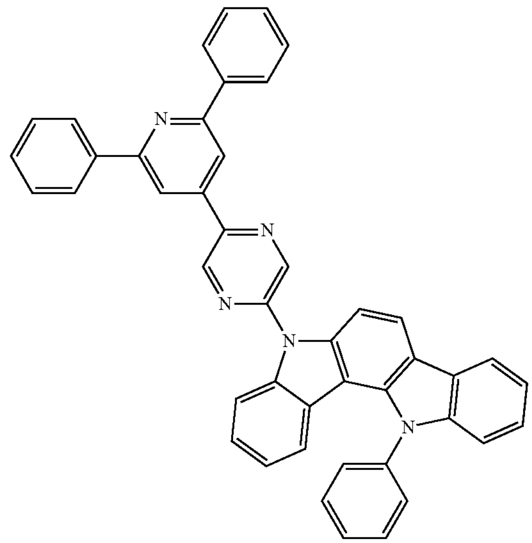
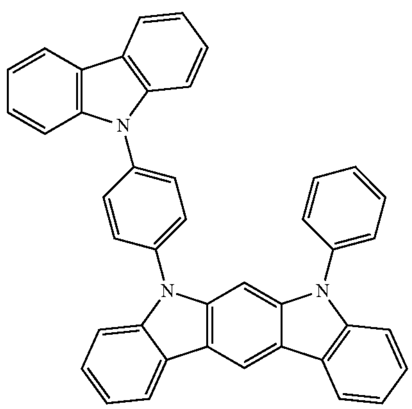
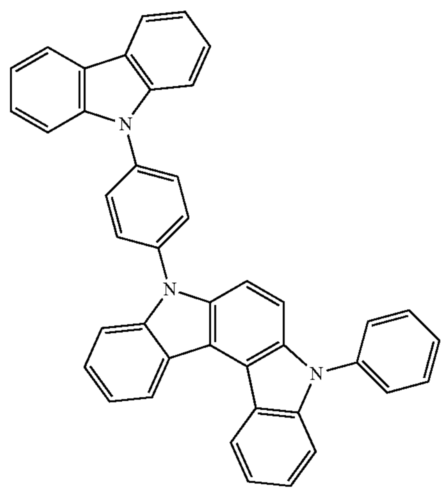
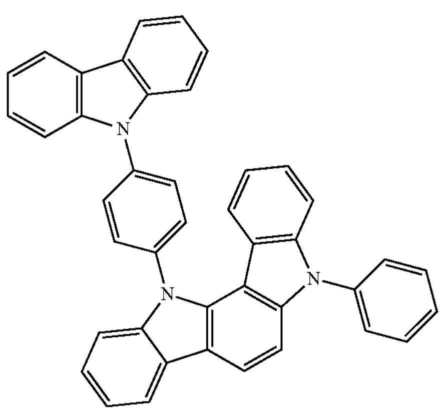
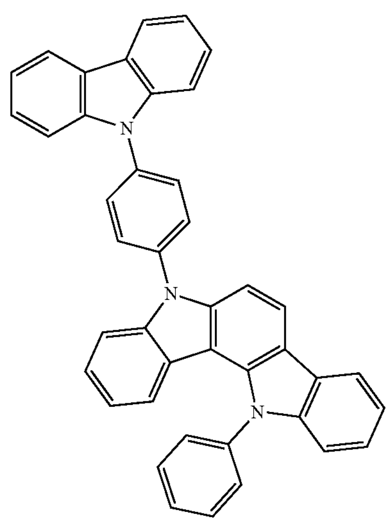

-continued
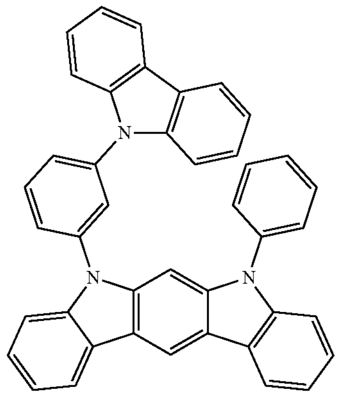
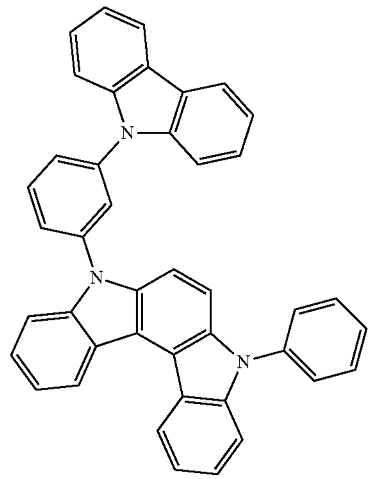
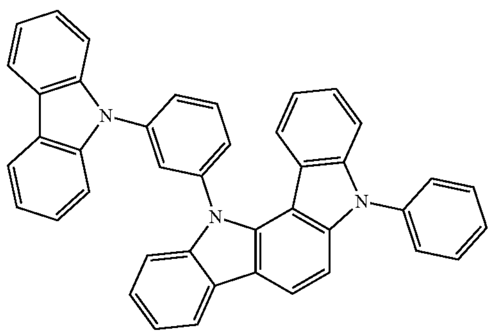
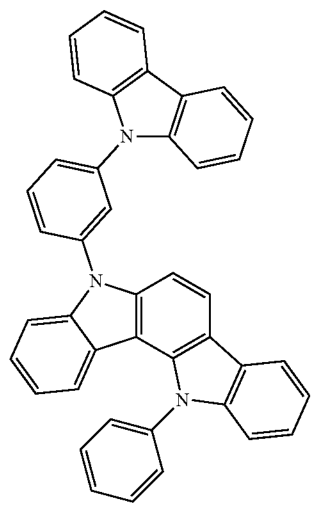
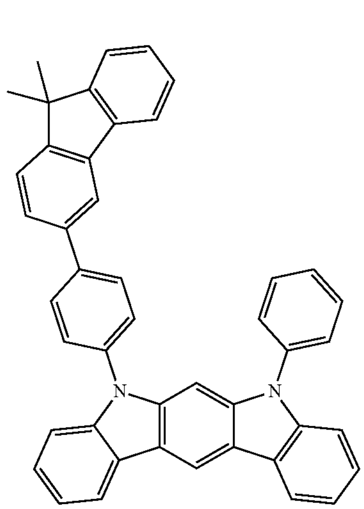
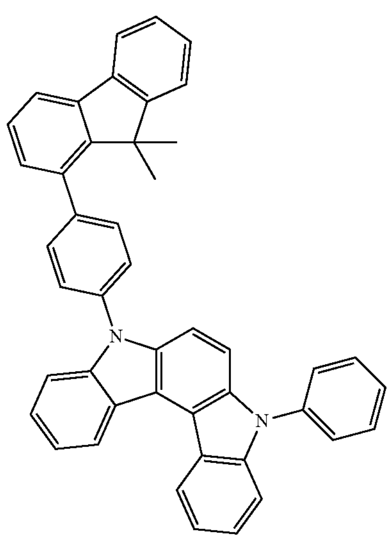

-continued
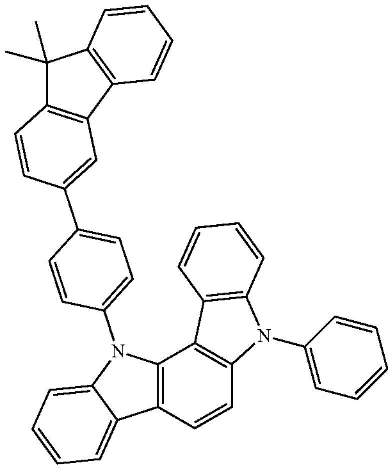
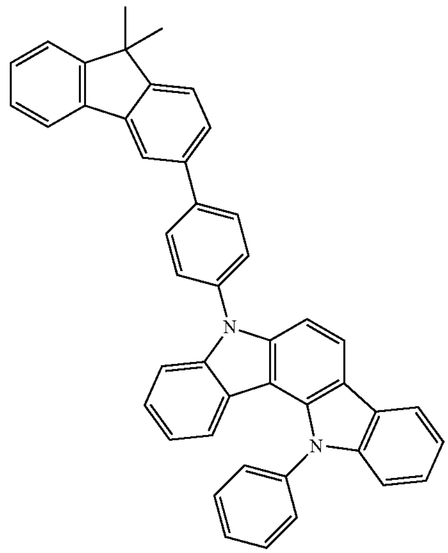
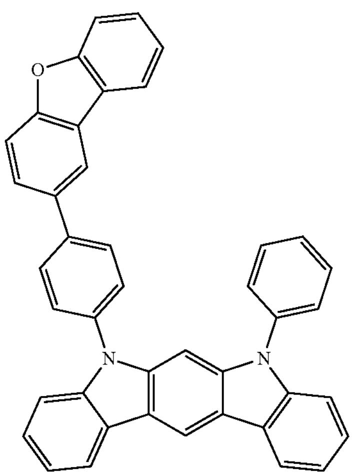
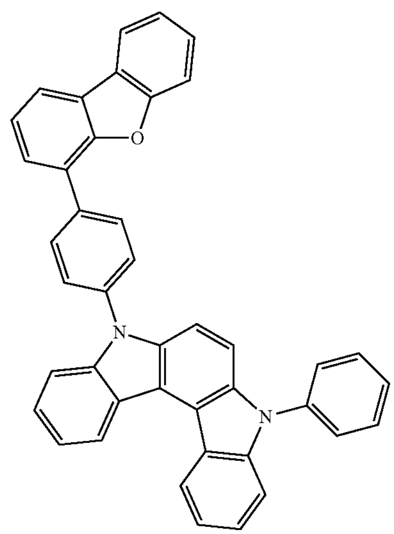
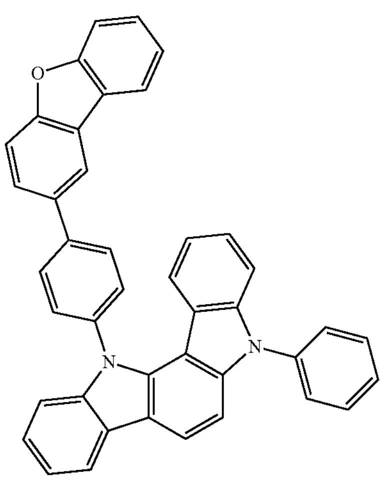
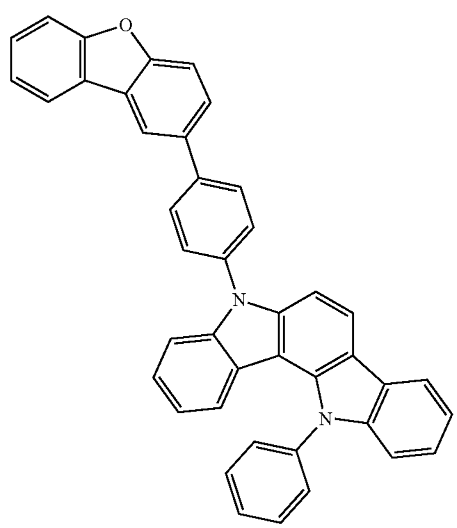

-continued
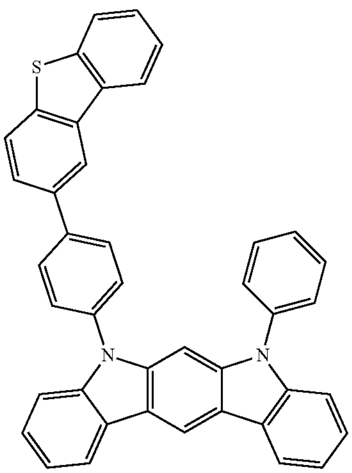
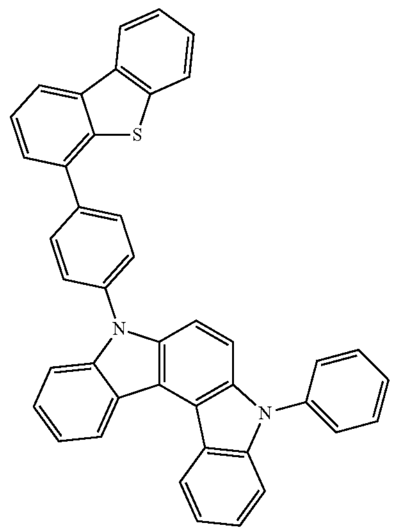
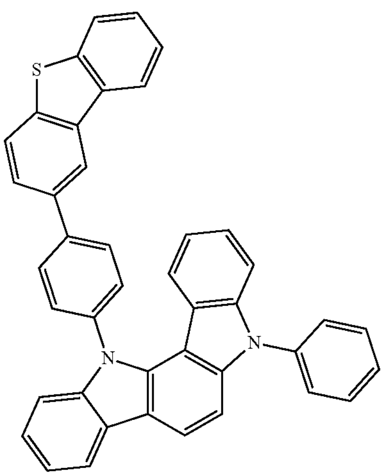
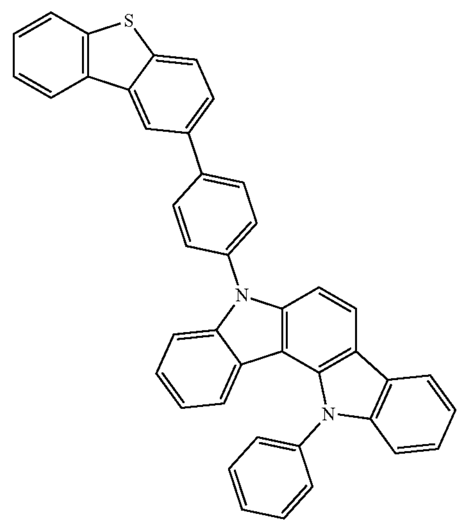
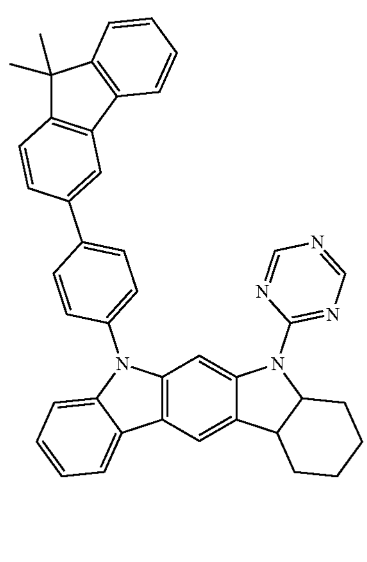
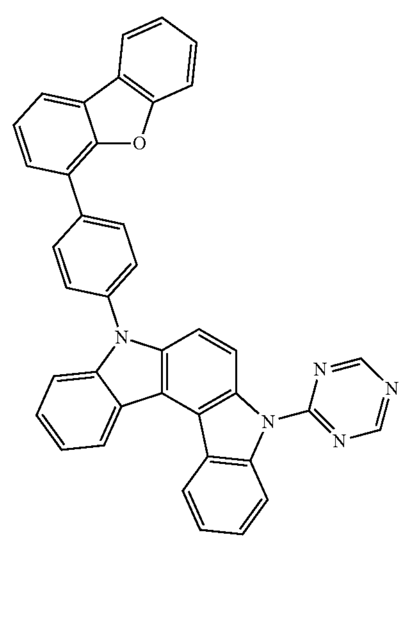

-continued
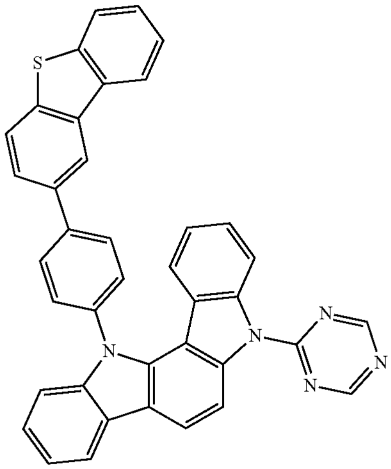
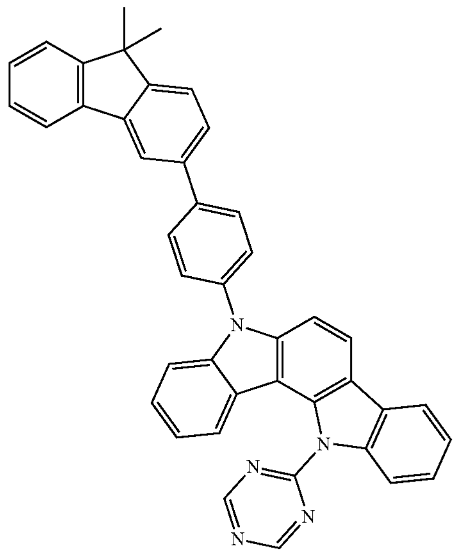
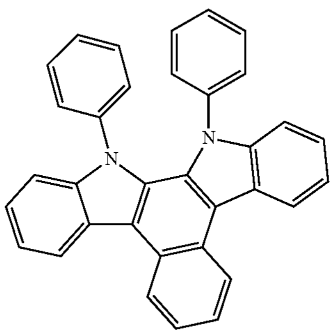
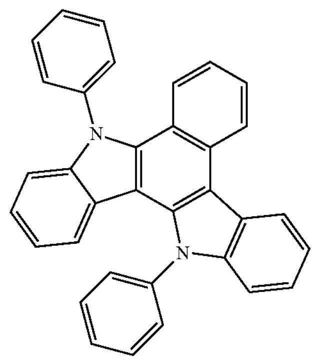
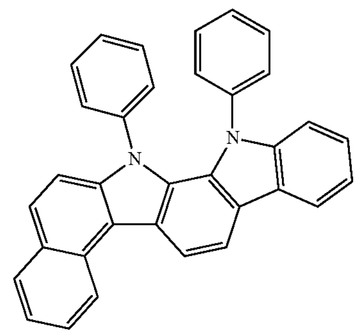
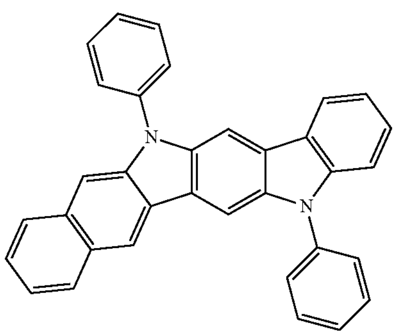
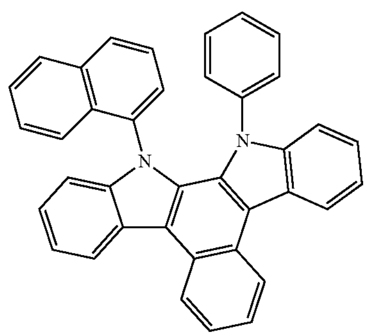
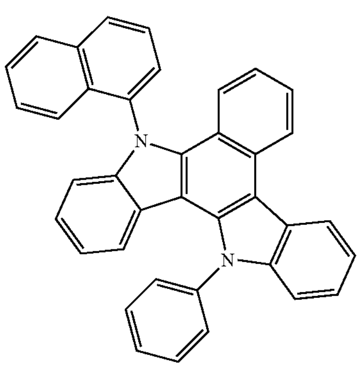
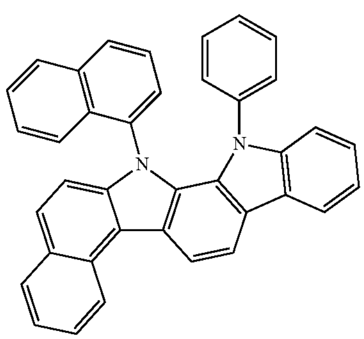

-continued
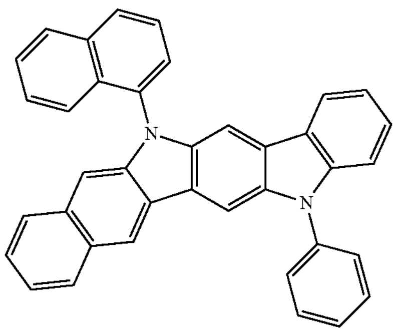
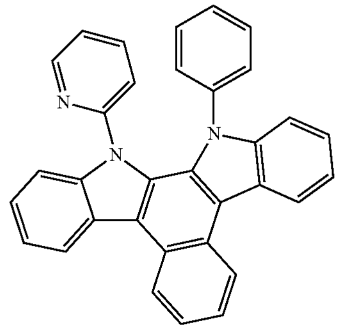
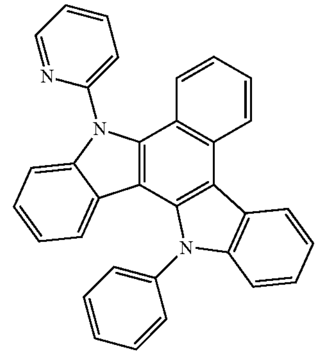
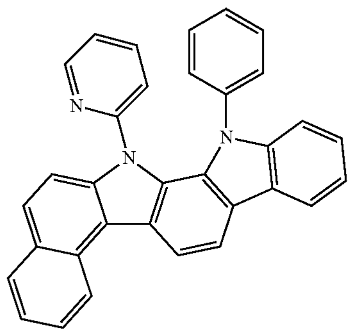
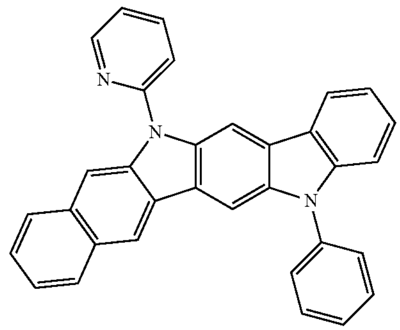
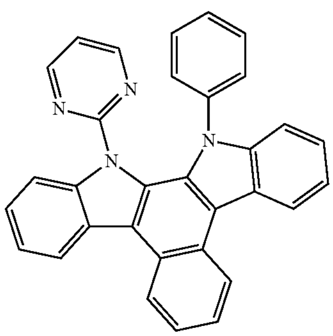
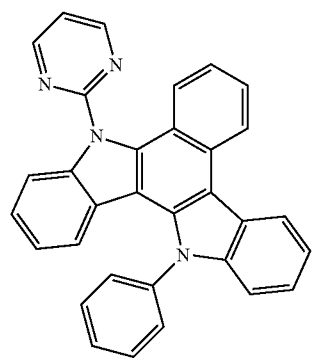
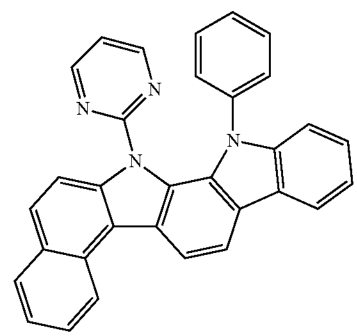
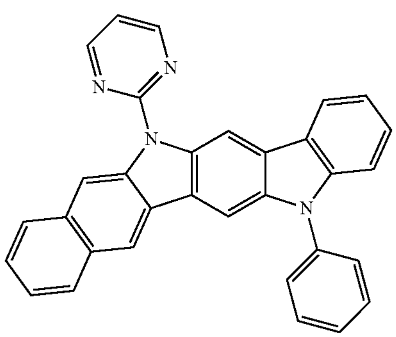
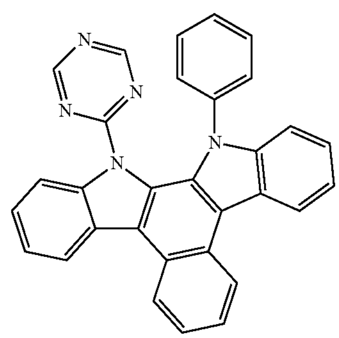
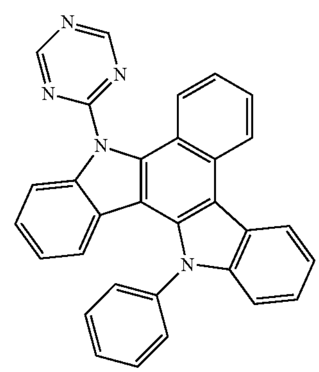
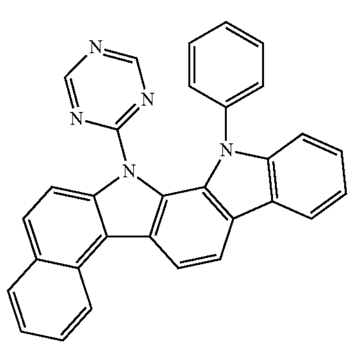
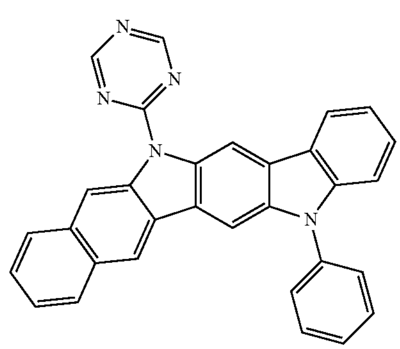

-continued
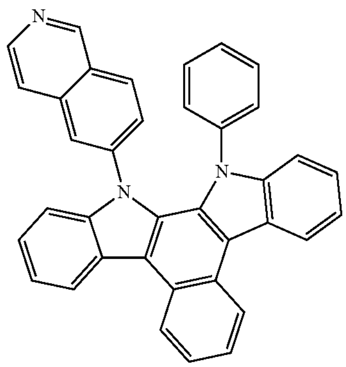
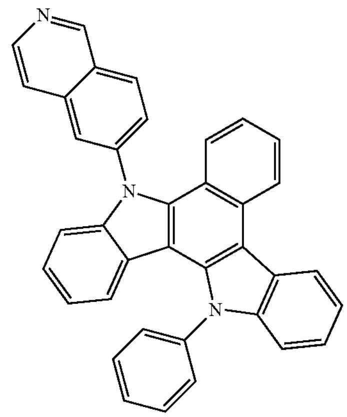
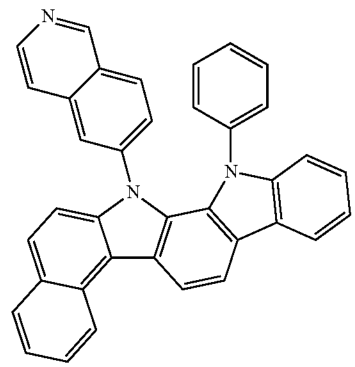
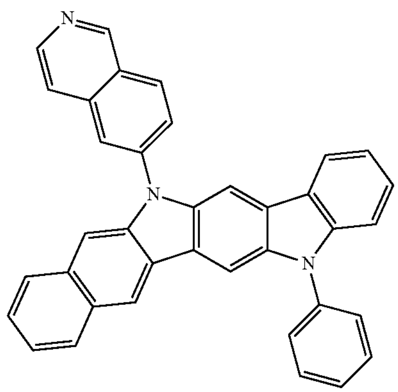
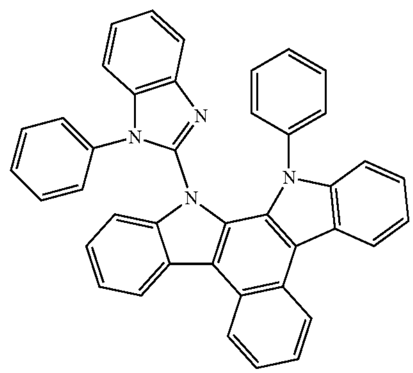
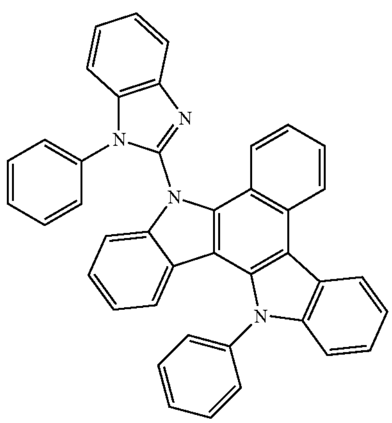
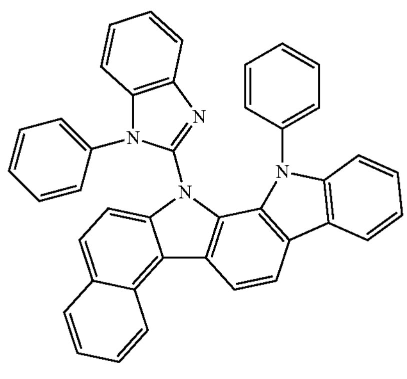
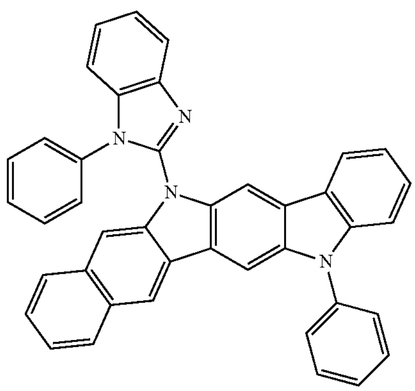
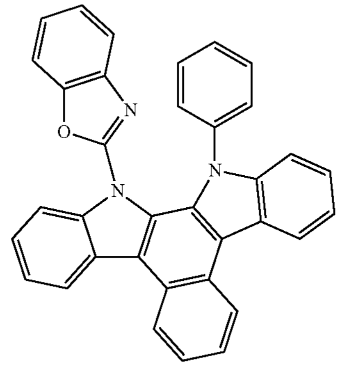
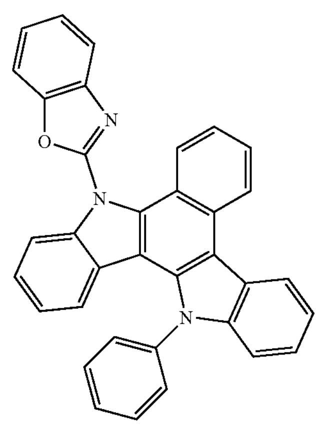

-continued
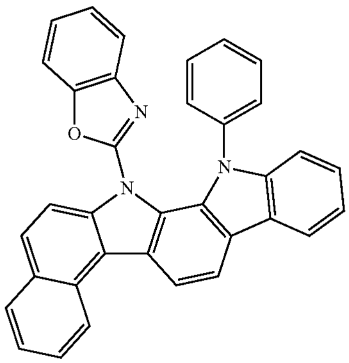
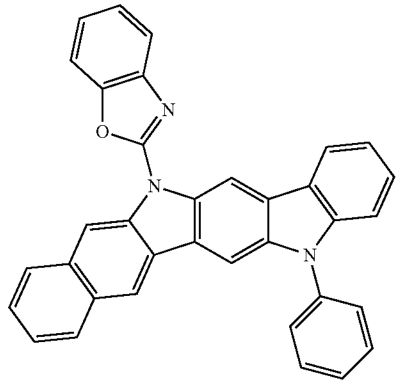
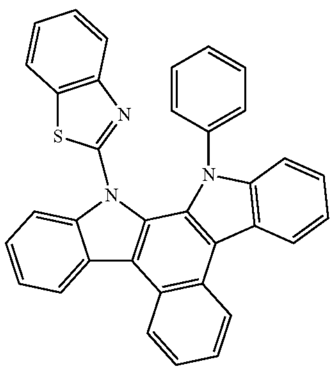
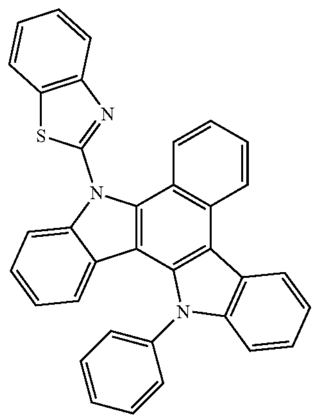
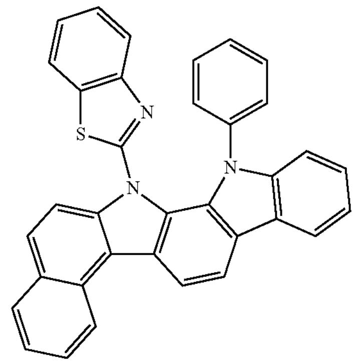
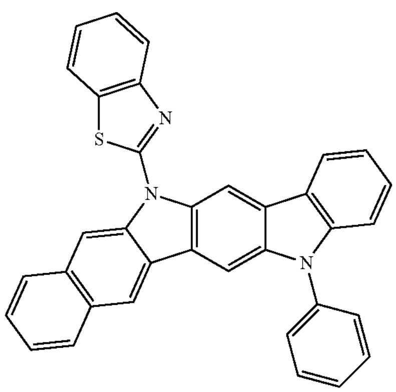
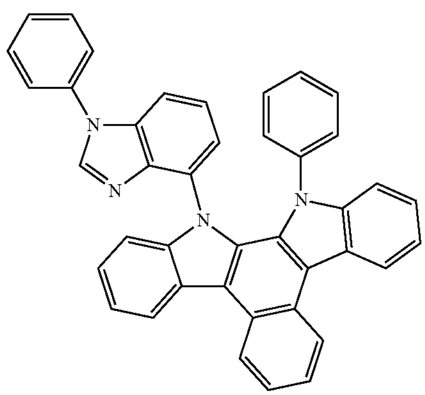
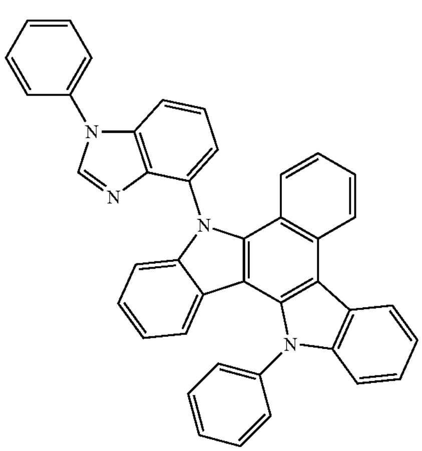
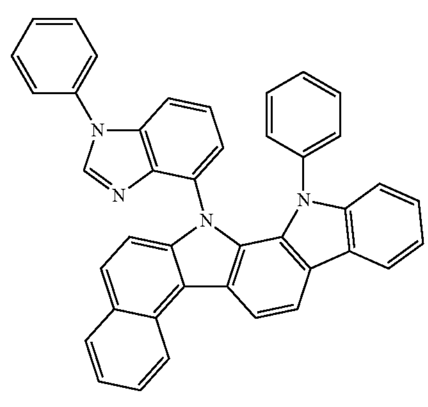

-continued
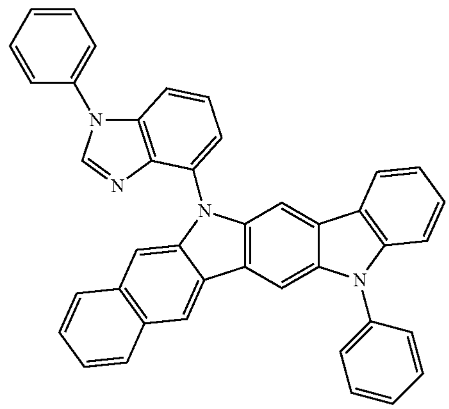
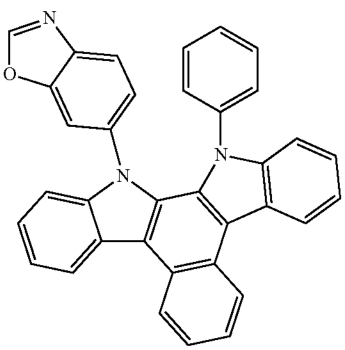
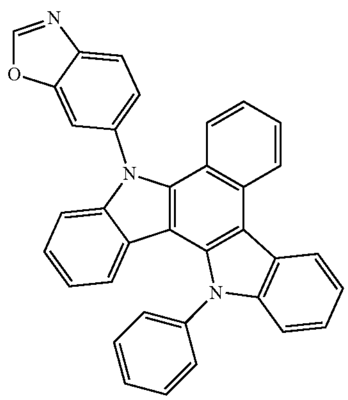
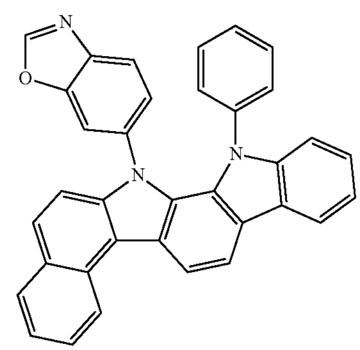
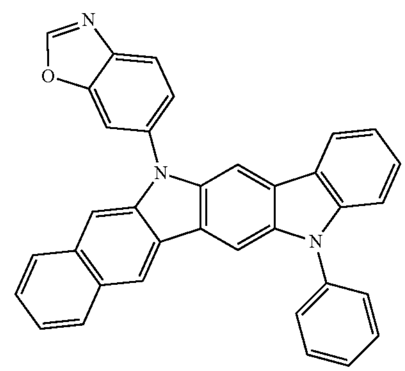
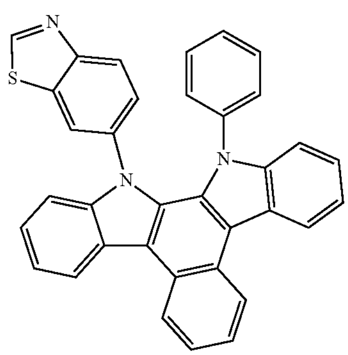
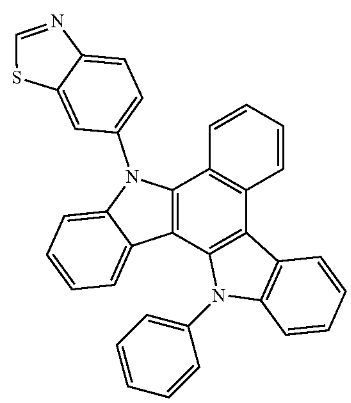
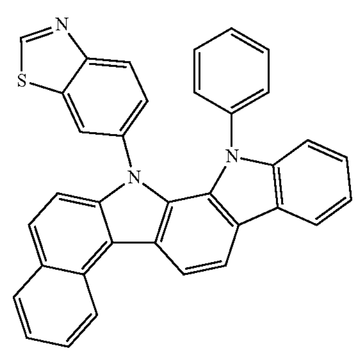
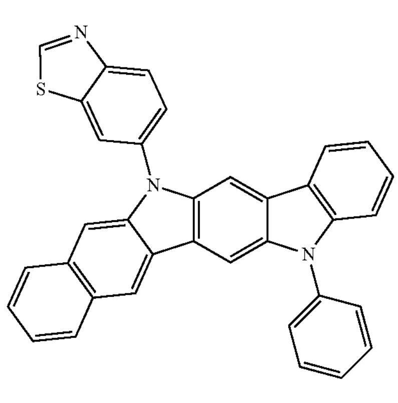
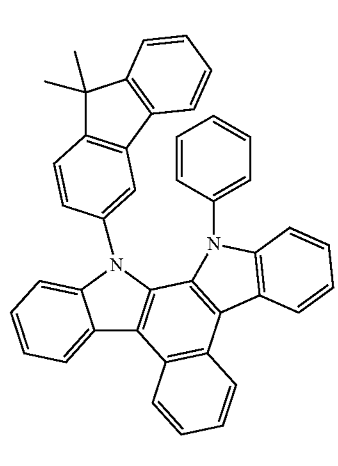
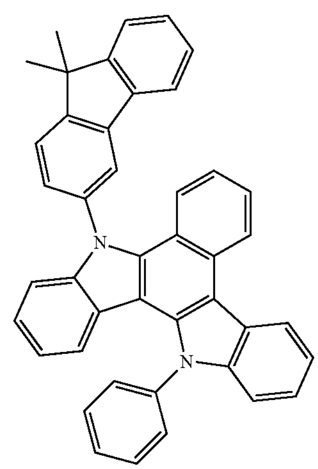

-continued
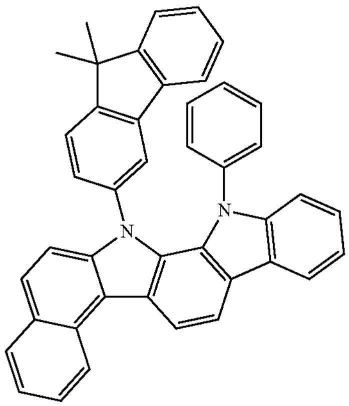
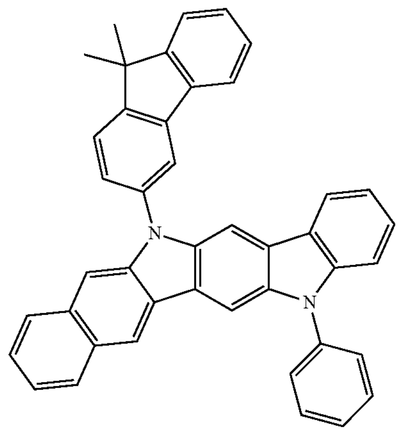
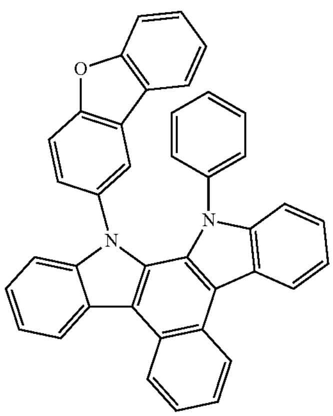
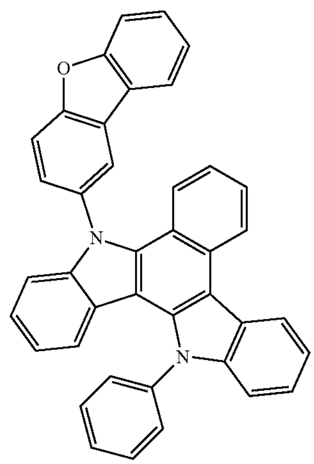
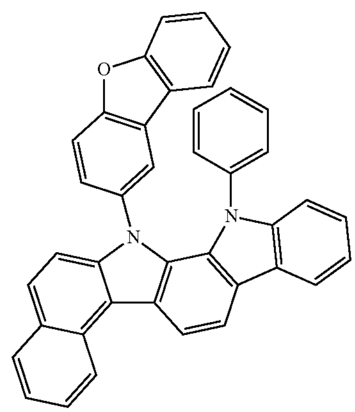
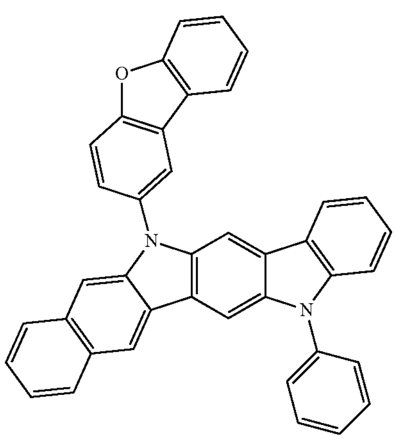
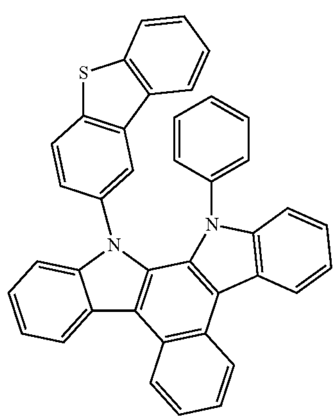
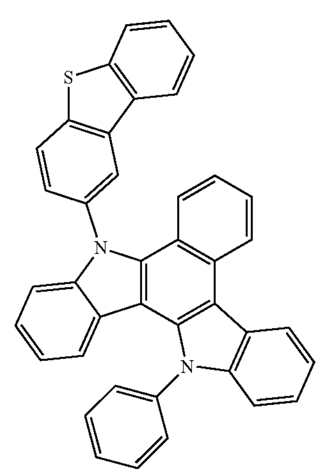

-continued
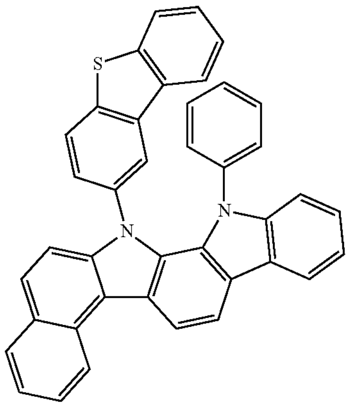
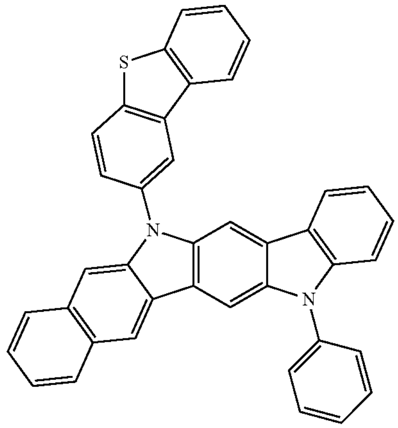
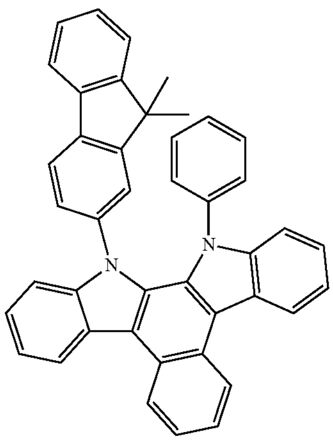
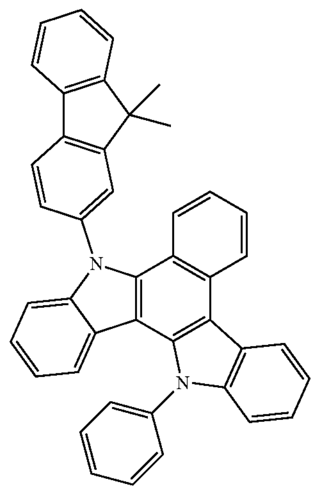
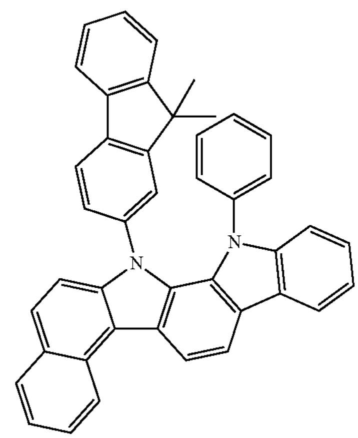
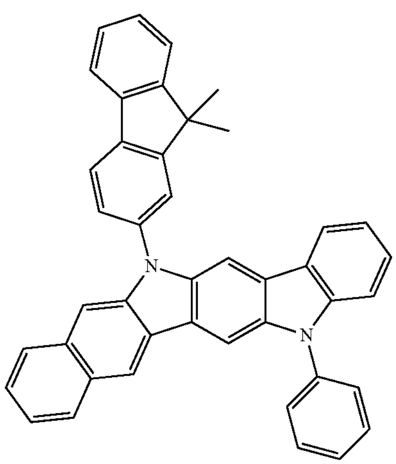
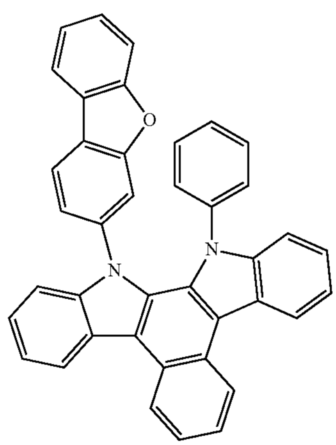
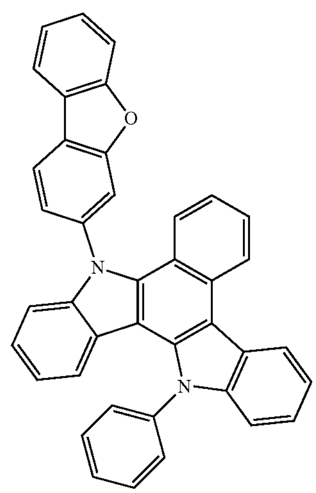

-continued
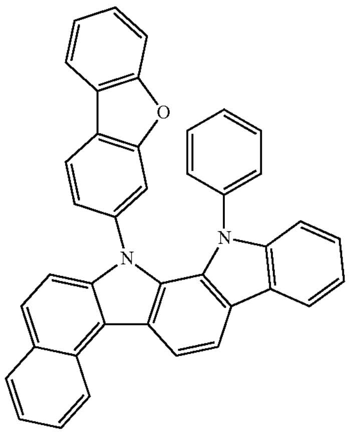
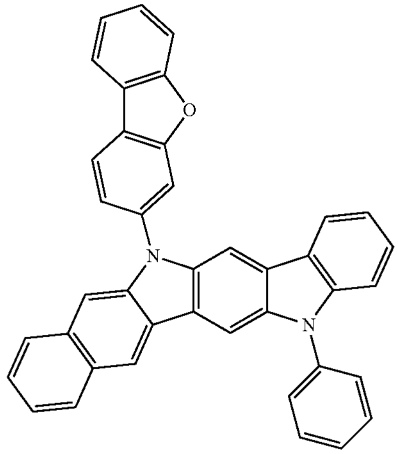
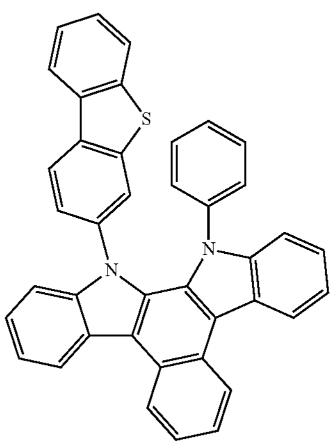
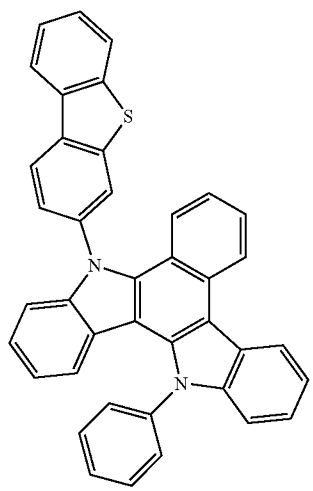
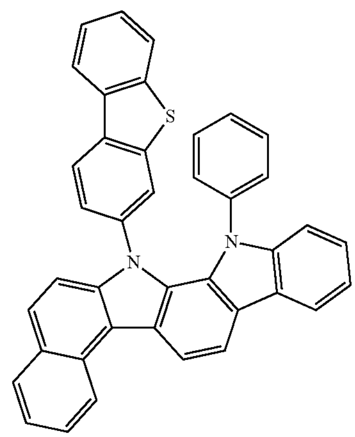
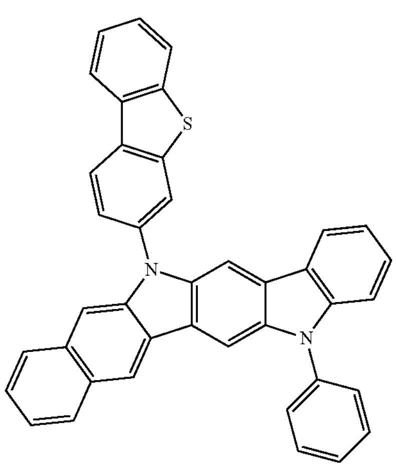
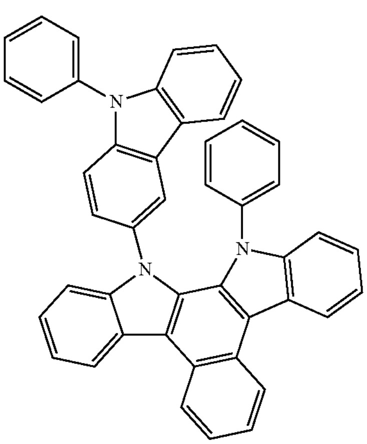

-continued
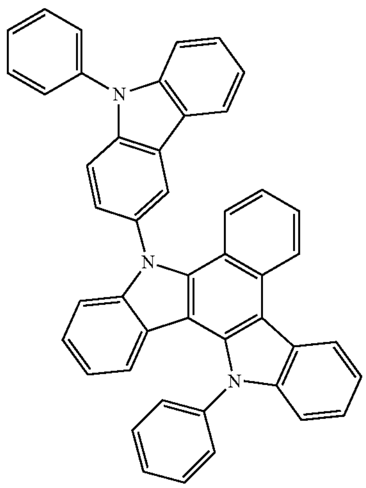
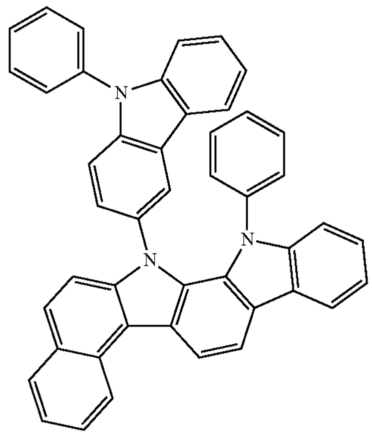
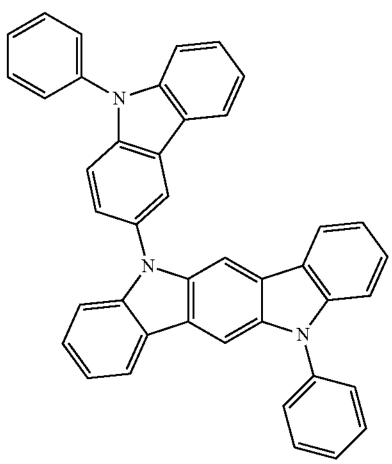
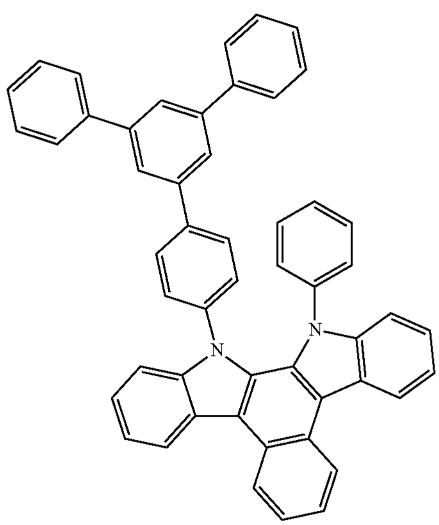
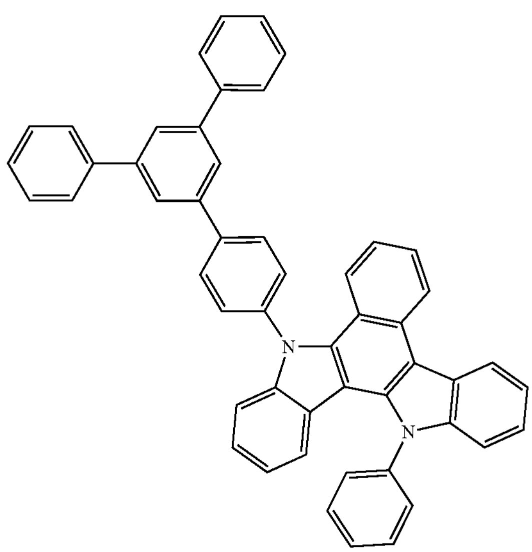
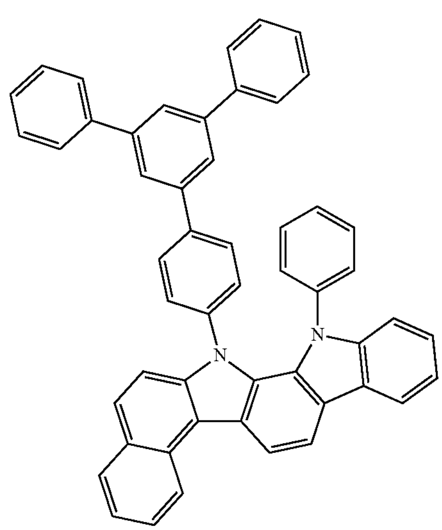

-continued
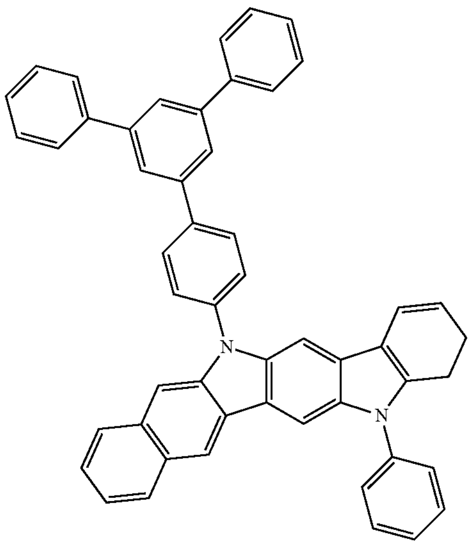
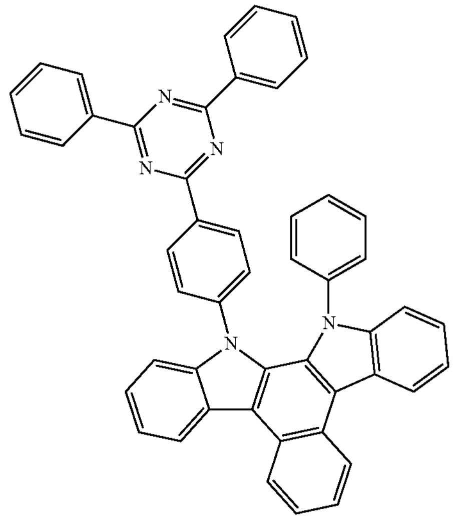
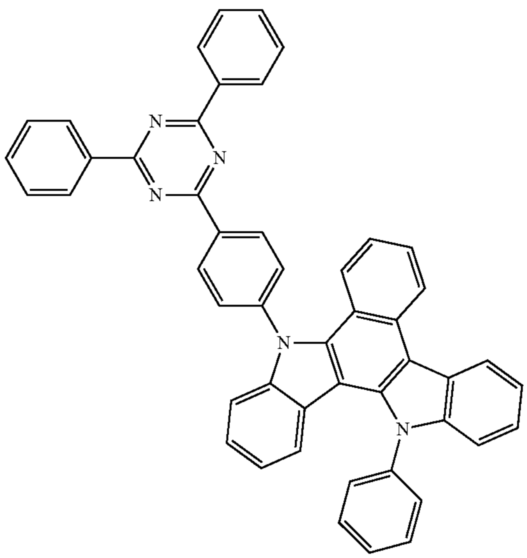
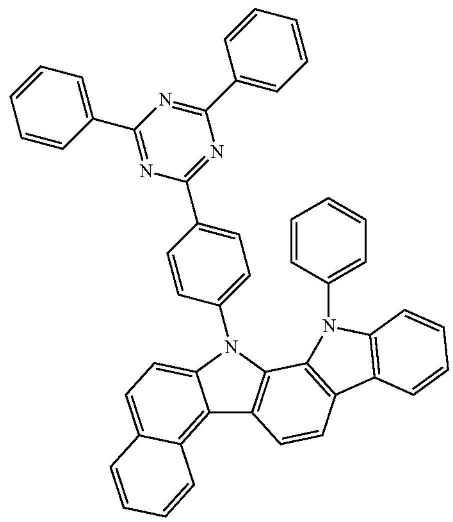
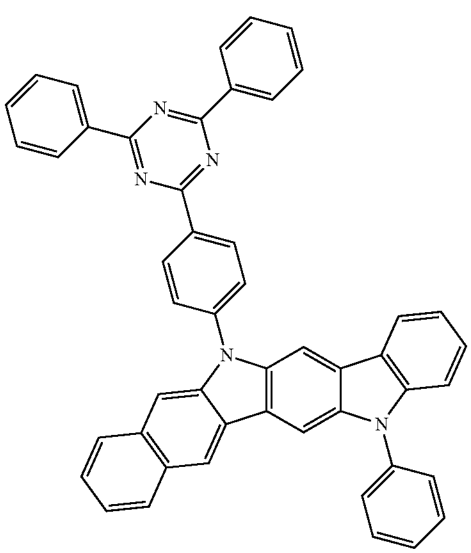
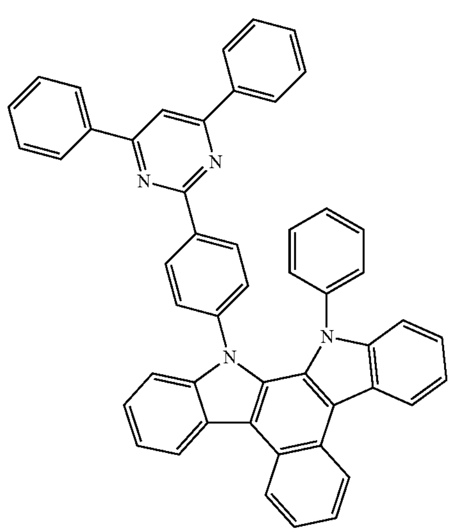

-continued
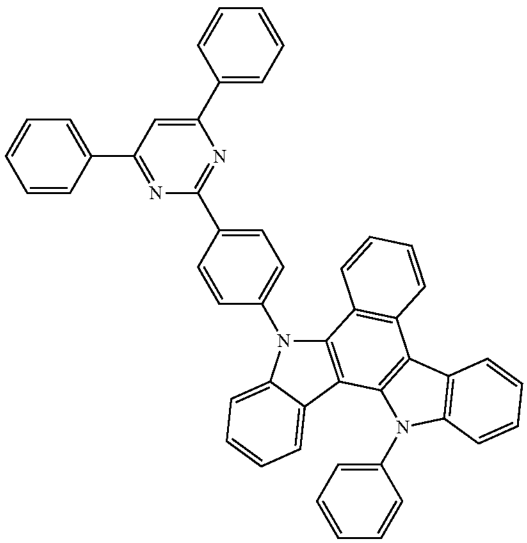
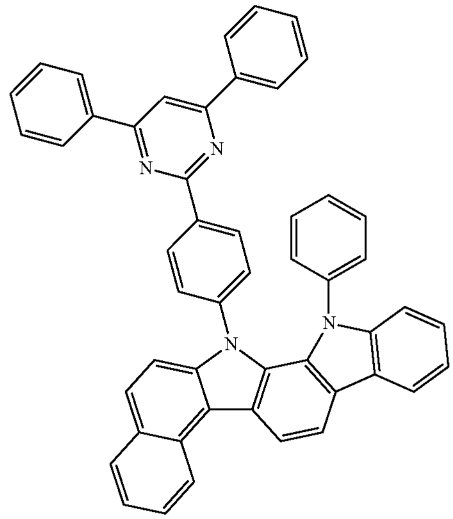
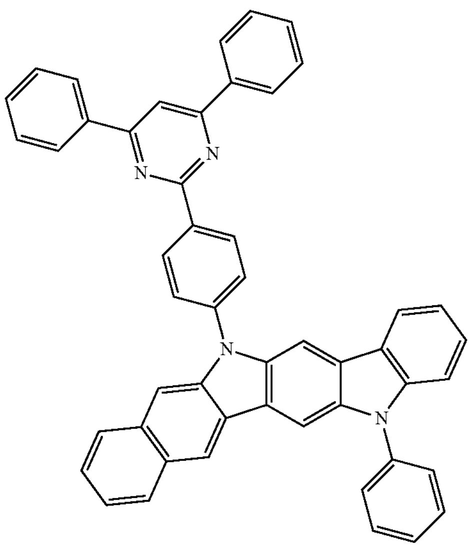
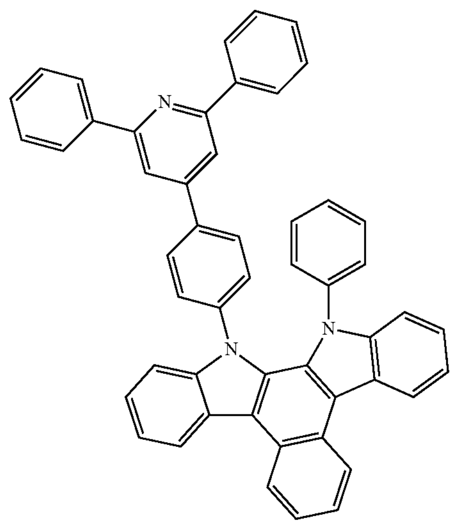
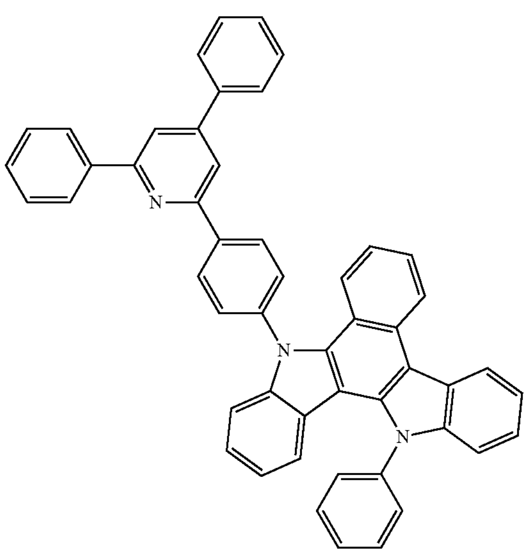
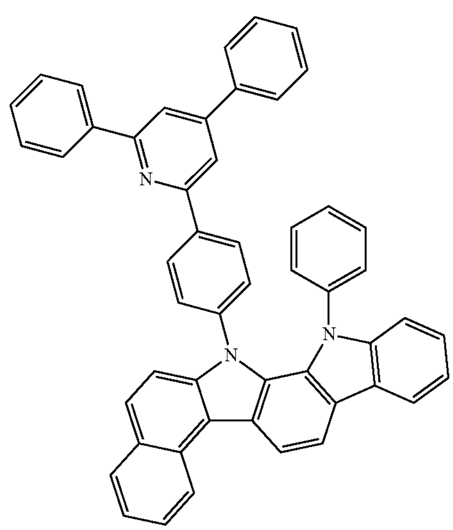

-continued
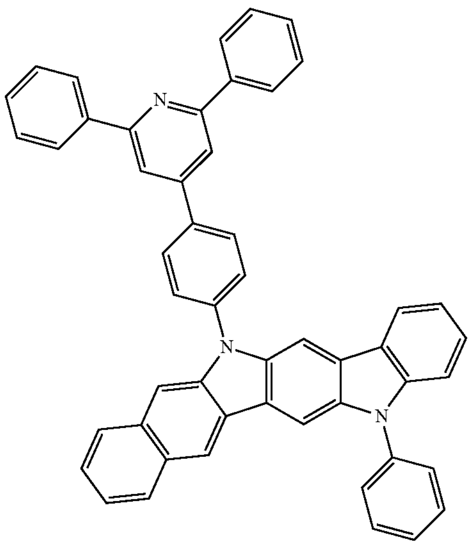
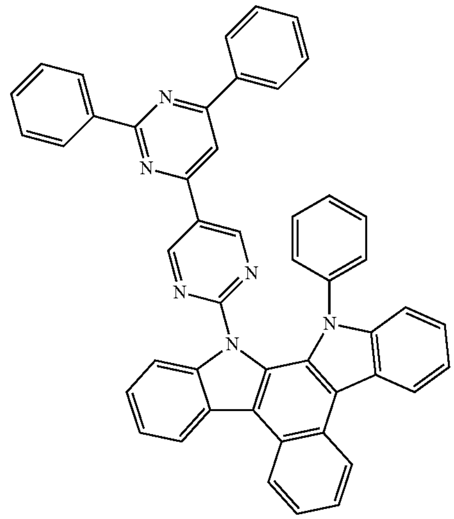
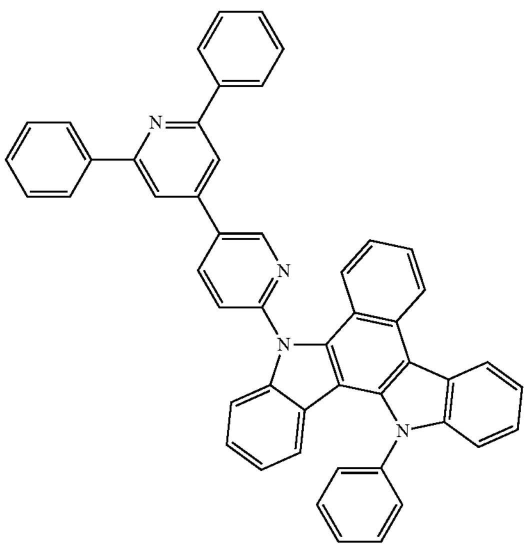
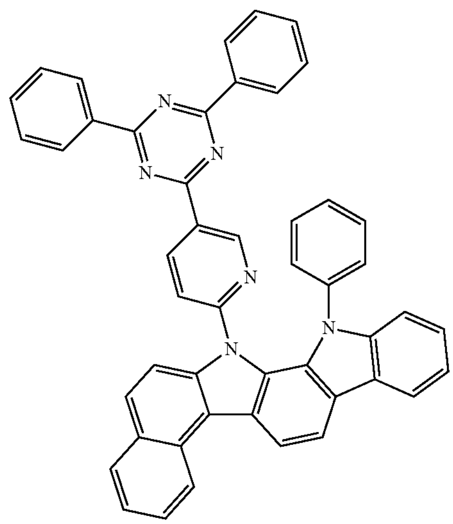
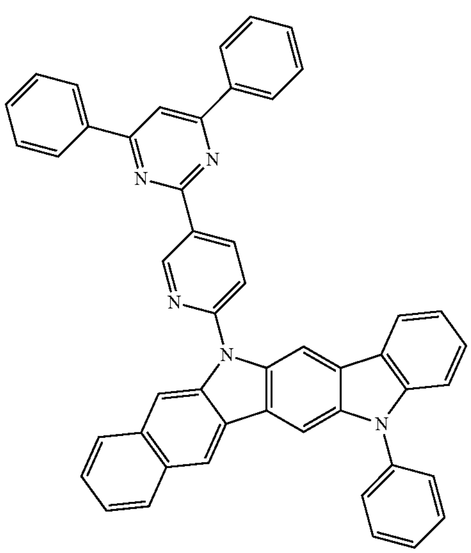
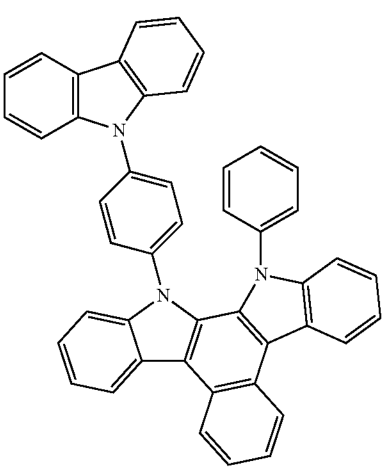

-continued
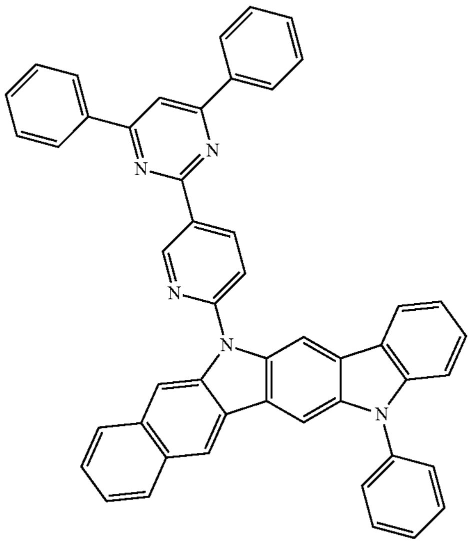
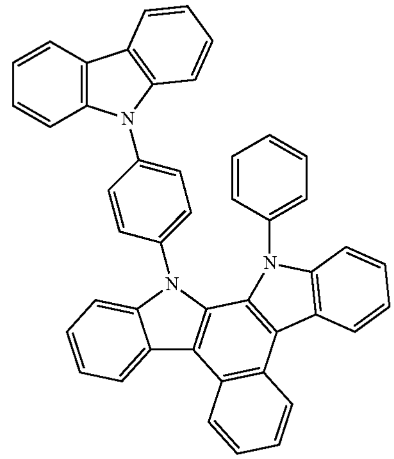
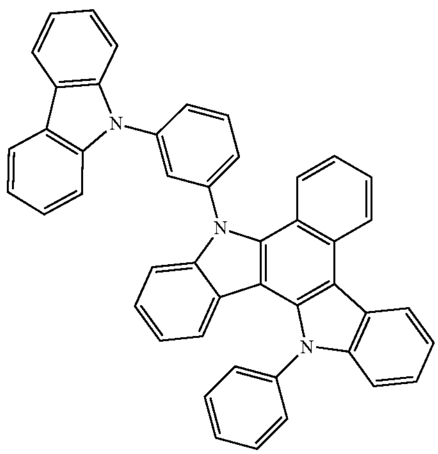
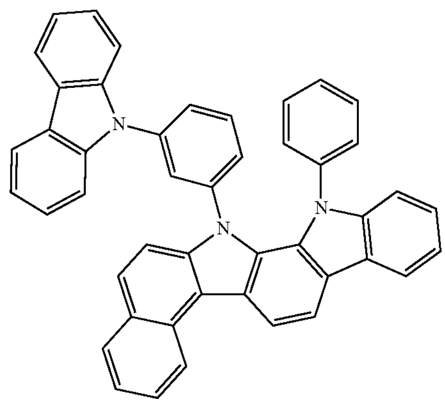
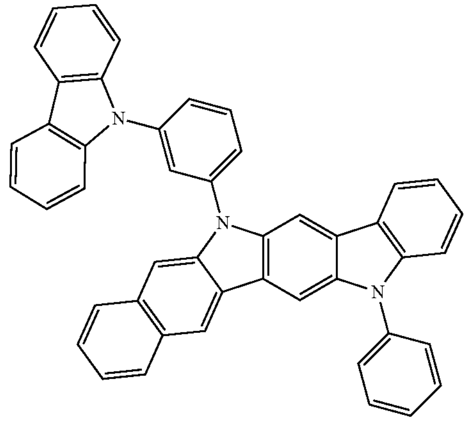
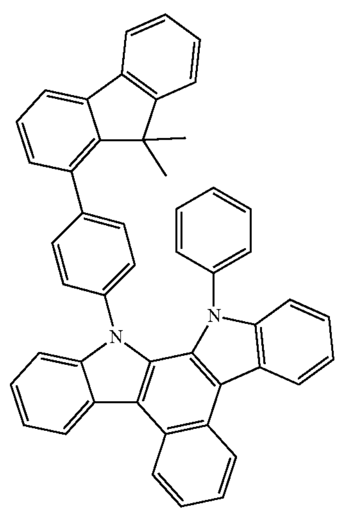

-continued
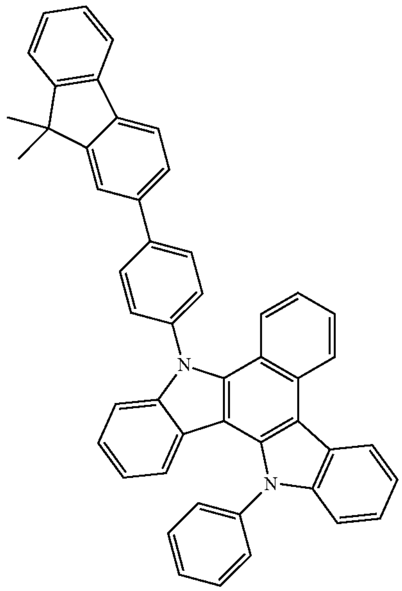
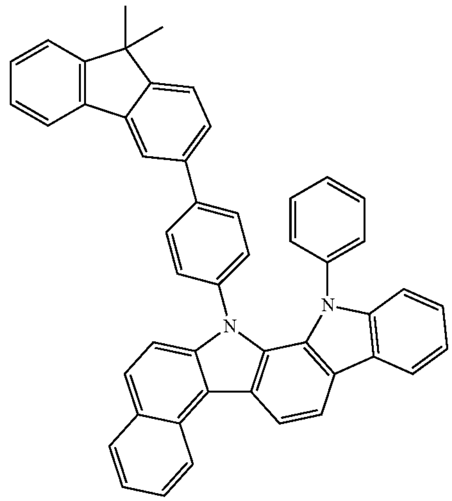
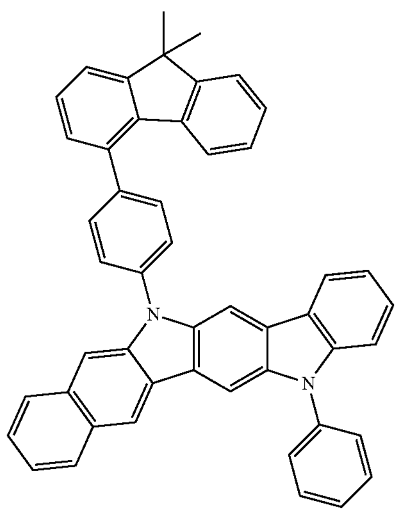
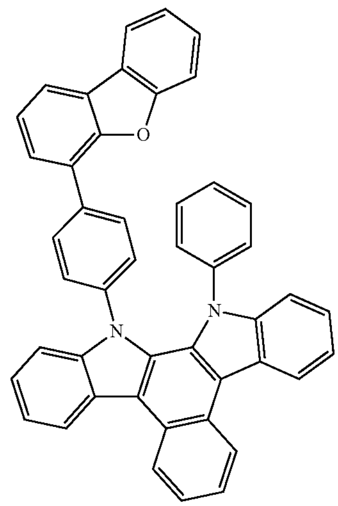
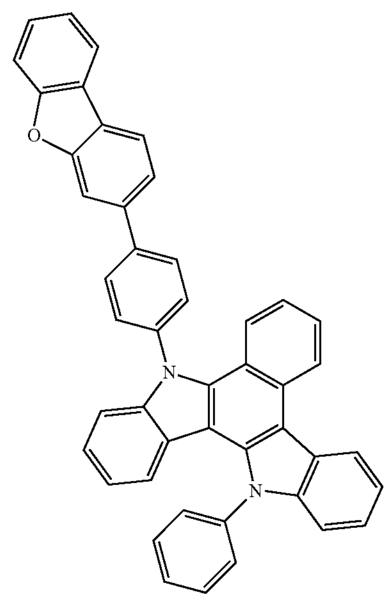
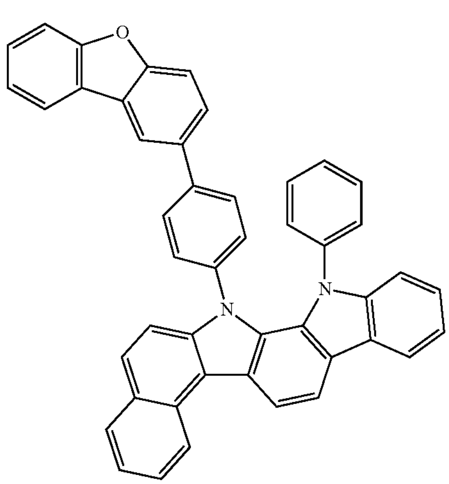
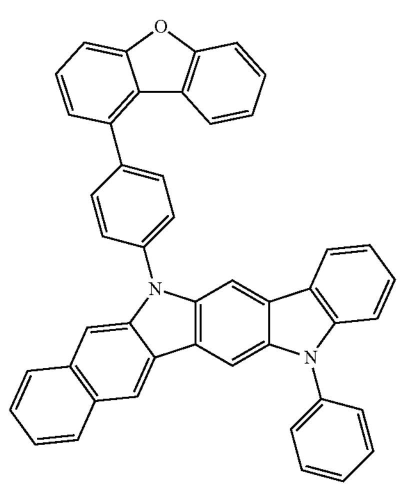

-continued
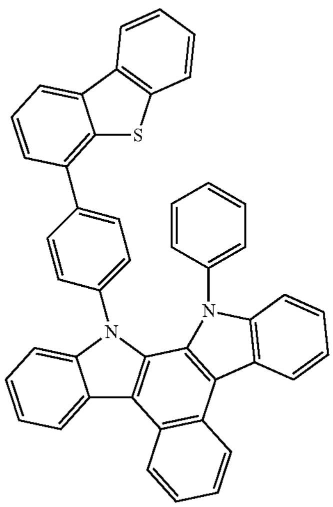
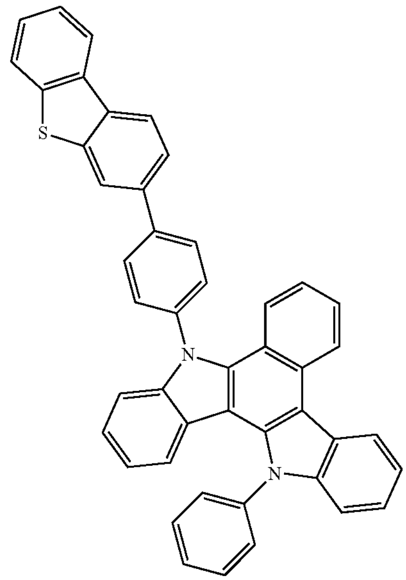
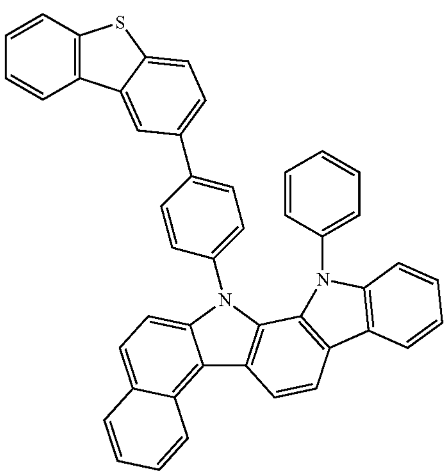
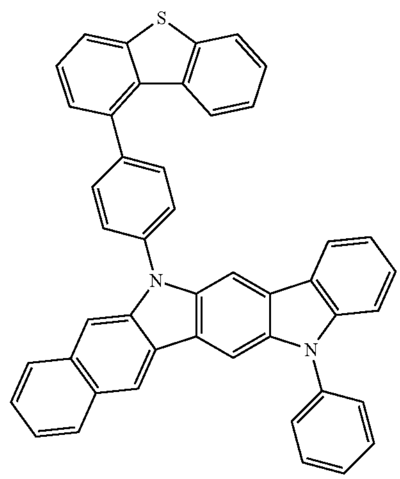
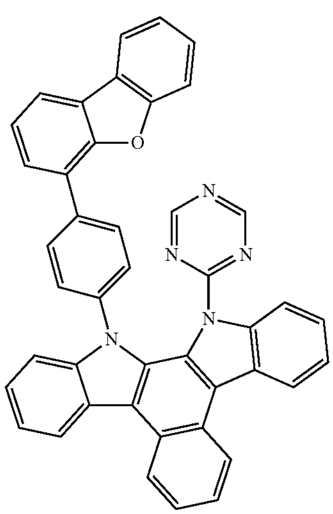
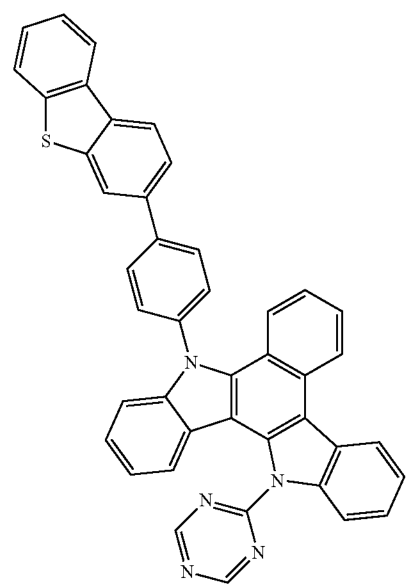

-continued
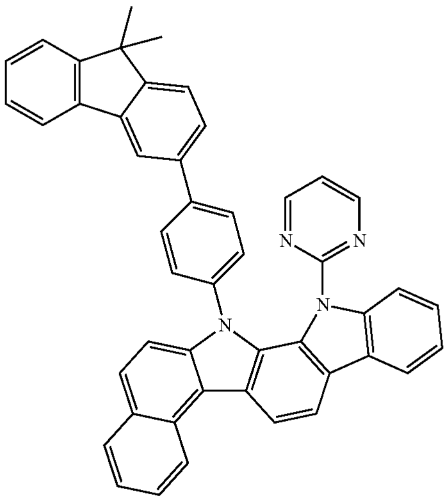
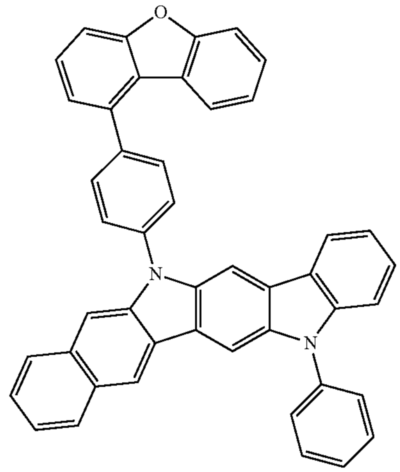
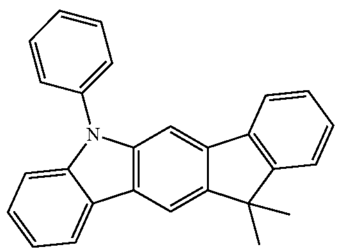
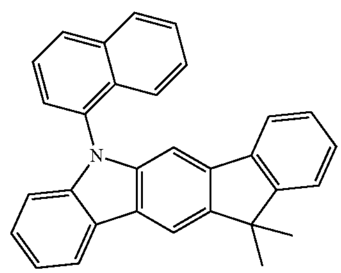
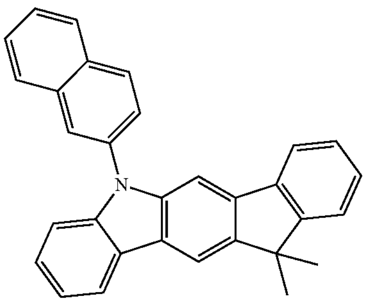
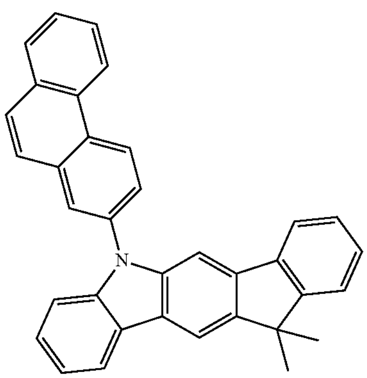
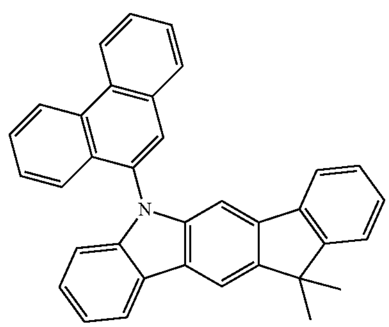
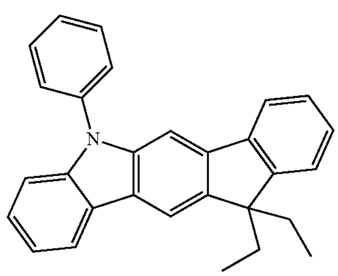
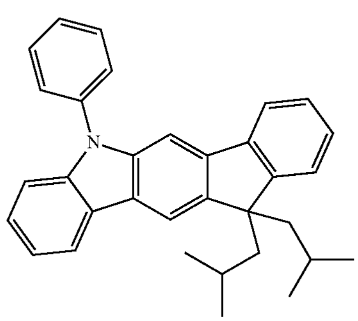
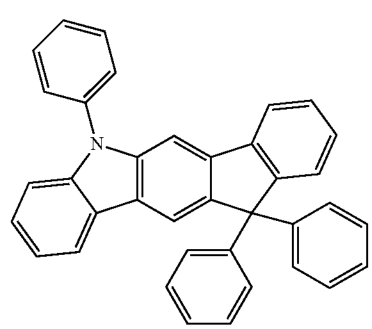

-continued
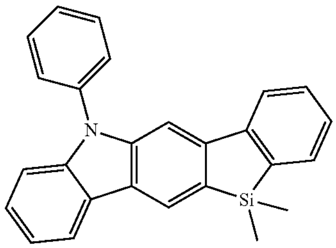
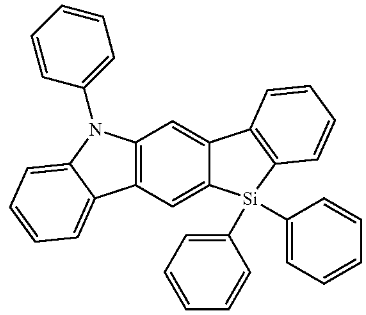
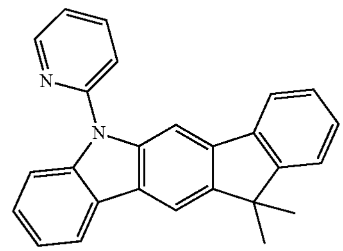
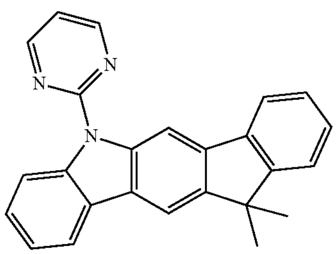
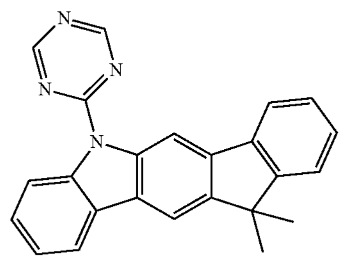
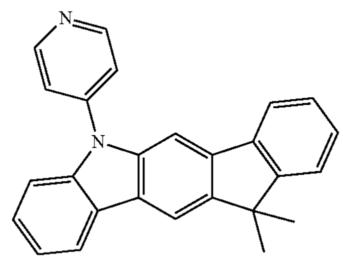
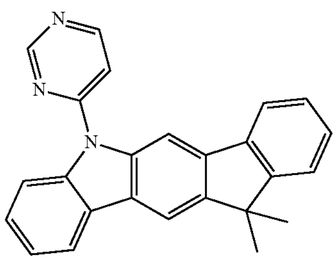
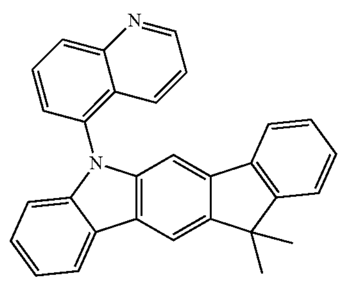
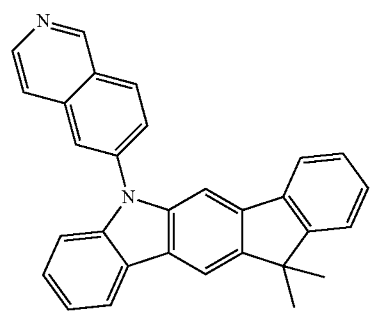
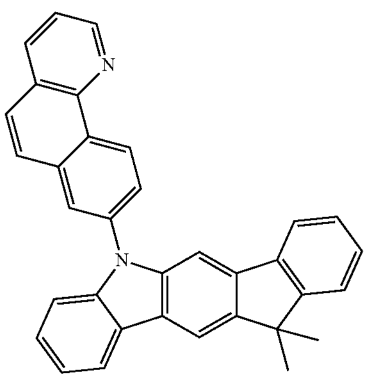
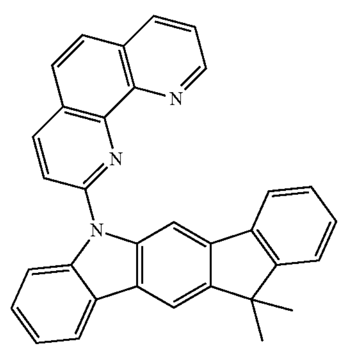
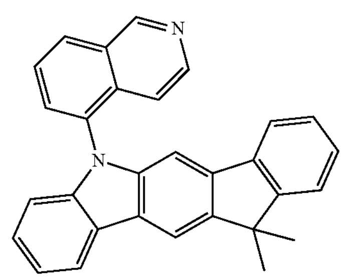
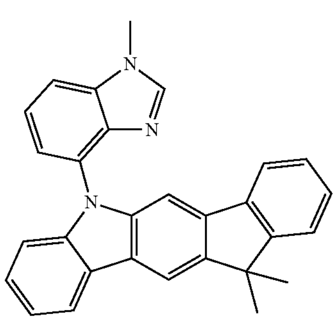
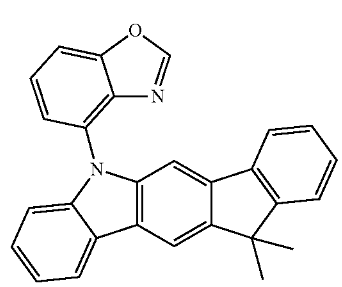
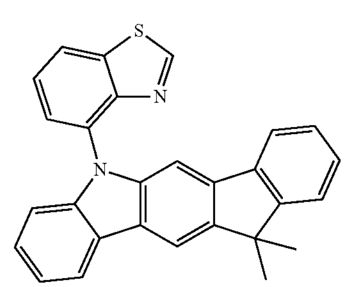

-continued
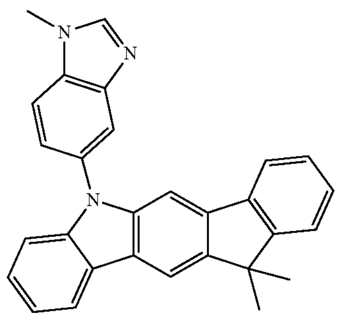
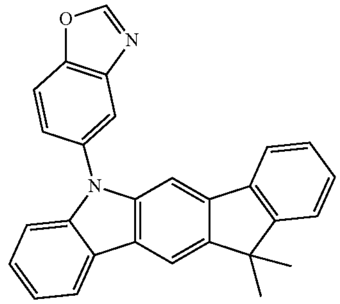
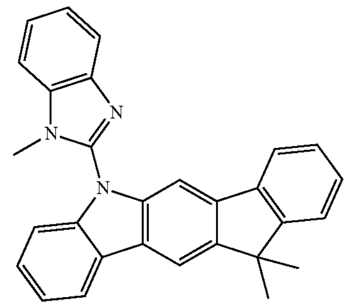
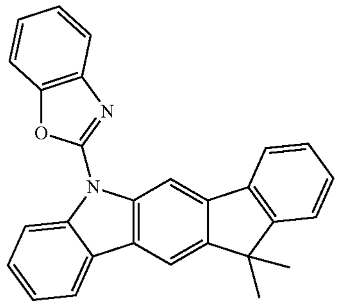
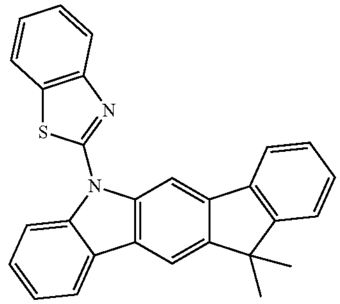
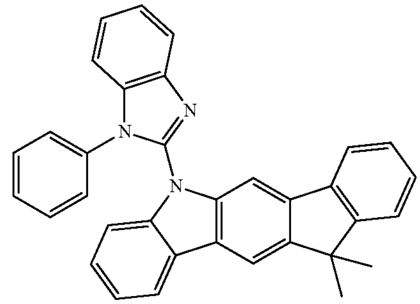
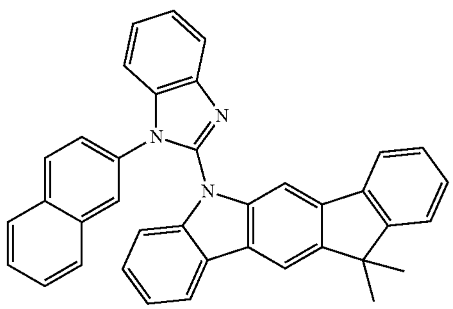
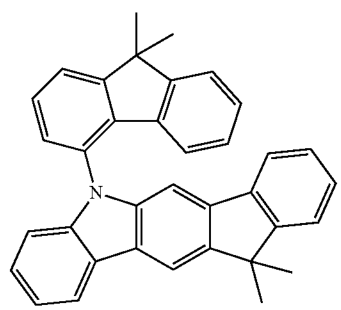
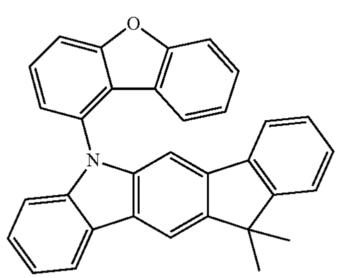
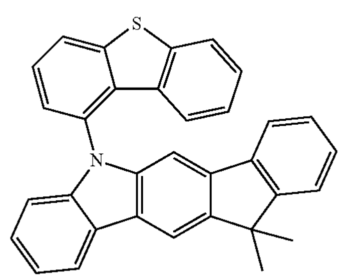
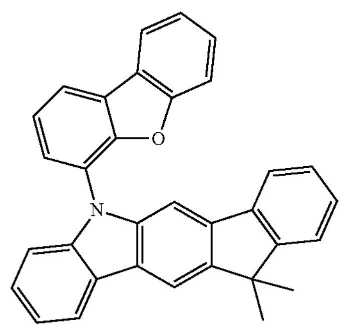
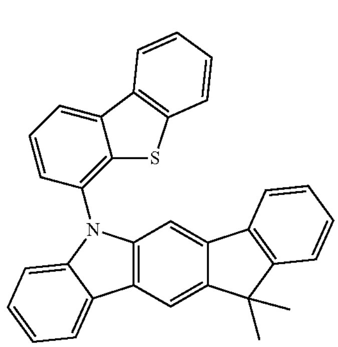
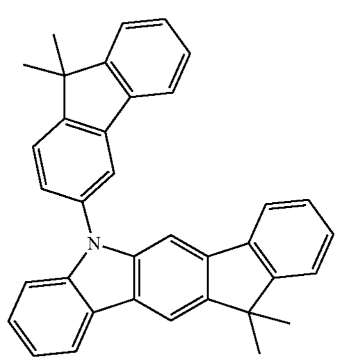
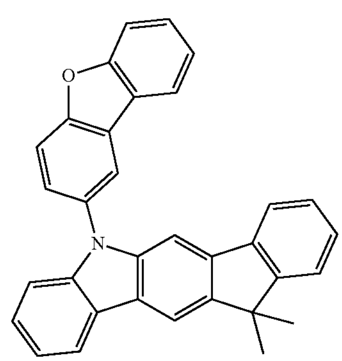

-continued
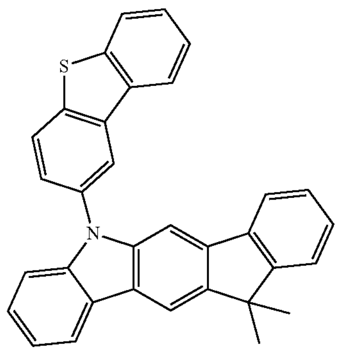
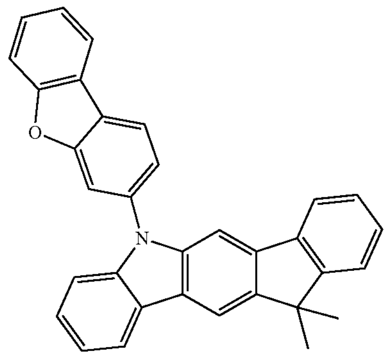
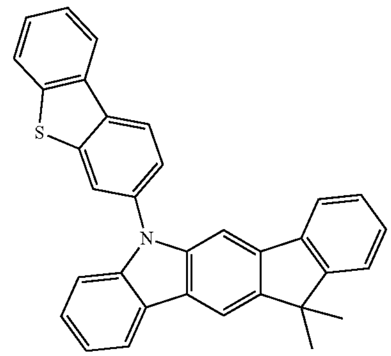
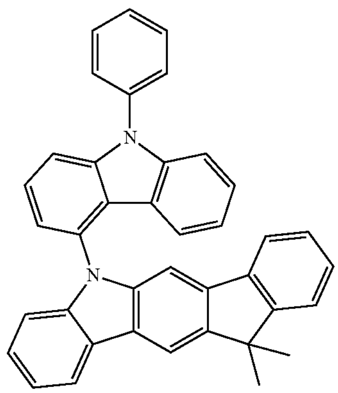
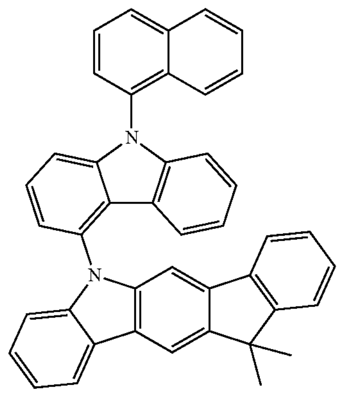
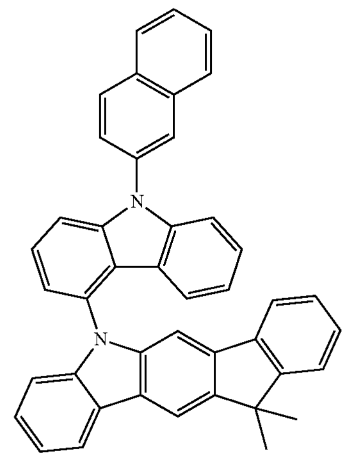
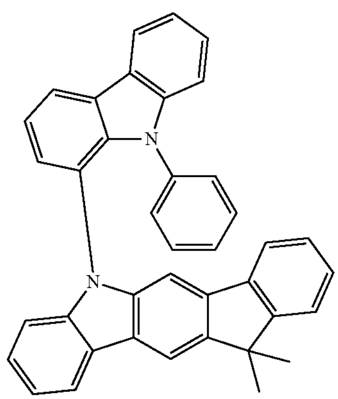
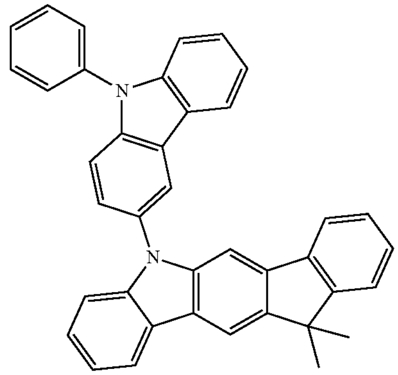
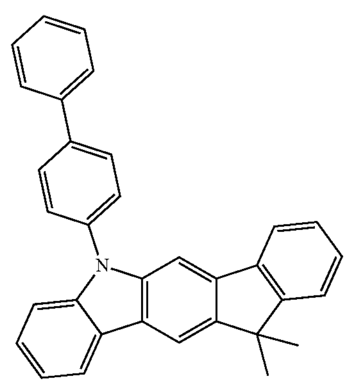
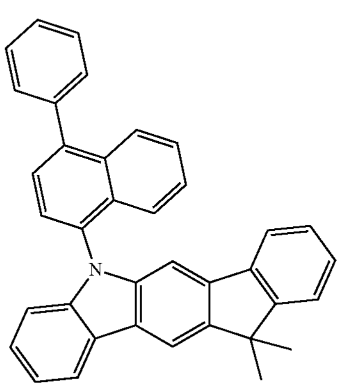
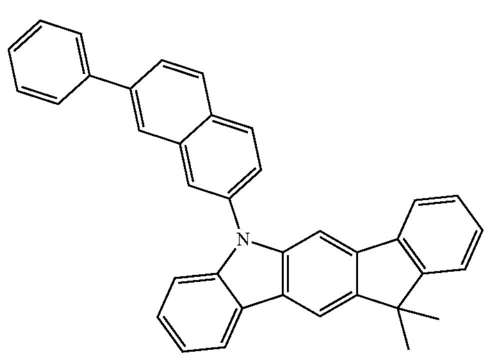

-continued
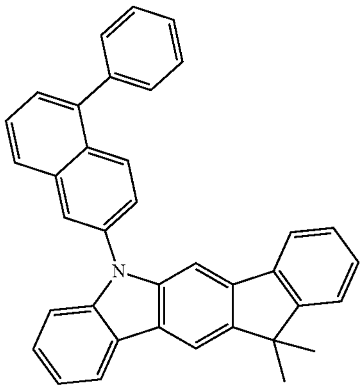
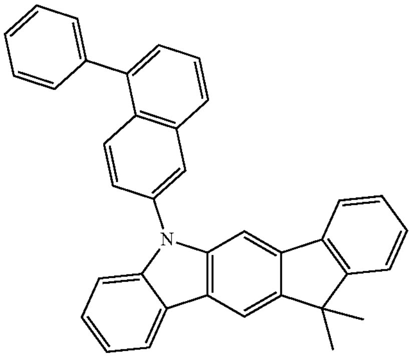
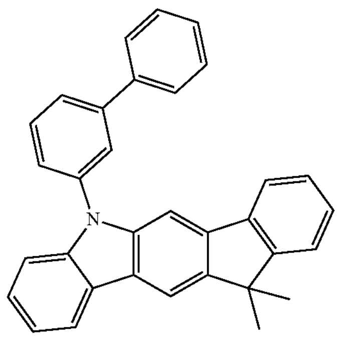
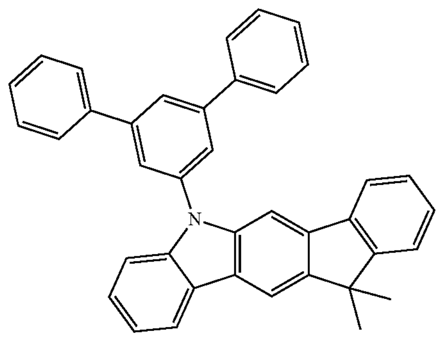
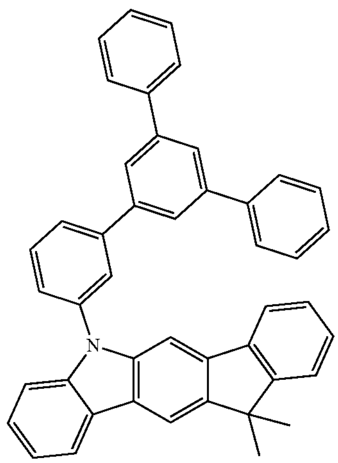
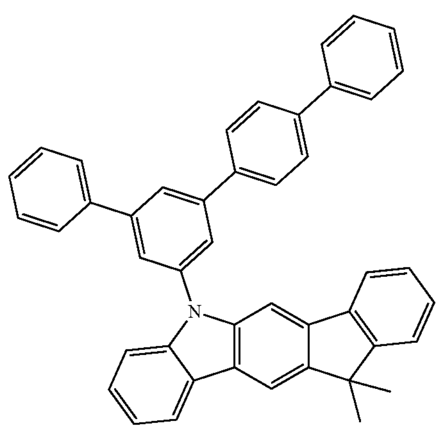
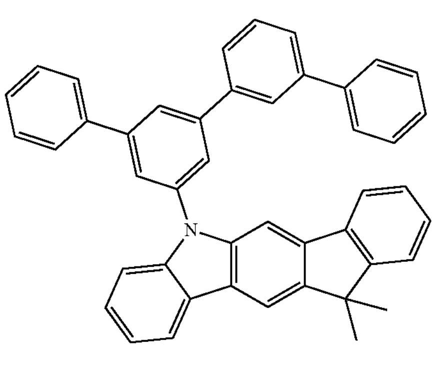
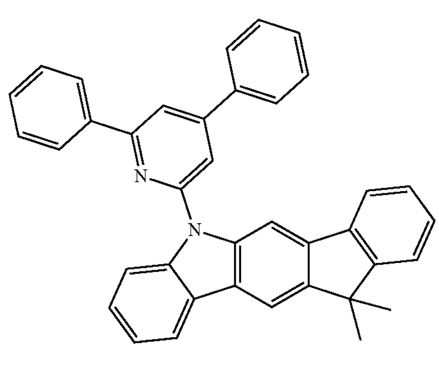

-continued
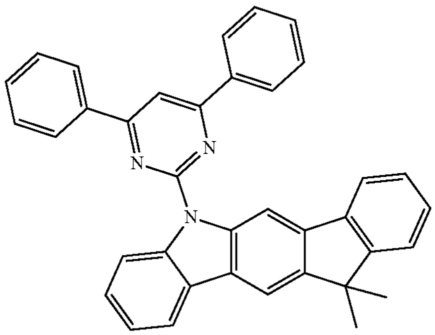
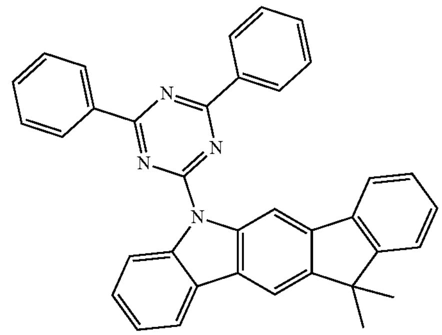
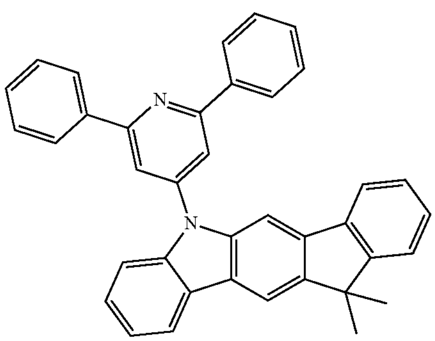
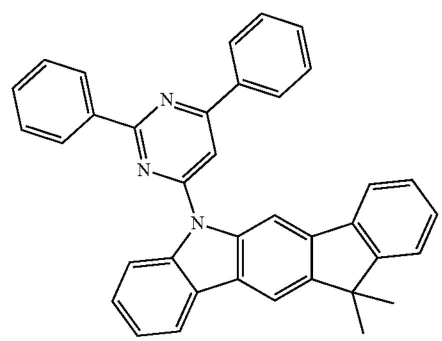
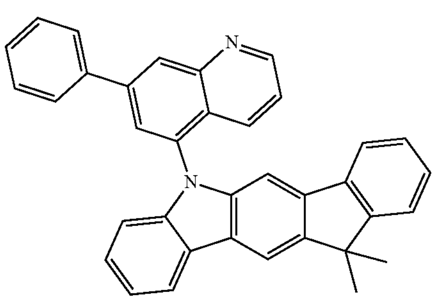
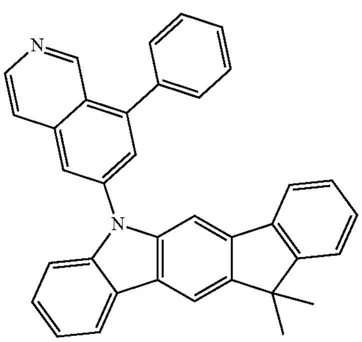
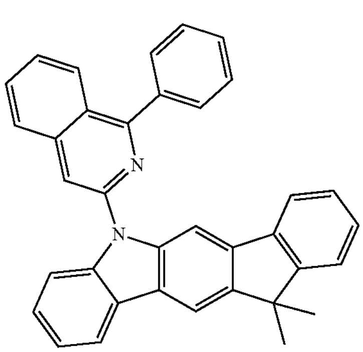
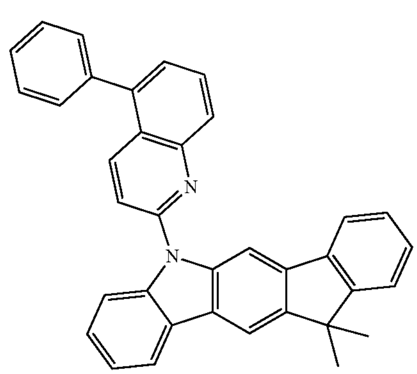

-continued
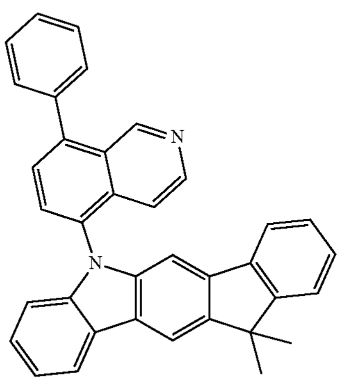
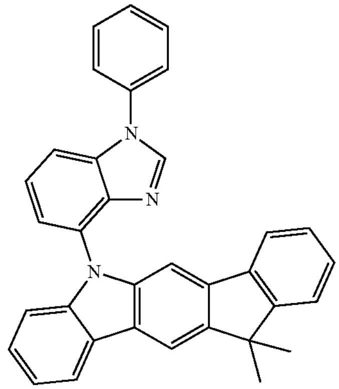
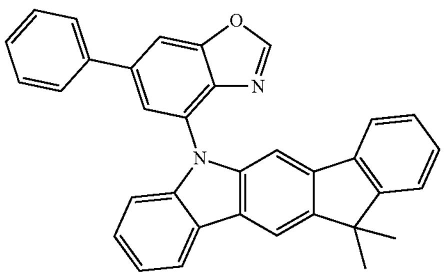
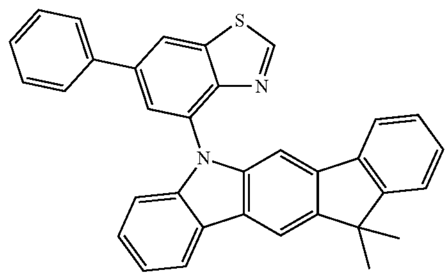
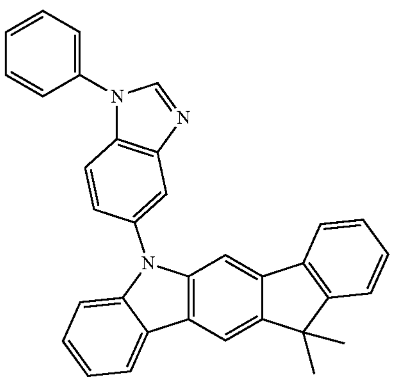
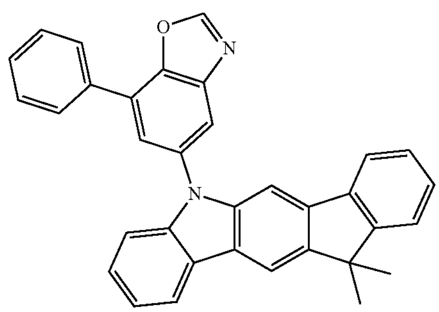
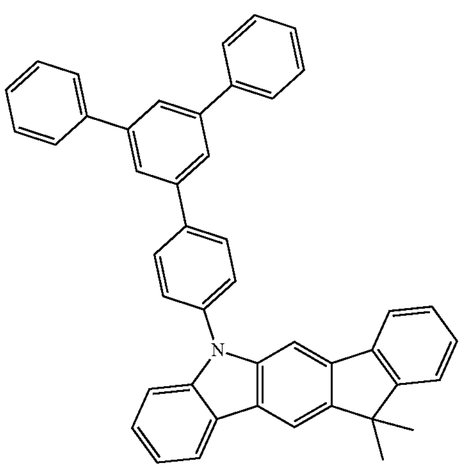
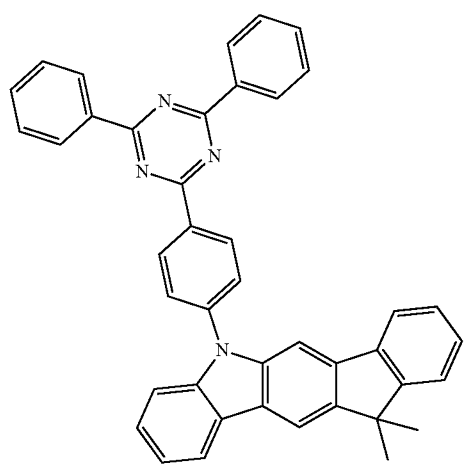

-continued
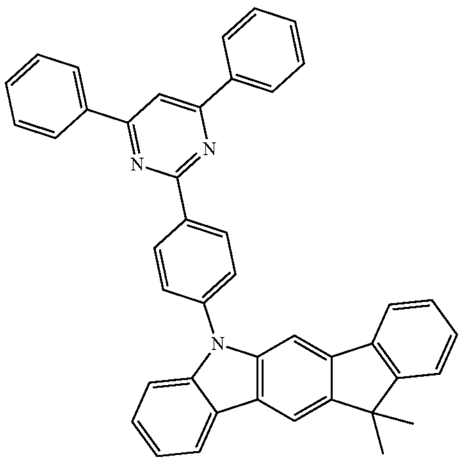
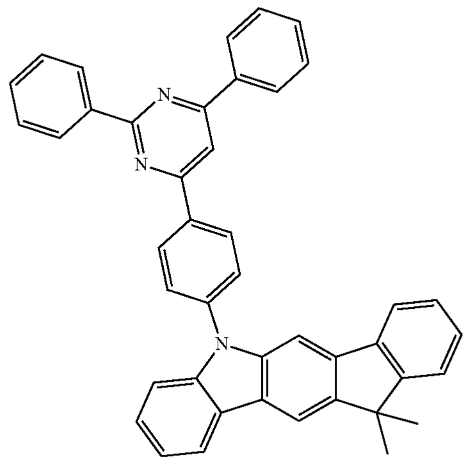
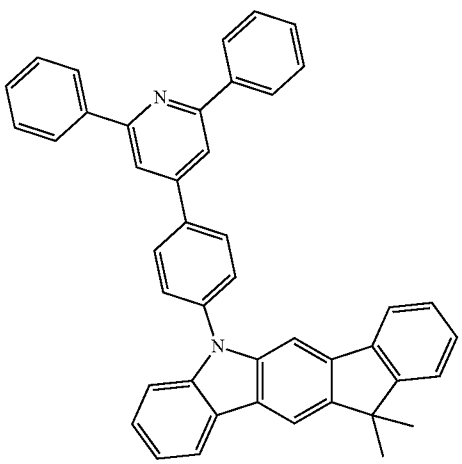
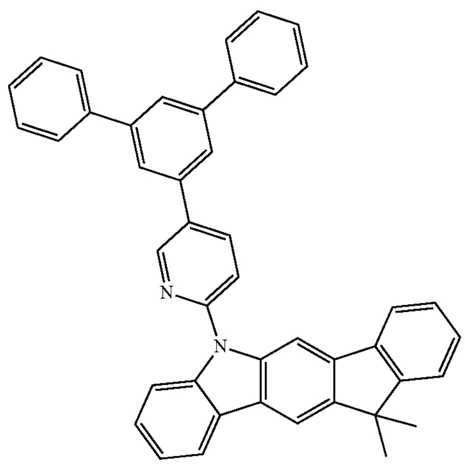
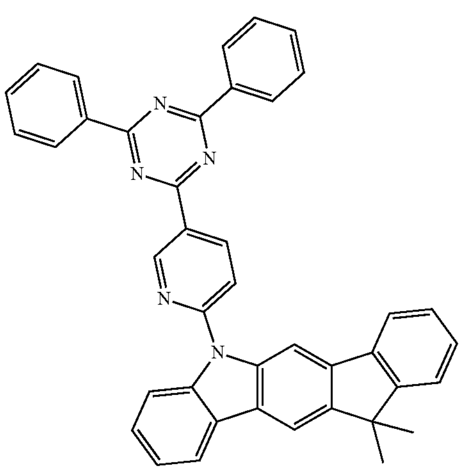
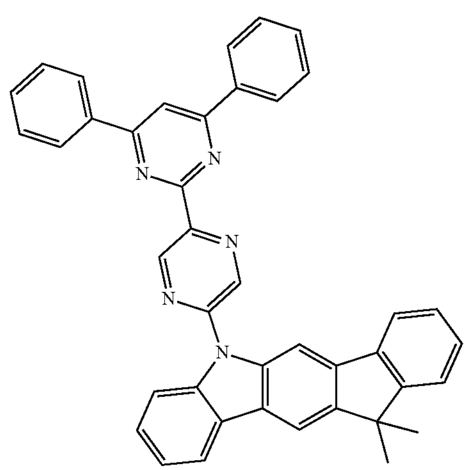

-continued
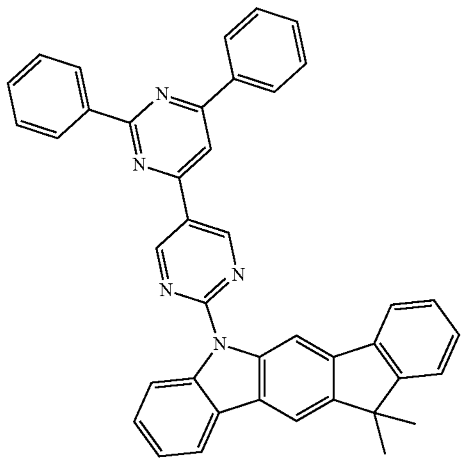
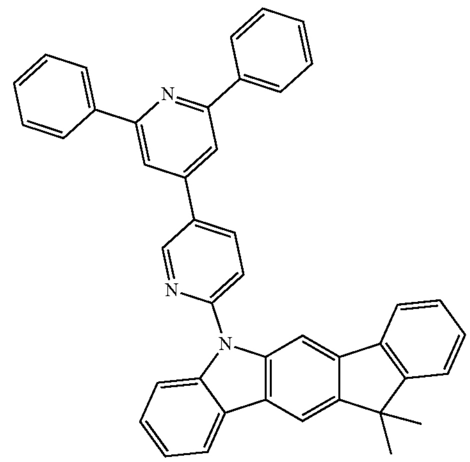
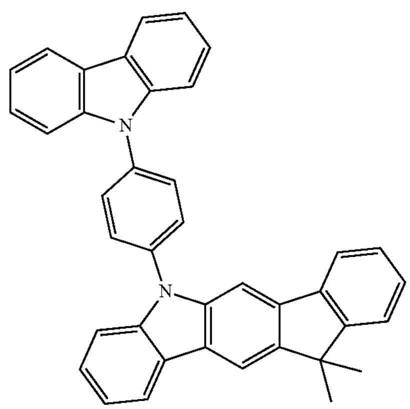
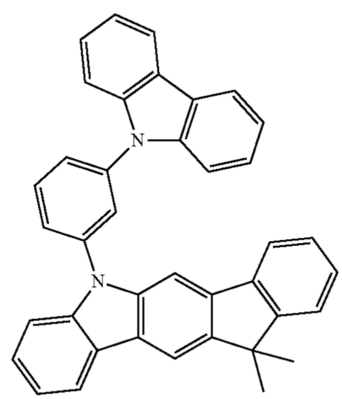
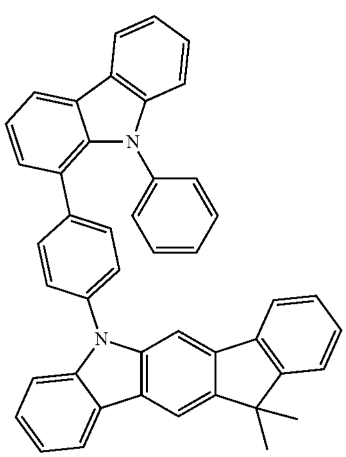
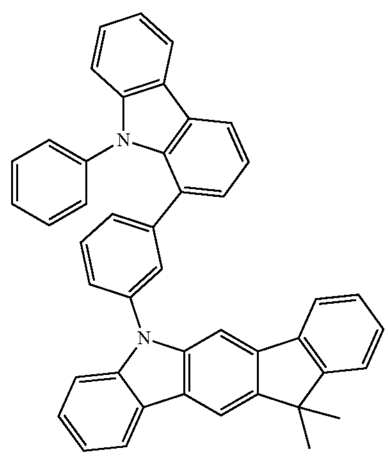
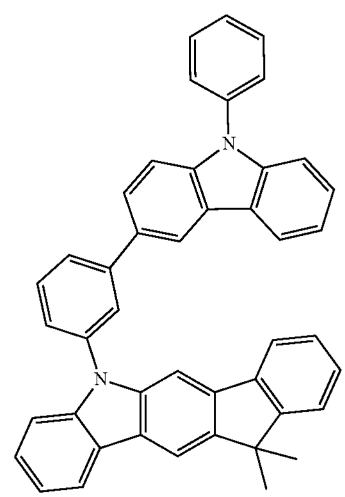

-continued
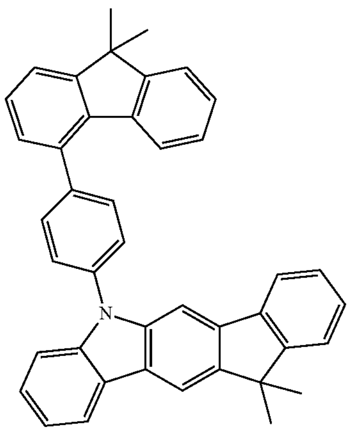
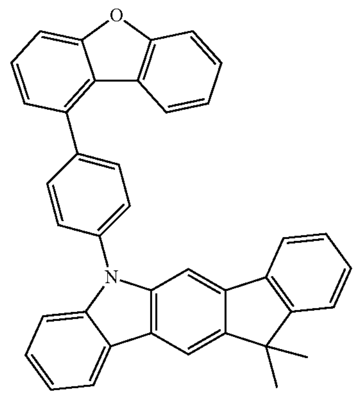
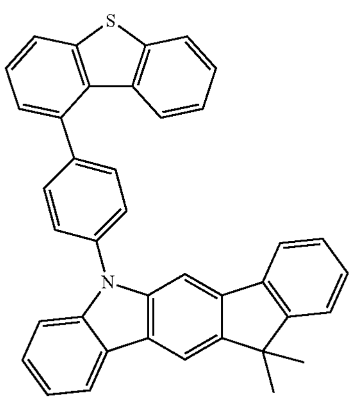
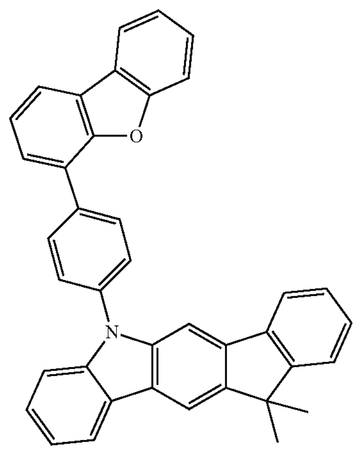
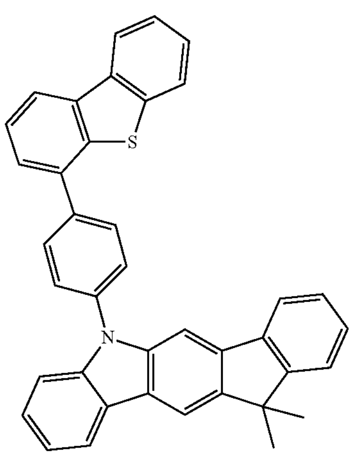
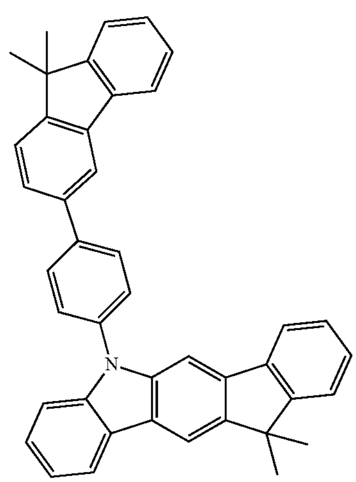
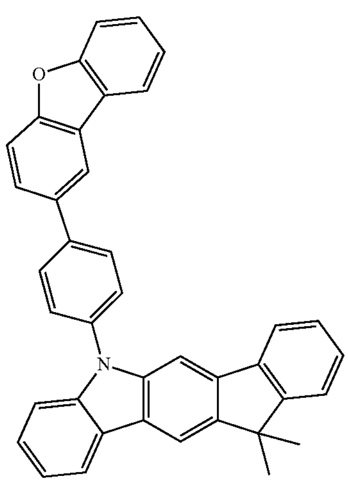

-continued
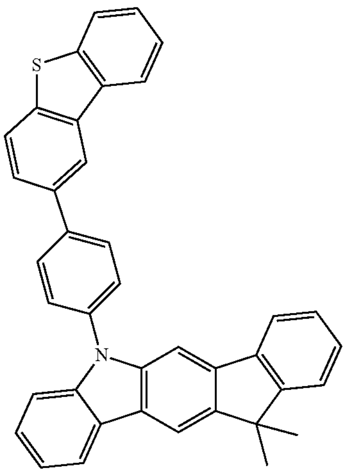
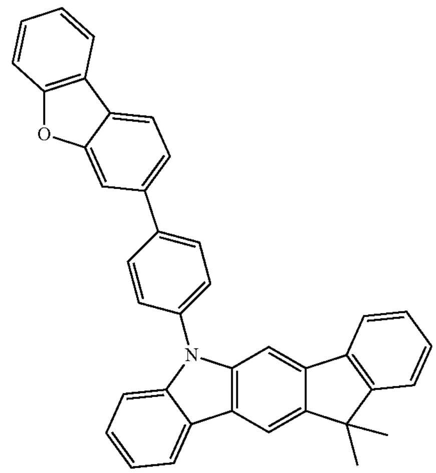
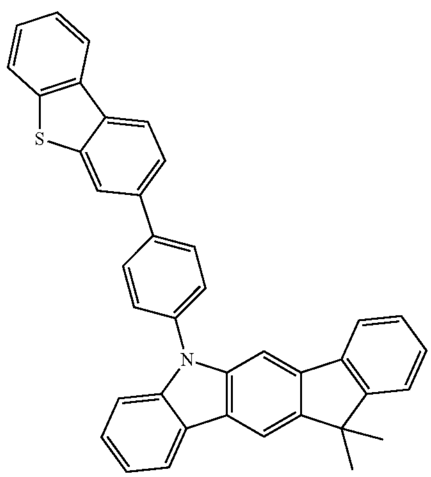
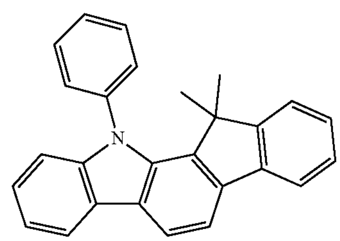
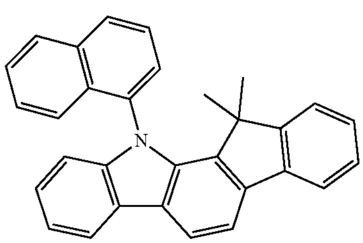
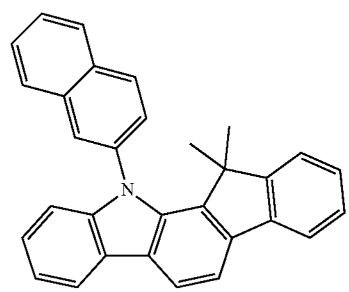
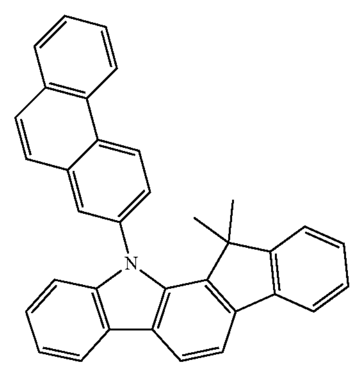
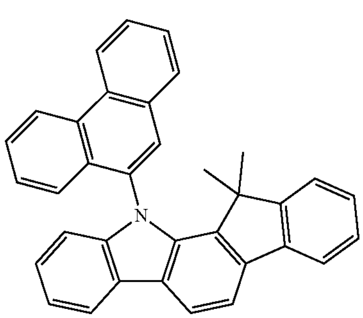
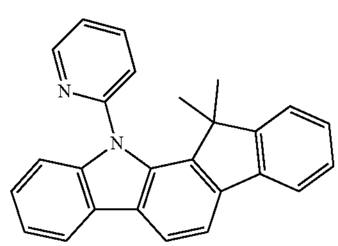
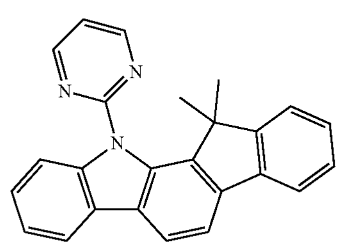

-continued
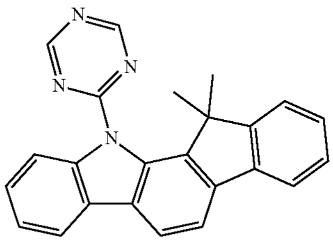
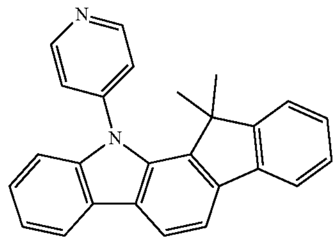
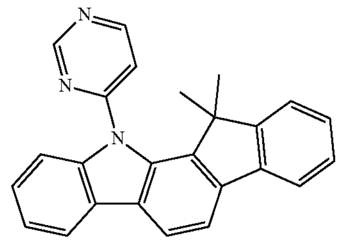
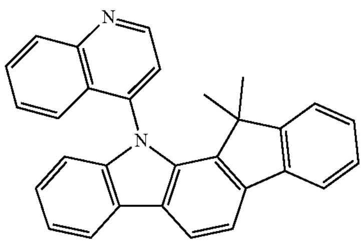
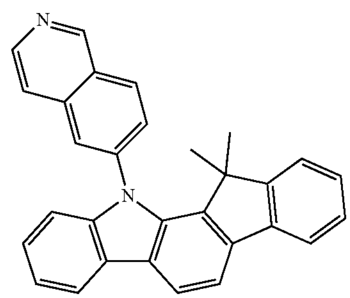
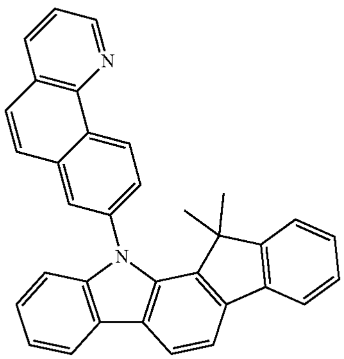
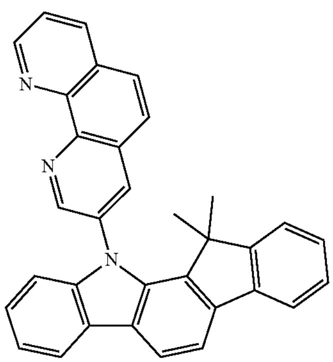
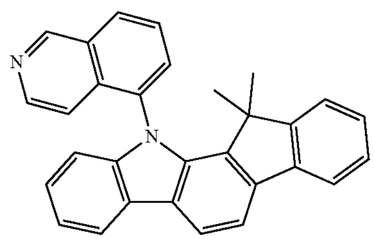
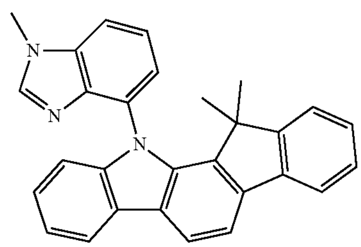
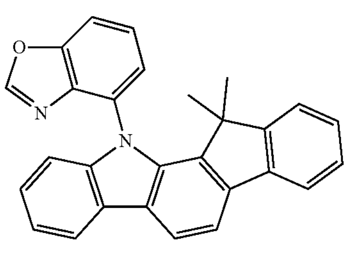
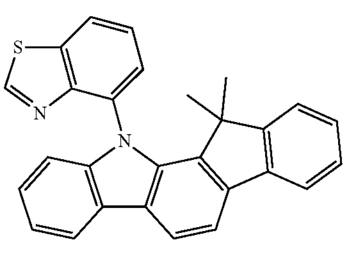
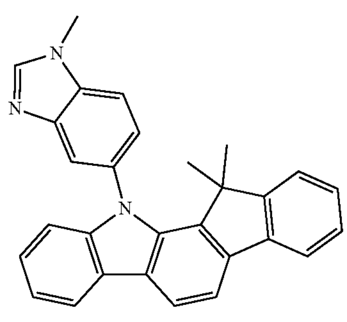
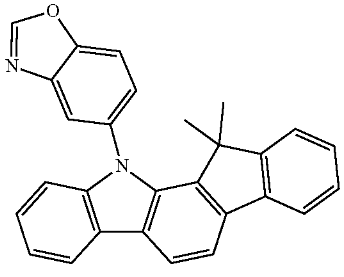
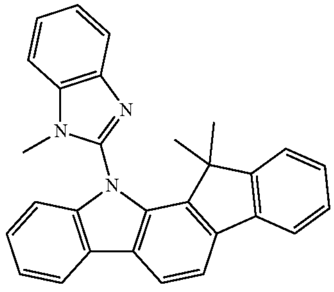
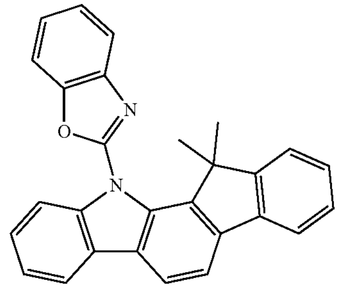

-continued
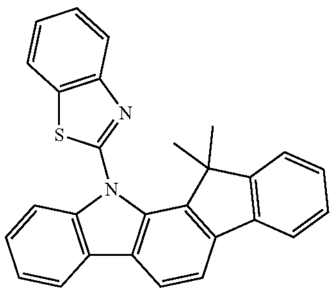
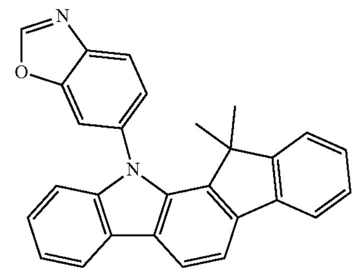
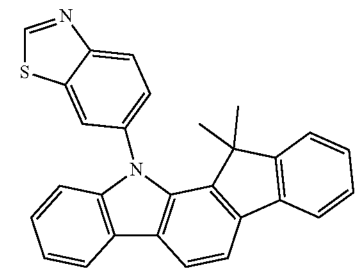
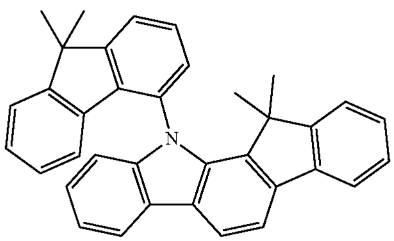
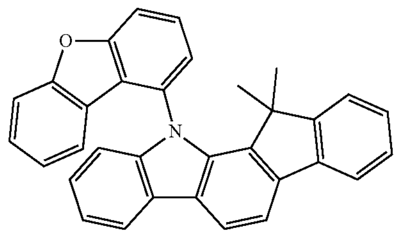
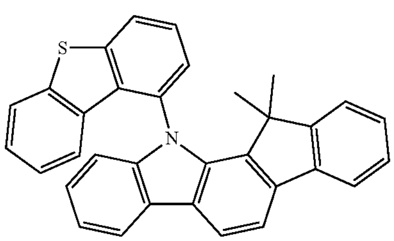
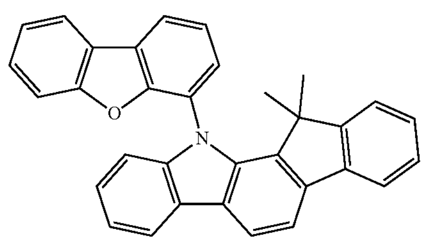
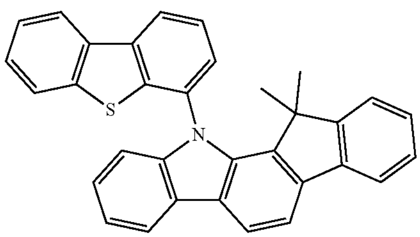
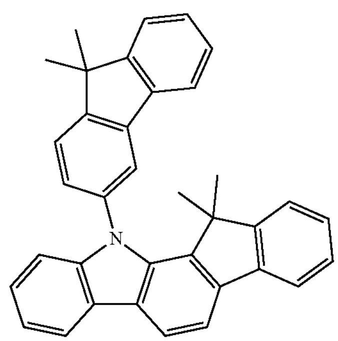
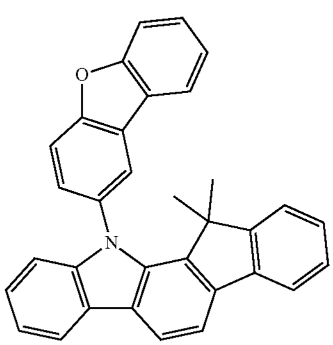
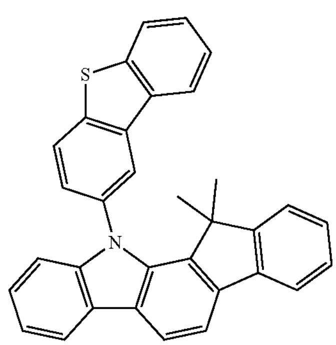
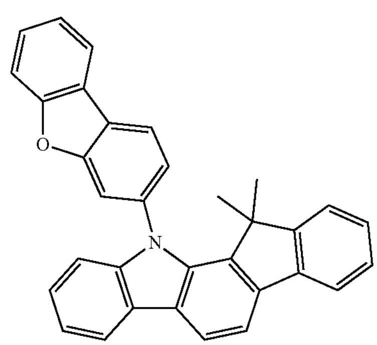

-continued
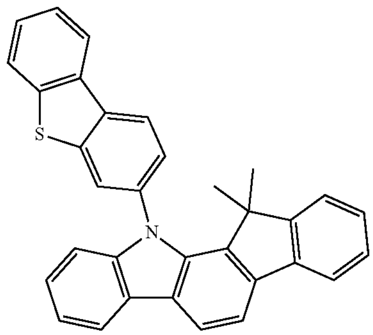
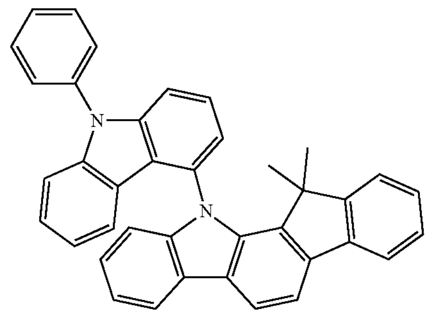
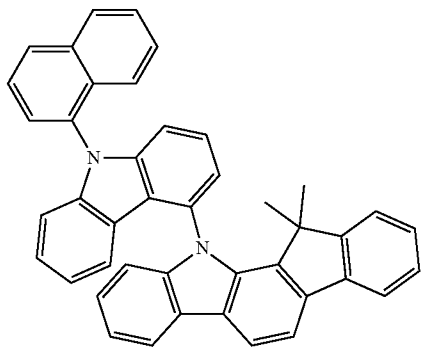
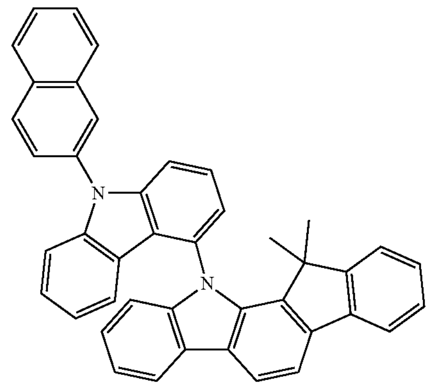
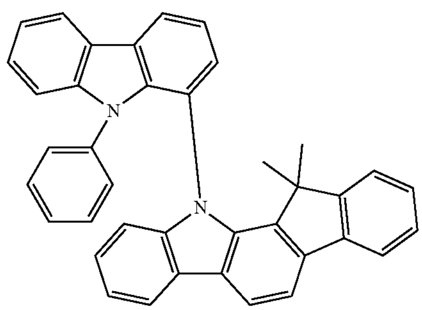
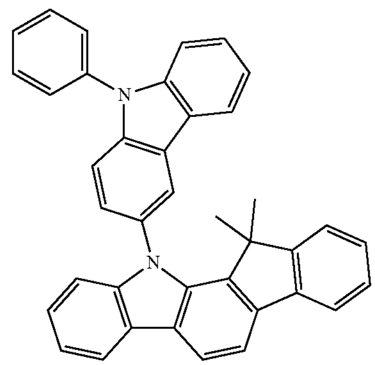
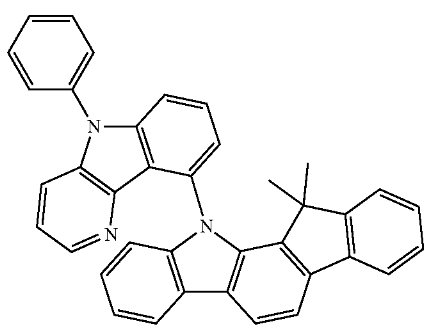
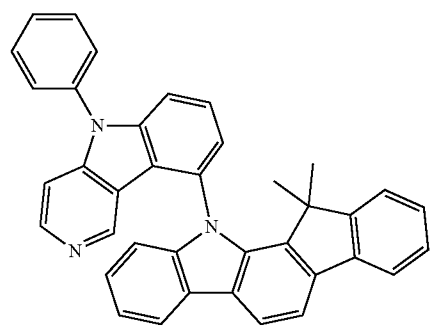
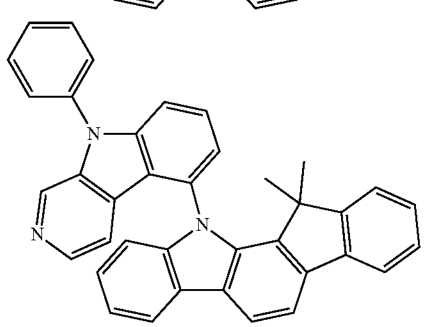
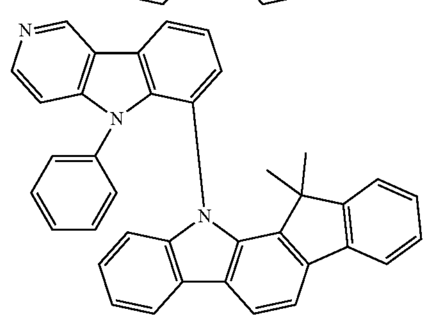

-continued
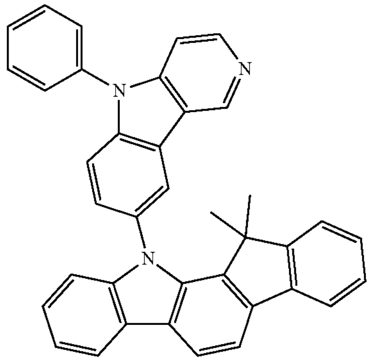
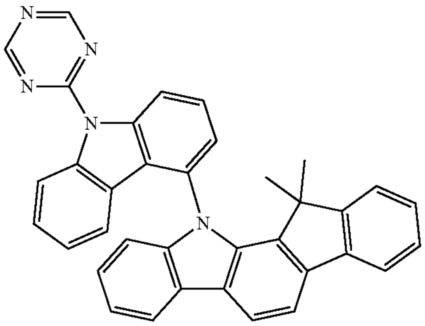
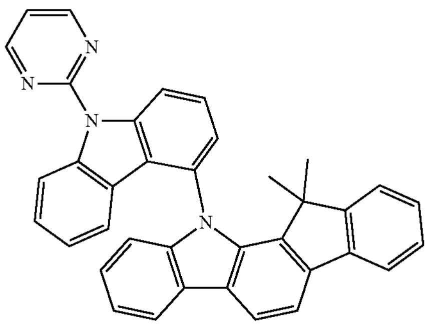
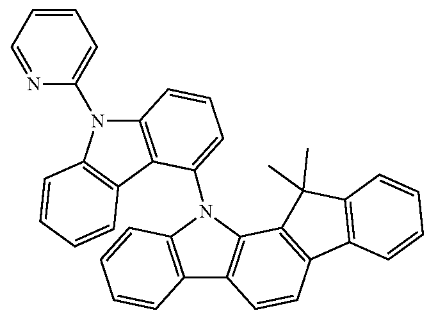
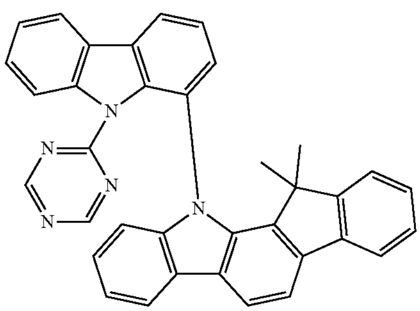
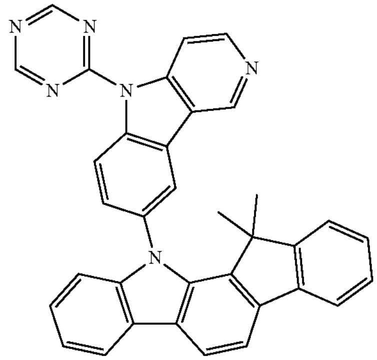
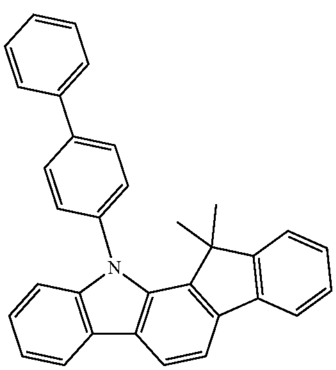
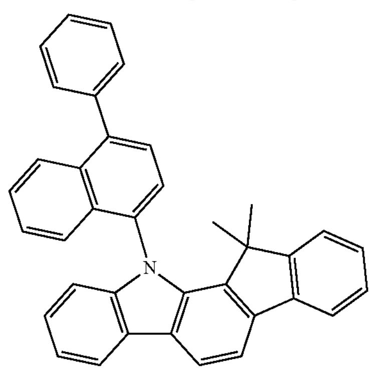
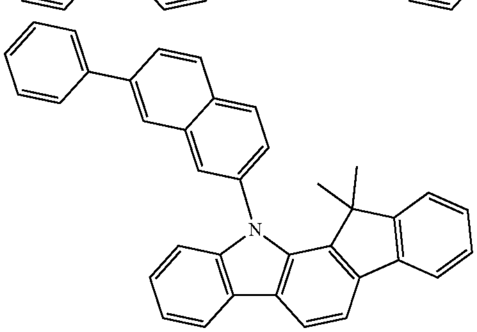
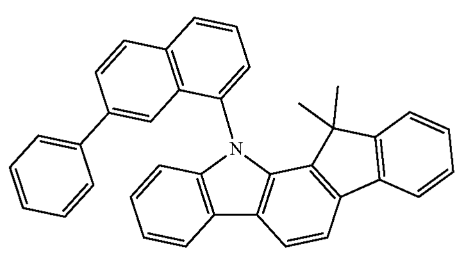

-continued
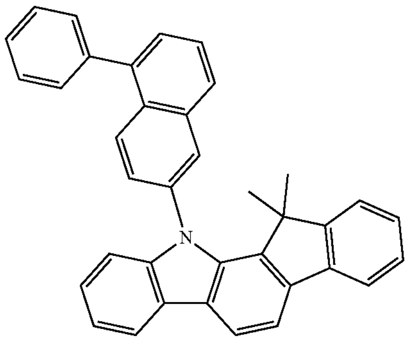
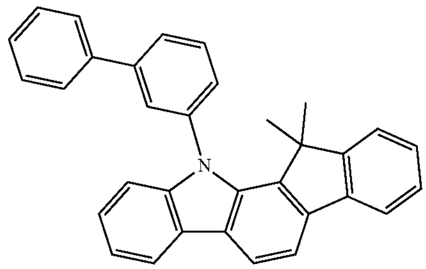
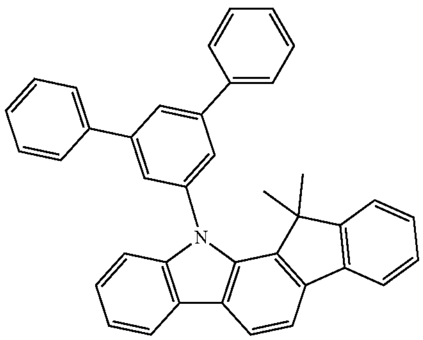
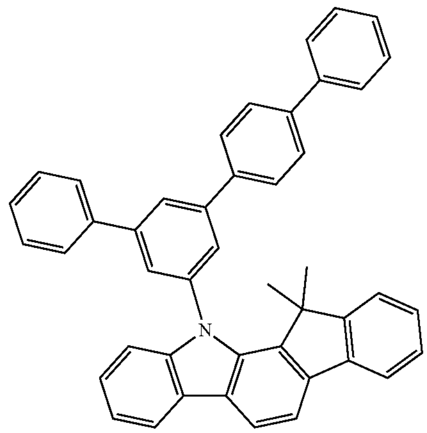
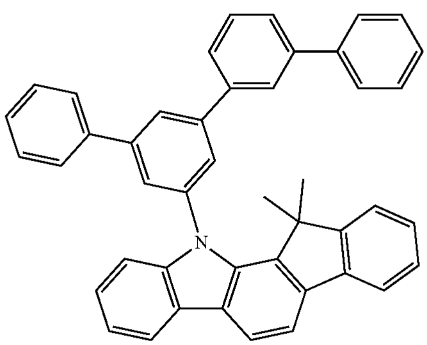
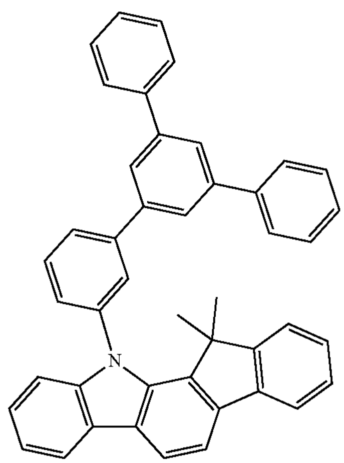
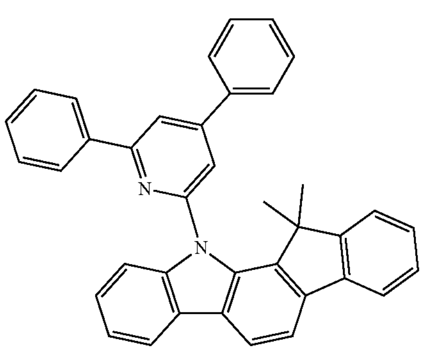
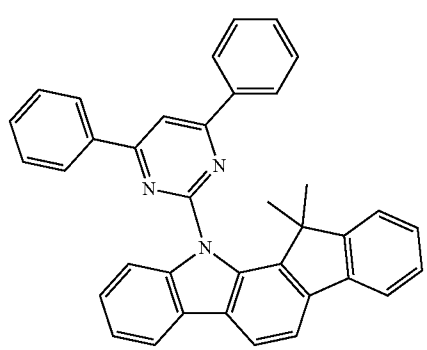

-continued
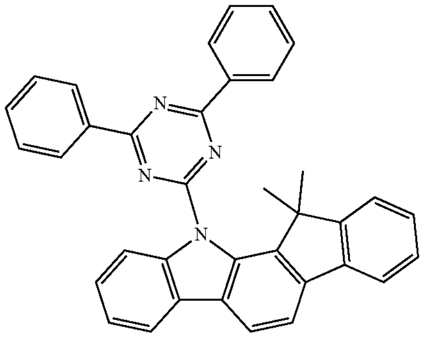
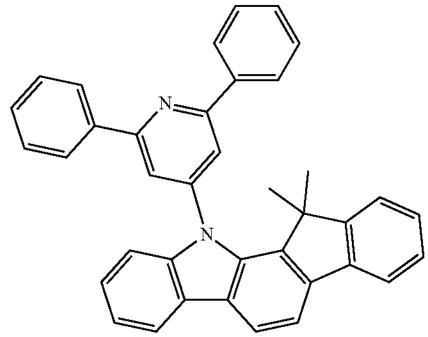
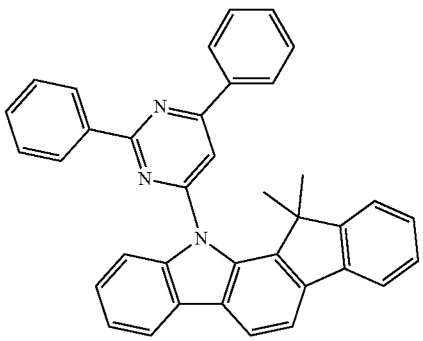
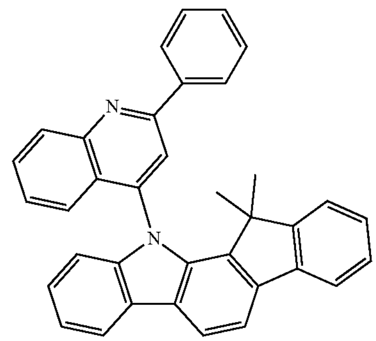
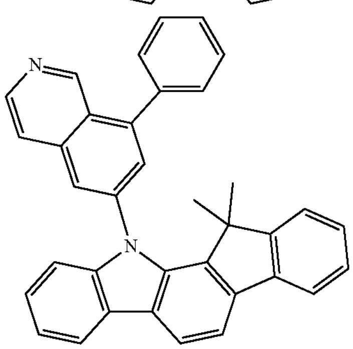
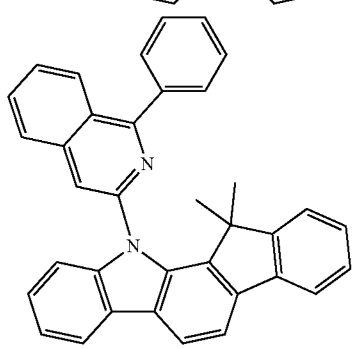
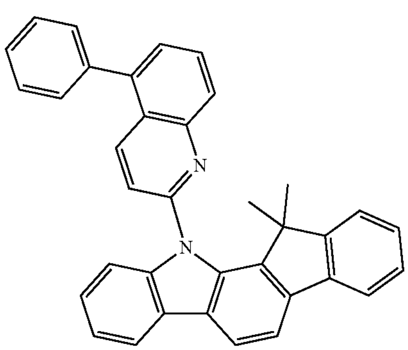
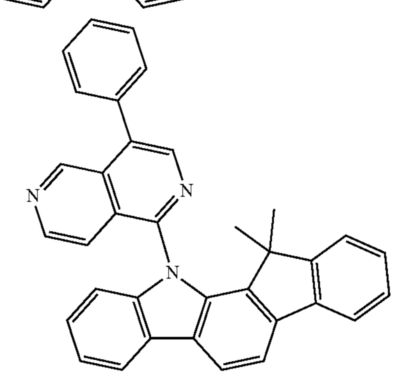
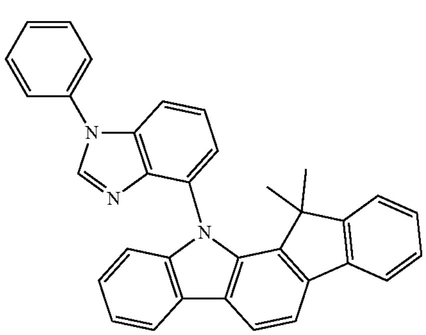
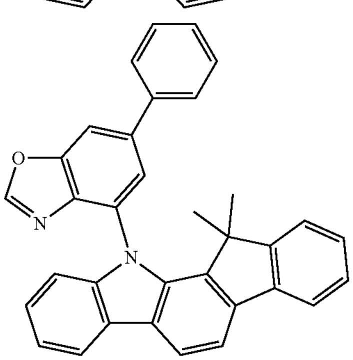

-continued
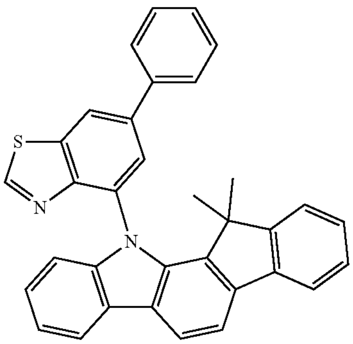
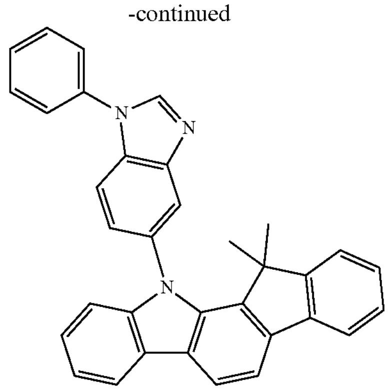
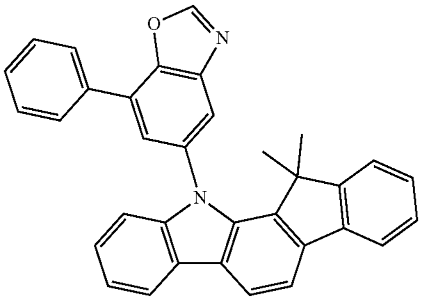
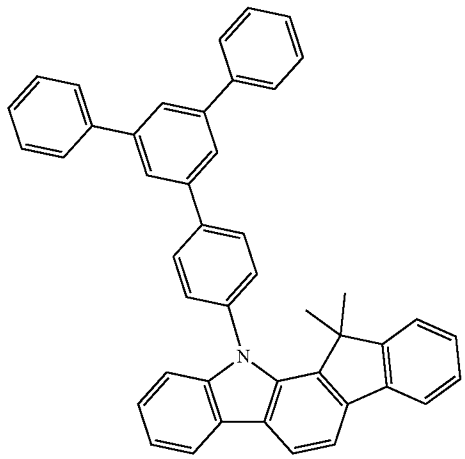
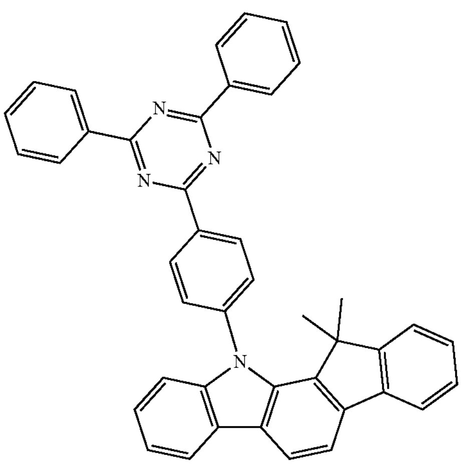
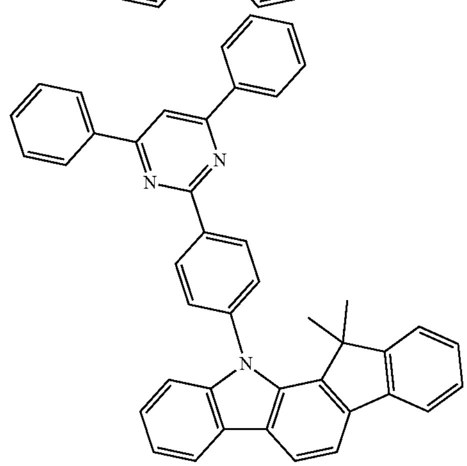
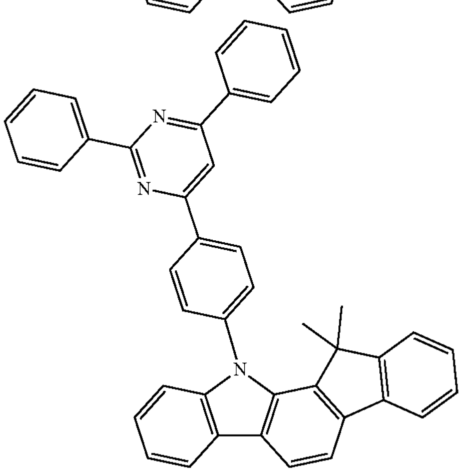
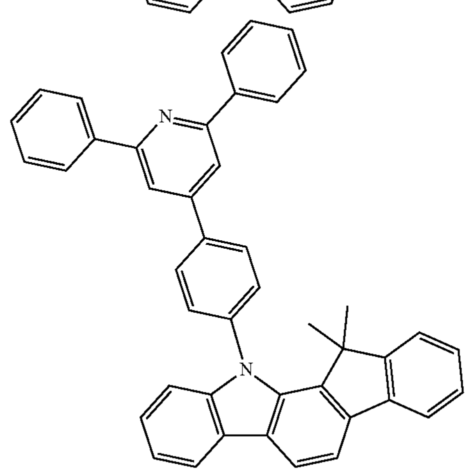

-continued
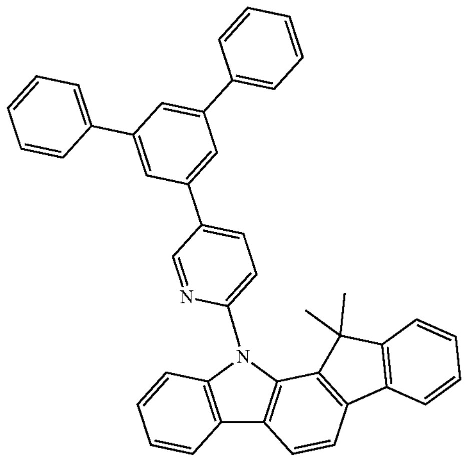
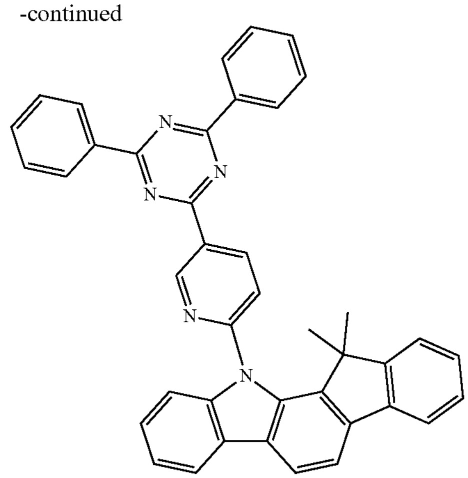
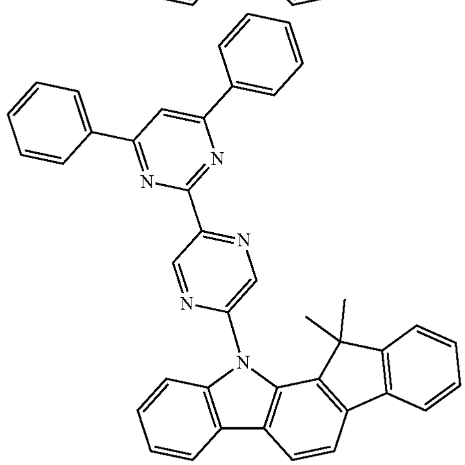
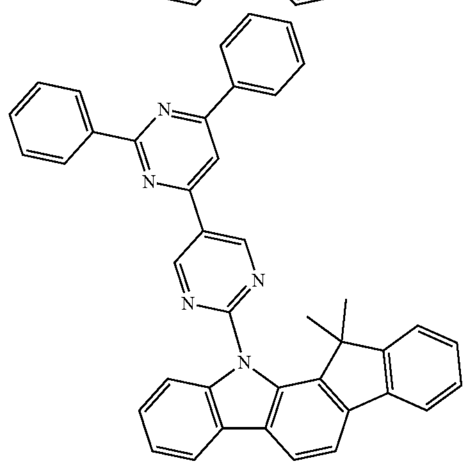
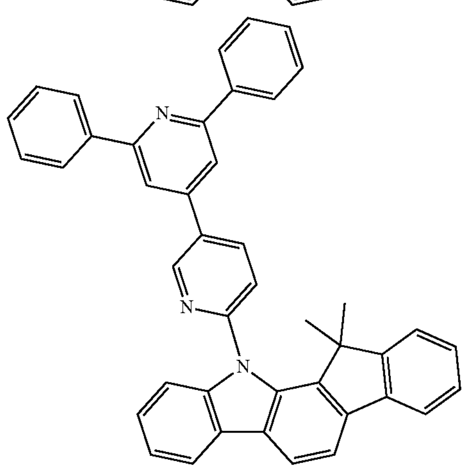
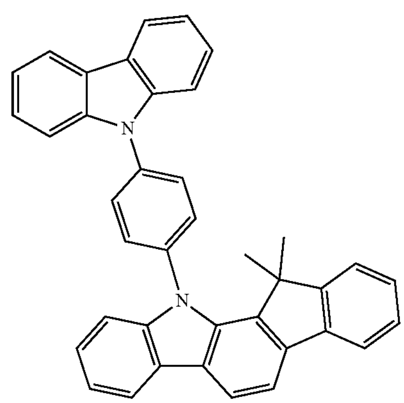
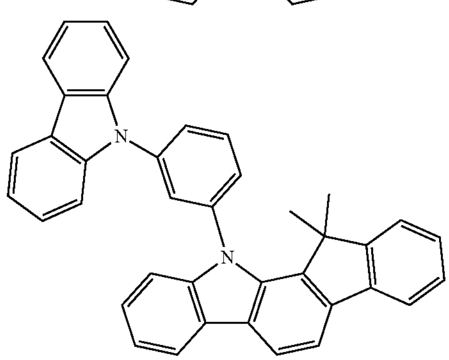
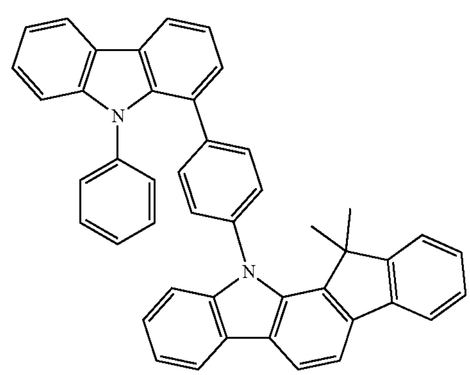

-continued
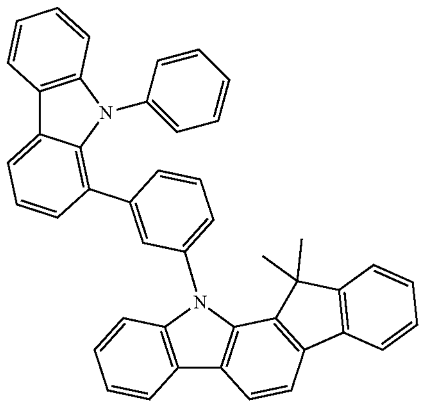
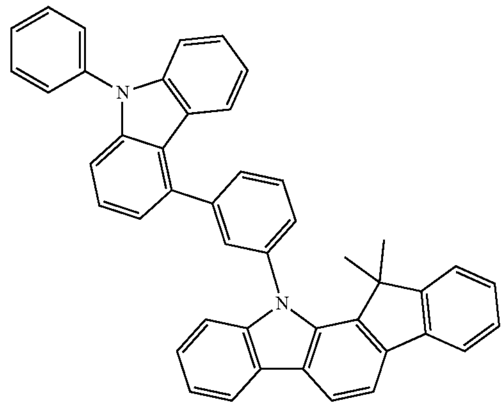
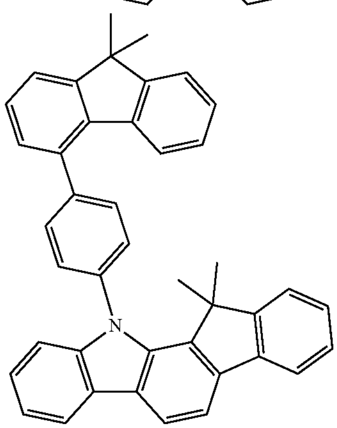
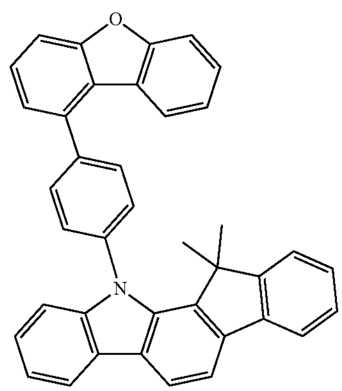
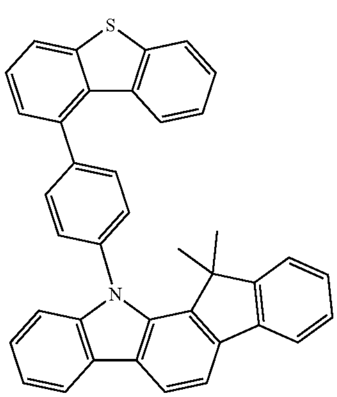
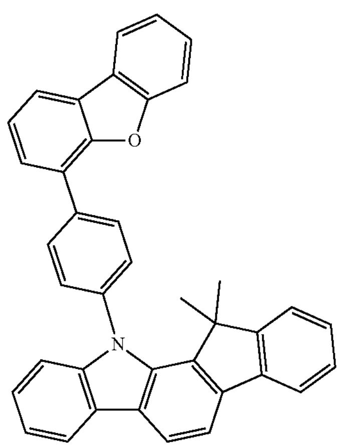
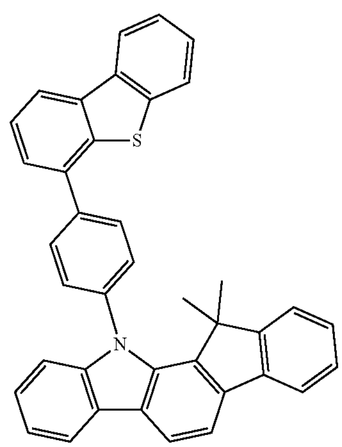
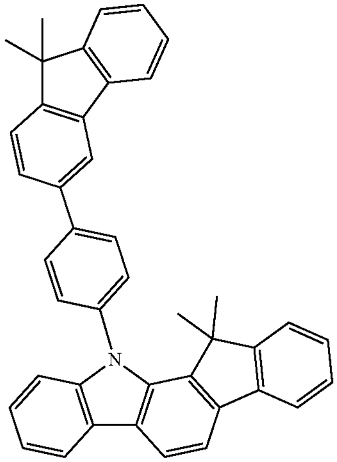
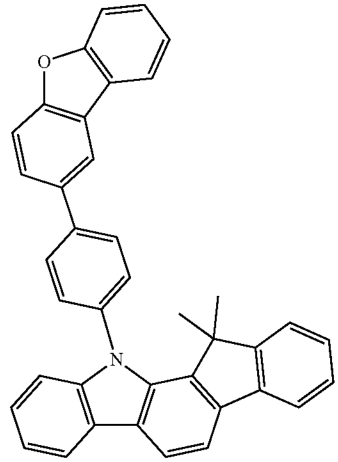
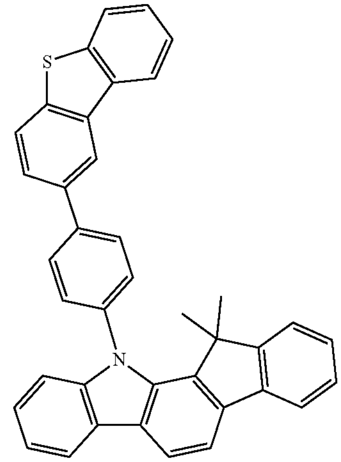

-continued
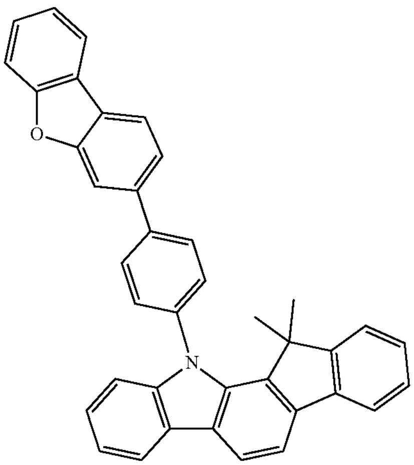
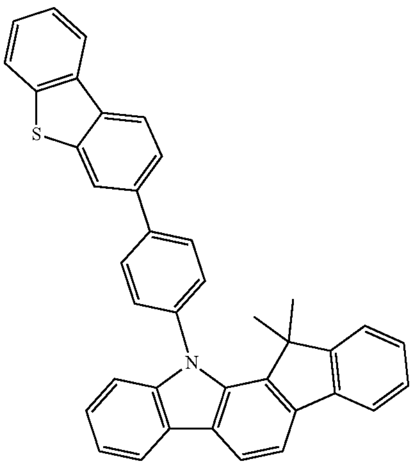
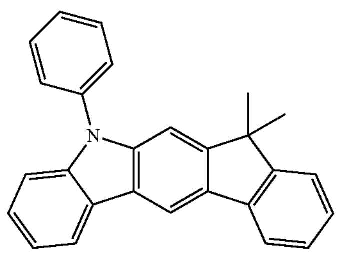
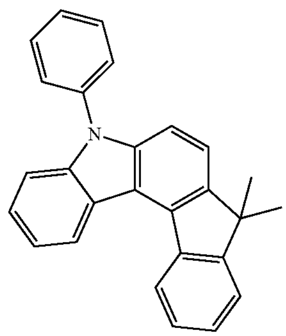
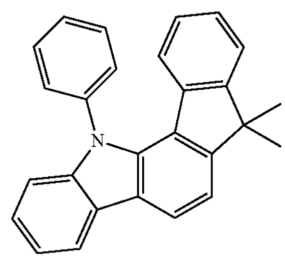
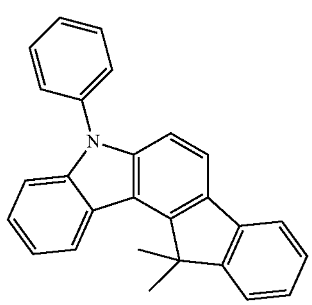
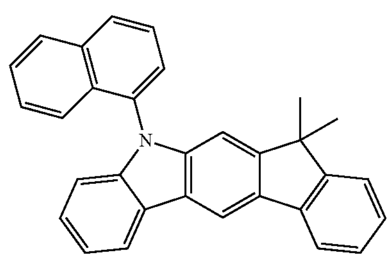
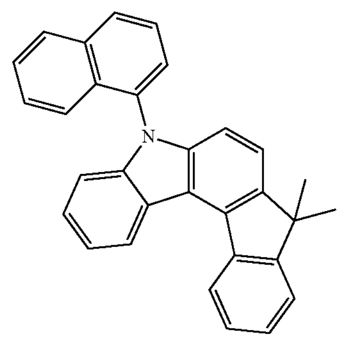
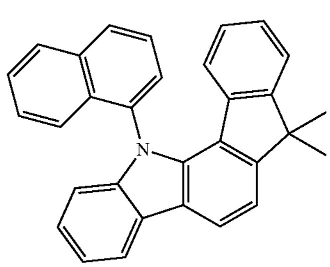
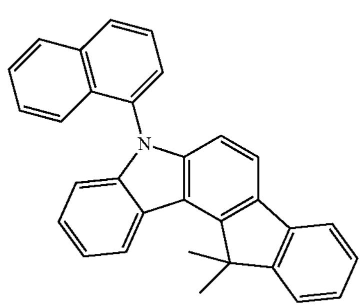
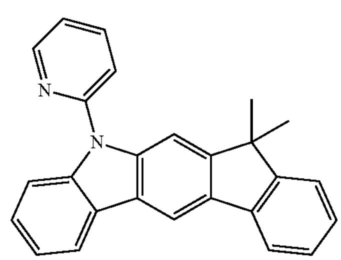

-continued
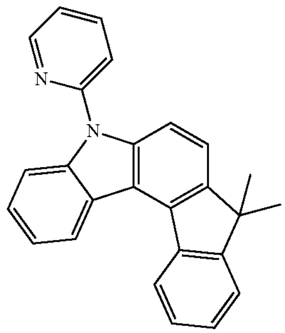
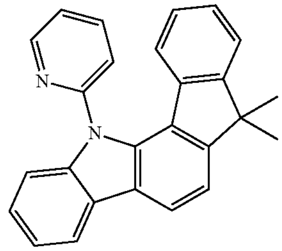
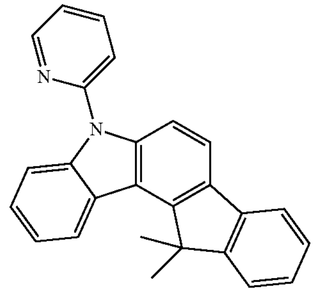
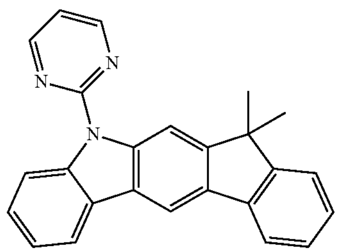
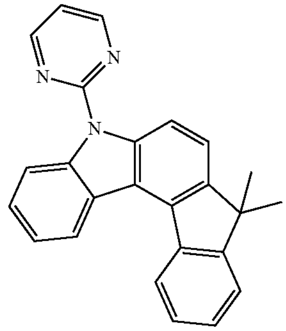
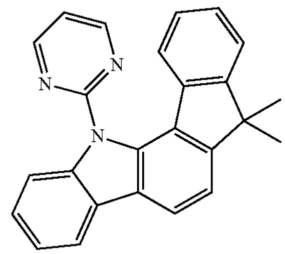
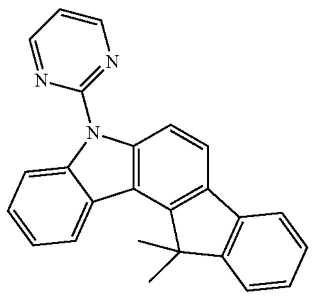
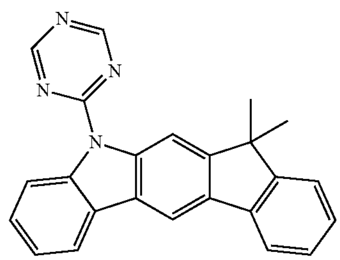
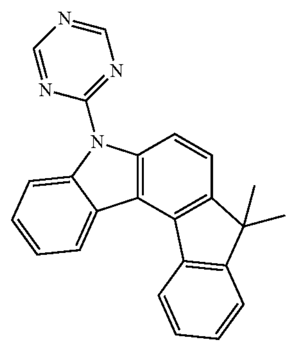
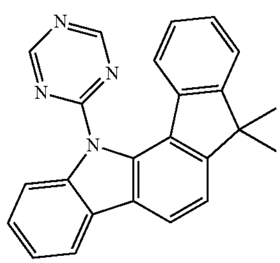
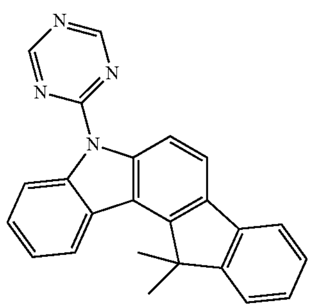
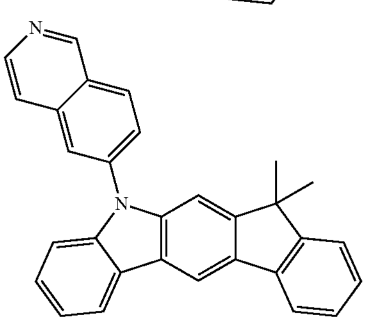
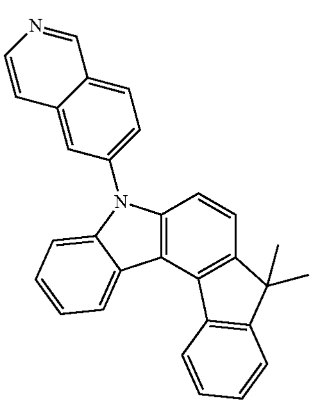
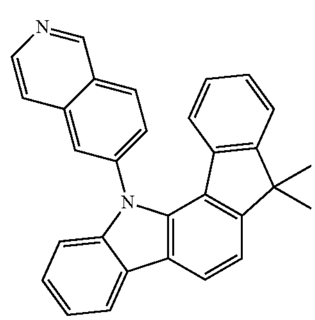
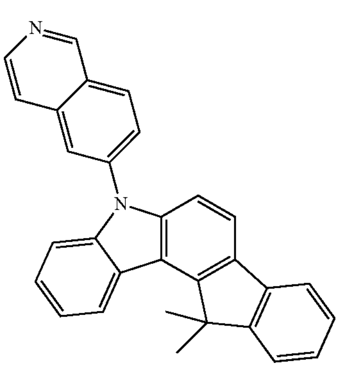

-continued
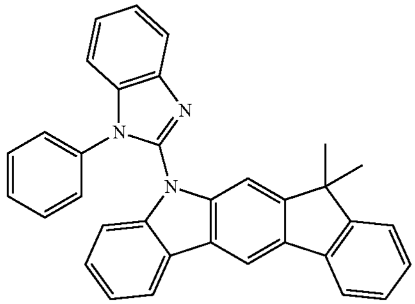
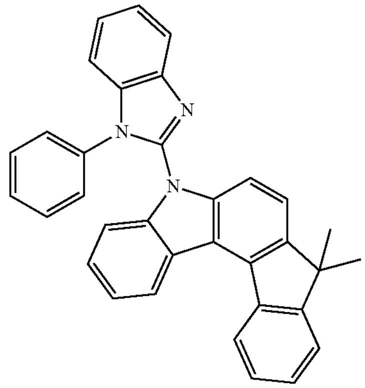
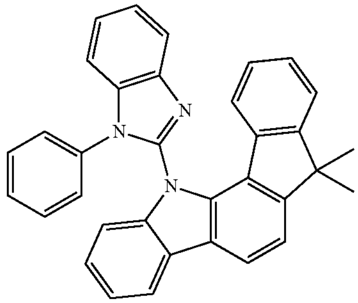
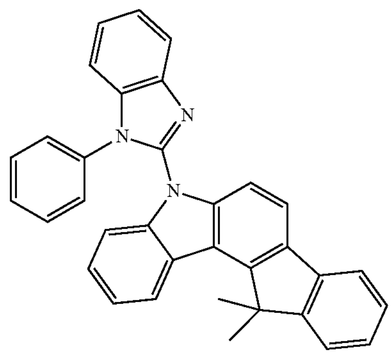
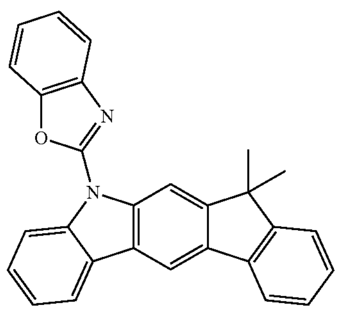
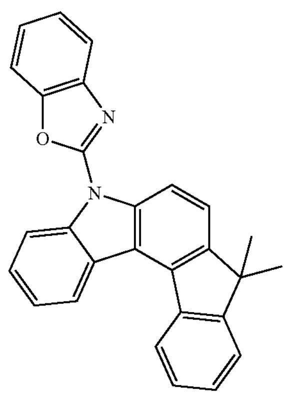
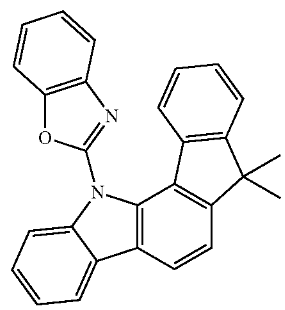
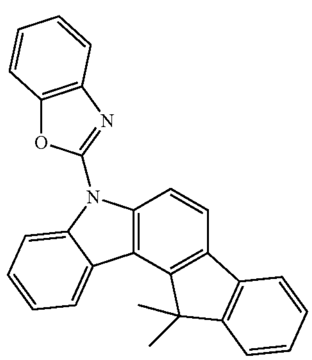
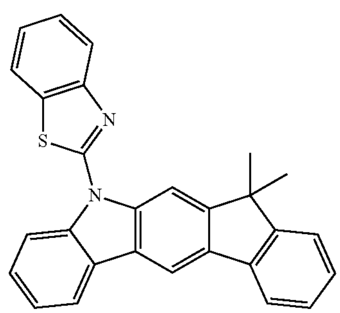
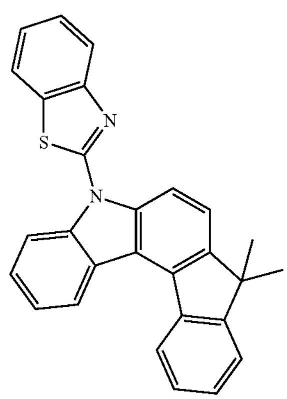

-continued
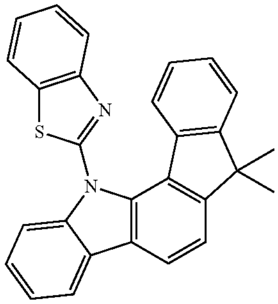
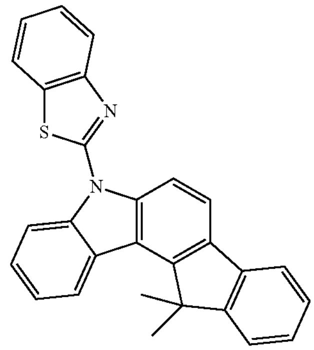
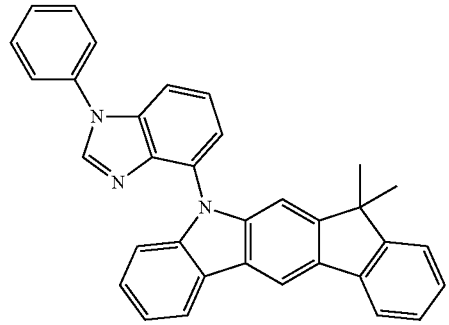
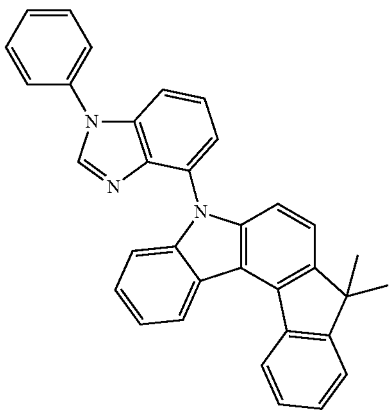
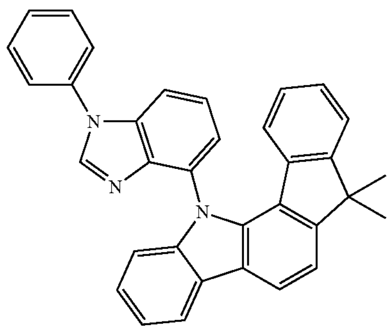
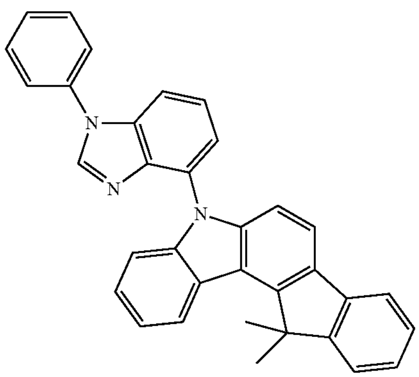
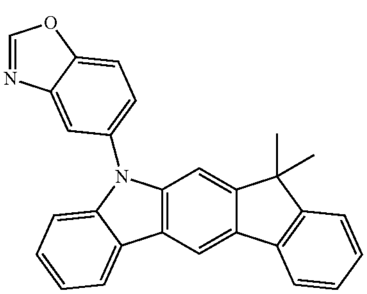
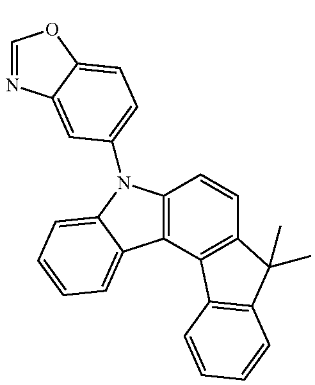
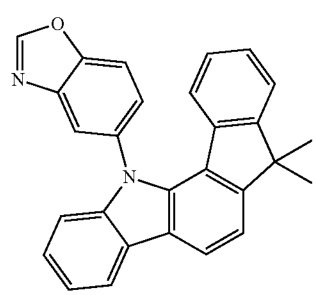
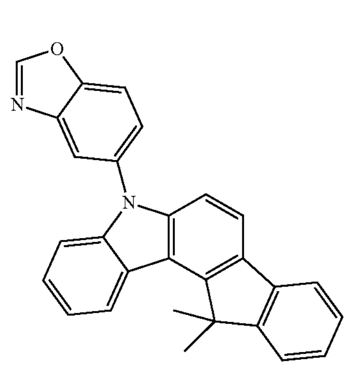

-continued
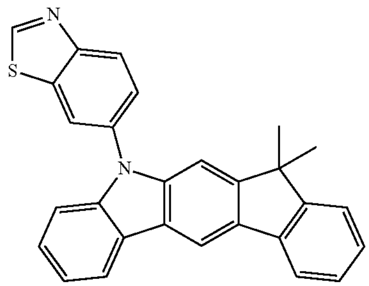
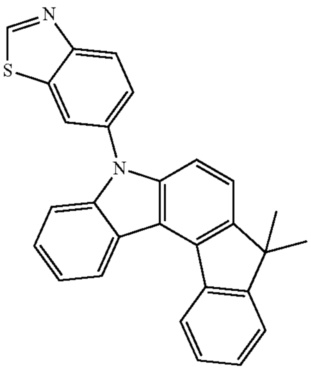
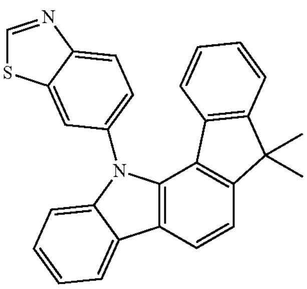
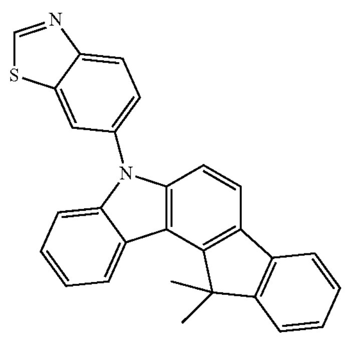
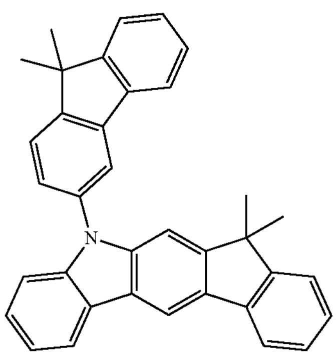
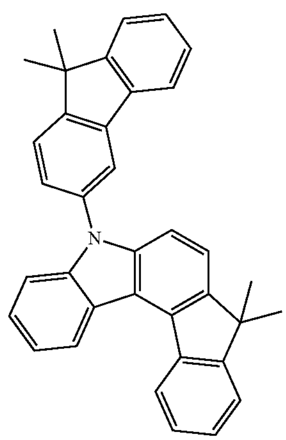
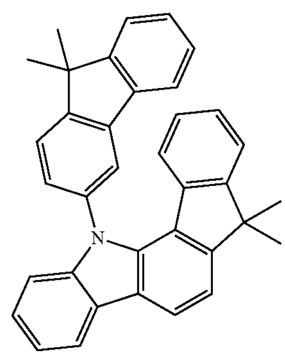
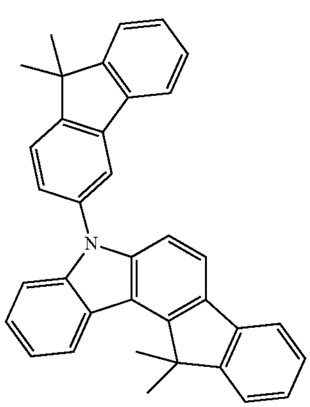
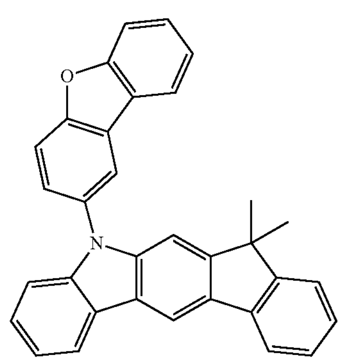
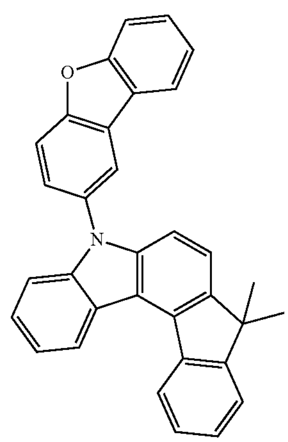

-continued
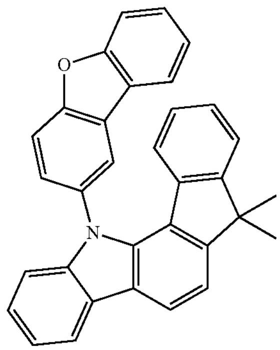
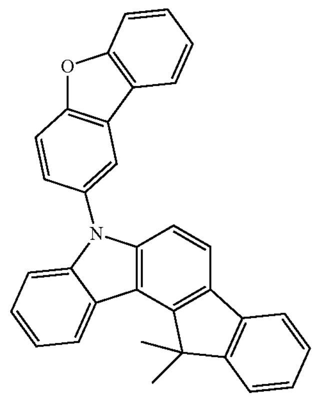
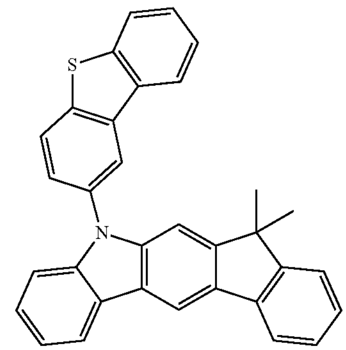
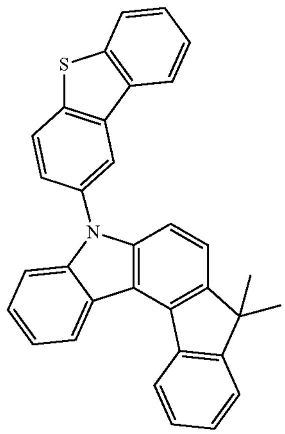
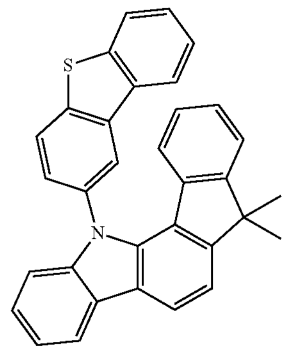
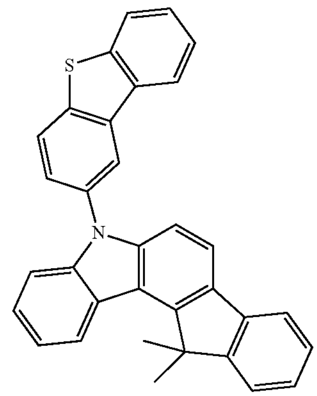
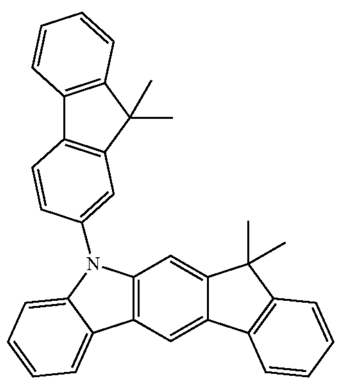
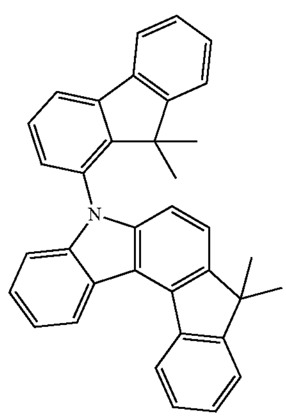
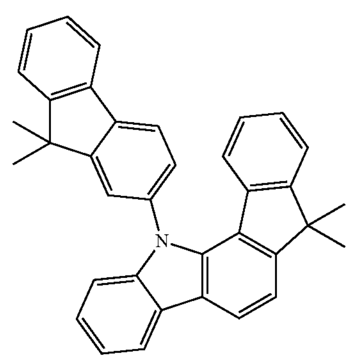
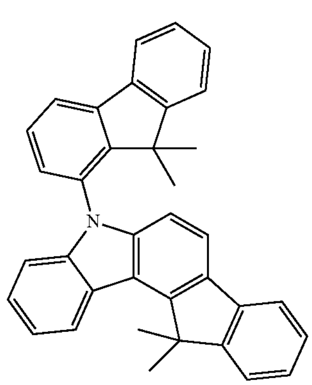
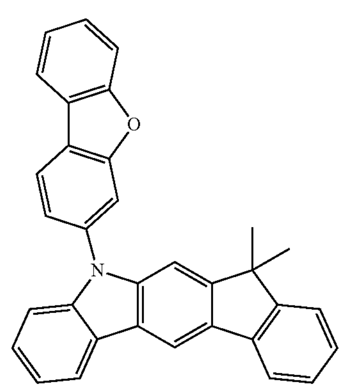
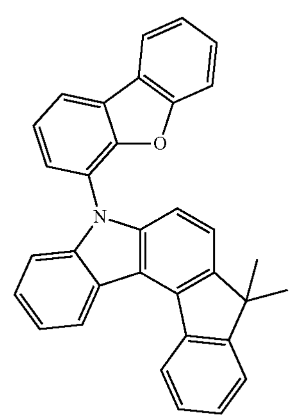

-continued
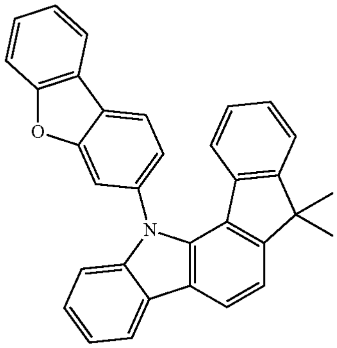
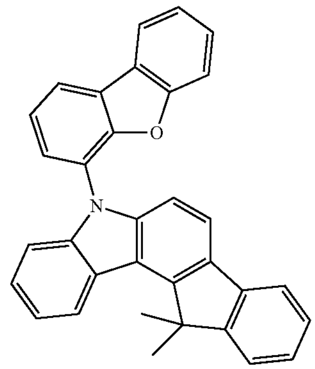
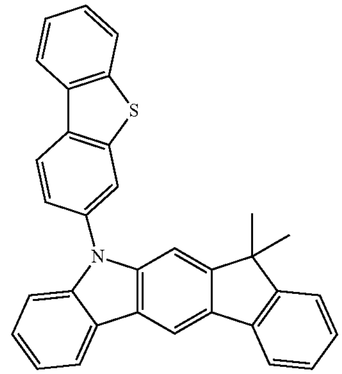
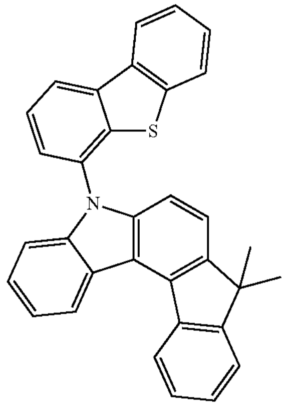
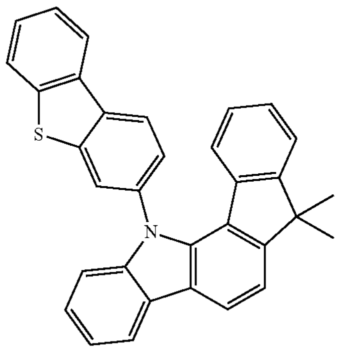
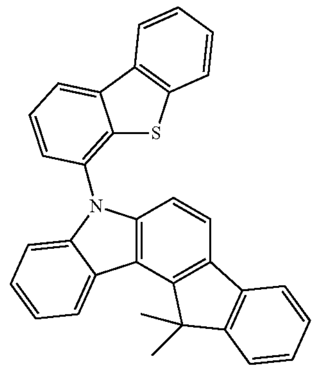
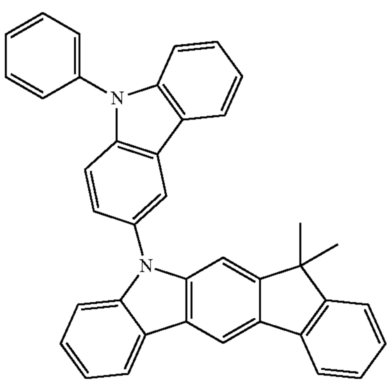
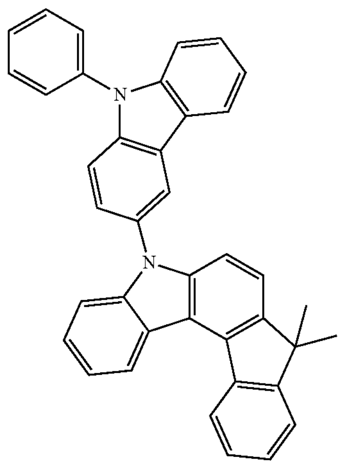
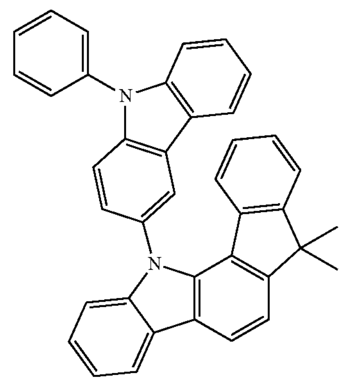
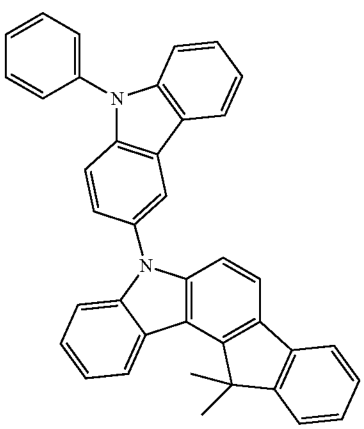
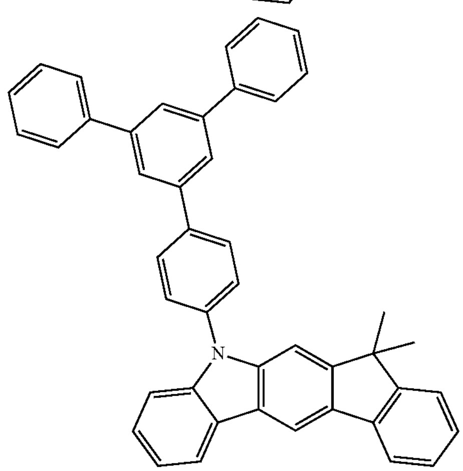

-continued
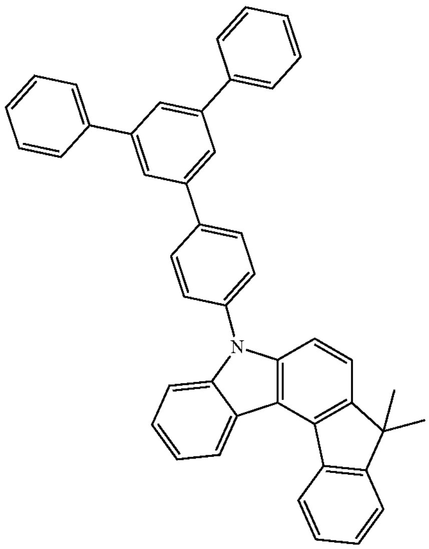
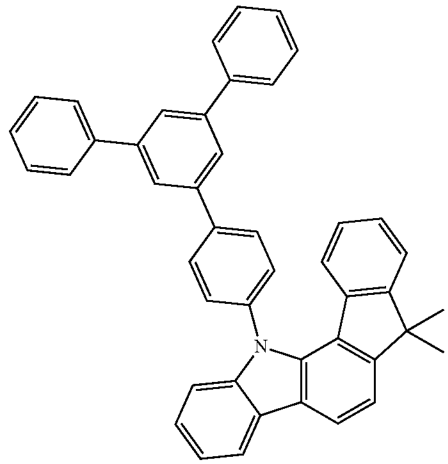
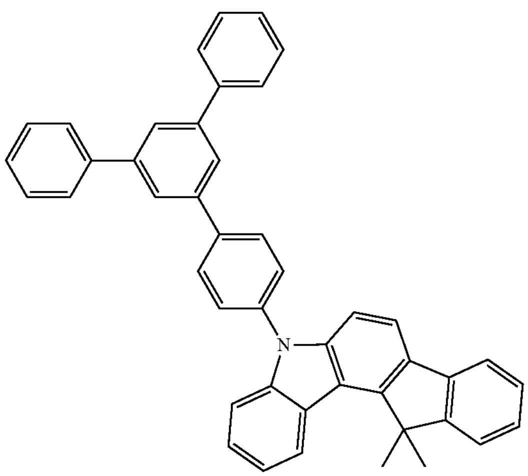
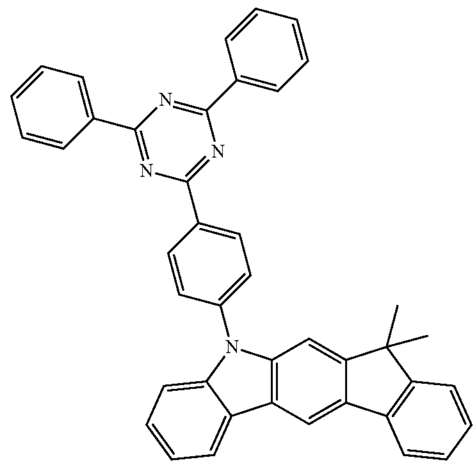
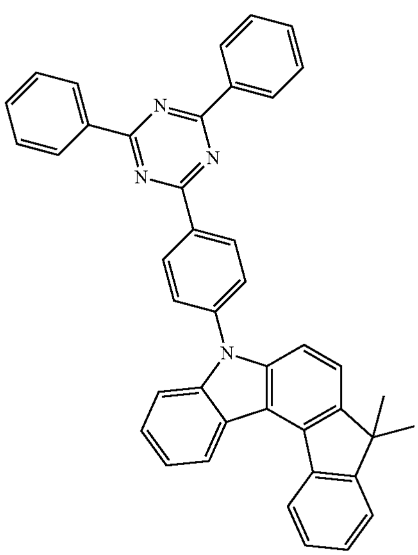
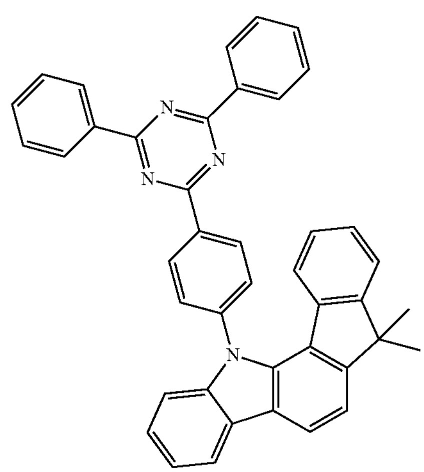

-continued
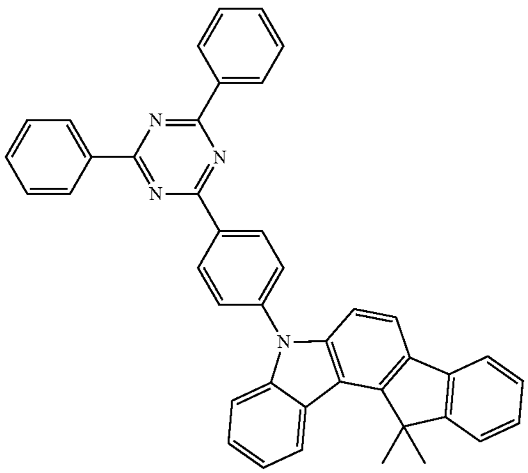
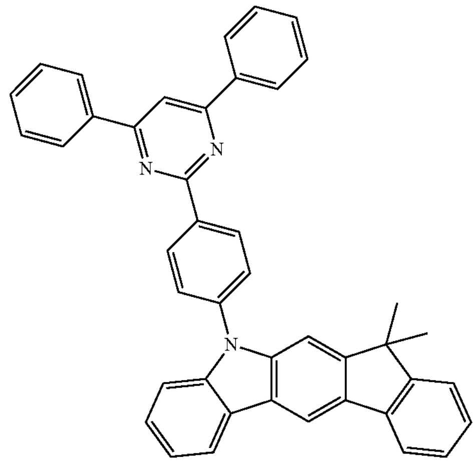
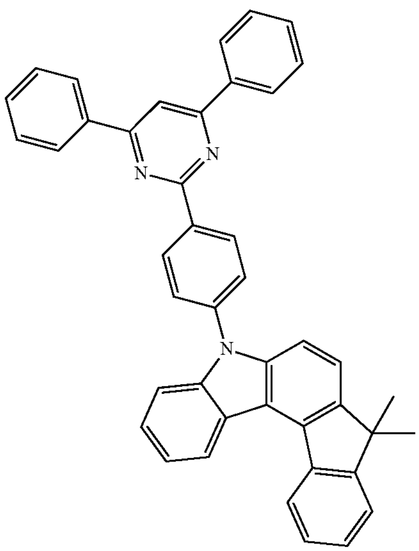
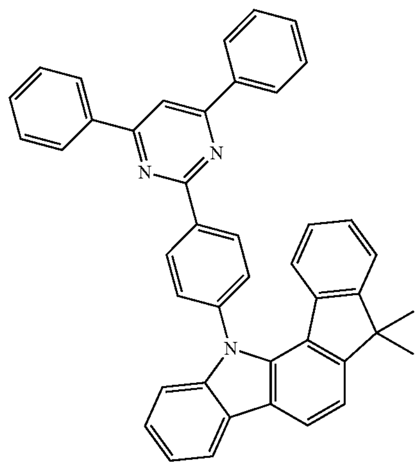
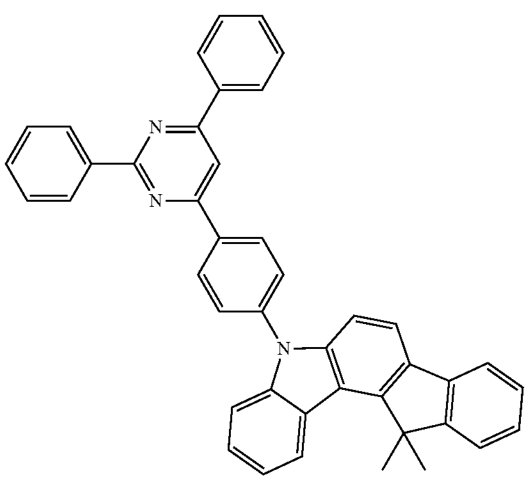
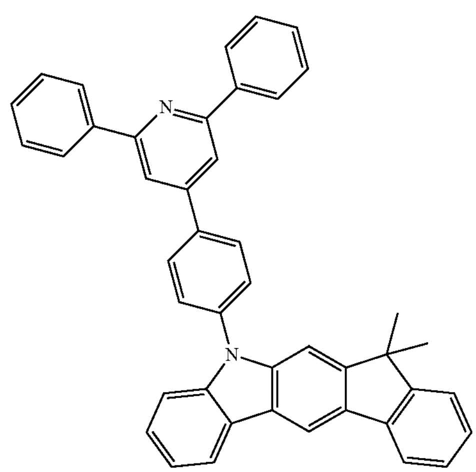

-continued
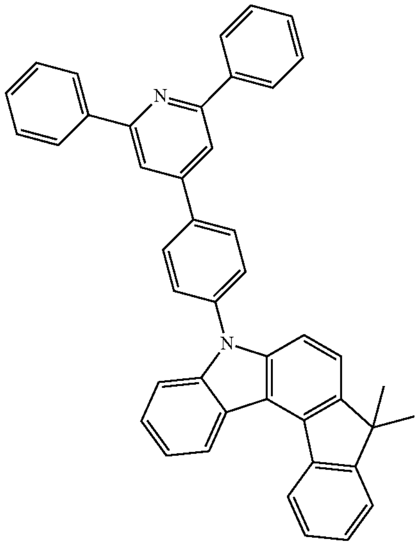
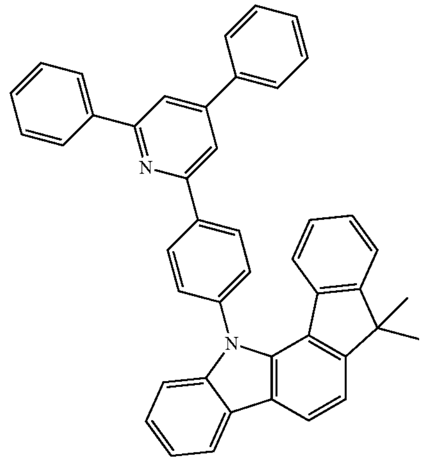
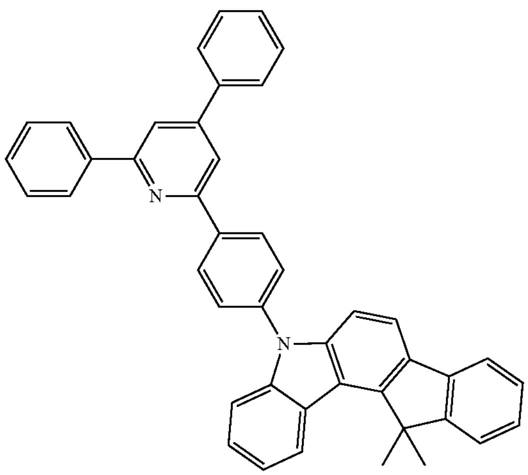
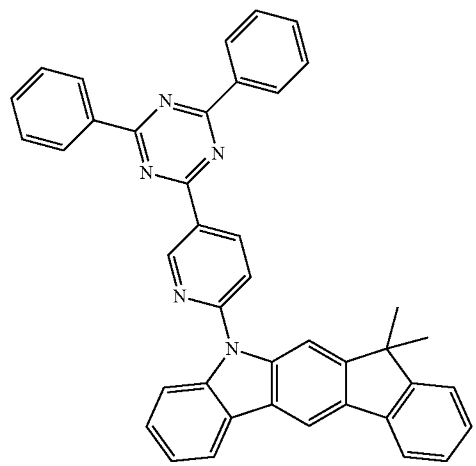
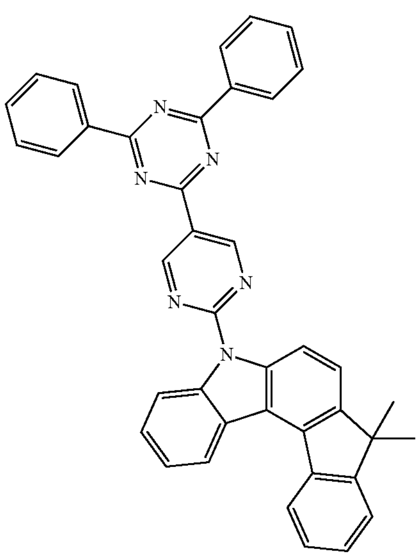
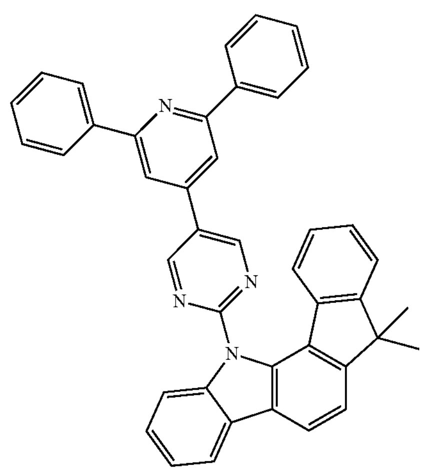

-continued
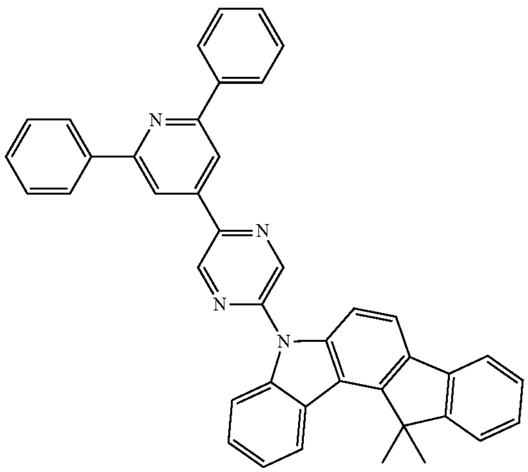
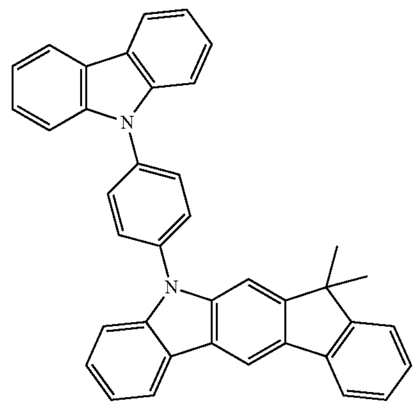
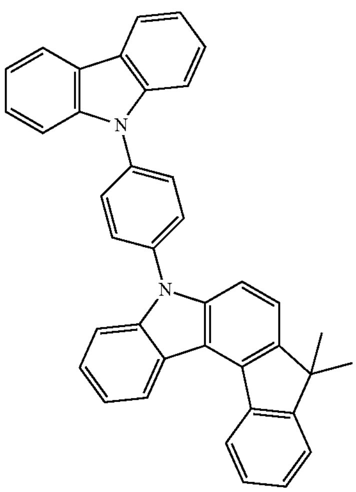
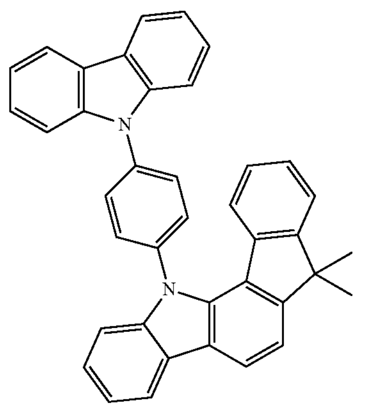
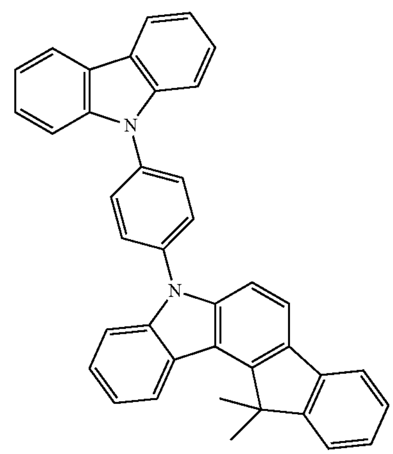
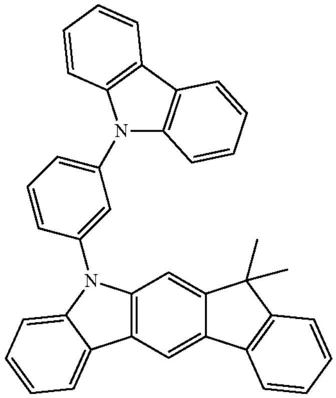
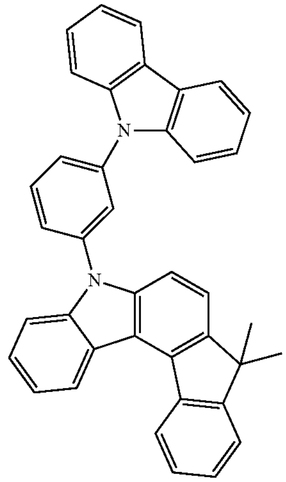
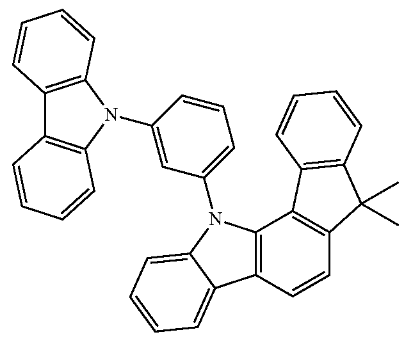

-continued
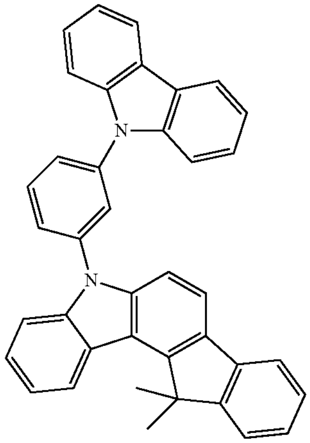
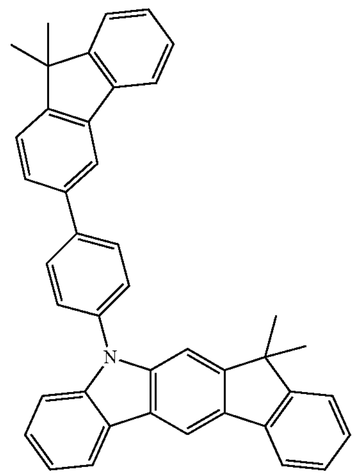
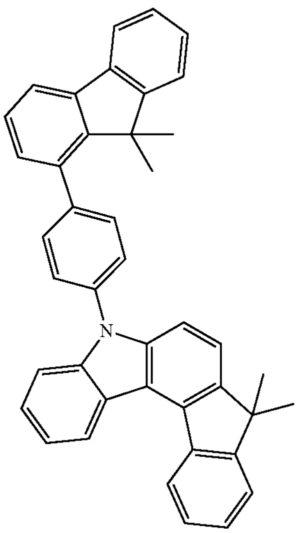
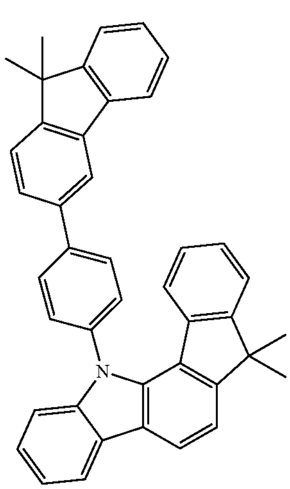
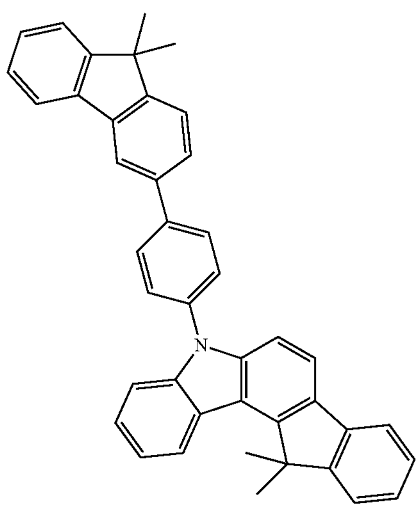
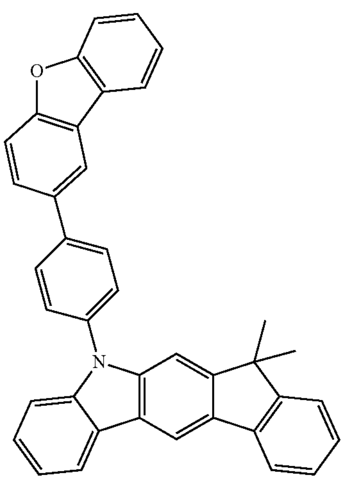
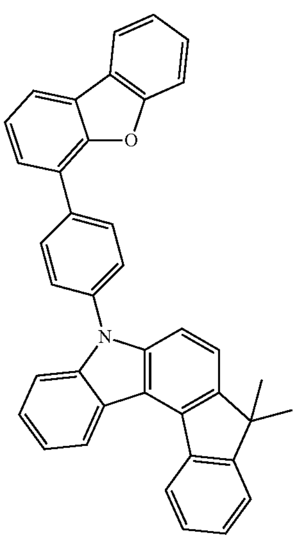
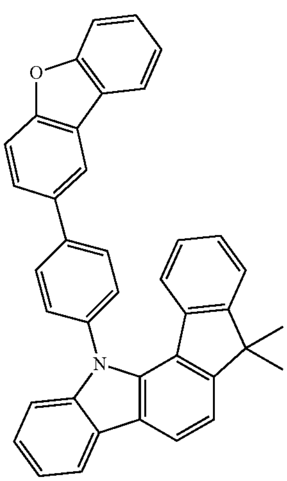
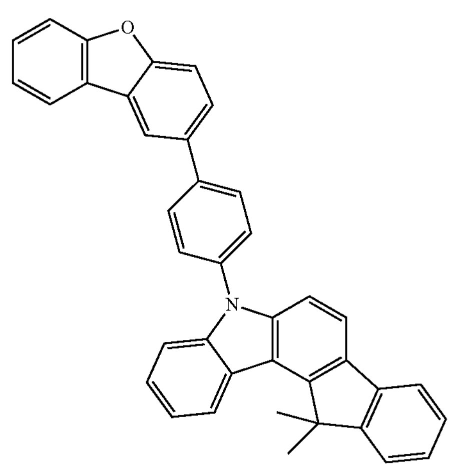

-continued
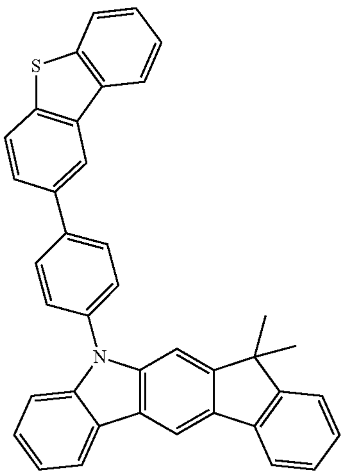
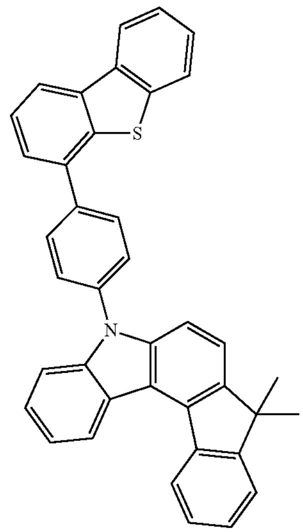
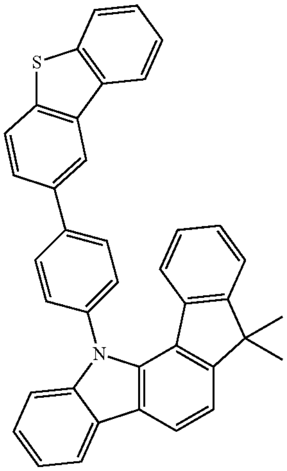
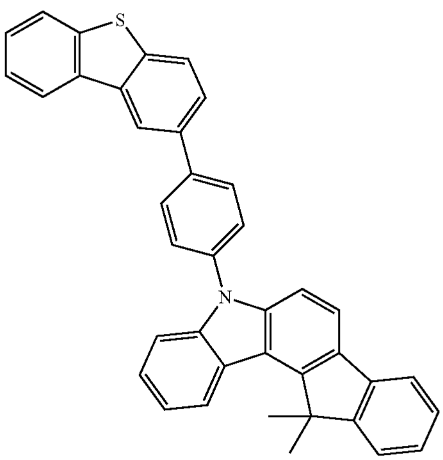
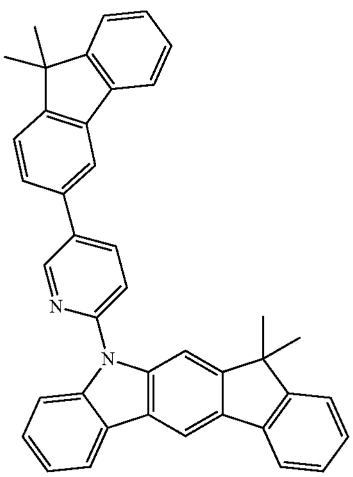
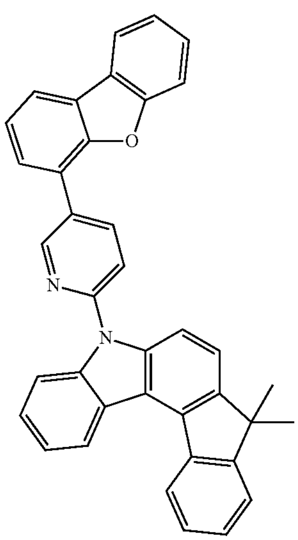
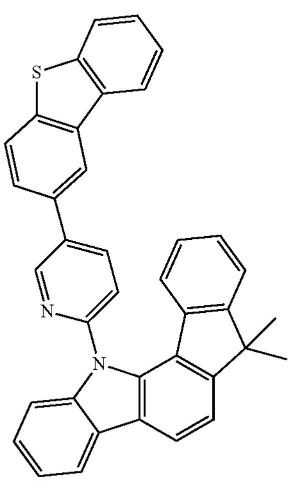
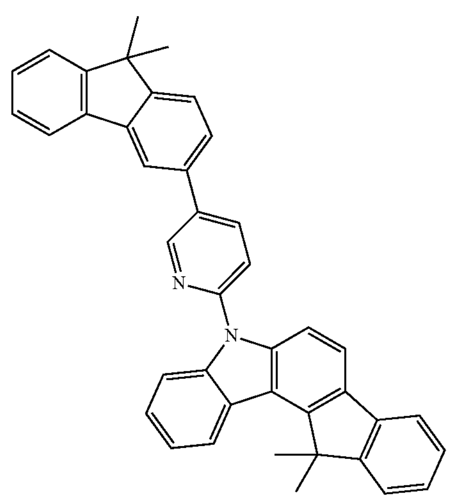

-continued
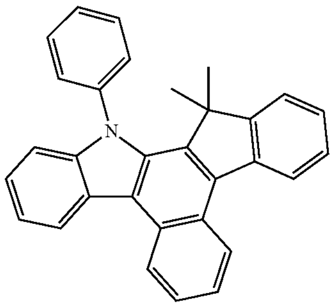
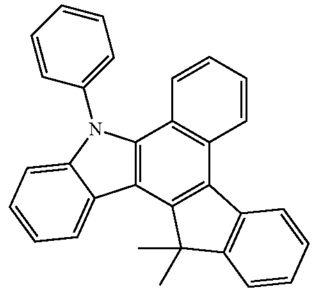
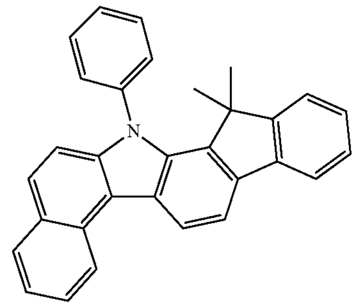
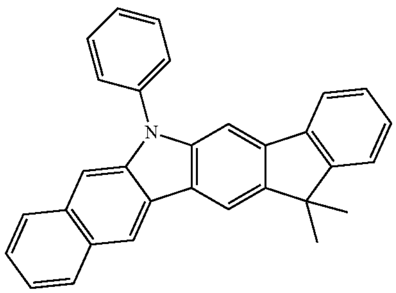
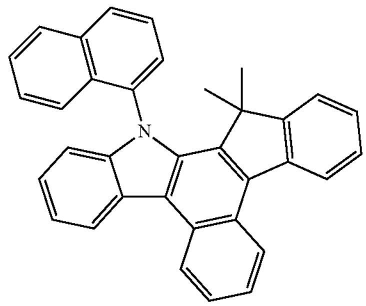
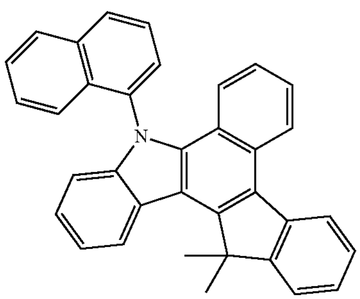
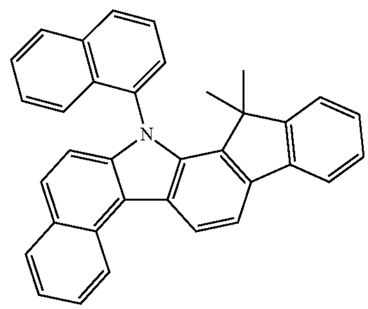
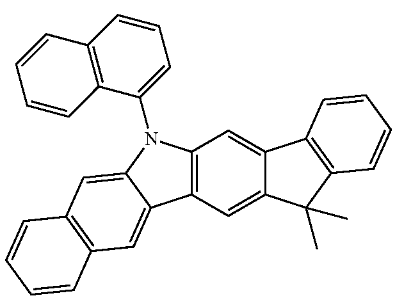
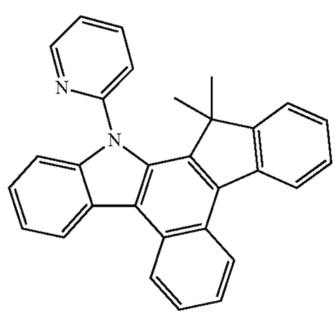
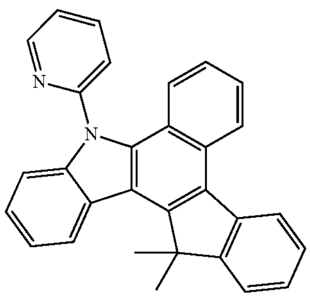
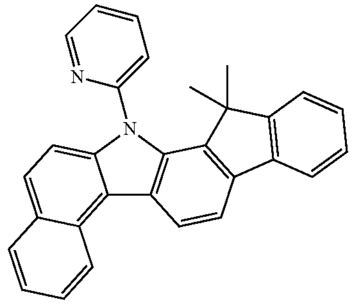
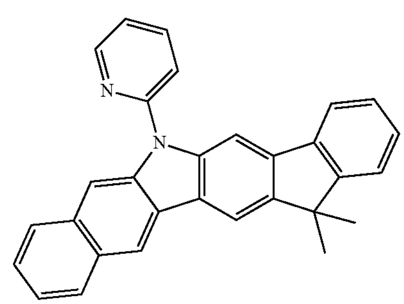

-continued
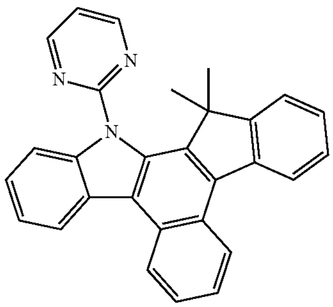
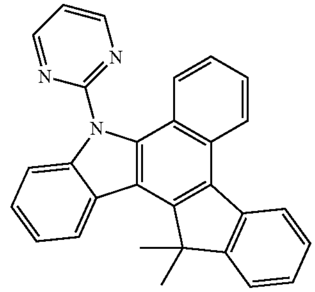
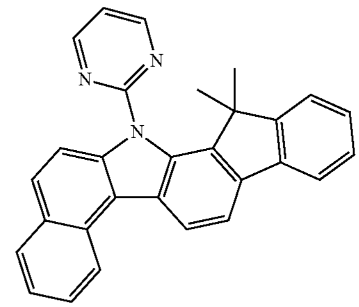
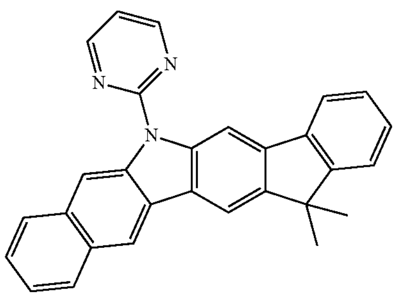
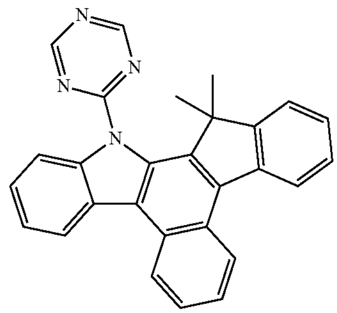
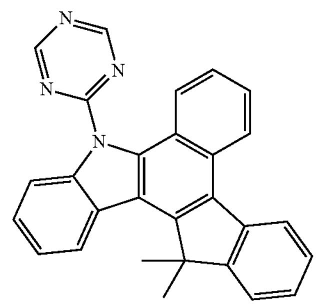
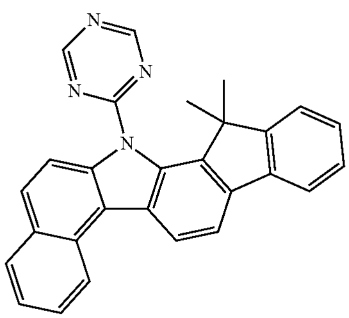
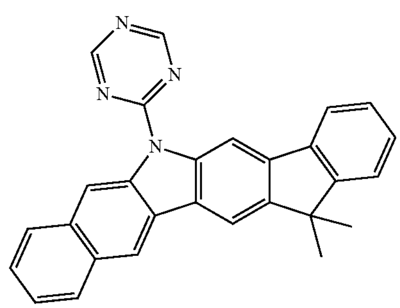
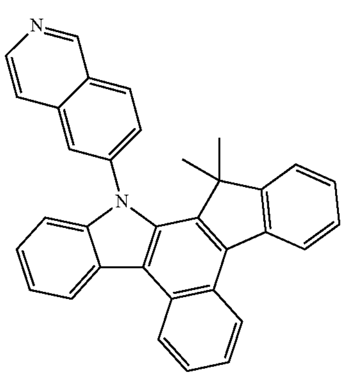
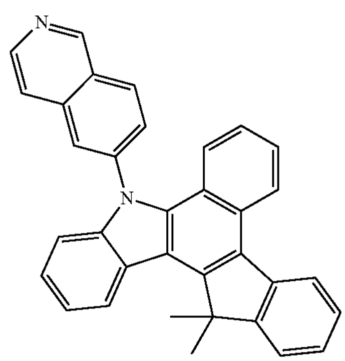
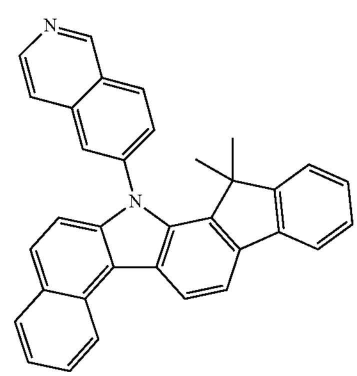
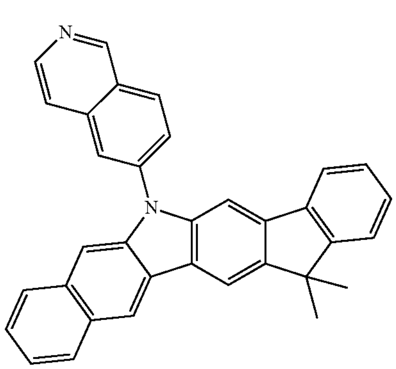
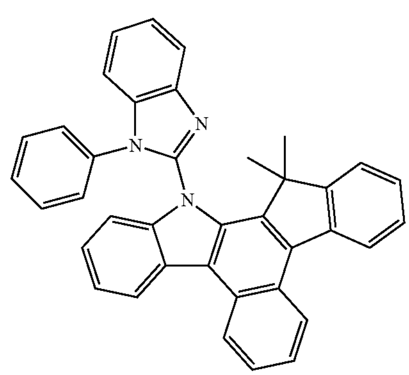

-continued
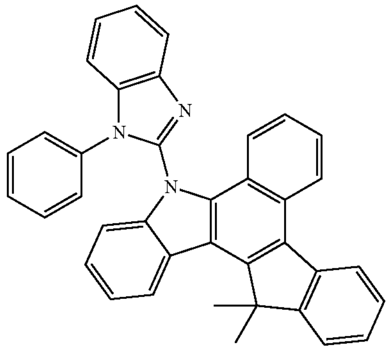
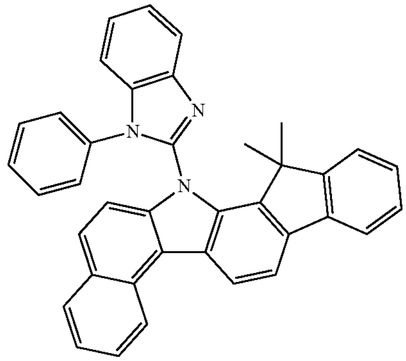
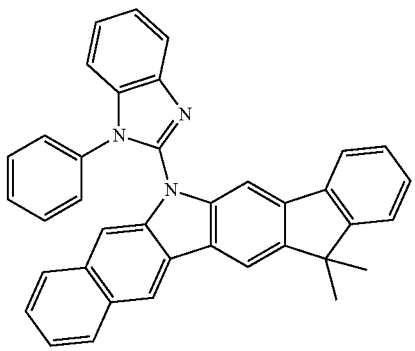
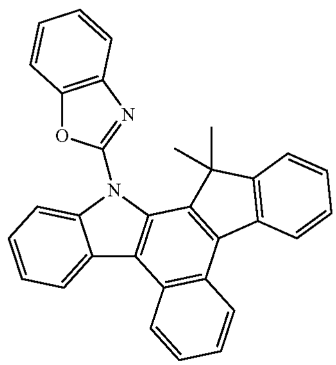
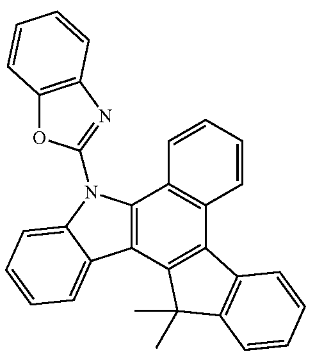
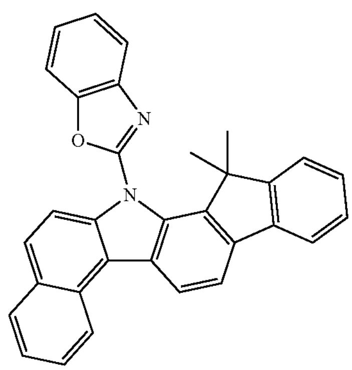
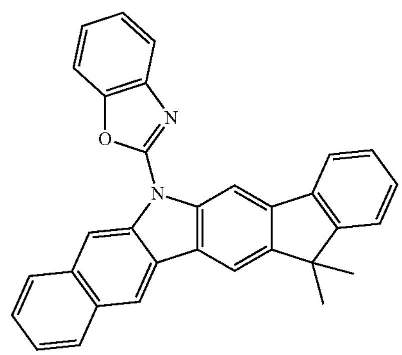
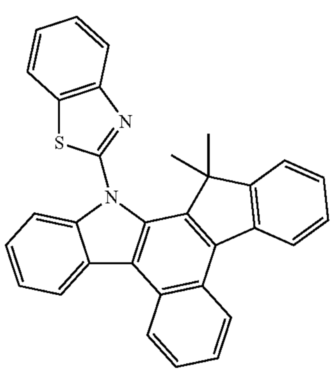
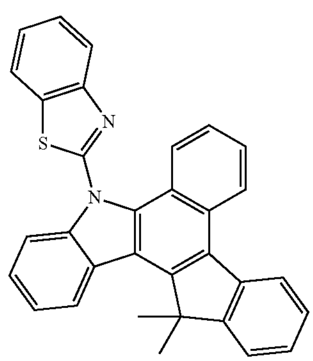
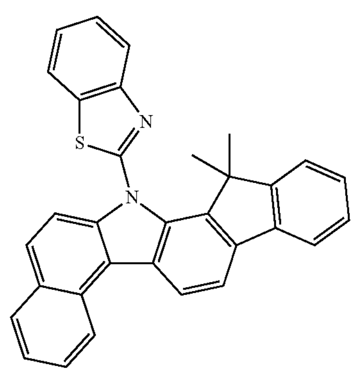

-continued
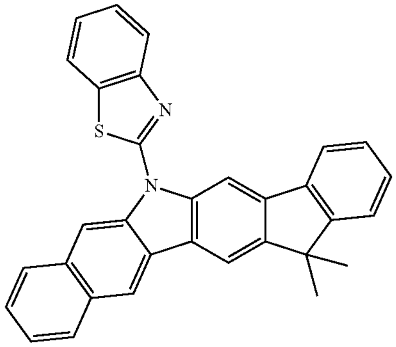
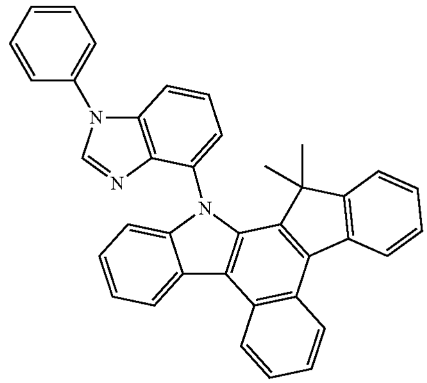
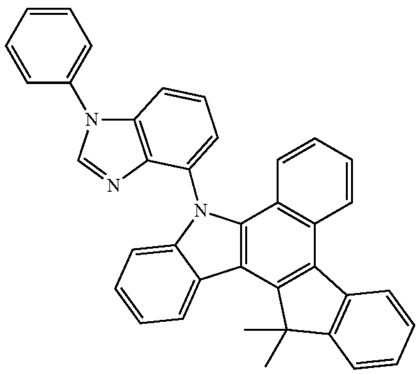
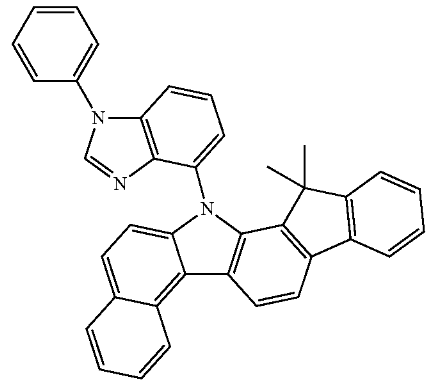
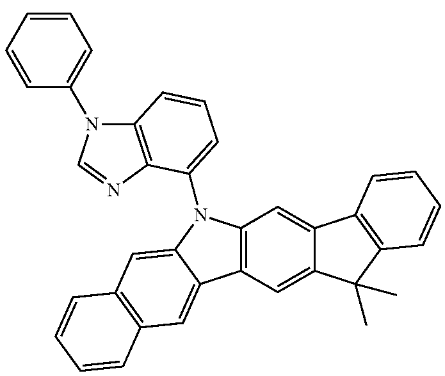
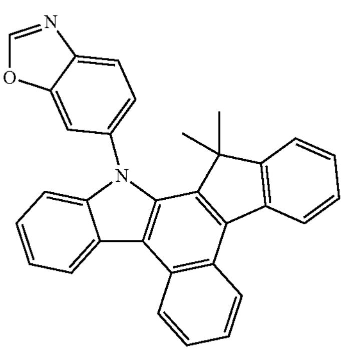
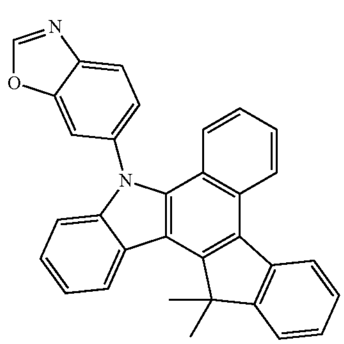
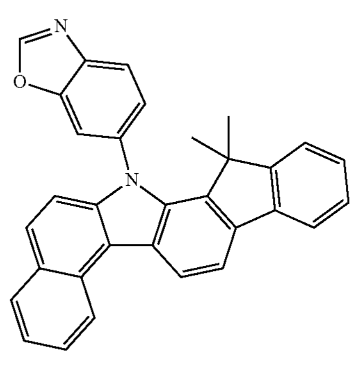
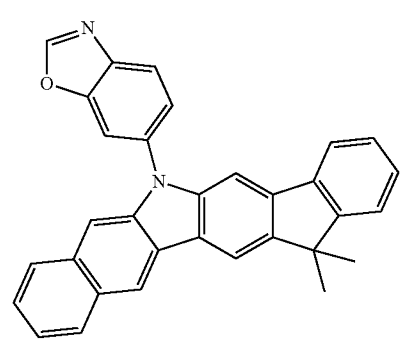

-continued
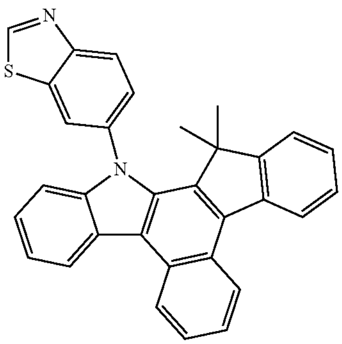
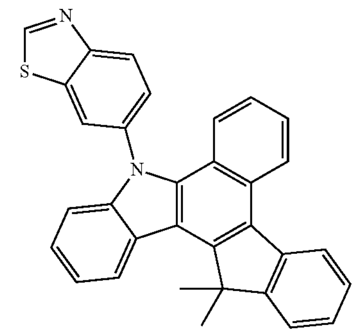
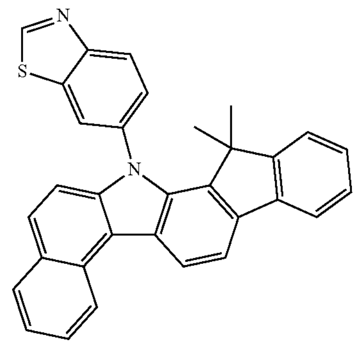
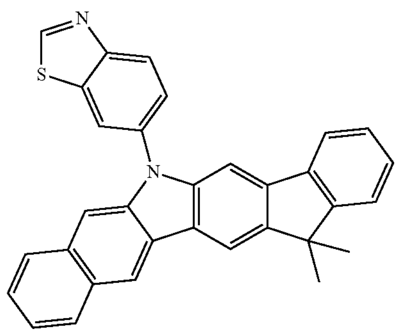
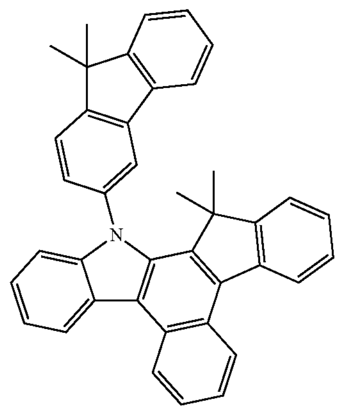
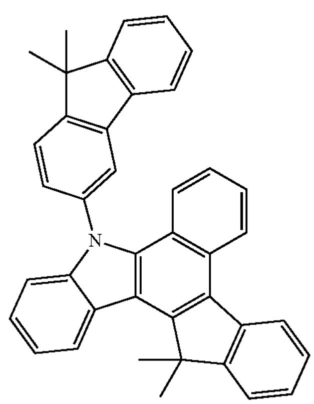
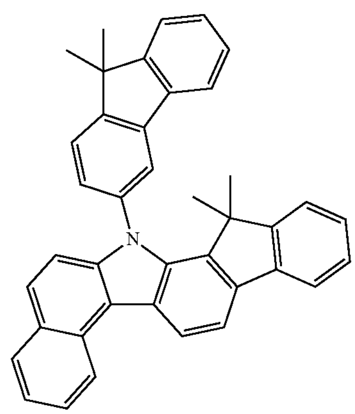
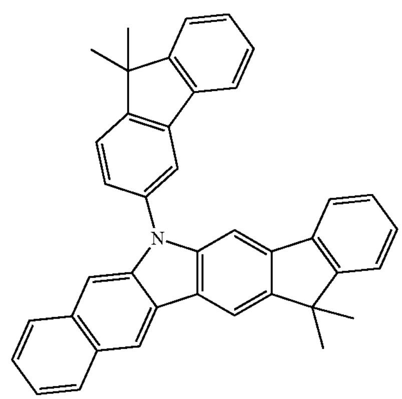
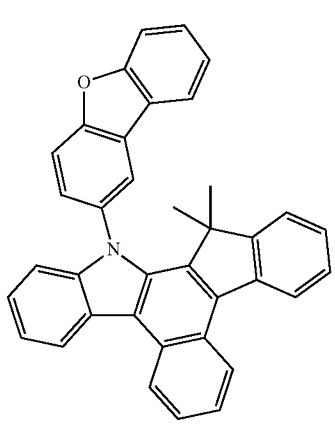
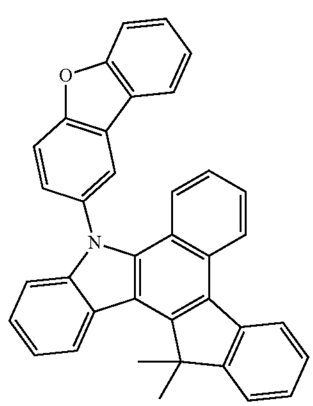
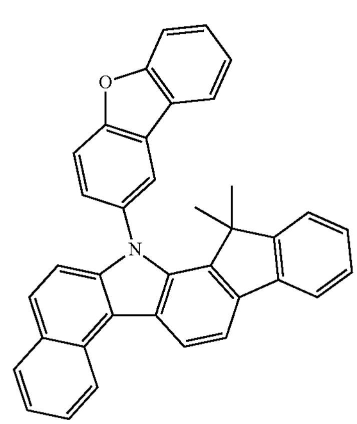

-continued
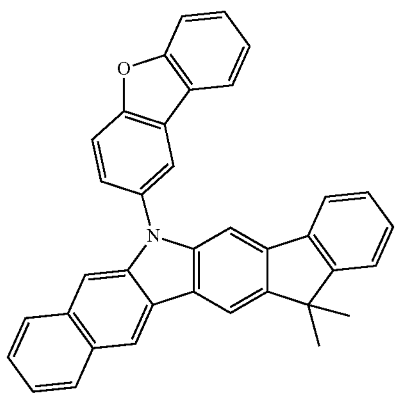
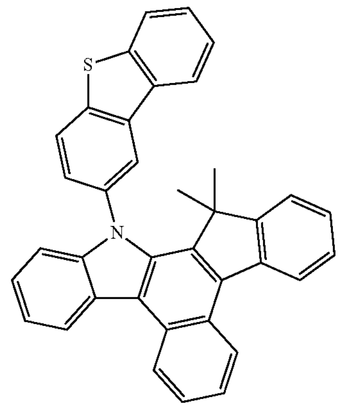
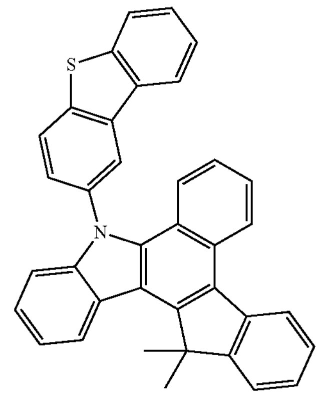
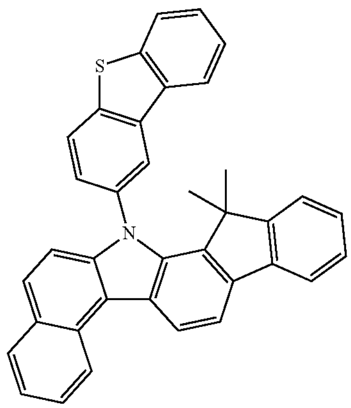
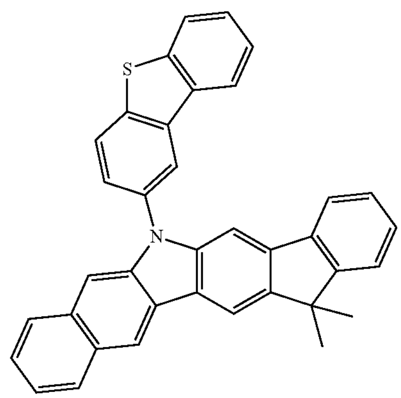
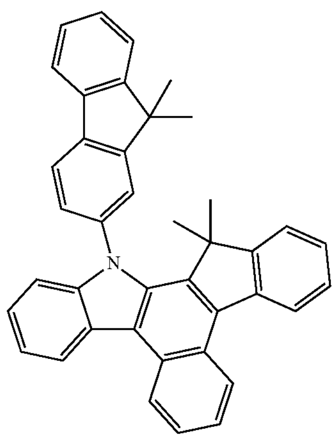
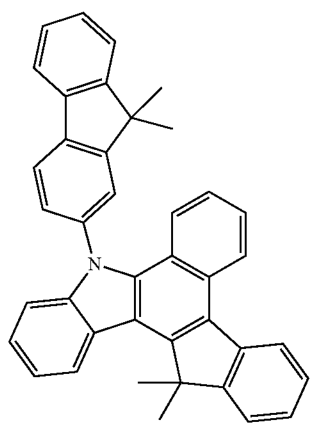
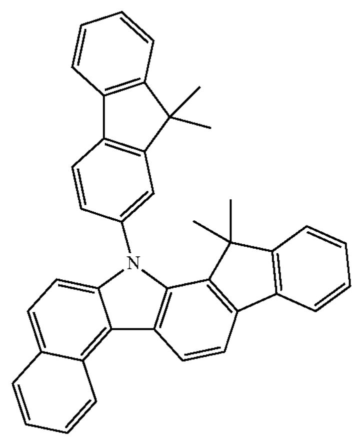
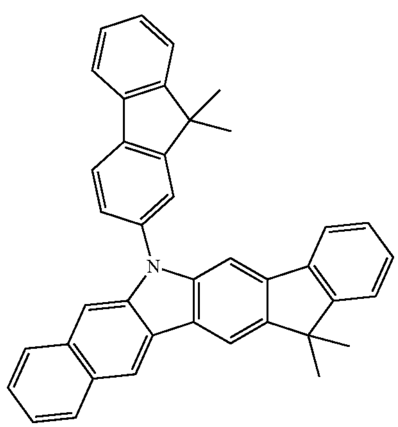
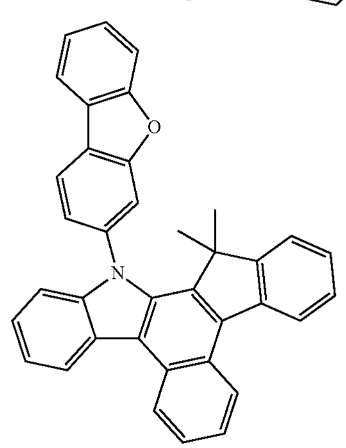
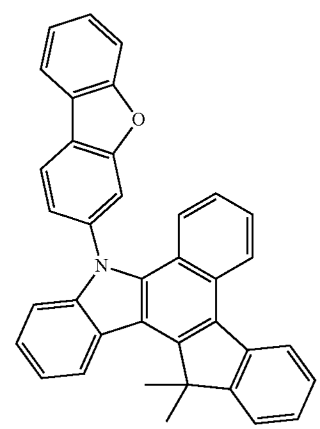

-continued
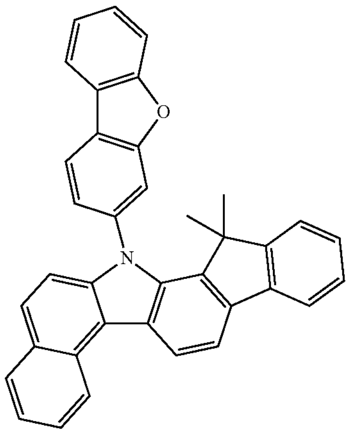
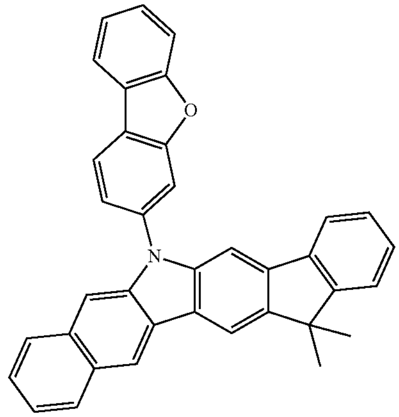
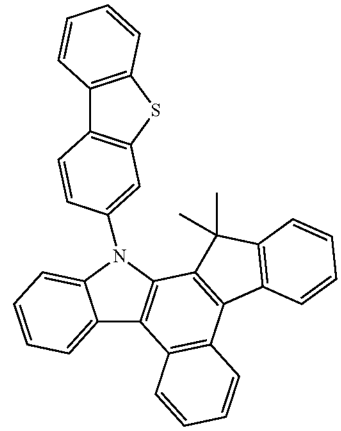
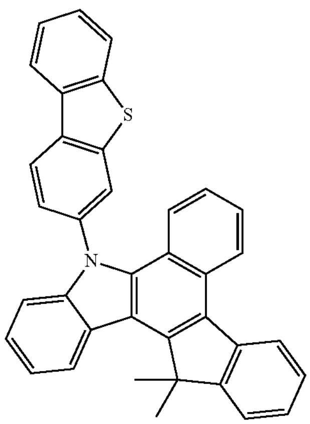
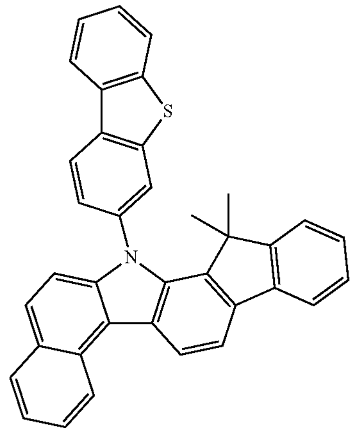
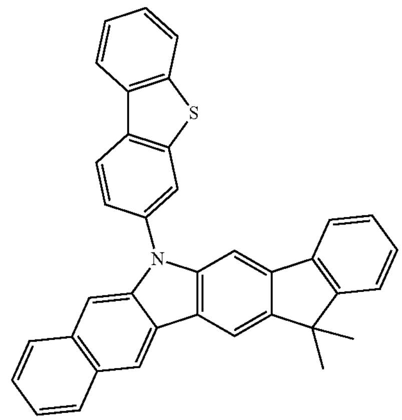
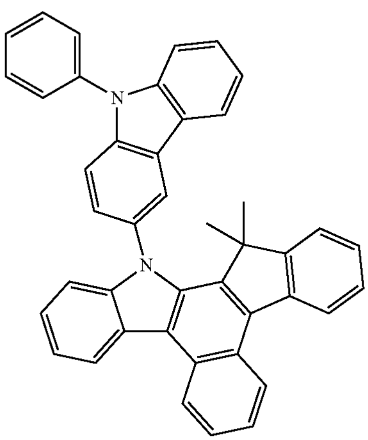
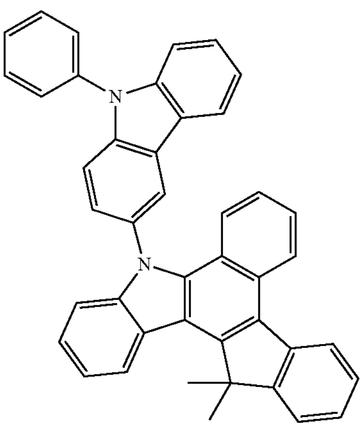
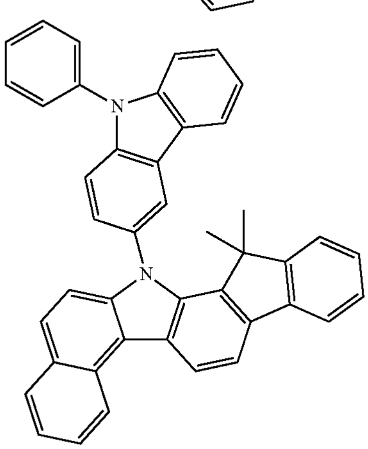
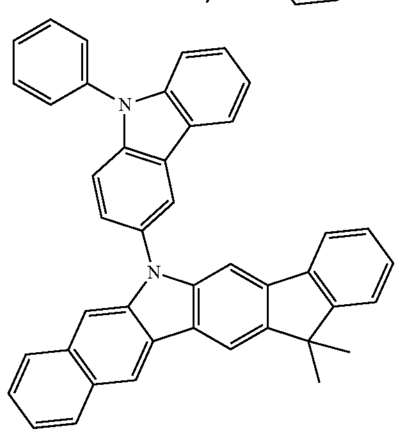

-continued
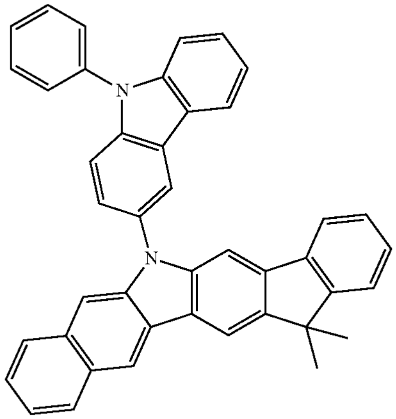
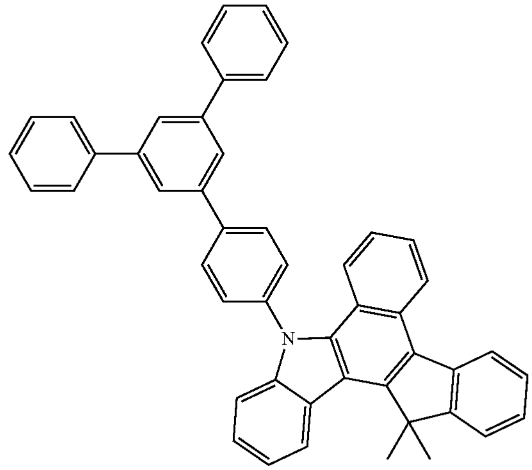
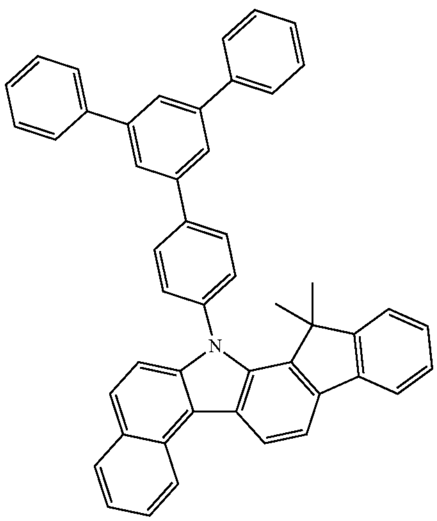
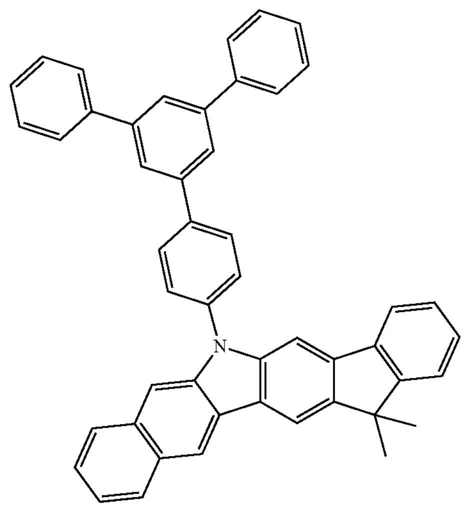
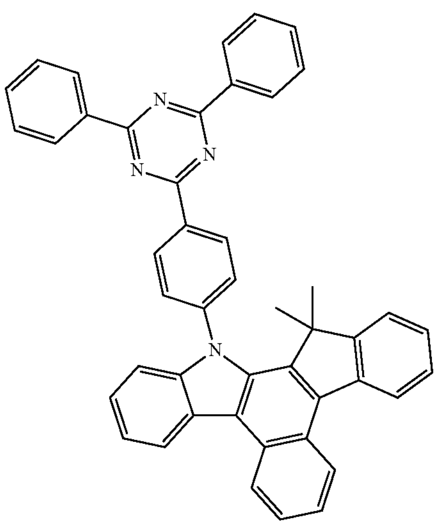
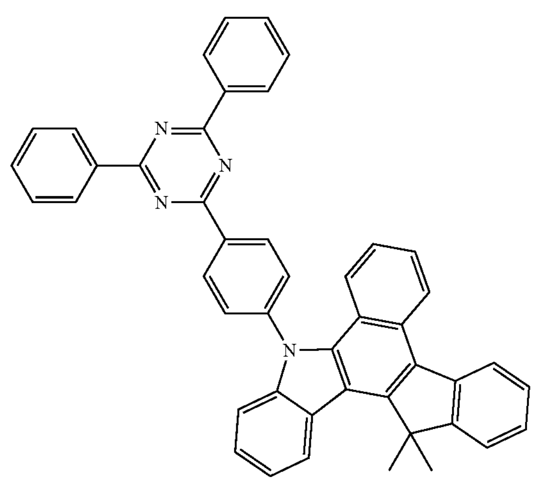

-continued
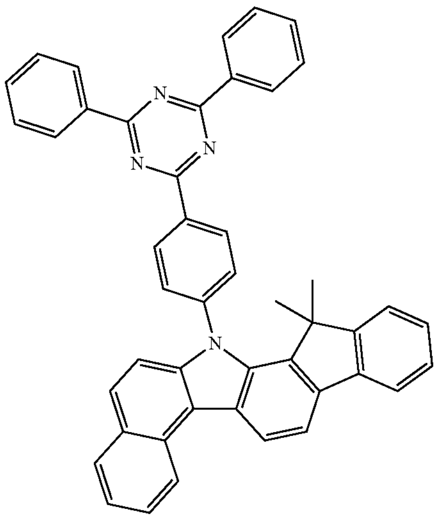
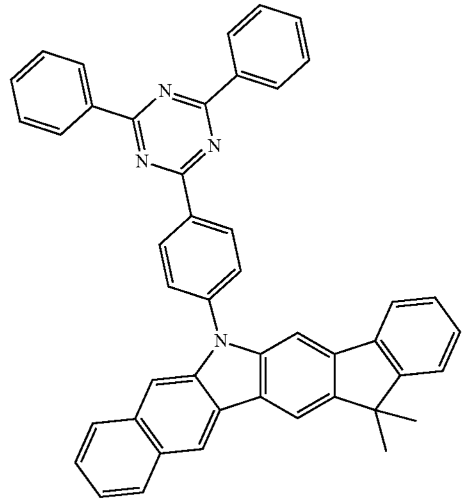
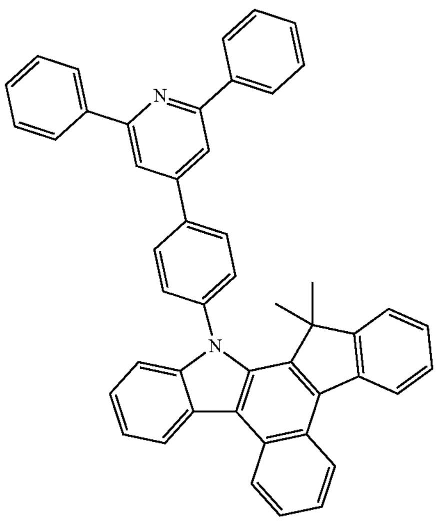
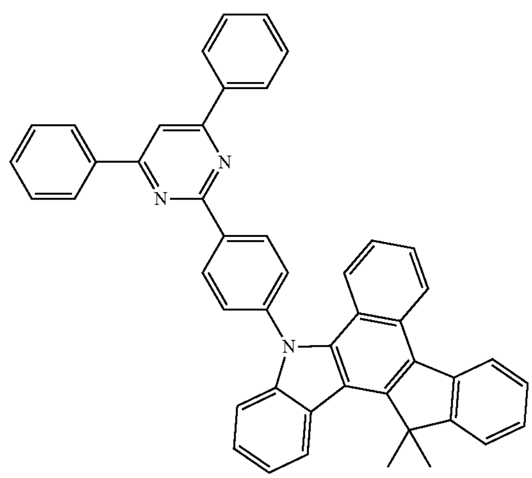
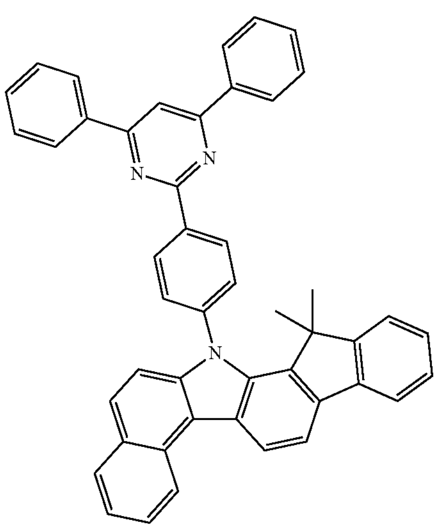
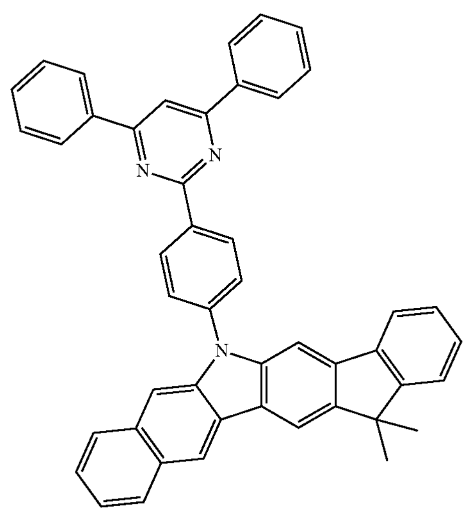

-continued
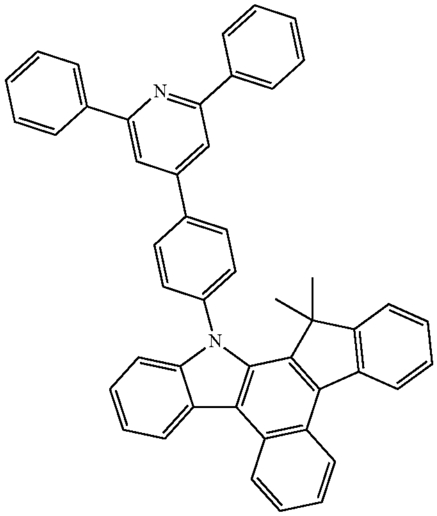
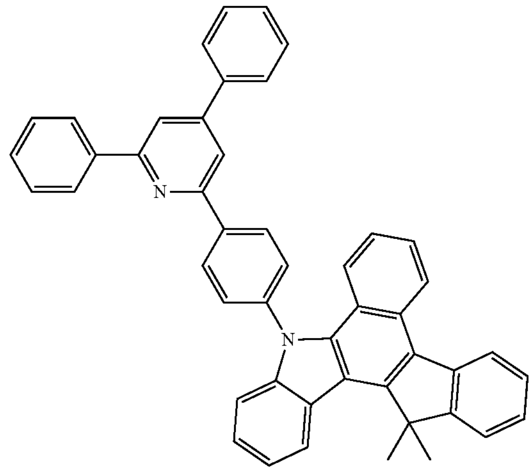
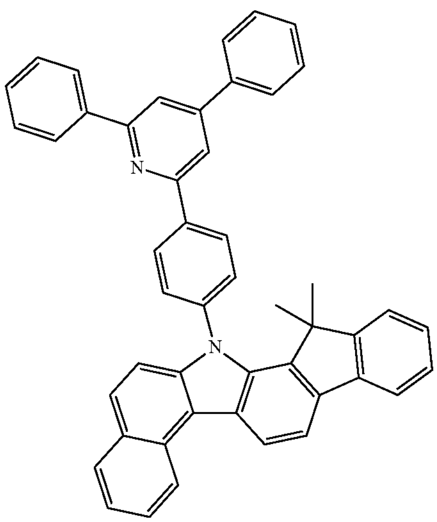
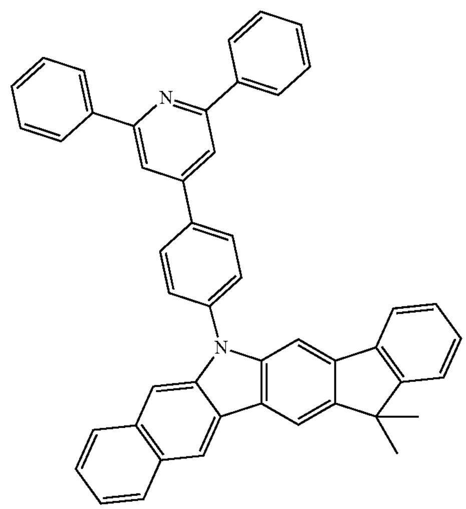
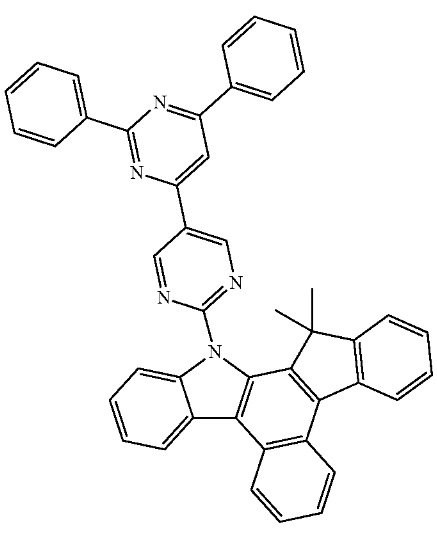
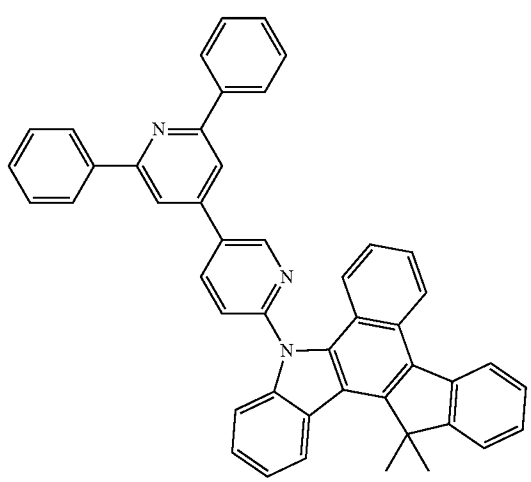

-continued
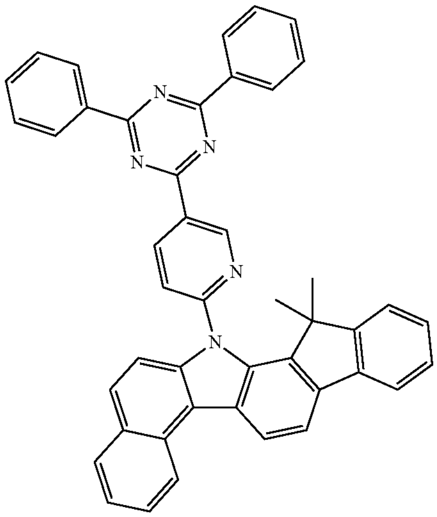
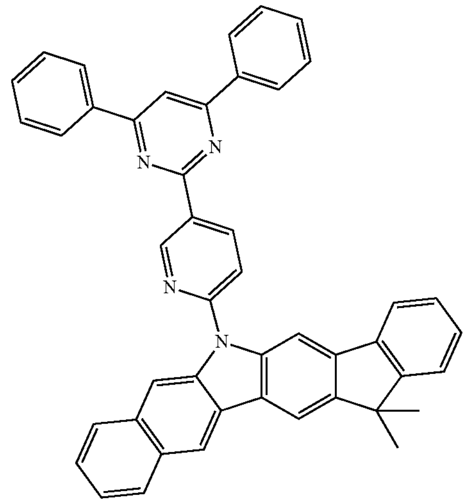
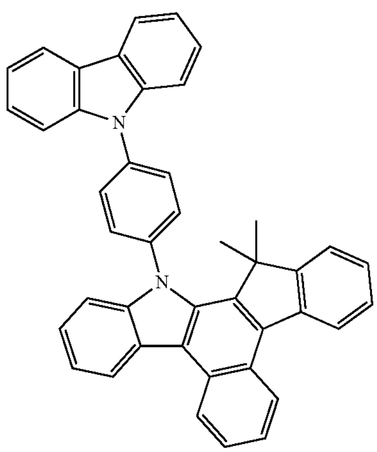
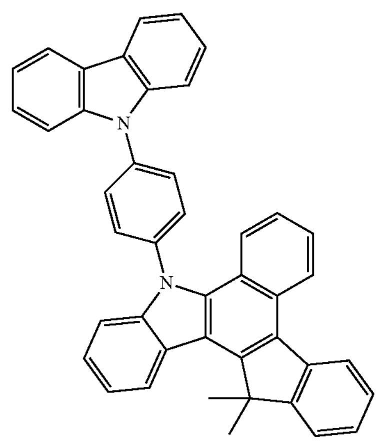
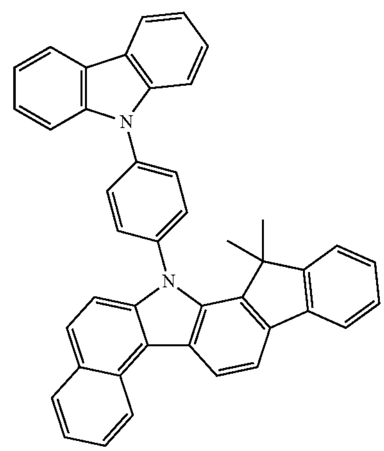
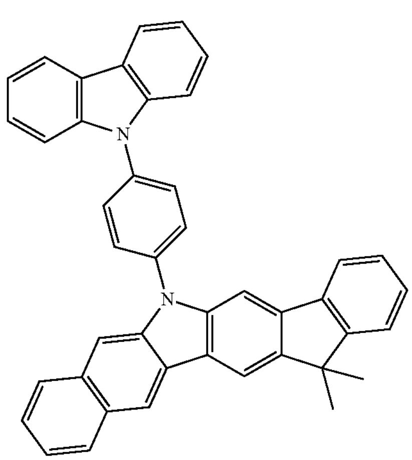
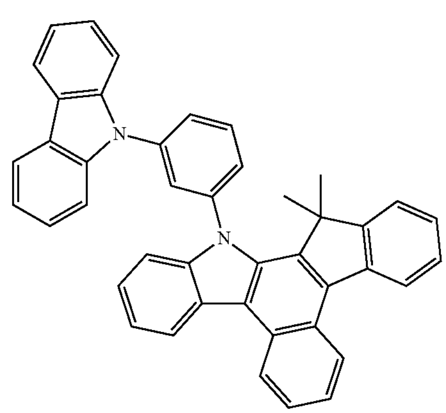

-continued
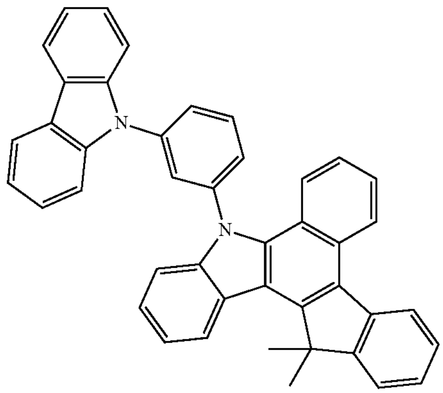
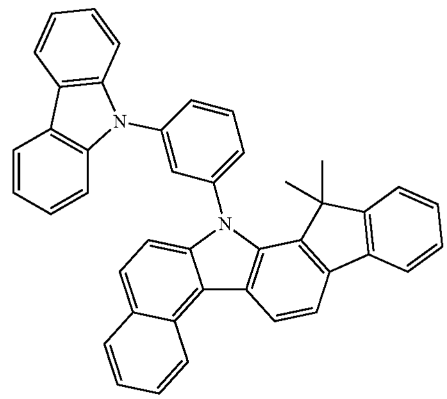
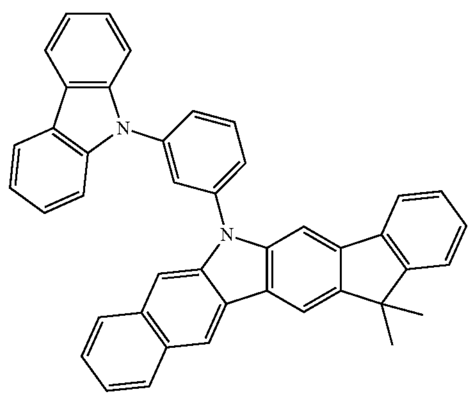
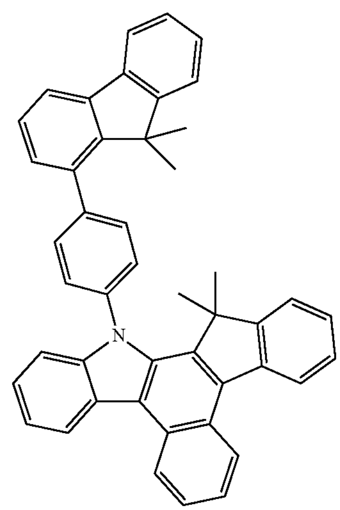
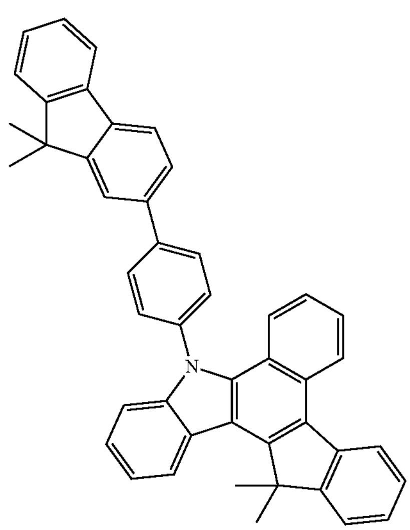
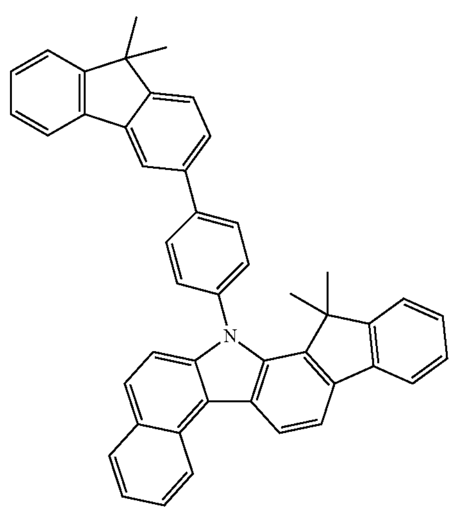

-continued
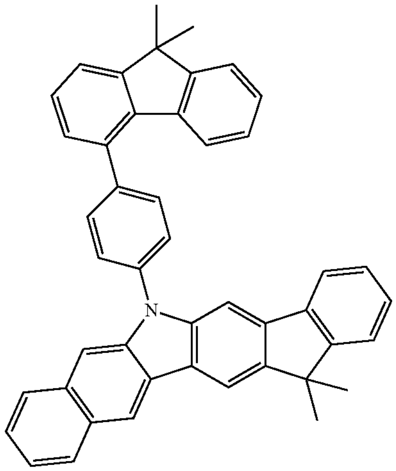
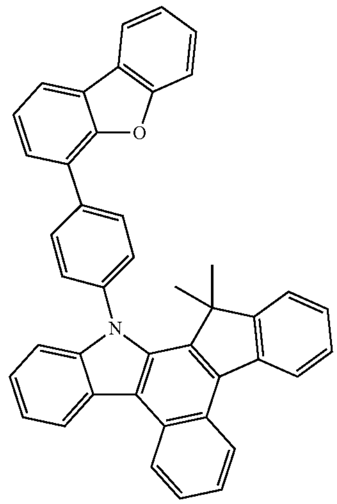
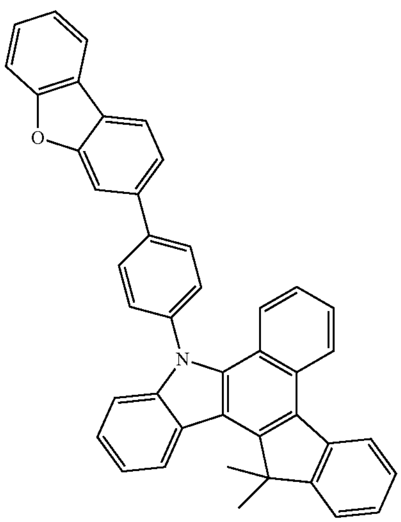
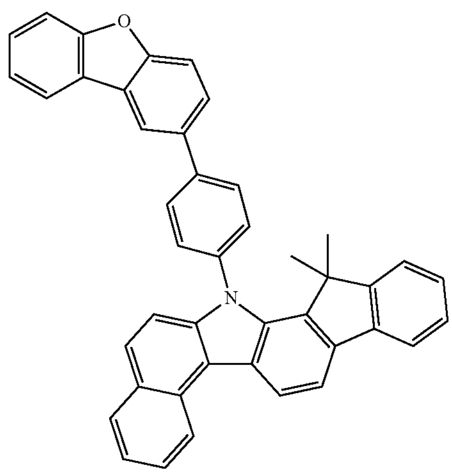
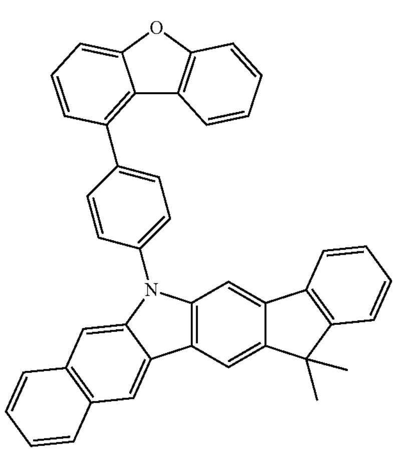
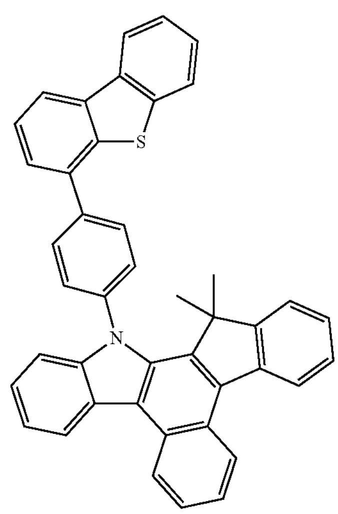

-continued
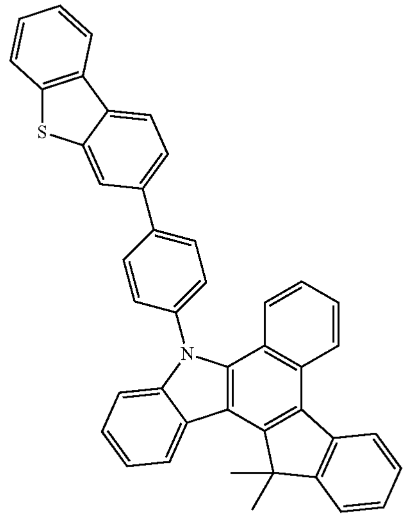
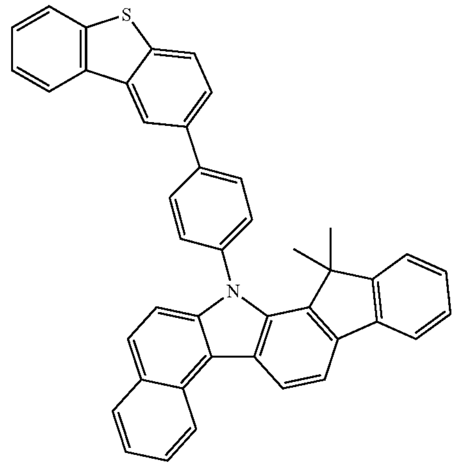
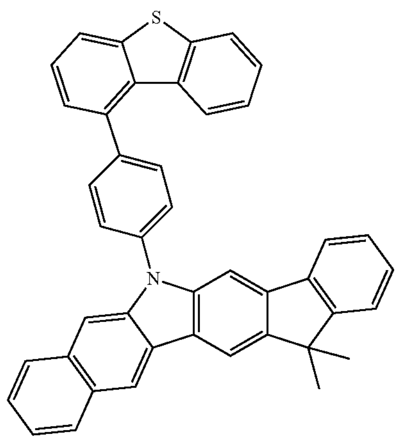
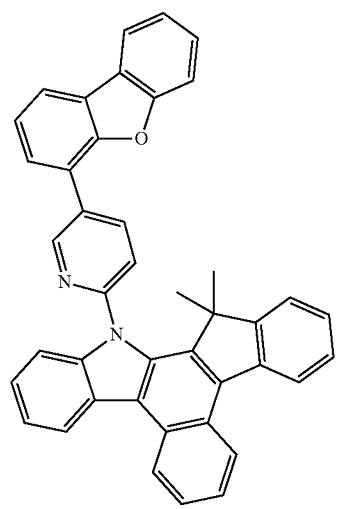
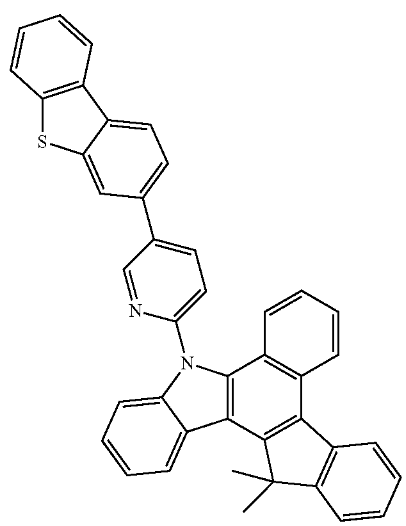
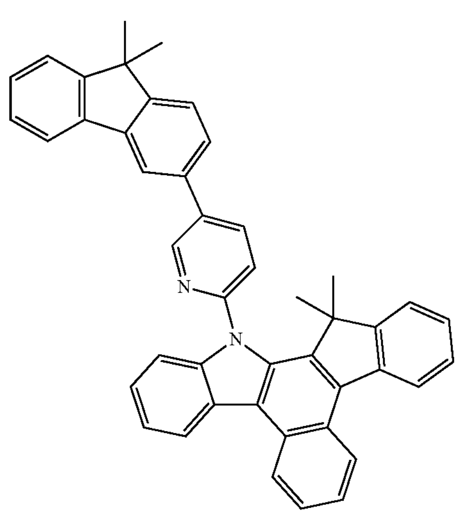

-continued
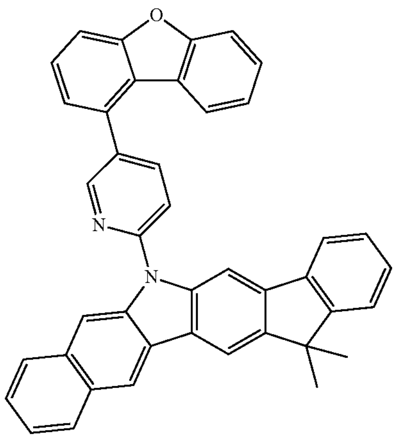
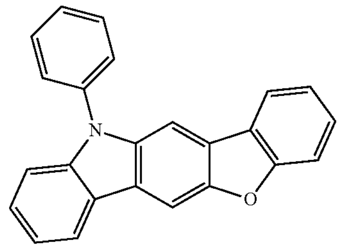
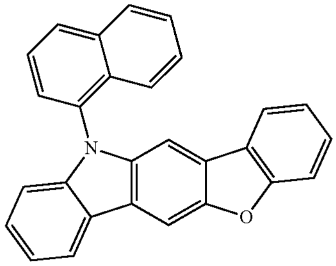
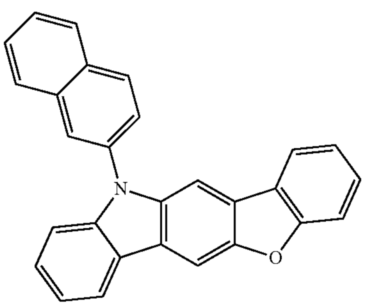
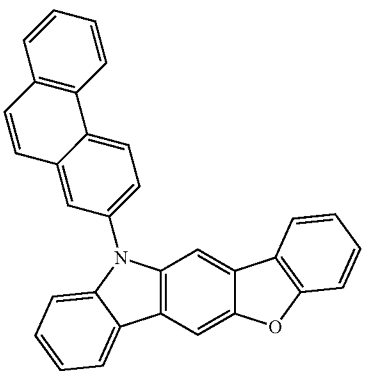
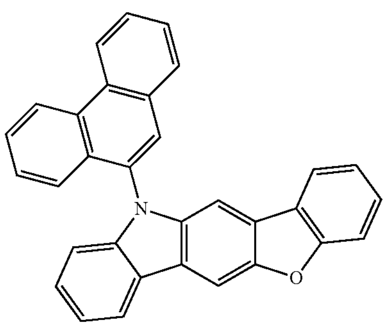
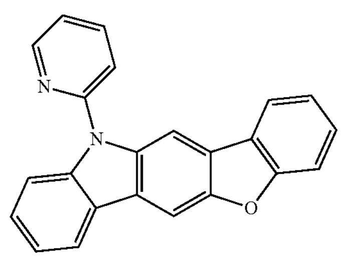
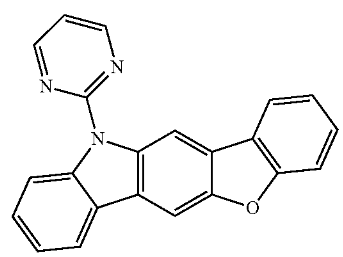
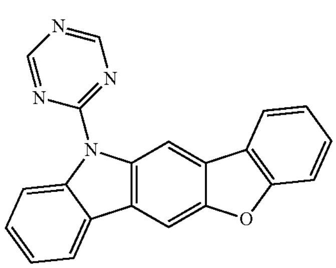
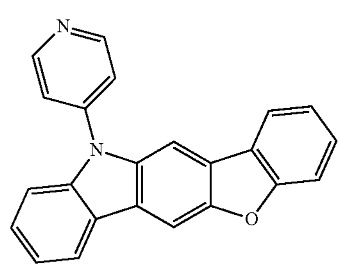
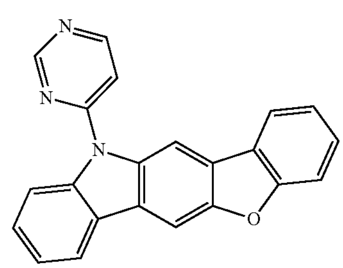

-continued
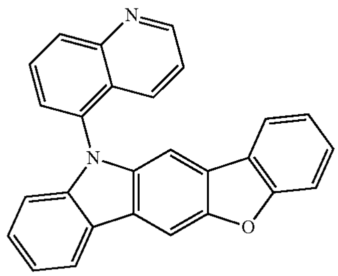
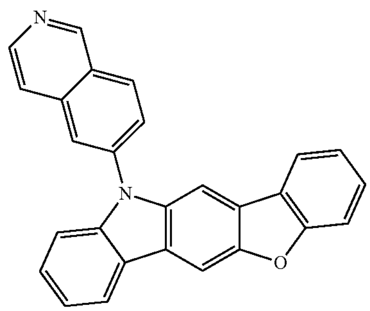
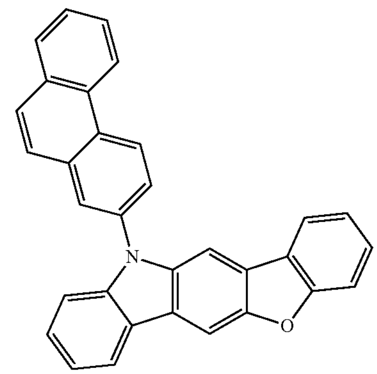
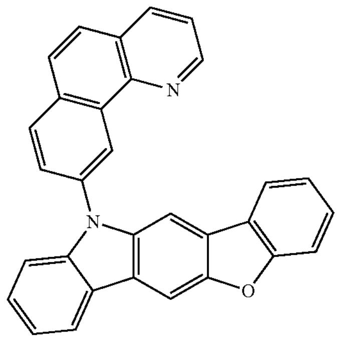
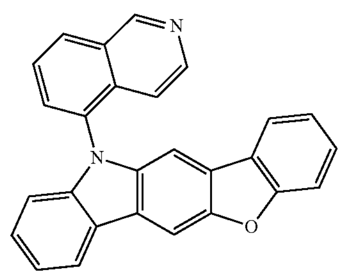
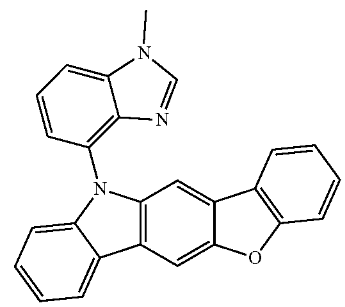
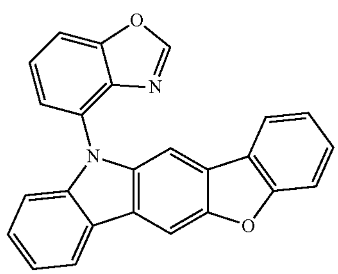
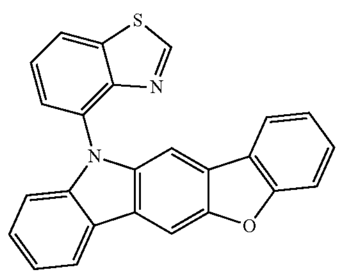
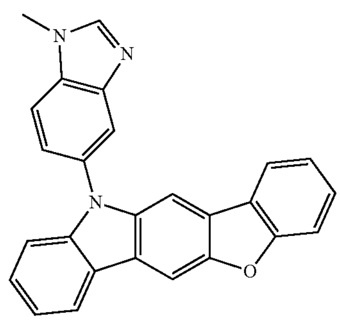
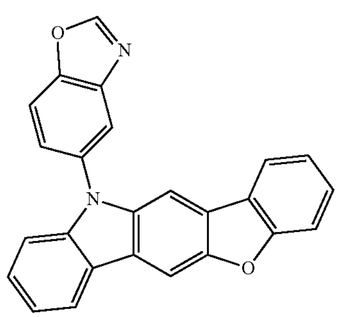
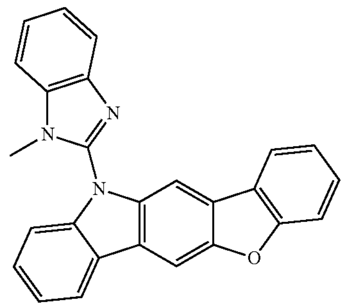
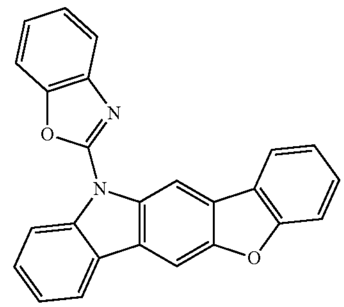
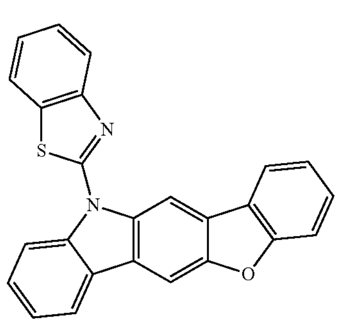
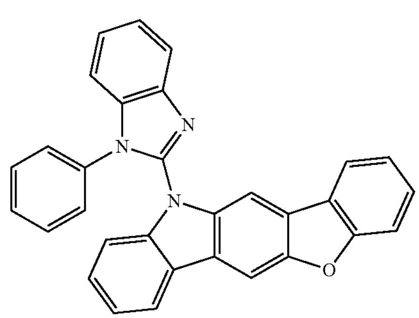

-continued
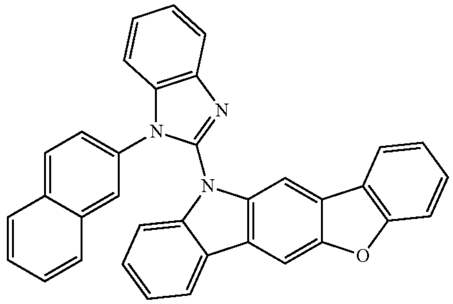
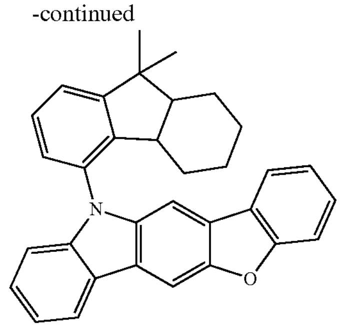
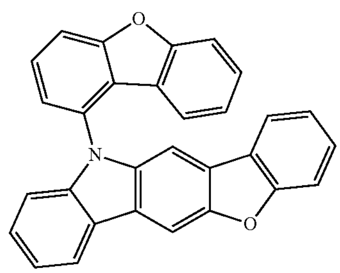
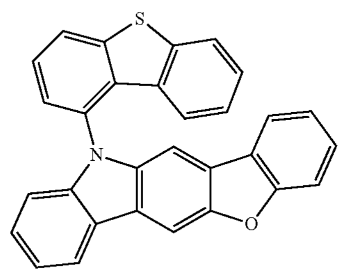
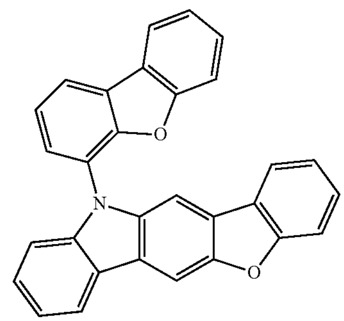
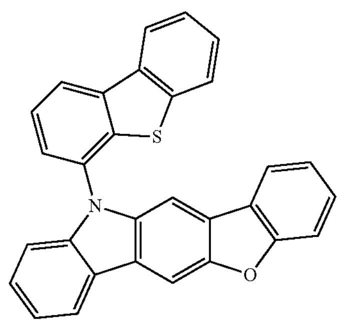
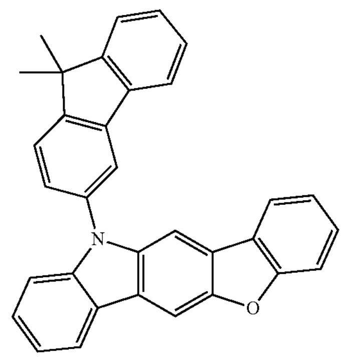
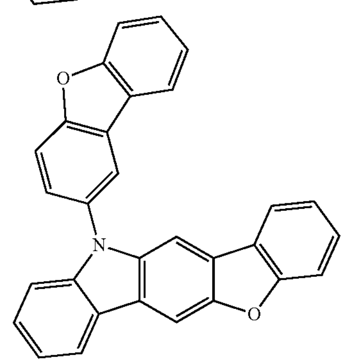
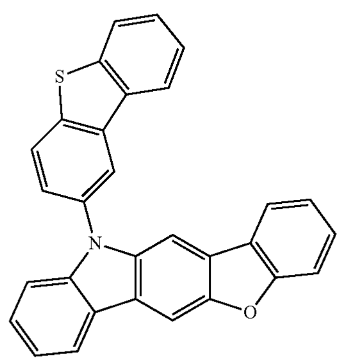
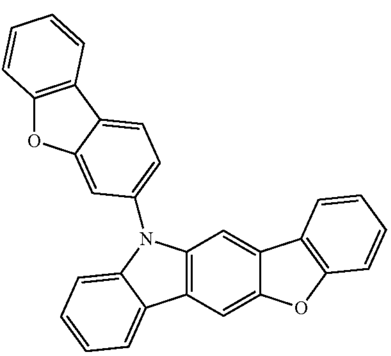
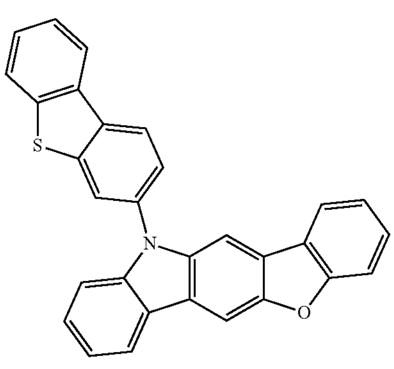
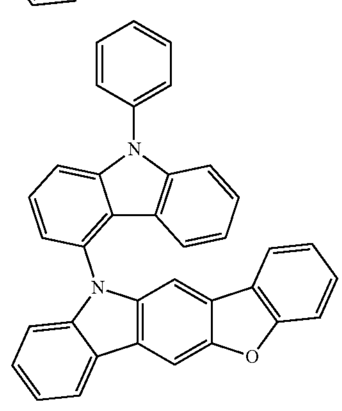

-continued
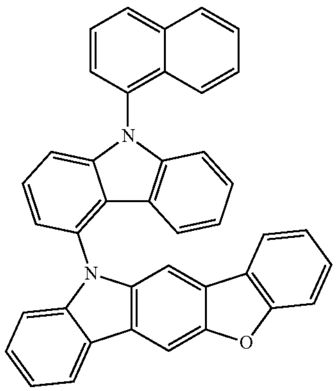
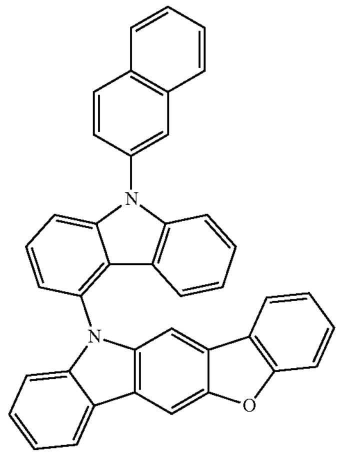
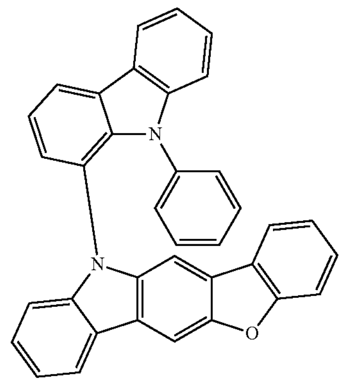
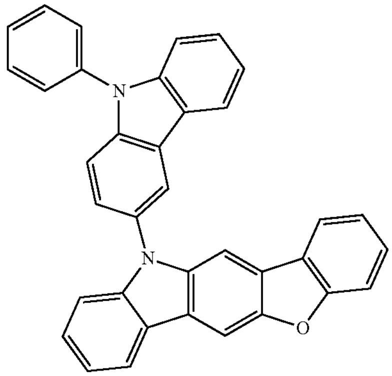
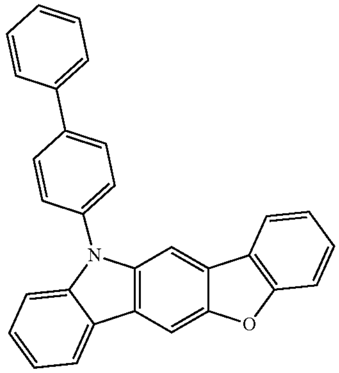
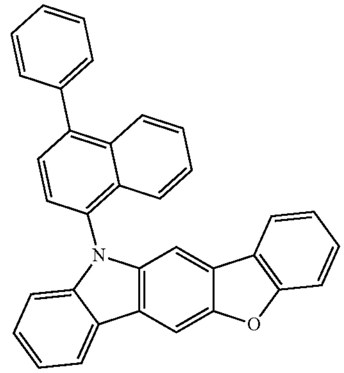
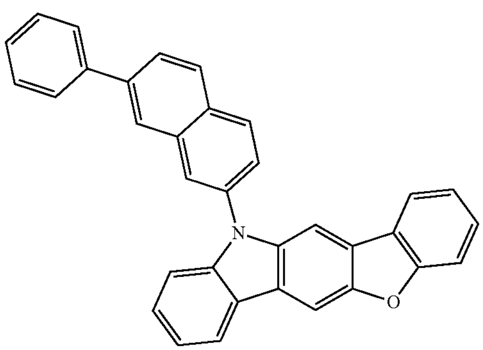
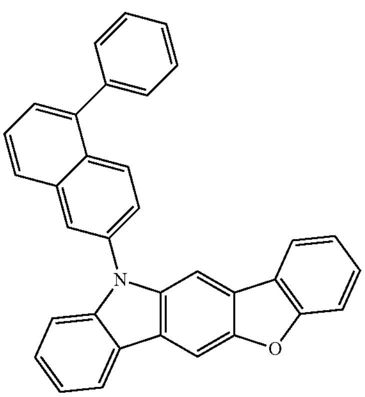
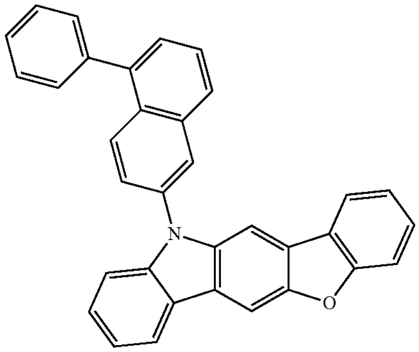
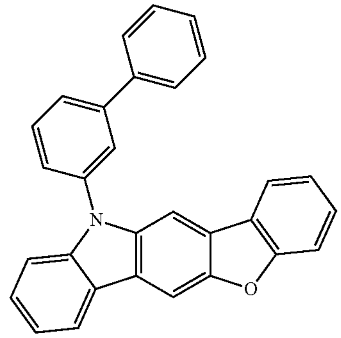

-continued
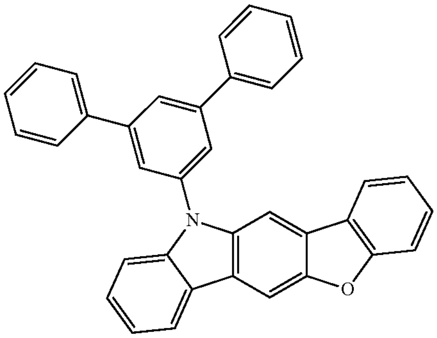
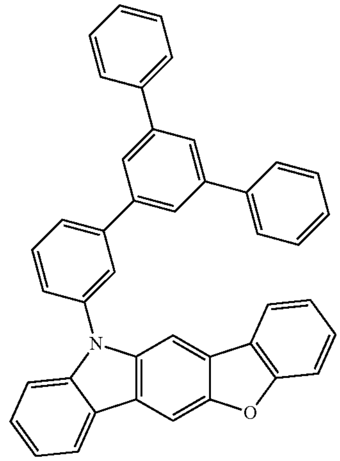
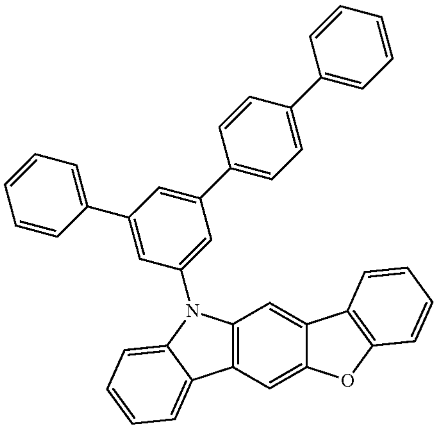
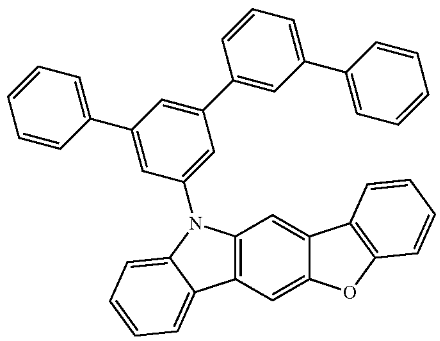
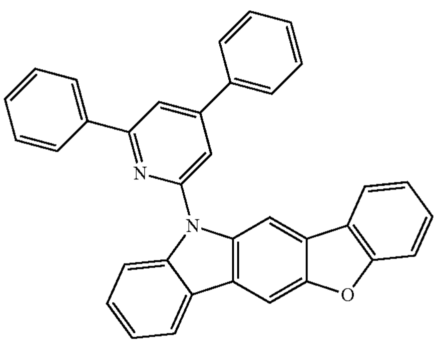
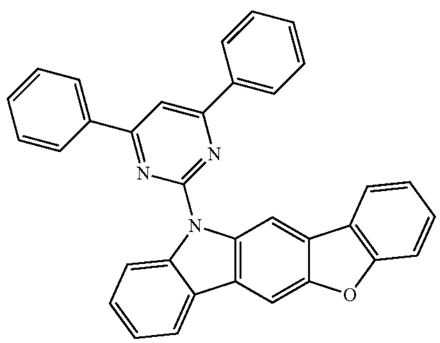
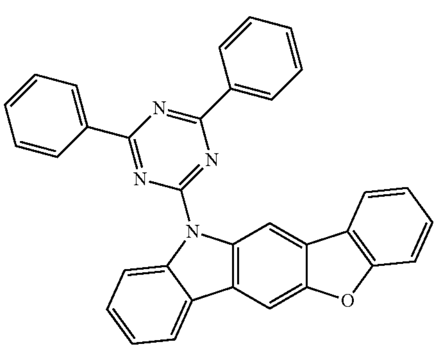
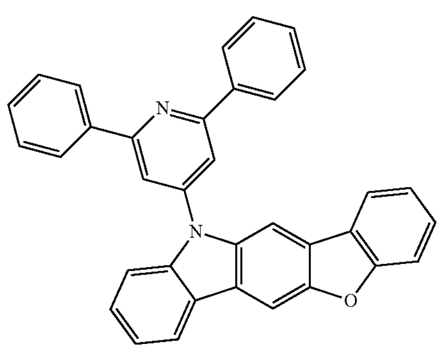

-continued
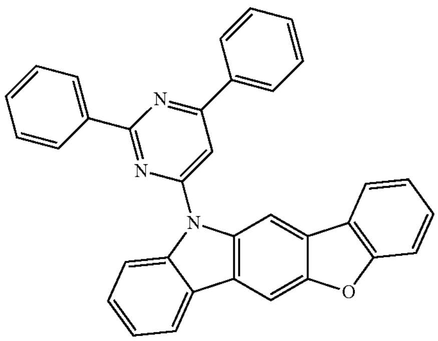
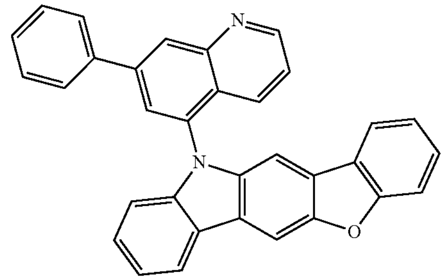
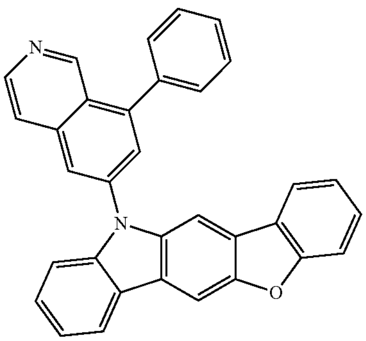
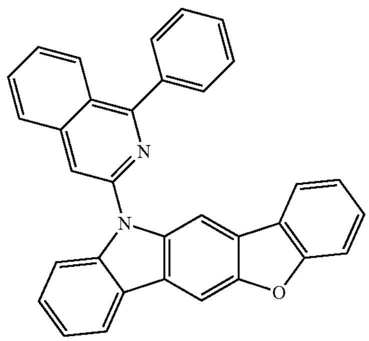
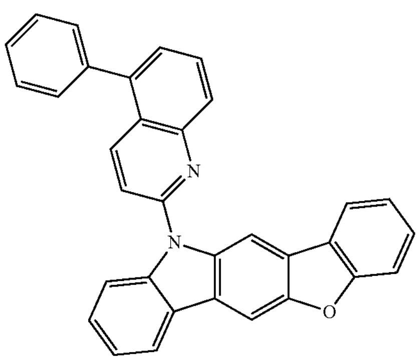
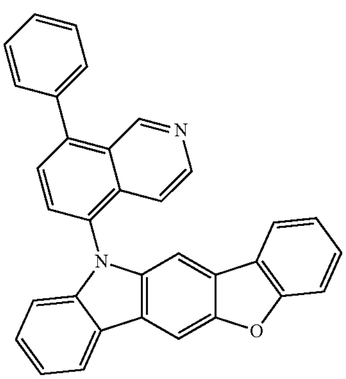
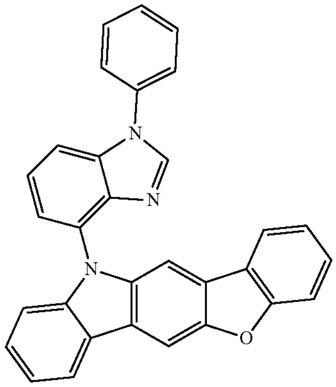
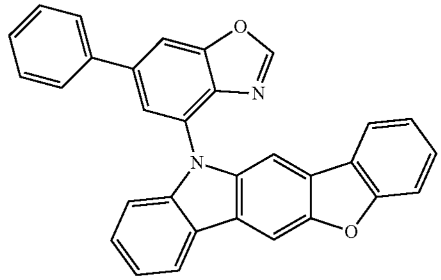

-continued
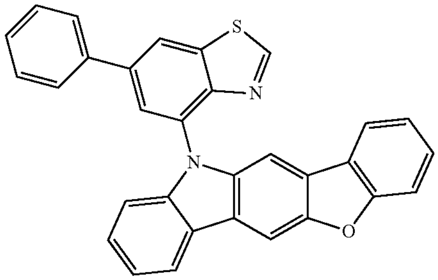
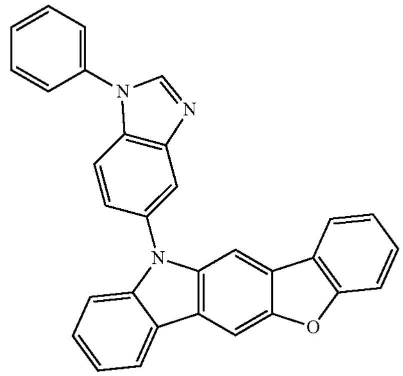
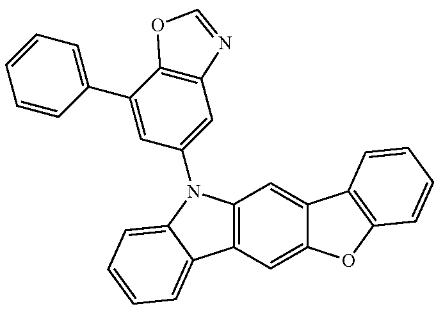
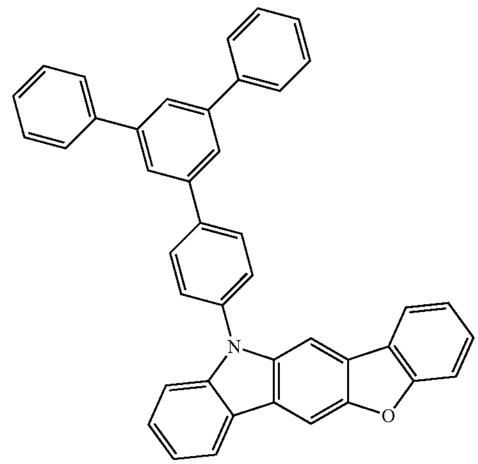
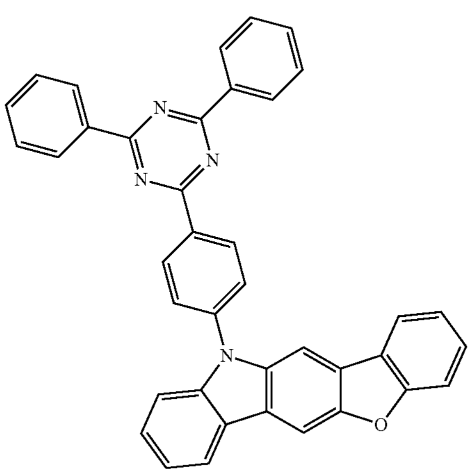
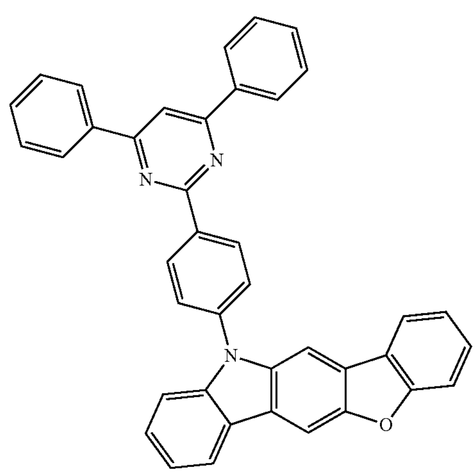

-continued
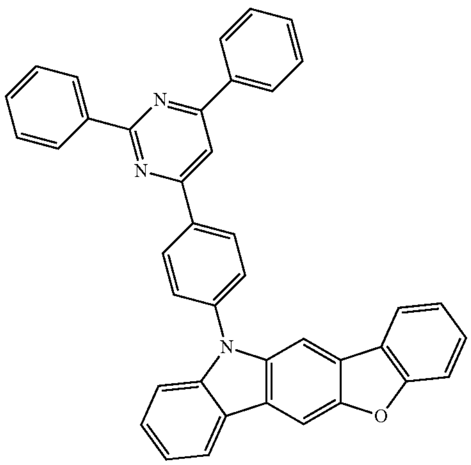
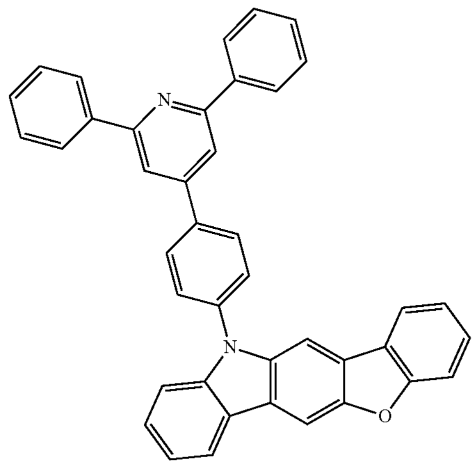
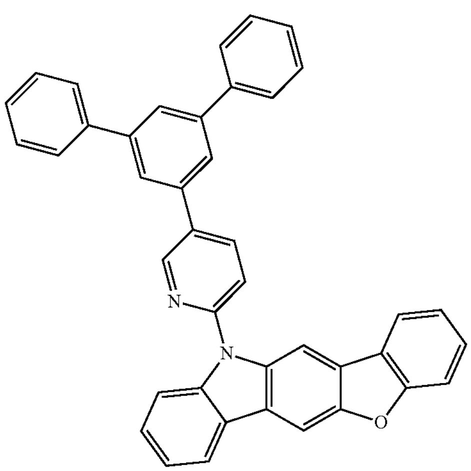
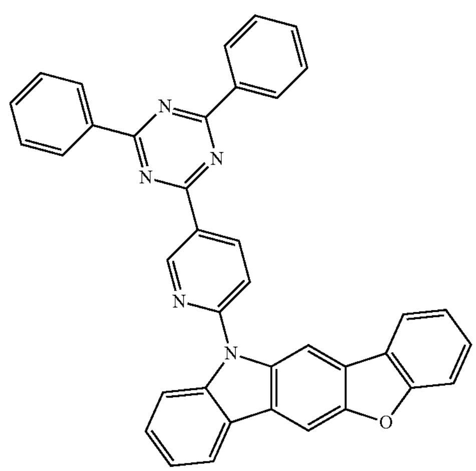
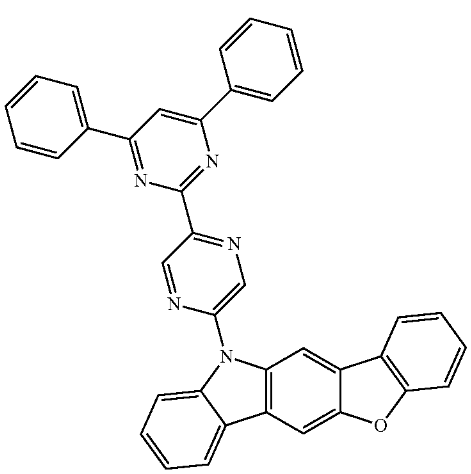
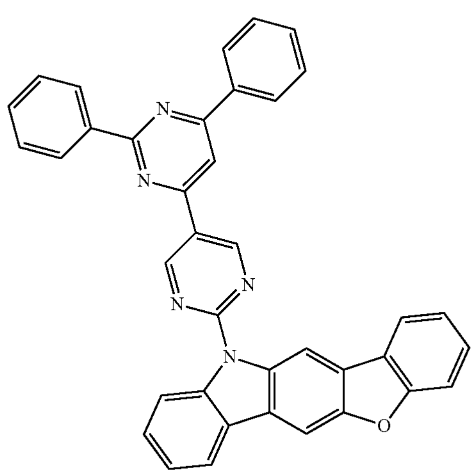

-continued
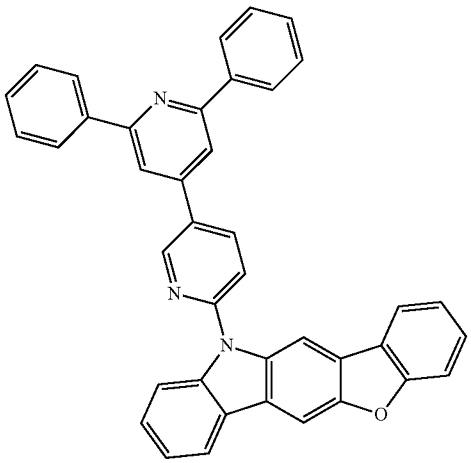
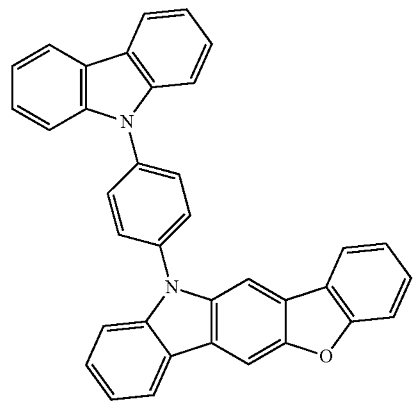
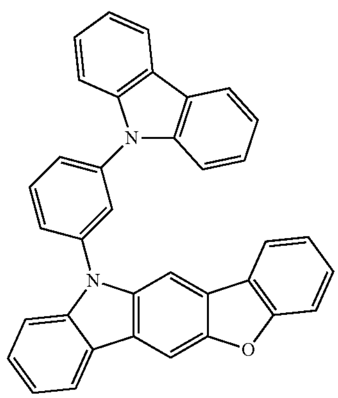
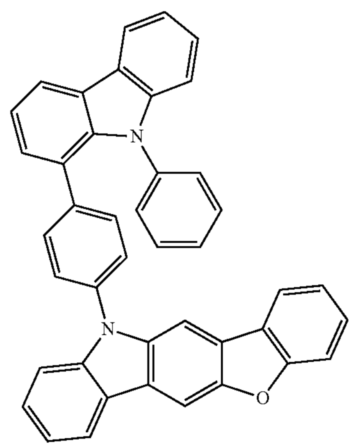
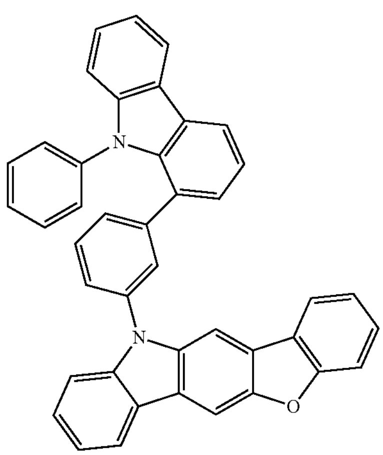
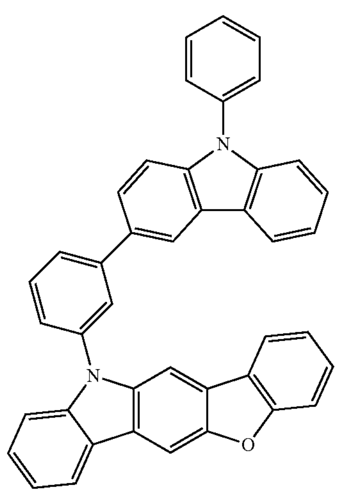
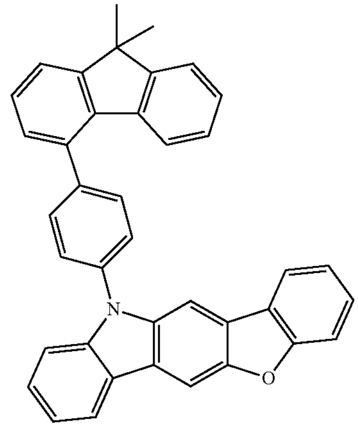

-continued
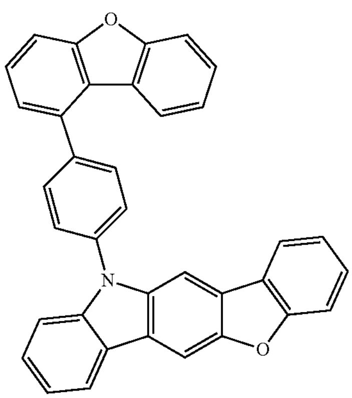
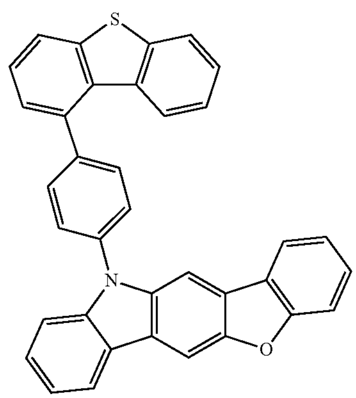
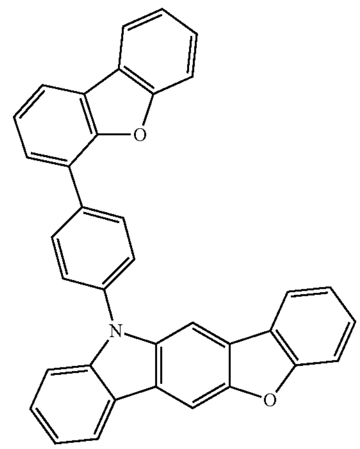
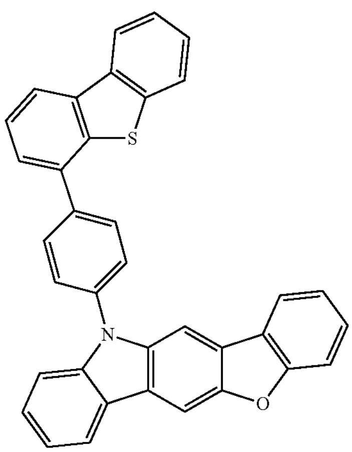
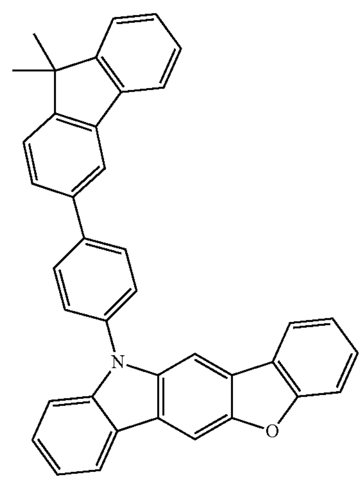
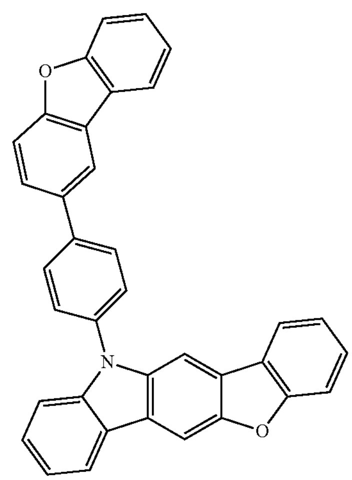
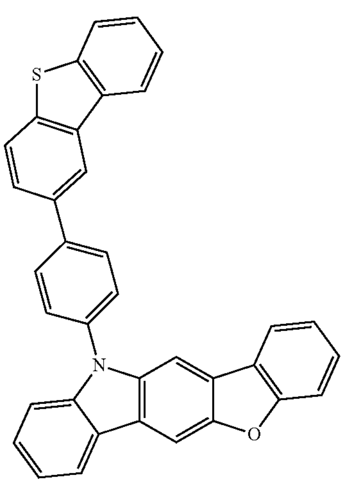
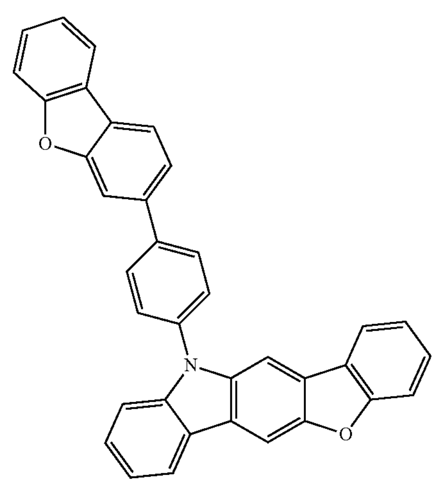

-continued
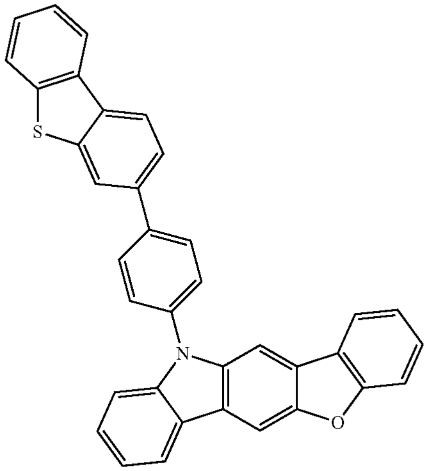
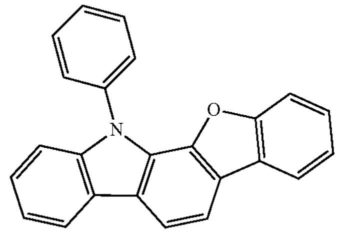
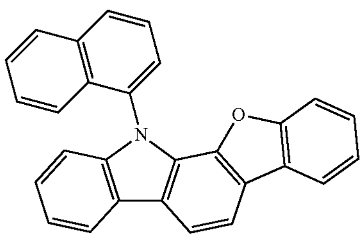
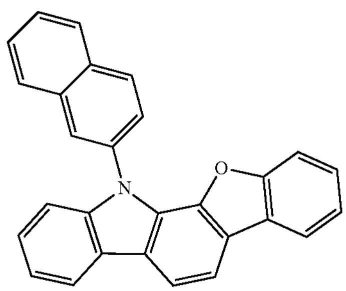
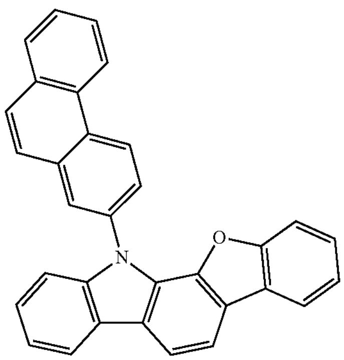
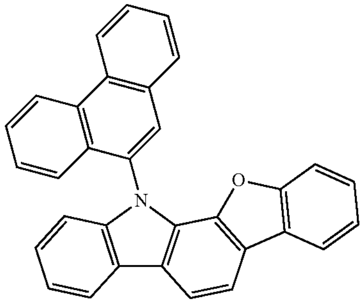
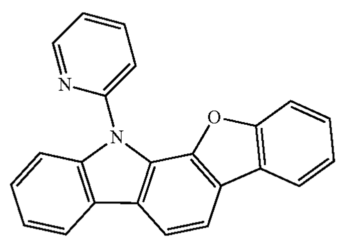
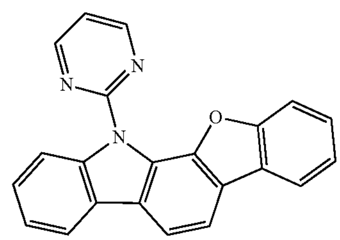
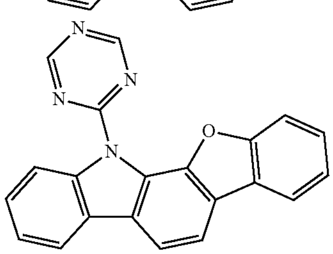
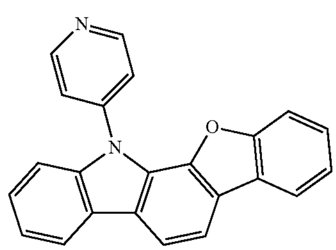
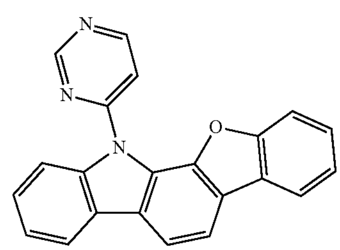
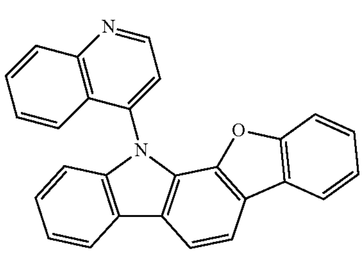
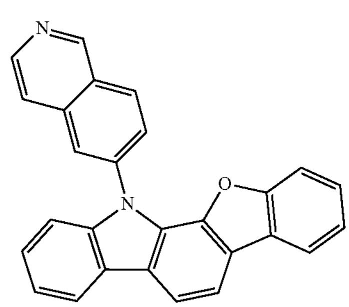
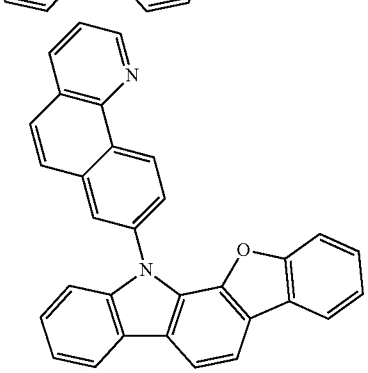

-continued
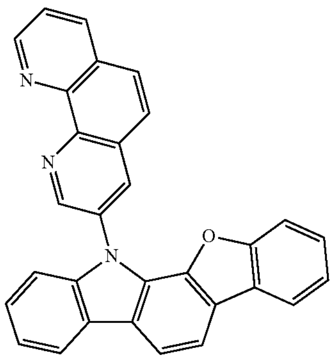
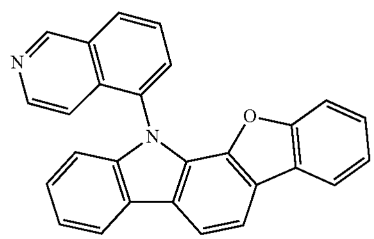
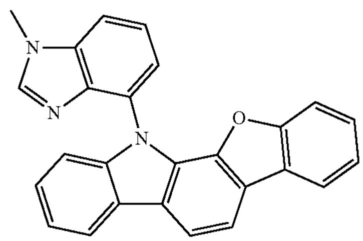
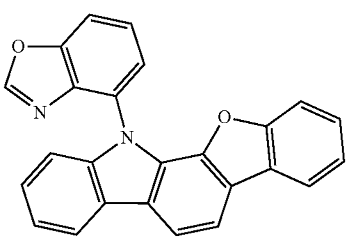
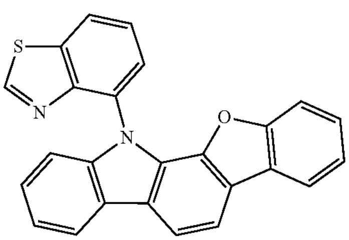
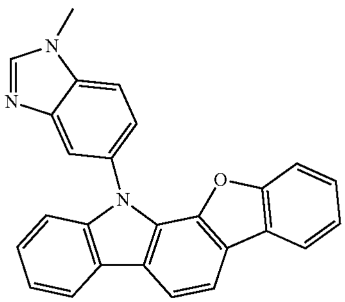
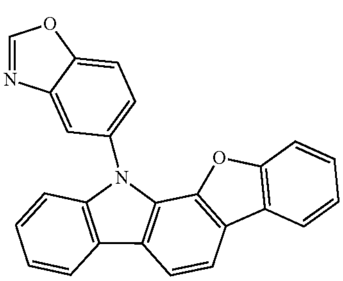
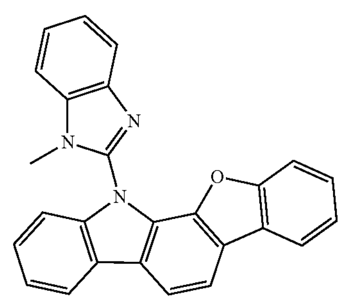
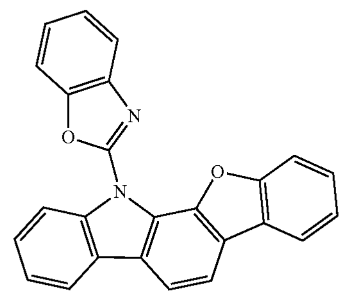
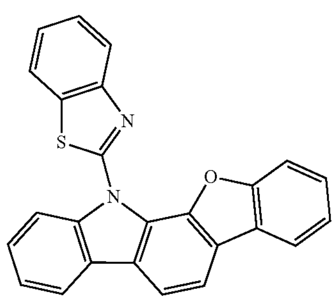
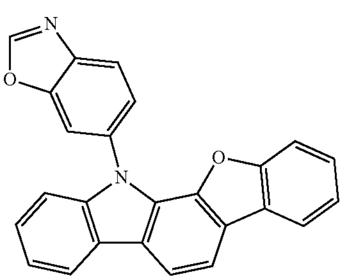
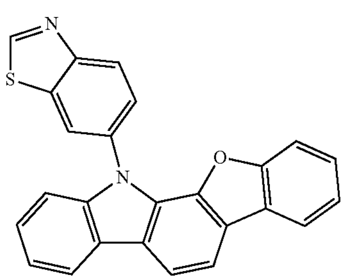
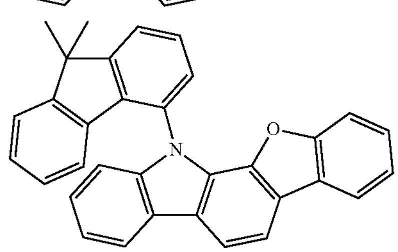
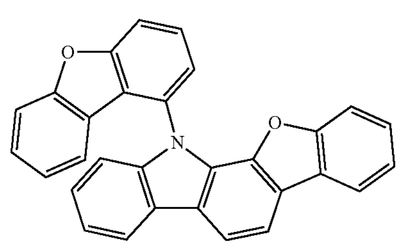
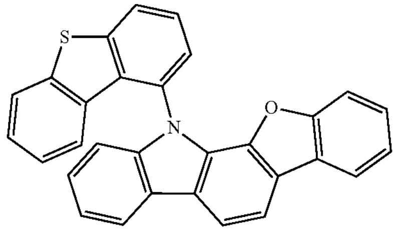
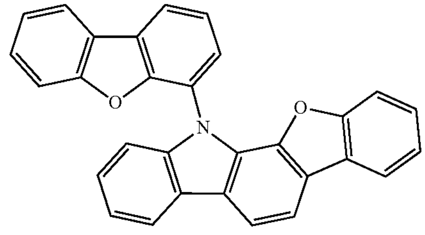

-continued
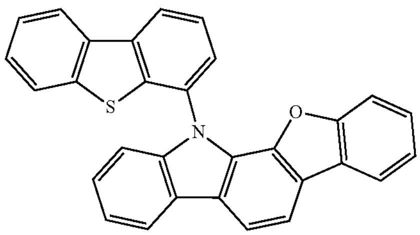
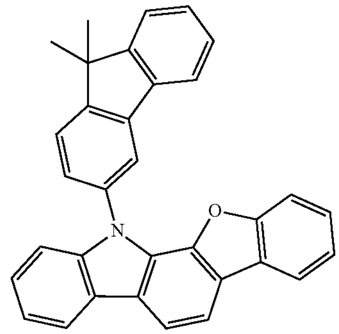
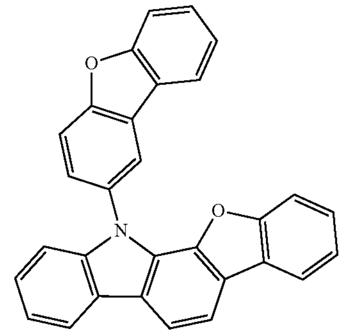
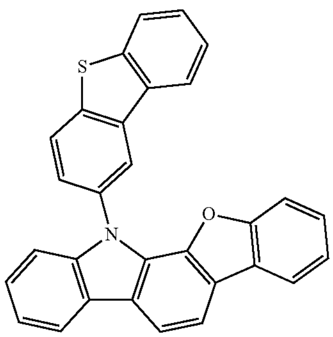
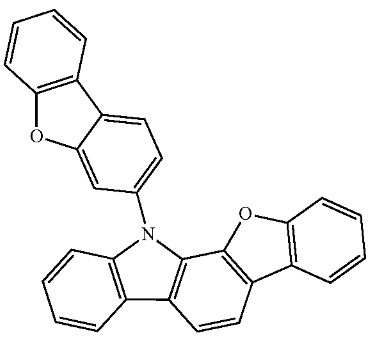
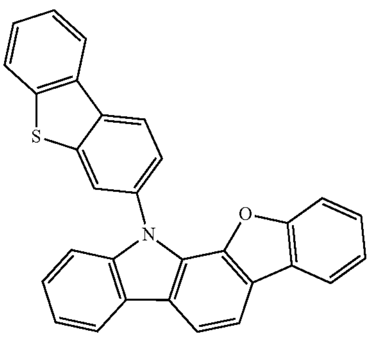
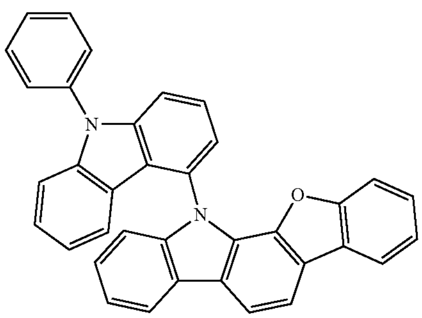
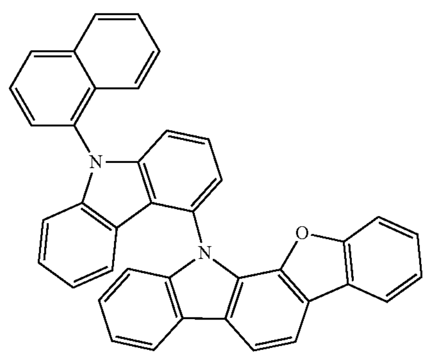
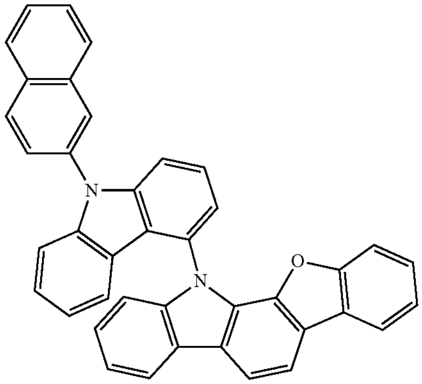
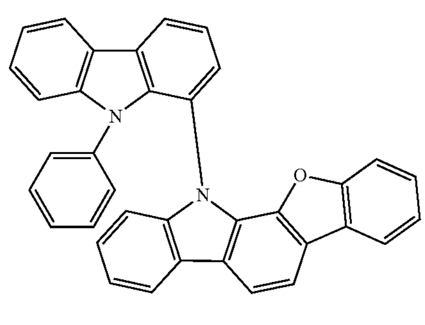

-continued
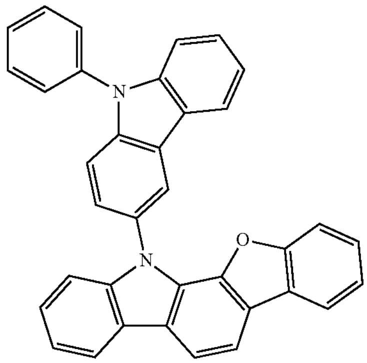
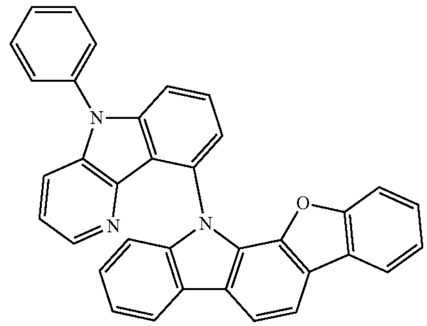
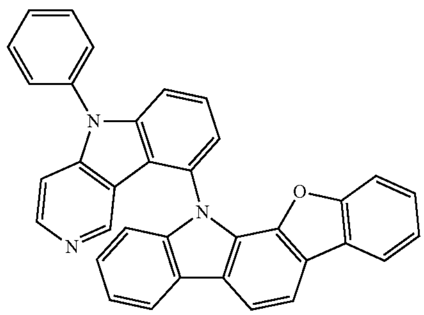
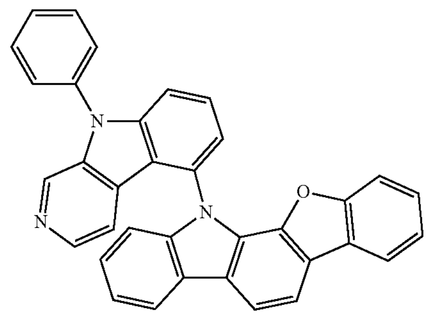
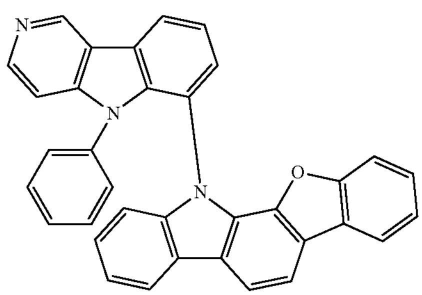
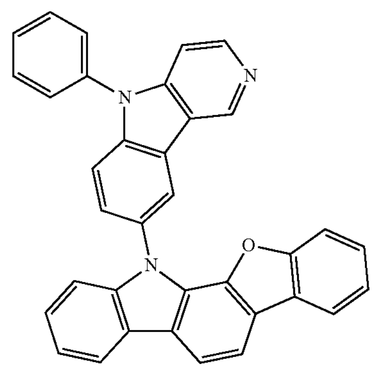
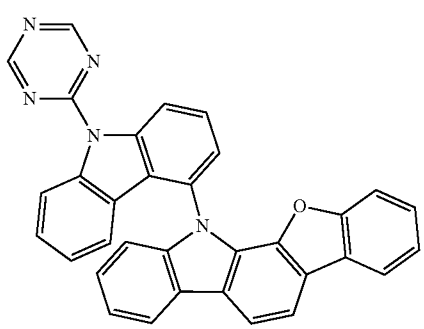
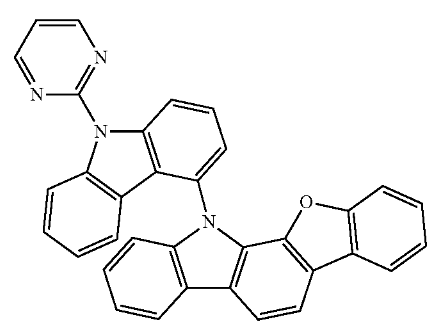
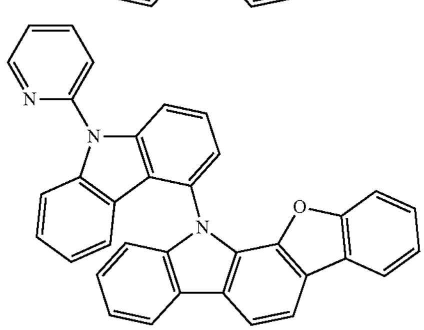
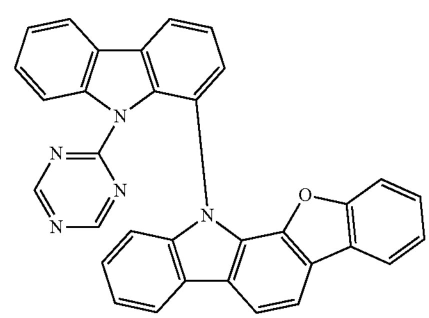

-continued
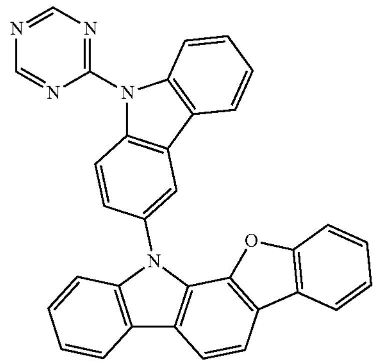
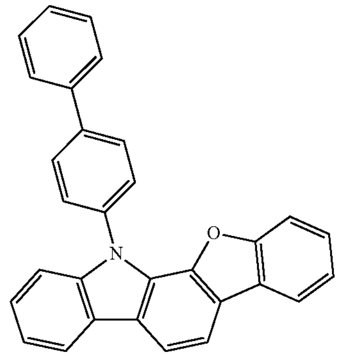
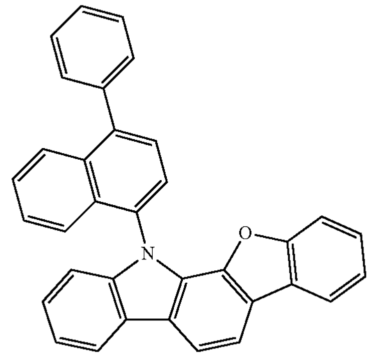
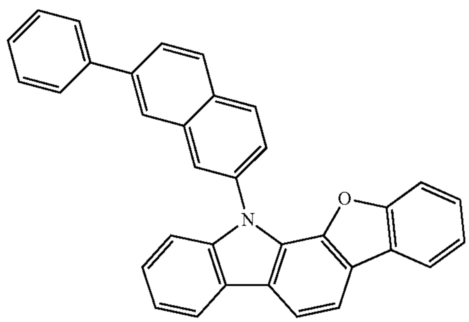
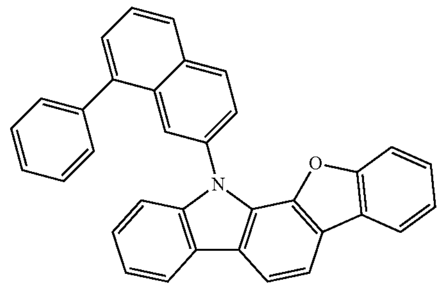
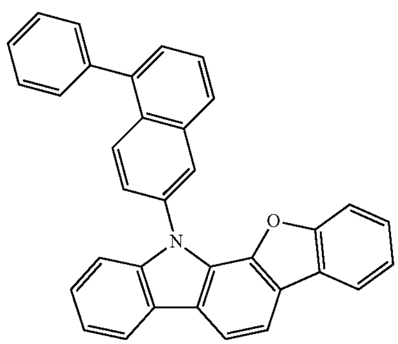
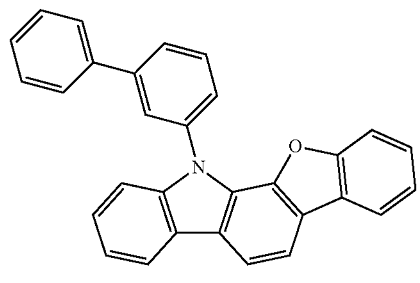
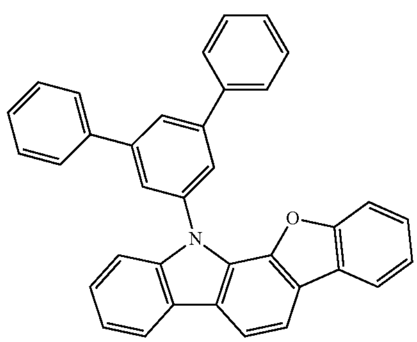
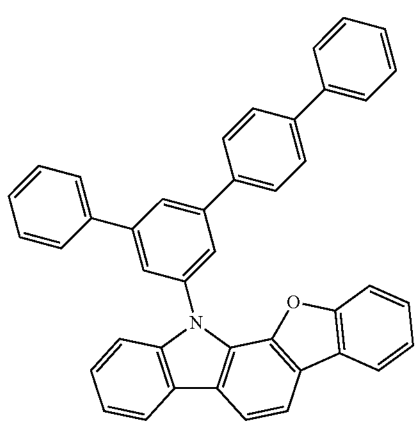

-continued
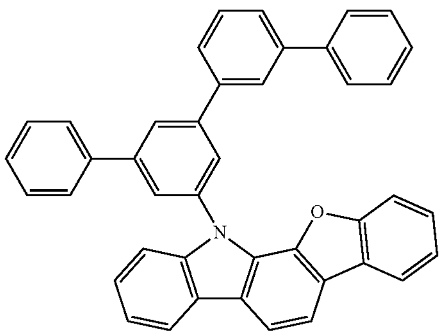
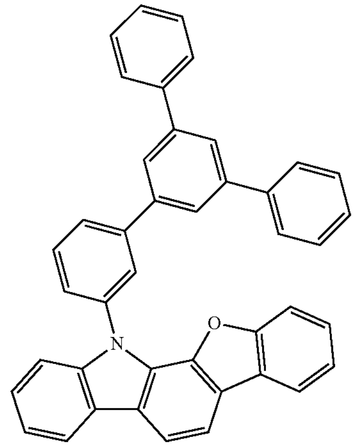
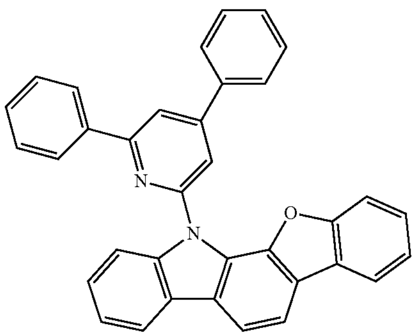
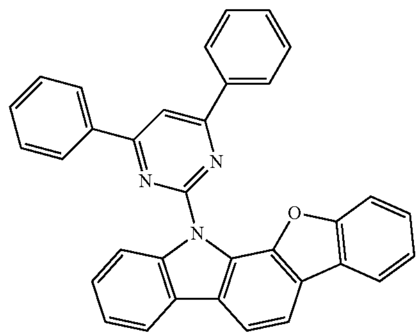
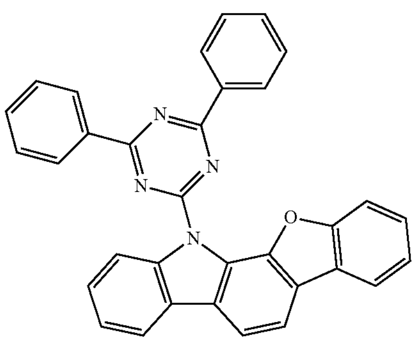
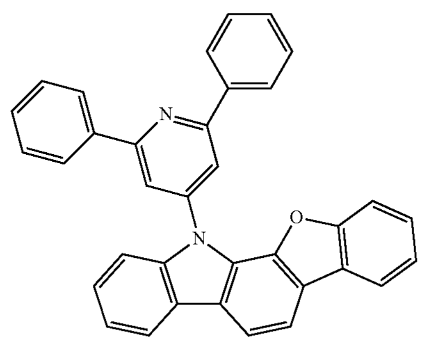
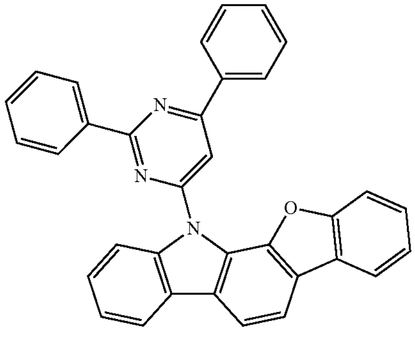
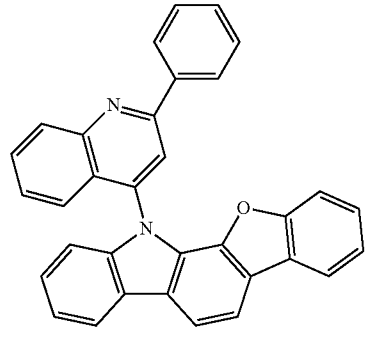

-continued
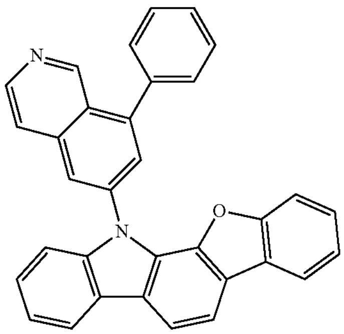
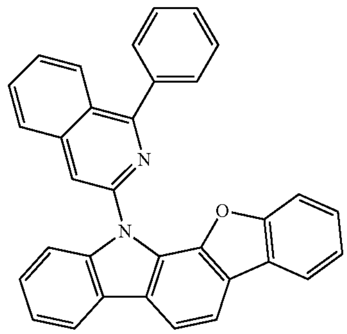
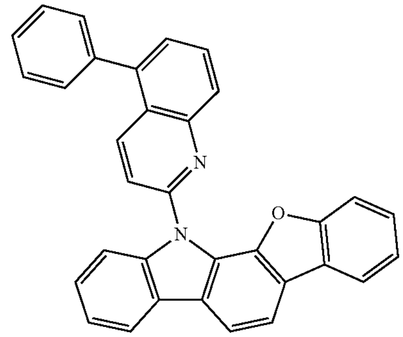
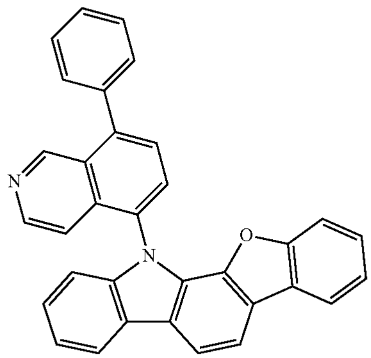
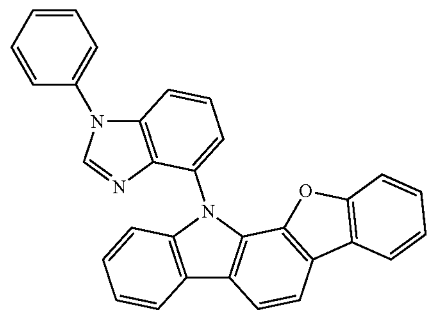
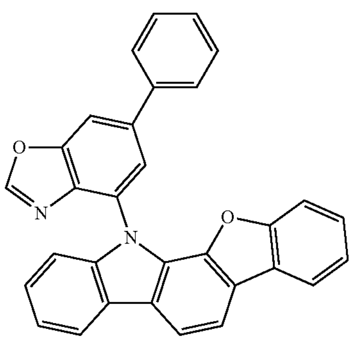
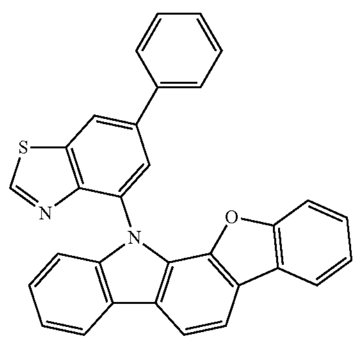
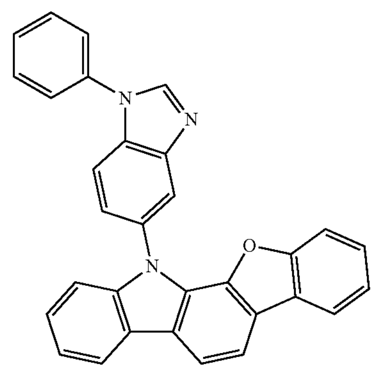
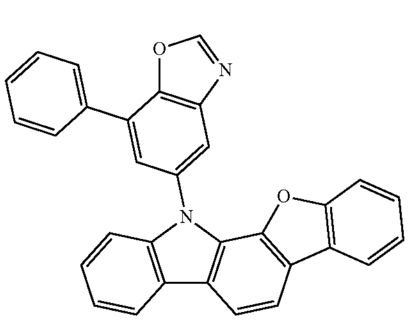
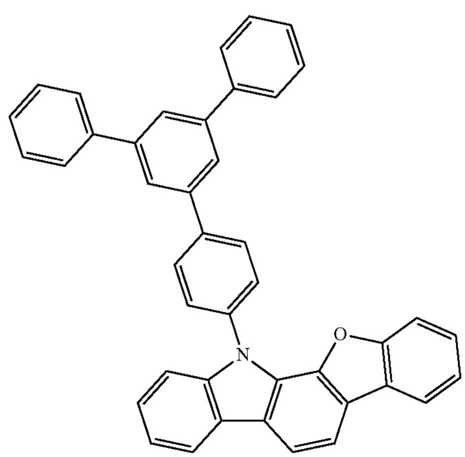

-continued
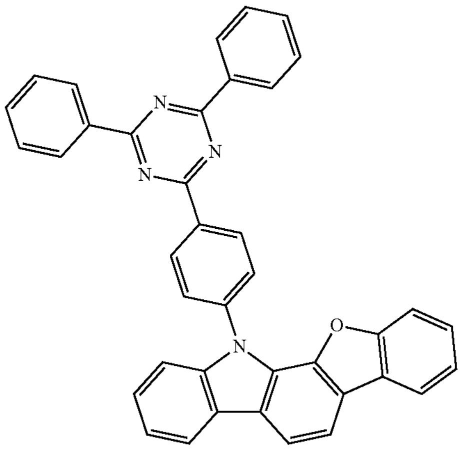
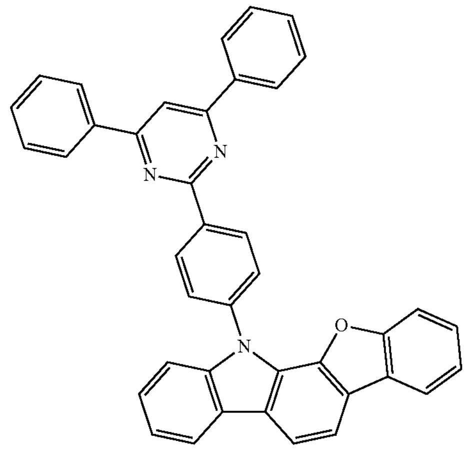
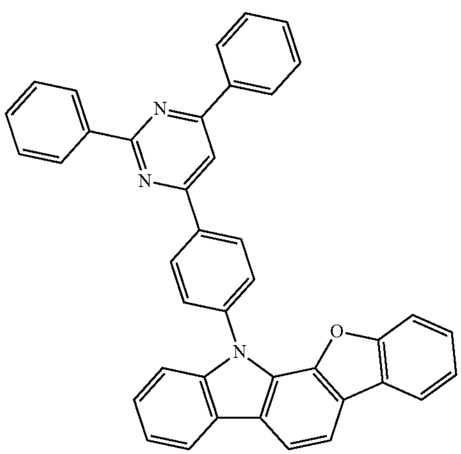
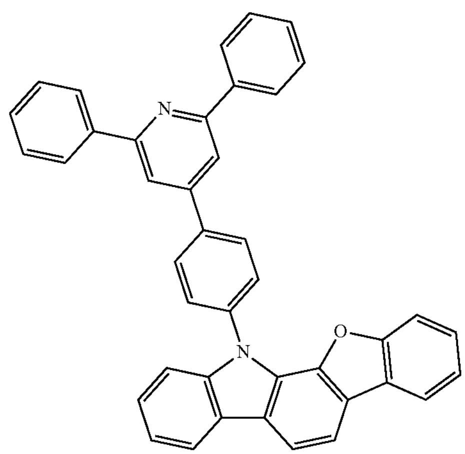
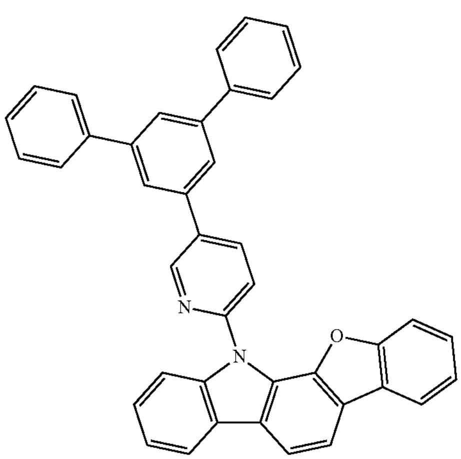
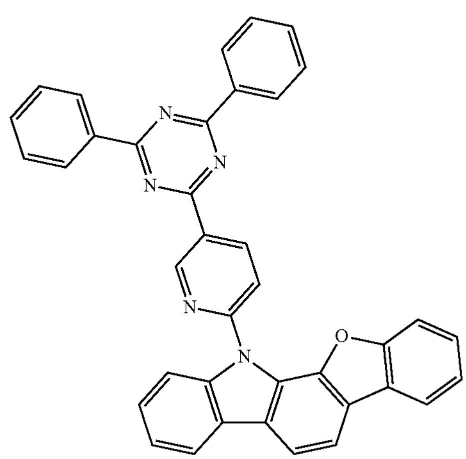

-continued
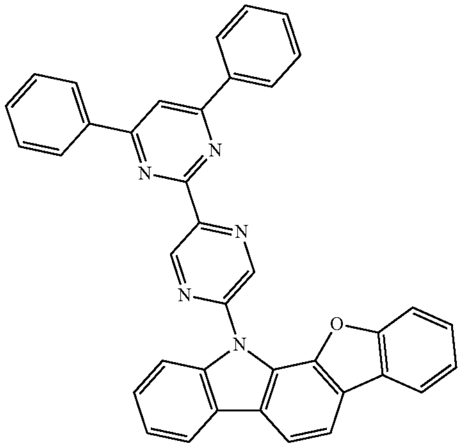
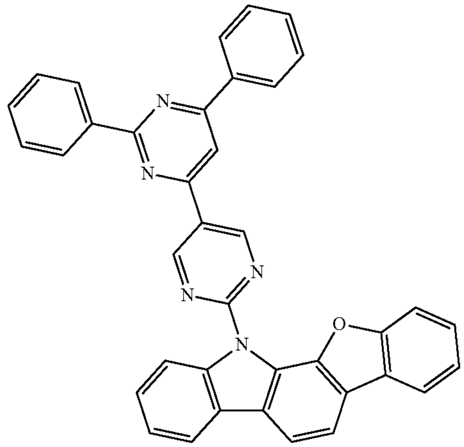
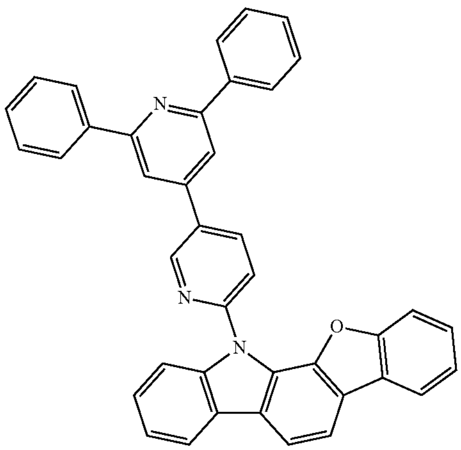
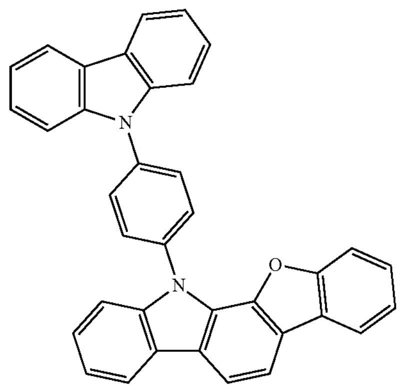
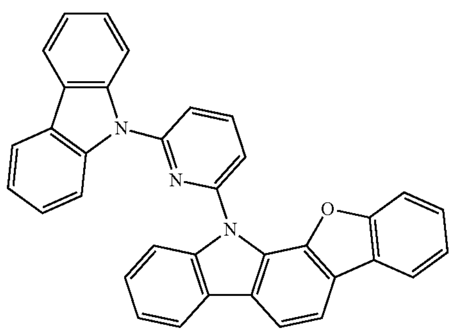
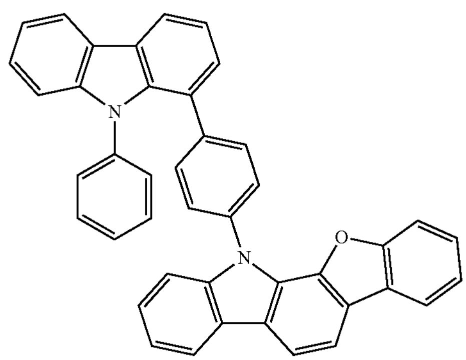
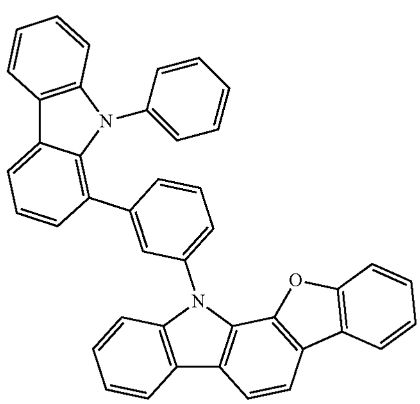
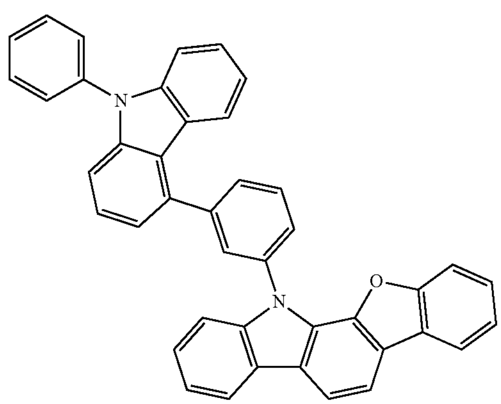

-continued
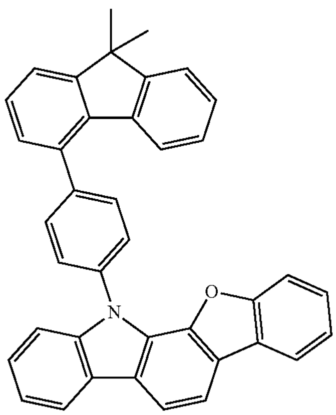
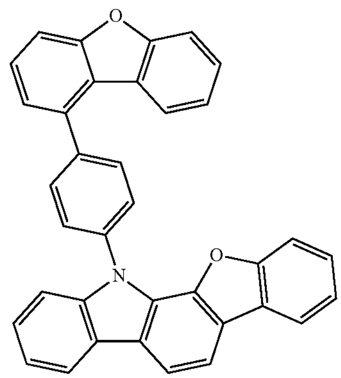
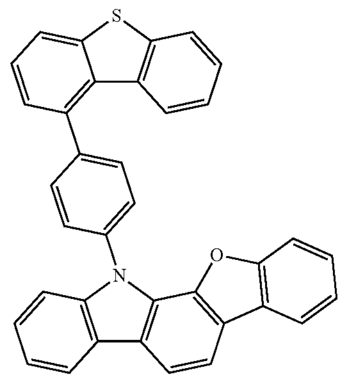
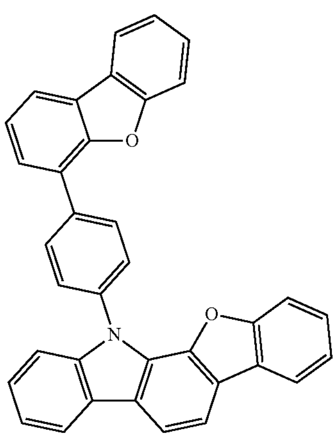
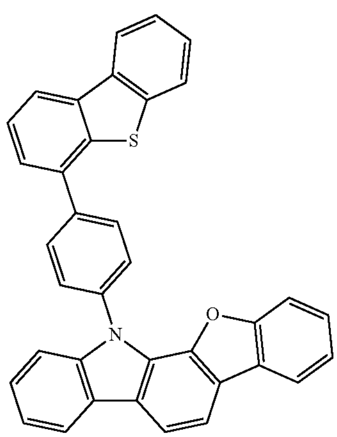
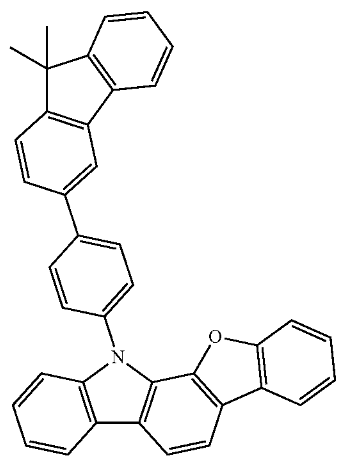
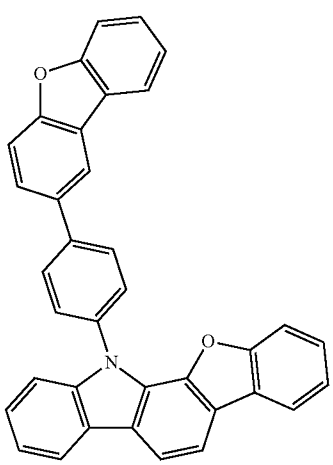
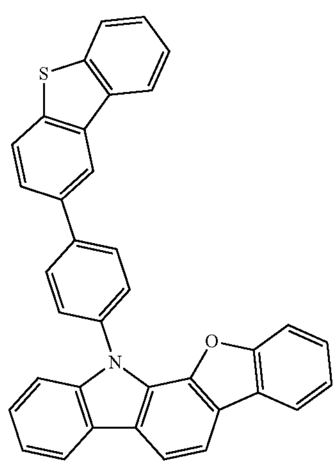
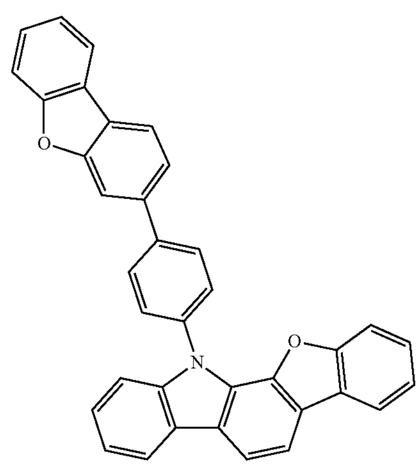

-continued
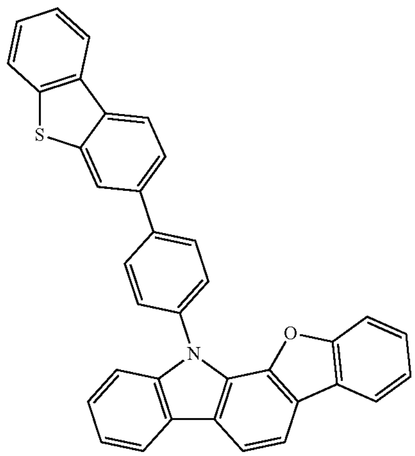
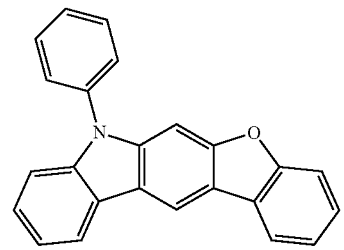
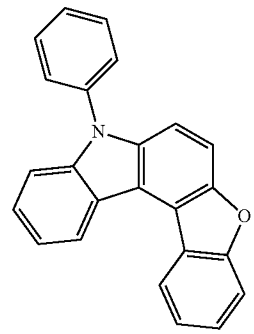
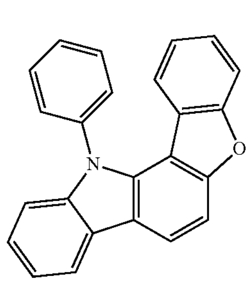
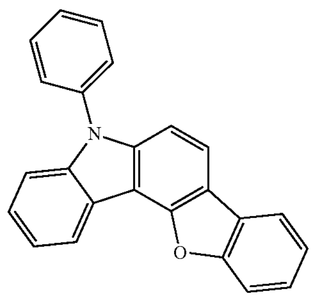
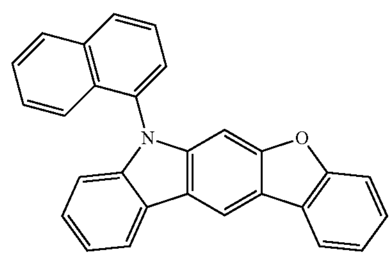
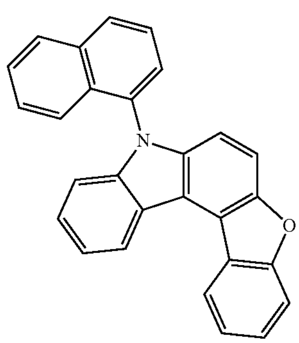
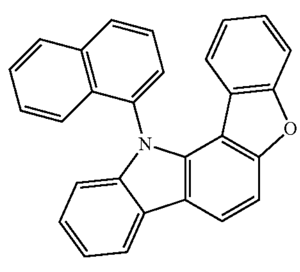
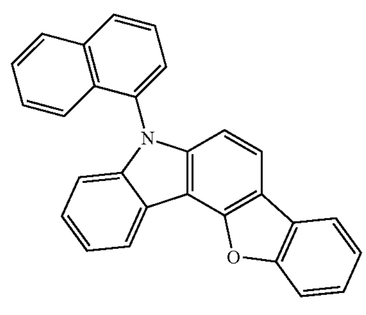
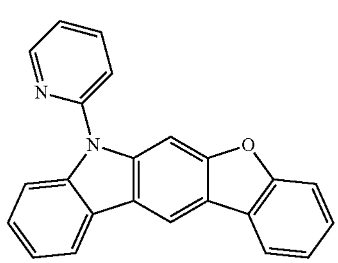
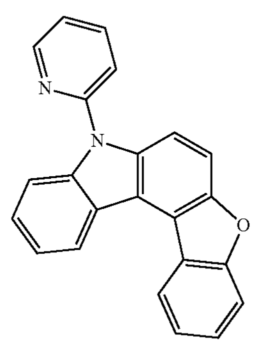
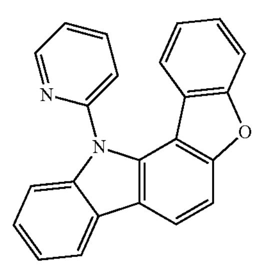

-continued
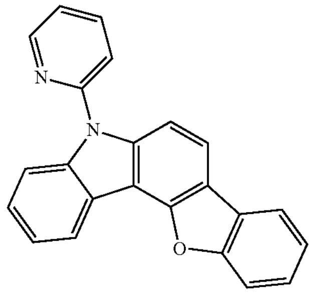
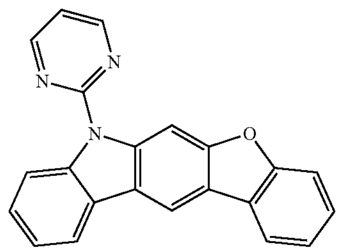
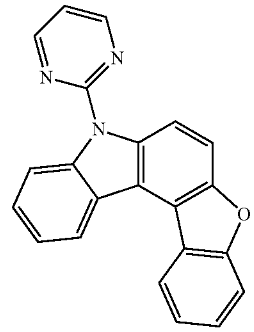
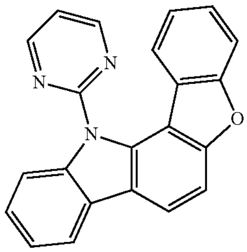
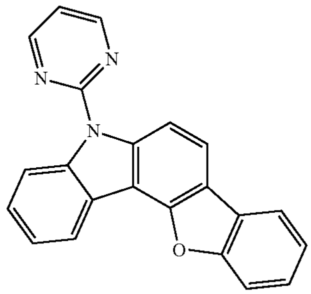
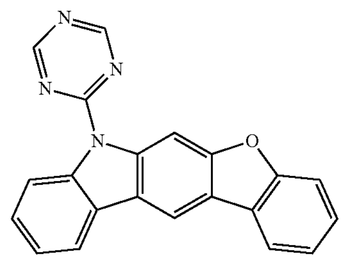
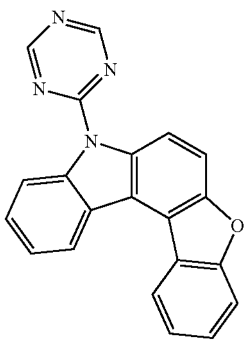
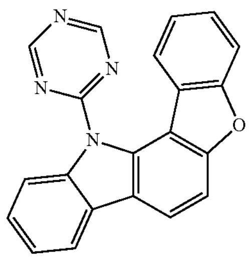
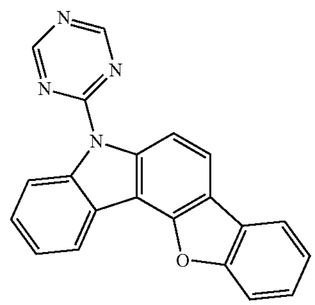
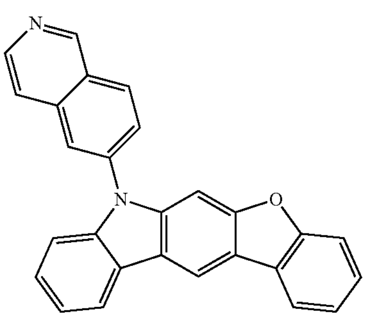
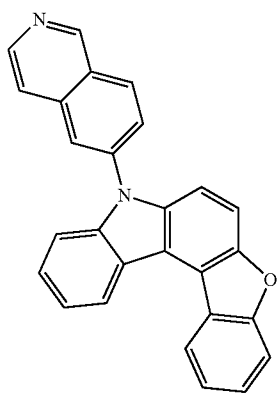
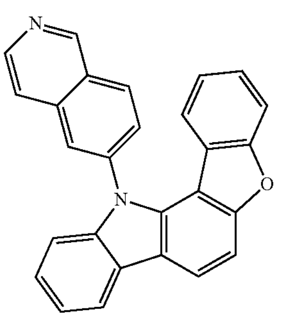
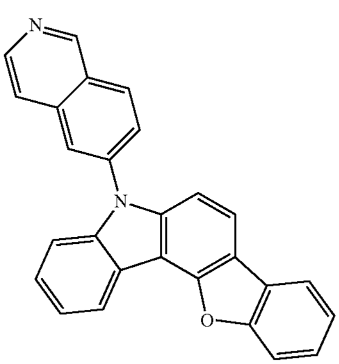
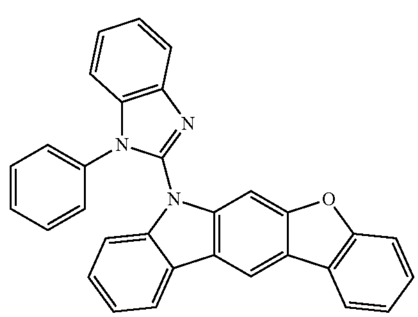

-continued
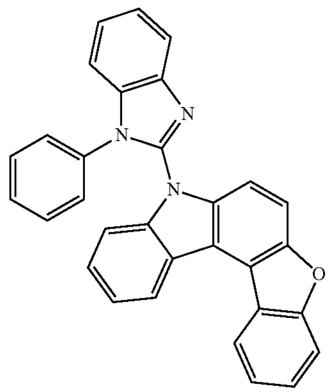
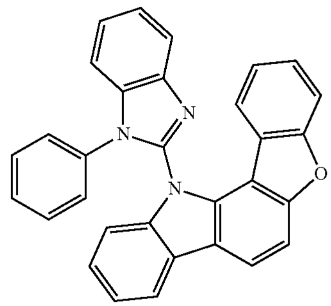
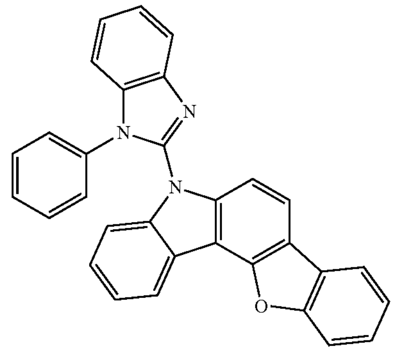
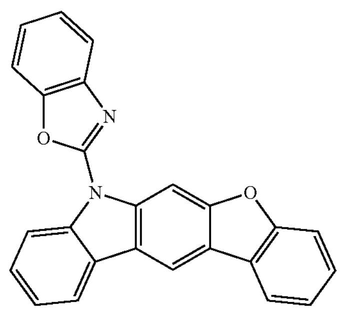
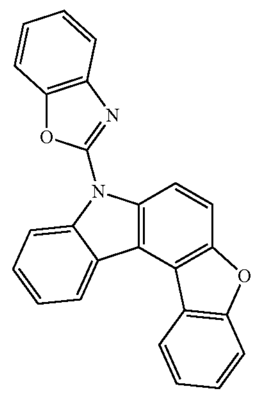
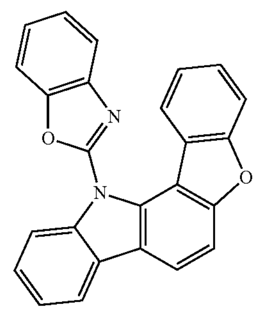
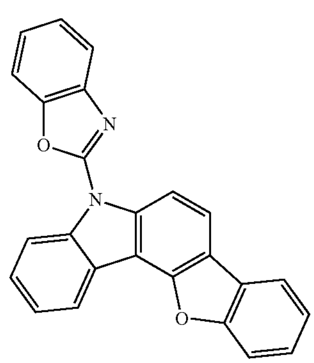
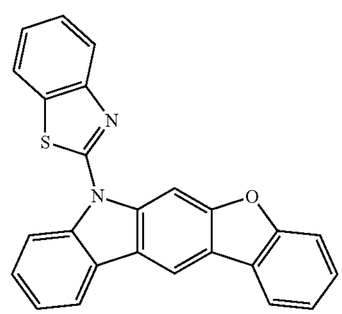
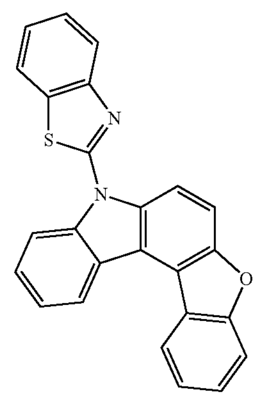
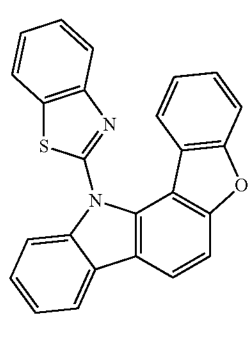
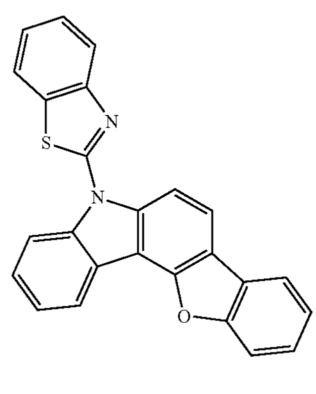
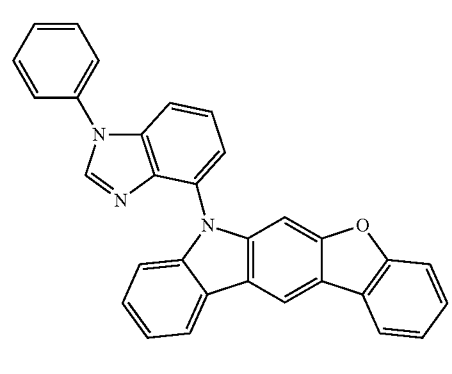

-continued
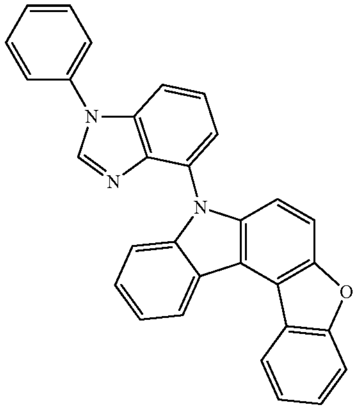
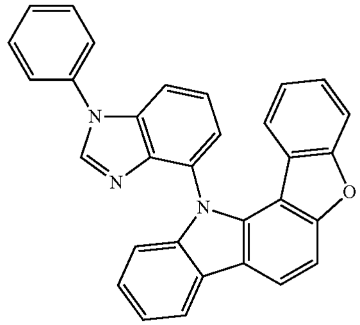
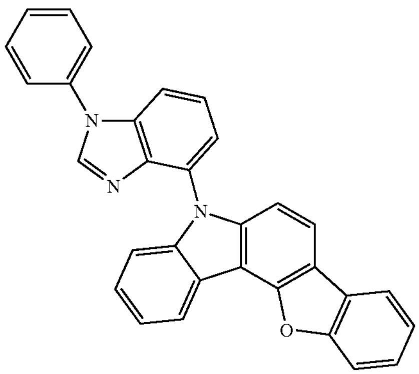
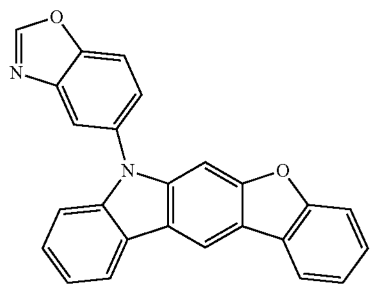
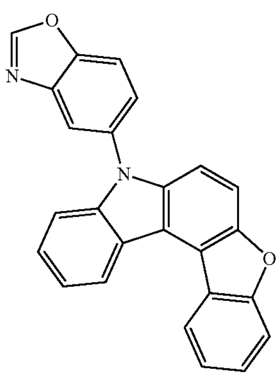
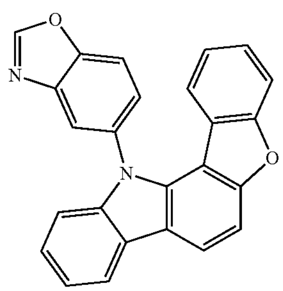
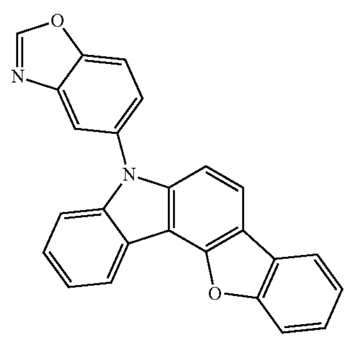
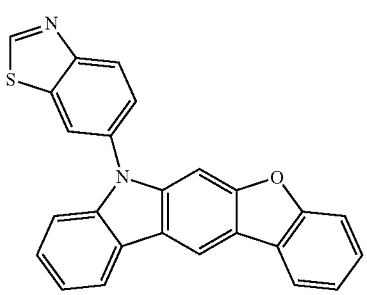
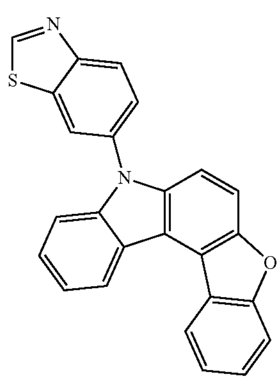
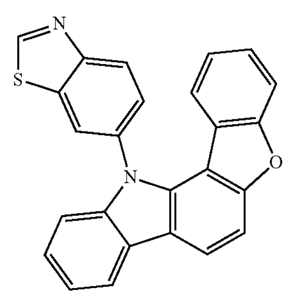

-continued
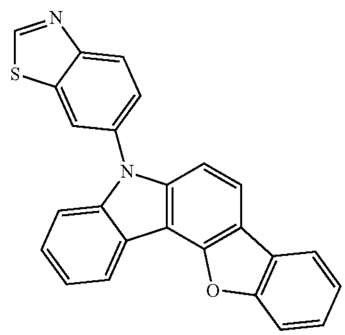
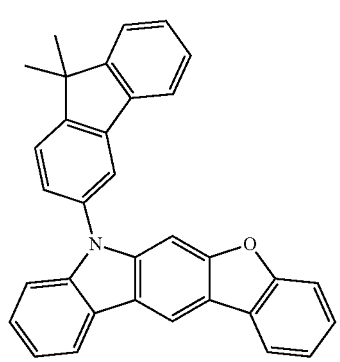
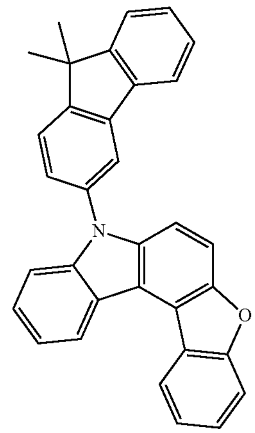
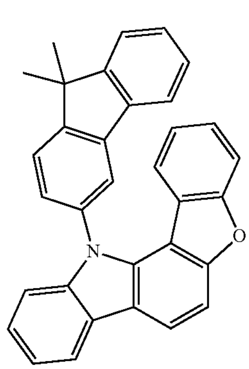
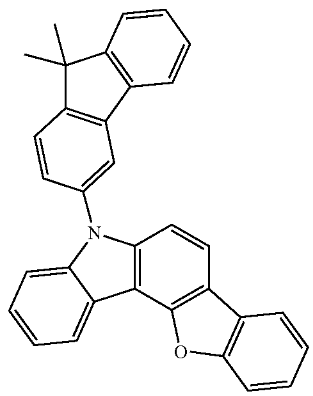
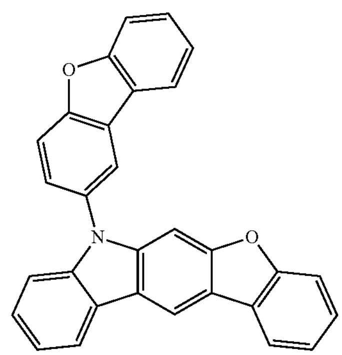
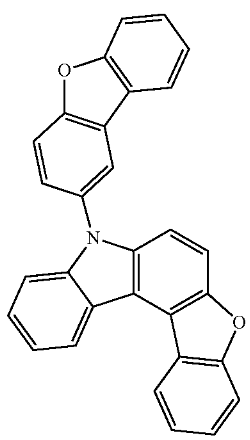
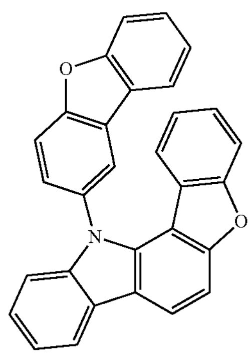
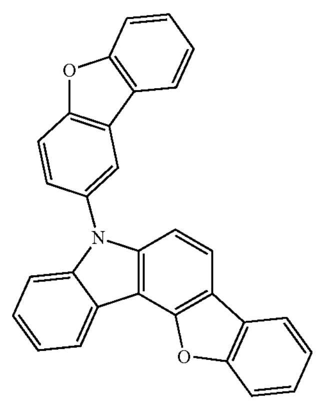
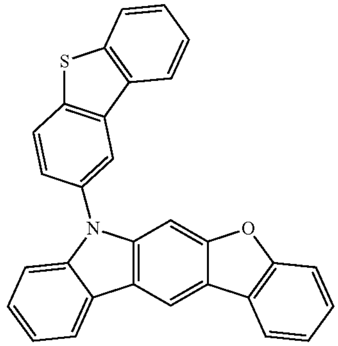
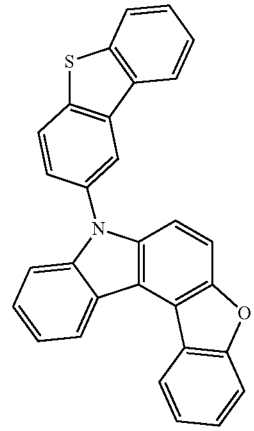
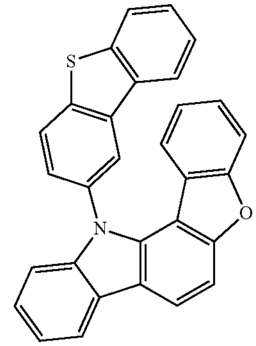

-continued
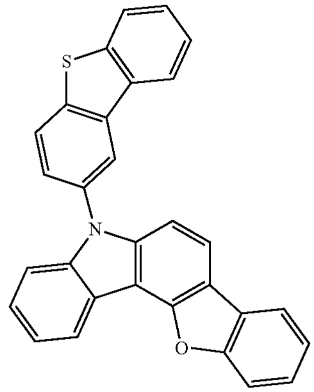
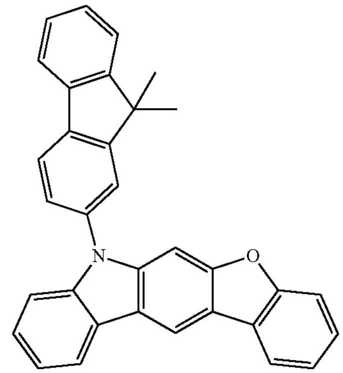
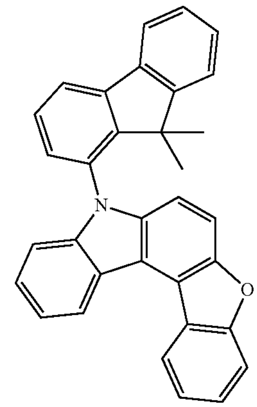
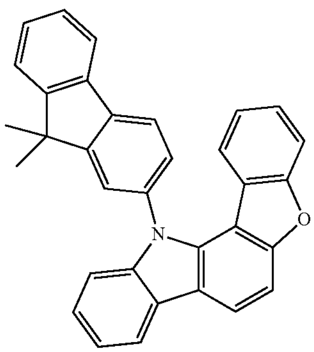
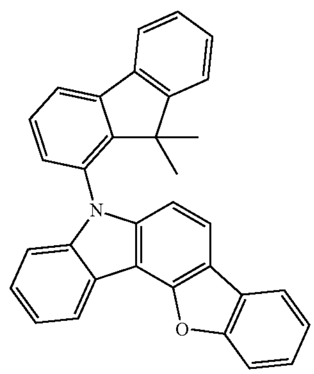
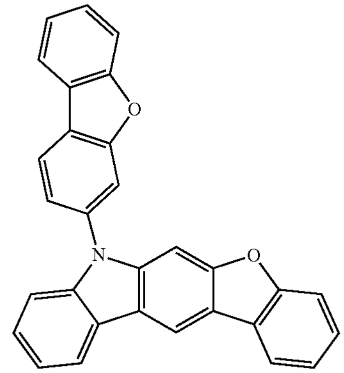
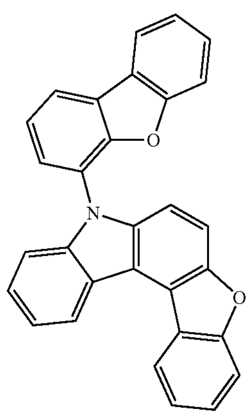
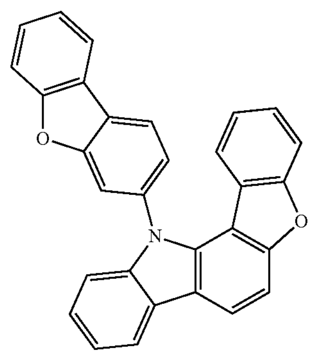
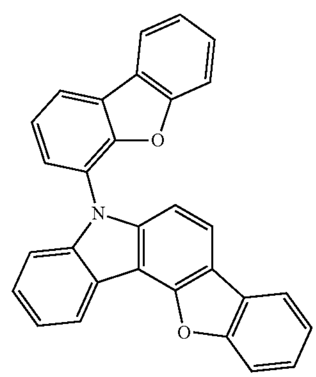
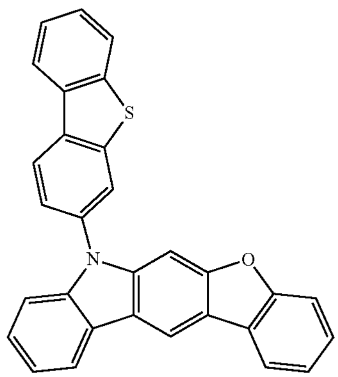
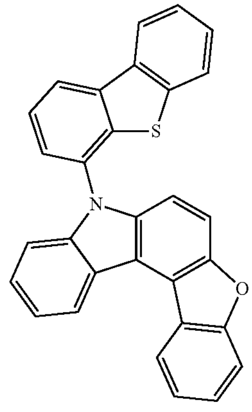
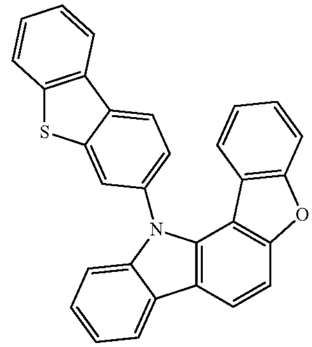

-continued
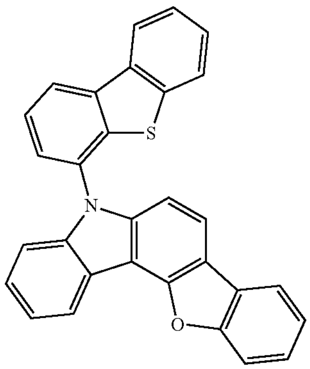
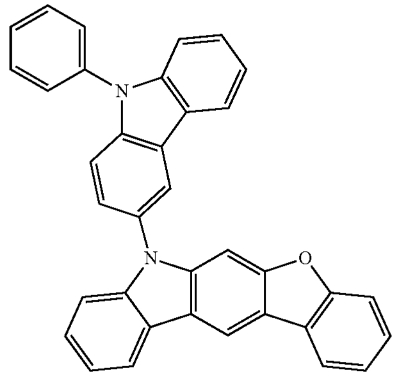
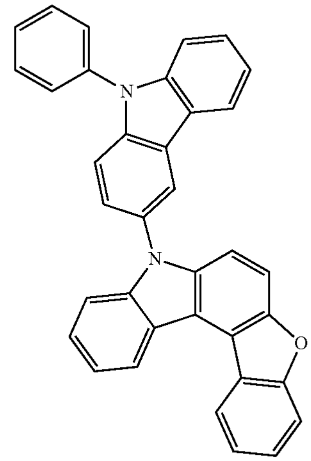
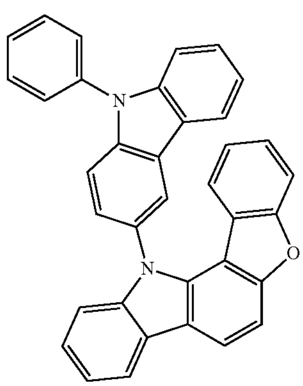
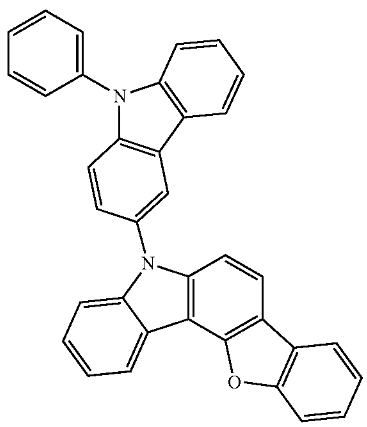
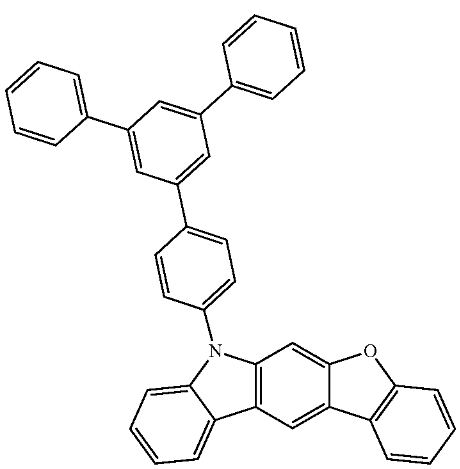
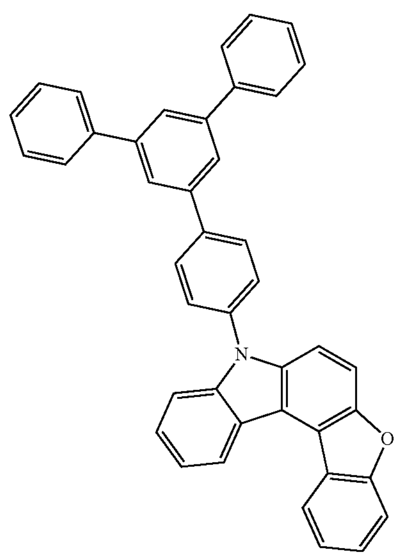

-continued
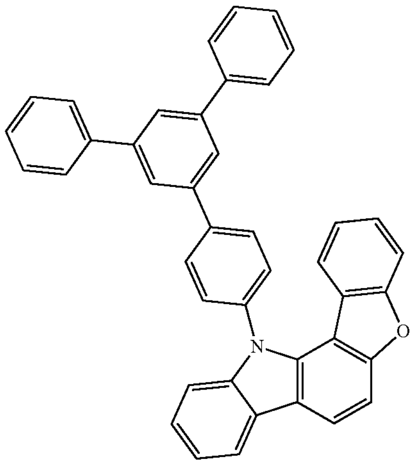
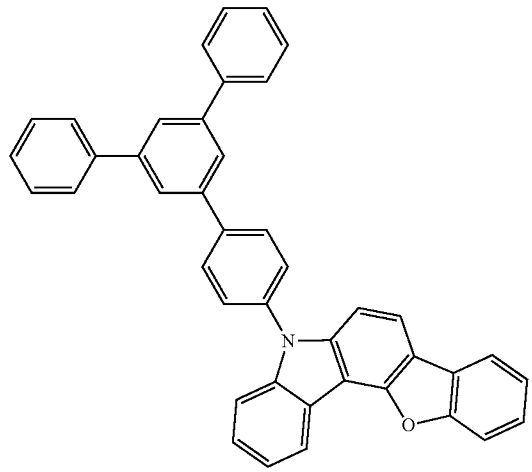
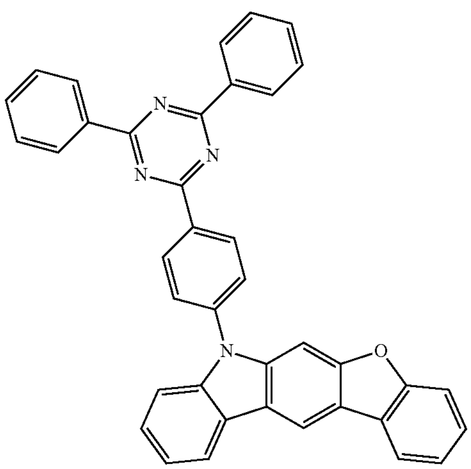
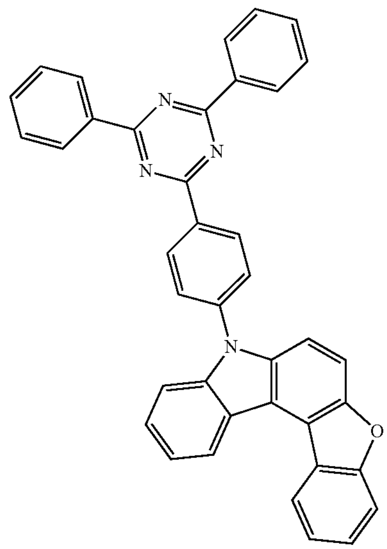
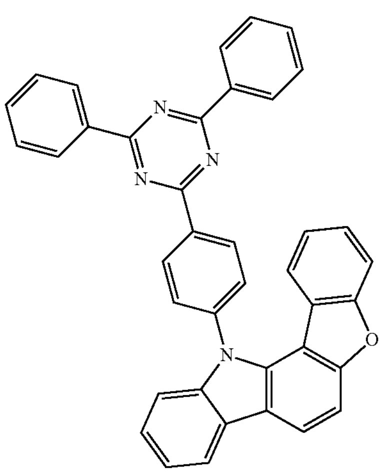
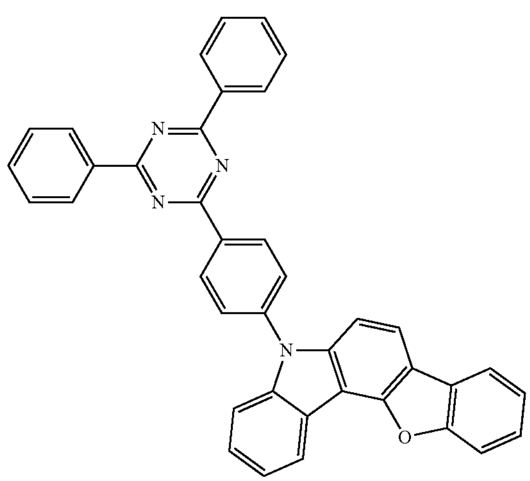

-continued
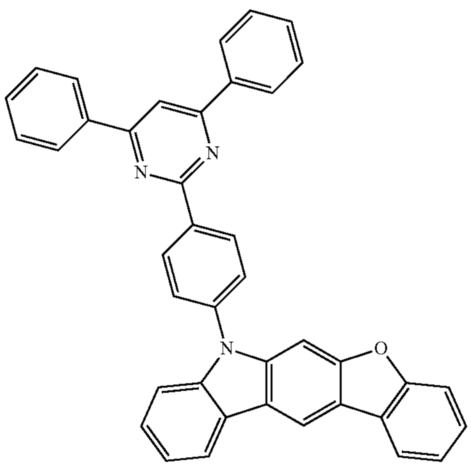
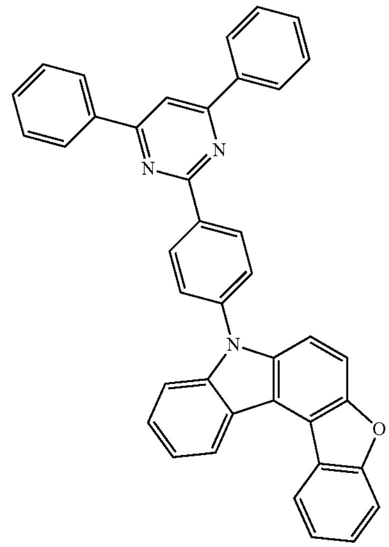
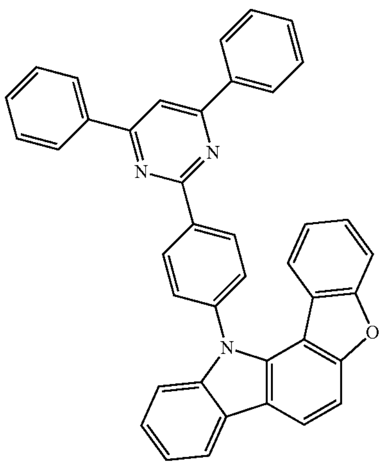
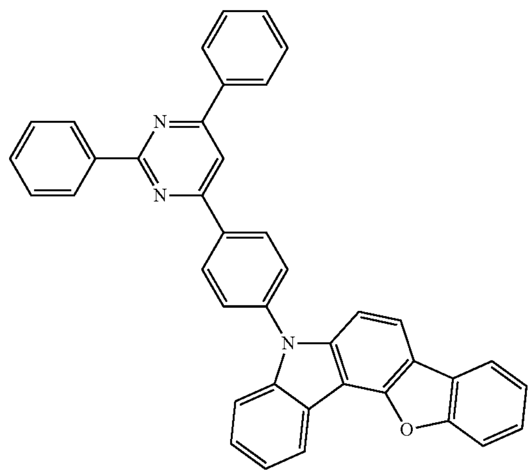
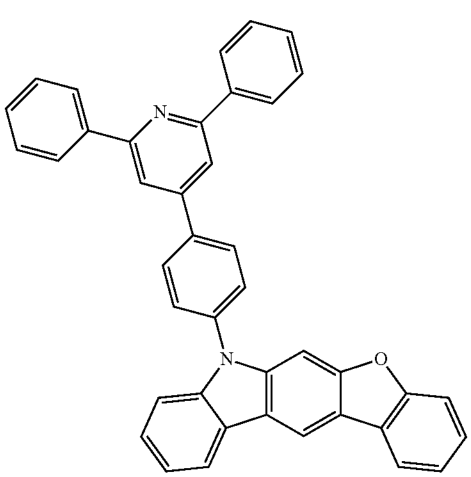
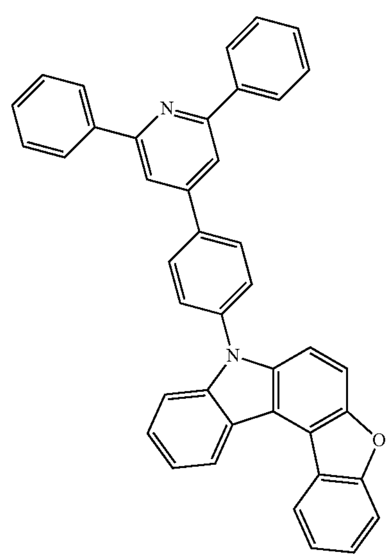

-continued
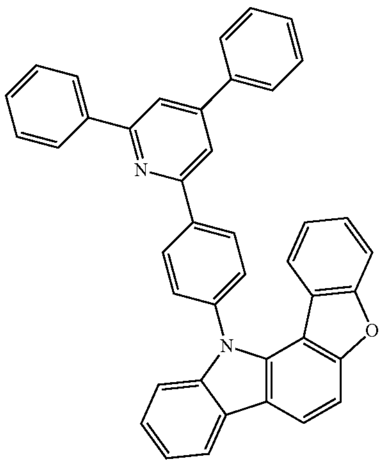
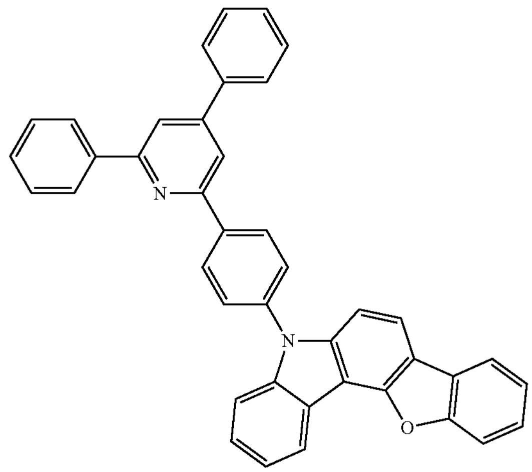
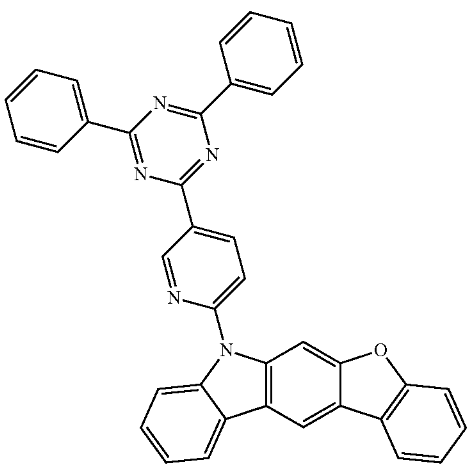
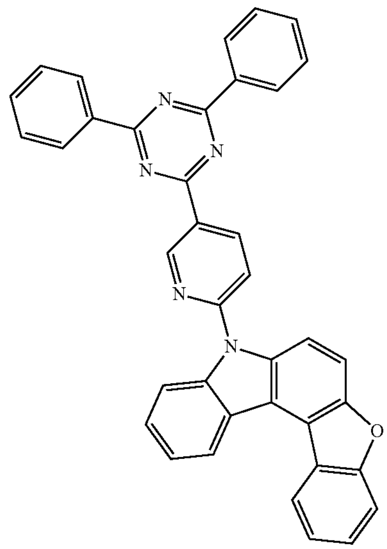
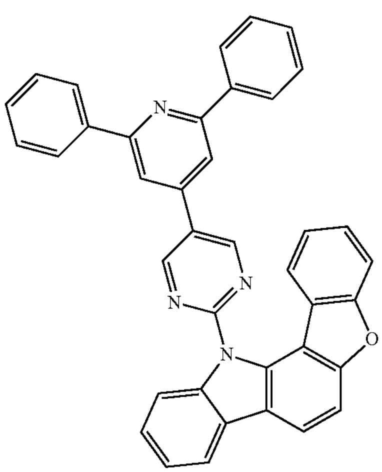
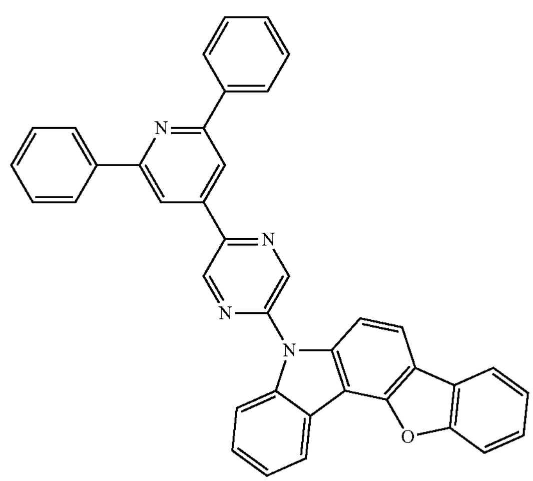

-continued
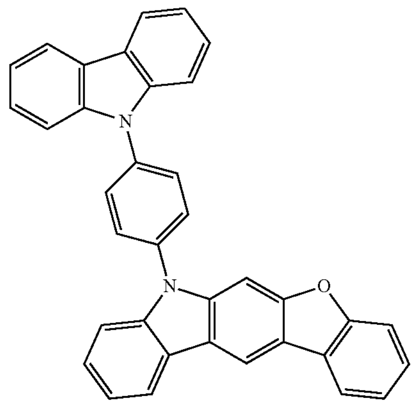
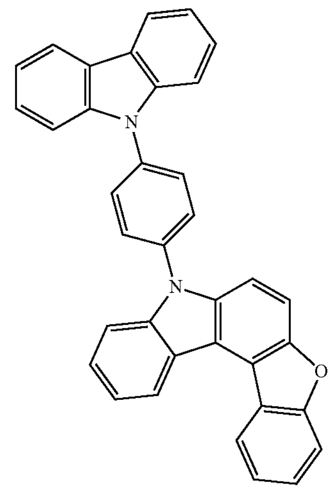
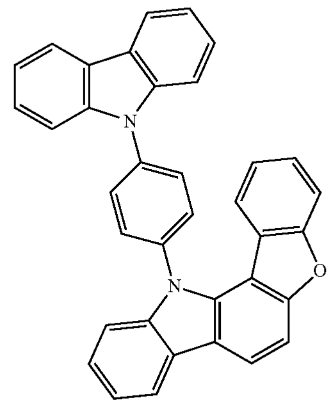
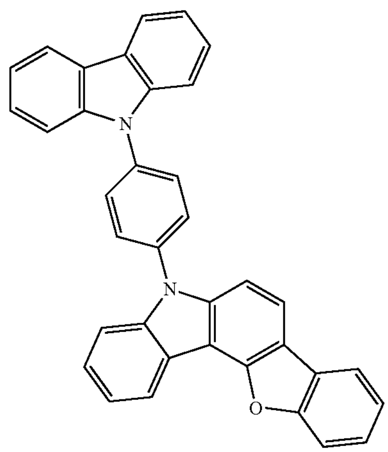
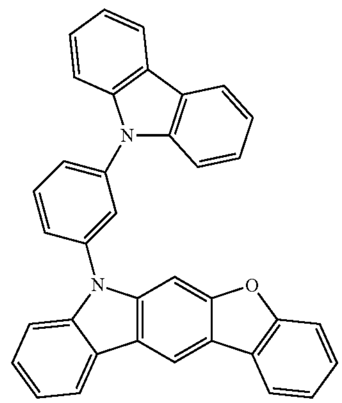
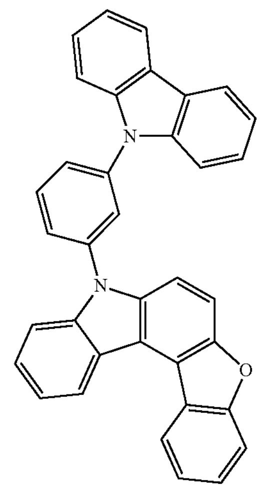
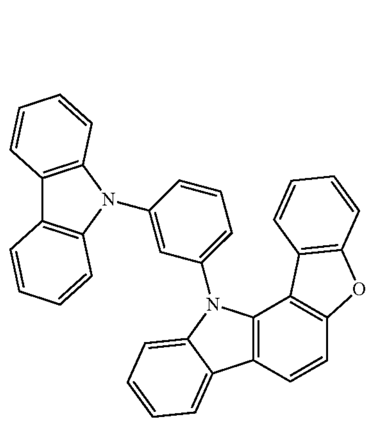
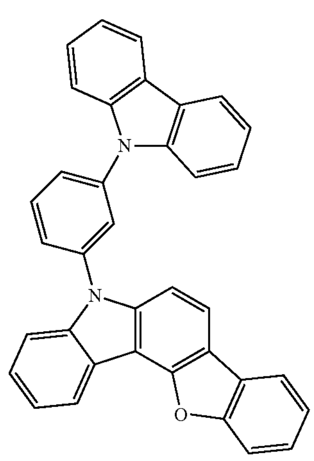
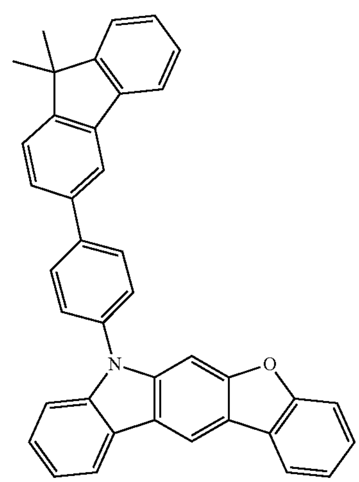

-continued
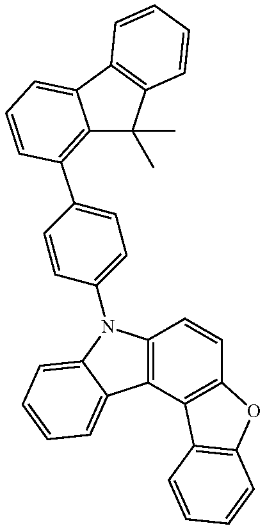
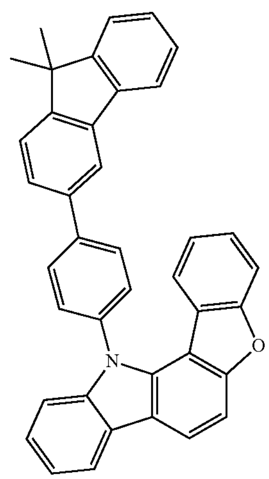
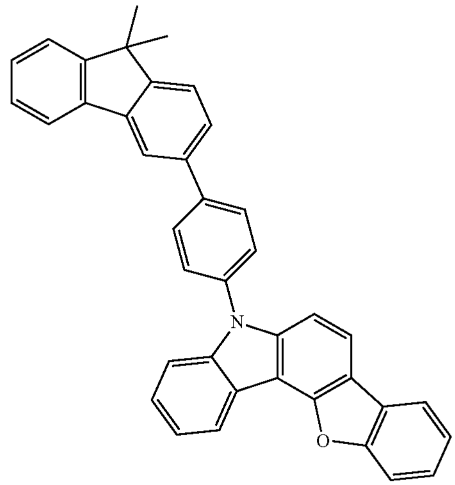
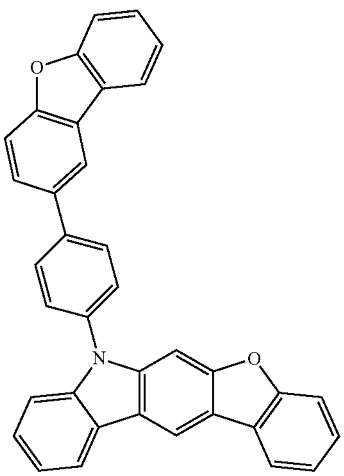
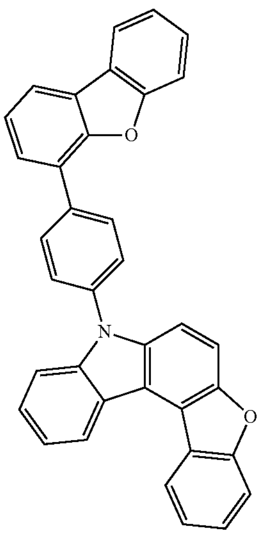
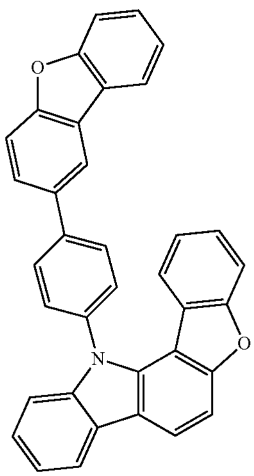
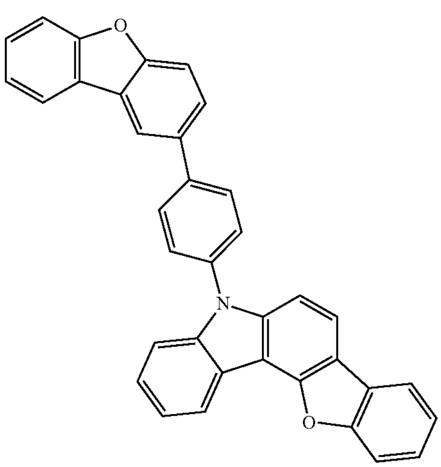
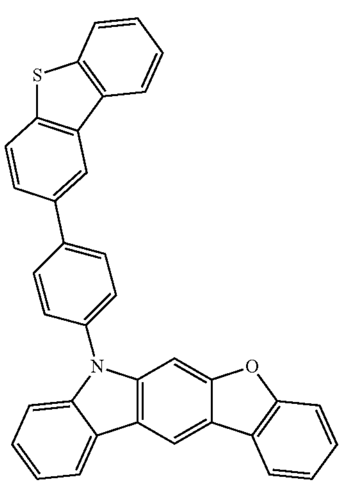

-continued
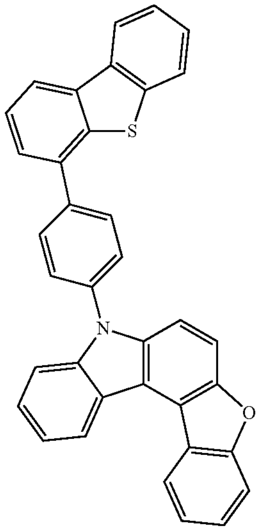
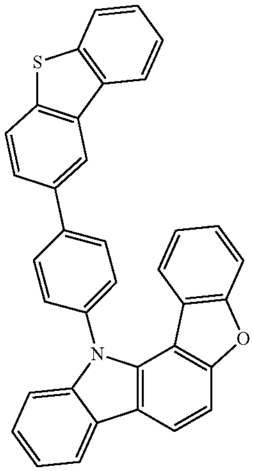
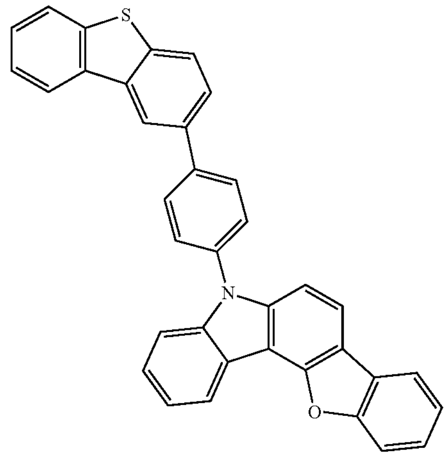
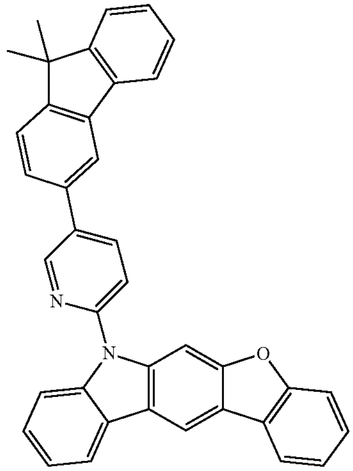
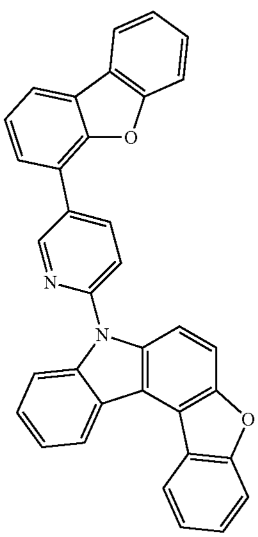
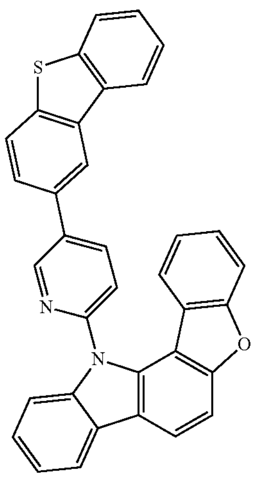
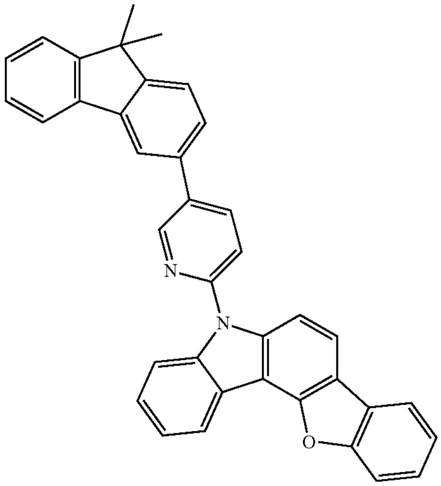
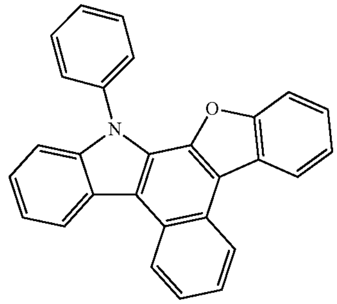
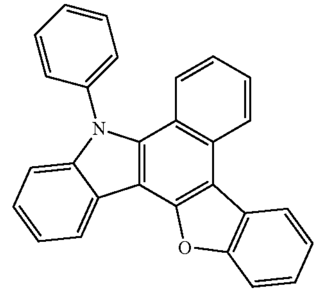

-continued
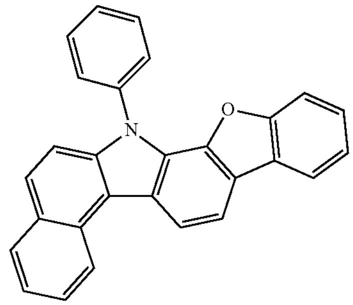
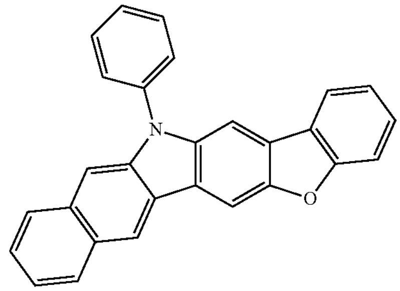
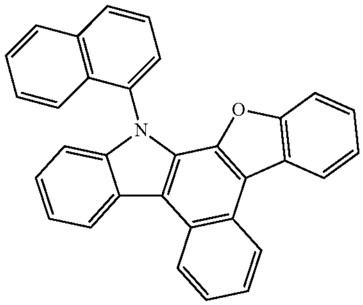
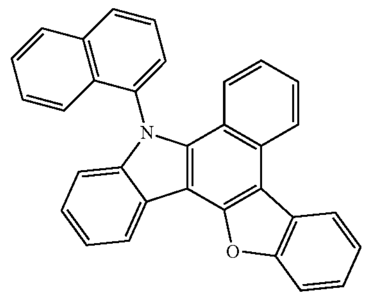
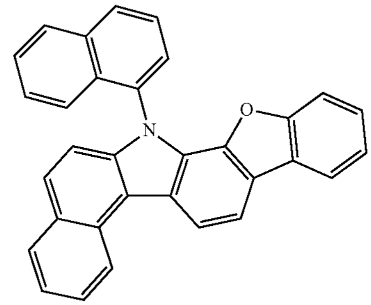
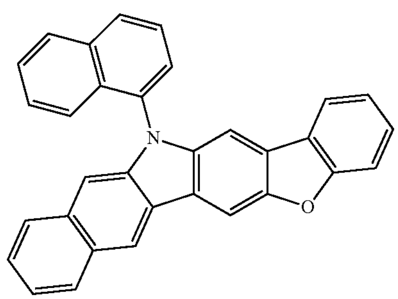
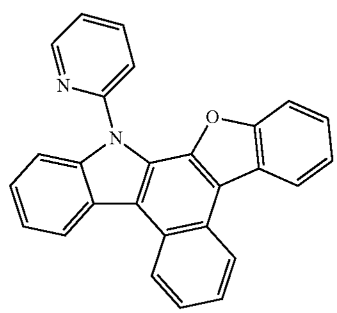
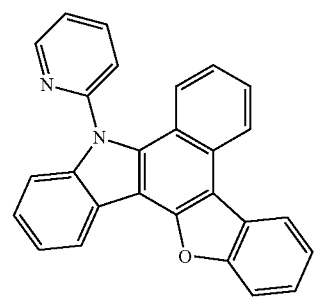
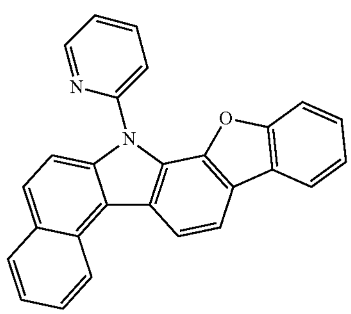
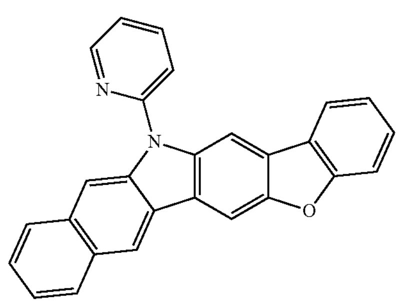
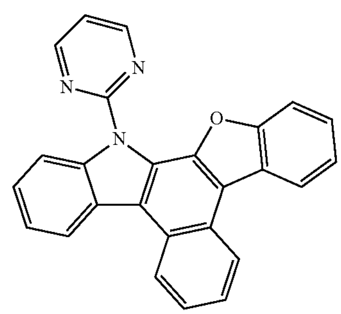
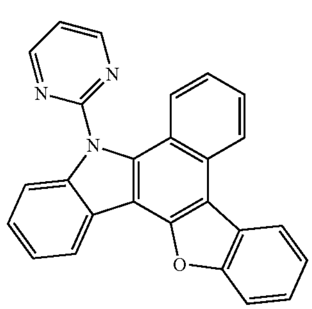
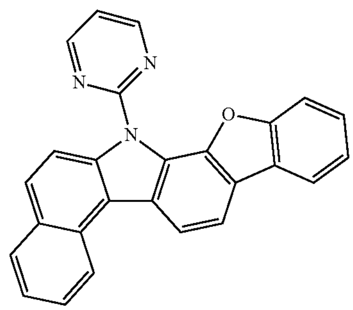
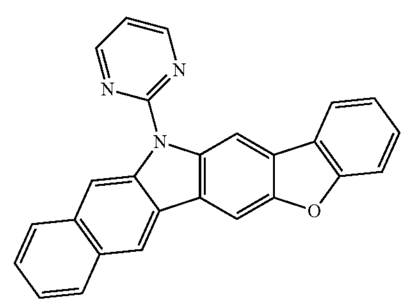

-continued
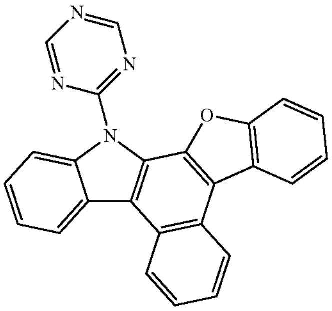
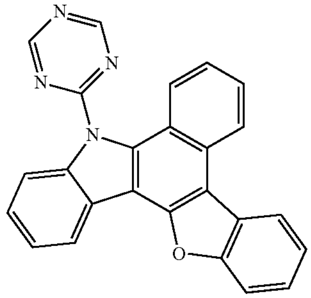
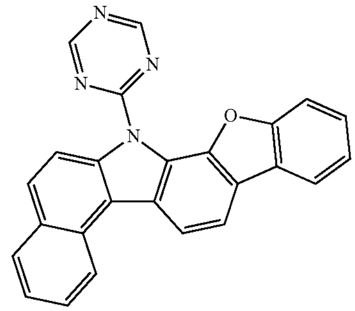
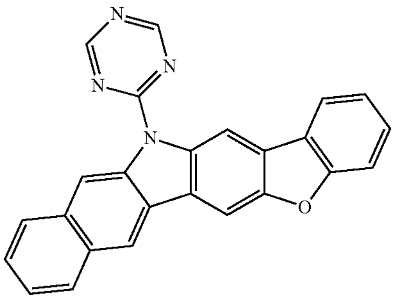
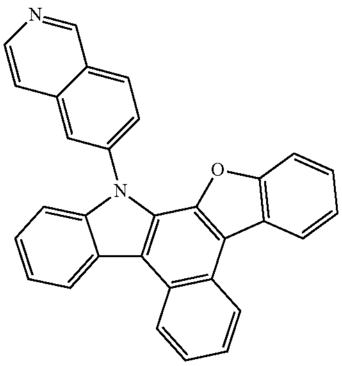
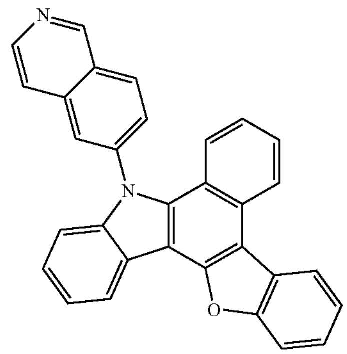
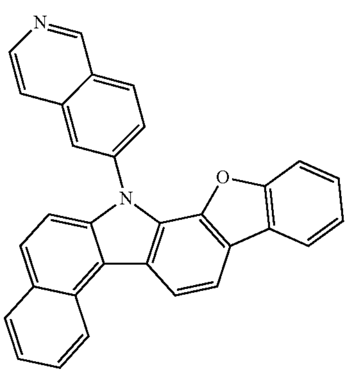
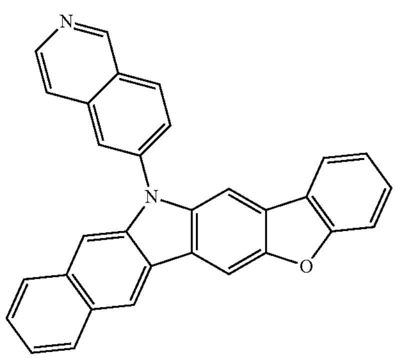
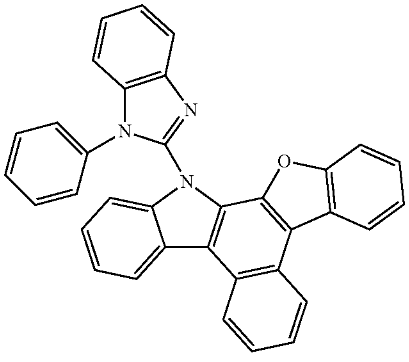
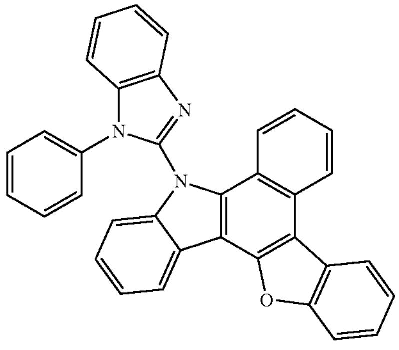

-continued
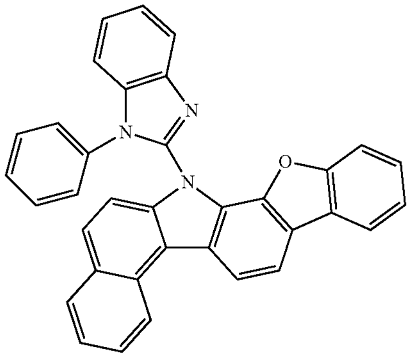
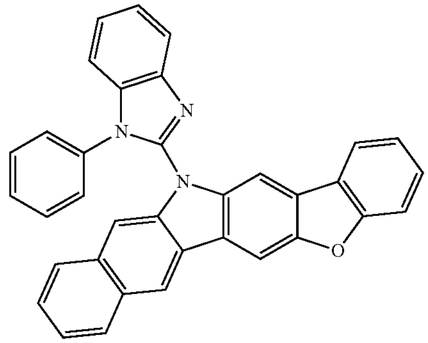
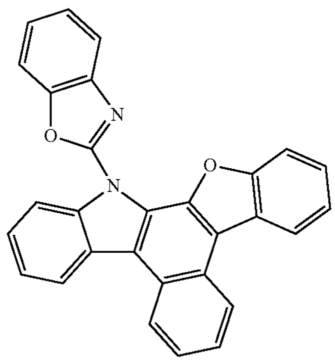
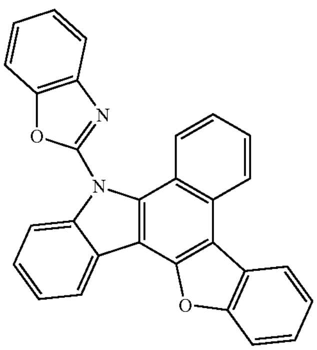
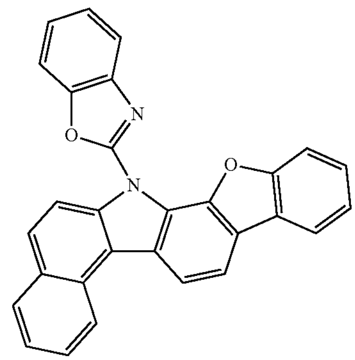
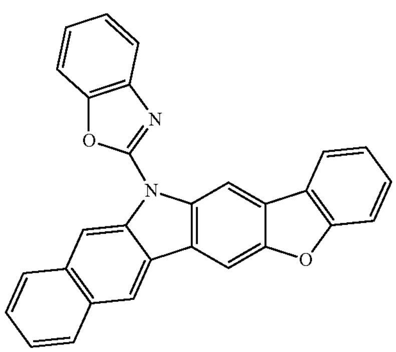
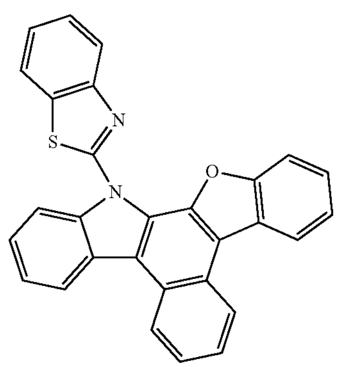
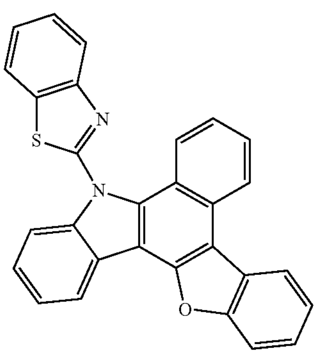
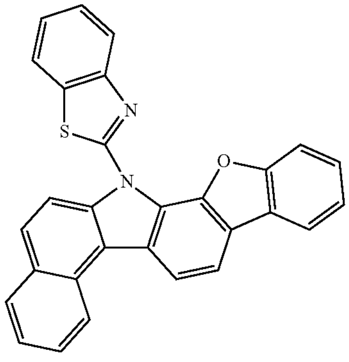
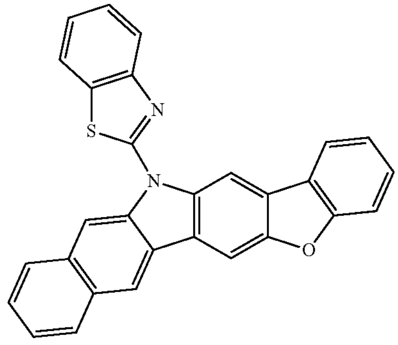

-continued
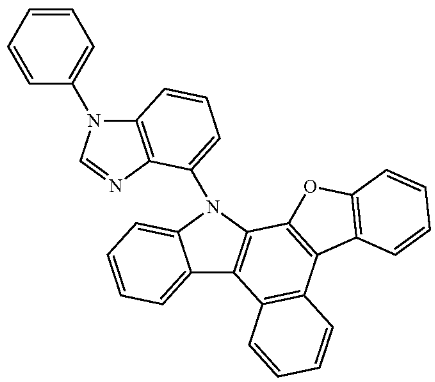
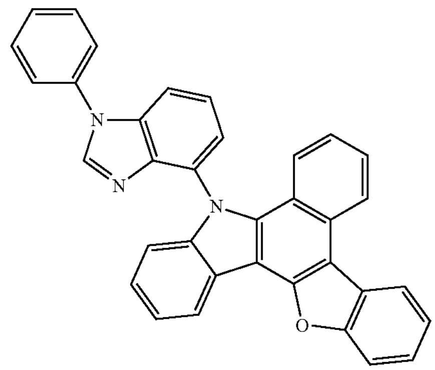
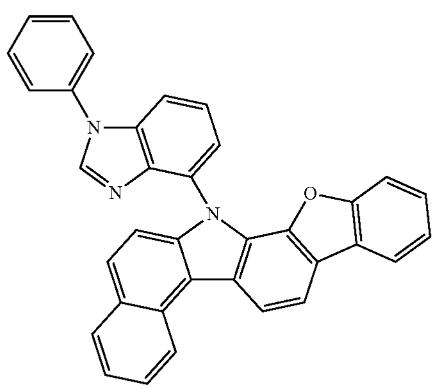
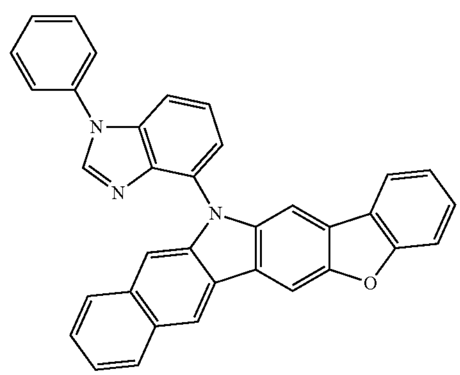
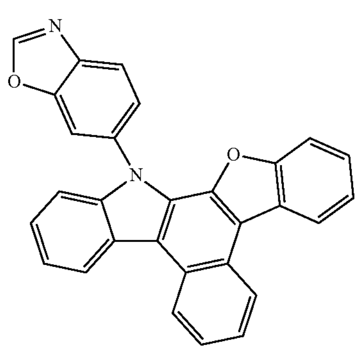
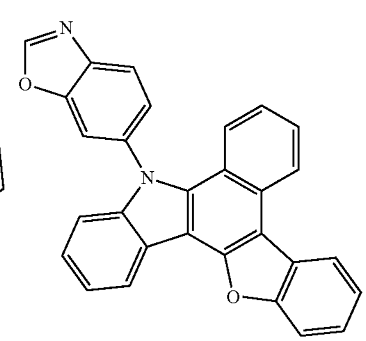
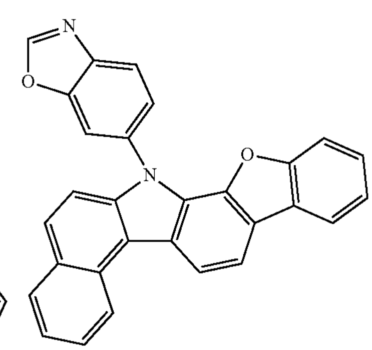
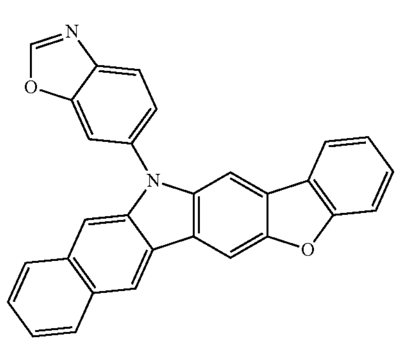
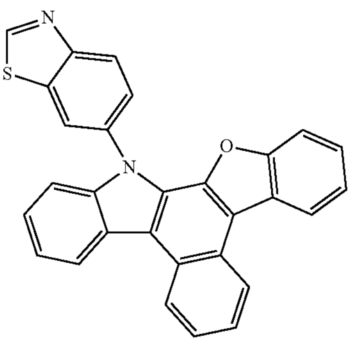
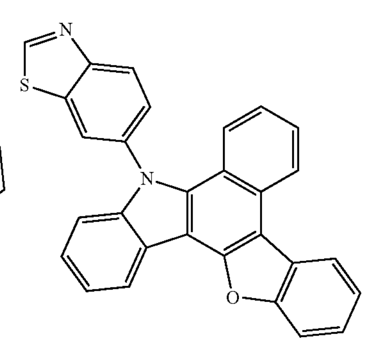

-continued
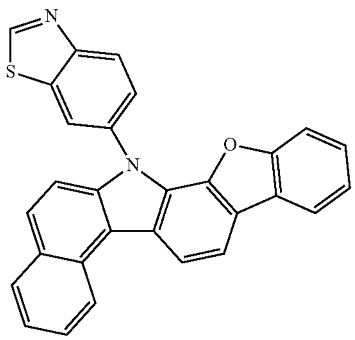
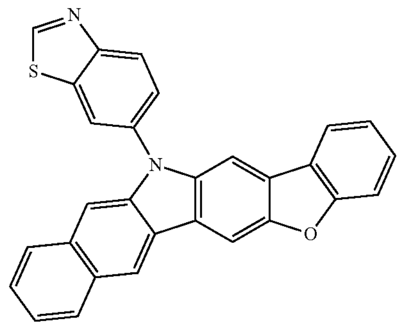
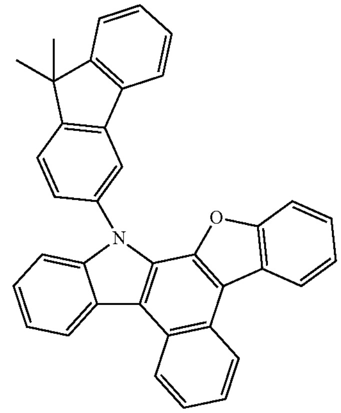
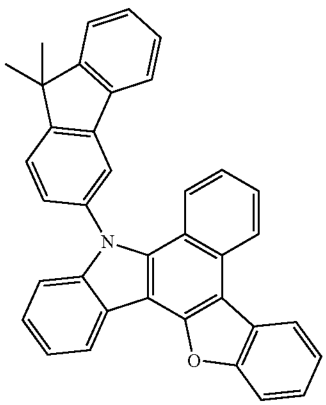
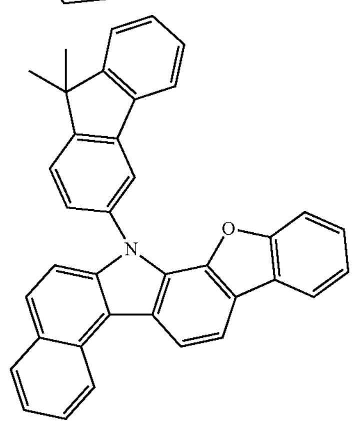
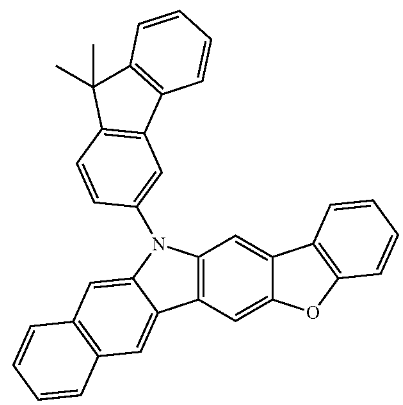
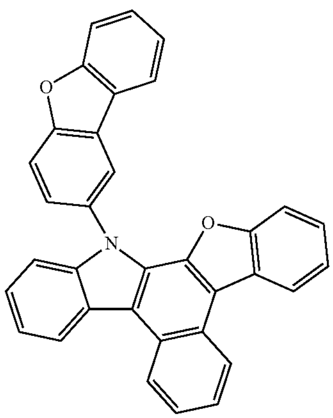
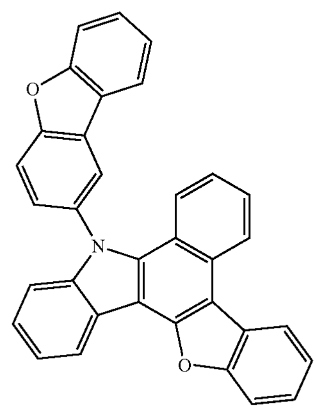
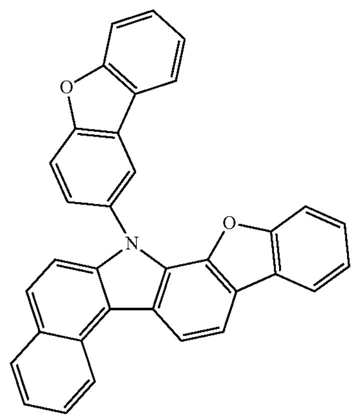
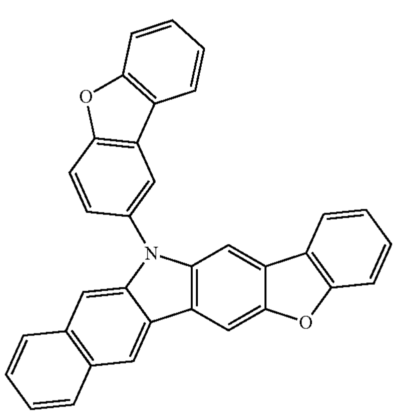
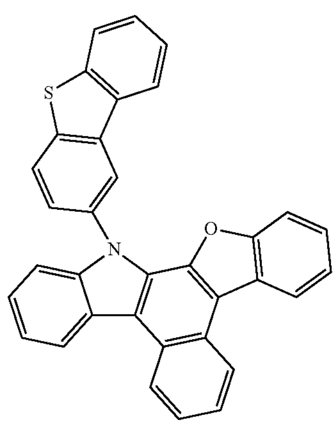
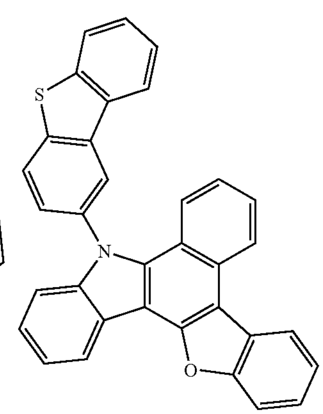

-continued
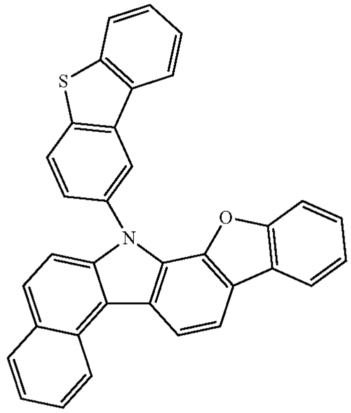
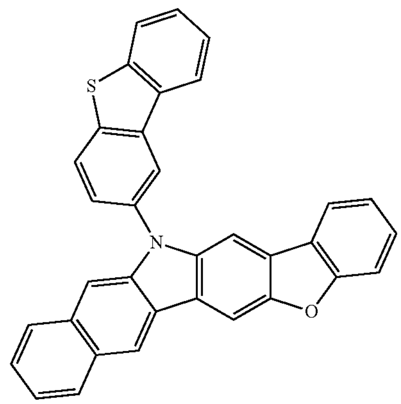
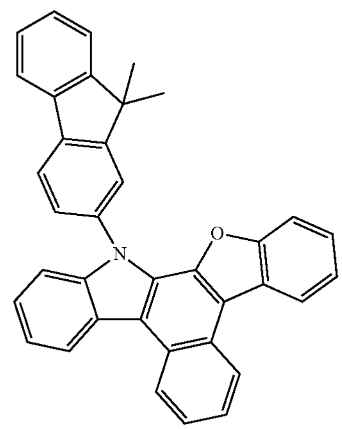
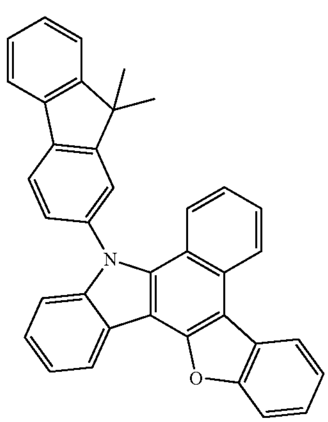
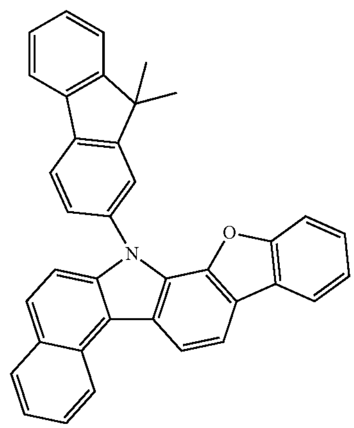
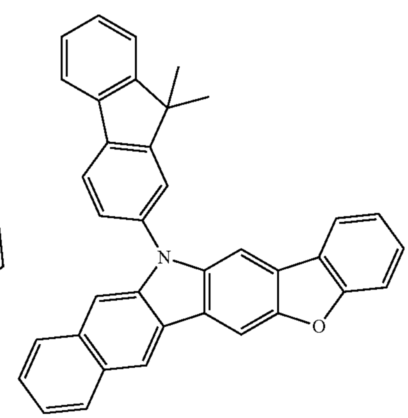
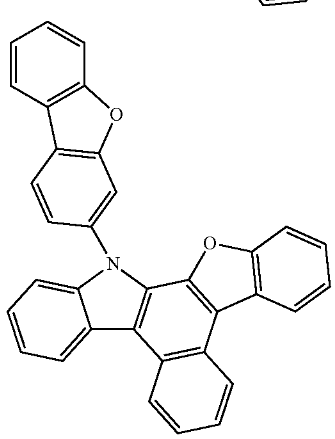
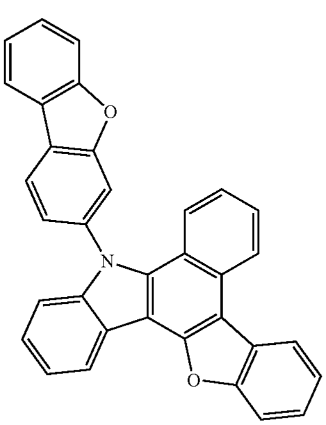
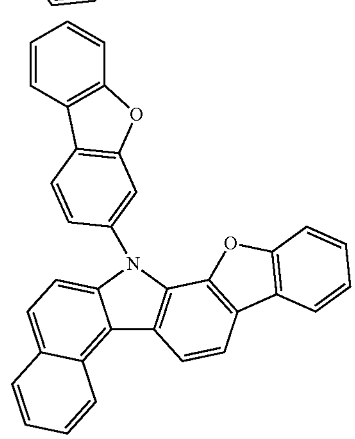
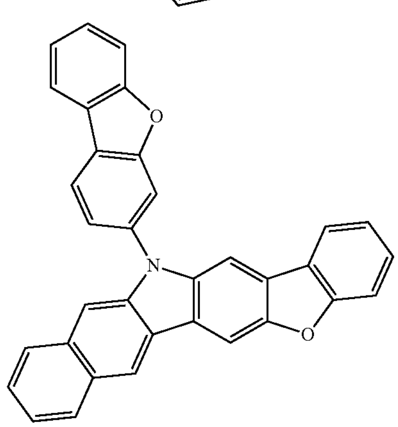
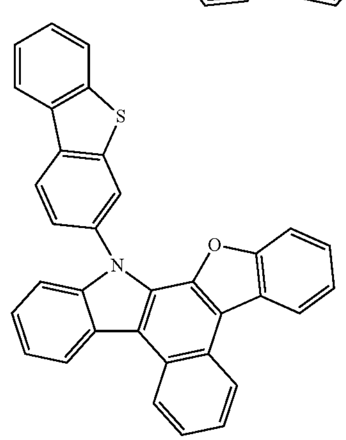
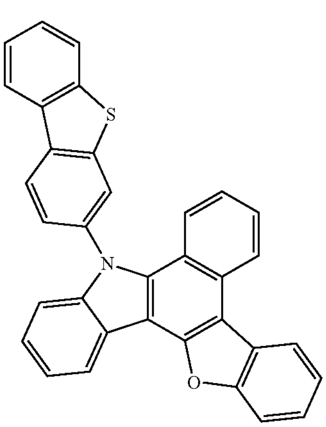

-continued
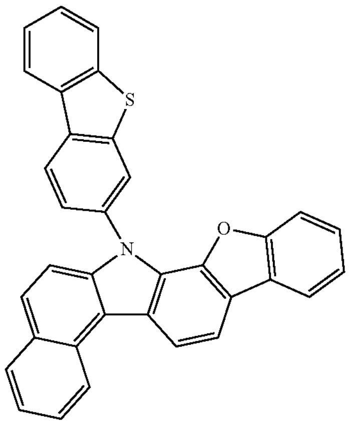
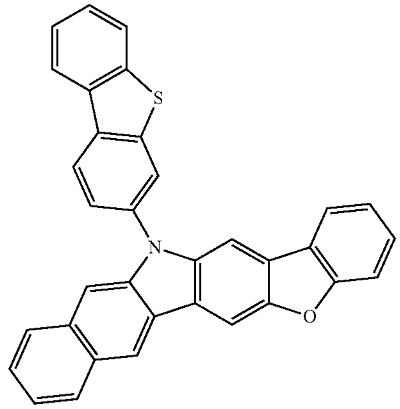
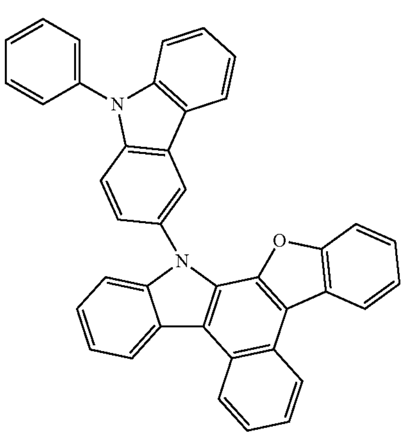
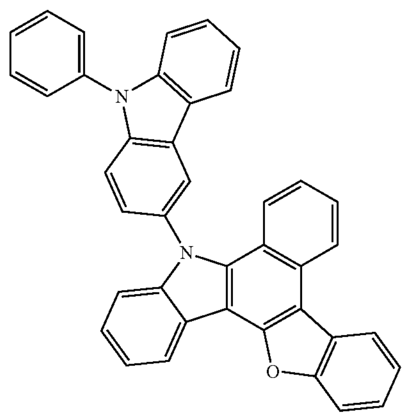
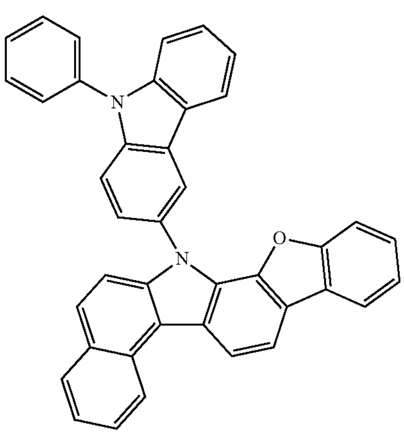
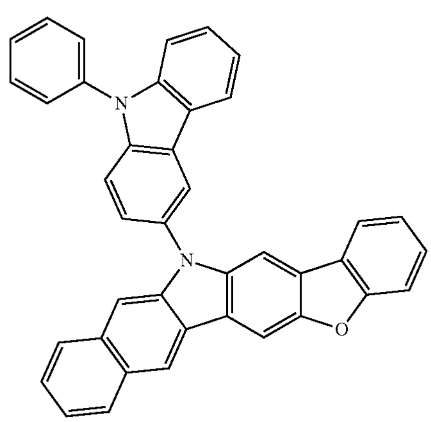

-continued
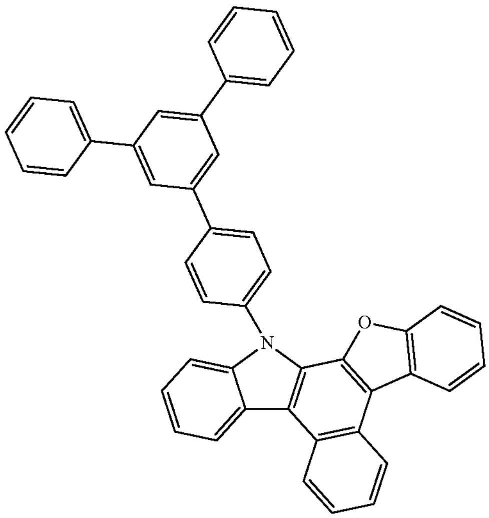
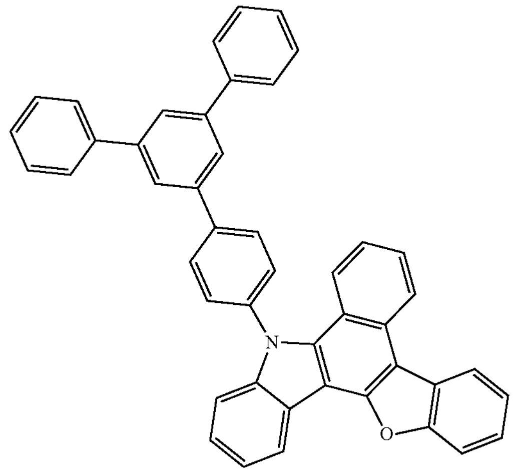
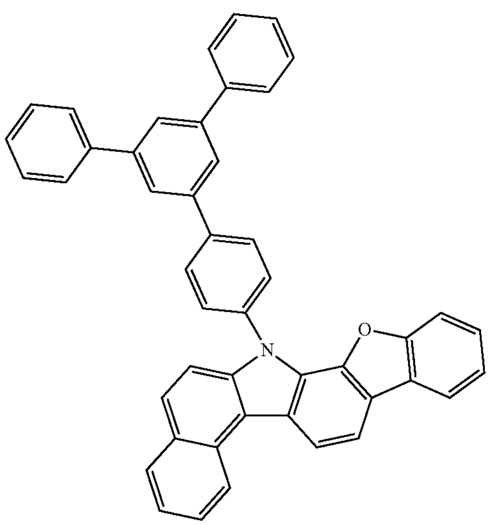
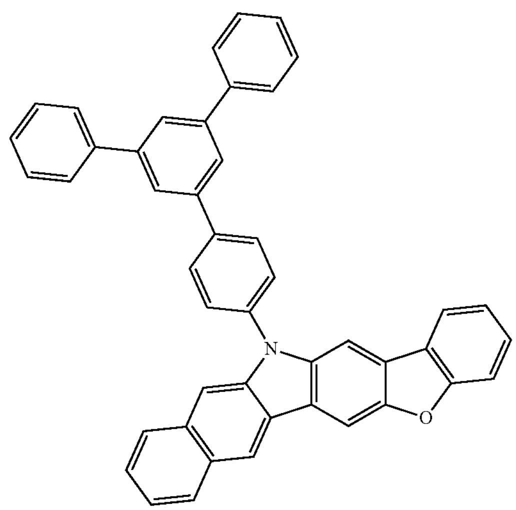
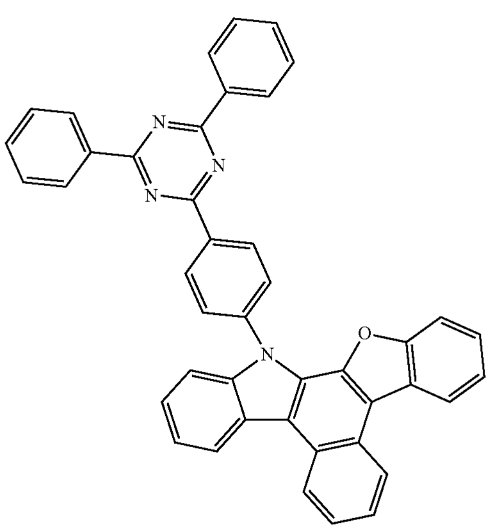
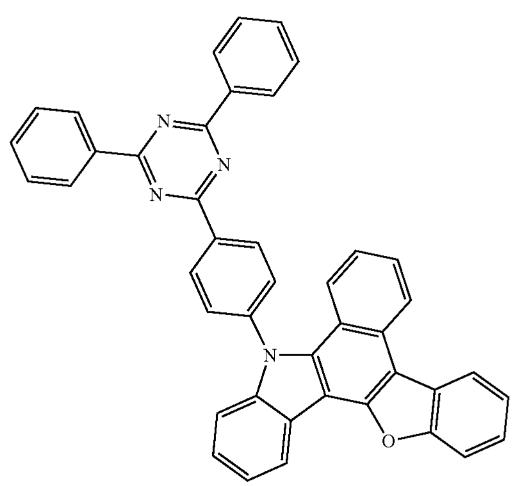

-continued
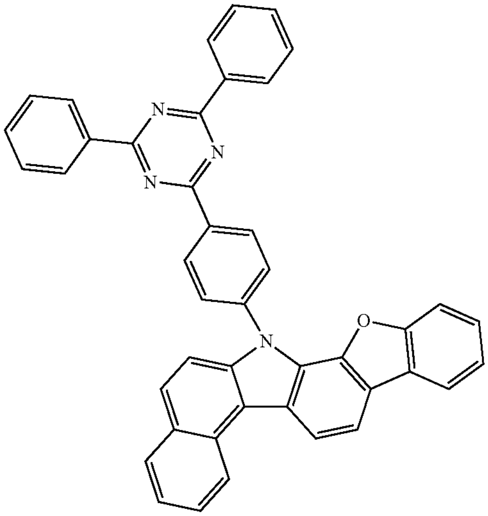
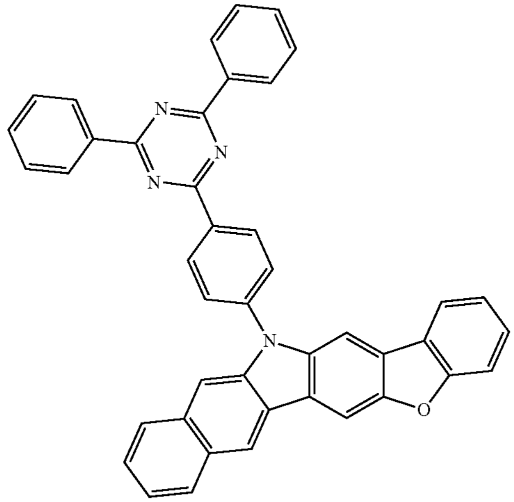
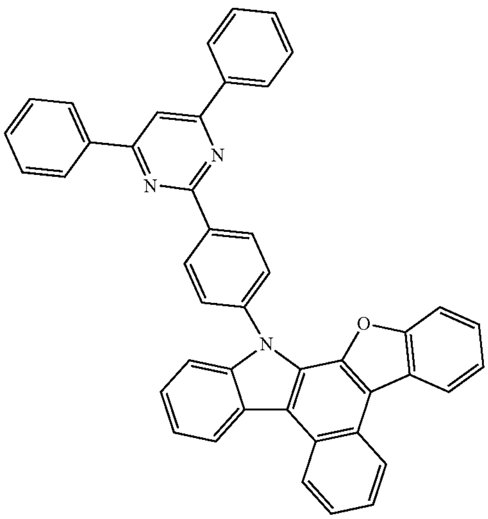
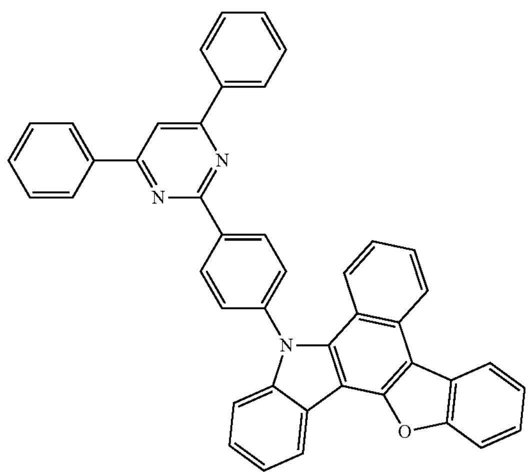
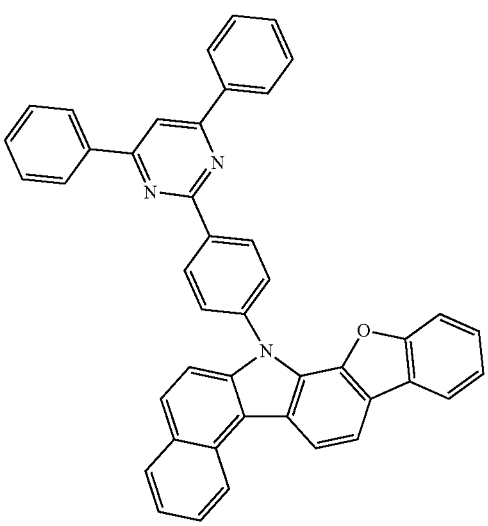
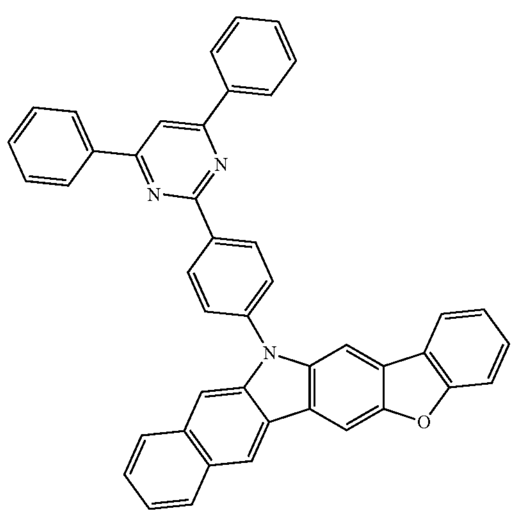

-continued
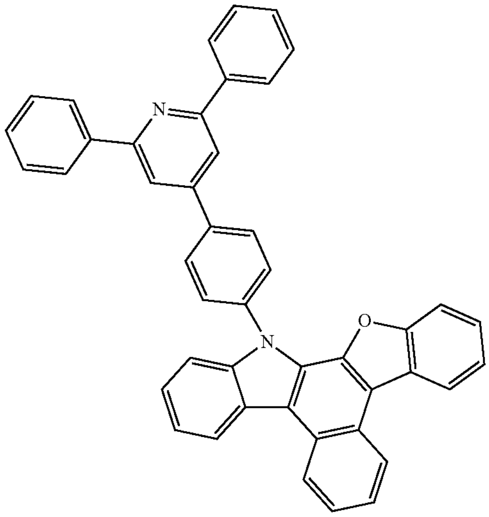
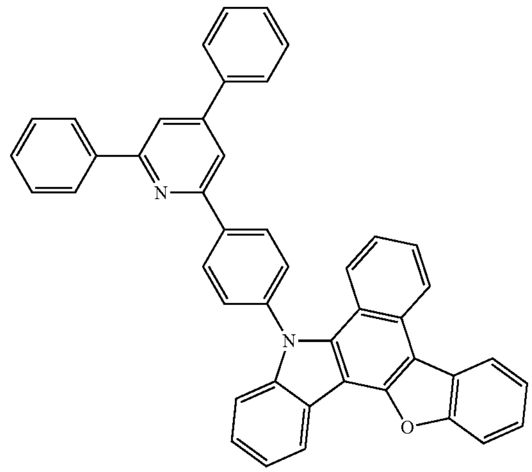
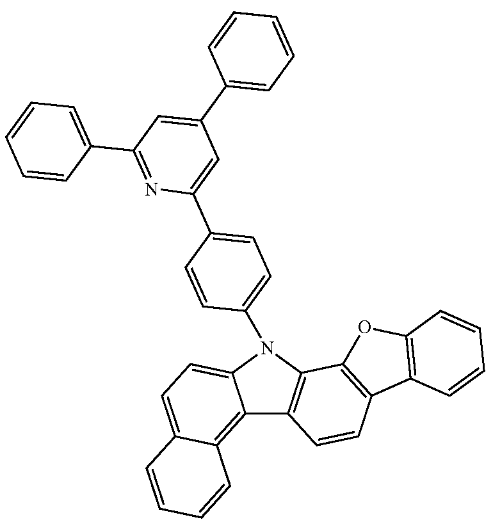
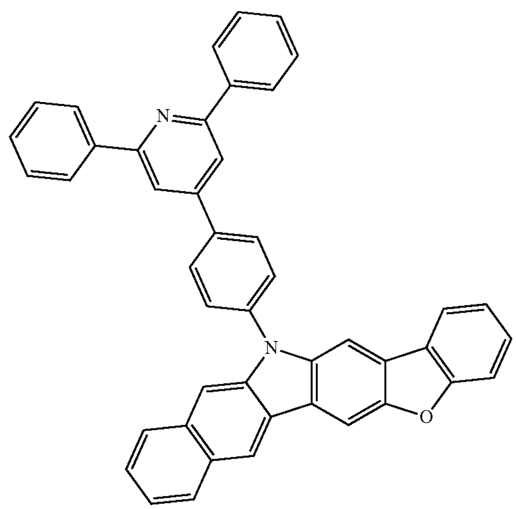
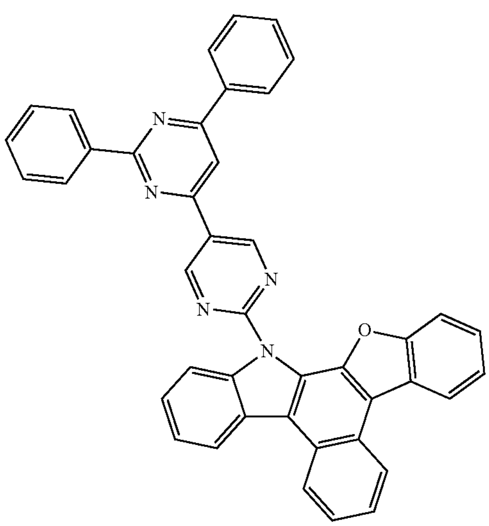
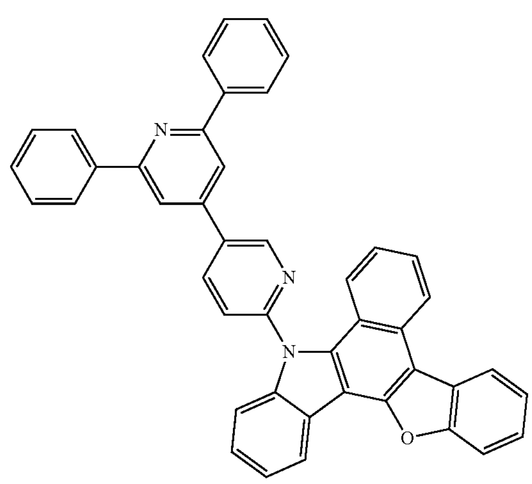

-continued
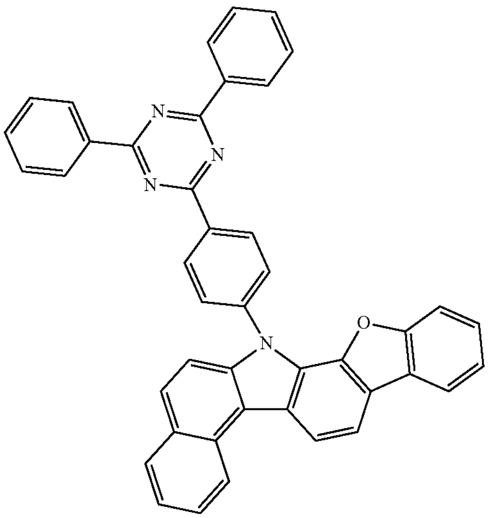
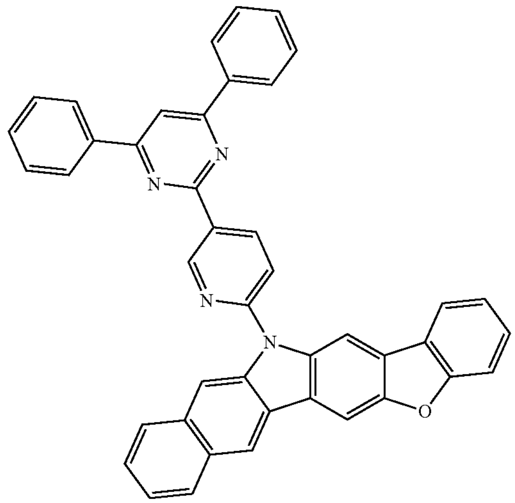
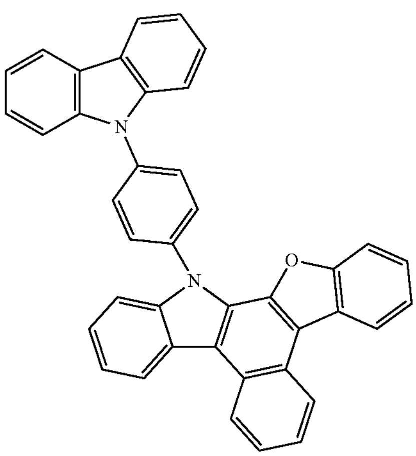
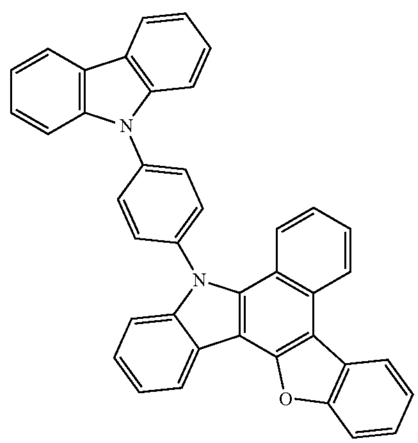
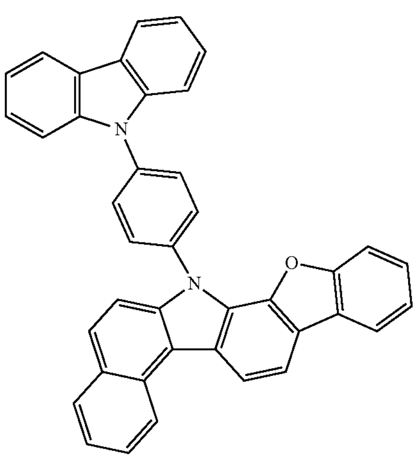
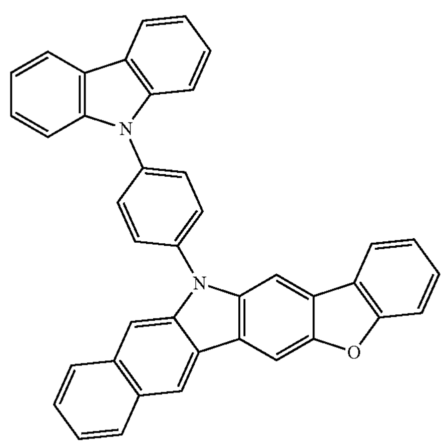

-continued
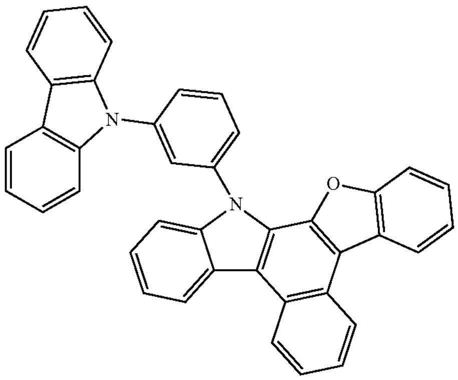
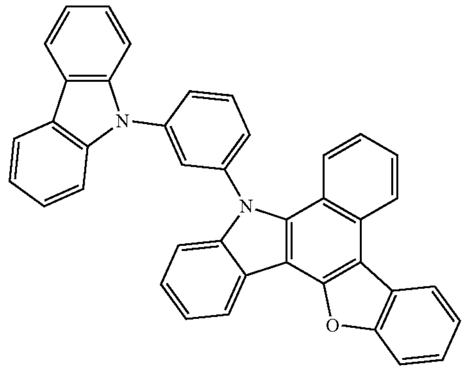
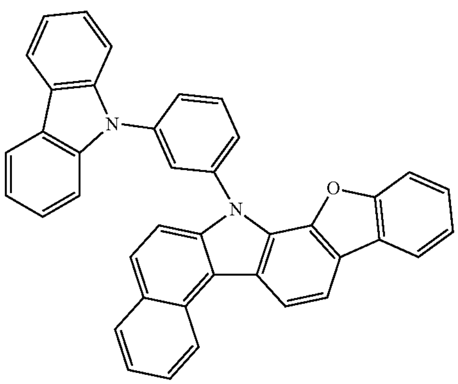
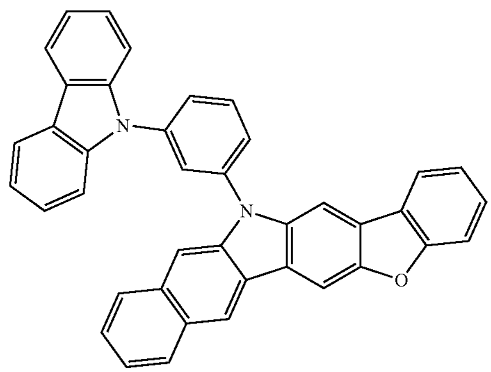
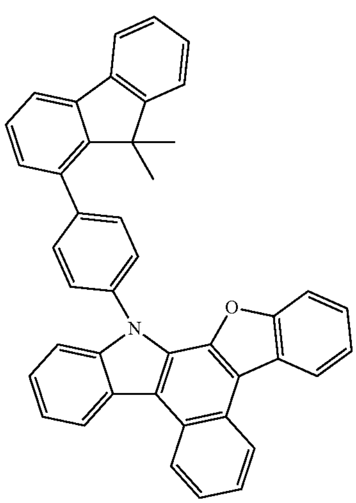
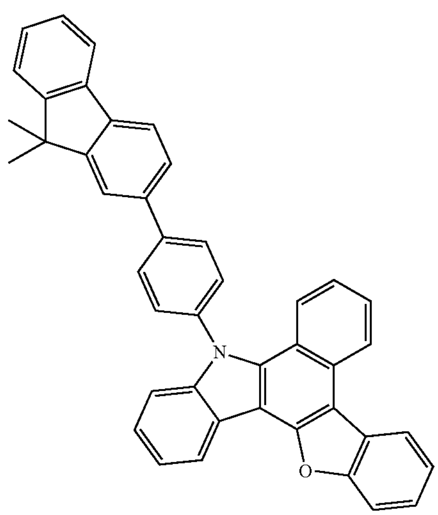

-continued
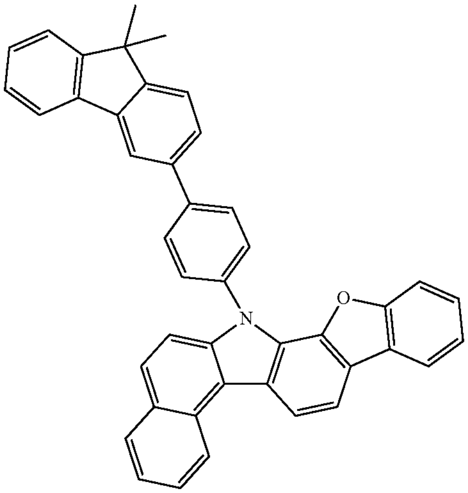
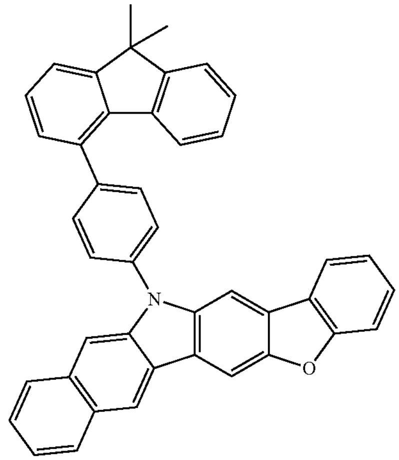
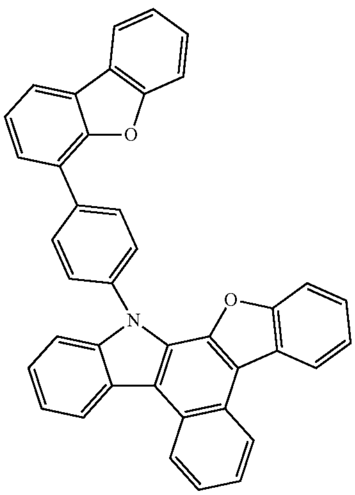
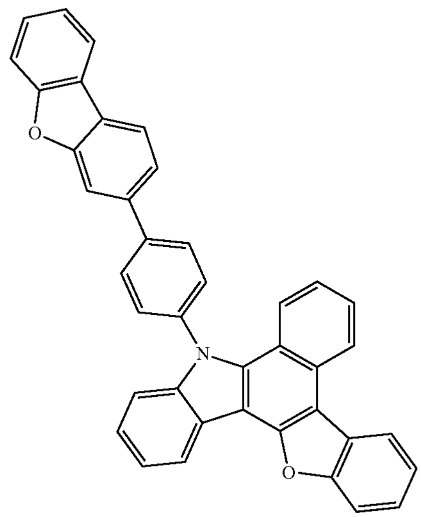
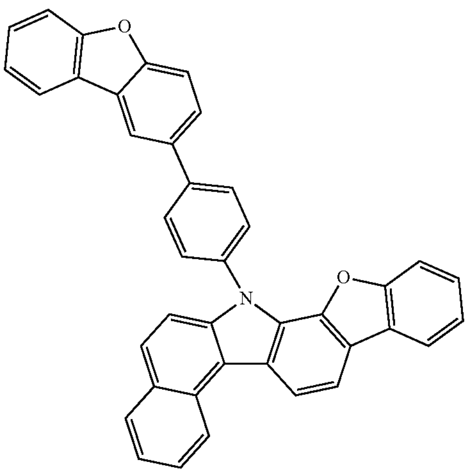
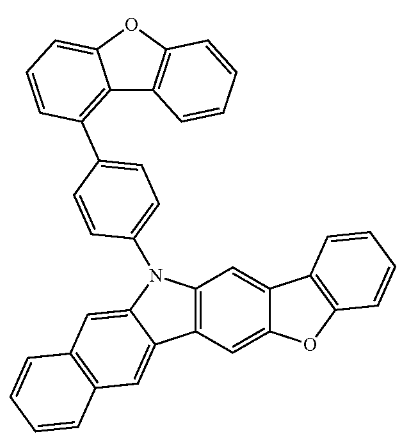

-continued
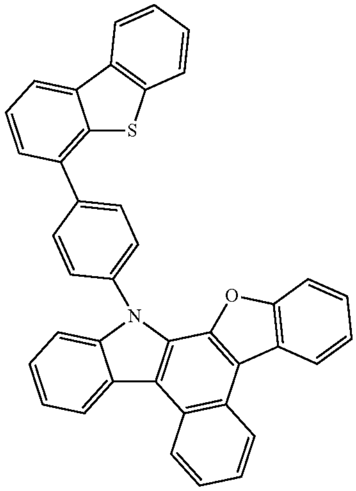
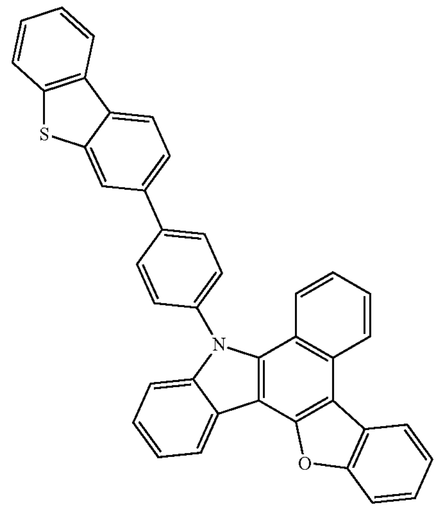
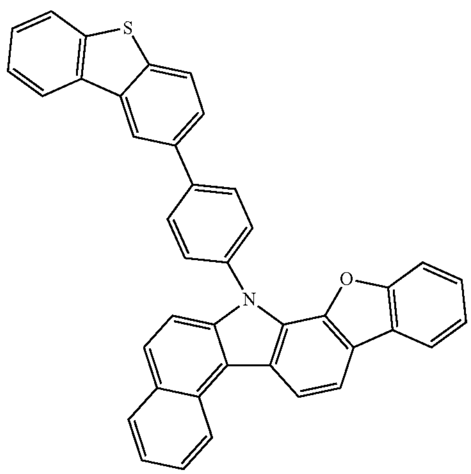
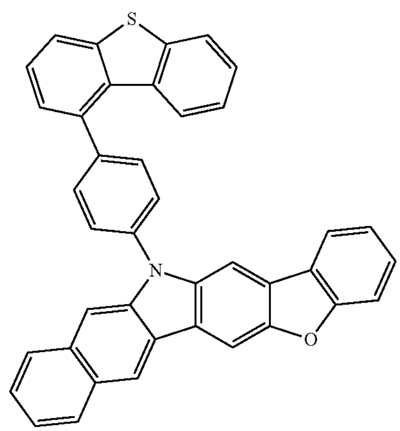
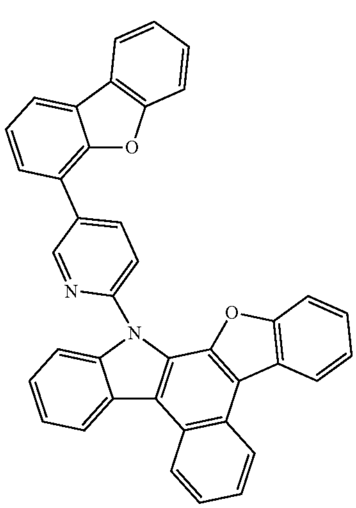
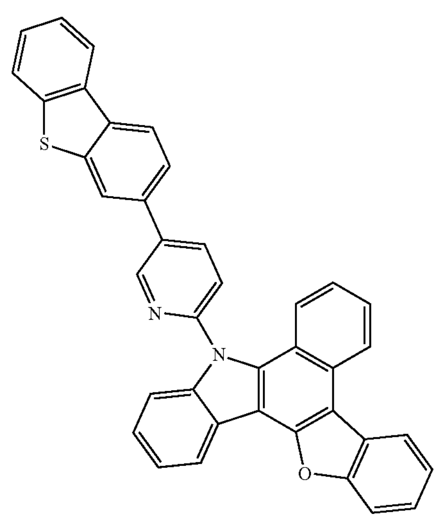

-continued
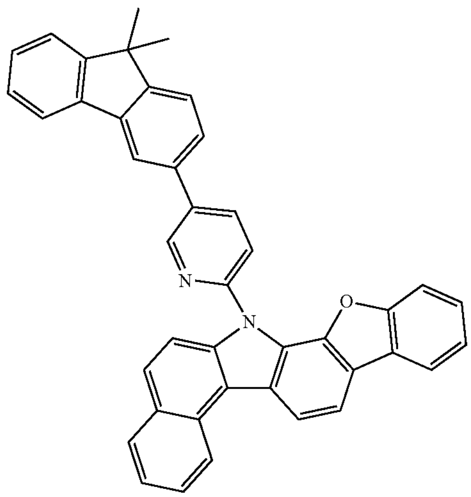
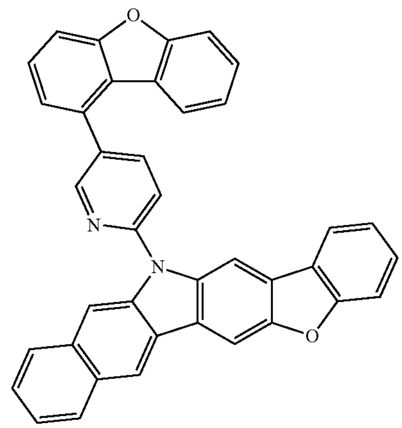
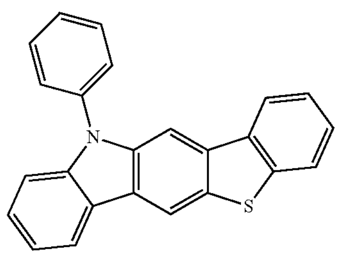
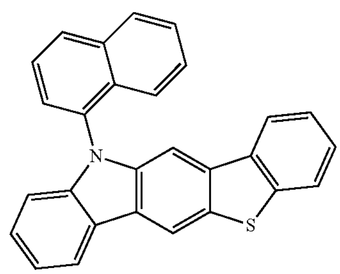
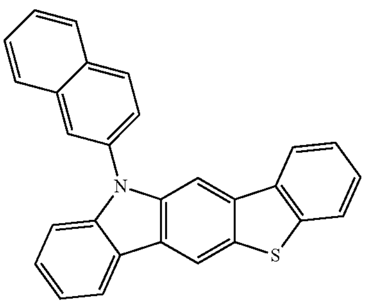
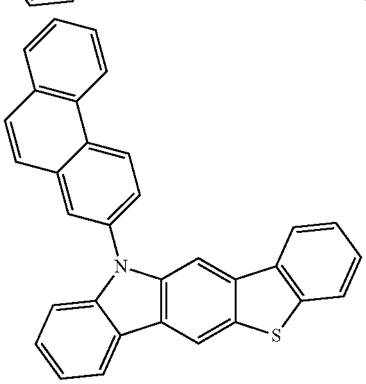
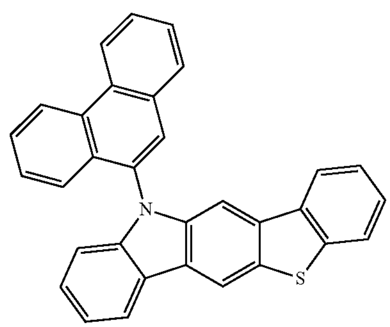
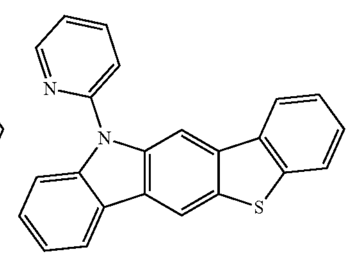
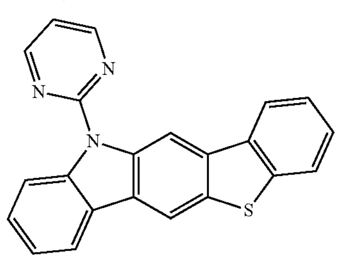
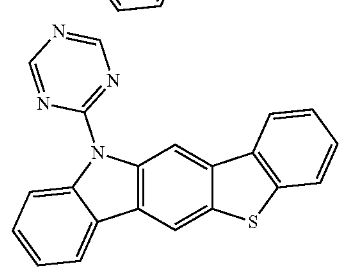
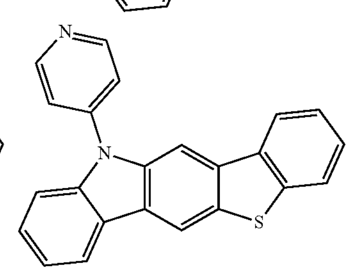
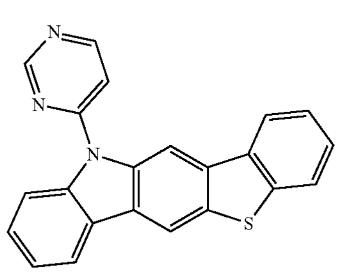
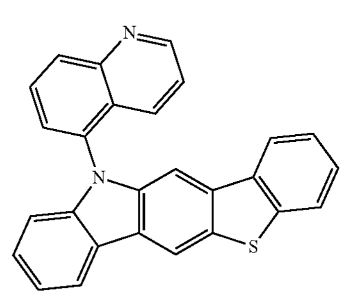
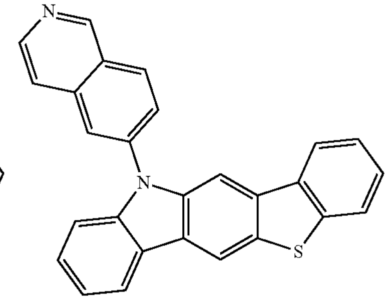

-continued
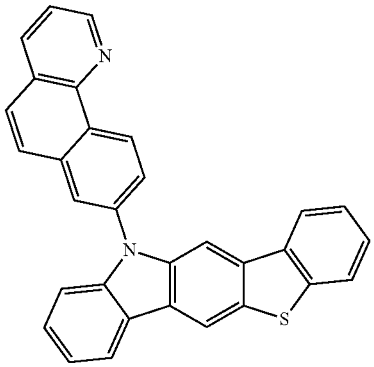
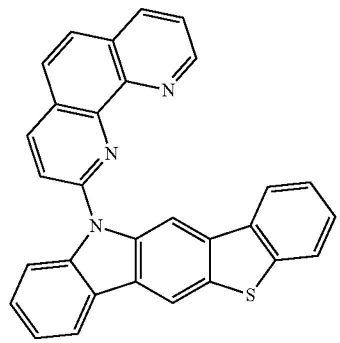
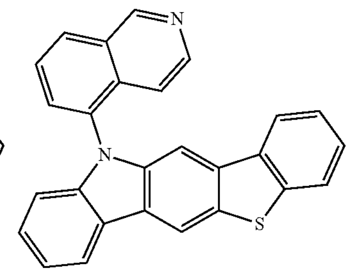
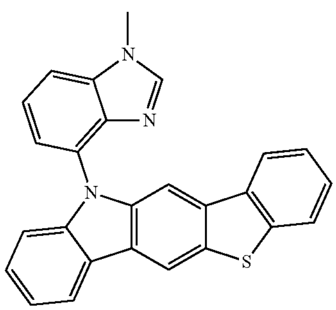
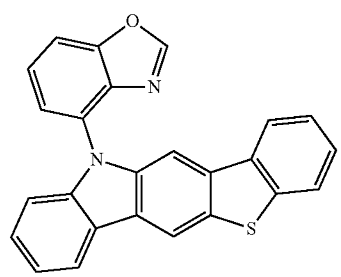
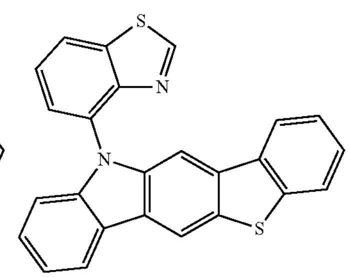
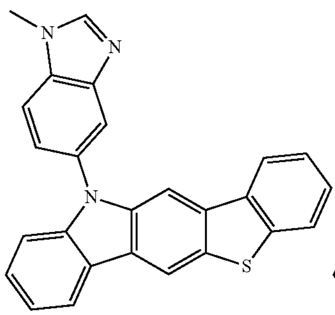
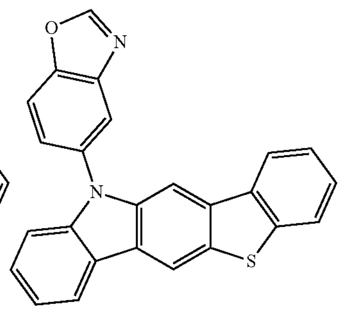
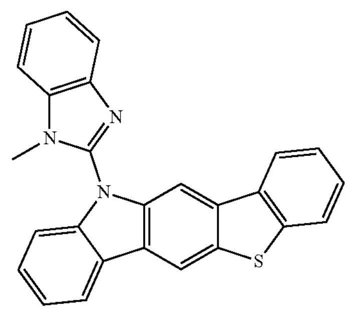
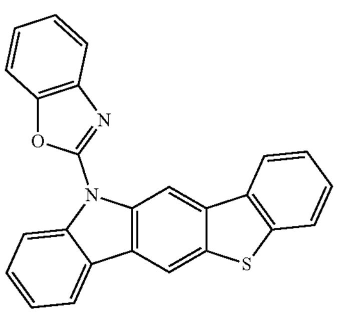
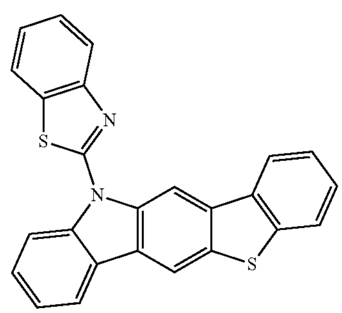
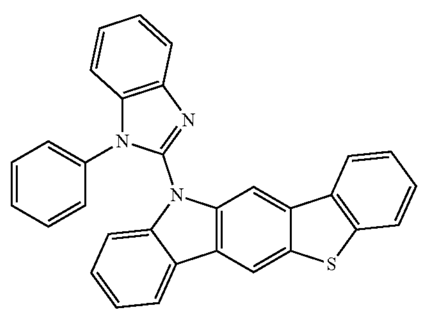
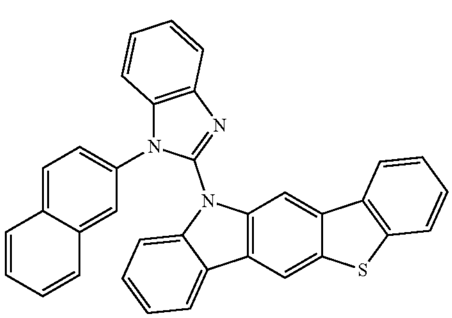
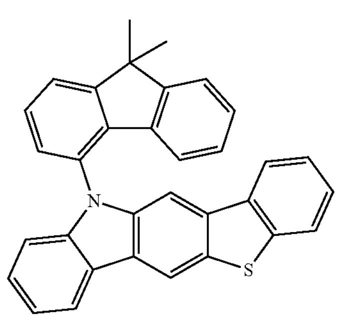
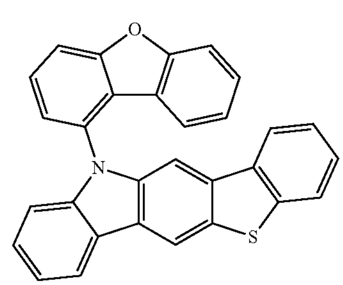

-continued
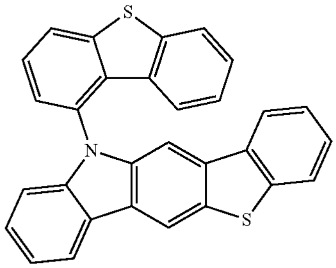
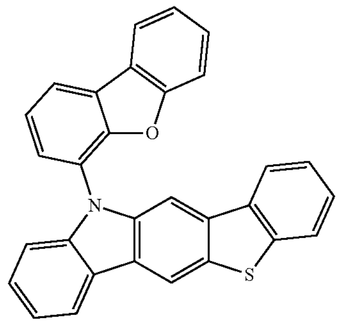
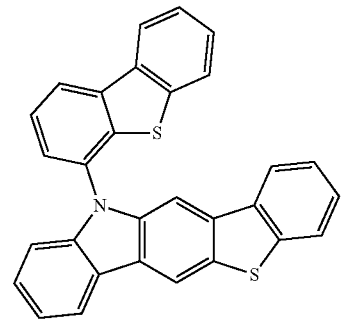
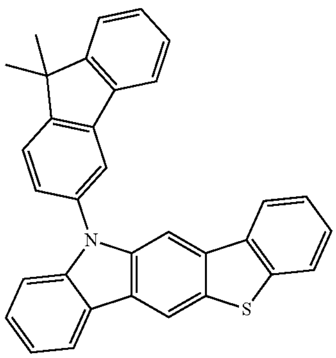
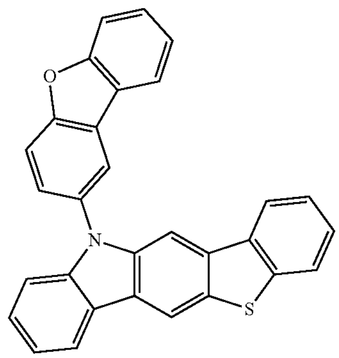
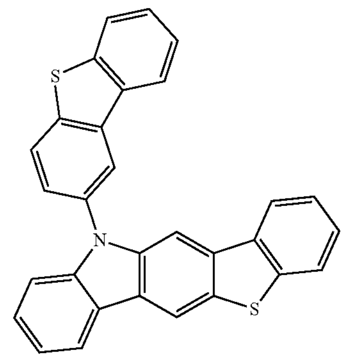
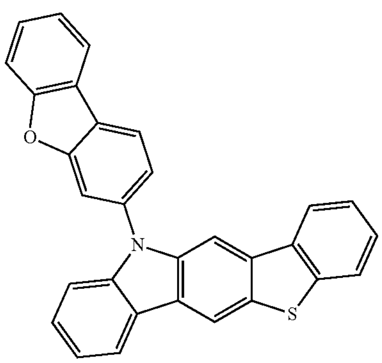
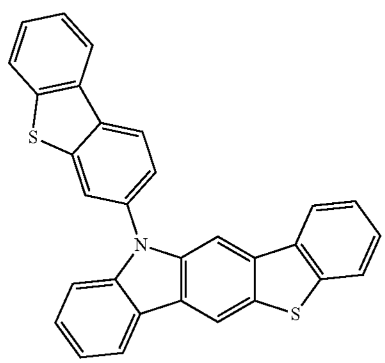
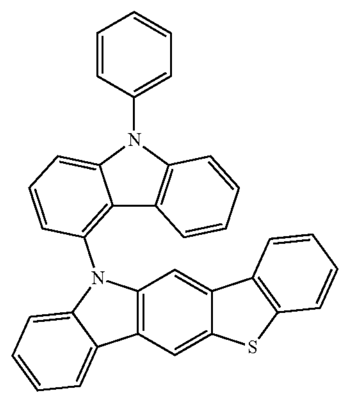
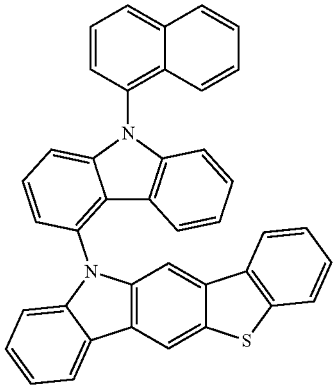
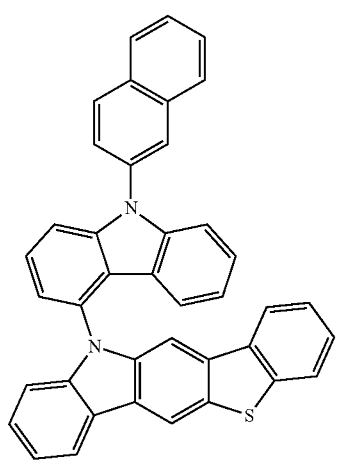
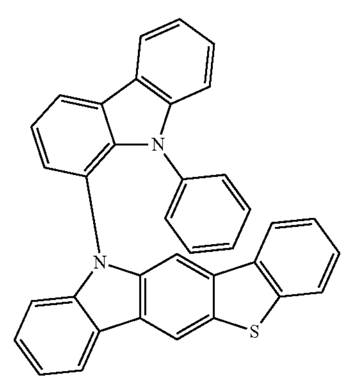

-continued
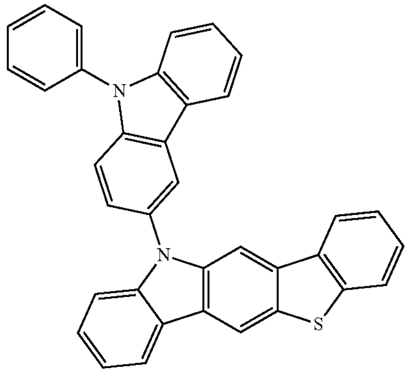
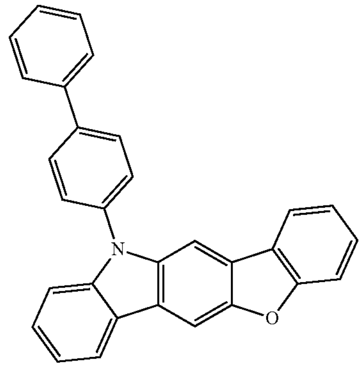
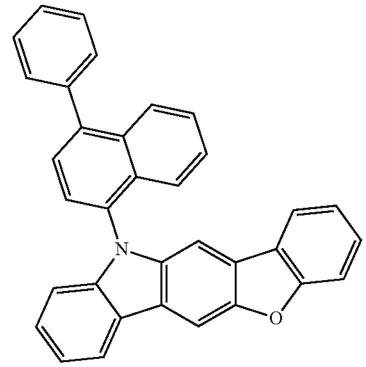
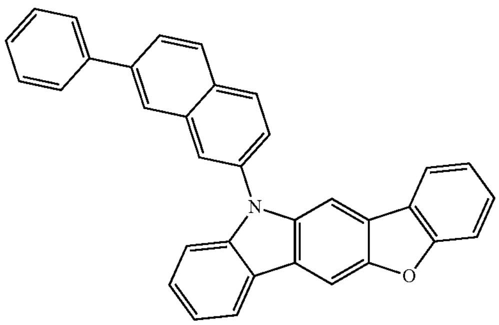
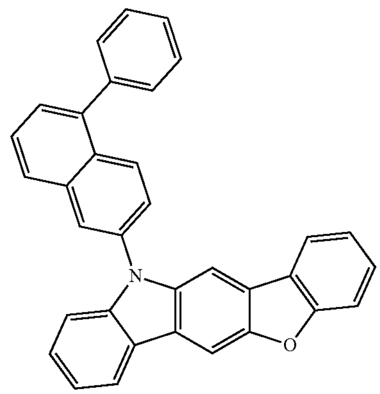
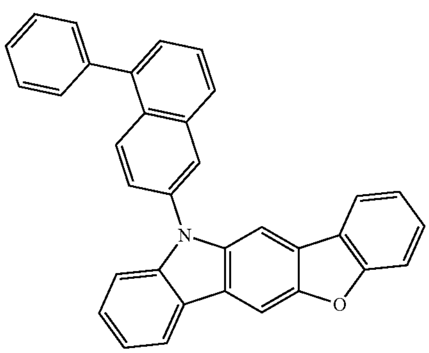
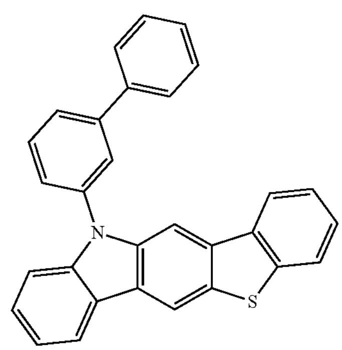
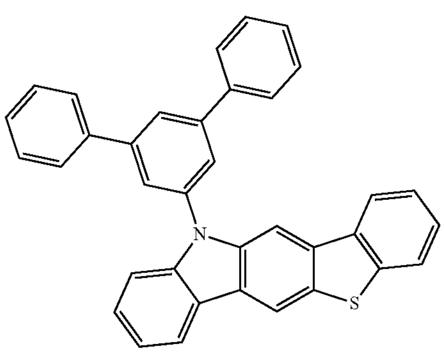
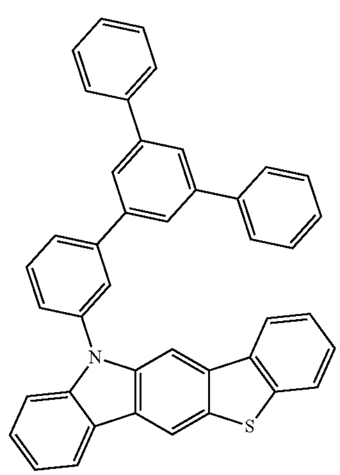

-continued
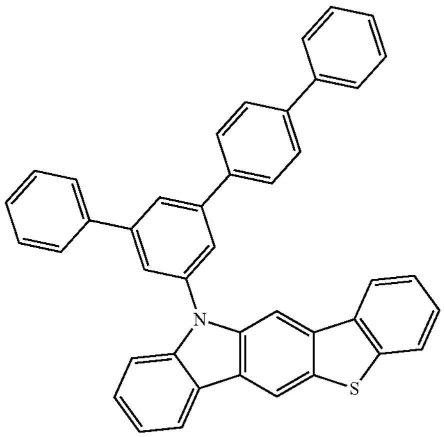
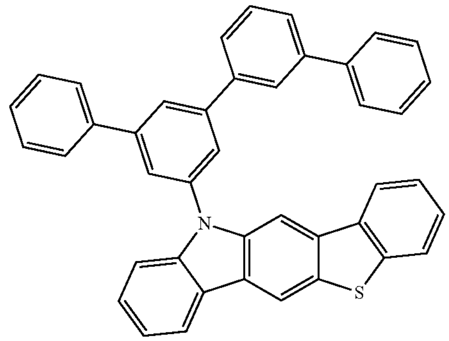
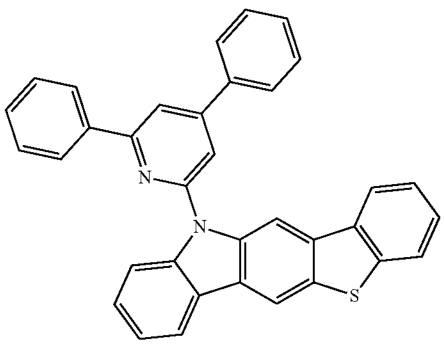
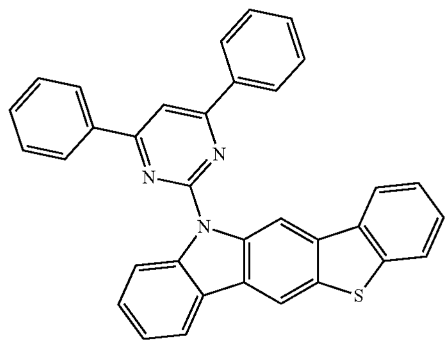
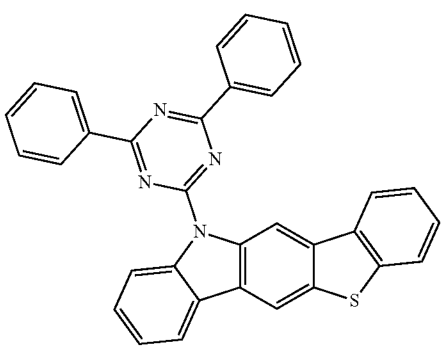
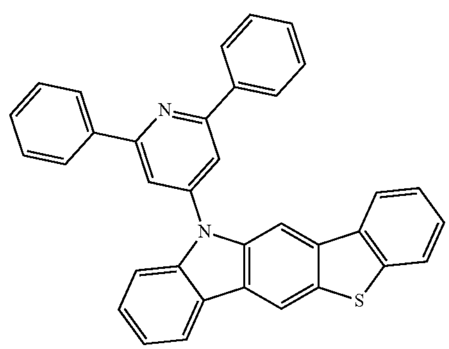
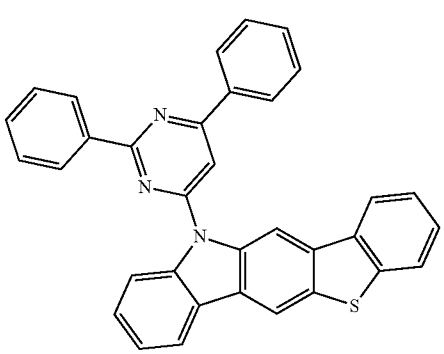
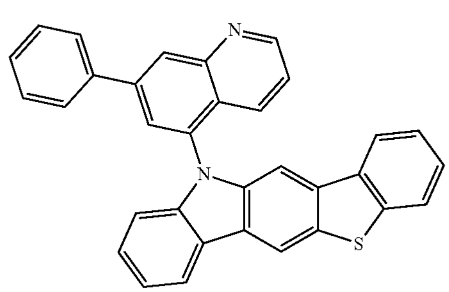

-continued
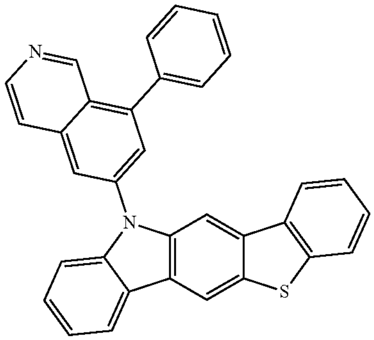
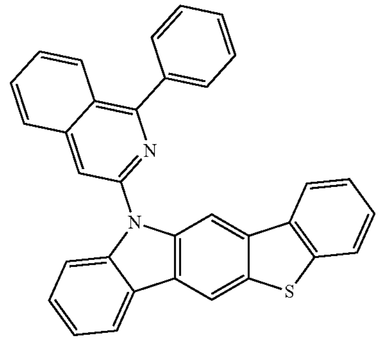
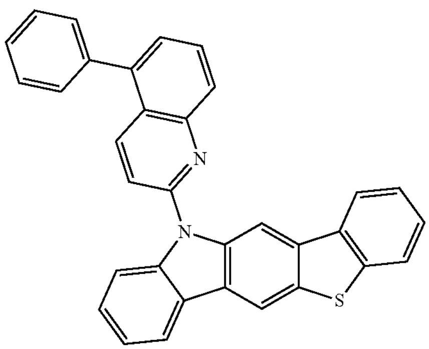
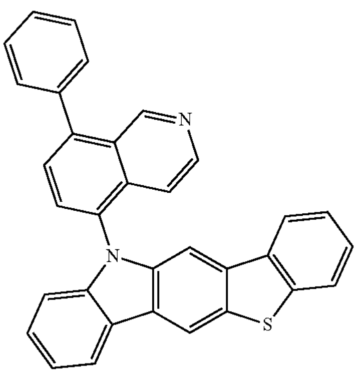
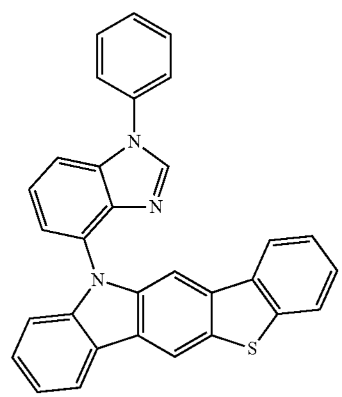
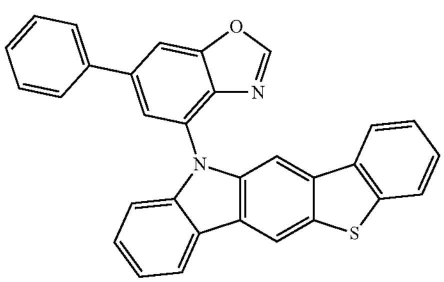
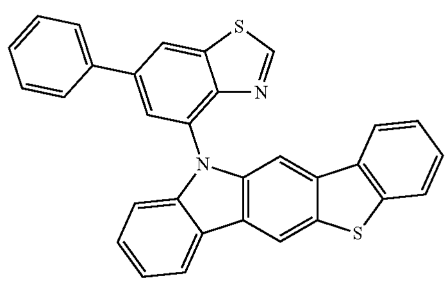
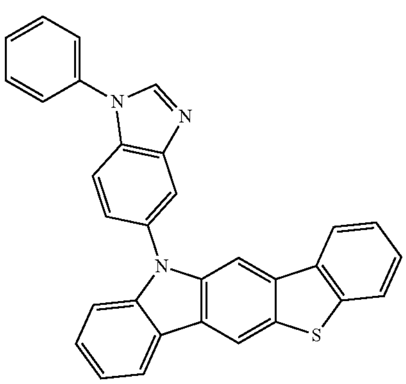
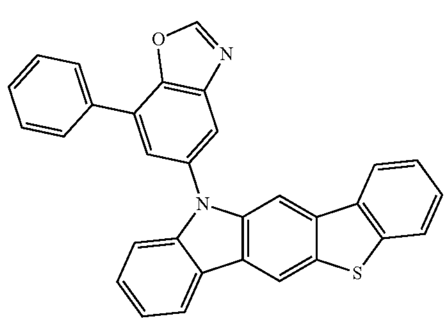

-continued
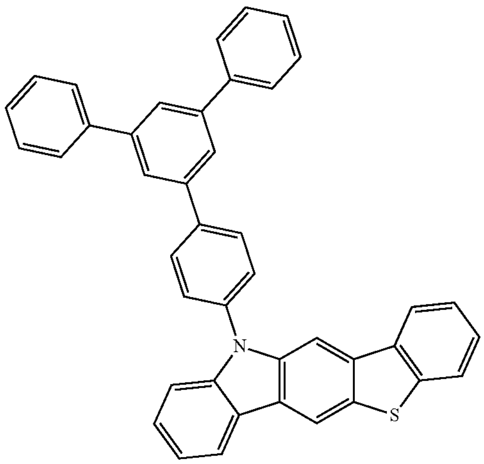
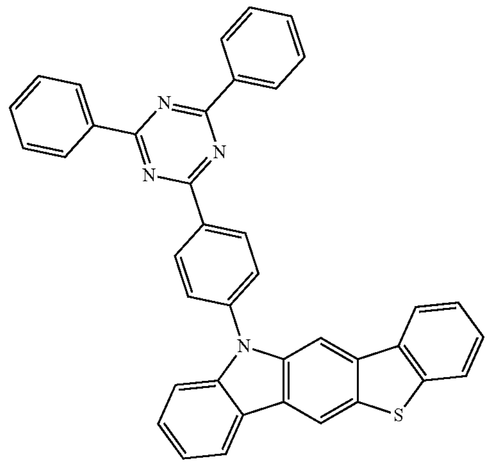
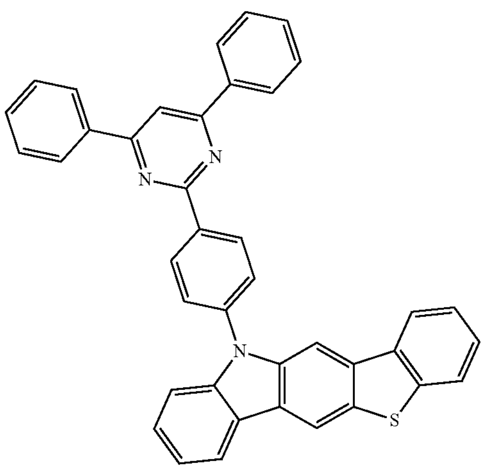
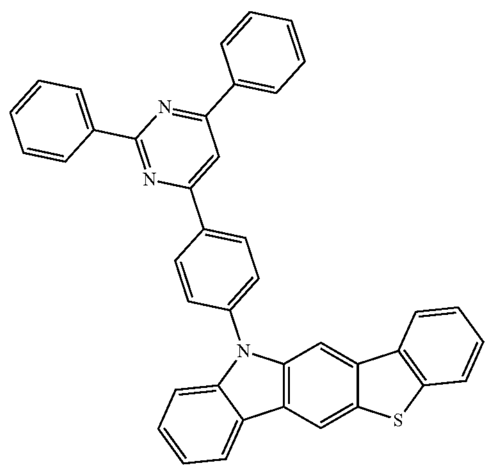
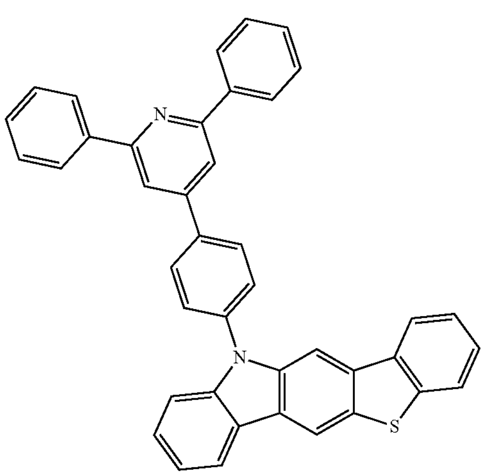
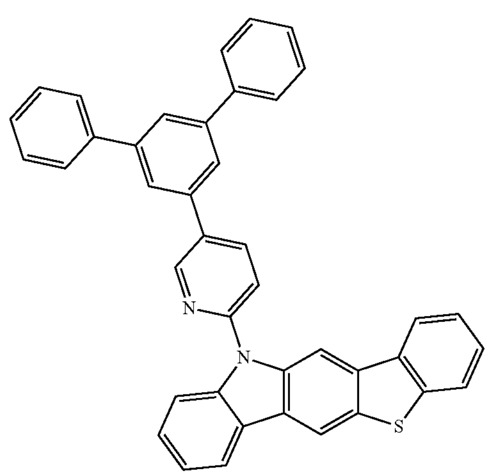

-continued
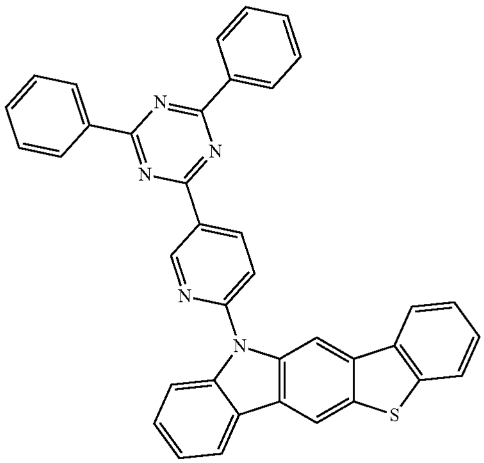
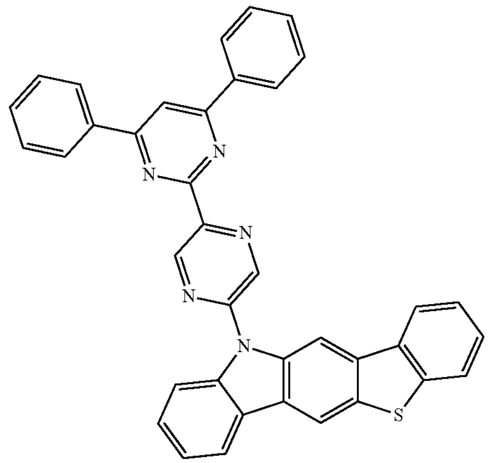
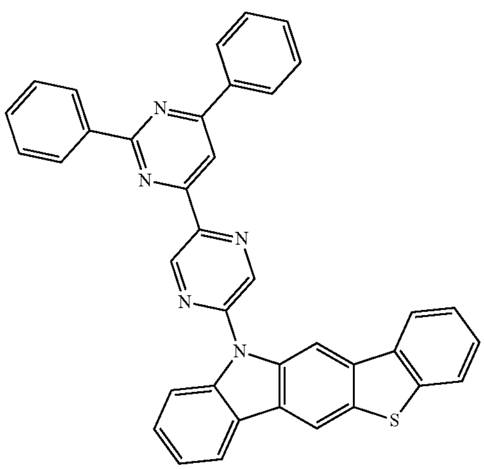
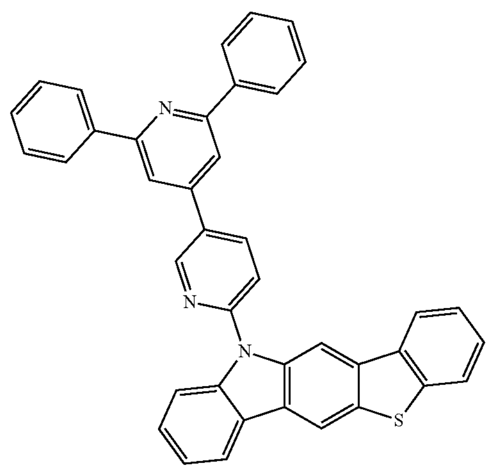
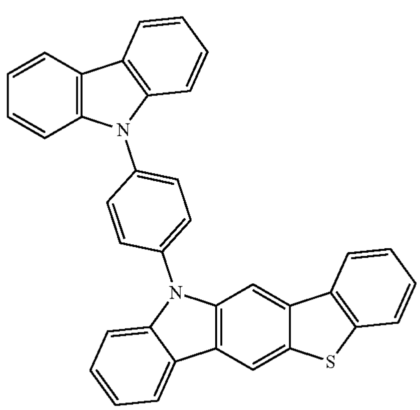
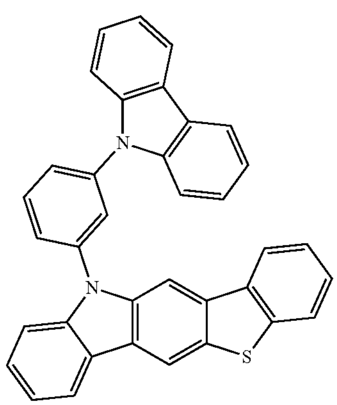
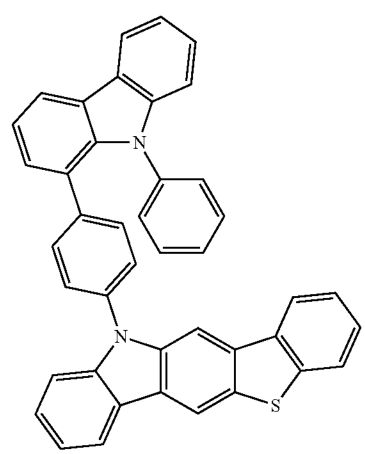

-continued
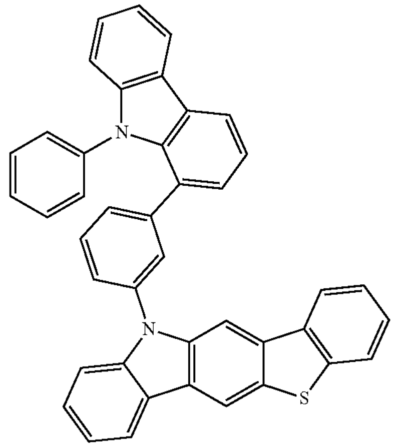
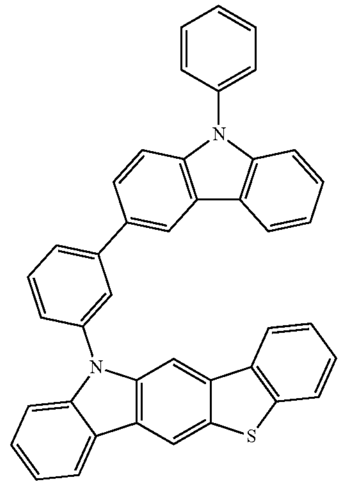
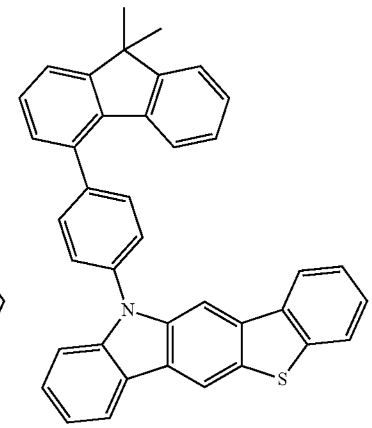
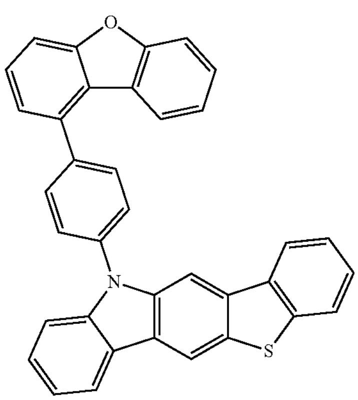
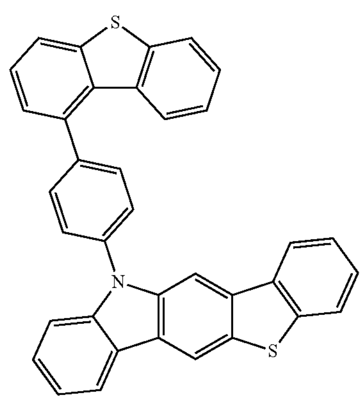
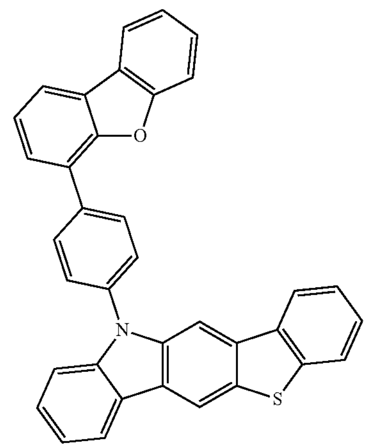
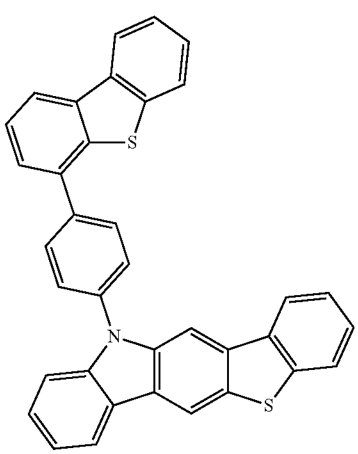
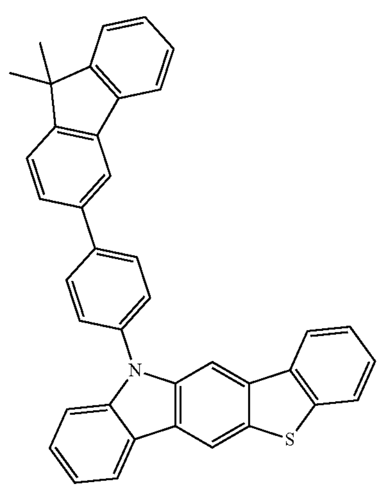
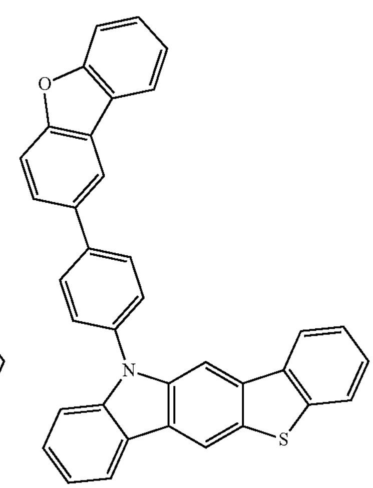

-continued
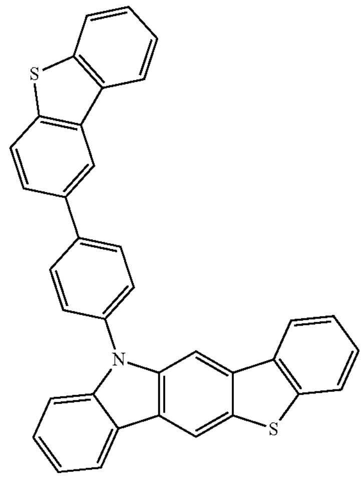
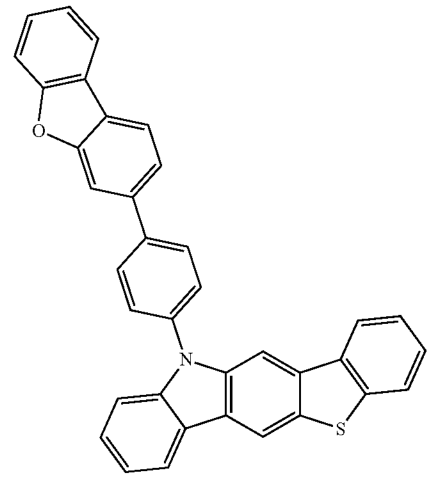
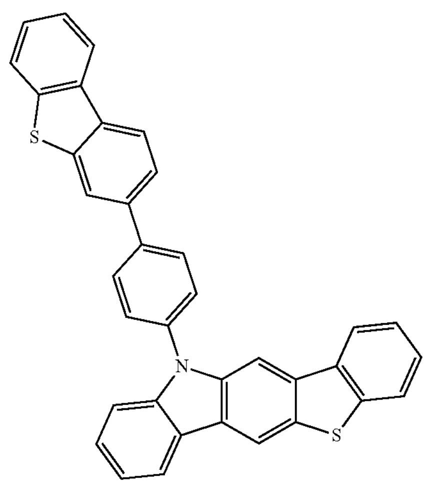
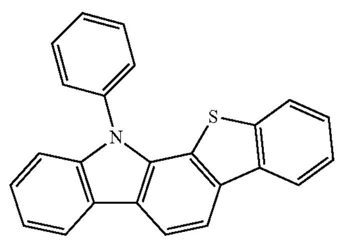
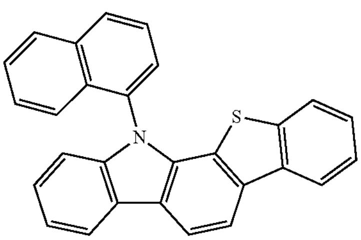
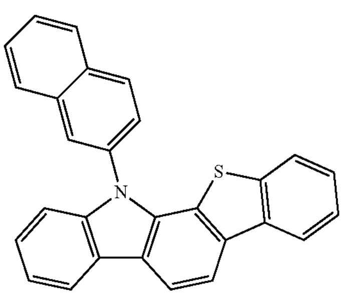
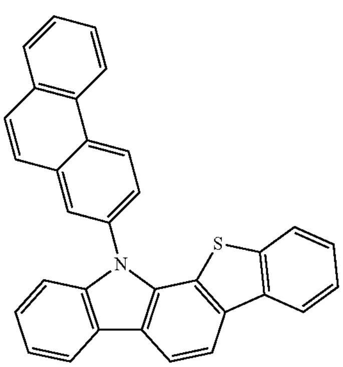
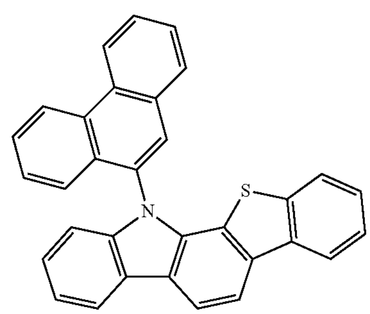
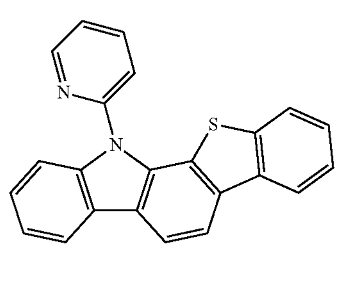
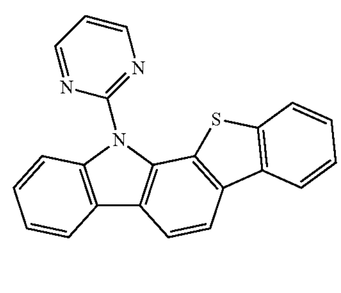
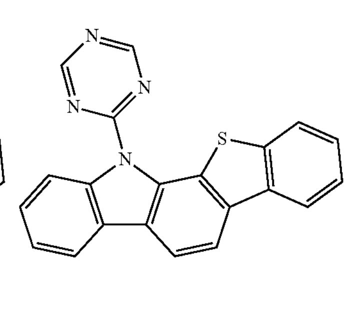

-continued
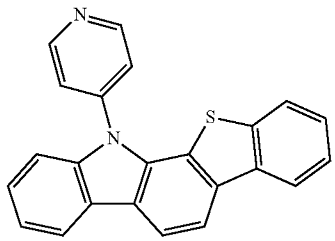
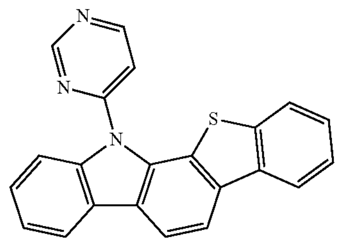
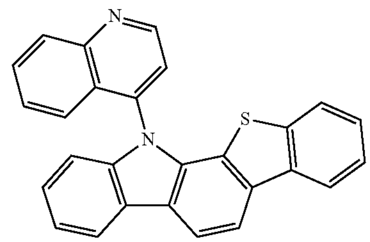
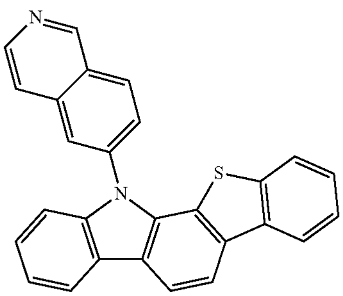
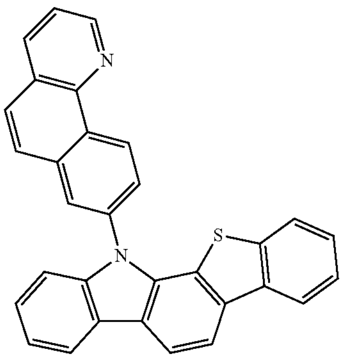
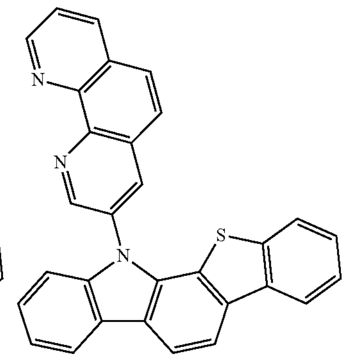
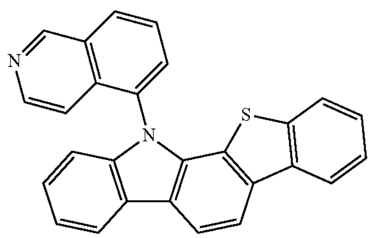
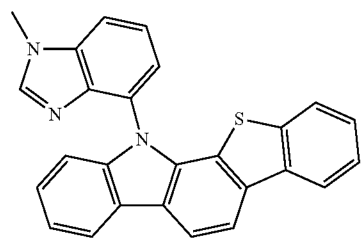
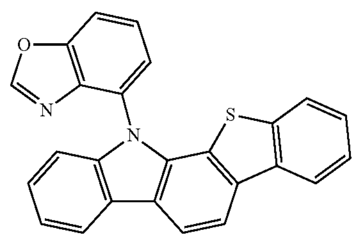
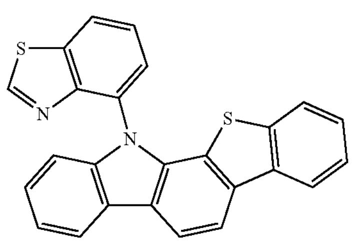
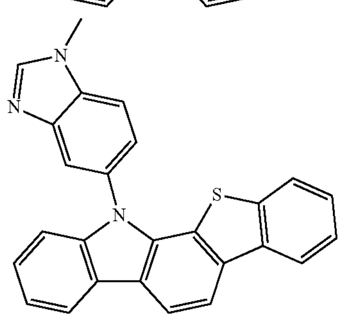
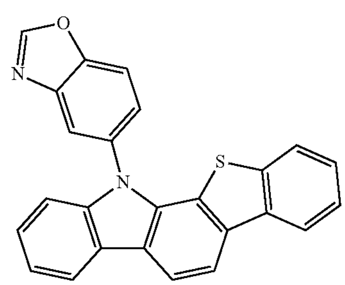
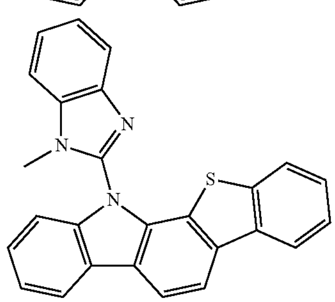
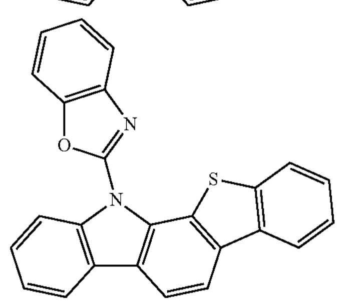
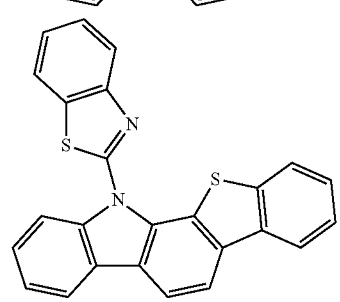
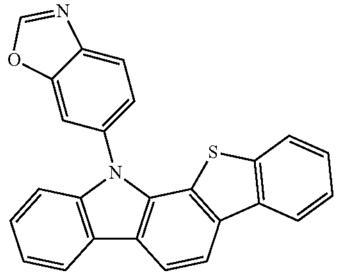
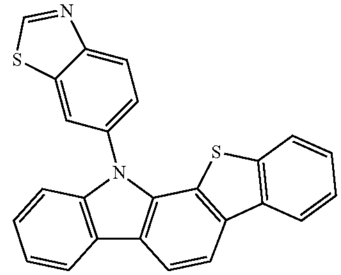
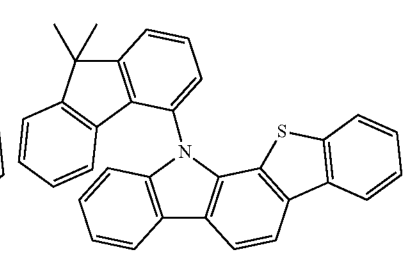

-continued
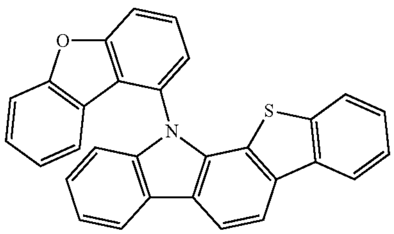
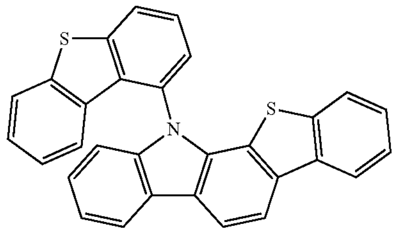
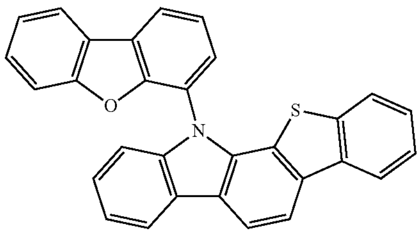
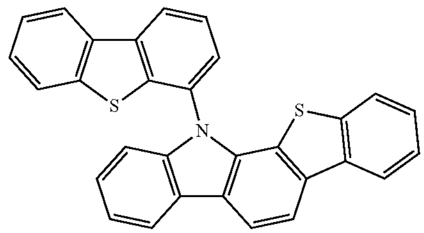
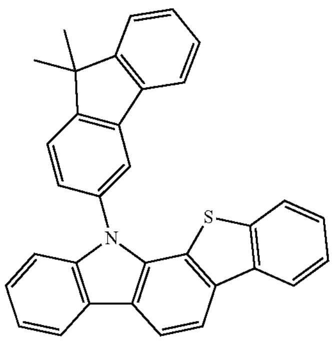
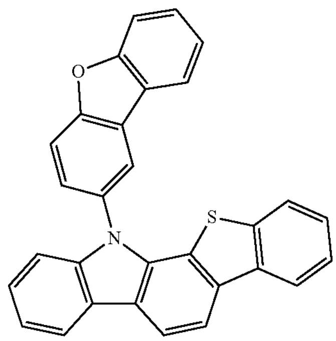
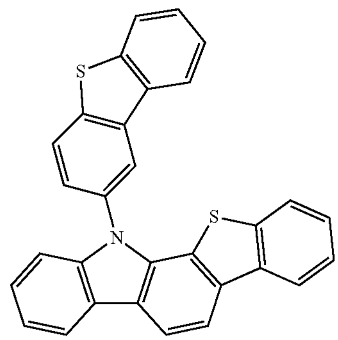
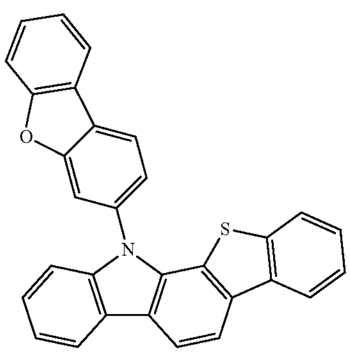
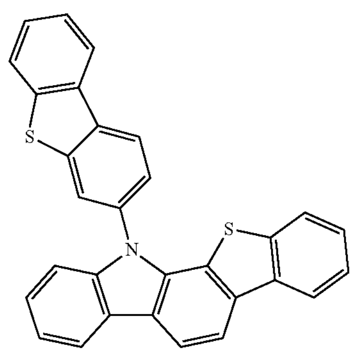
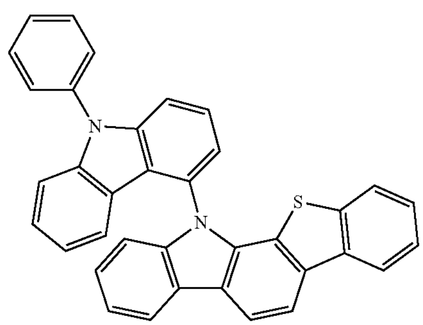
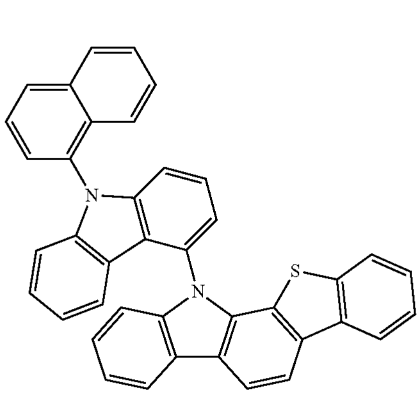
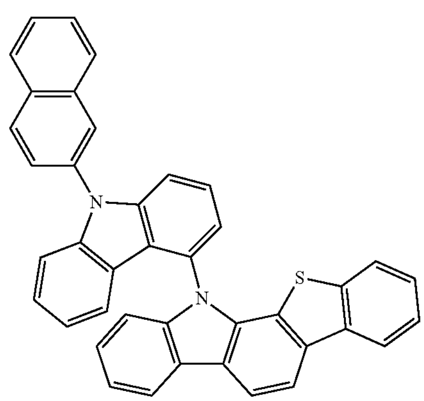

-continued
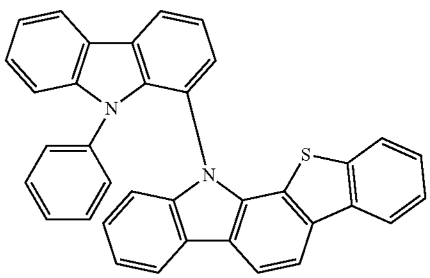
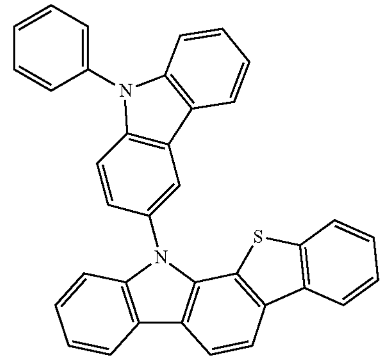
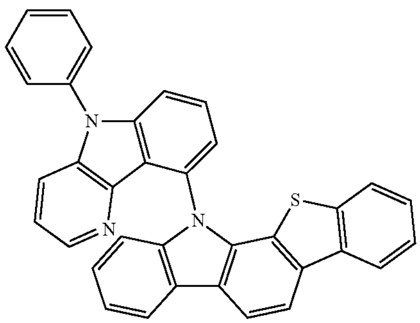
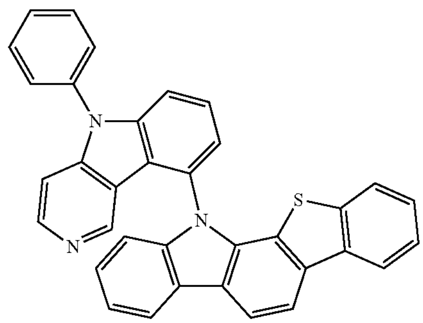
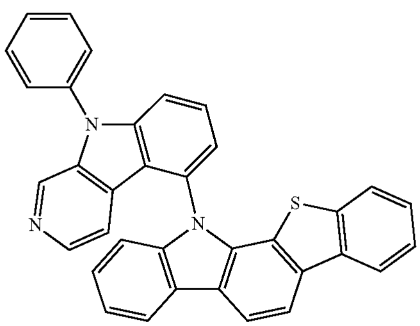
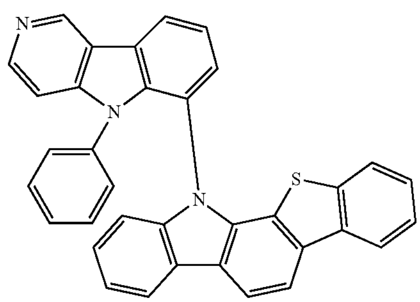
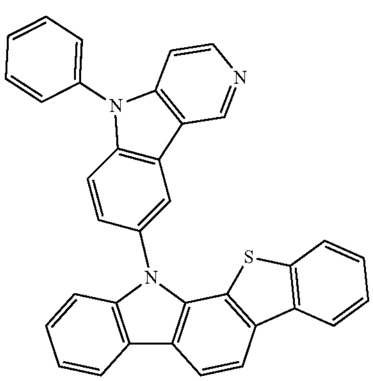
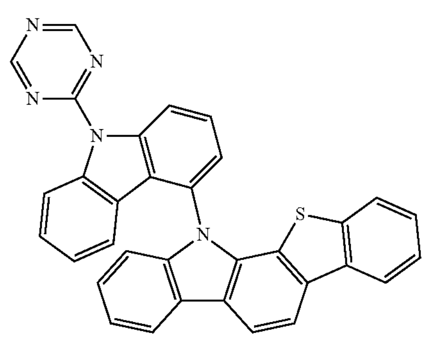
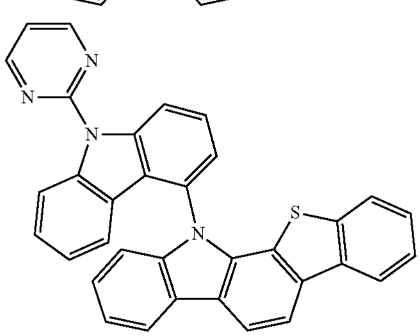
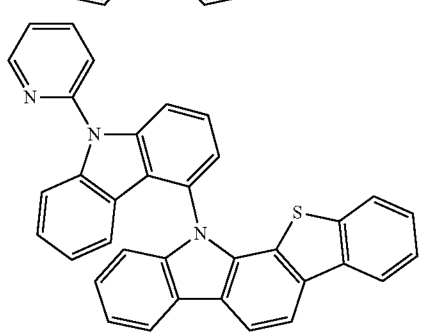

-continued
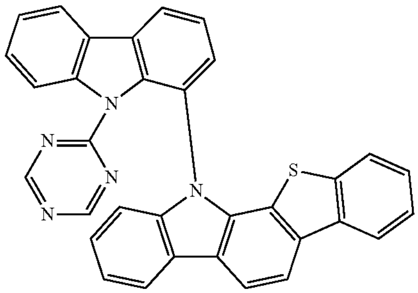
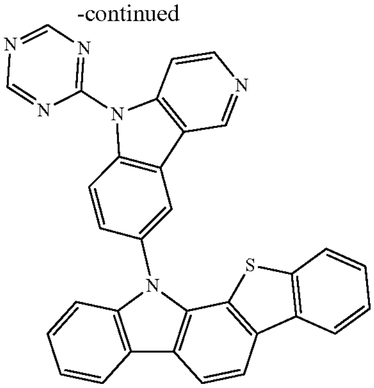
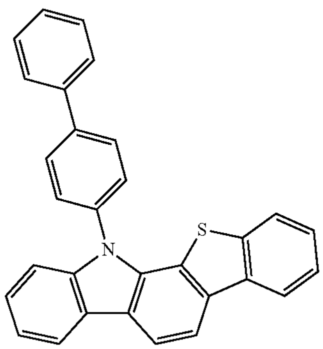
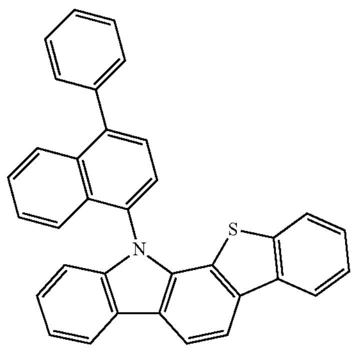
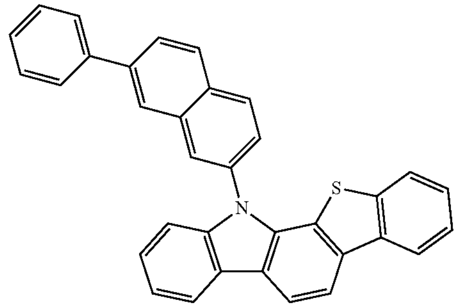
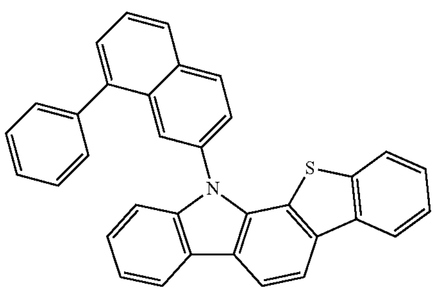
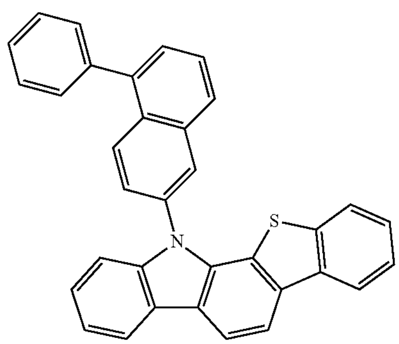
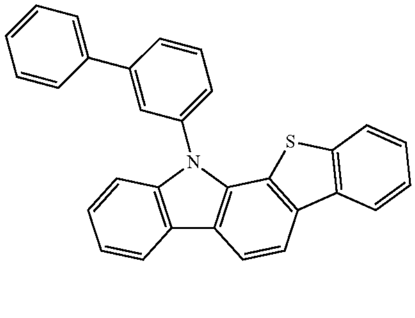
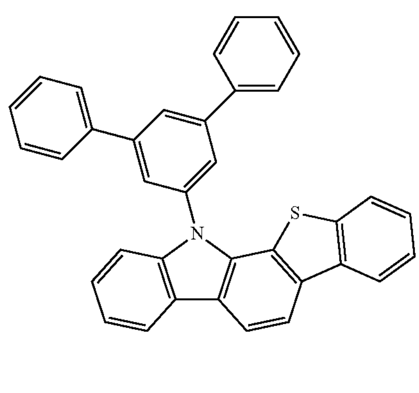

-continued
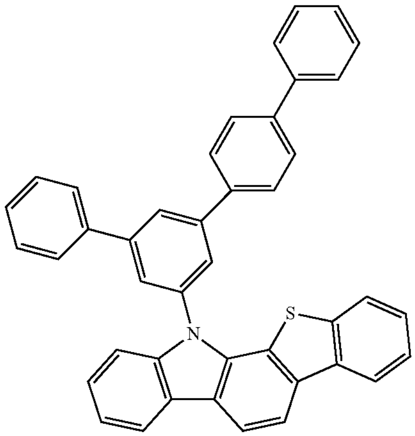
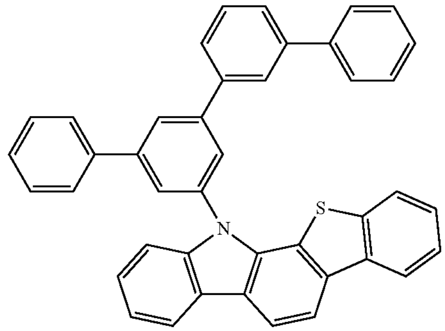
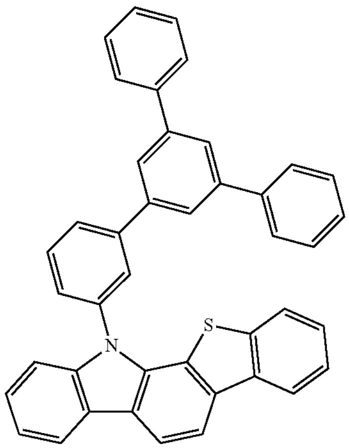
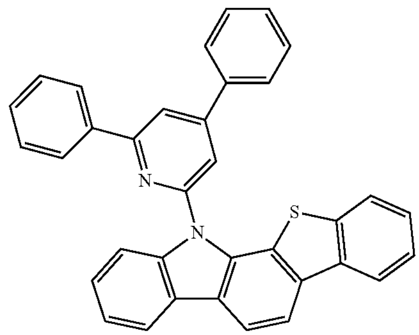
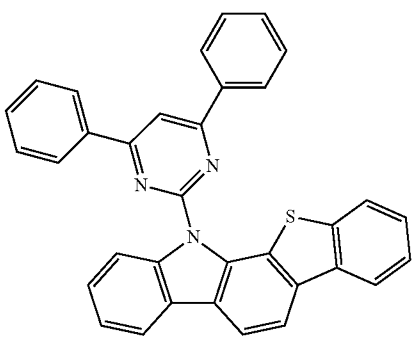
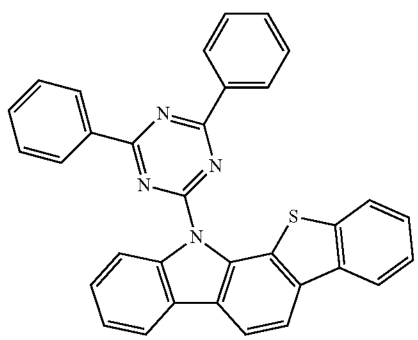
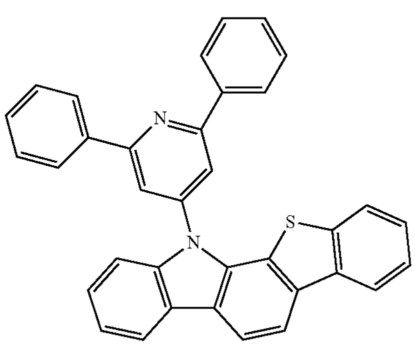
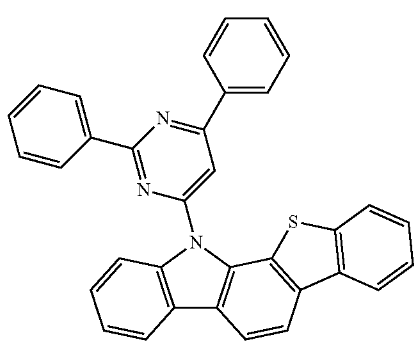

-continued
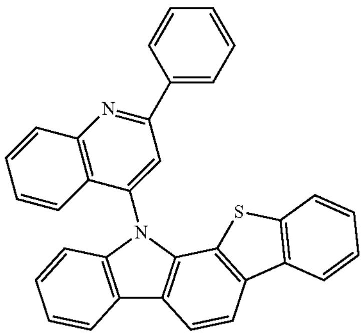
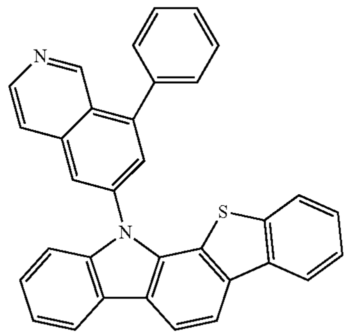
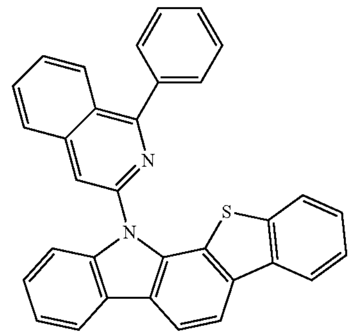
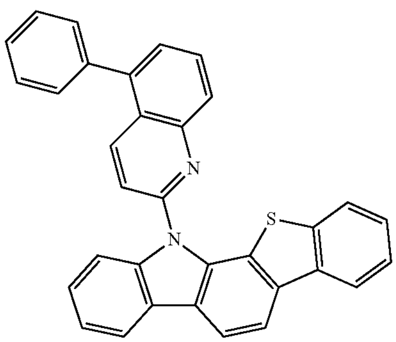
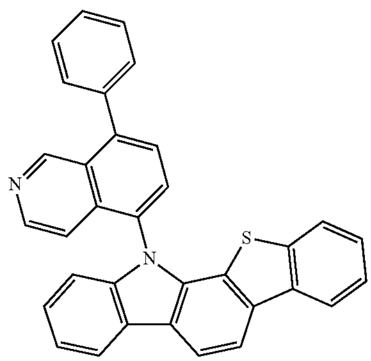
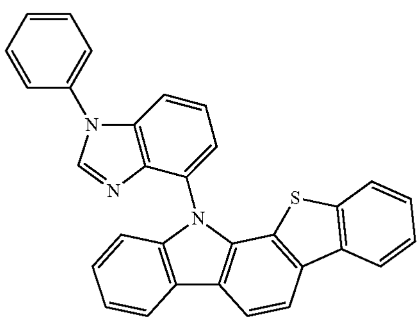
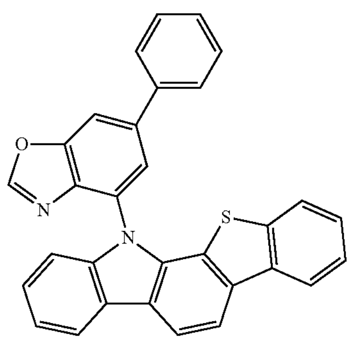
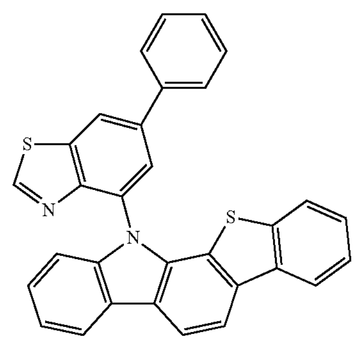
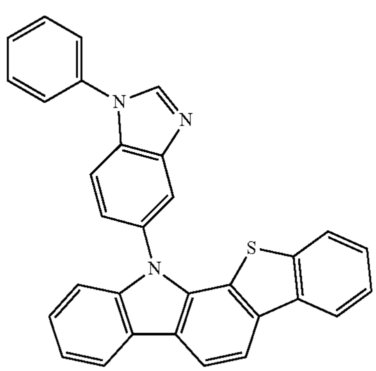
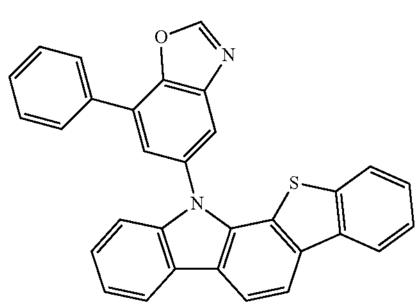

-continued
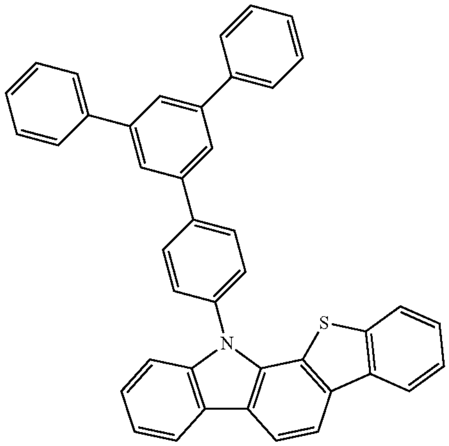
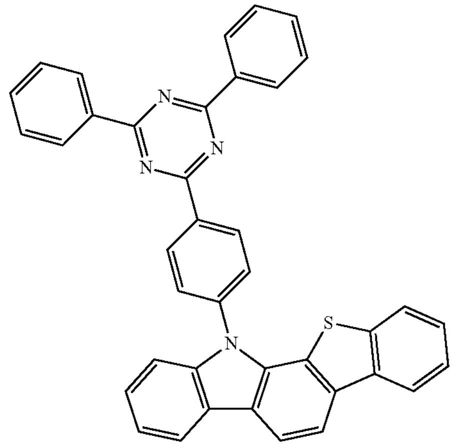
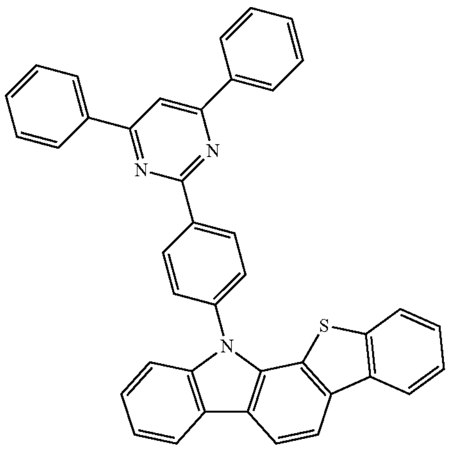
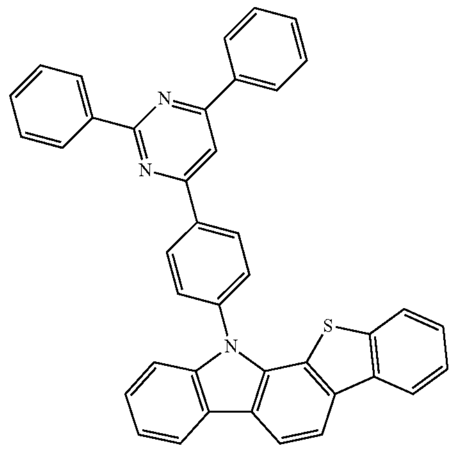
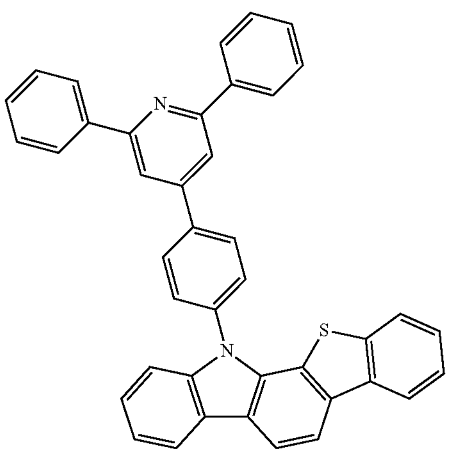
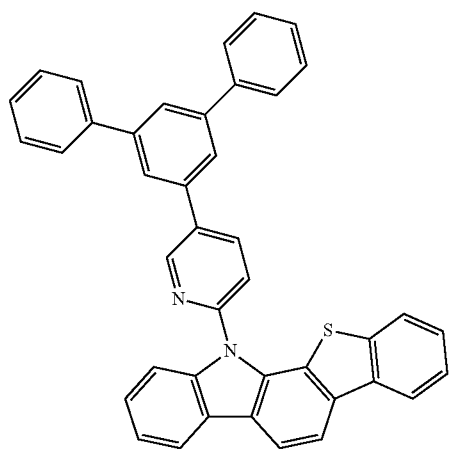

-continued
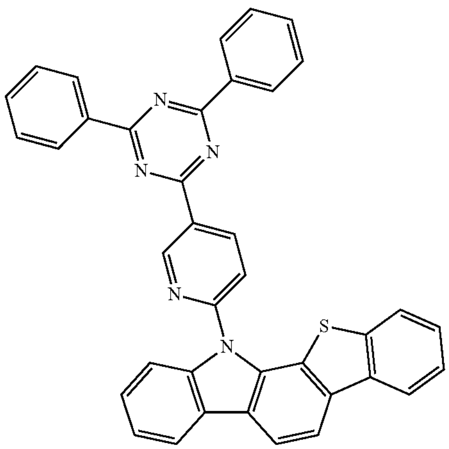
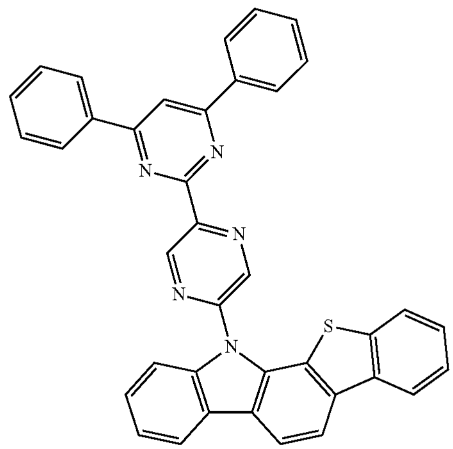
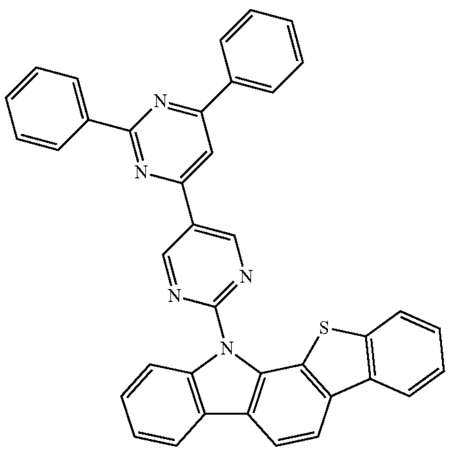
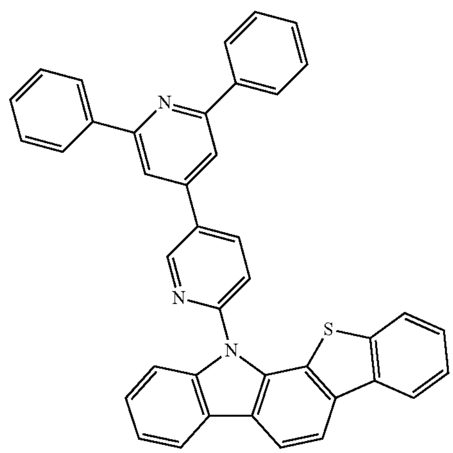
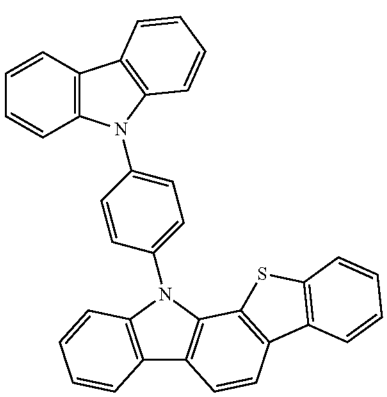
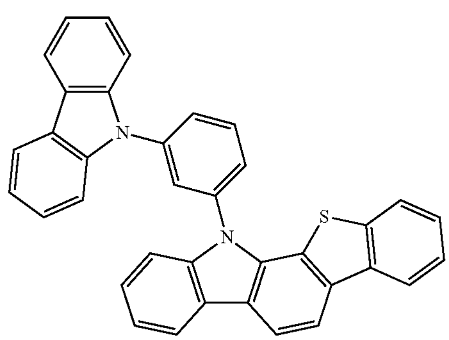
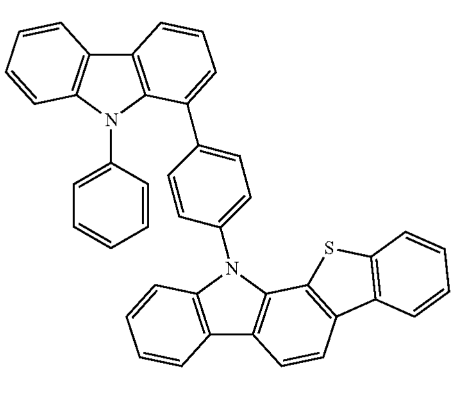
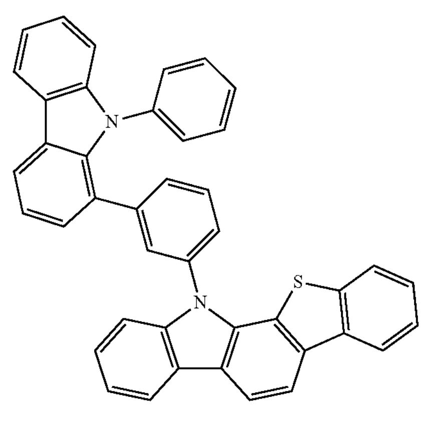

-continued
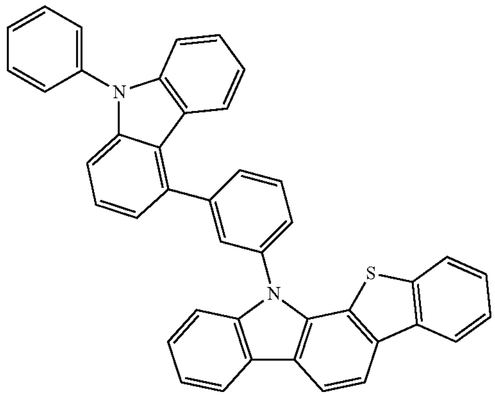
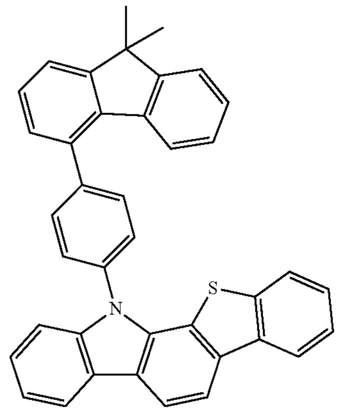
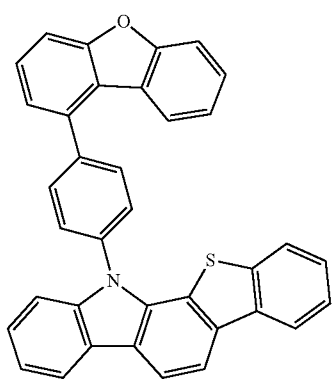
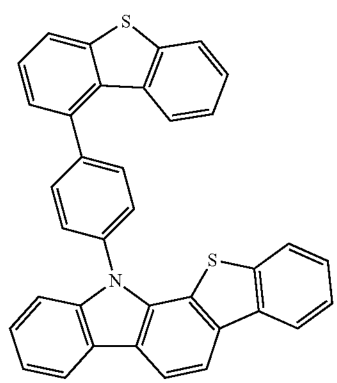
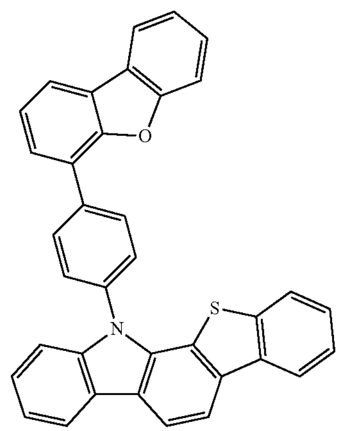
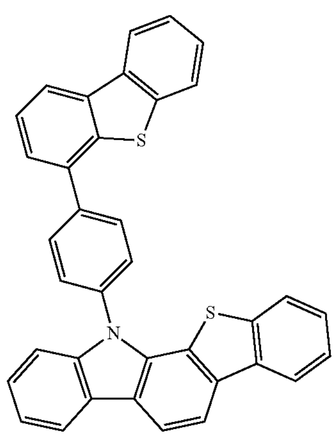
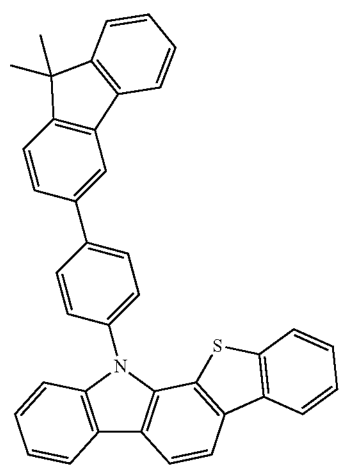
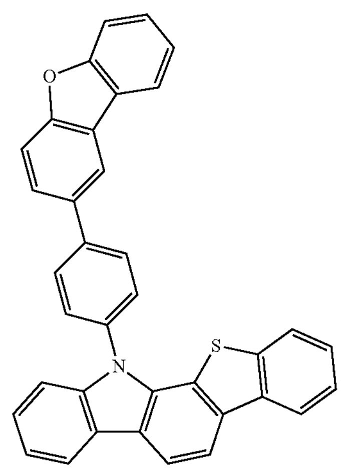

-continued
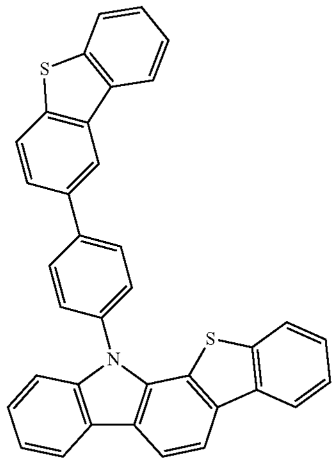
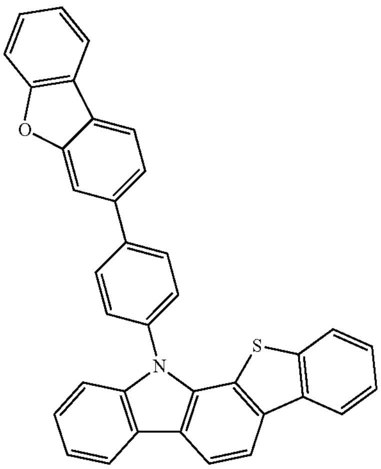
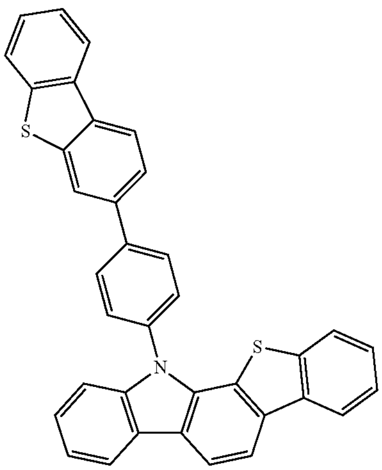
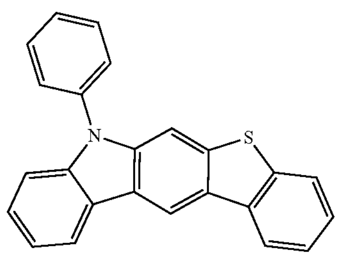
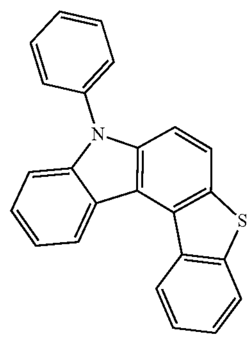
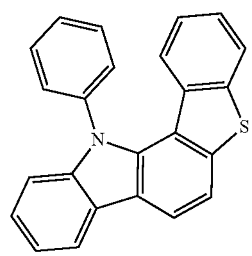
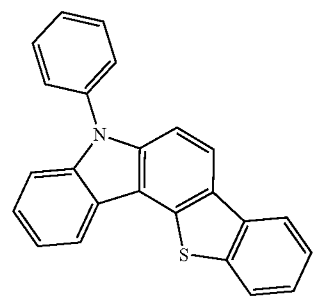
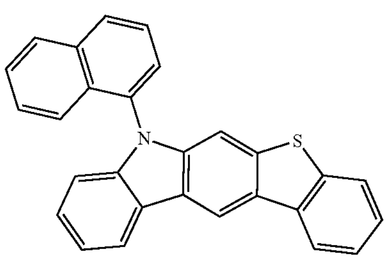
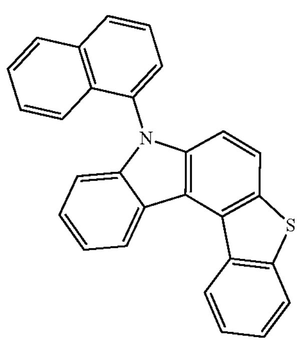
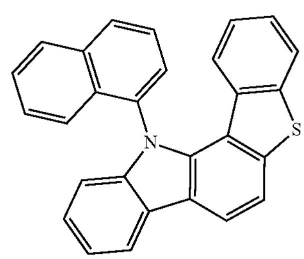
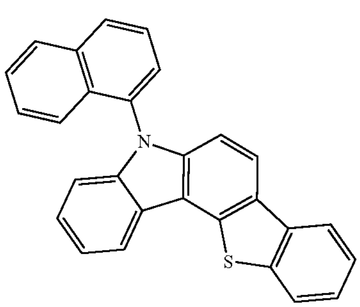
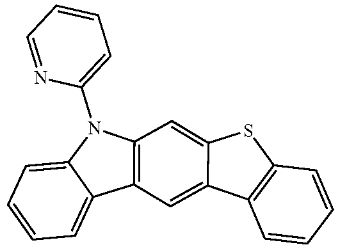
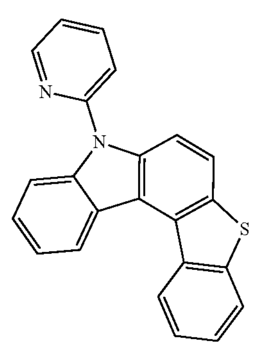

-continued
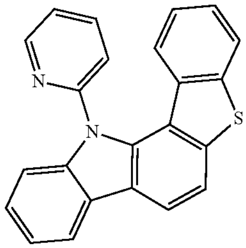
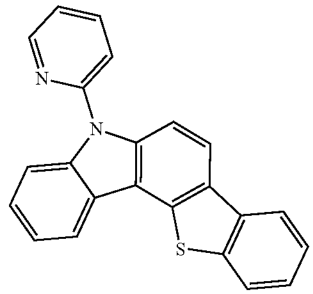
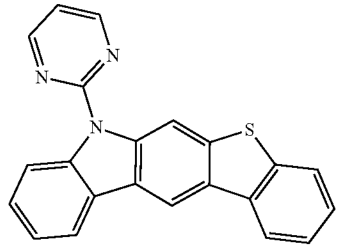
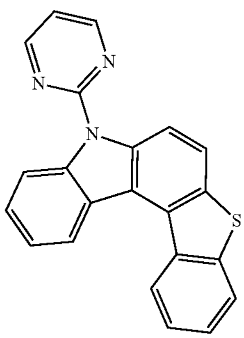
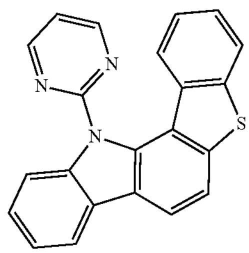
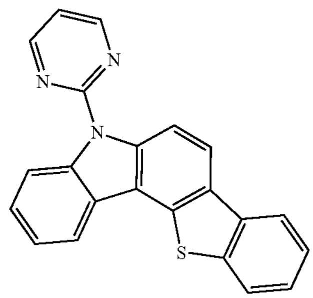
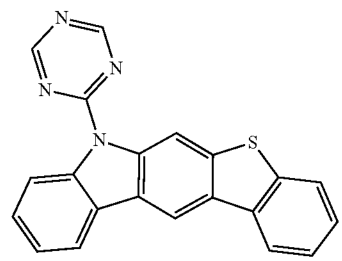
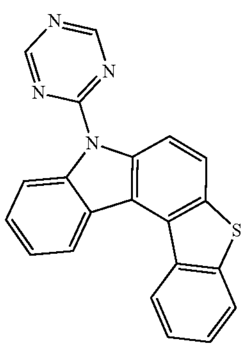
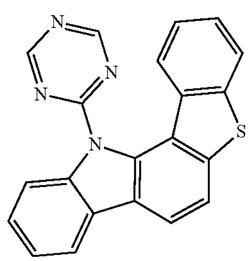
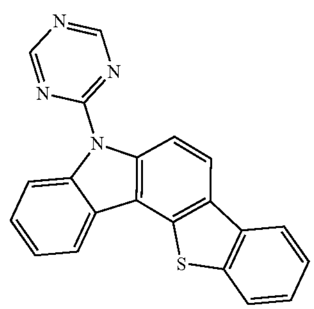
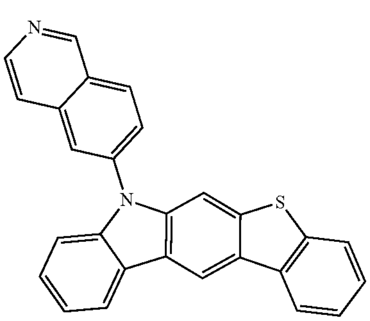
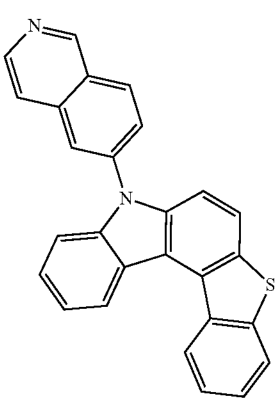
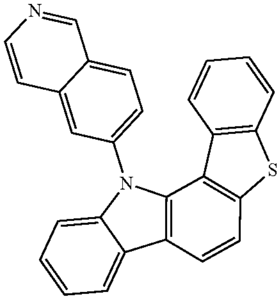

-continued
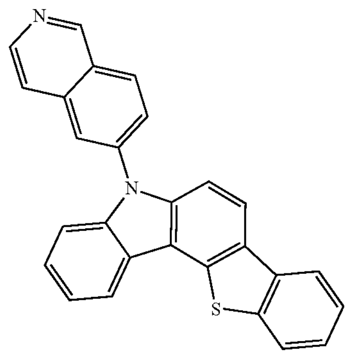
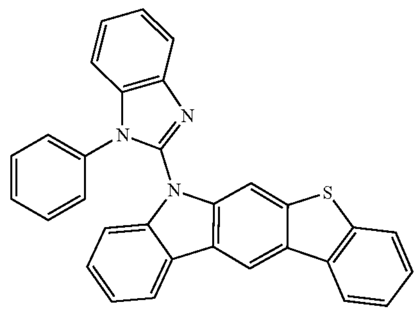
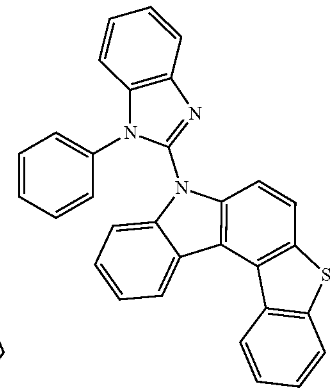
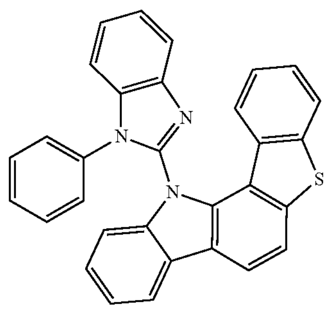
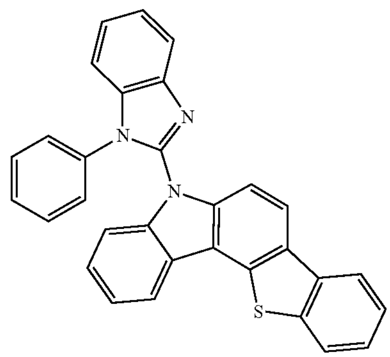
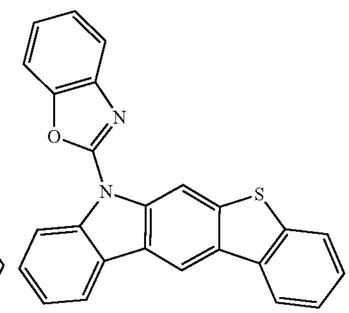
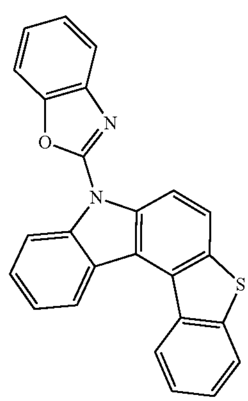
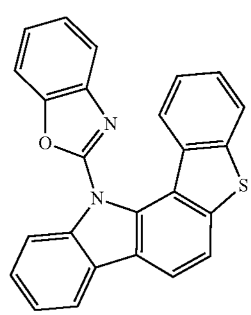
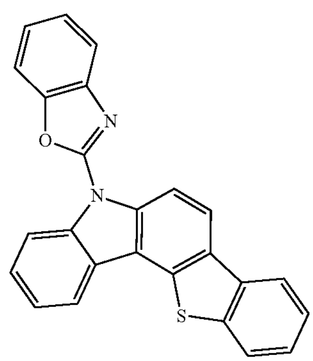
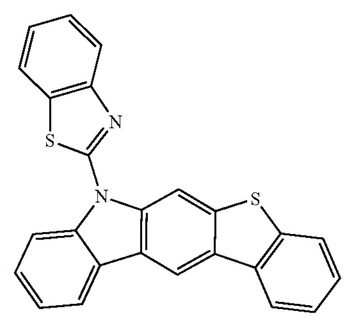
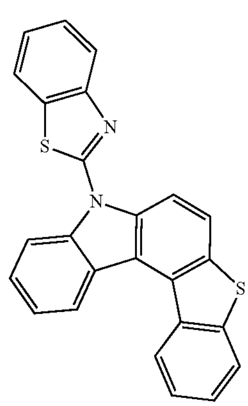
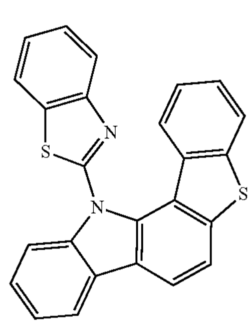
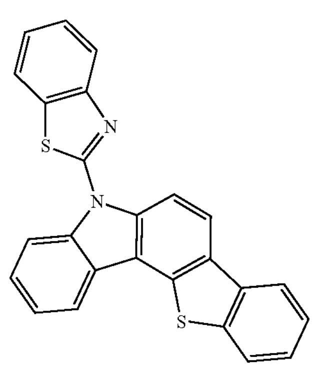

-continued
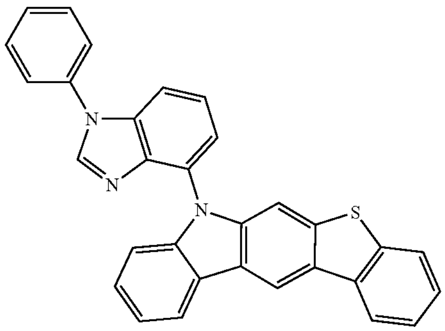
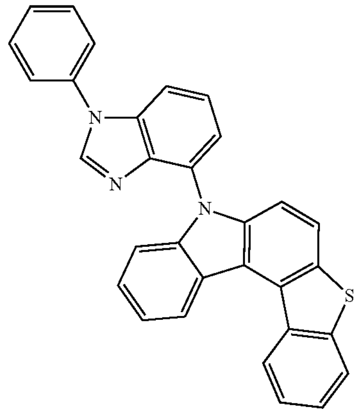
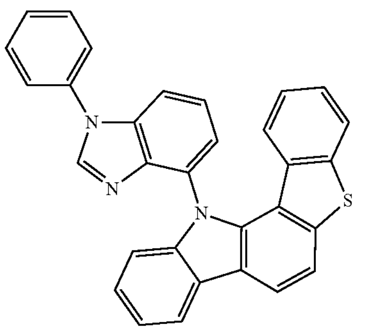
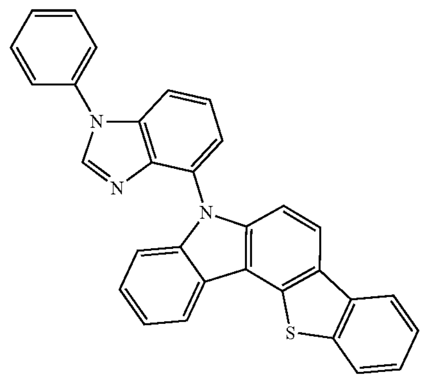
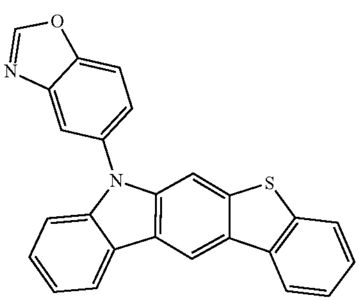
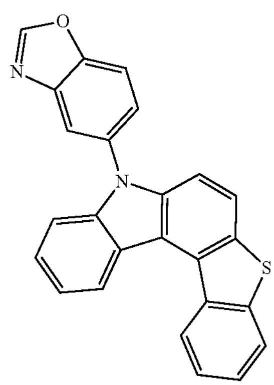
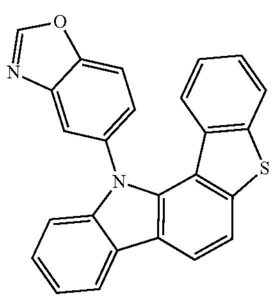
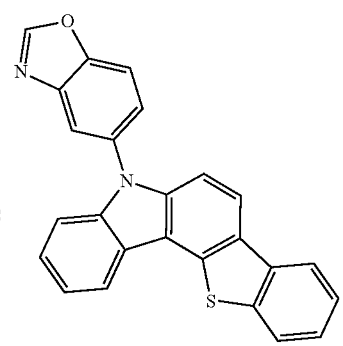
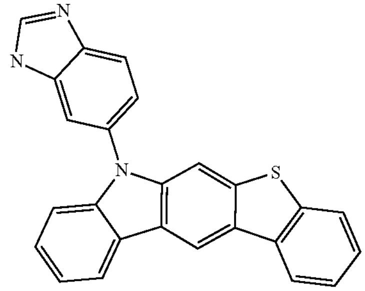
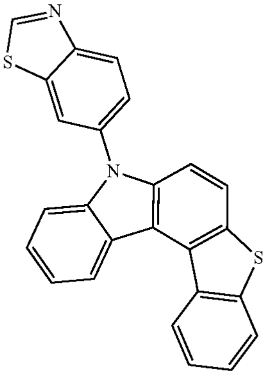
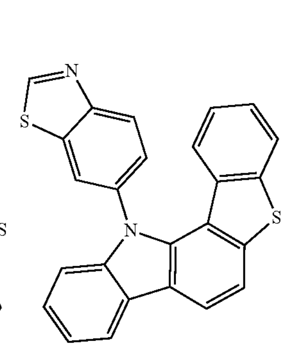

-continued
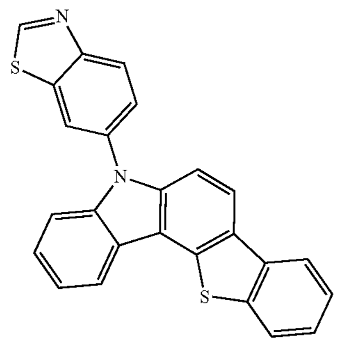
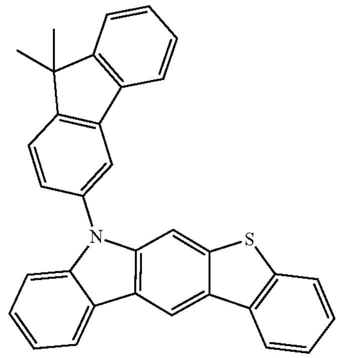
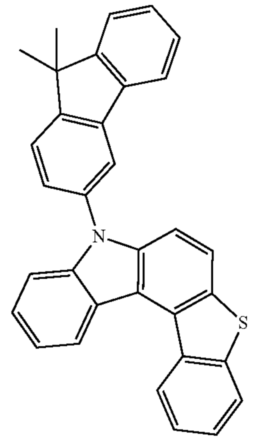
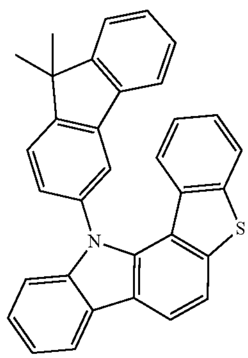
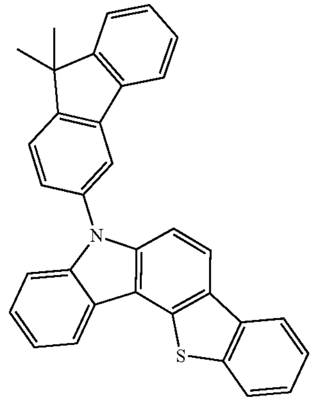
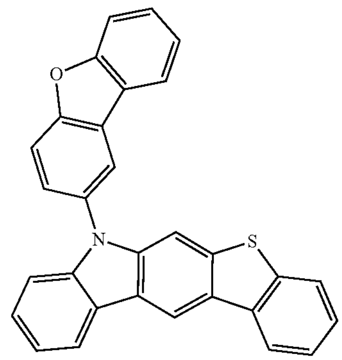
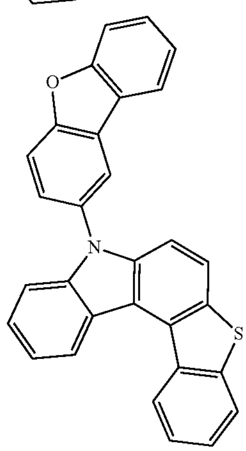
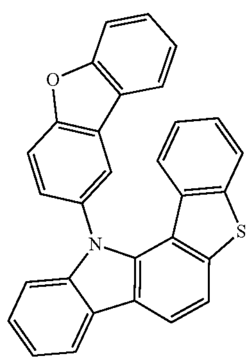
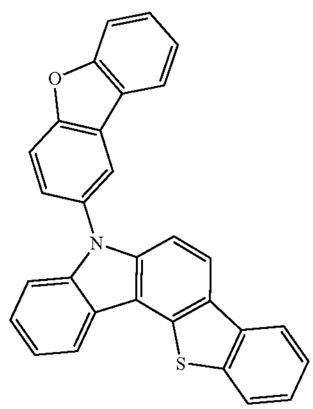
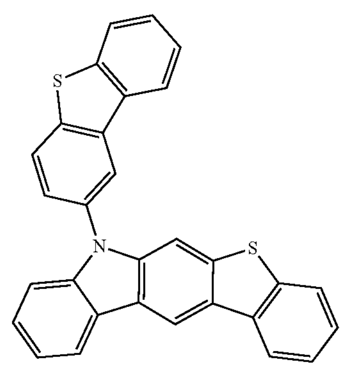
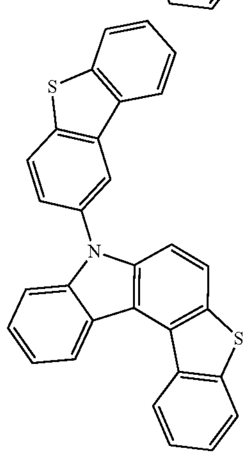
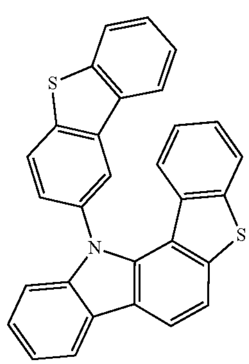
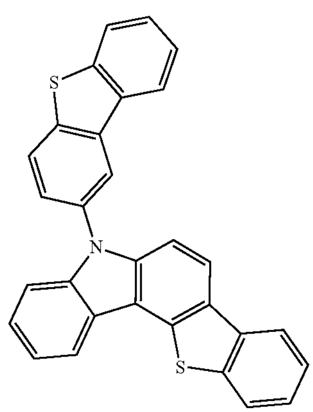
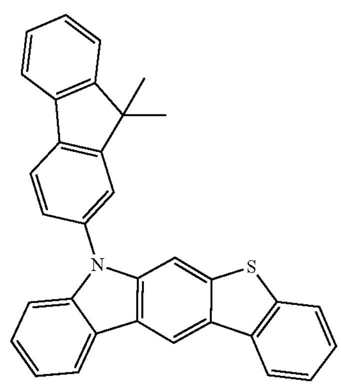

-continued
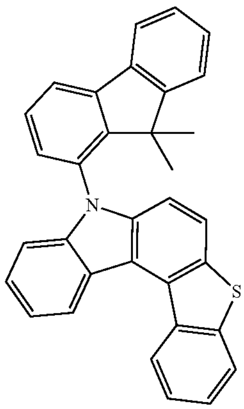
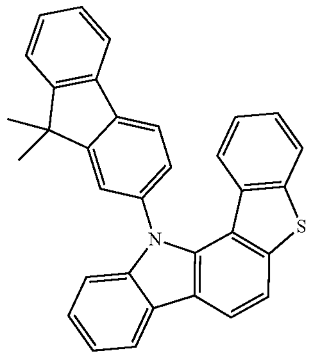
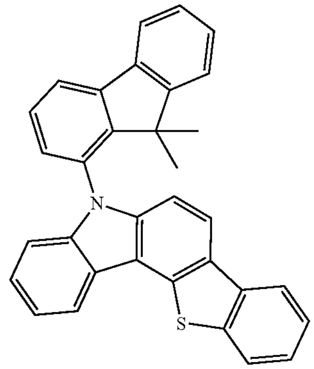
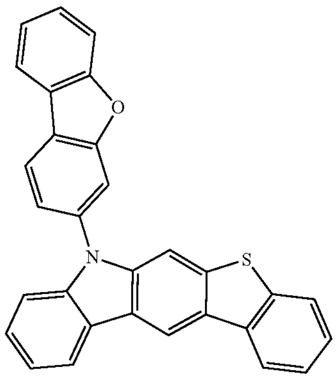
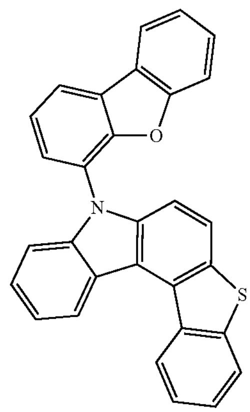
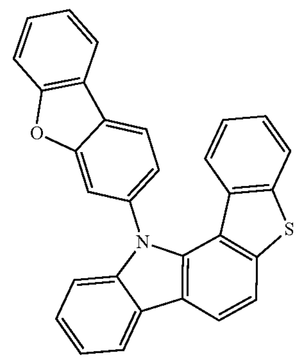
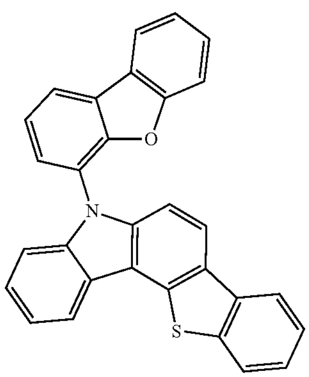
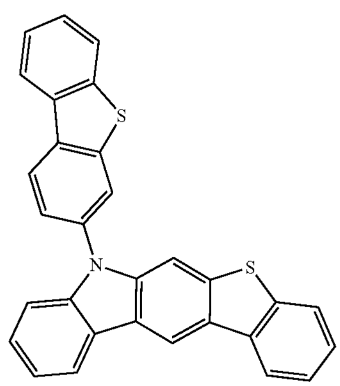
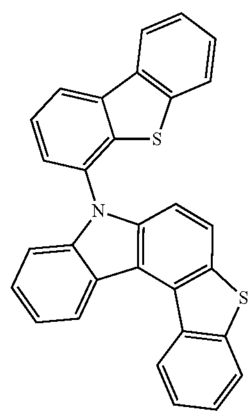
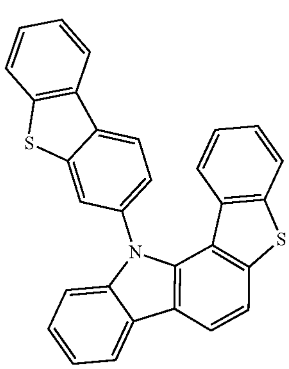
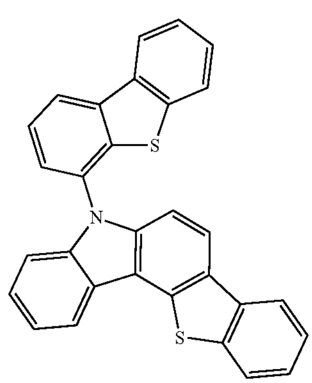
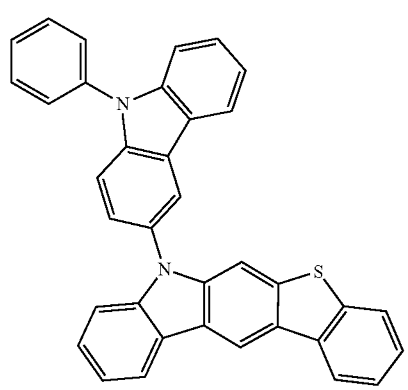

-continued
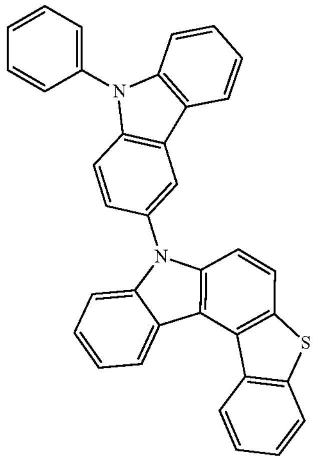
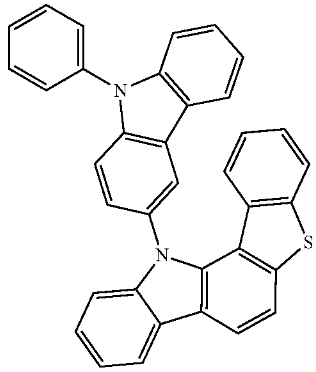
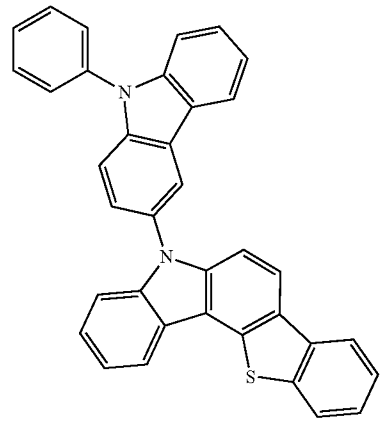
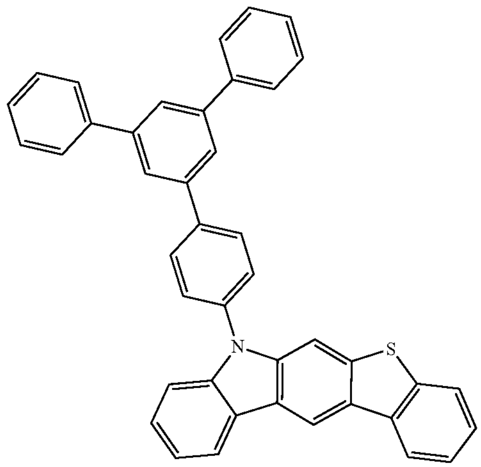
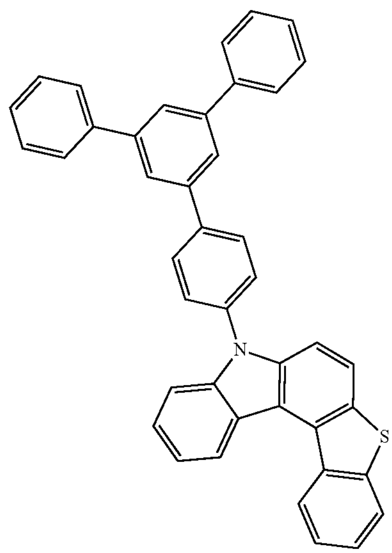
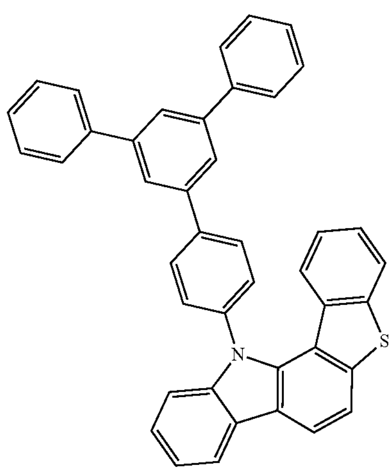
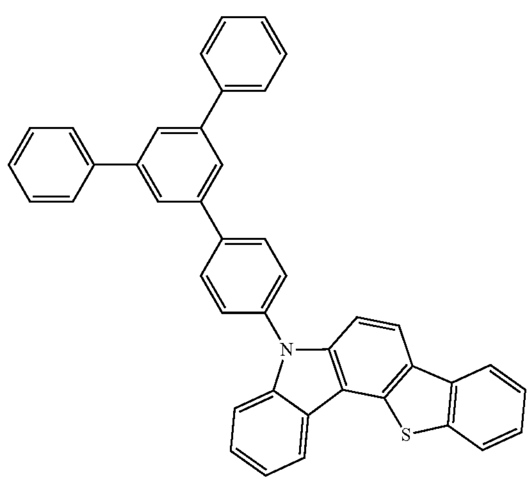

-continued
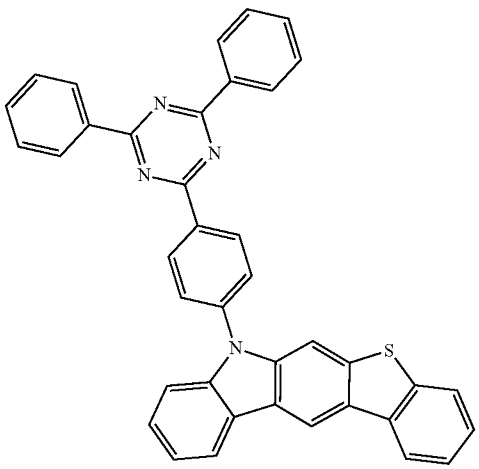
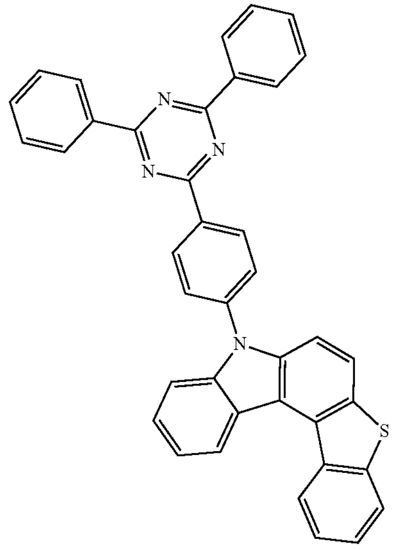
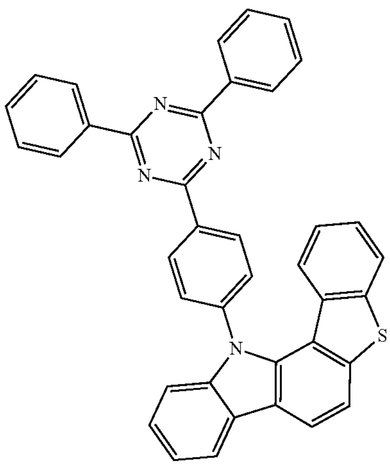
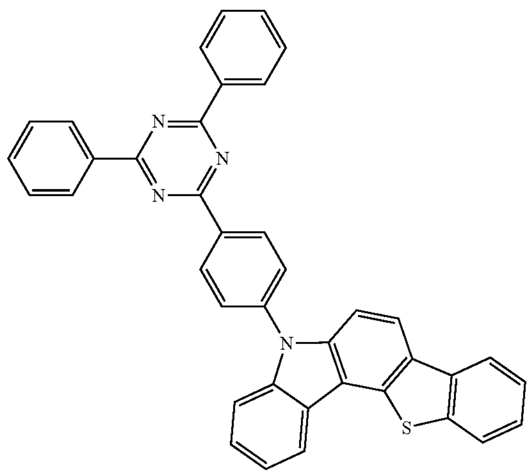
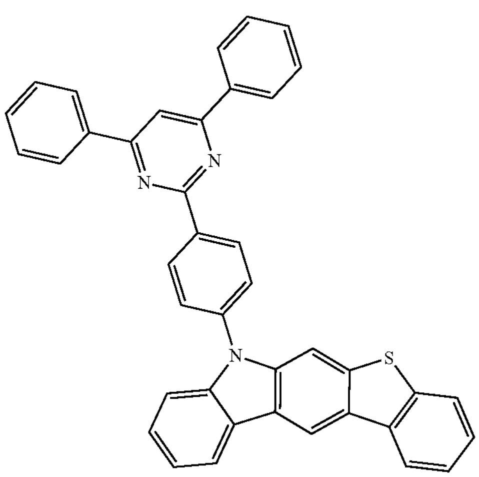
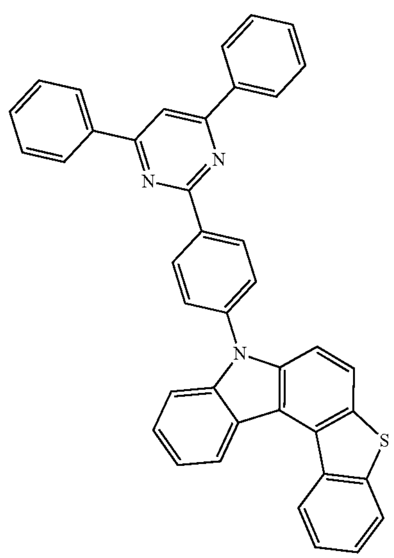

-continued
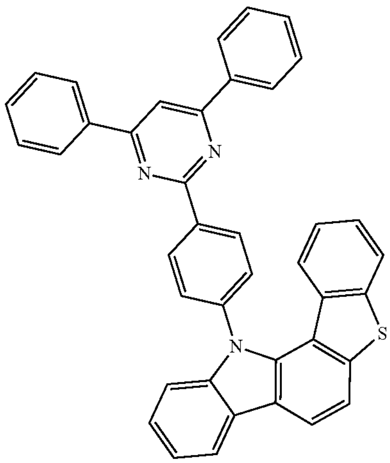
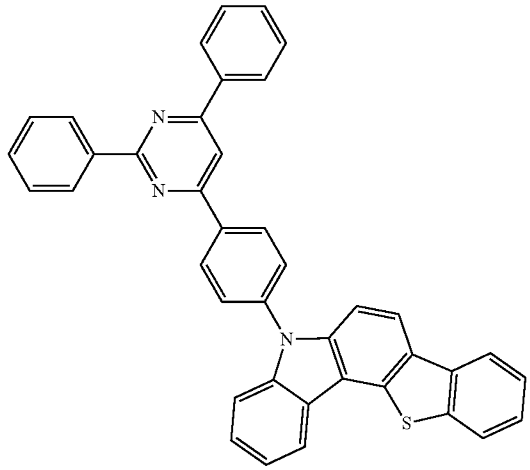
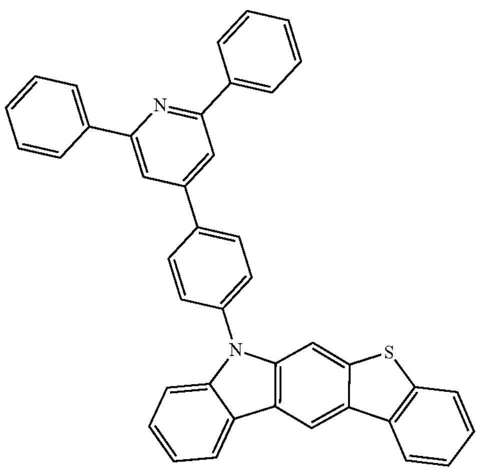
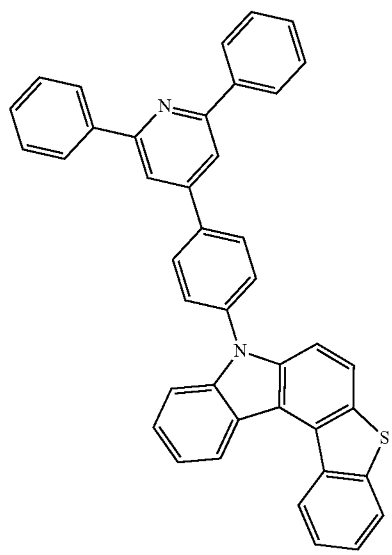
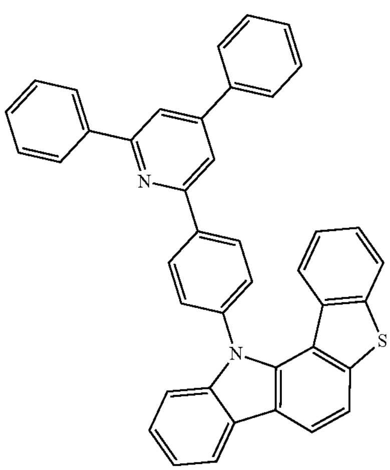
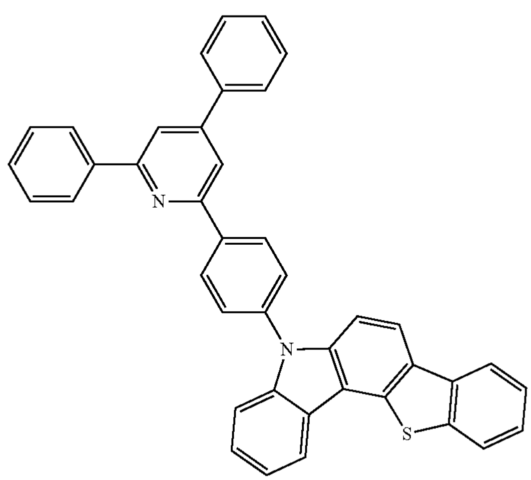

-continued
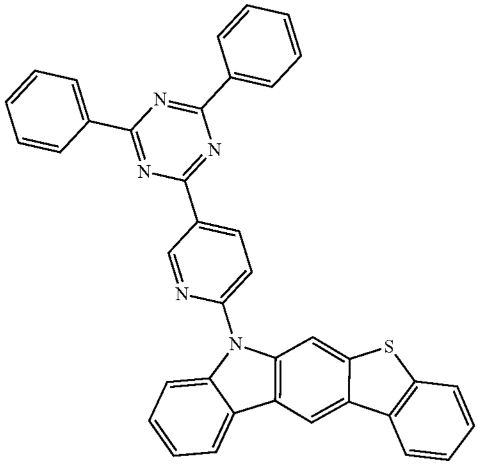
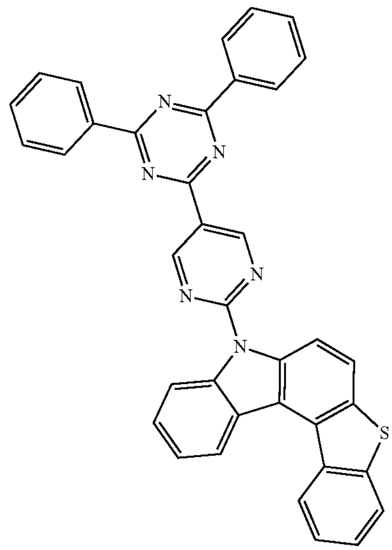
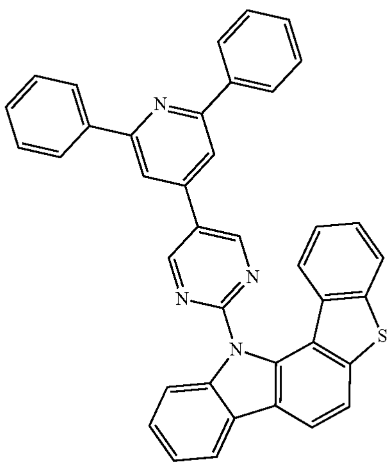
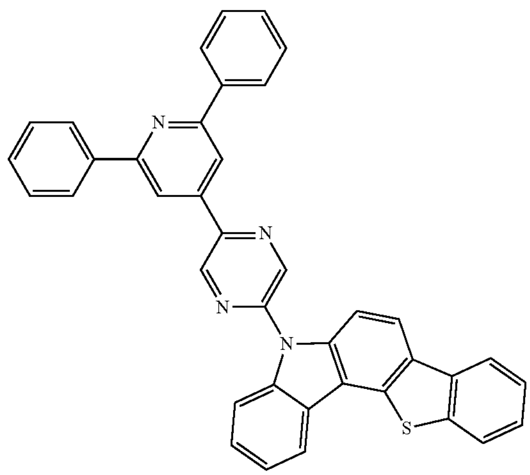
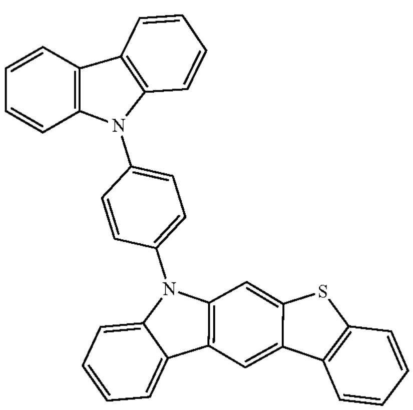
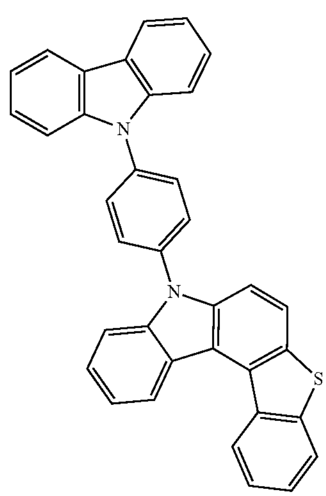
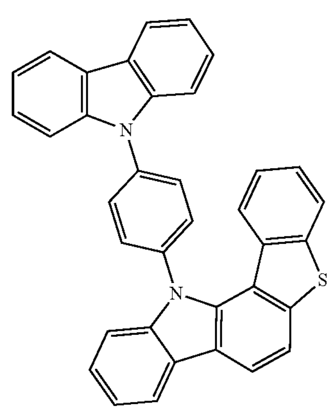

-continued
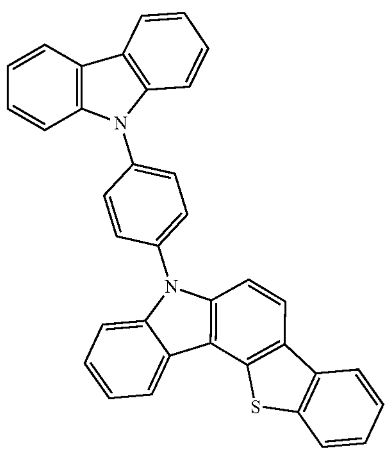
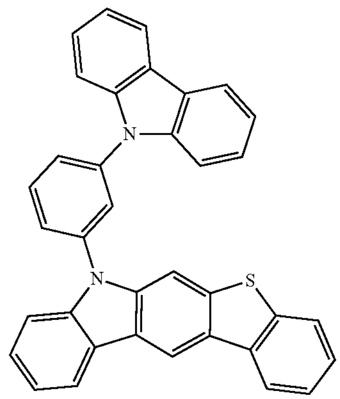
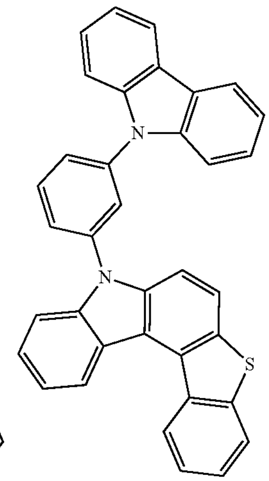
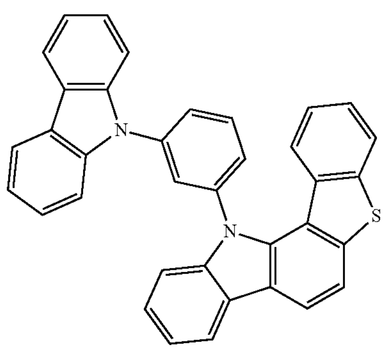
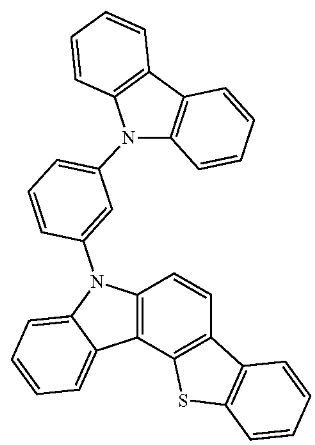
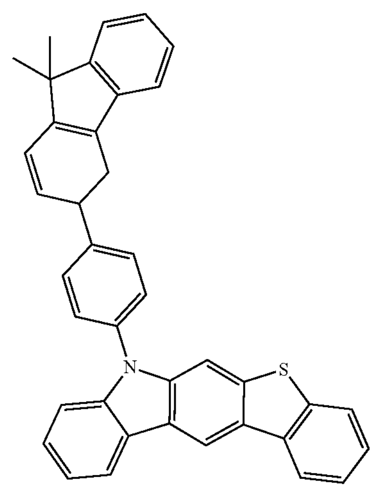
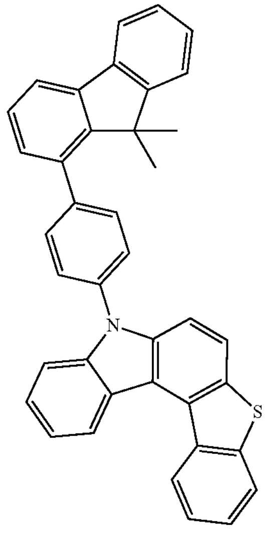
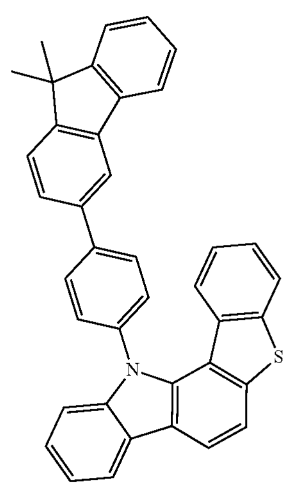
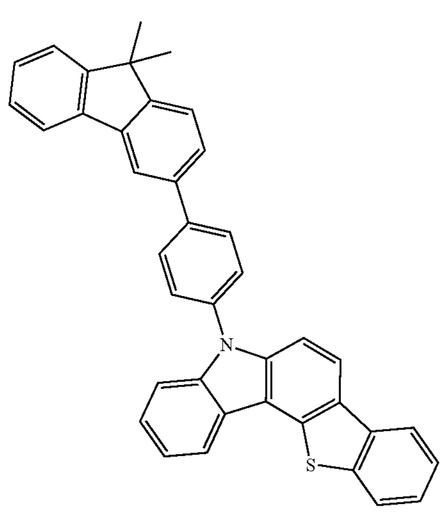

-continued
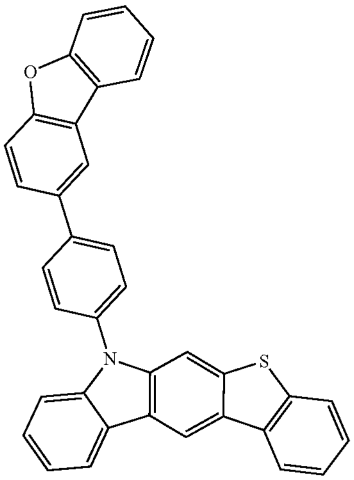
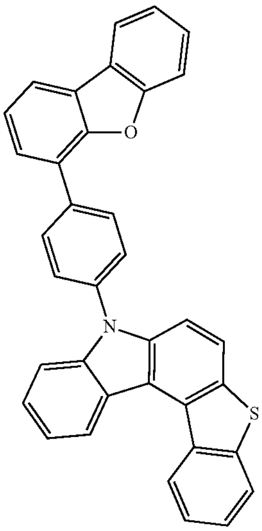
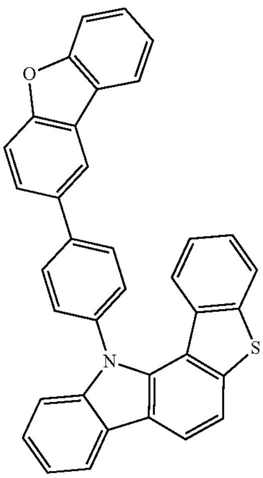
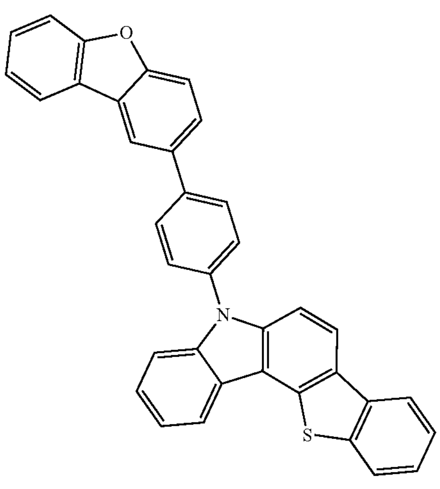
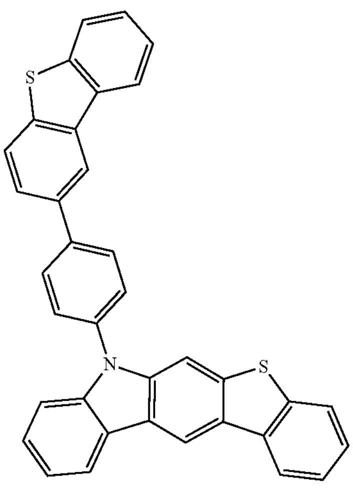
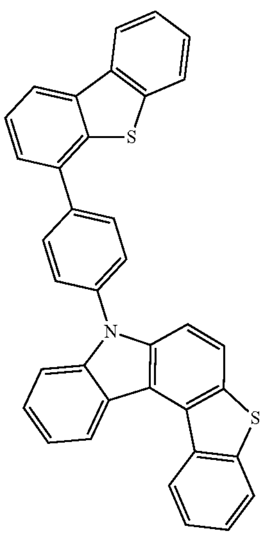
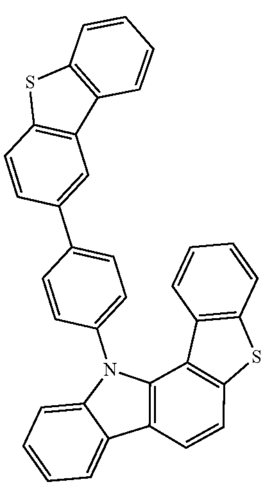
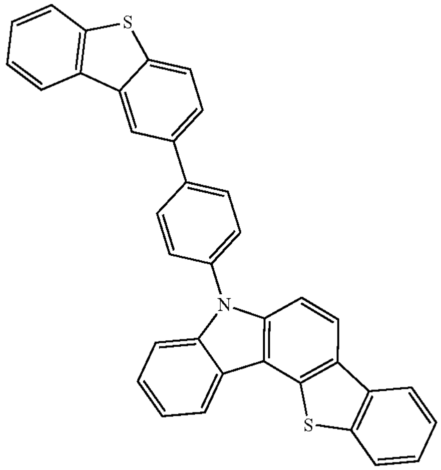
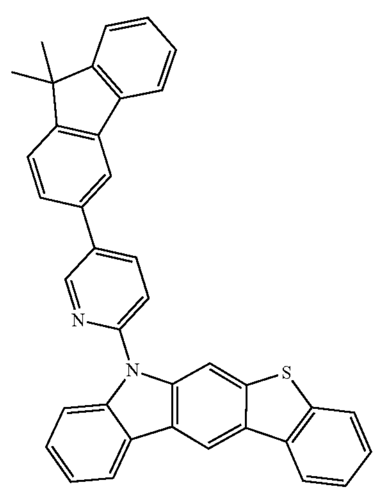

-continued
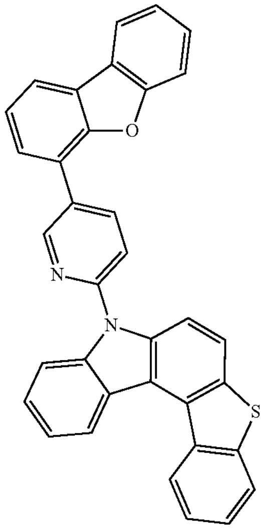
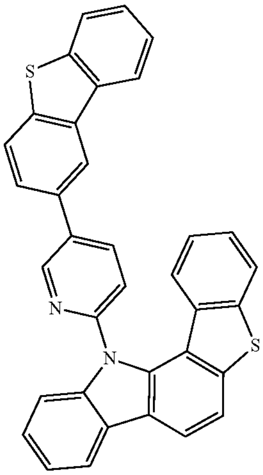
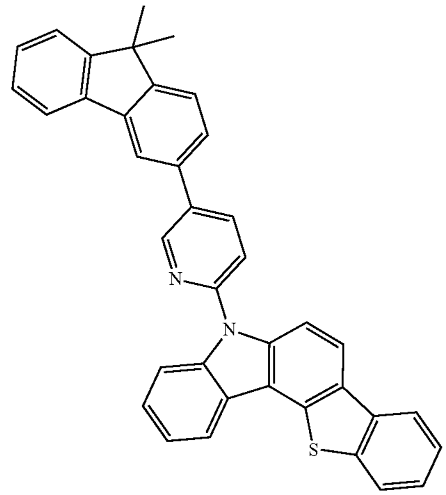
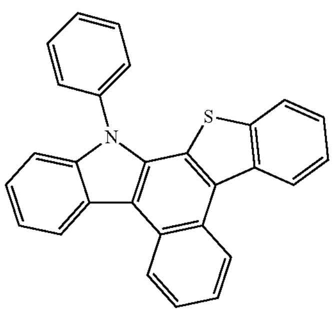
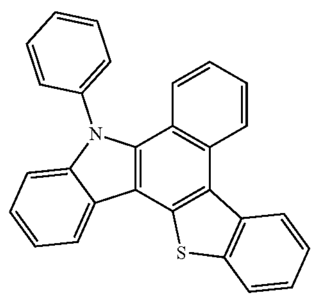
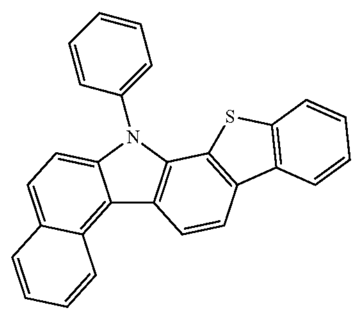
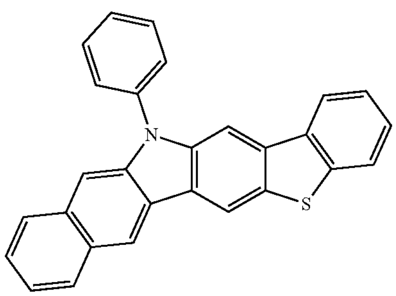
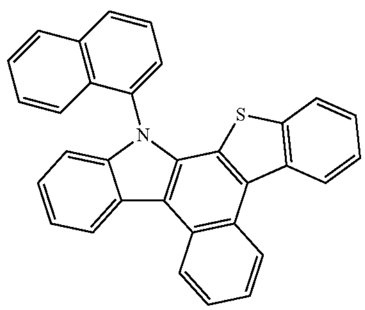
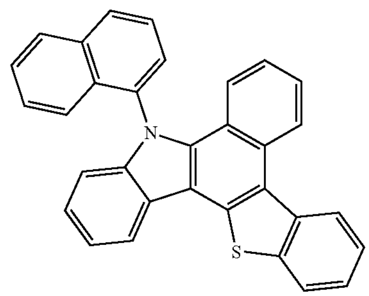
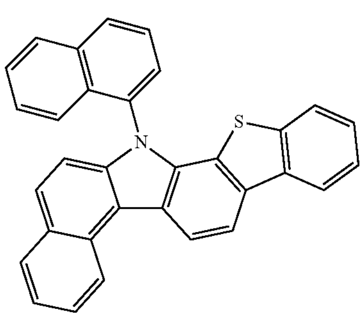
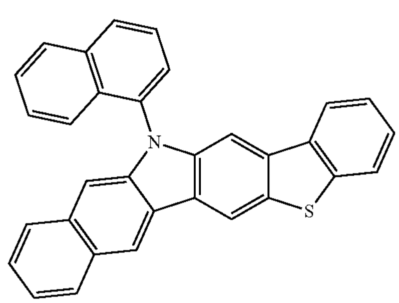
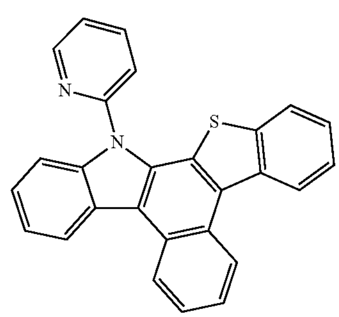

-continued
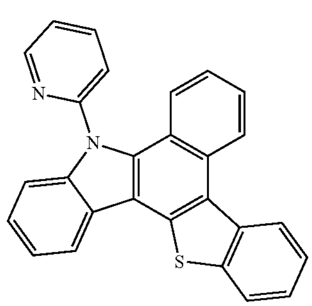
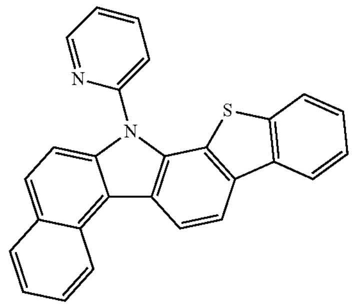
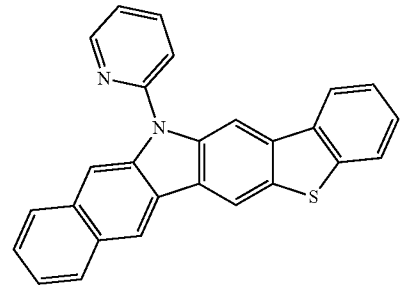
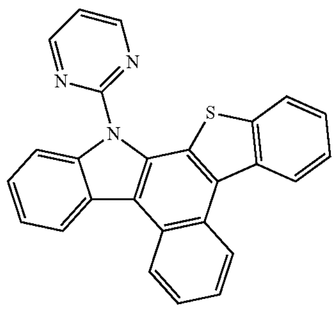
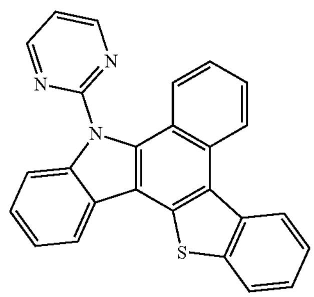
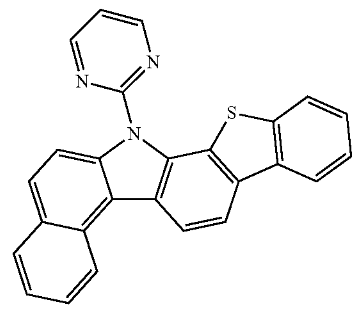
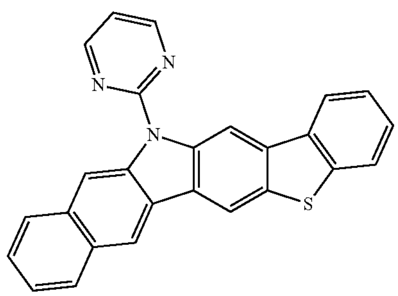
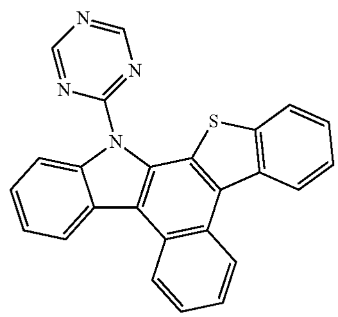
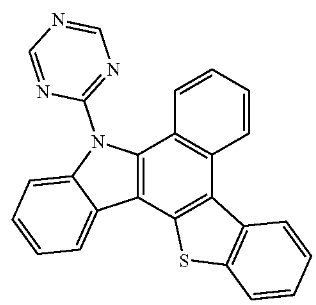
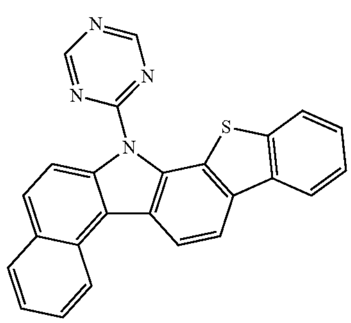
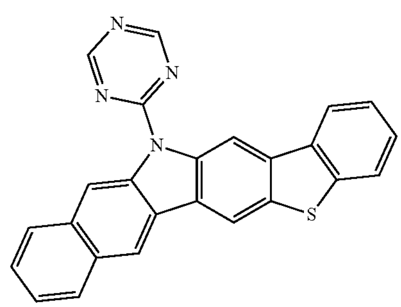
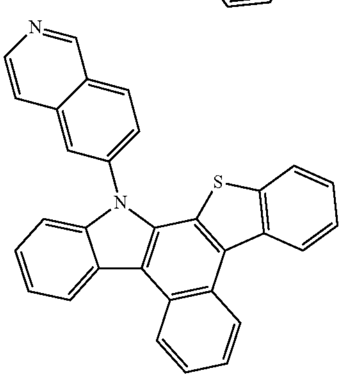
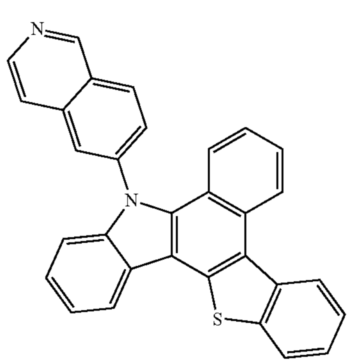
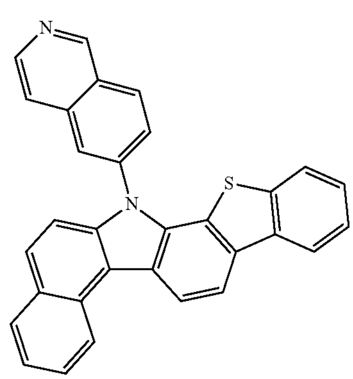
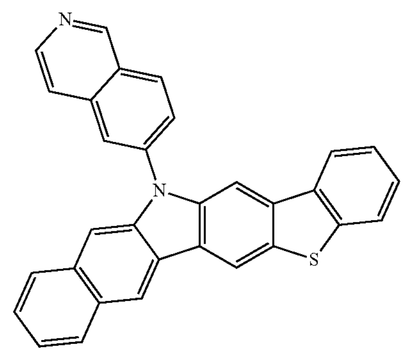

-continued
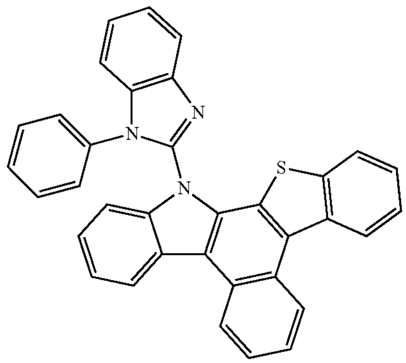
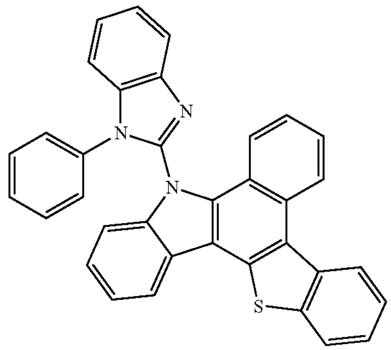
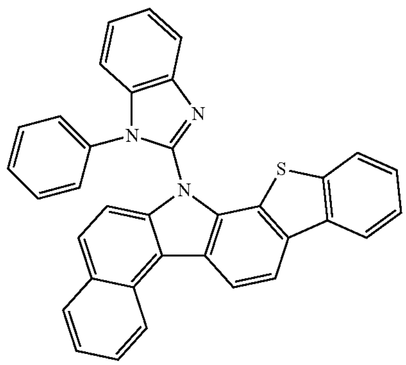
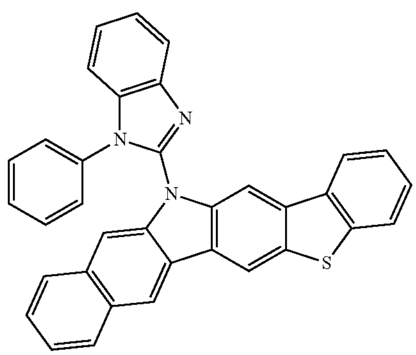
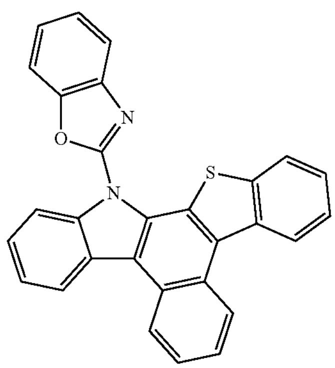
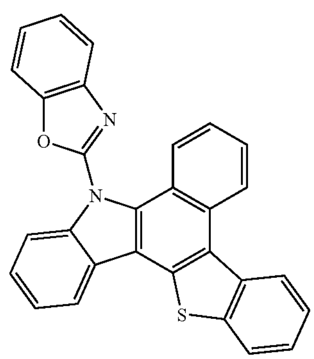
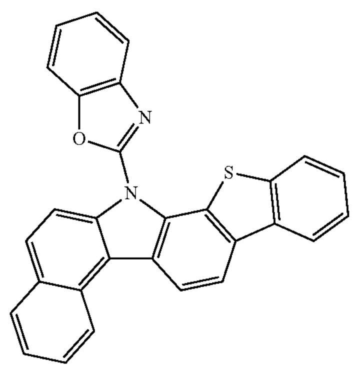
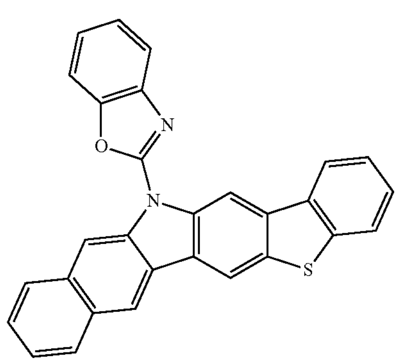
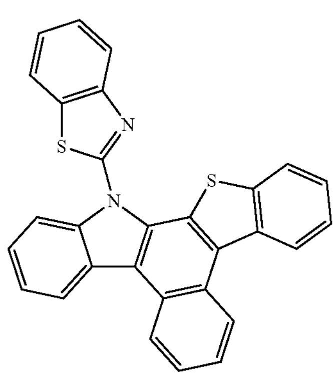
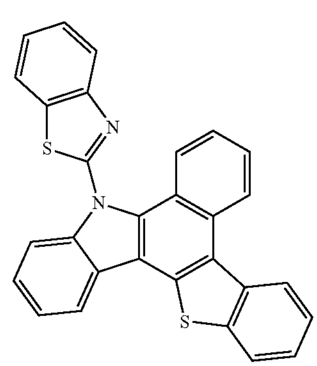

-continued
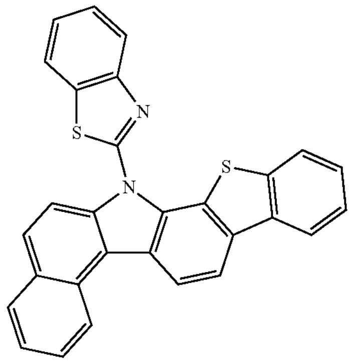
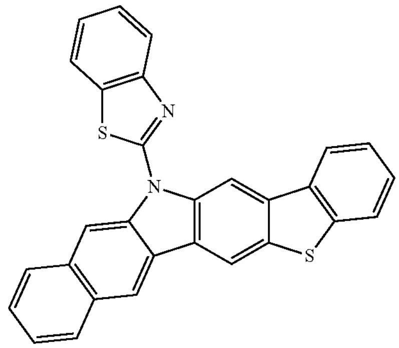
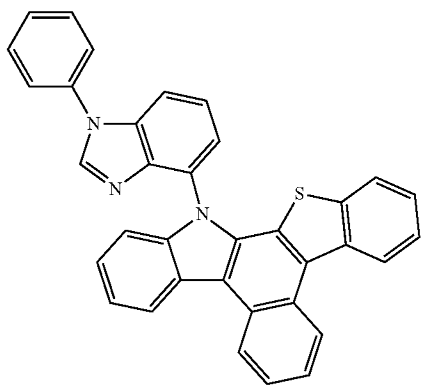
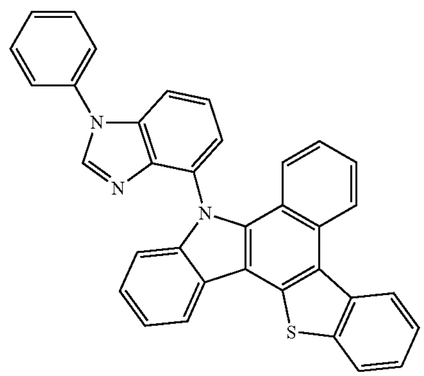
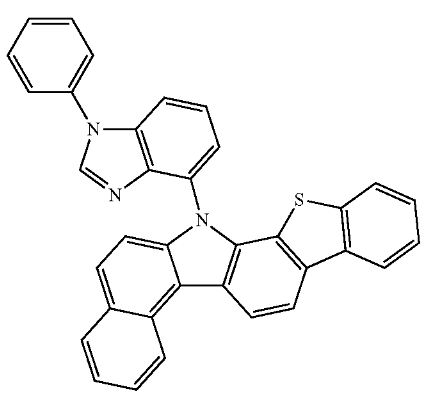
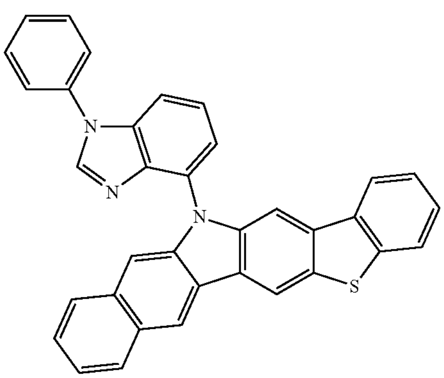
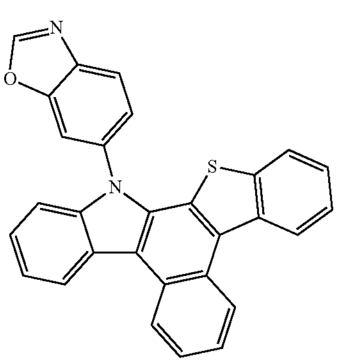
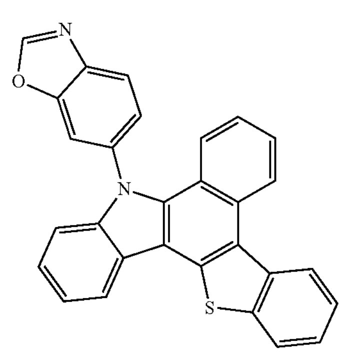
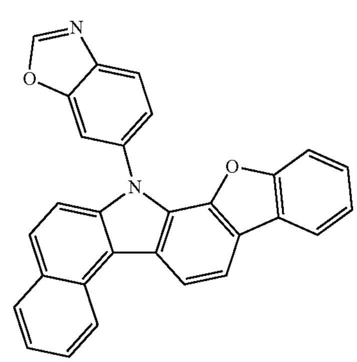

-continued
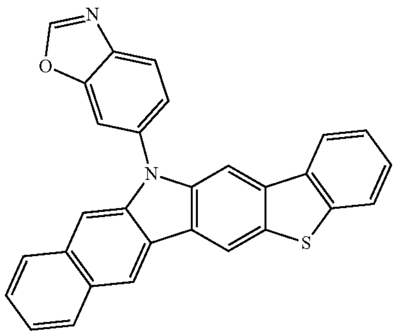
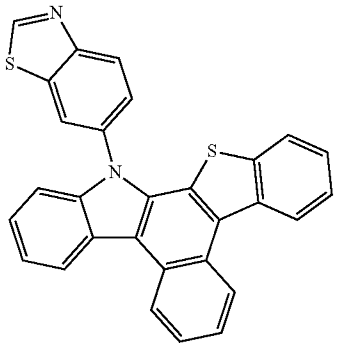
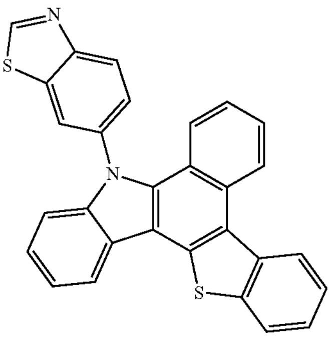
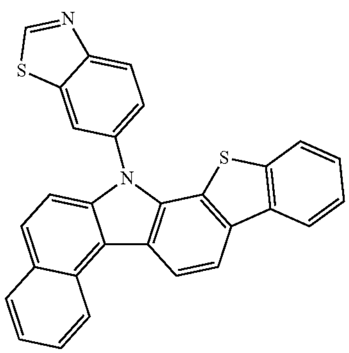
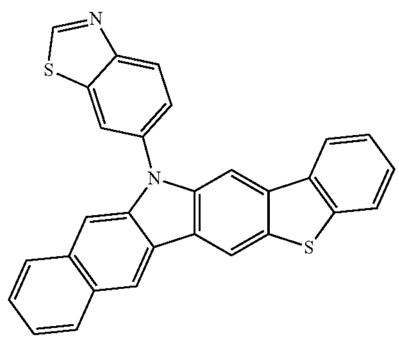
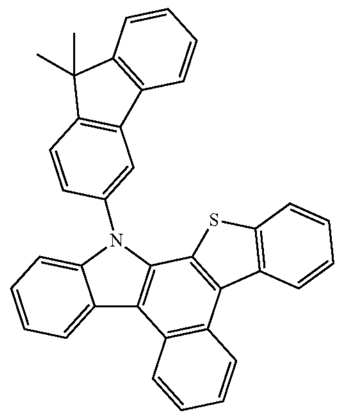
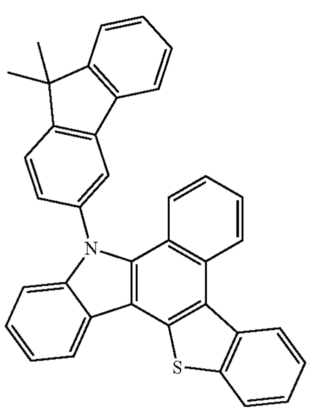
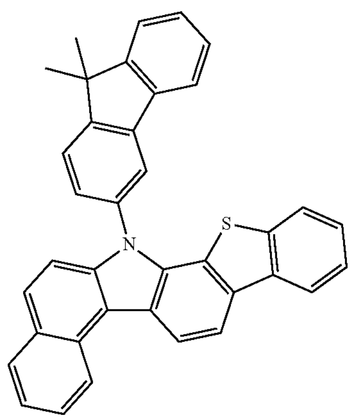
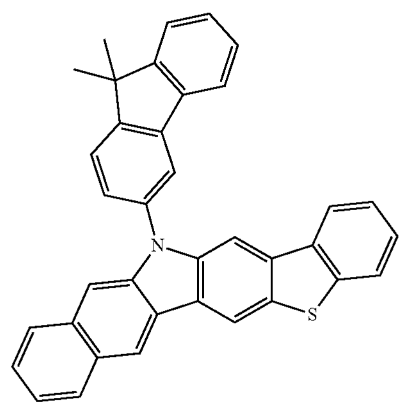
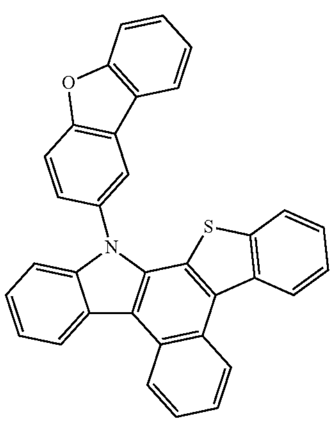
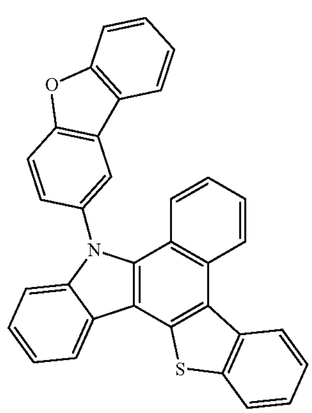
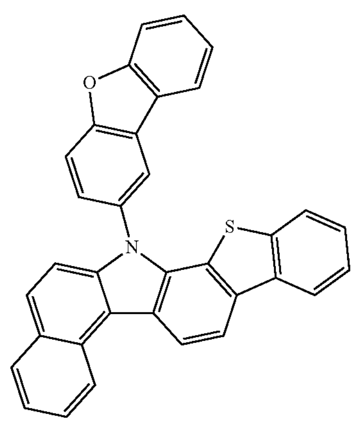

-continued
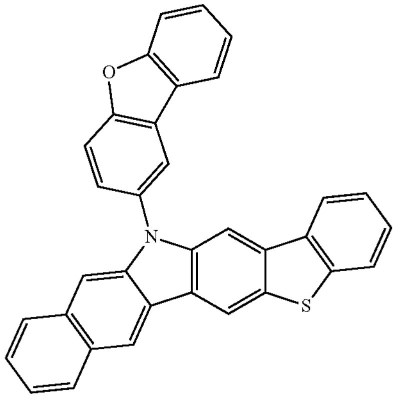
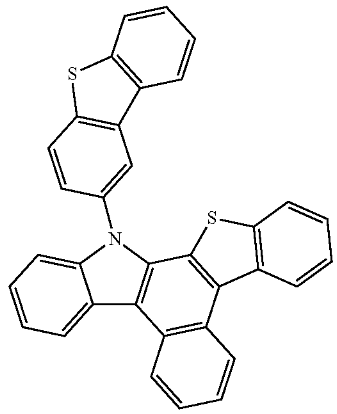
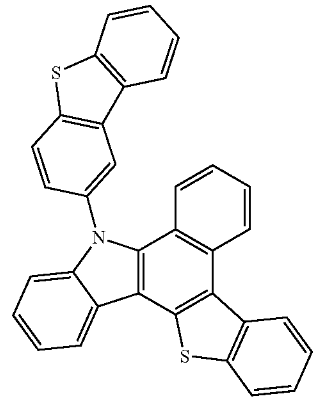
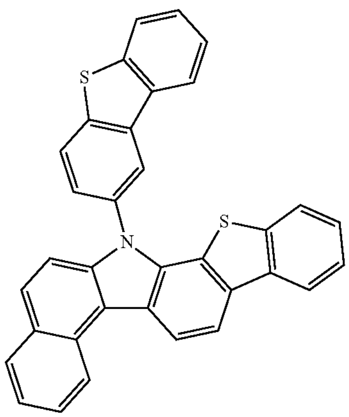
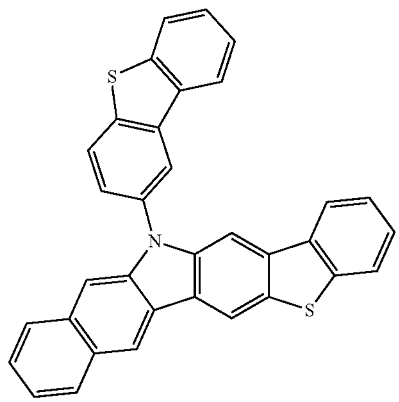
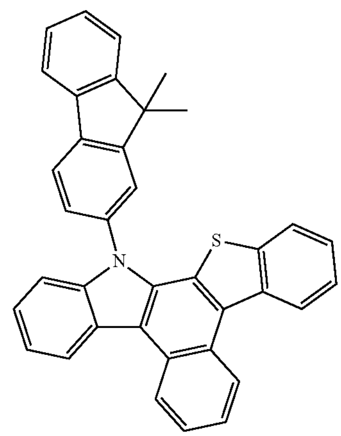
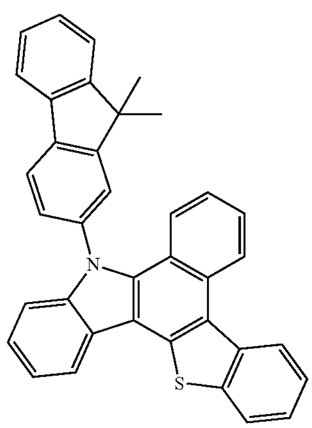
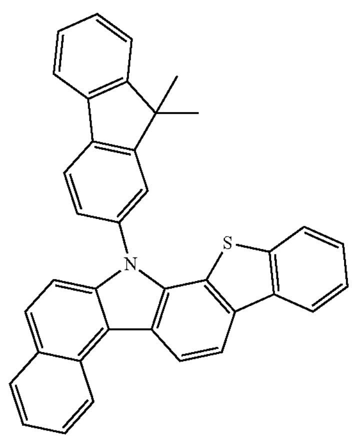
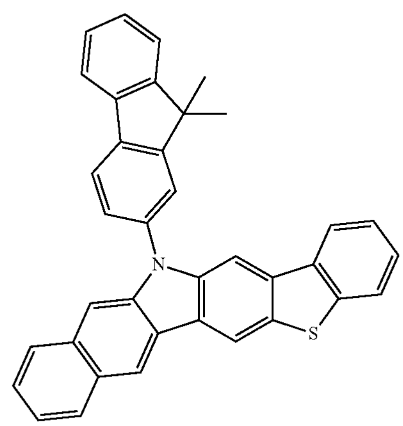
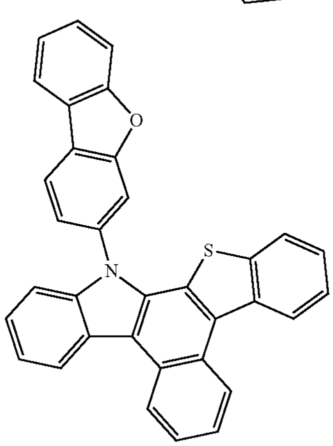
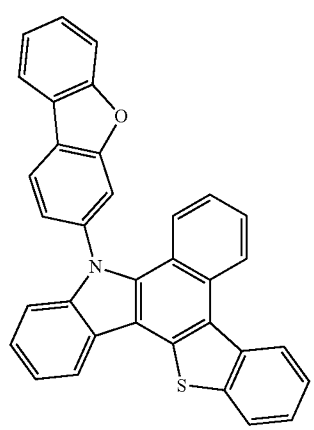
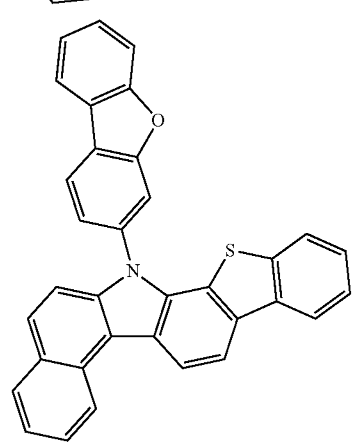

-continued
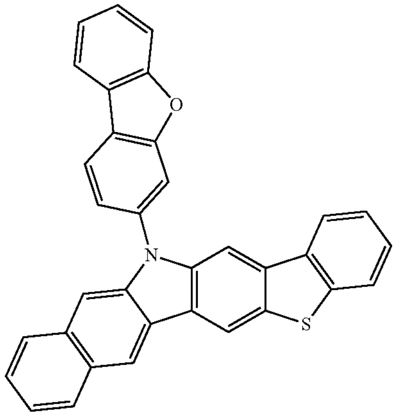
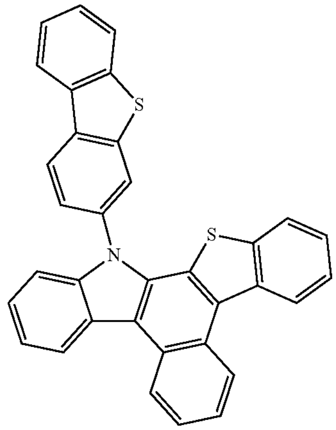
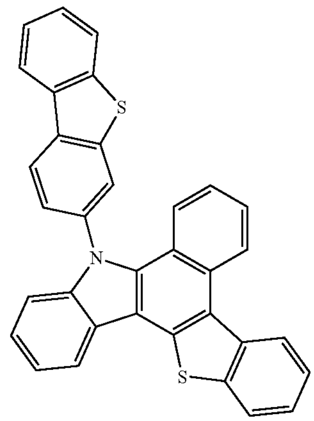
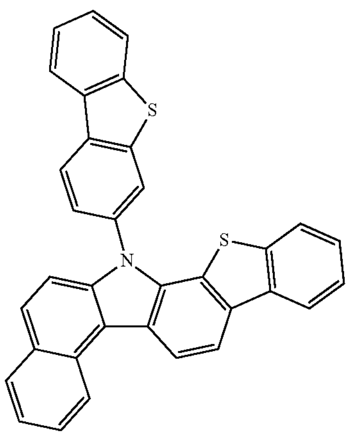
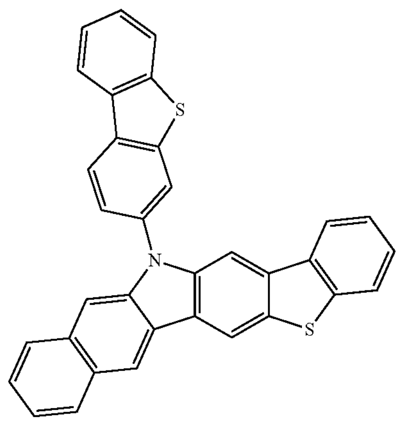
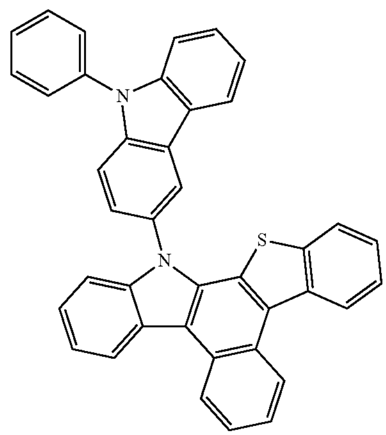
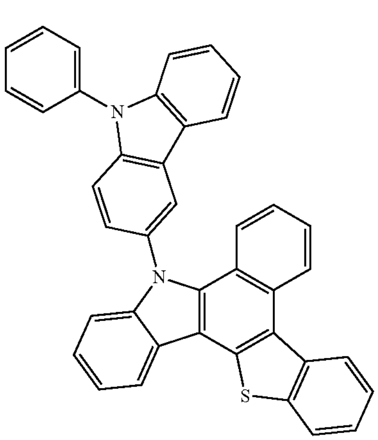
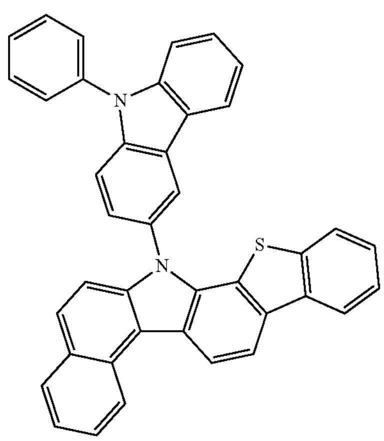

-continued
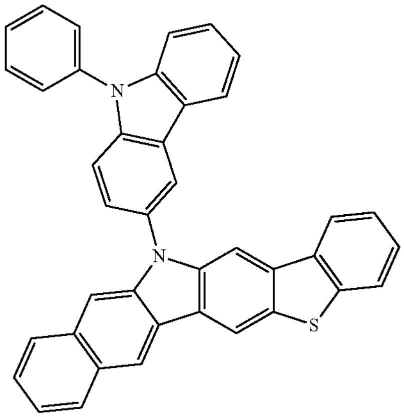
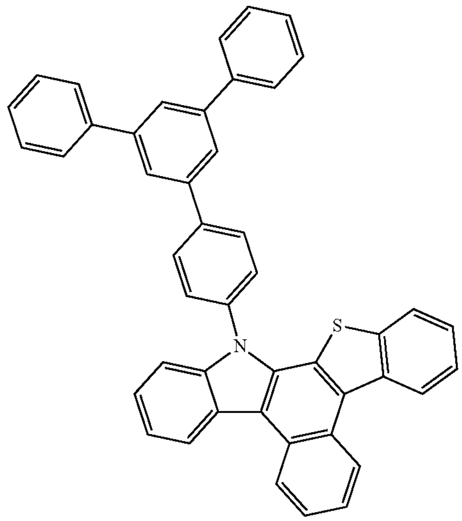
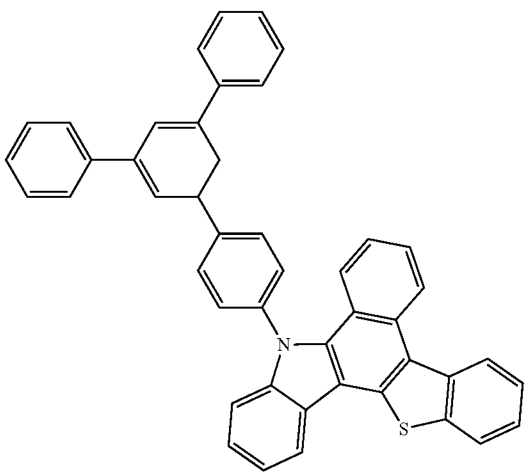
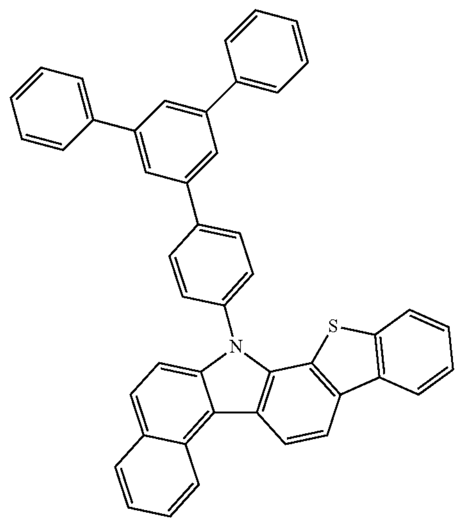
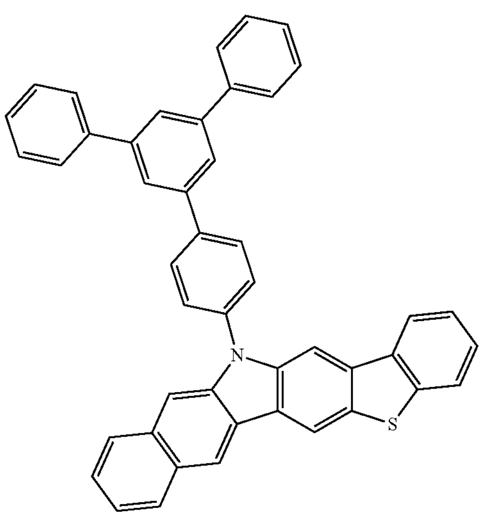
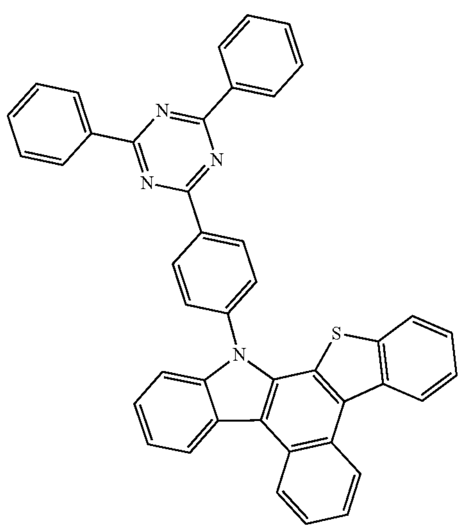

-continued
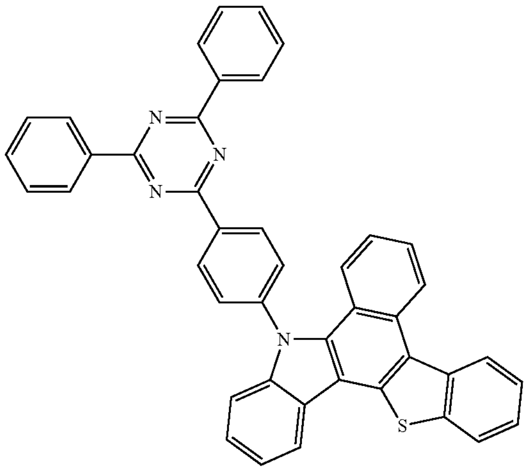
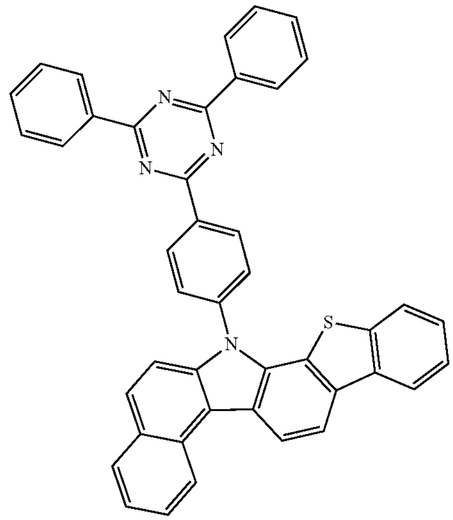
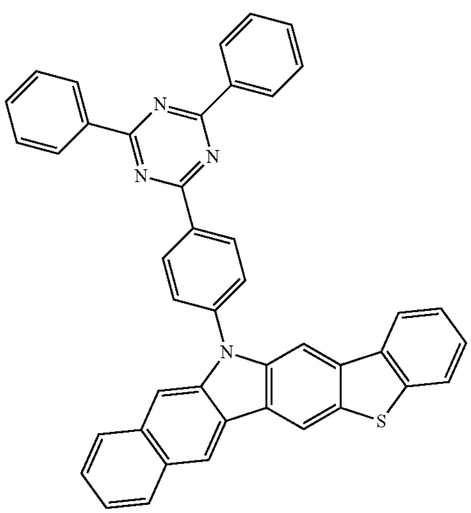
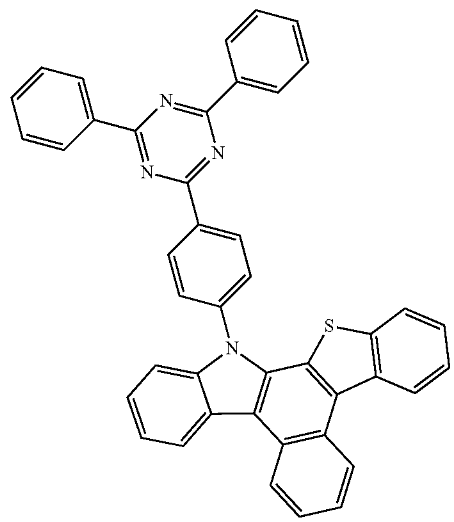
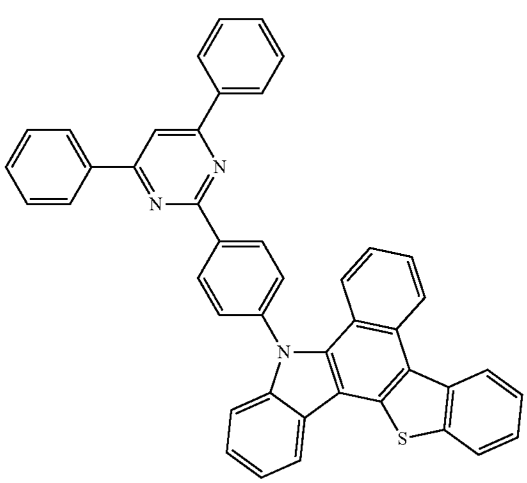
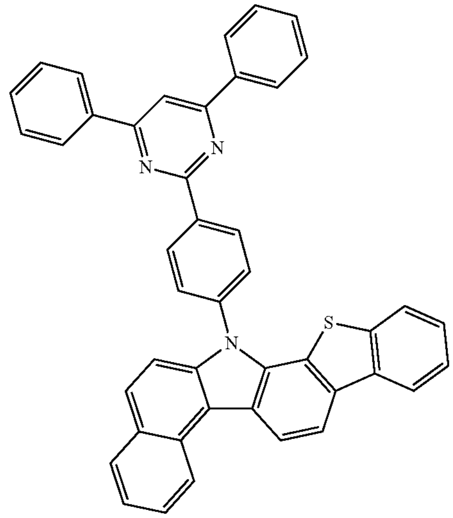

-continued
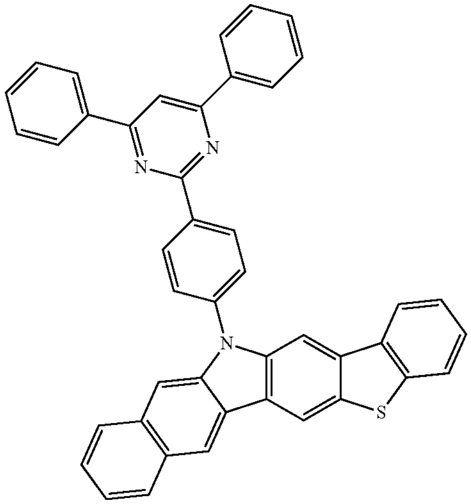
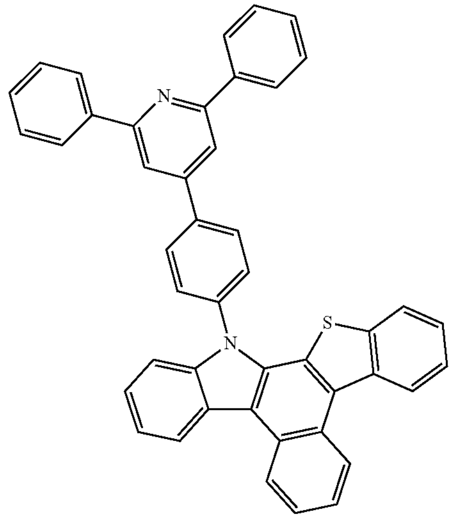
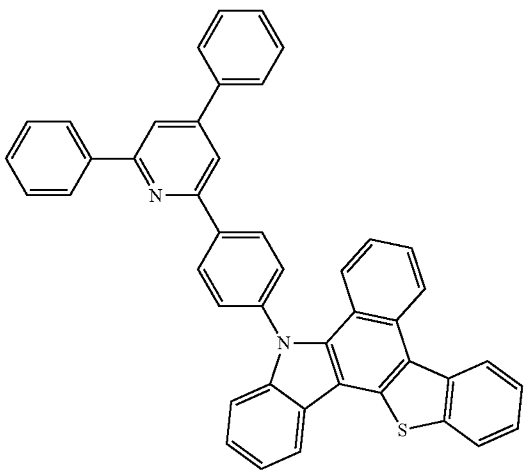
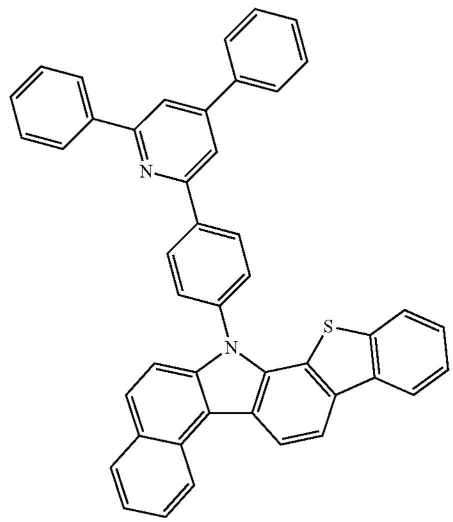
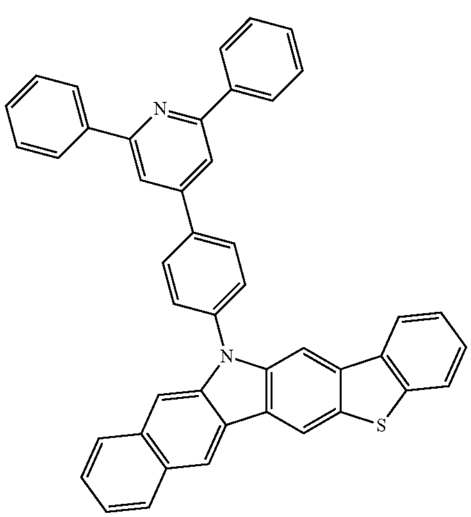
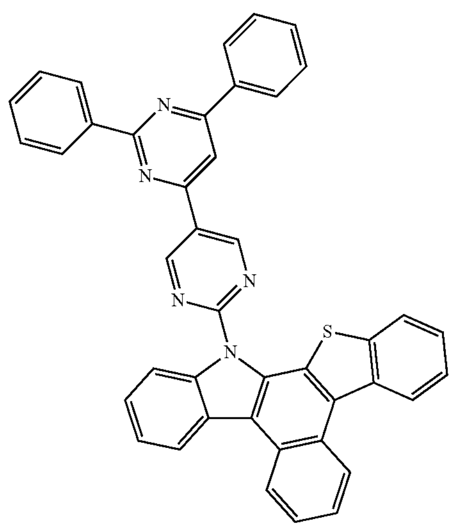

-continued
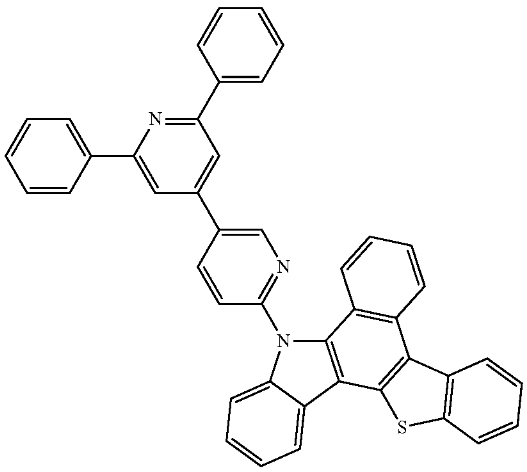
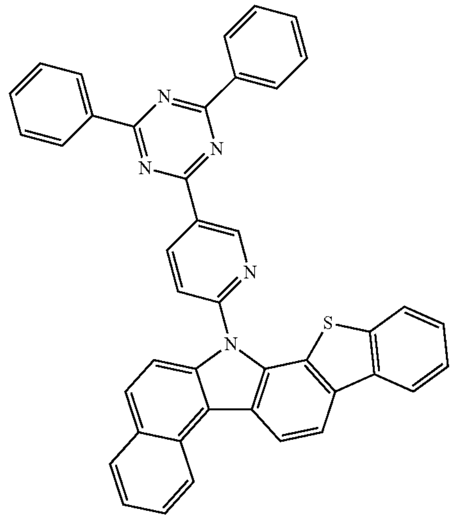
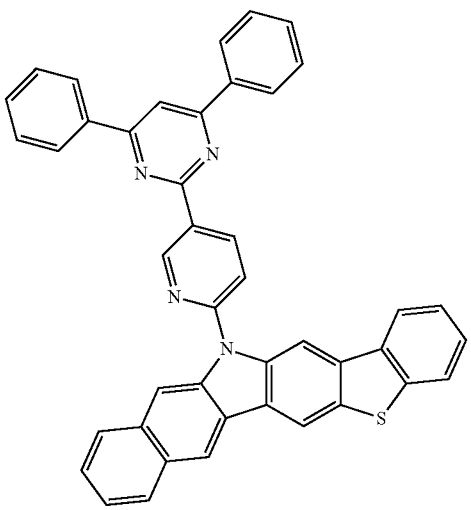
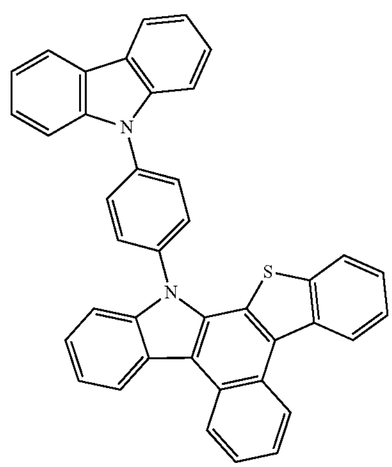
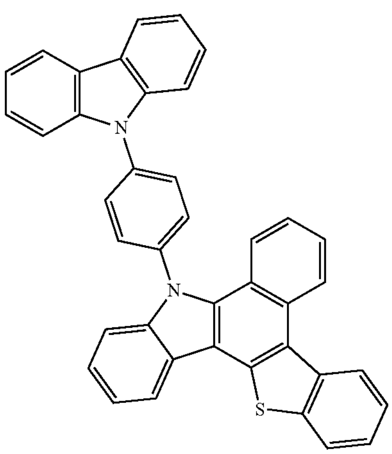
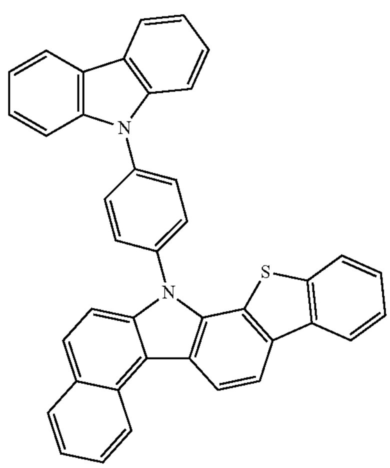

-continued
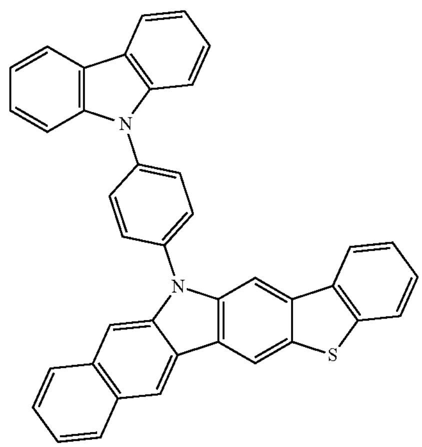
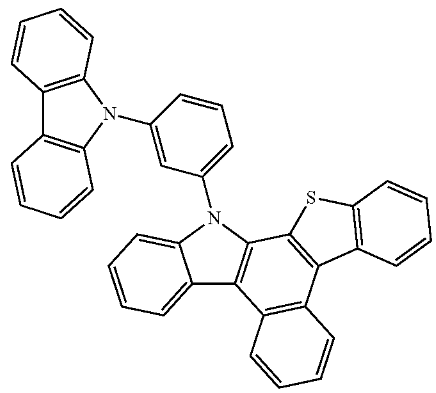
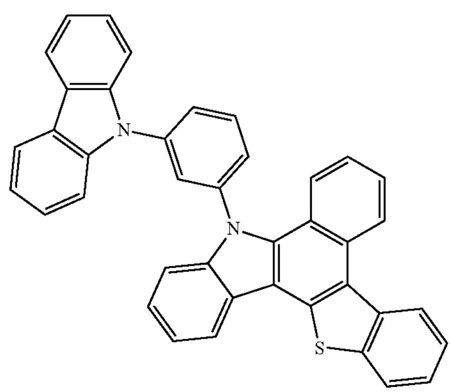
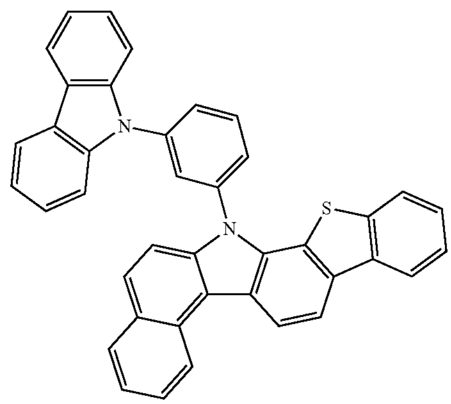
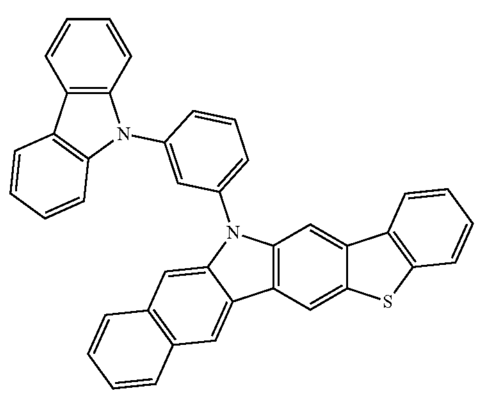
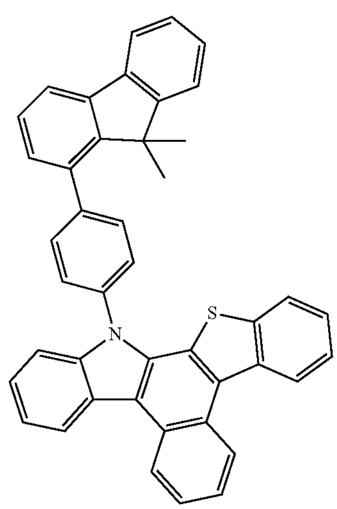

-continued
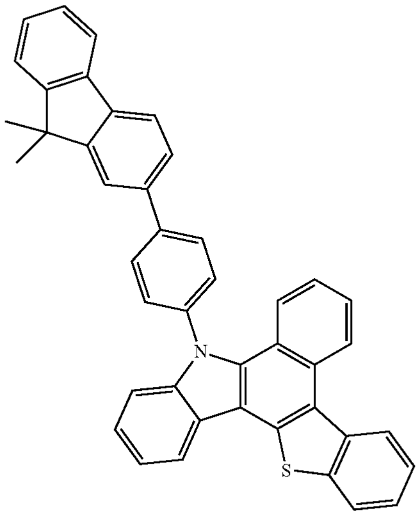
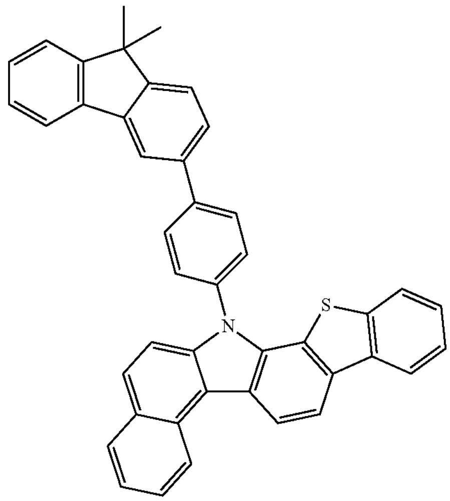
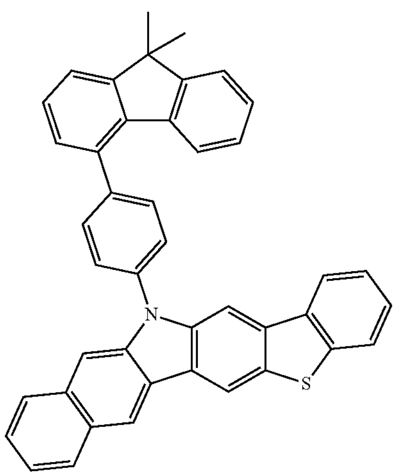
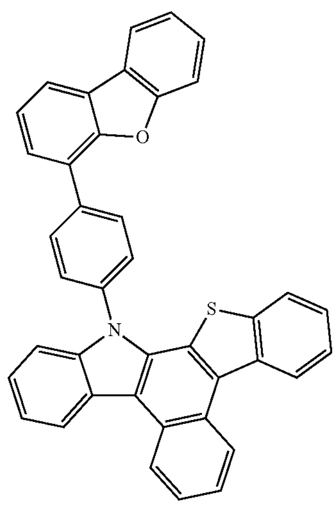
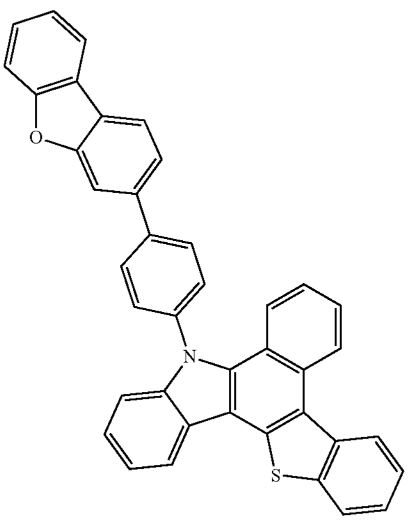
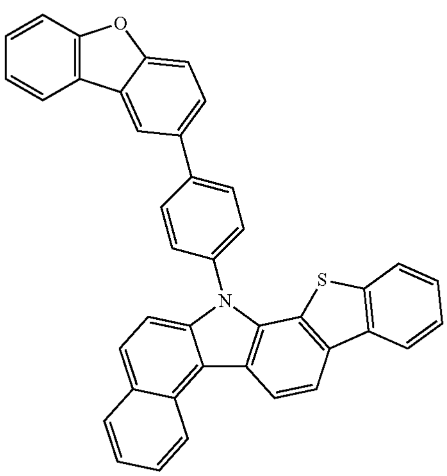
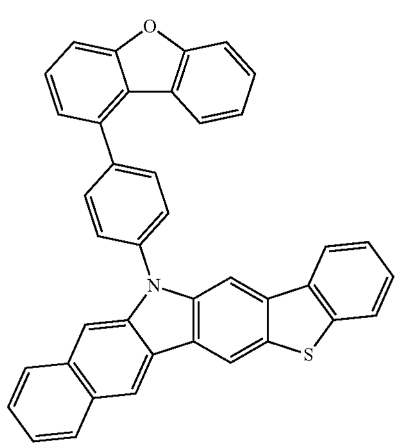

-continued
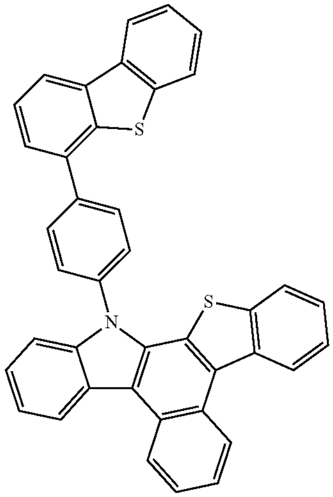
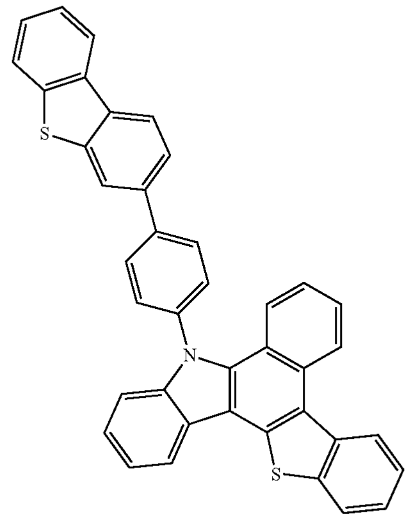
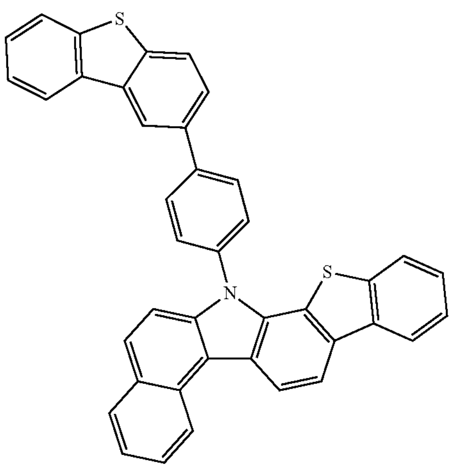
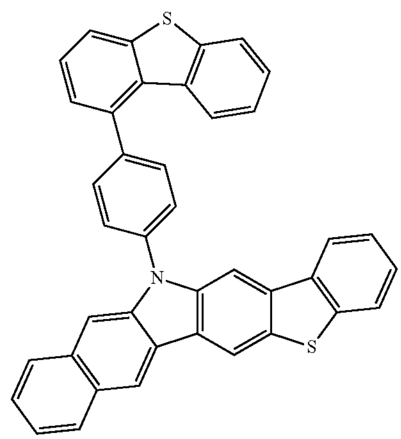
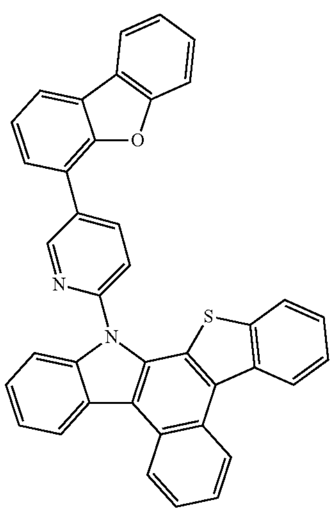
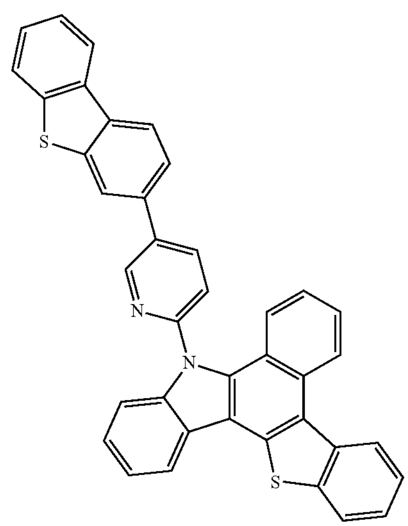

-continued
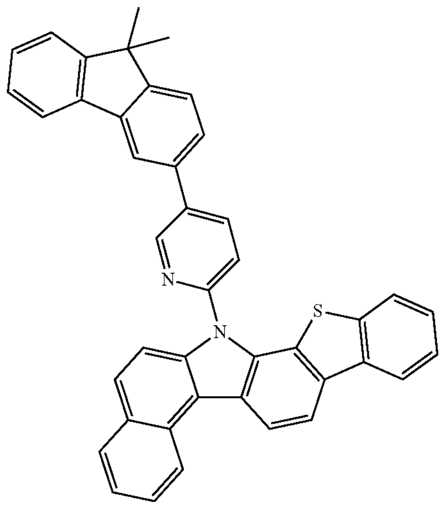
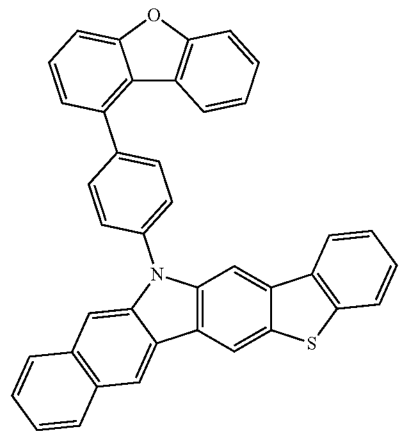
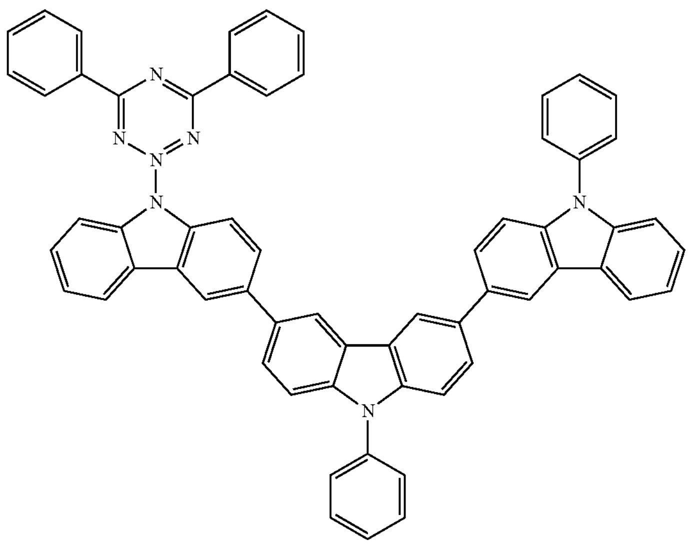
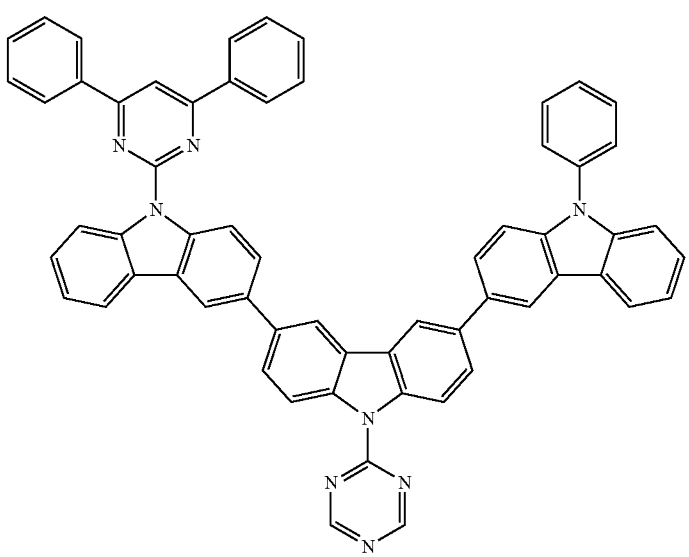

-continued
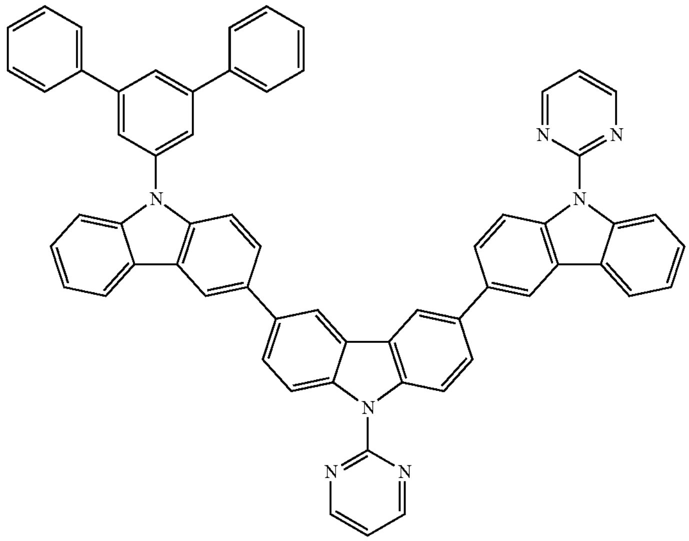
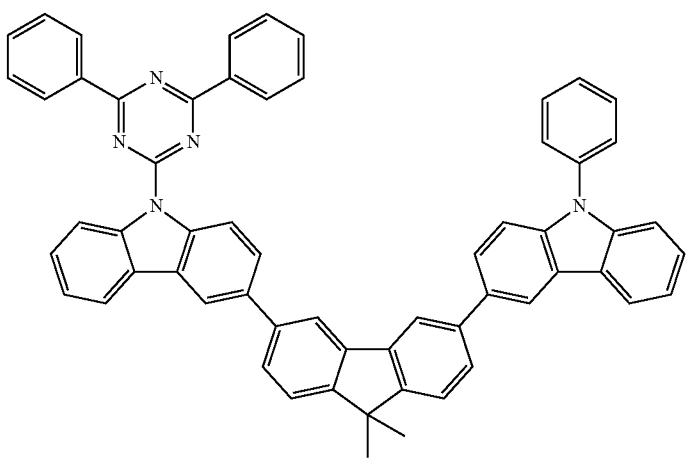
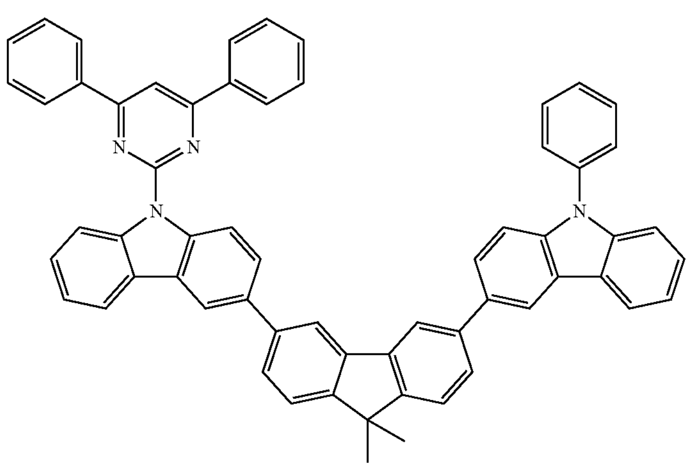

-continued
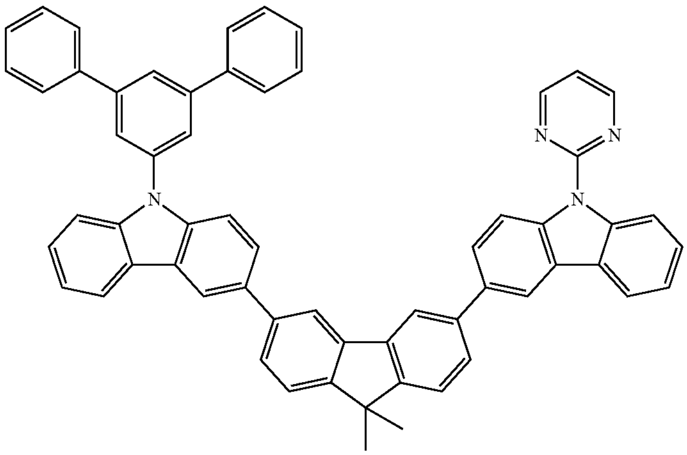 [SMILES: CC1(C)c2ccc(-c3ccc4c(c3)c3ccccc3n4-c3cc(-c4ccccc4)cc(-c4ccccc4)c3)cc2-c2cc(-c3ccc4c(c3)c3ccccc3n4-c3ncccn3)ccc21]
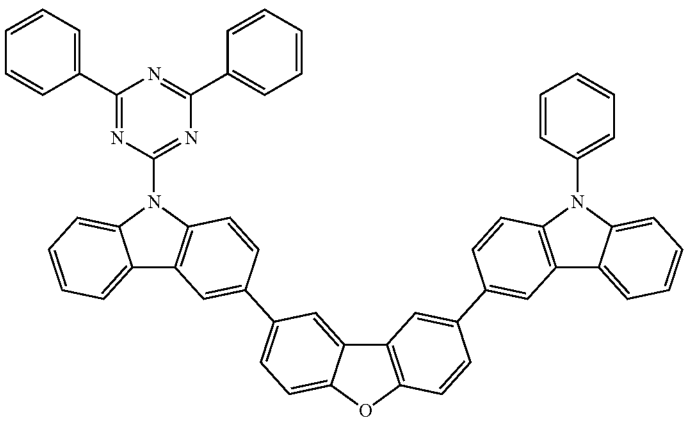
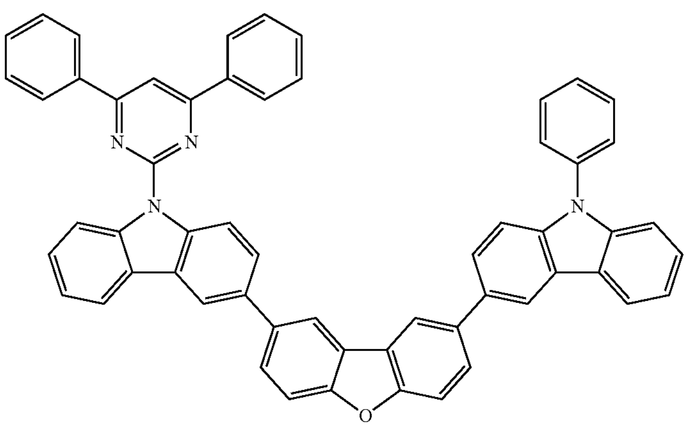
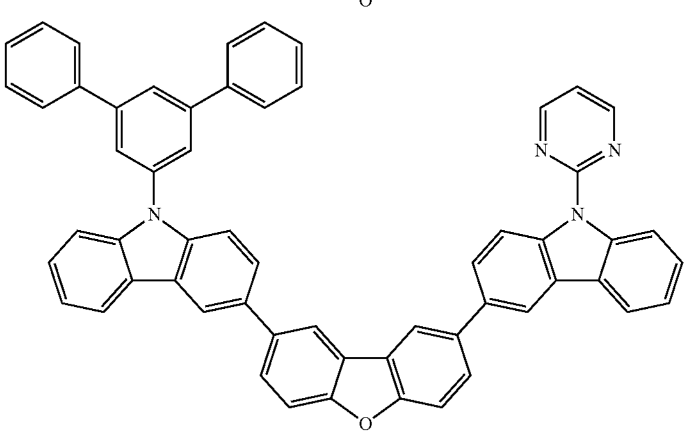

-continued
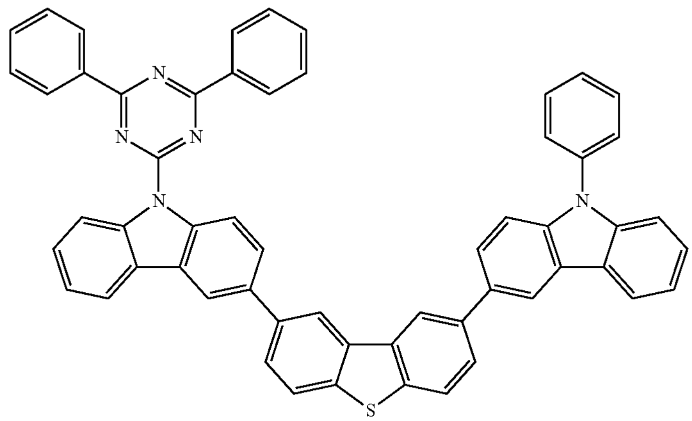
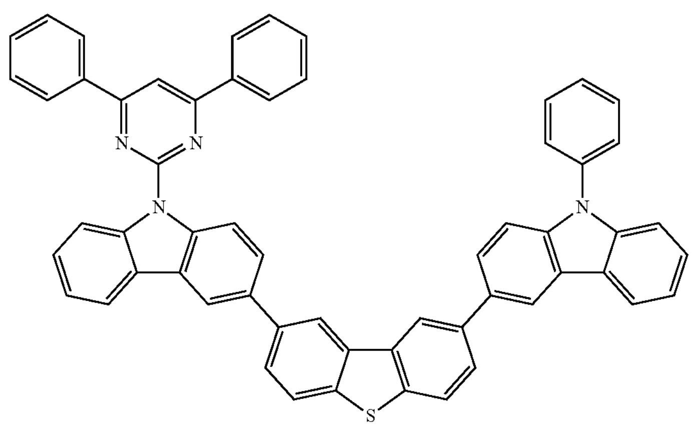
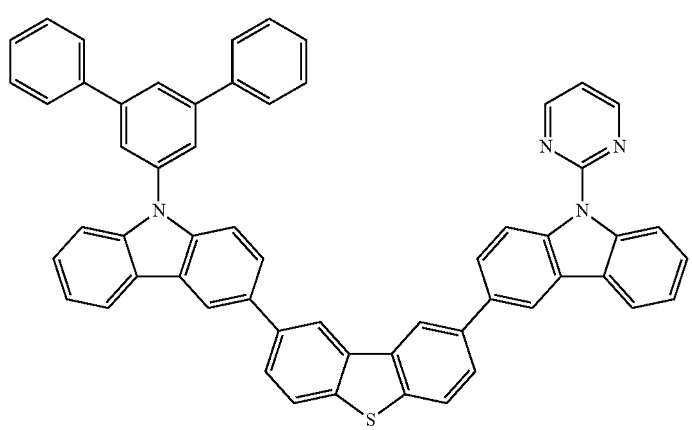

-continued
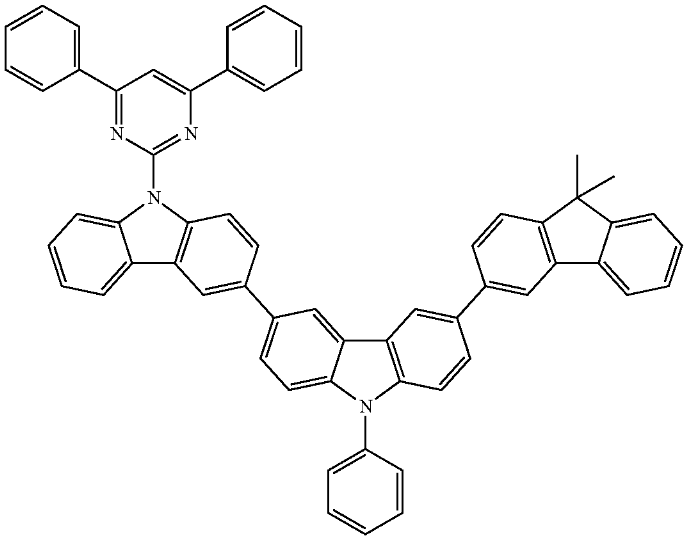
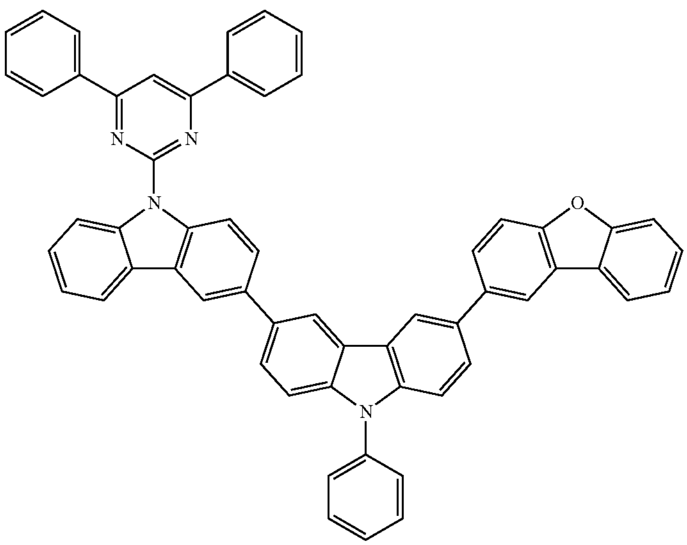
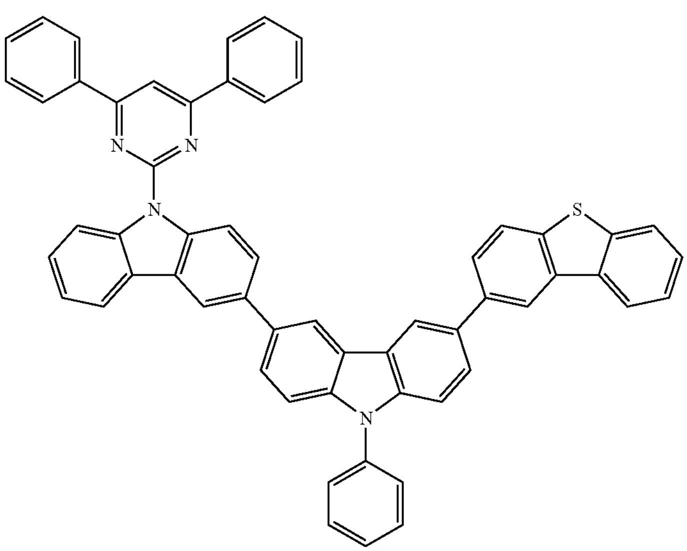

-continued
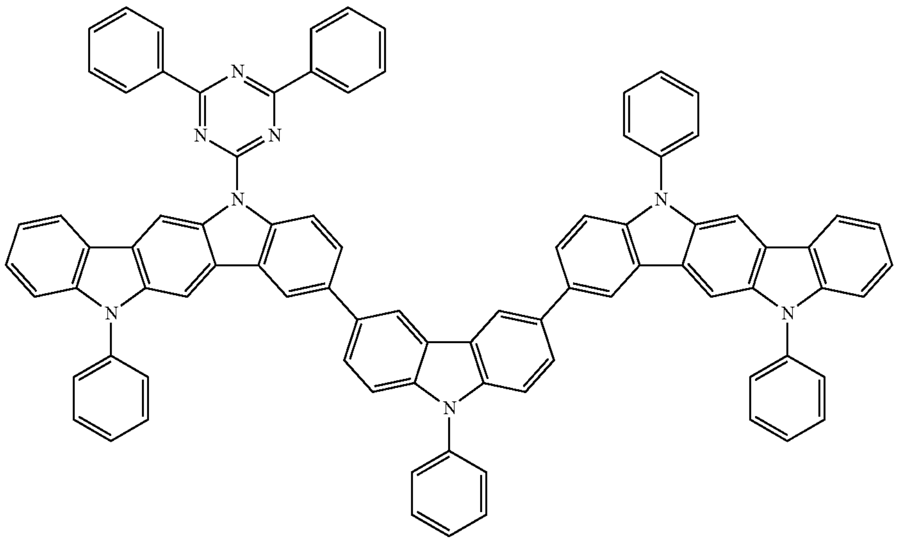
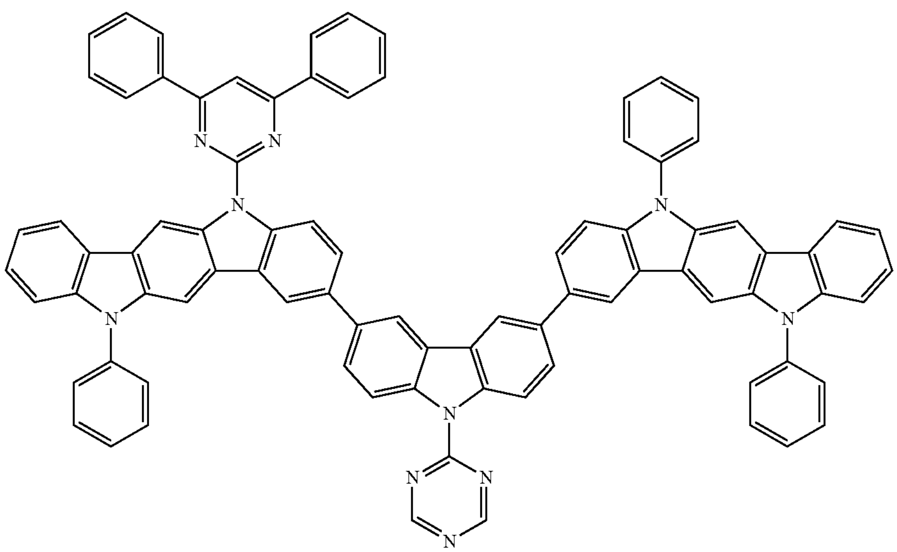
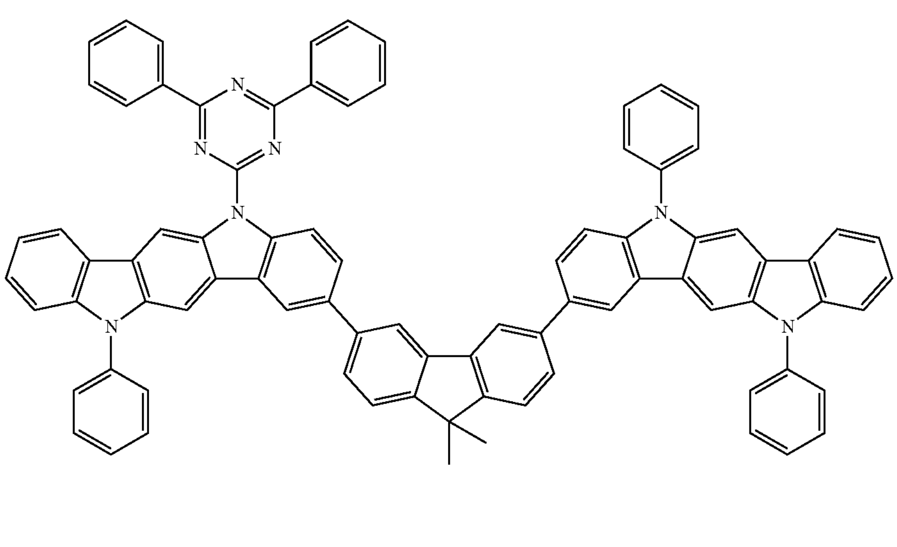

-continued
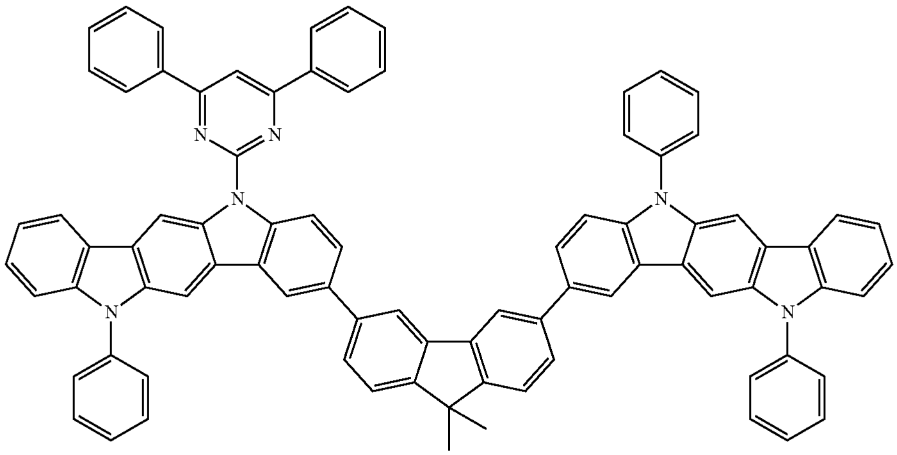
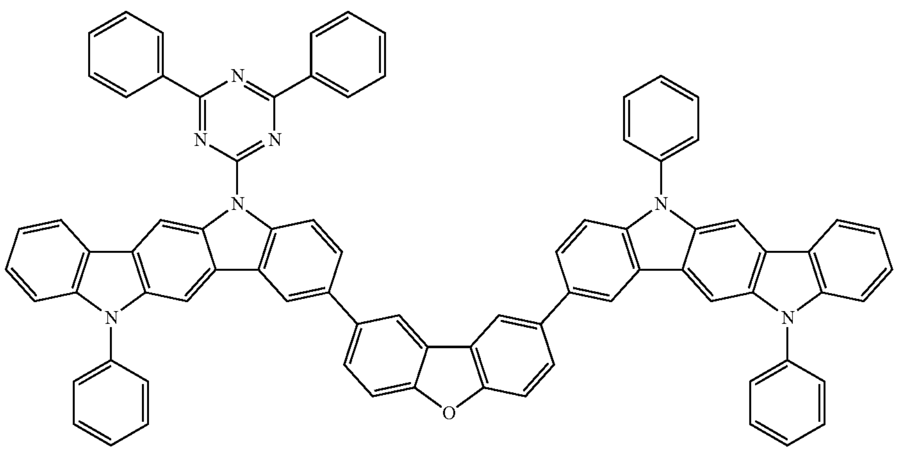
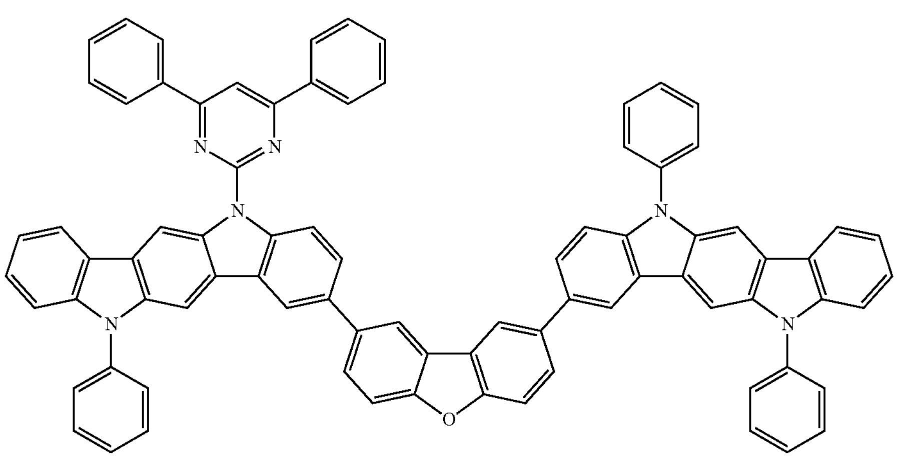

-continued
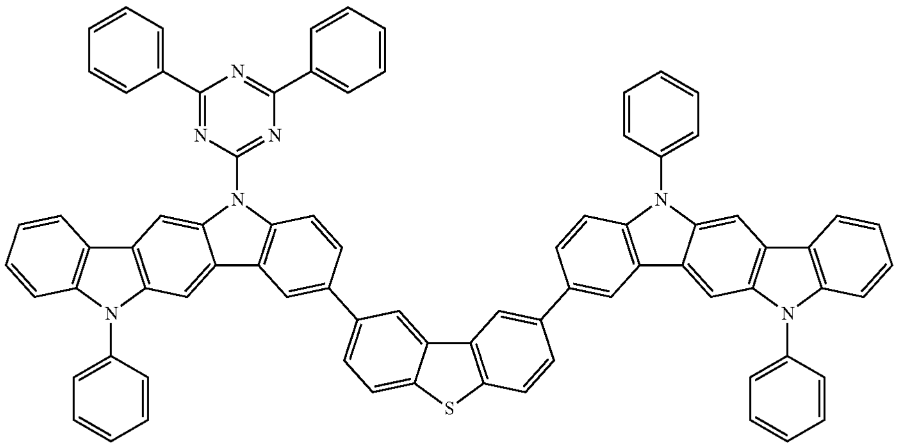
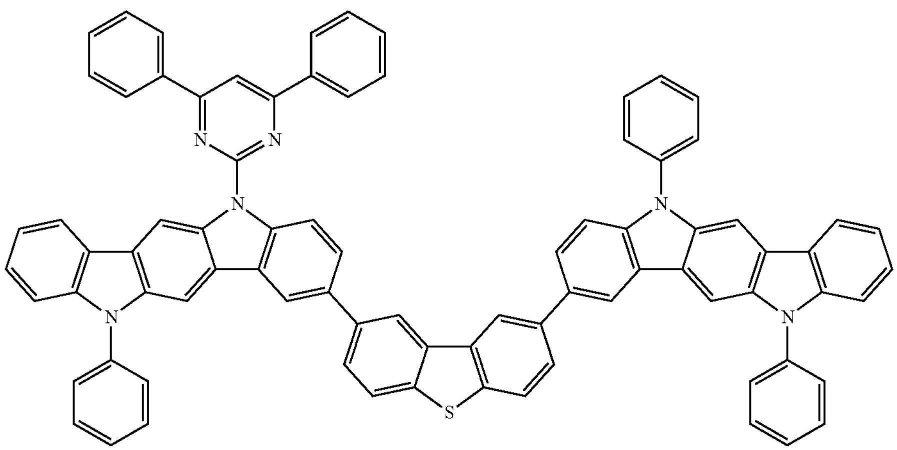
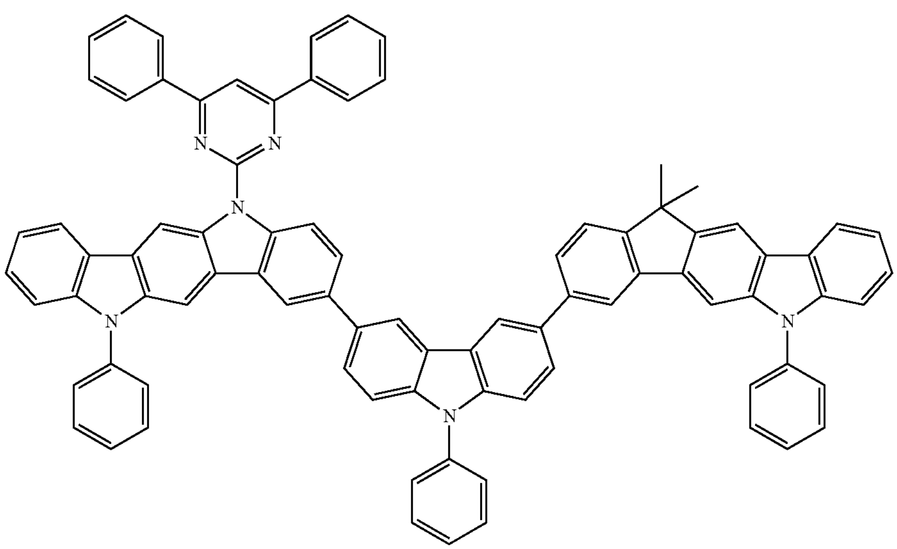

-continued
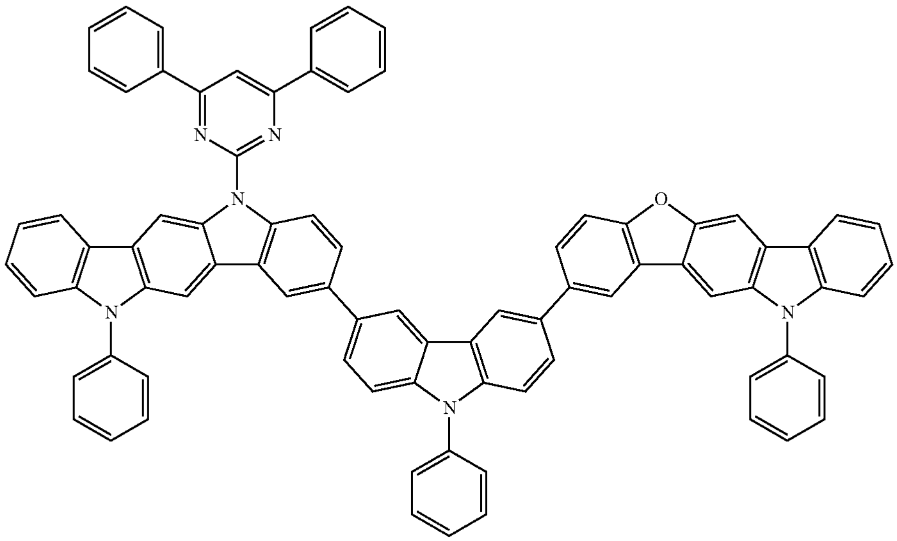
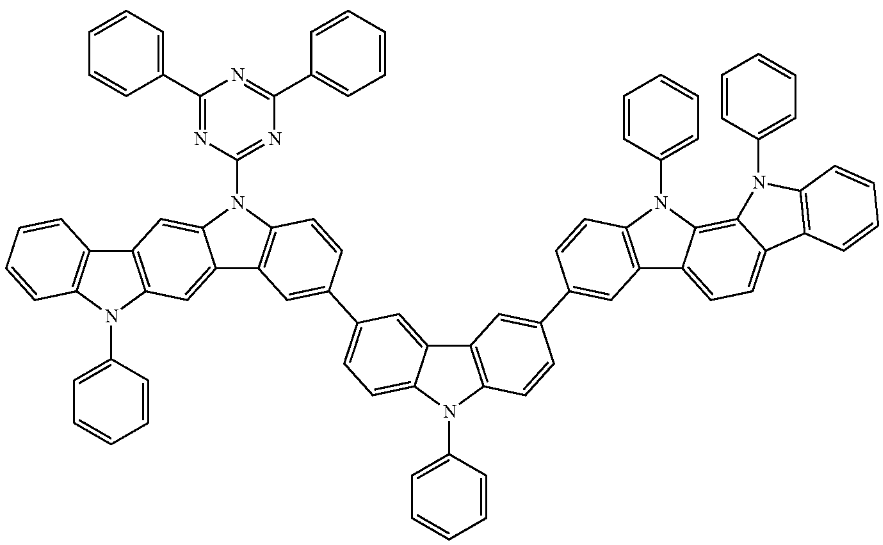
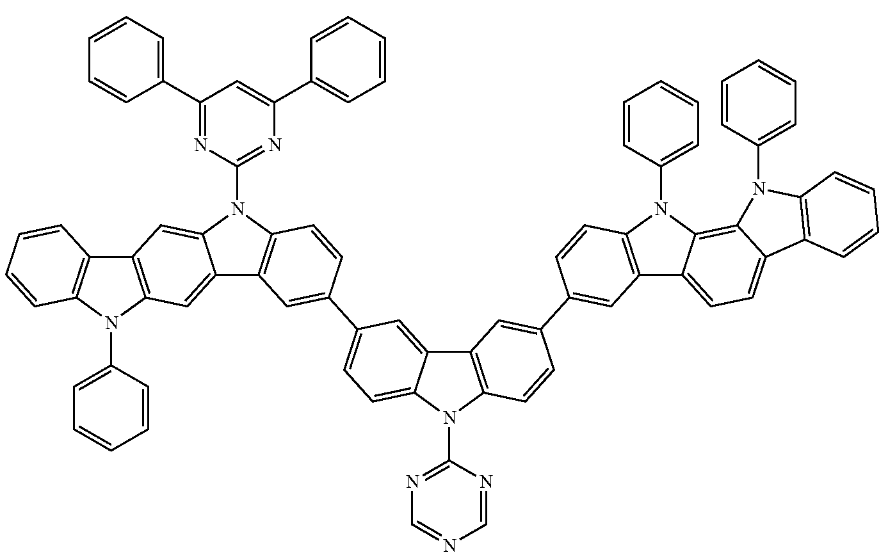

-continued
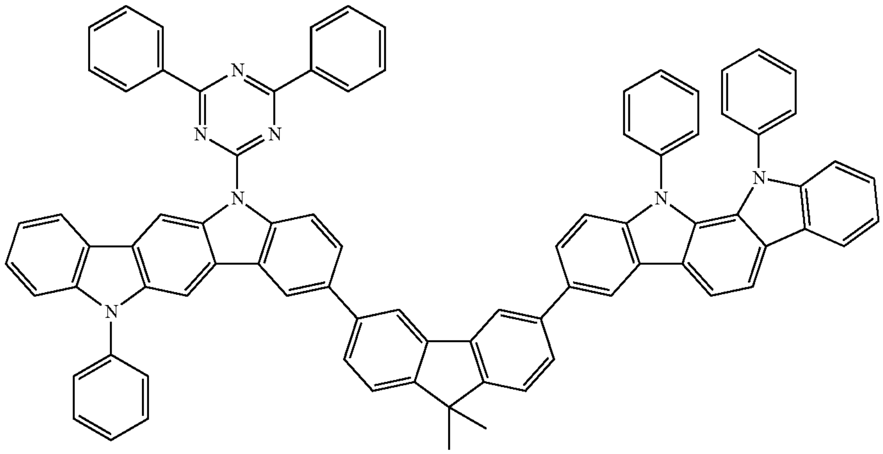
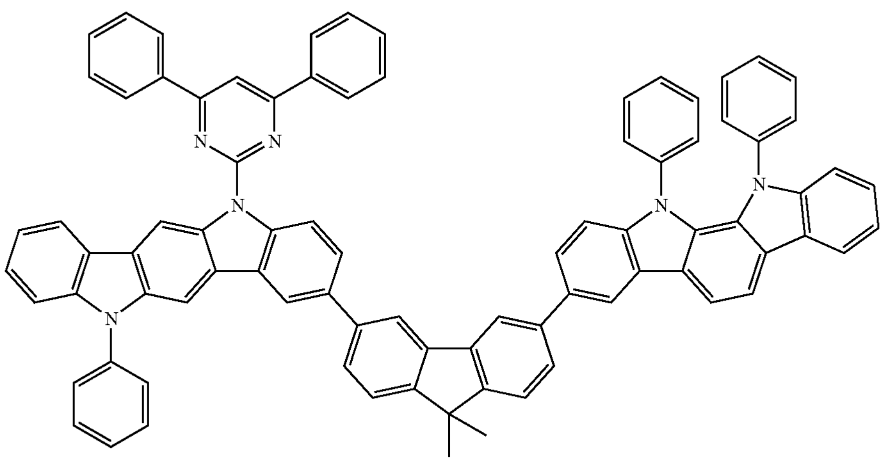
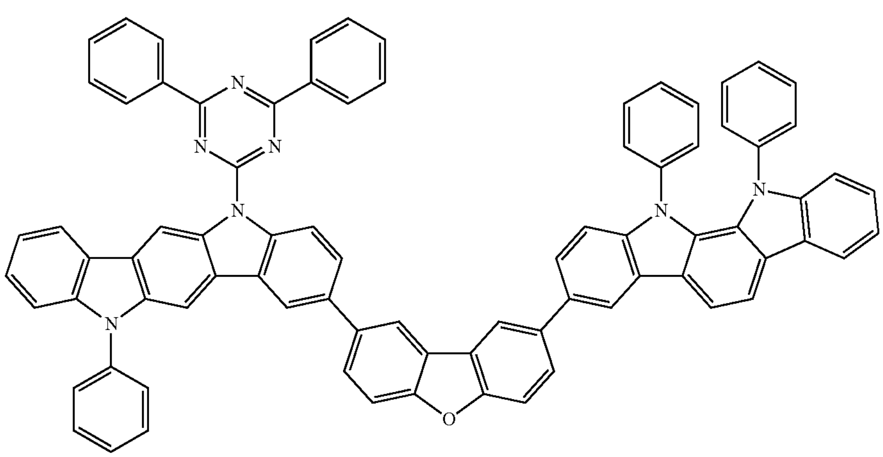

-continued
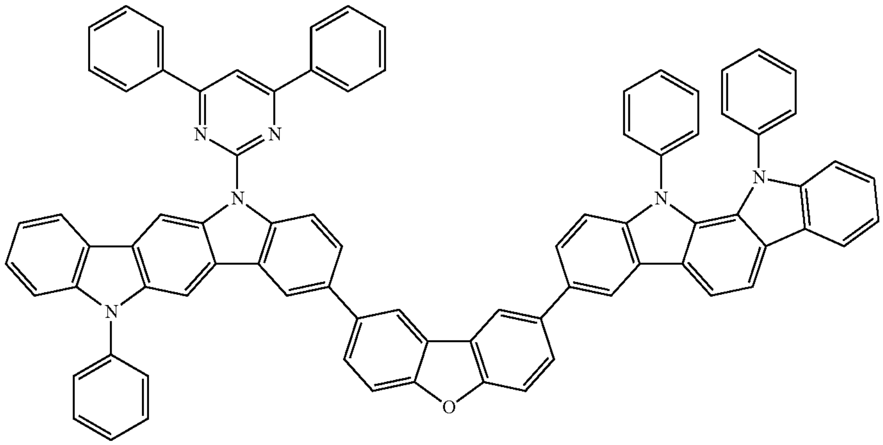
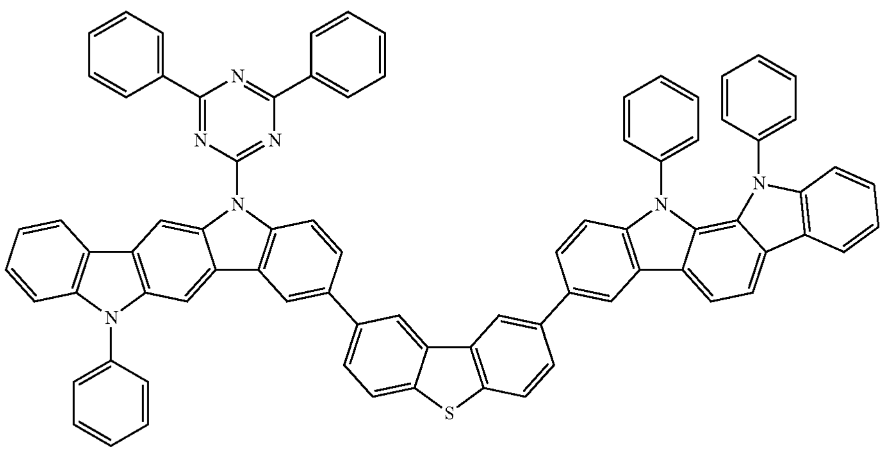
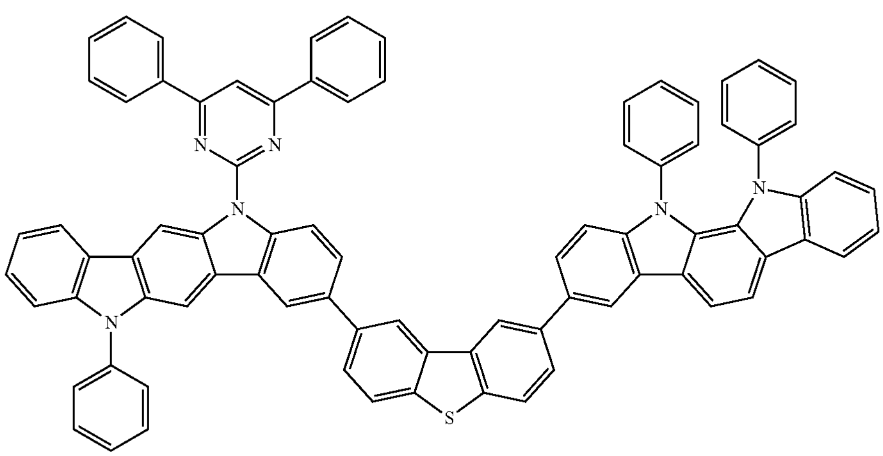

-continued
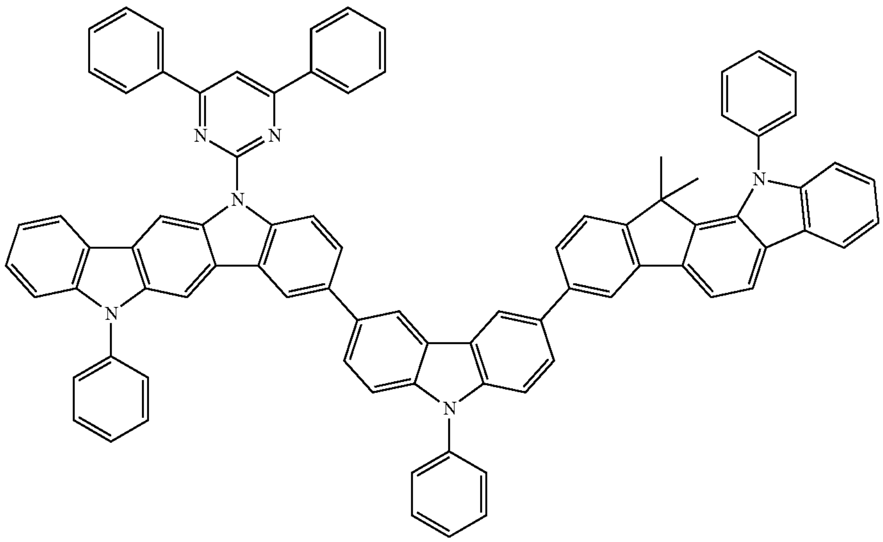
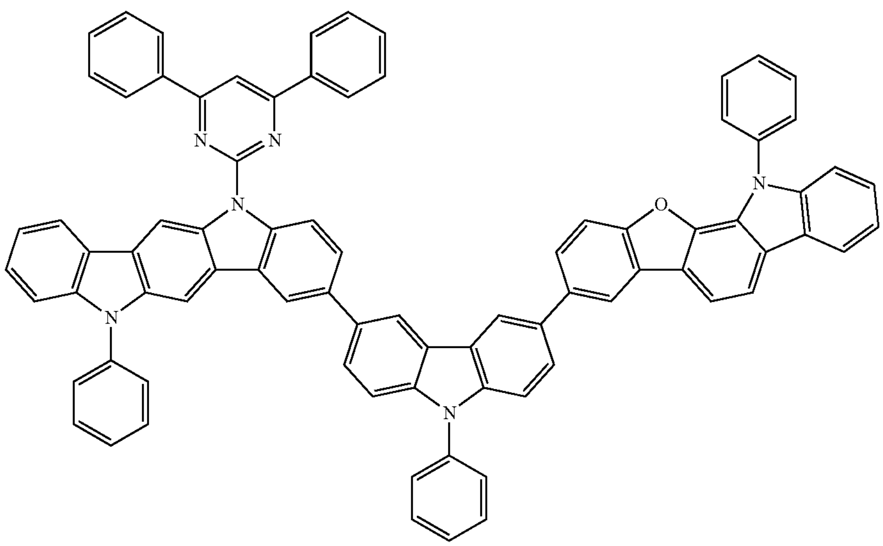
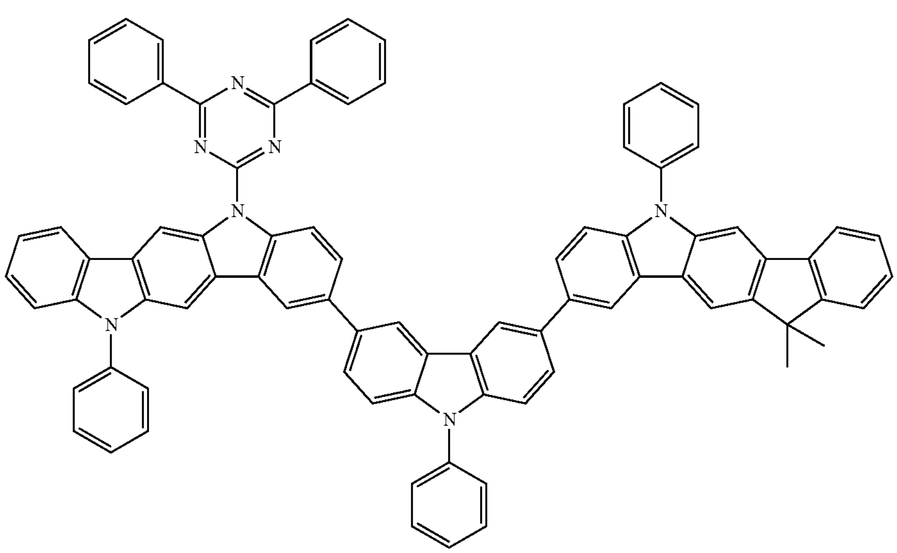

-continued
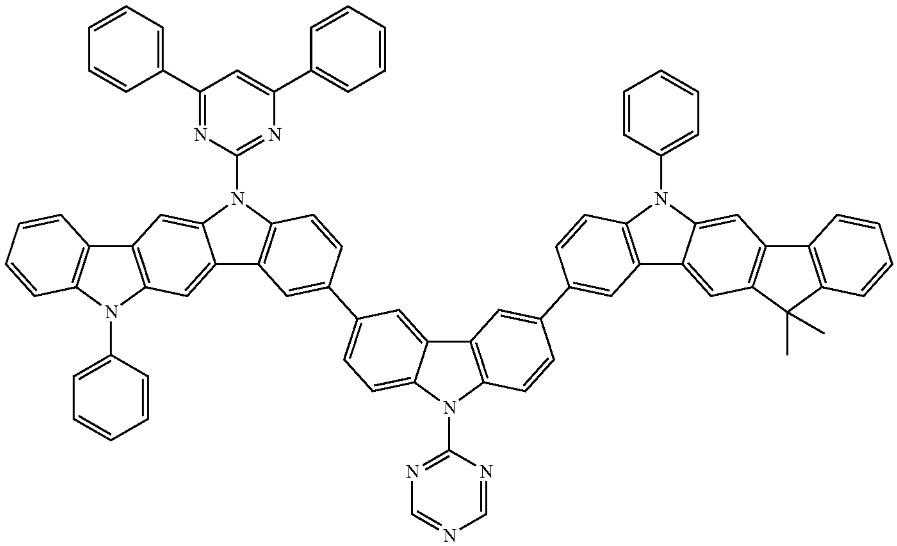
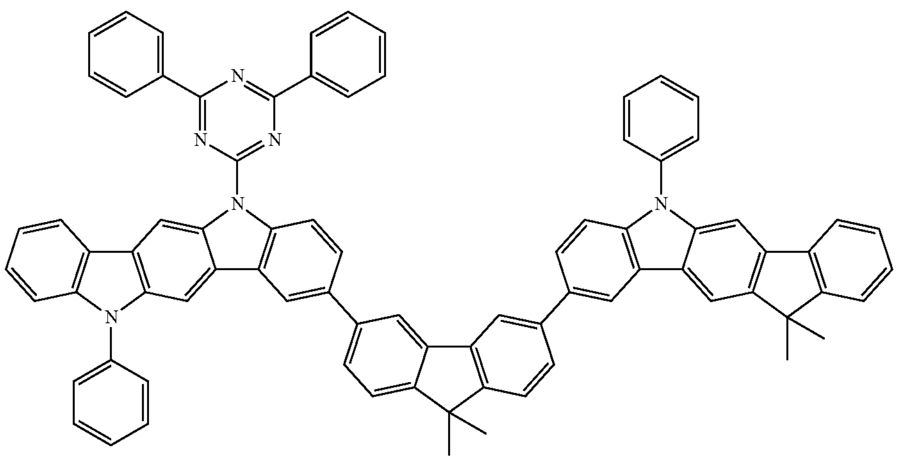
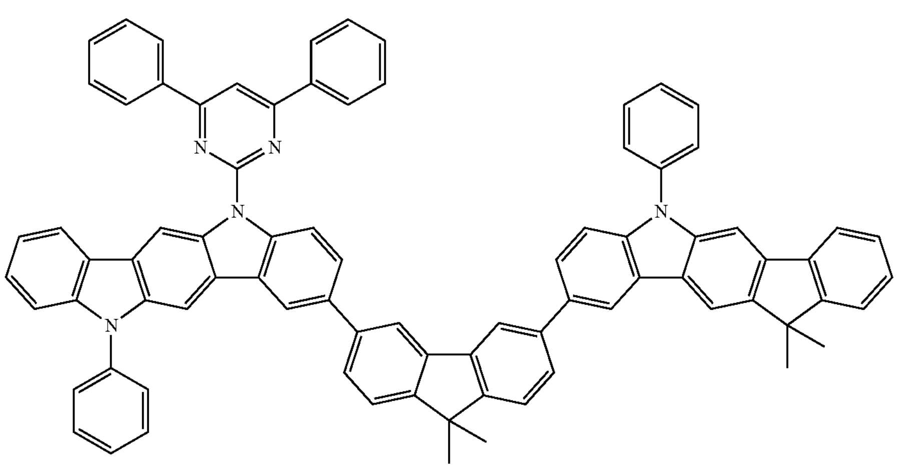

-continued
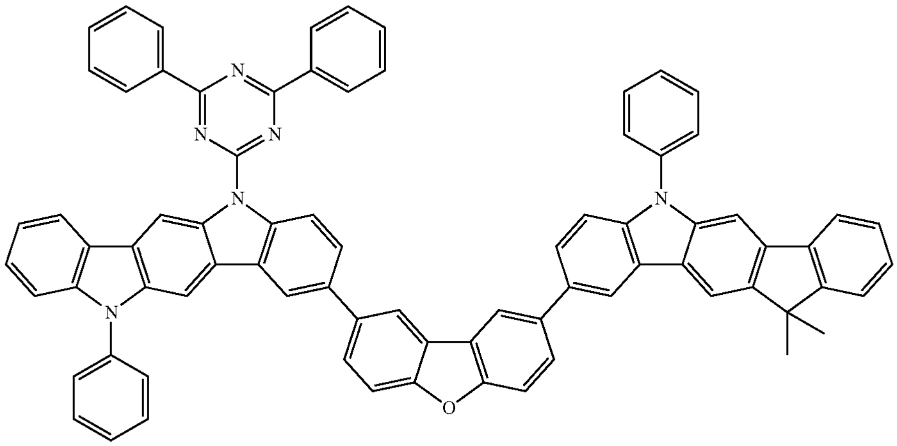
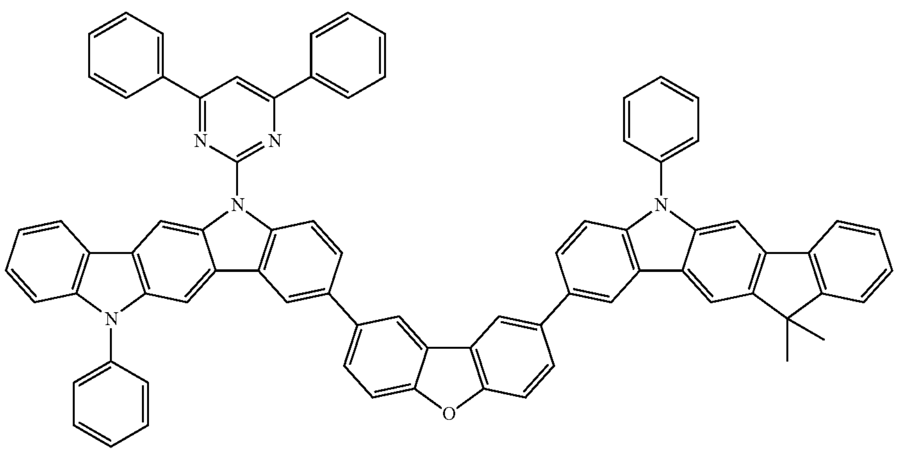
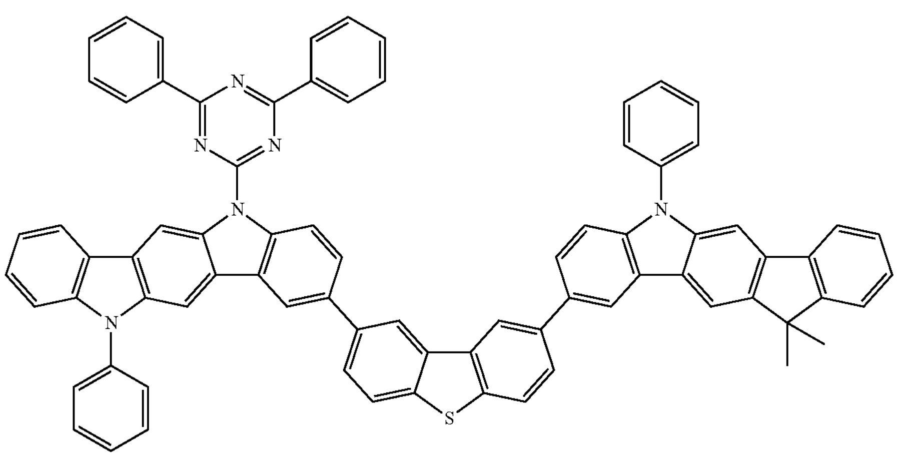

-continued
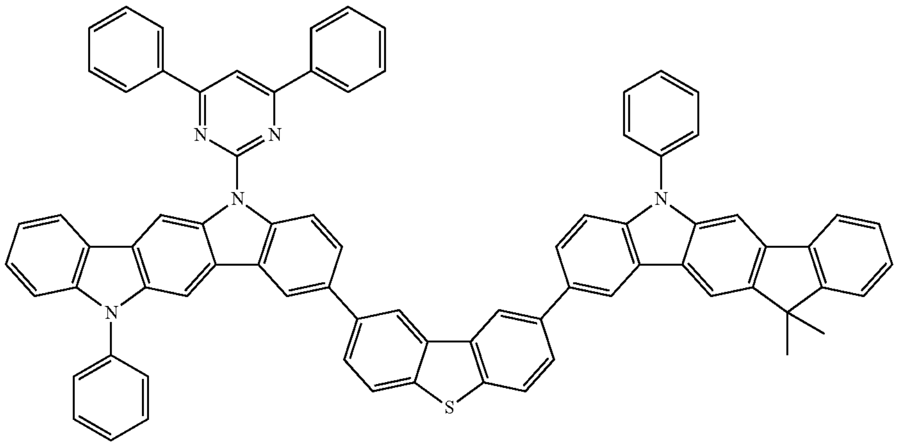
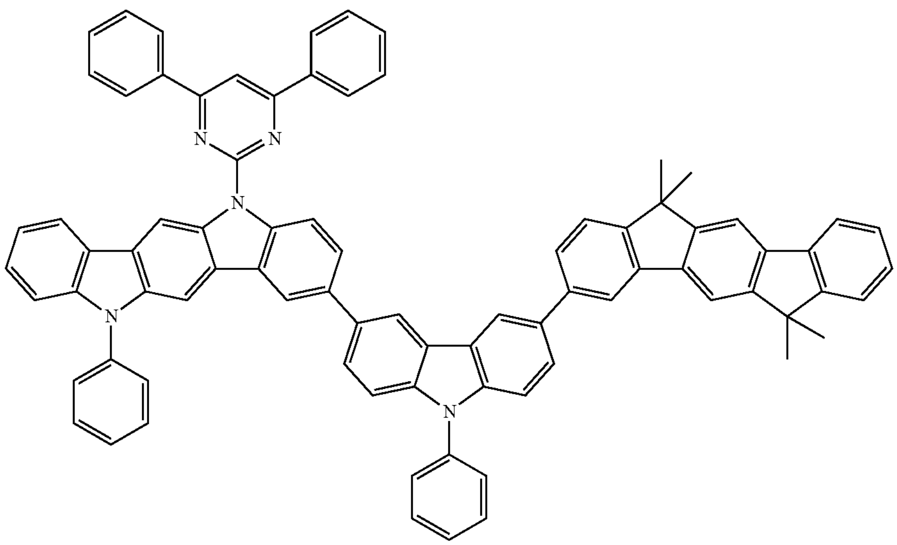
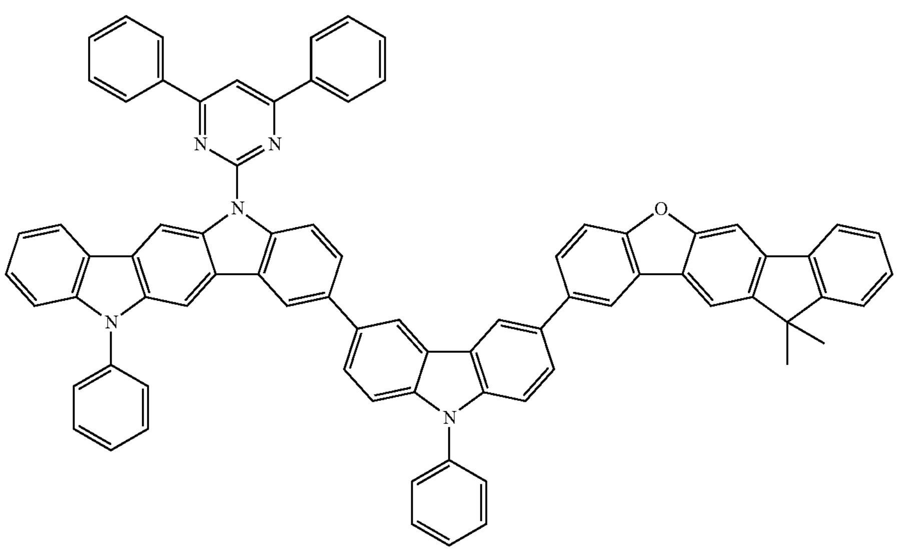

-continued
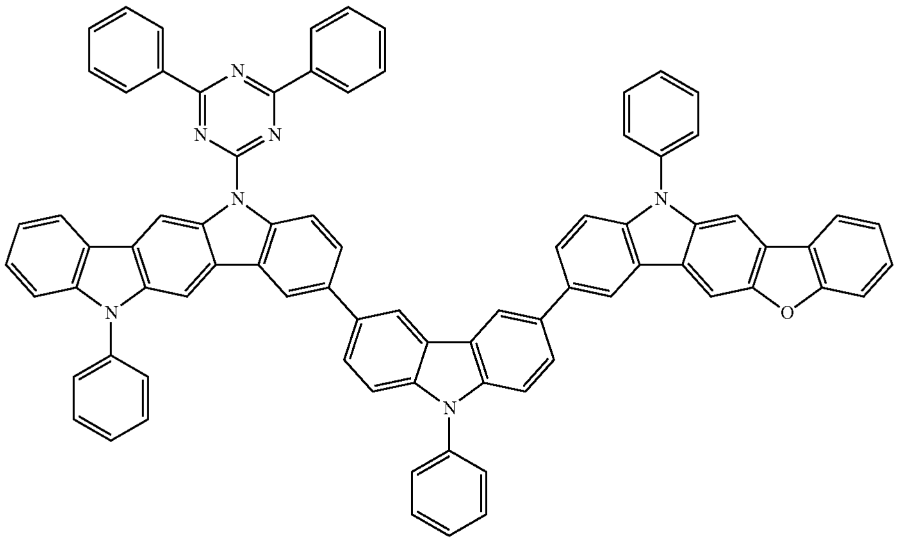
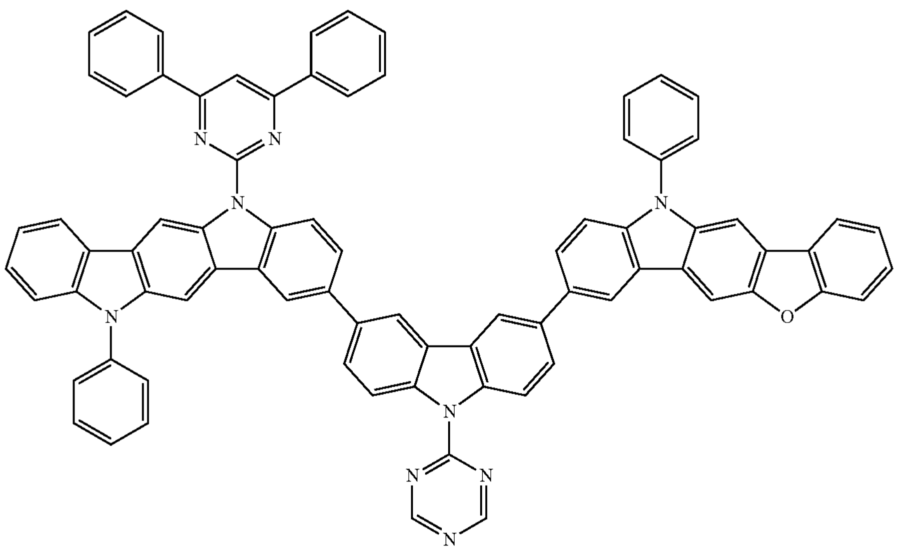
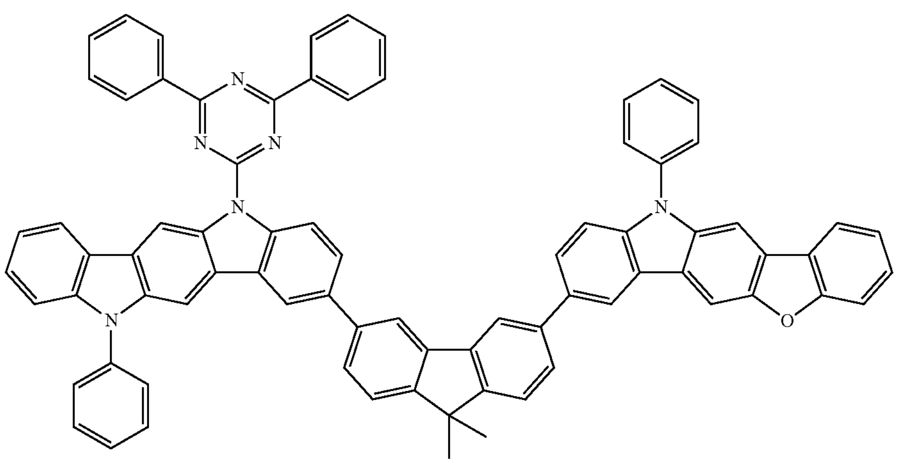

-continued
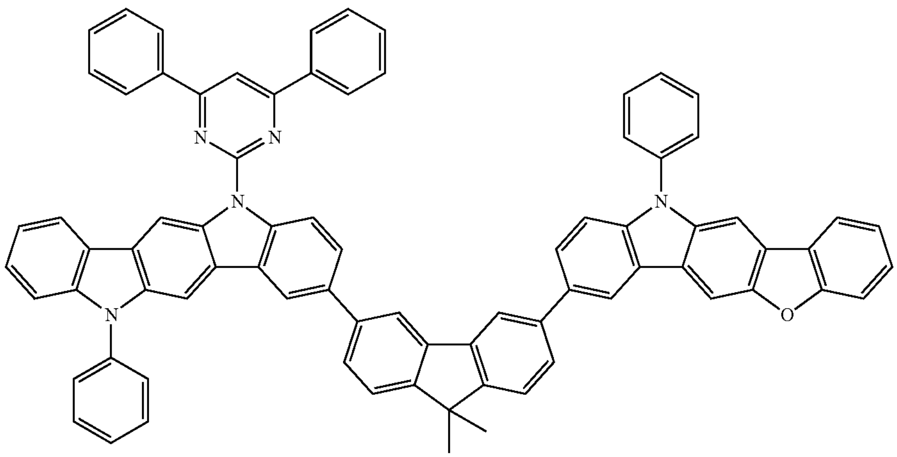
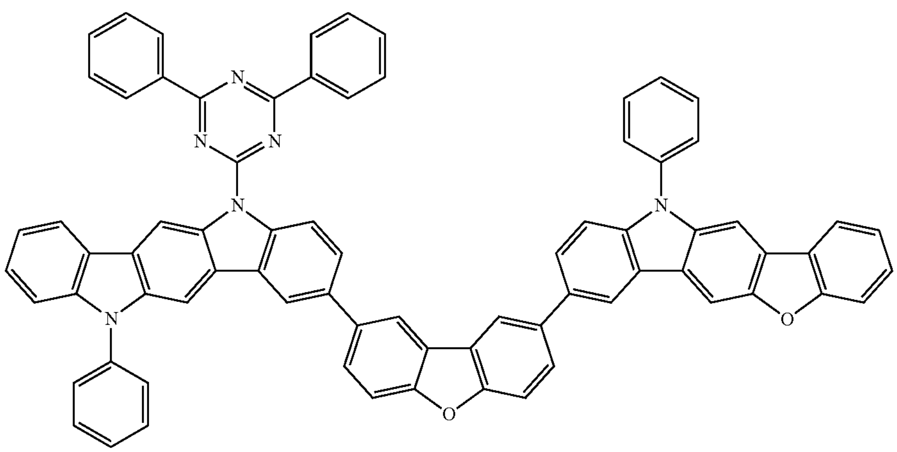
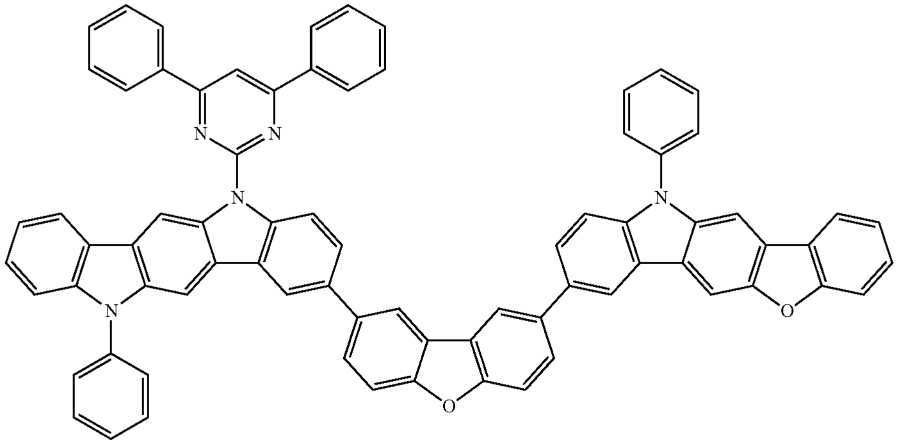

-continued
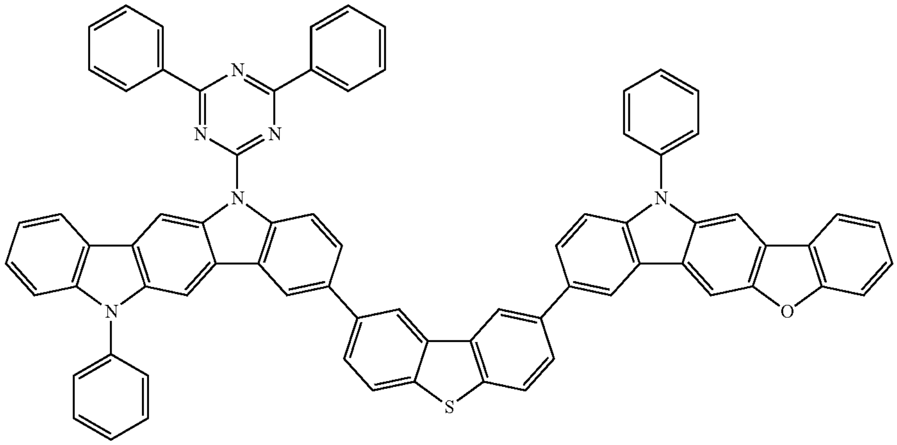
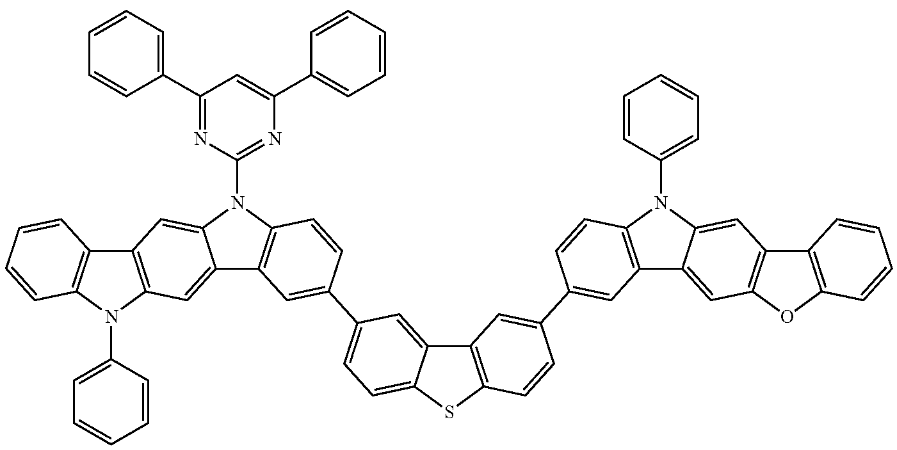
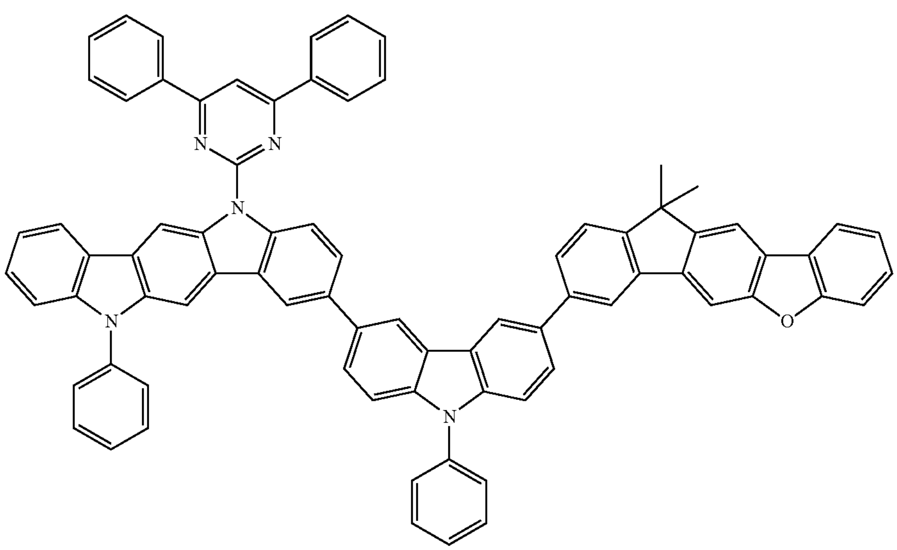

-continued
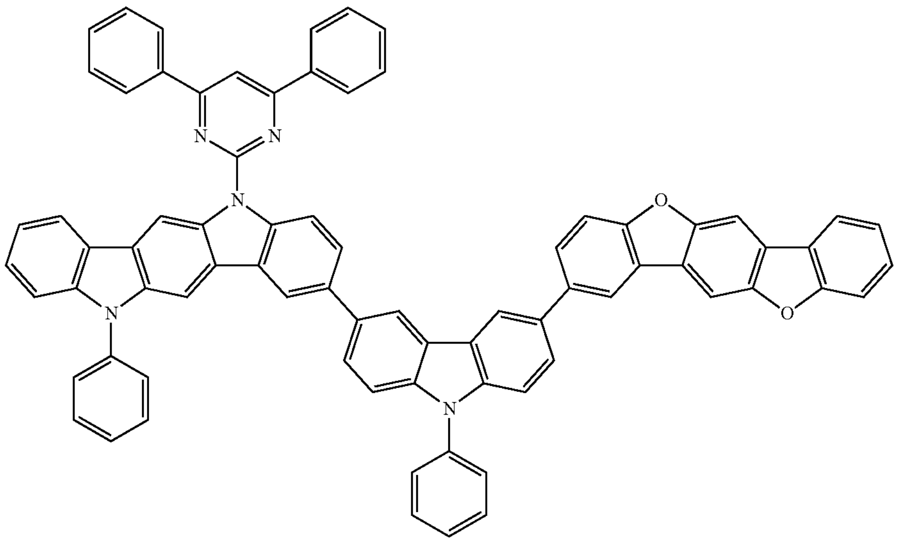
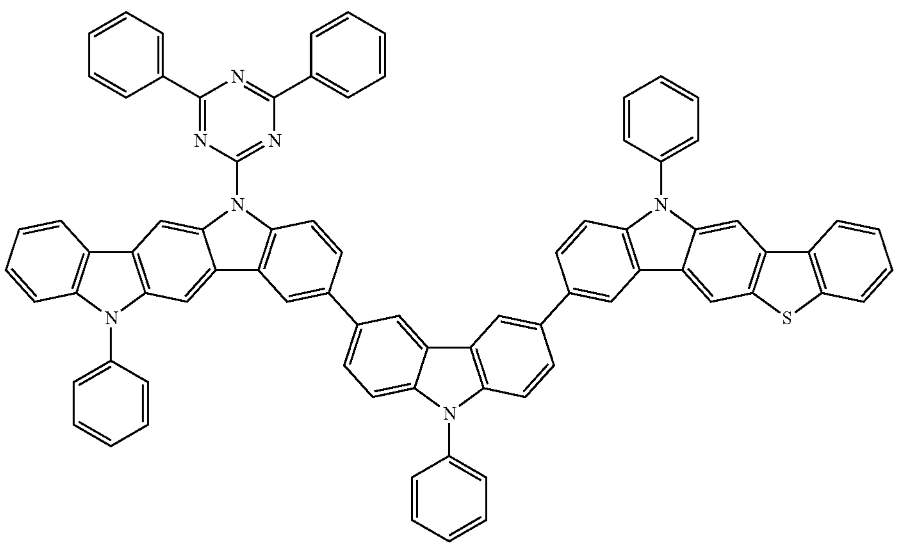
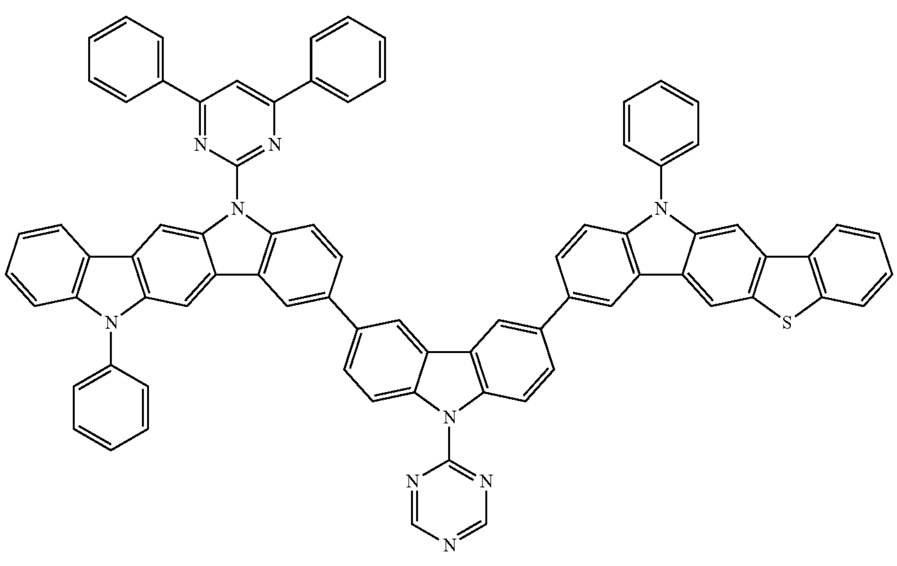

-continued
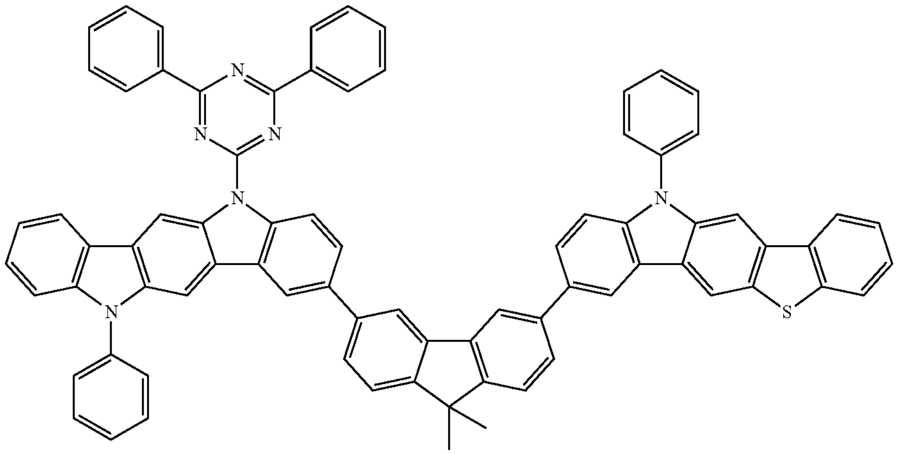
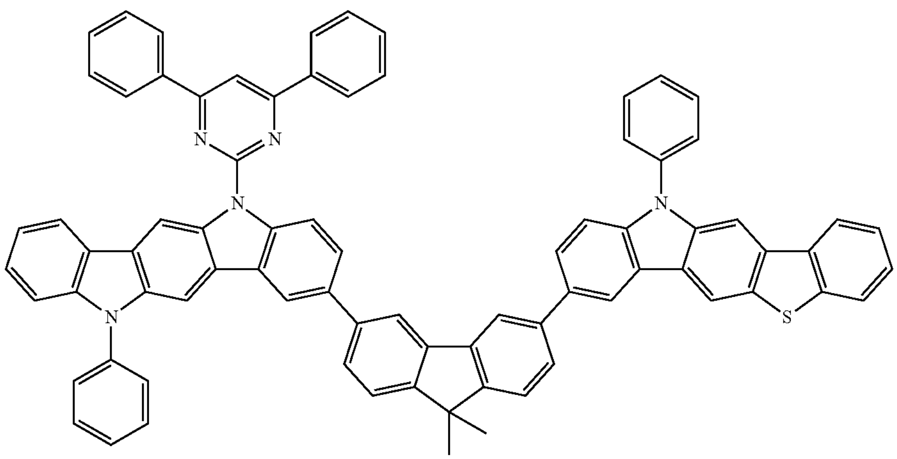
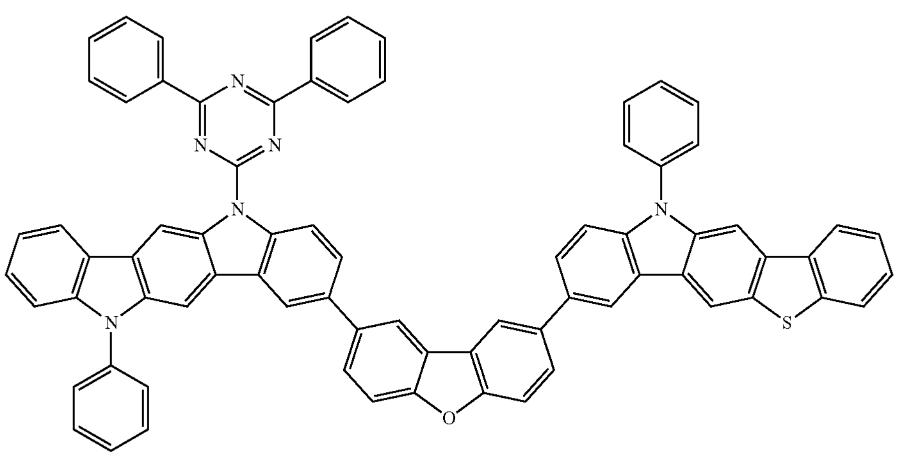

-continued
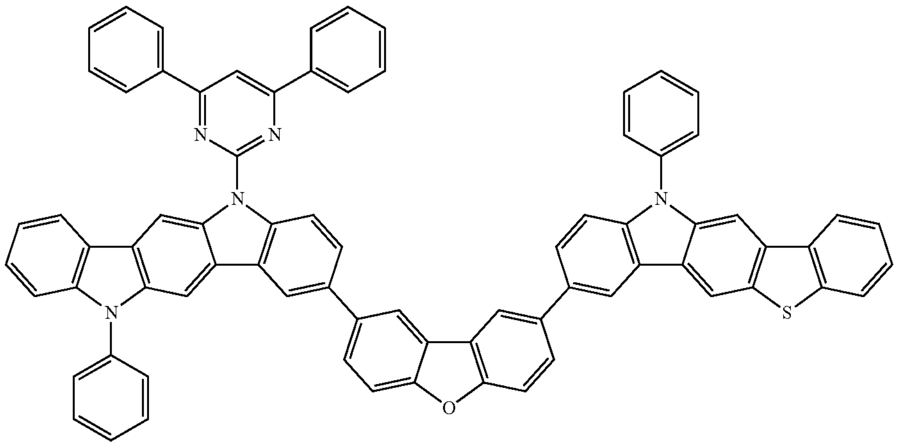
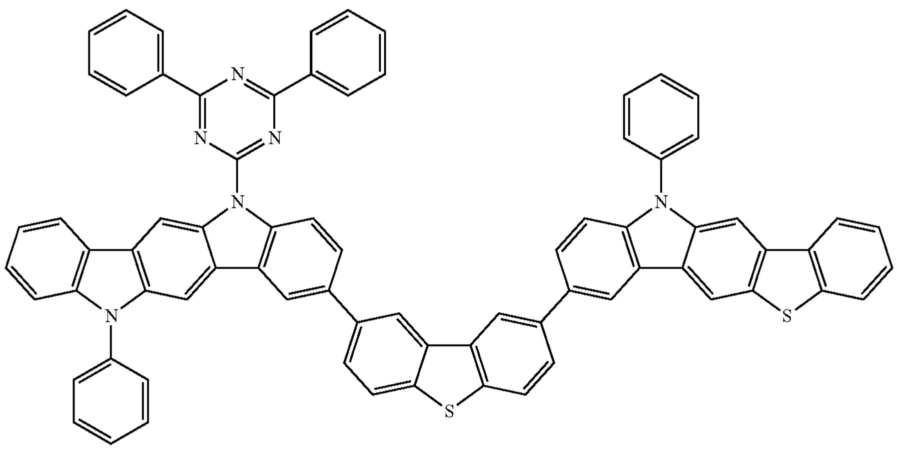
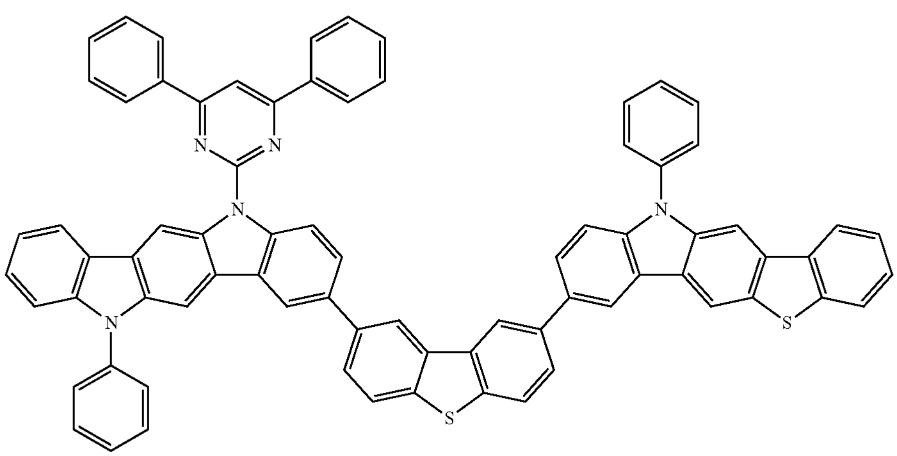

-continued
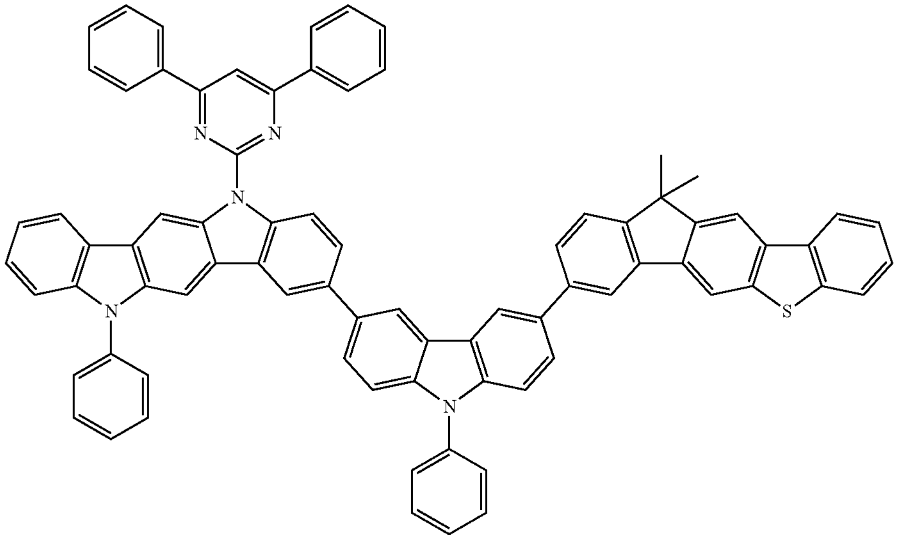
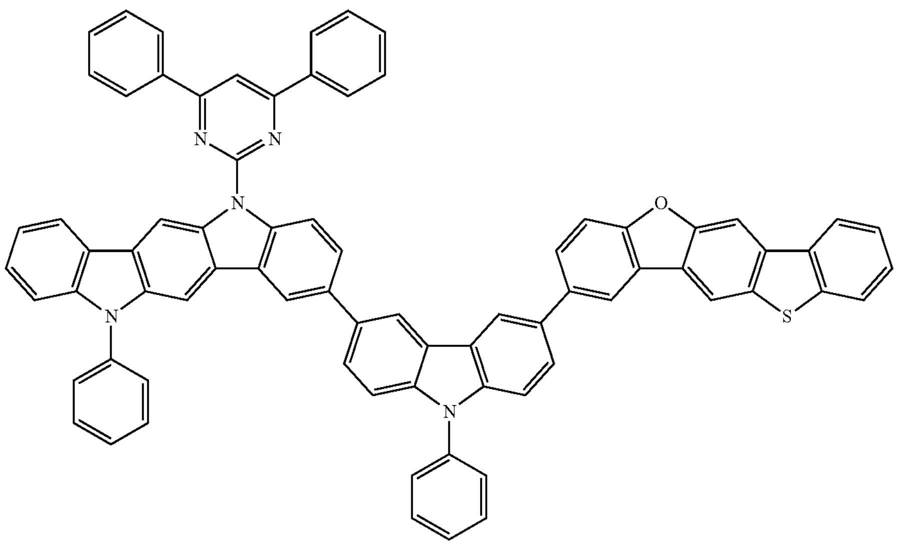
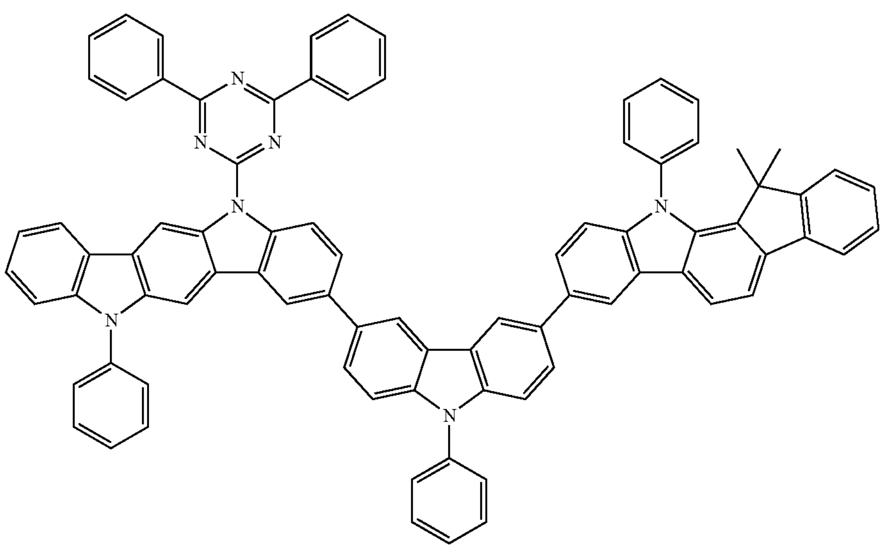

-continued
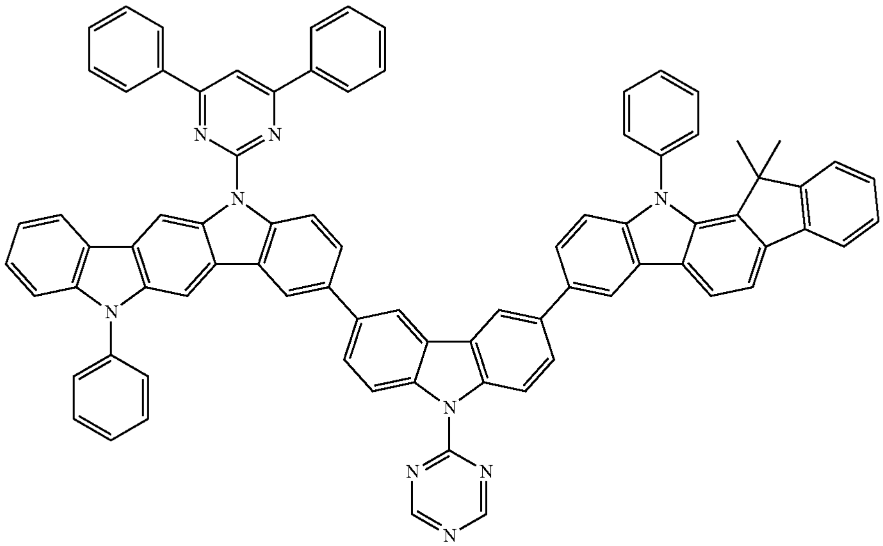
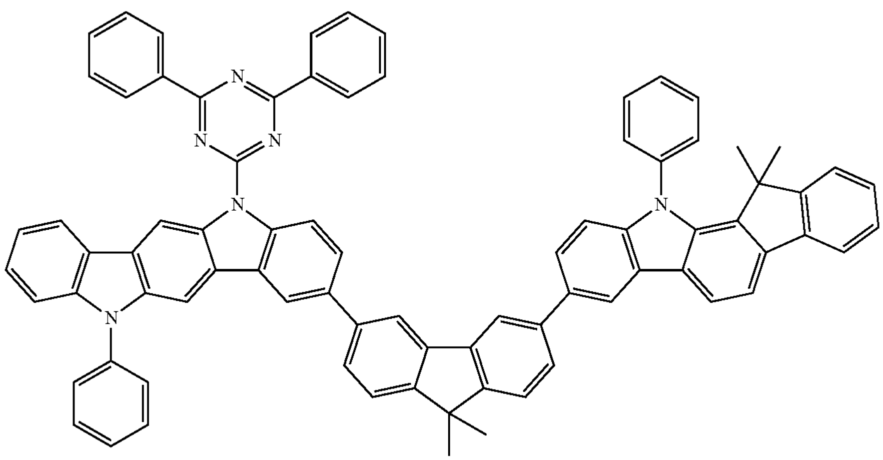
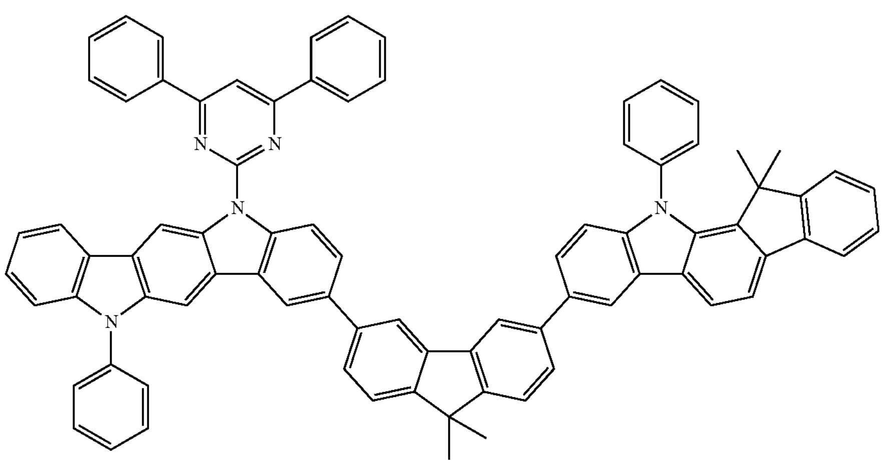

-continued
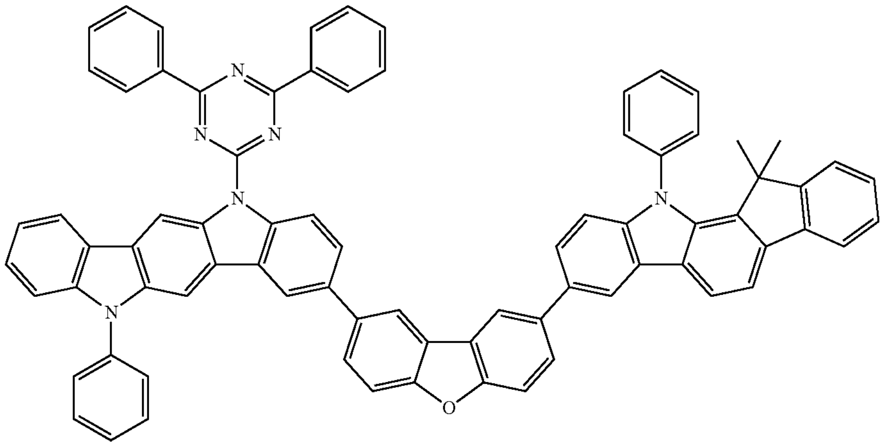
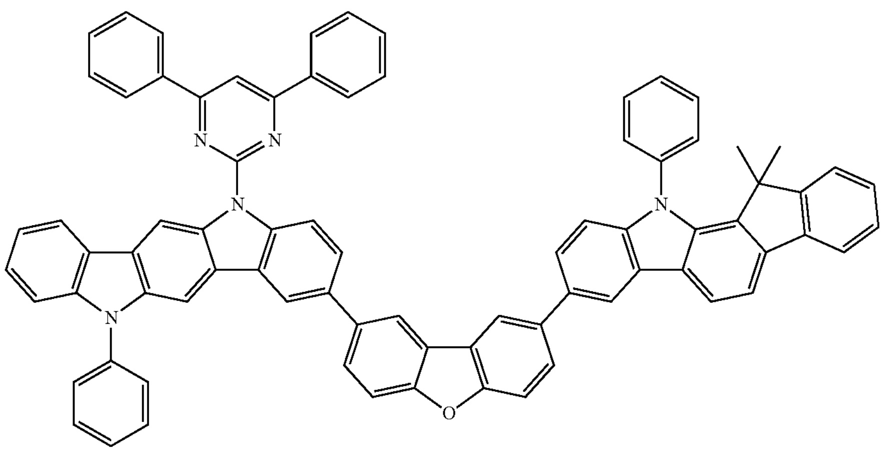
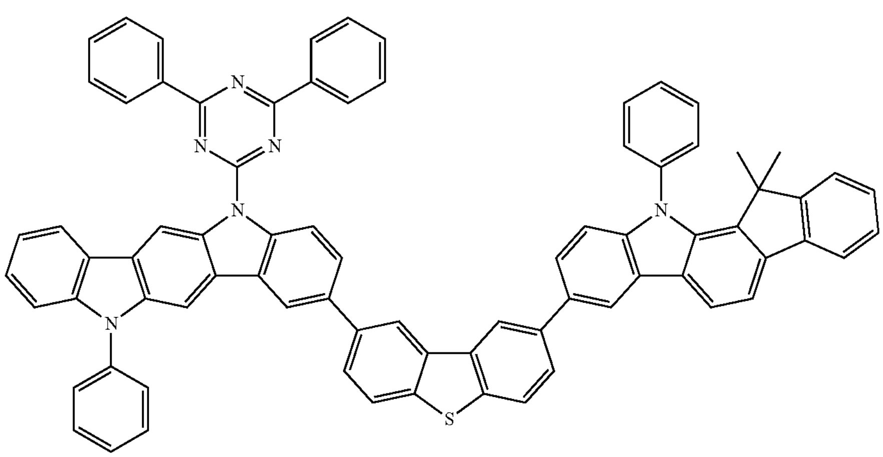

-continued
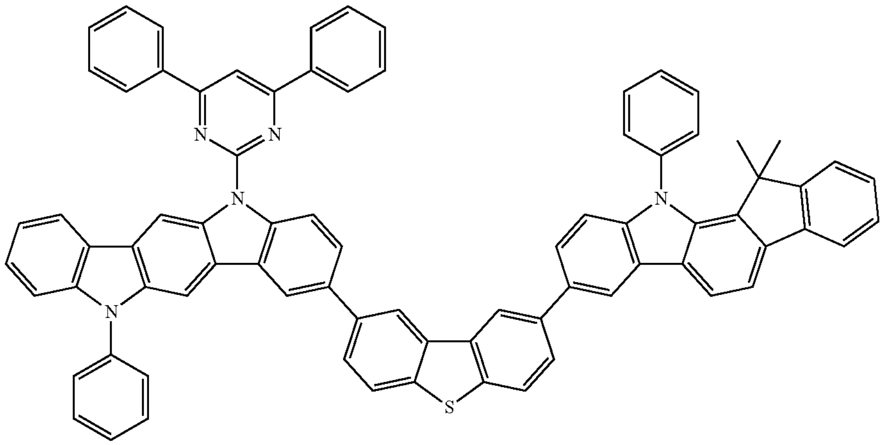
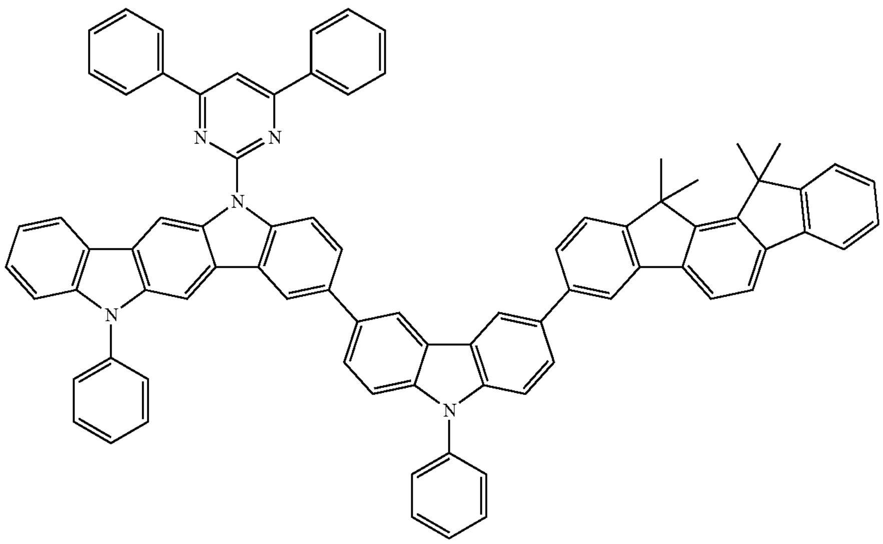
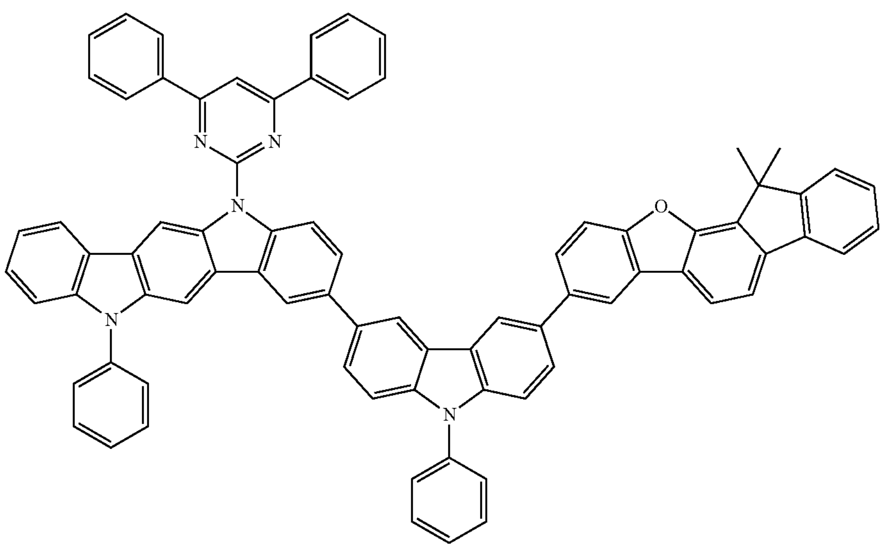

-continued
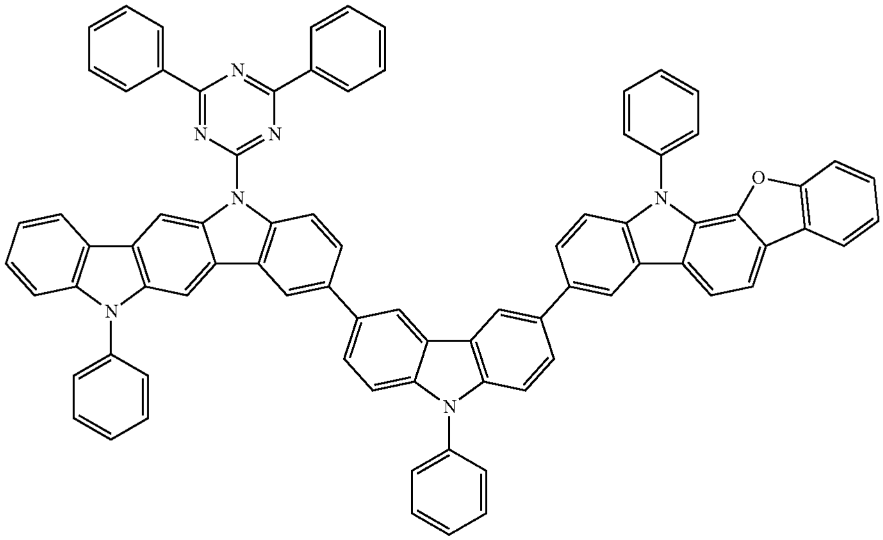
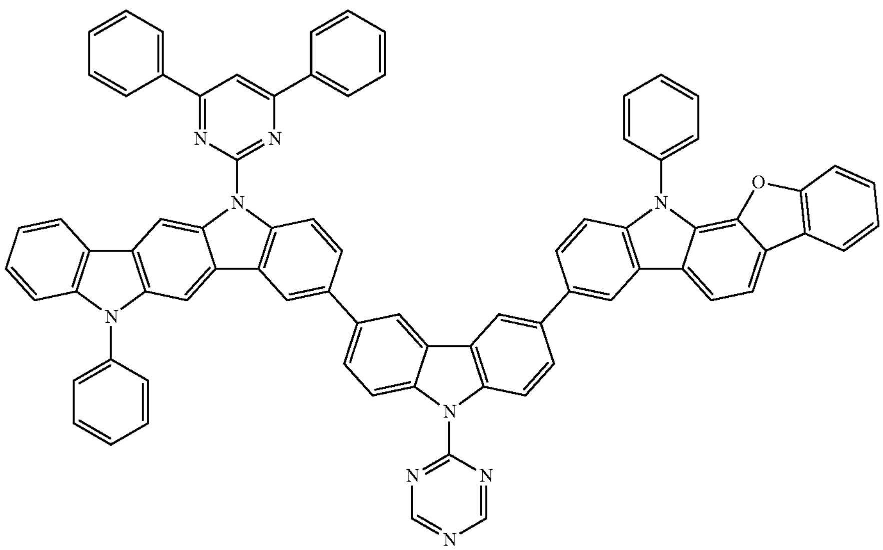
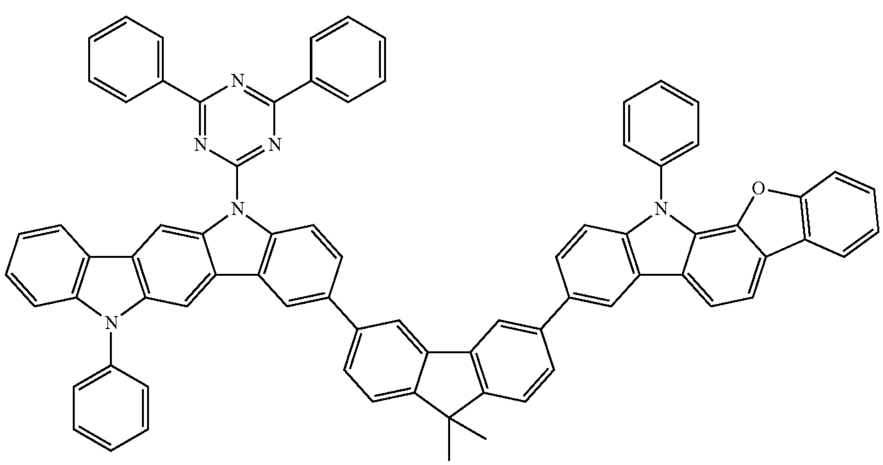

-continued
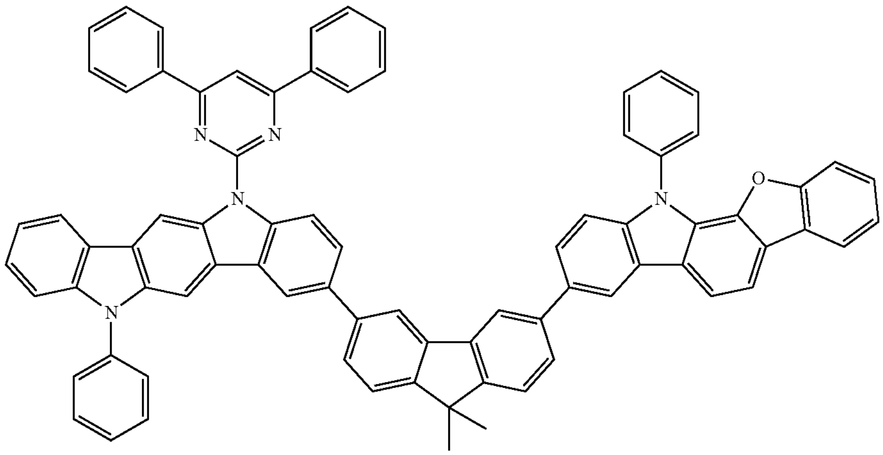
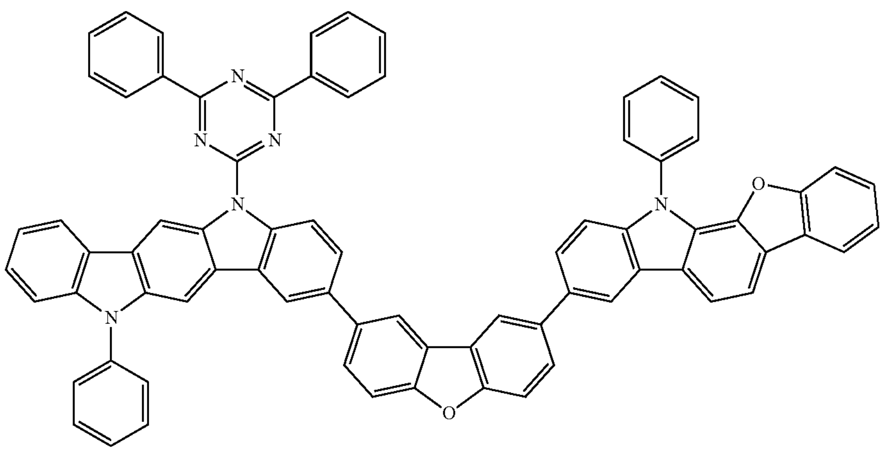
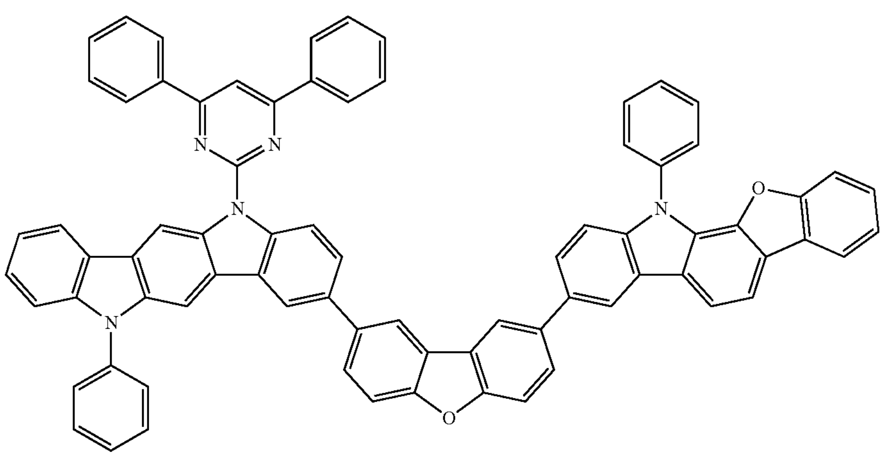

-continued
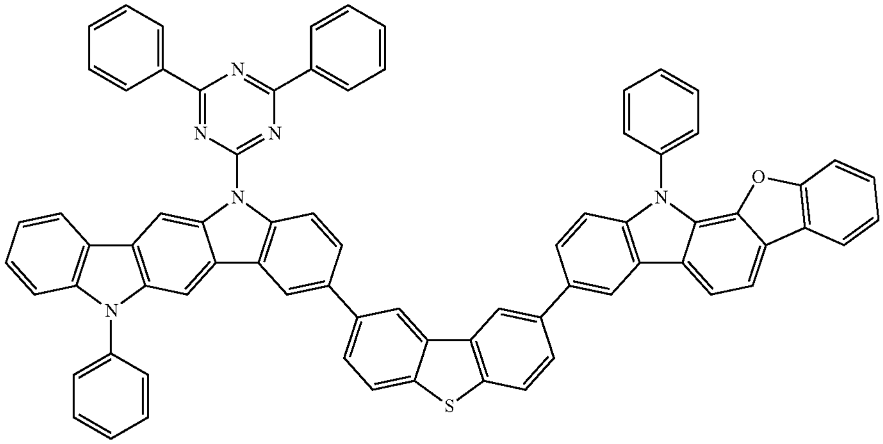
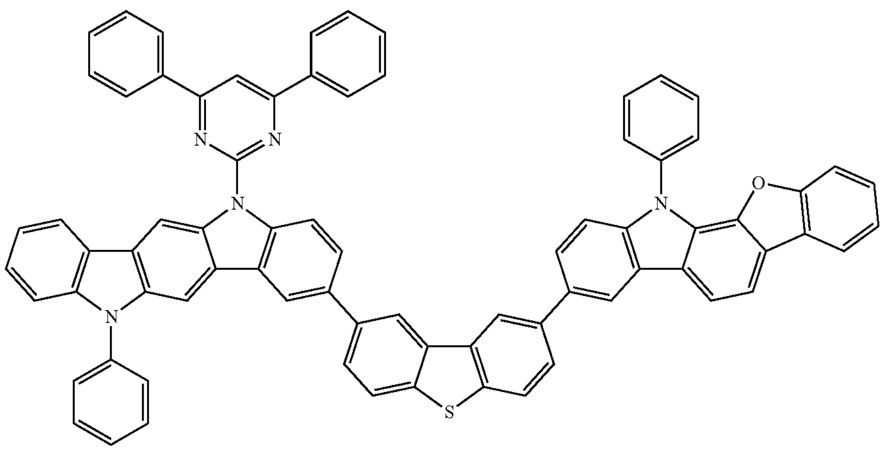
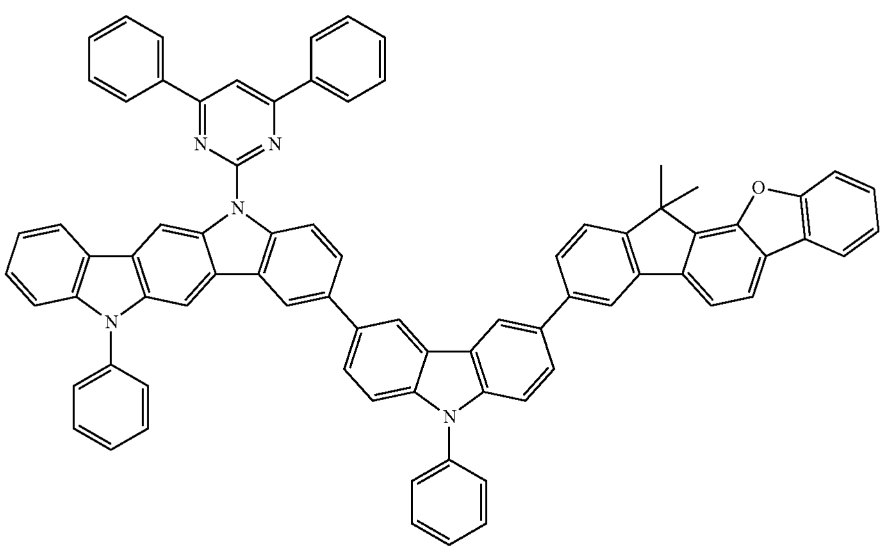

-continued
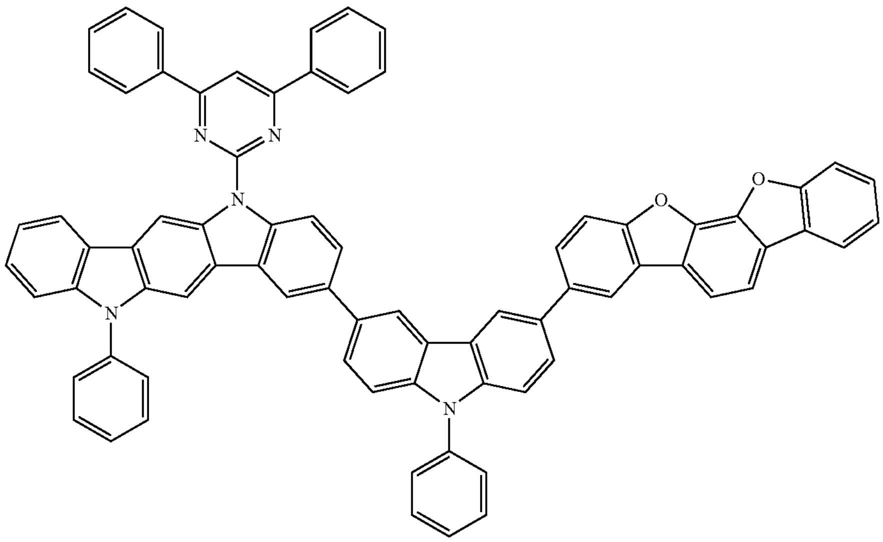
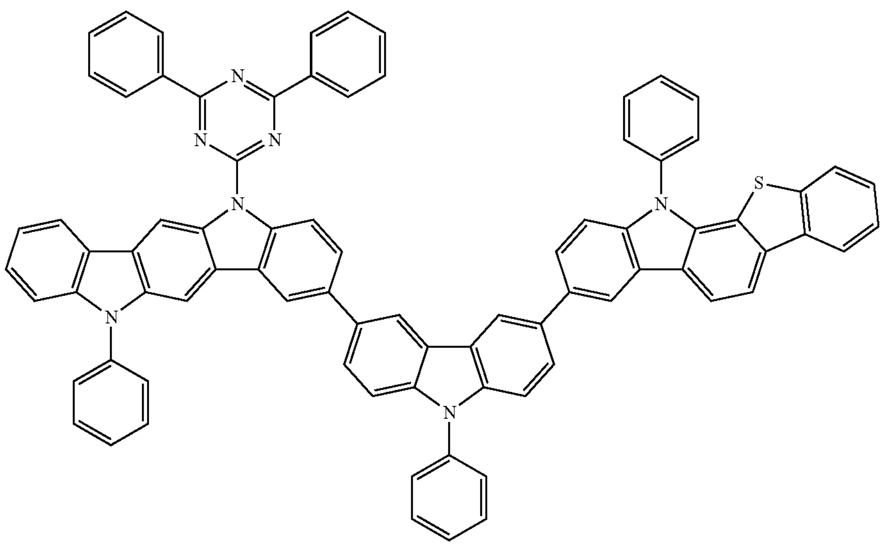
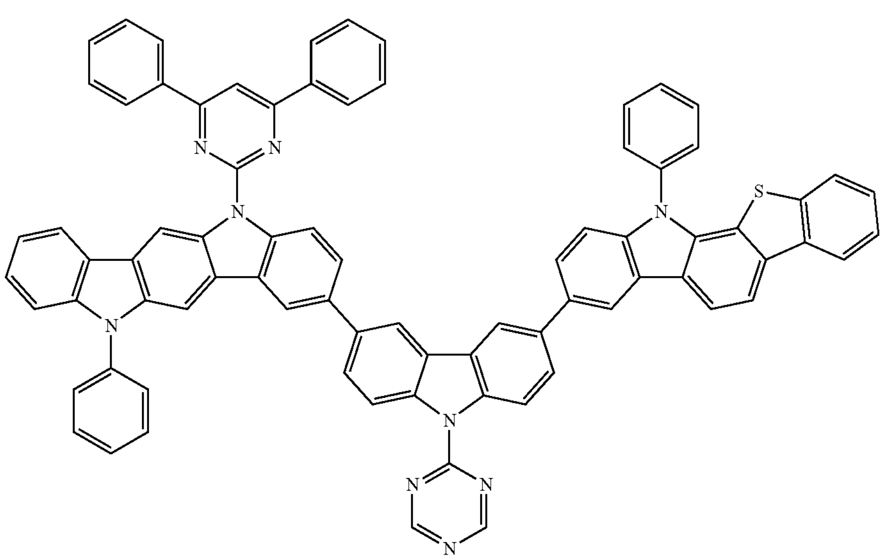

-continued
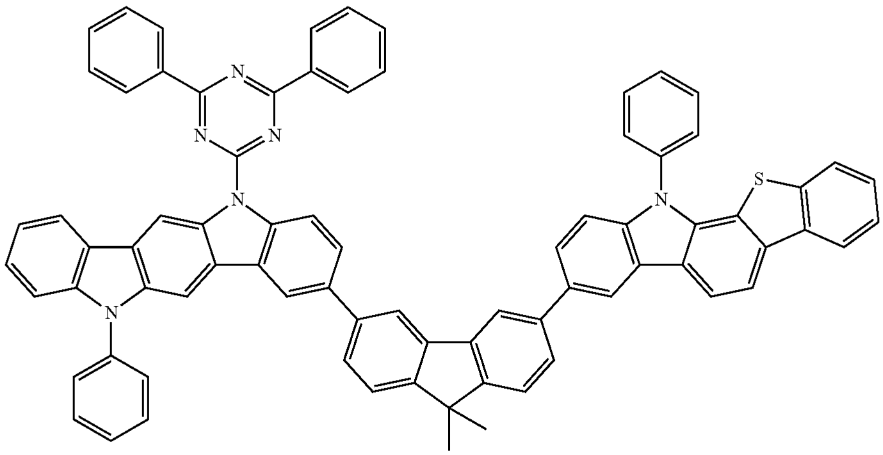
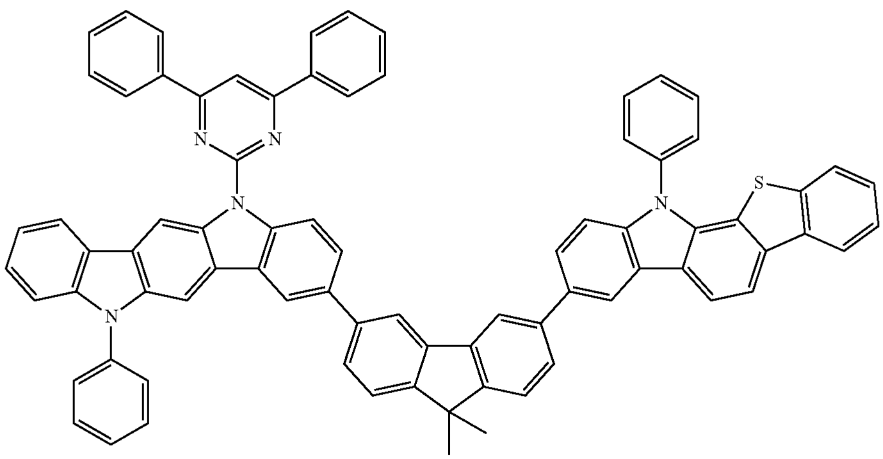
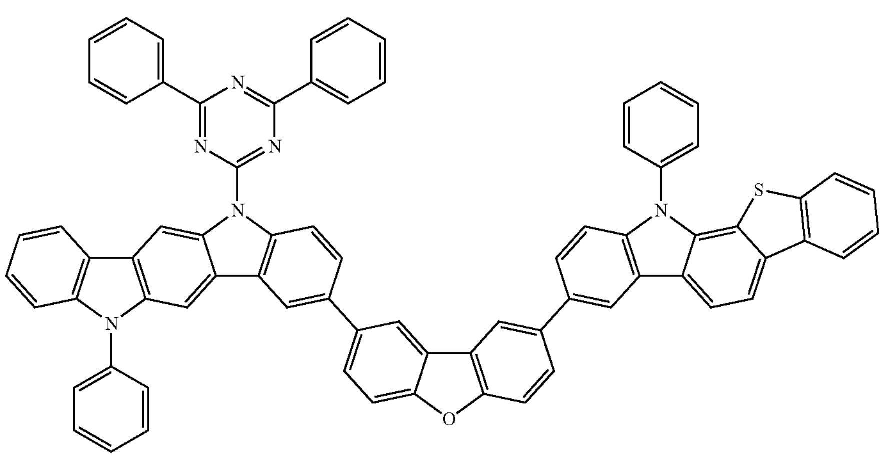

-continued
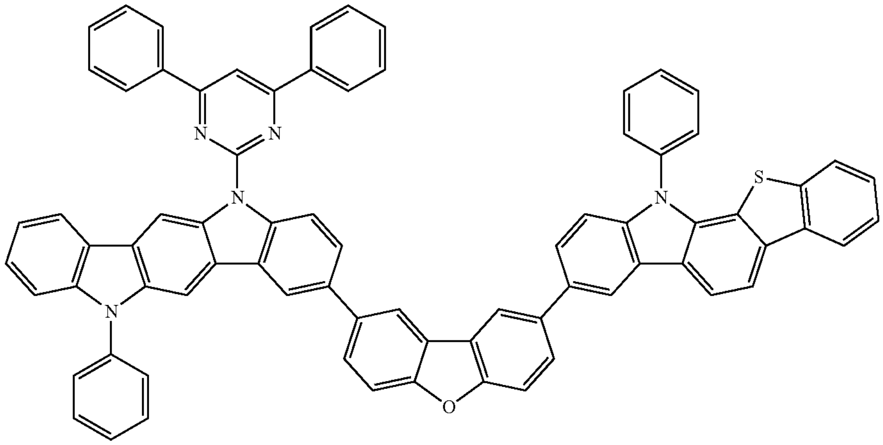
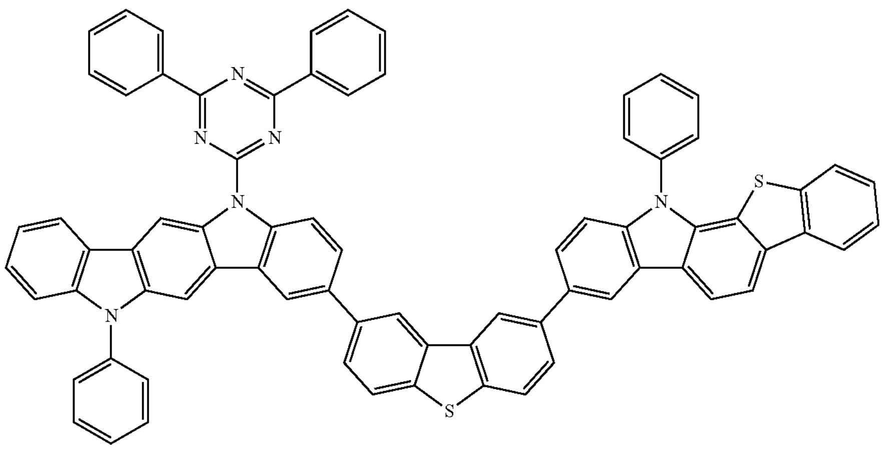
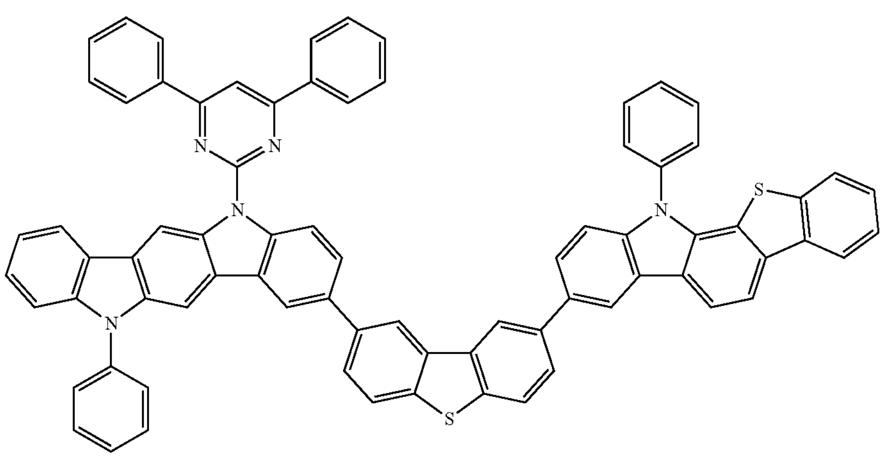

-continued
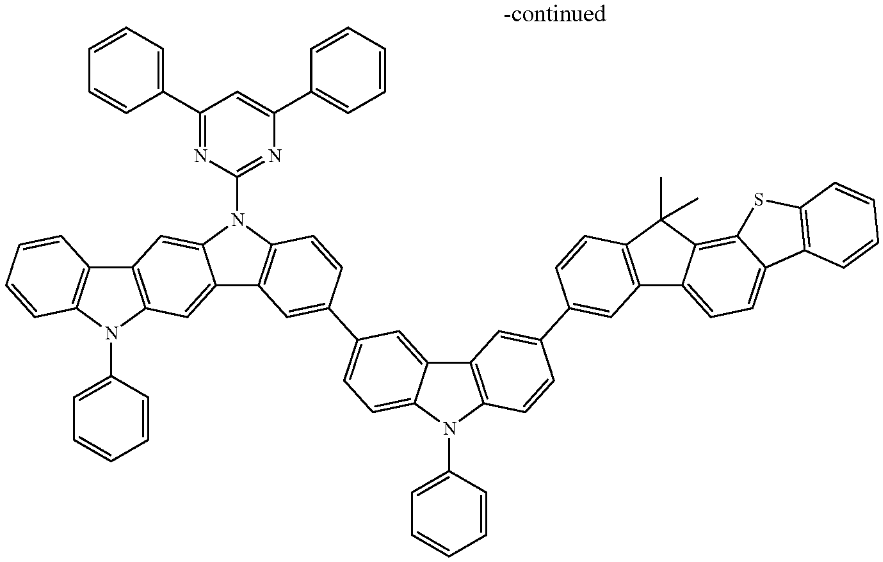
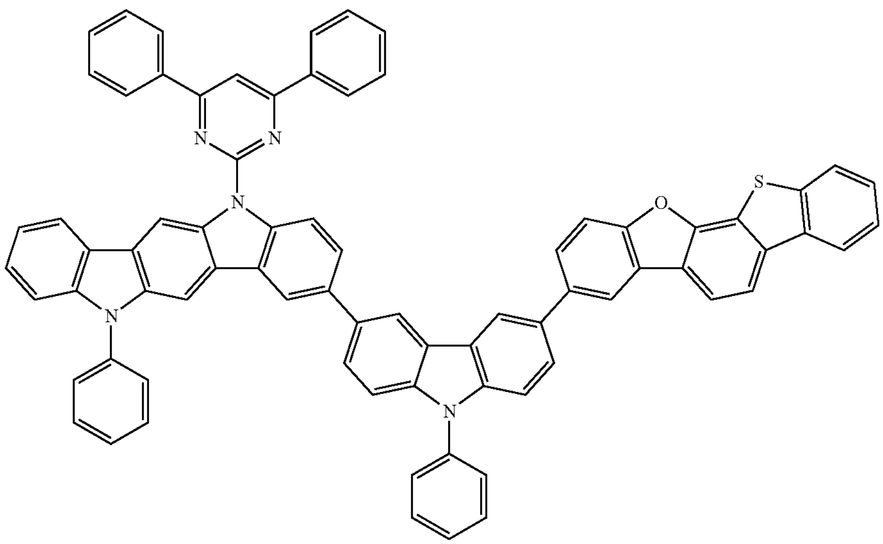
In another embodiment, the first material and the second material may be selected from Compounds BF1 to BF13 below, but they are not limited thereto:
BF1
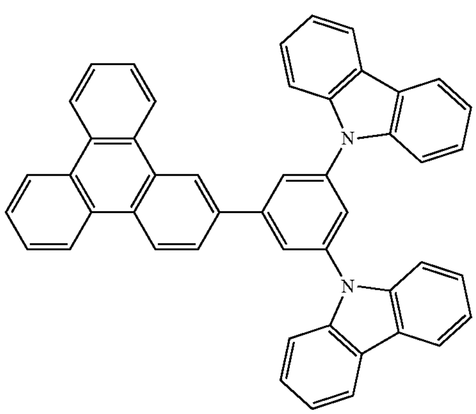
-continued
BF2
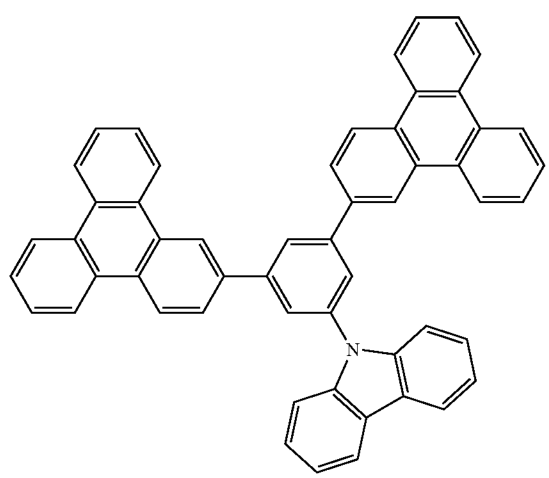

BF3
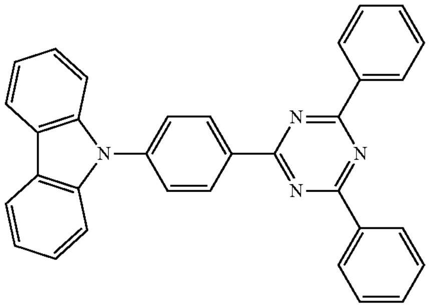
BF4
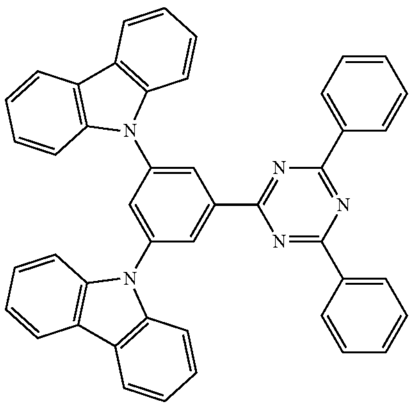
BF5
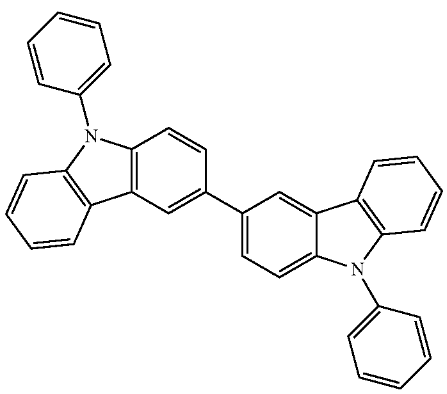
BF6
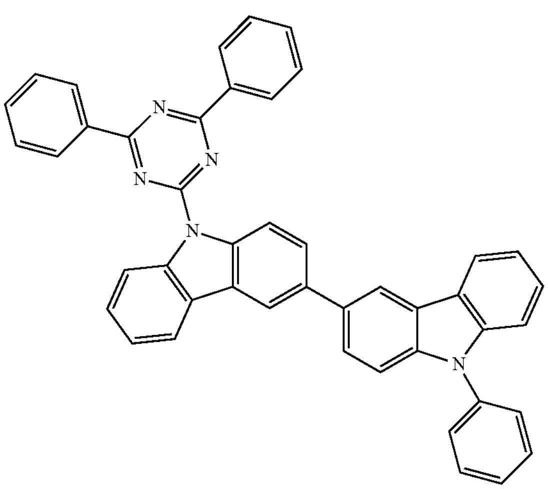
BF7
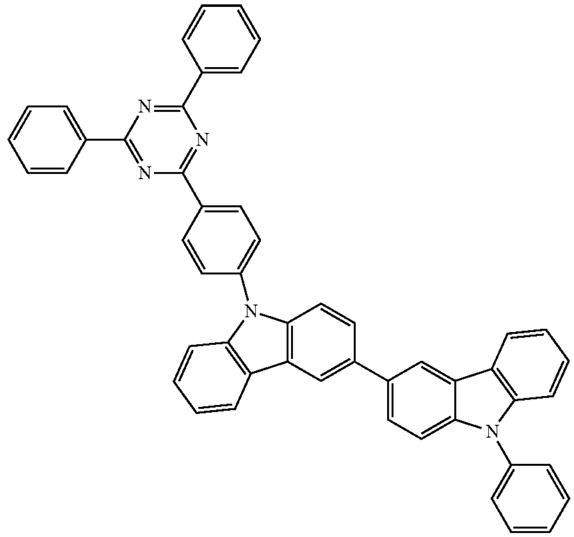
BF8
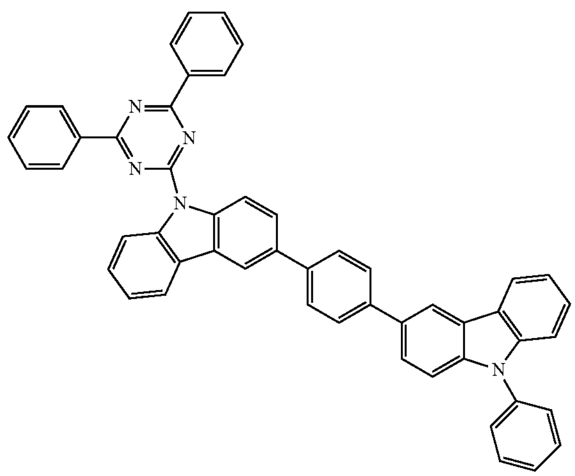
BF9
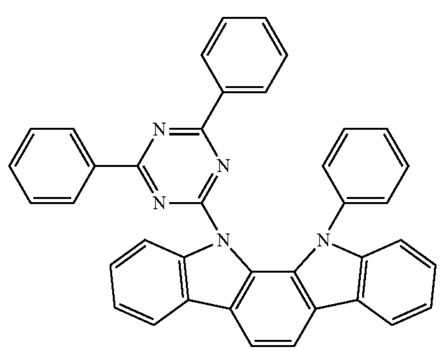

-continued

BF10

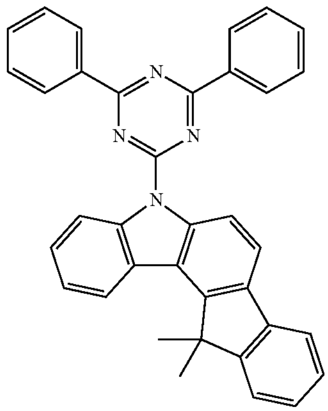

BF11

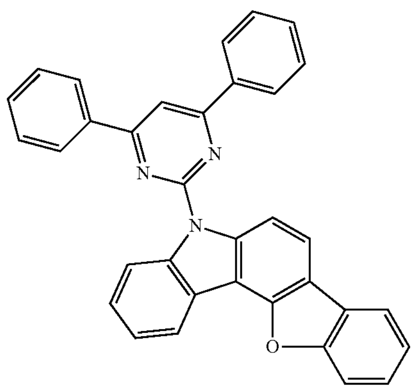

BF12

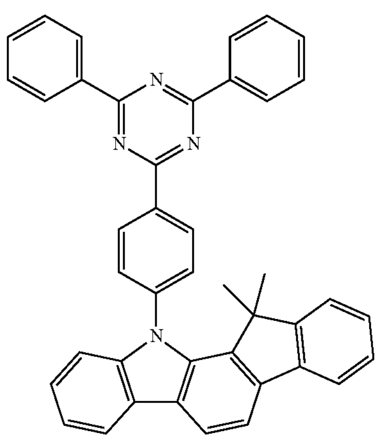

BF13

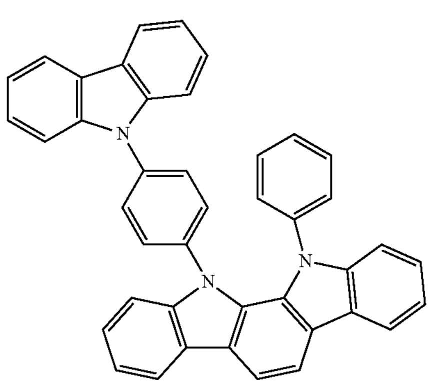

For example, electron affinity $EA_1$ of the first material and electron affinity $EA_2$ of the second material may satisfy Equation 1 below, but they are not limited thereto:

$$EA_1 < EA_2 \quad \text{Equation 1}$$

For example, the emission layer may include a host and a dopant;

triplet energy $Eg_{DT2}$ of the dopant may satisfy Equation 2 below, but it is not limited thereto:

$$Eg_{T1} > Eg_{DT2} \quad \text{Equation 2}$$

In another embodiment, the emission layer may include a host and a dopant; and triplet energy of the host $Eg_{HT2}$ may satisfy Equation 3 below, but it is not limited thereto:

$$Eg_{T1} > Eg_{HT2} \quad \text{Equation 3}$$

The drawing schematically illustrates a cross-section of an organic light-emitting device 10 according to an embodiment of the present invention. The organic light-emitting device 10 includes a first electrode 110, an organic layer 150, and a second electrode 190.

Hereinafter, a structure and a method of manufacturing an organic light-emitting device according to an embodiment of the present invention will be described with reference to the drawing.

A substrate may be additionally disposed under the first electrode 110 or above the second electrode 190 in the drawing. The substrate may be a glass substrate or a transparent plastic substrate with excellent mechanical strength, thermal stability, transparency, surface smoothness, ease of handling, and water resistance.

The first electrode 110 may be formed by, for example, depositing or sputtering a first electrode material on the substrate. When the first electrode 110 is an anode, the material for the first electrode 110 may be selected from materials with a high work function to facilitate hole injection. The first electrode 110 may be a reflective electrode, a transflective electrode, or a transmissive electrode. The material for the first electrode 110 may be a transparent material with high conductivity, and examples of such a material are indium tin oxide (ITO), indium zinc oxide (IZO), tin oxide ($SnO_2$), and zinc oxide (ZnO). Alternatively, at least one of magnesium (Mg), aluminum (Al), aluminum-lithium (Al—Li), calcium (Ca), magnesium-indium (Mg—In), magnesium-silver (Mg—Ag), or the like may be used as the first electrode material for manufacturing the first electrode 110 of the transflective electrode or the transmissive electrode.

The first electrode 110 may have a single-layered structure or a multi-layered structure. For example, the first electrode 110 may have a three-layered structure of ITO/Ag/ITO, but it is not limited thereto.

The organic layer 150 may be disposed on the first electrode 110 and include an emission layer.

The organic layer 150 may include a hole transport region disposed between the first electrode 110 and the emission layer, an electron transport region disposed between the emission layer and the second electrode, and a mixed layer disposed between the emission layer and the electron transport region.

The hole transport region may include at least one selected from a hole injection layer (HIL), a hole transport layer (HTL), a buffer layer, and an electron blocking layer (EBL), and the electron transport region may include at least one selected from a hole-blocking layer (HBL), an electron transport layer (ETL), and an electron injection layer (EIL), but they are not limited thereto.

The hole transport region may include a single layer formed of a single material, a single layer formed of a plurality of different materials, or a multi-layered structure including a plurality of layers formed of a plurality of different materials.

For example, the hole transport region may have a single-layered structure formed of a plurality of different materials, or a structure in which HIL/HTL, HIL/HTL/buffer layer, HIL/buffer layer, HTL/buffer layer, or HIL/HTL/EBL are sequentially layered on the first electrode 110, but it is not limited thereto.

When the hole transport region includes the HIL, the HIL may be formed on the first electrode 110 using (i.e., utilizing) various suitable methods, such as vacuum deposition, spin coating, casting, Langmuir-Blodgett (LB) deposition, inkjet printing, laser printing, or laser induced thermal imaging (LITI).

When the HIL is formed using vacuum deposition, vacuum deposition conditions may vary according to the compound that is used to form the HIL, and the desired structure of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec.

When the HIL is formed using spin coating, the coating conditions may vary according to the compound that is used to form the HIL, and the desired structure of the HIL to be formed. For example, the coating rate may be in the range of about 2000 rpm to about 5000 rpm, and a temperature at which heat treatment is performed may be in the range of about 80° C. to about 200° C.

When the hole transport region includes the HTL, the HTL may be formed on the first electrode 110 or on the HTL using various suitable methods, such as vacuum deposition, spin coating, casting, LB deposition, inkjet printing, laser printing, or LITI. When the HTL is formed by vacuum deposition or spin coating, vacuum deposition conditions and coating conditions may be the same as the vacuum depsotion conditions and the coating conditions of the HTL.

The hole transport region may include at least one selected from m-MTDATA, TDATA, 2-TNATA, NPB, β-NPB, TPD, Spiro-TPD, Spiro-NPB, α-NPB, TAPC, HMTPD, 4,4',4"-tris(N-carbazolyl)triphenylamine(4,4',4"-tris(N-carbazolyl)triphenylamine) (TCTA), polyaniline/dodecylbenzenesulfonic acid (Pani/DBSA), Poly(3,4-ethylenedioxythiophene)/Poly(4-styrenesulfonate) (PEDOT/PSS), polyaniline/camphor sulfonic acid (pani/CSA), polyaniline/poly(4-styrenesulfonate) (PANI/PSS), a compound represented by Formula 201 below, and a compound represented by Formula 202 below:

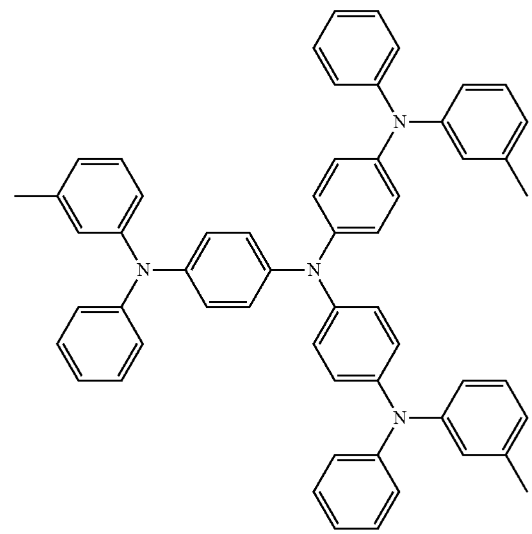

m-MTDATA

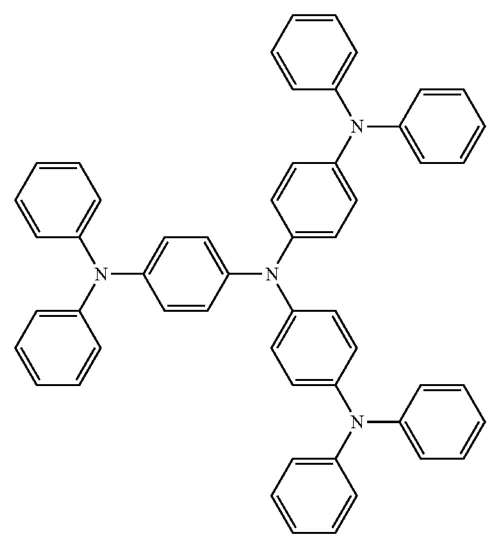

TDATA

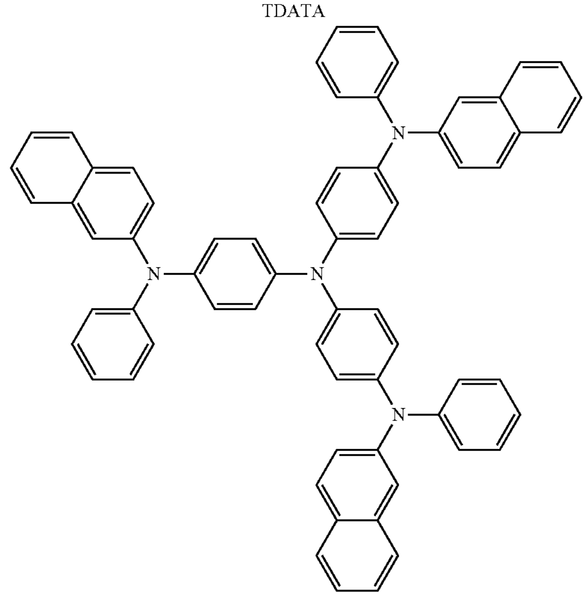

2-TNATA

-continued

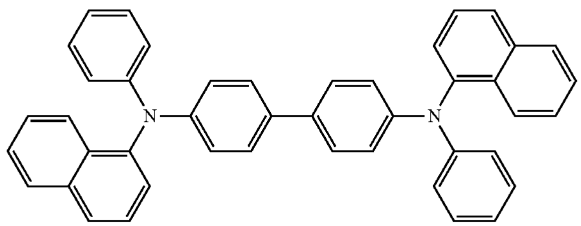

NPB

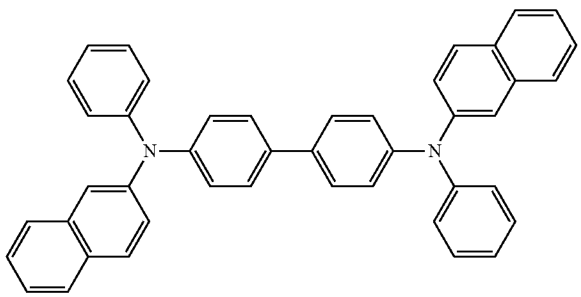

β-NPB

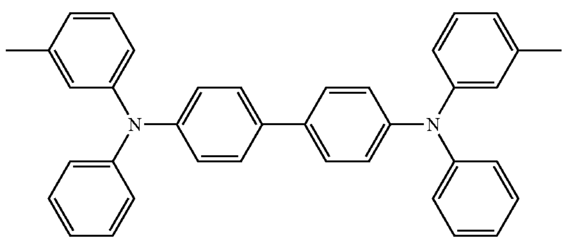

TPD

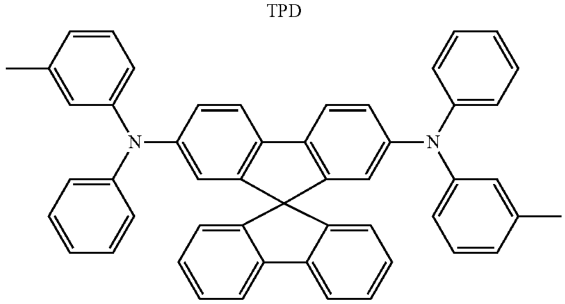

Spiro-TPD

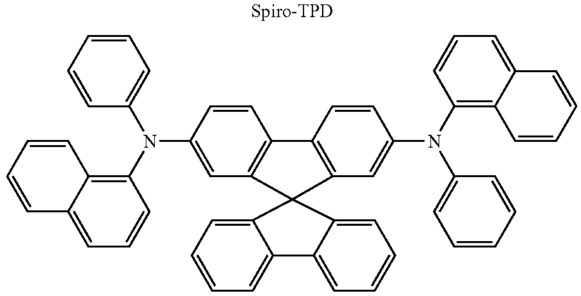

Spiro-NPB

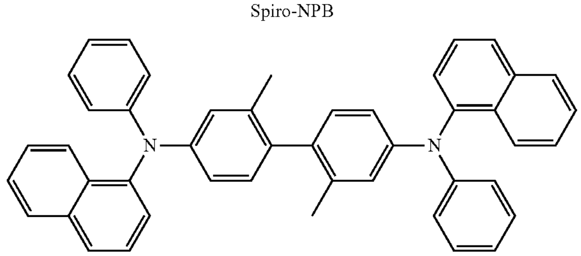

α-NPB

-continued

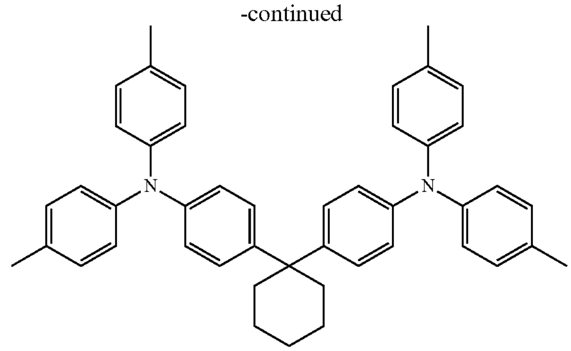

TAPC

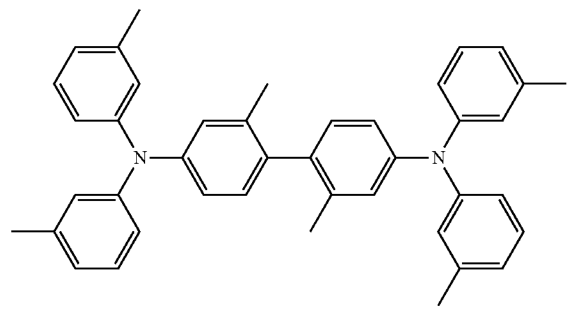

HMTPD

Formula 201

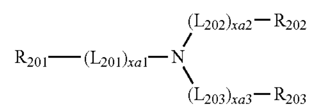

Formula 202

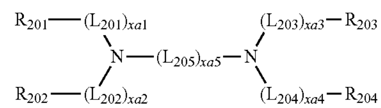

in Formulae 201 and 202, the descriptions of $L_{201}$ to $L_{205}$ may be each independently the same as the description of $L_{11}$;

xa1 to xa4 may be each independently 0, 1, 2, or 3;

xa5 may be 1, 2, 3, 4, or 5; and $R_{201}$ to $R_{204}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted monovalent non-aromatic condensed polycyclic group, and a substituted or unsubstituted monovalent non-aromatic hetero-condensed polycyclic group.

For example, in Formulae 201 and 202, $L_{201}$ to $L_{205}$ may be each independently selected from a phenylene group; a naphthylene group; a fluorenylene group; a spiro-fluorenylene group; a benzofluorene group; a dibenzofluorene group; a phenanthrenylene group; an anthracenylene group; a pyrenylene group; a chrysenylene group; a pyridinylene group; a pyrazinylene group; a pyrimidinylene group; a pyridazinylene group; a quinolinylene group; an isoquinolinylene group; a quinoxalinylene group; a quinazolinylene group; a carbazolylene group; and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, an isoindolyl group, a quinolinyl group, an isoquinolinyl group, a quinoxalinyl group, a quinazolinyl group, a carbazolyl group, and a triazinyl group;

xa1 to xa4 may be each independently 0, 1, or 2;

xa5 may be 1, 2, or 3; and $R_{201}$ to $R_{204}$ may be each independently selected from a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; a carbazolyl group; and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, but they are not limited thereto.

The compound represented by Formula 201 may be represented by Formula 201A below:

Formula 201A

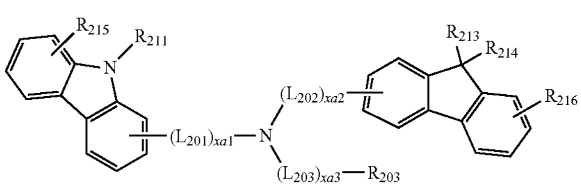

For example, the compound represented by Formula 201 may be represented by Formula 201A-1, but it is not limited thereto:

Formula 201A-1

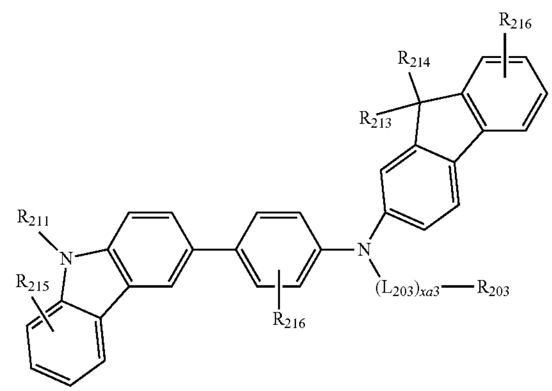

The compound represented by Formula 202 may be represented by Formula 202A below, but it is not limited thereto:

Formula 202A

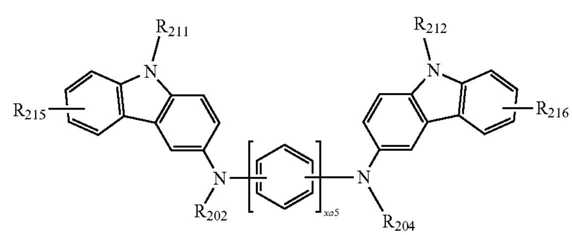

In Formulae 201A, 201A-1, and 202A, descriptions of $L_{201}$ to $L_{203}$, xa1 to xa3, xa5, and $R_{202}$ to $R_{204}$ are as described herein, and description of $R_{211}$ may be the same as the description of $R_{203}$; $R_{213}$ to $R_{216}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic hetero-condensed polycyclic group.

For example, in Formulae 201A, 201A-1, and 202A, $L_{201}$ to $L_{203}$ may be each independently selected from a phenylene group; a naphthylene group; a fluorenylene group; a spiro-fluorenylene group; a benzofluorenylene group; a dibenzofluorenylene group; a phenanthrenylene group; an anthracenylene group; a pyrenylene group; a chrysenylene group; a pyridinylene group; a pyrazinylene group; a pyrimidinylene group; a pyridazinylene group; a quinolinylene group; an isoquinolinylene group; a quinoxalinylene group; a quinazolinylene group; a carbazolylene group; and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may be each independently 0 or 1;

$R_{203}$, $R_{211}$ and $R_{212}$ may be each independently selected from a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; a carbazolyl group; and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may be each independently selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; a carbazolyl group; and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{215}$ and $R_{216}$ may be each independently selected from a hydrogen; a deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{20}$ alkyl group; and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In Formulae 201A and 201A-1, $R_{213}$ and $R_{214}$ may be coupled to each other to form a saturated or an unsaturated ring.

The compound represented by Formula 201 and the compound represented by Formula 202 may include Compounds HT1 to HT20, but they are not limited thereto.

HT1

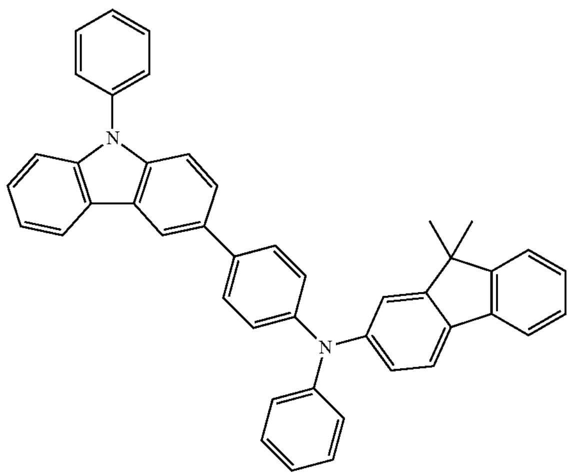

HT2

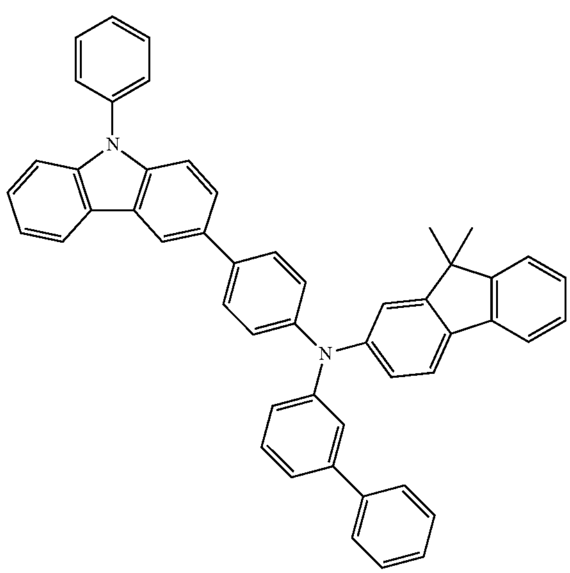

-continued

HT3

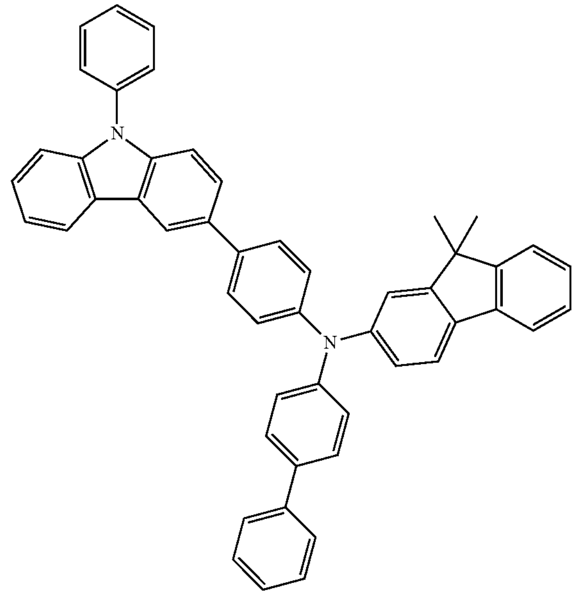

HT4

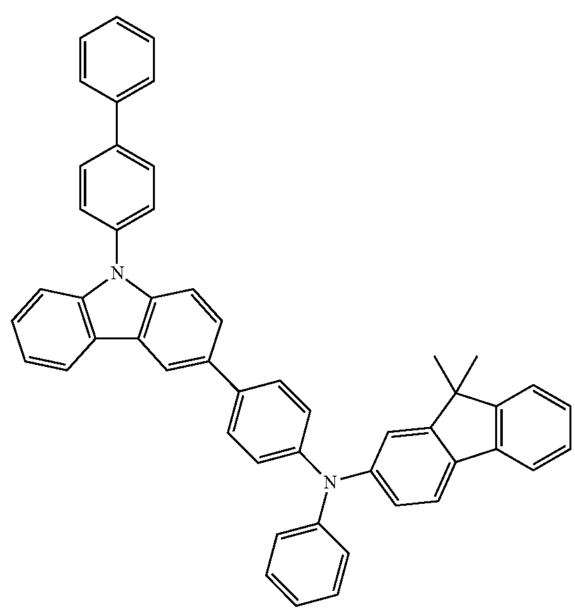

-continued
HT5
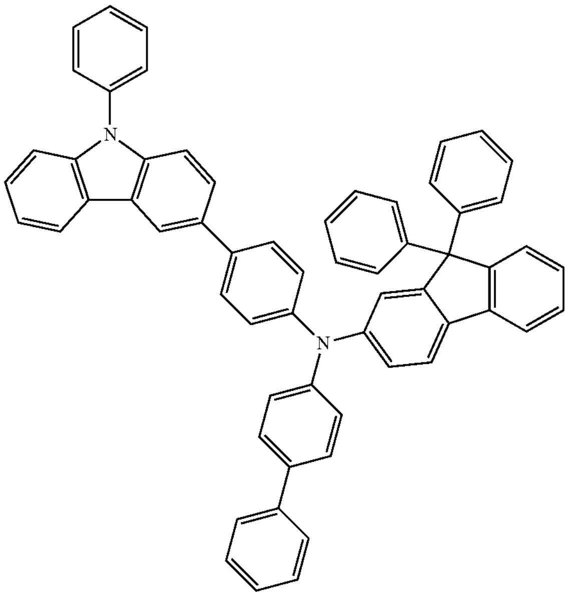
HT6
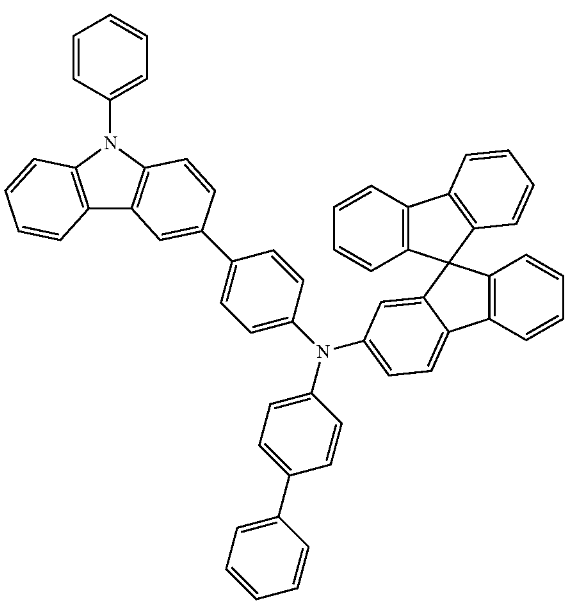
-continued
HT7
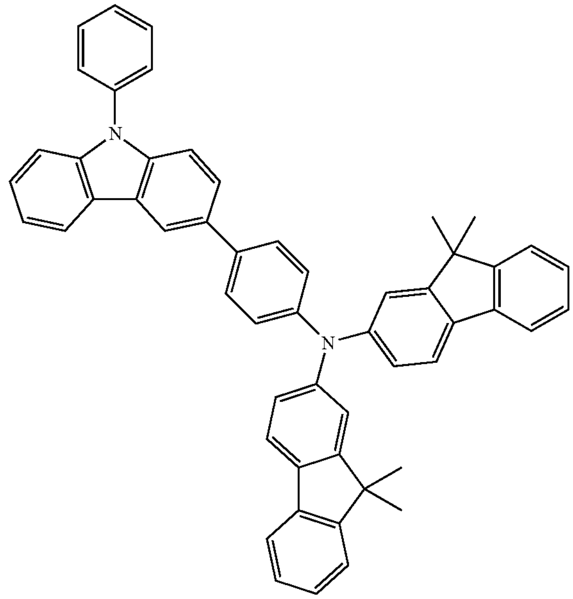
HT8
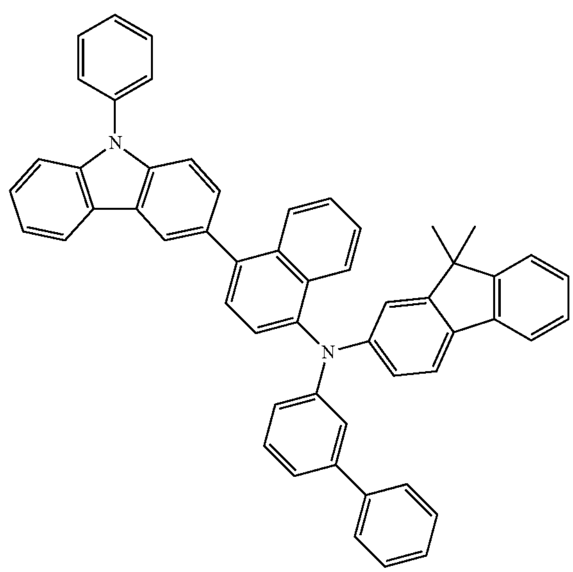

-continued
HT9
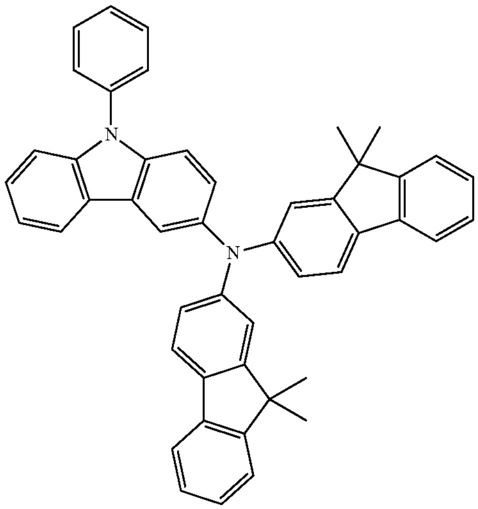
HT10
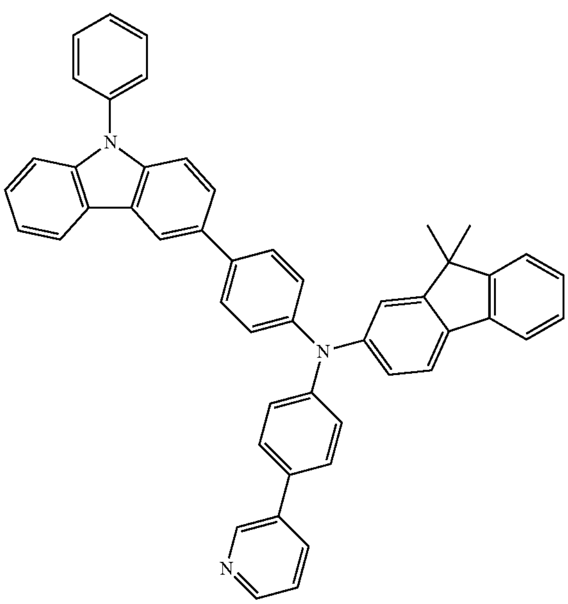
-continued
HT11
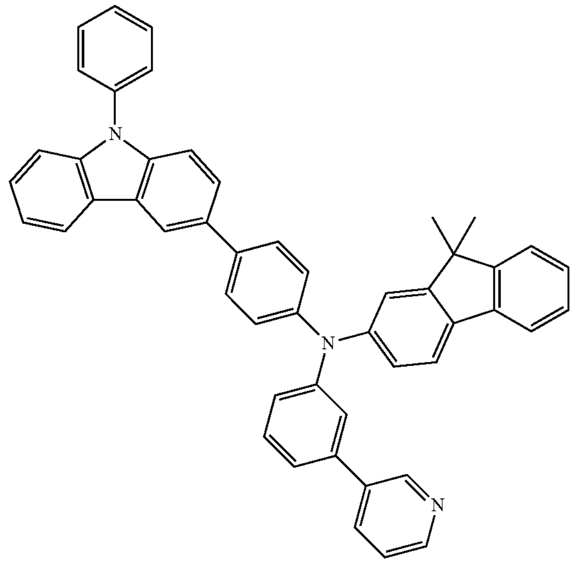
HT12
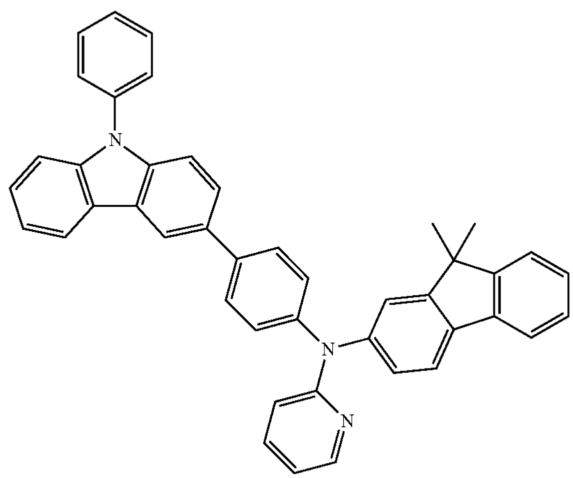
HT13
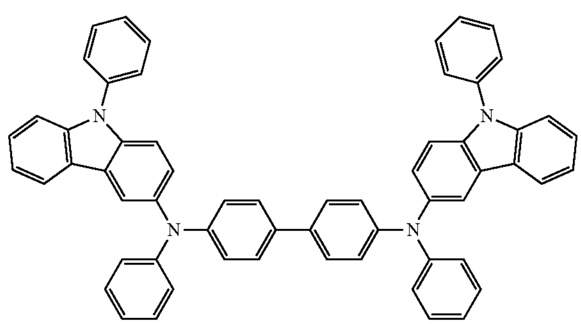

-continued

HT14

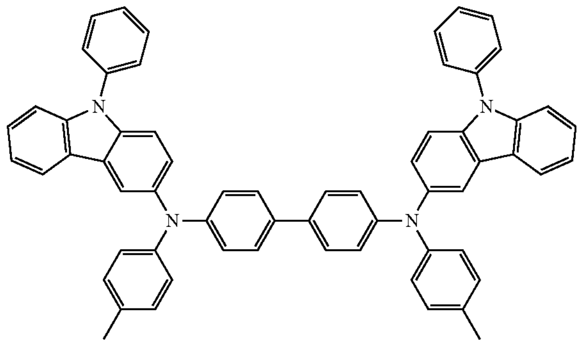

HT15

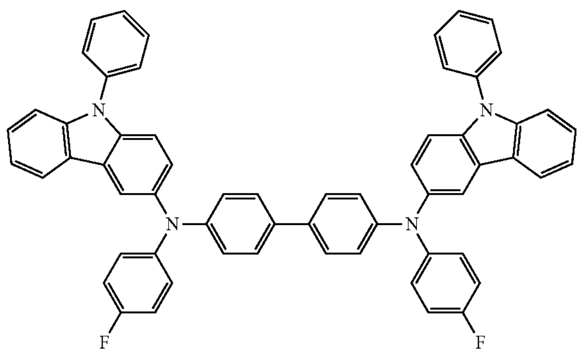

HT16

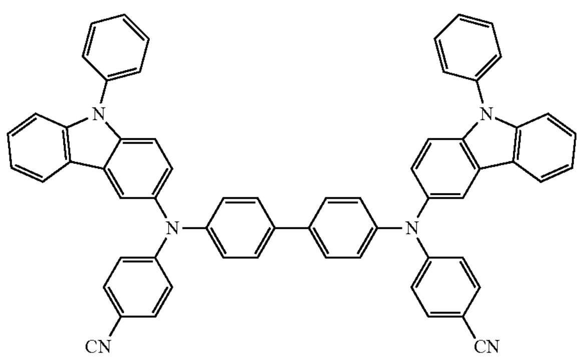

HT17

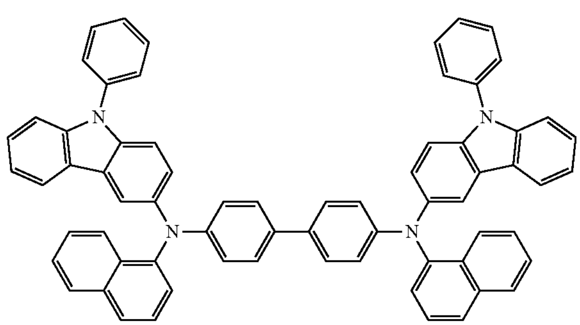

-continued

HT18

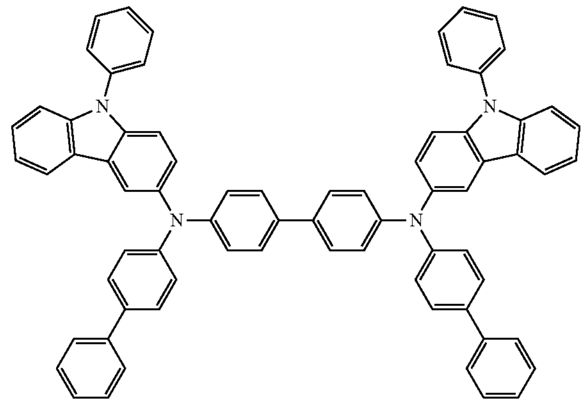

HT19

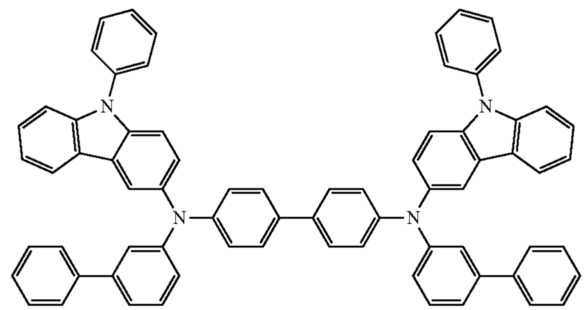

HT20

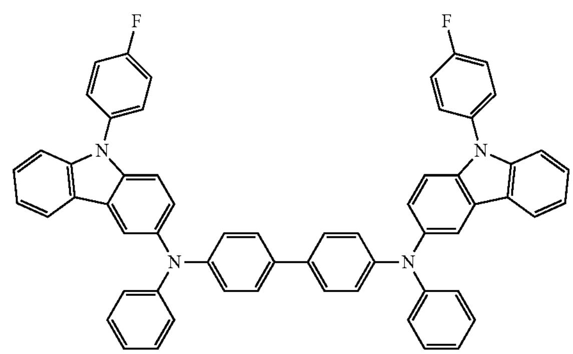

A thickness of the hole transport region may be about 100 Å to about 10000 Å, for example, about 100 Å to about 1000 Å. When the hole transport region includes both of the HIL and the HTL, a thickness of the HIL may be about 100 Å to about 10000 Å, for example, about 100 Å to about 1000 Å; and a thickness of the HTL may be about 50 Å to about 2000 Å, for example, about 100 Å to about 1500 Å. When the thicknesses of the hole transport region, the HIL, and the HTL satisfy the ranges described above, satisfactory hole injection characteristics may be obtained without a substantial increase in a driving voltage.

The hole transport region may further include a charge-generating material, in addition to the material described above. The charge-generating material may be uniformly or non-uniformly dispsered in the hole transport region.

The charge-generating material may be, for example, a p-dopant. The p-dopant may be selected from quinone derivatives, metal oxides, F-containing compounds, Cl-containing compounds, and CN-containing compounds, but it is not limited thereto. For example, non-limiting examples of the p-dopant are quinone derivatives, such as tetracyanoquinodimethane (TCNQ), or 2,3,5,6-tetrafluoro-tetracyano-1,4-benzoquinodimethane (F4-TCNQ); metal oxides such as tungsten oxides or molybdenym oxides; and a Compound HT-D1 below.

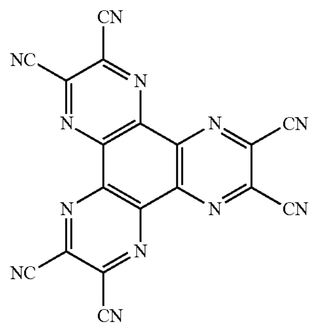

Compound HT-D1

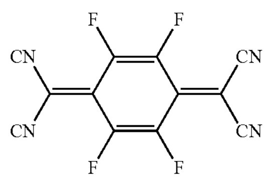

F4-TCNQ

The hole transport region may include at least one selected from the buffer layer and the EBL, in addition to the HIL and the HTL. The buffer layer may compensate for an optical resonance distance of light according to a wavelength of the light emitted from the EML, and thus may increase the light-emitting efficiency. The buffer layer may include any suitable material that may be used in the hole transport region. The EBL may reduce or prevent injection of electrons from the electron transport region.

The HTL may include a first HTL and a second HTL, which may include (e.g., simultaneously include) the same material or include different materials.

Then, the EML may be formed on the first electrode 110 or the hole transport region by vacuum deposition, spin coating, casting, LB deposition, inkjet printing, laser printing, LITI, or the like. When the EML is formed using vacuum deposition or spin coating, the deposition and coating conditions may be similar to those for the formation of the HIL.

When the organic light-emitting device 10 is a full color organic light-emitting device, the organic light-emitting device 10 may be patterned into a red EML, a green EML, and a blue EML, according to different EMLs and individual pixels. Alternatively, the EML may have a structure in which the red EML, the green EML, and the blue EML are layered or a structure in which a red light emission material, a green light emission material, and a blue light emission material are mixed without separation of layers and emit white light.

The EML may include a host and a dopant.

The host may include at least one selected from TPBi, TBADN, ADN (also known as "DNA"), CBP, CDBP, and TCP:

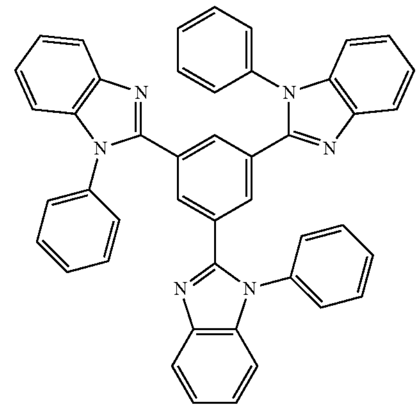

TPBi

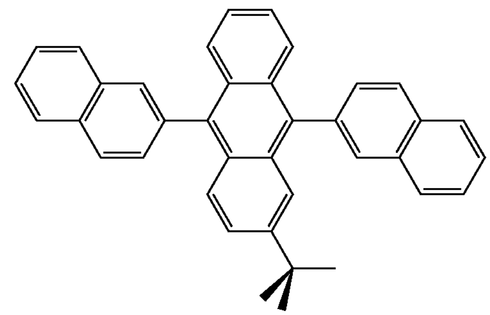

TBADN

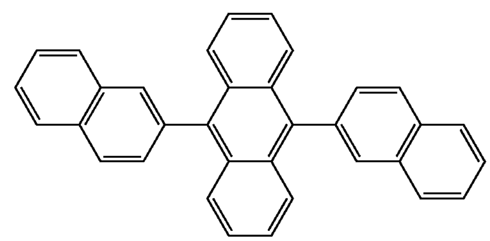

ADN

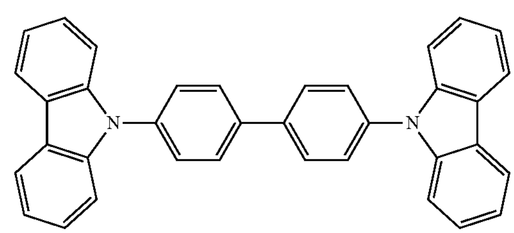

CBP

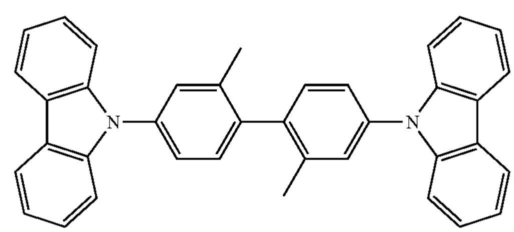

CDBP

-continued

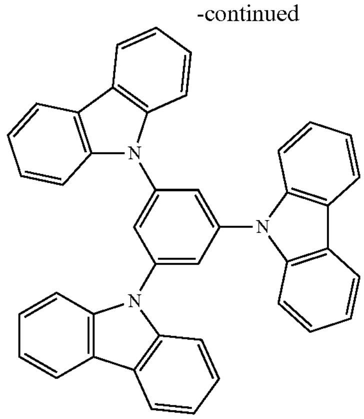

TCP

Alternatively, the host may include a compound represented by Formula 301 below.

$Ar_{301}$-[$(L_{301})_{xb1}$-$R_{301}$]$_{xb2}$ Formula 301

In Formula 301, $Ar_{301}$ may be selected from a naphthalene; a heptalene; a fluorene; a spiro-fluorene; a benzofluorene; a dibenzofluorene; a phenalene; a phenanthrene; an anthracene; a fluoranthene; a triphenylene; a pyrene; a chrysene; a naphthacene; a picene; a perylene; a pentaphene; and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group and —Si($Q_{301}$)($Q_{302}$)($Q_{303}$) (wherein, $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

the description of $L_{301}$ is the same as the description of $L_{201}$;

$R_{301}$ may be selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; a carbazole group; and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xb1 may be 0, 1, 2, or 3; and xb2 may be 1, 2, 3, or 4.

For example, in Formula 301, $L_{301}$ may be selected from a phenylene group; a naphthylene group; a fluorenylene group; a spiro-fluorenylene group; a benzofluorenylene group; a dibenzofluorenylene group; a phenanthrenylene group; an anthracenylene group; a pyrenylene group; and a chrysenylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, and a chrysenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group; and $R_{301}$ may be selected from a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group;

a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; and a chrysenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, and a chrysenyl group.

For example, the host may include a compound represented by Formula 301A:

Formula 301A

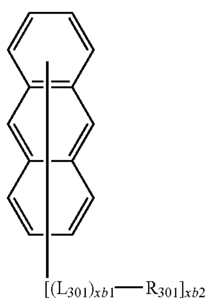

In Formula 301A, descriptions of the substituents are as described herein.

The compound represented by Formula 301 may include at least one selected from Compounds H1 to H42, but it is not limited thereto:

H1

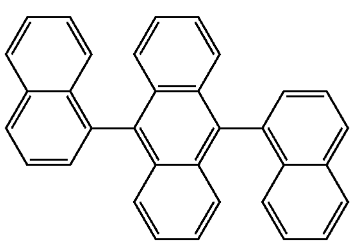

H2

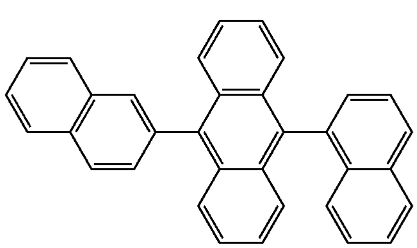

-continued

H3

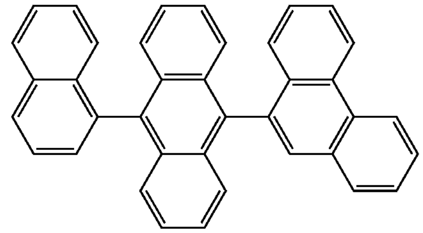

H4

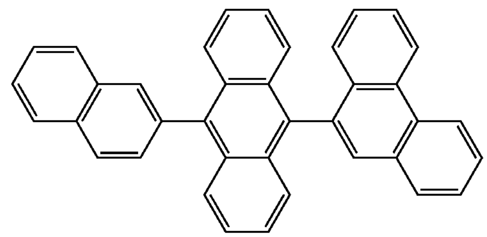

H5

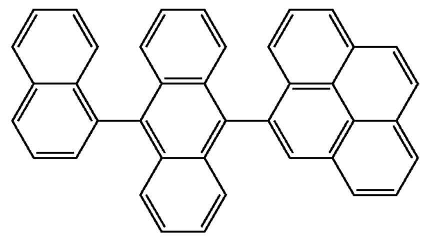

H6

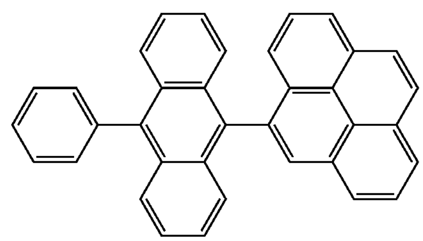

H7

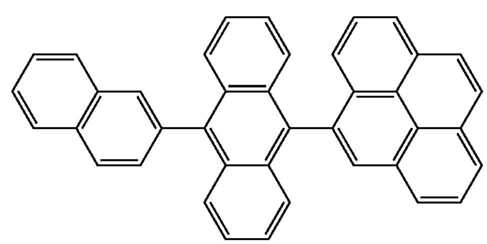

H8

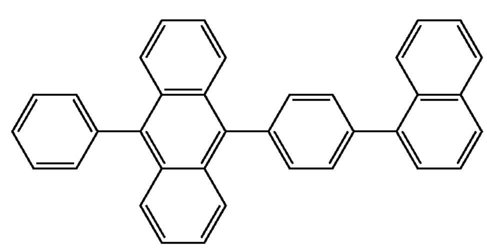

-continued
H9
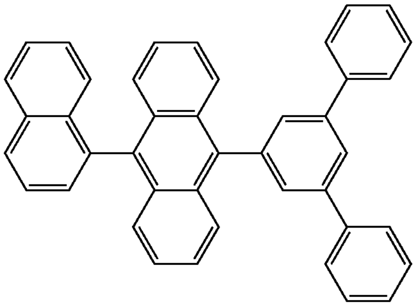
H10
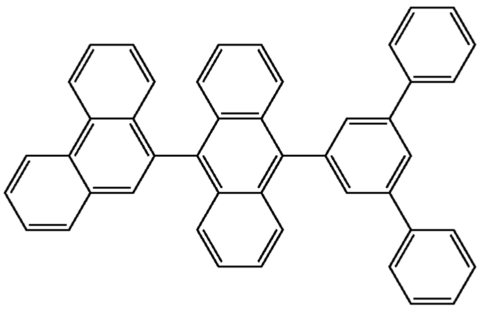
H11
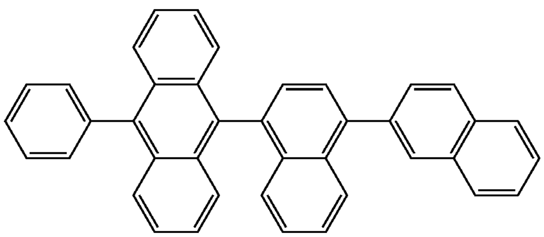
H12
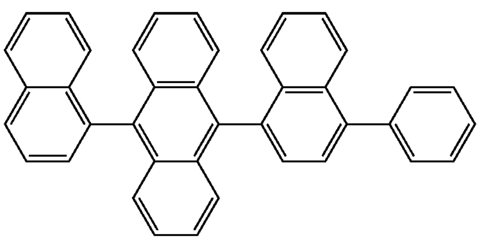
H13
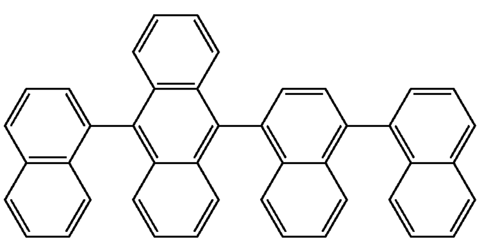
H14
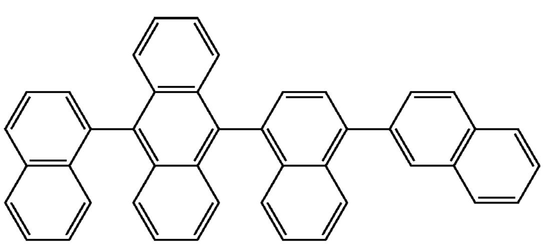
-continued
H15
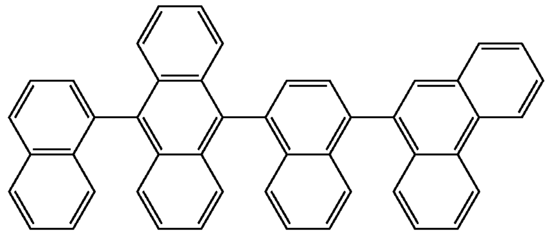
H16
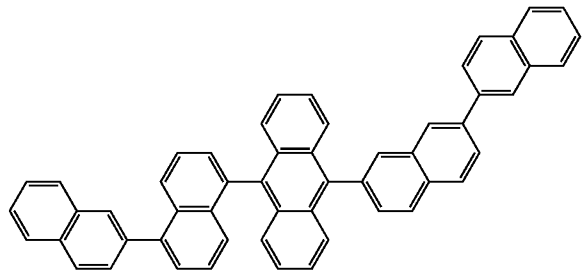
H17
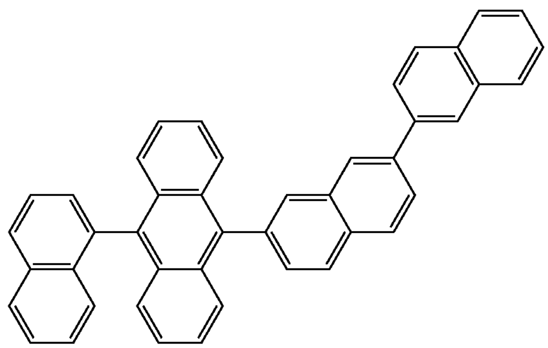
H18
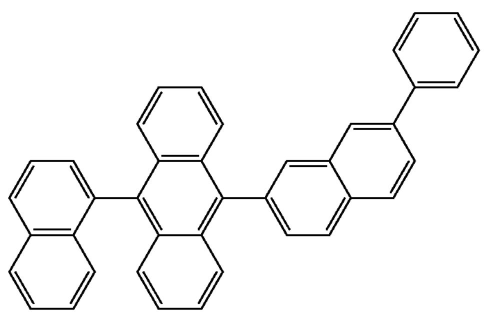
H19
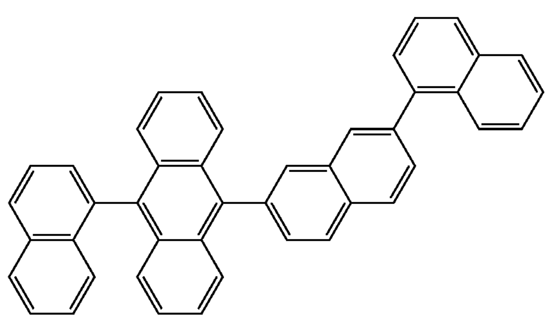

-continued
H20
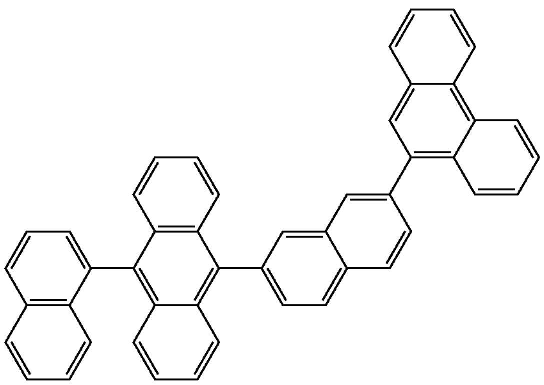
H21
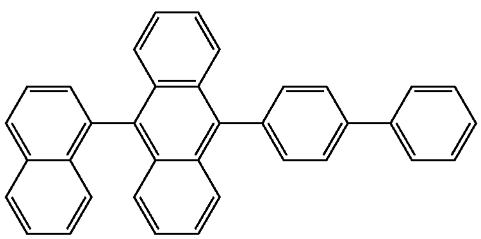
H22
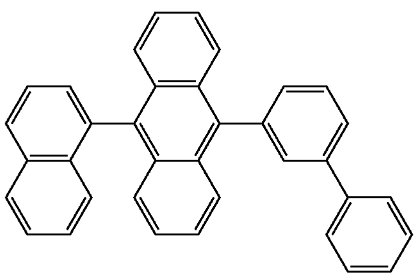
H23
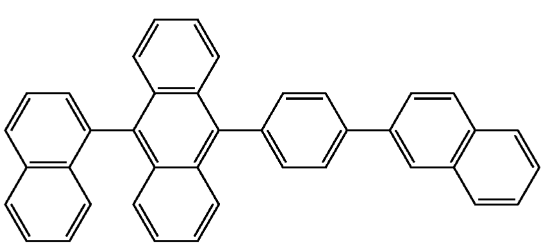
H24
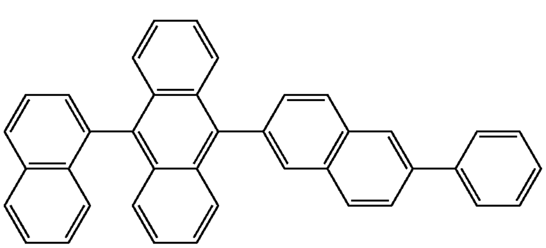
-continued
H25
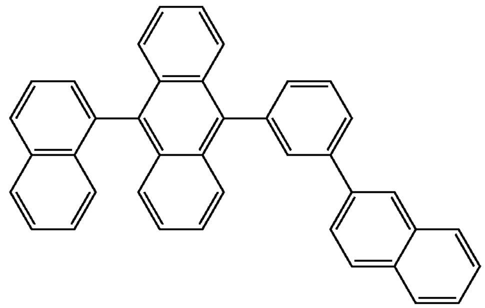
H26
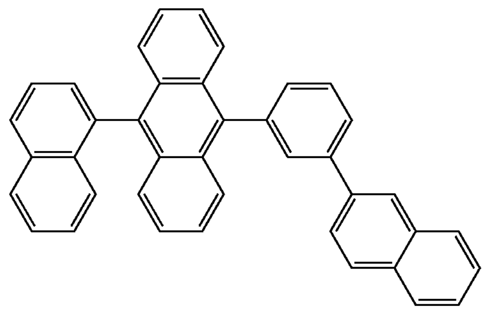
H27
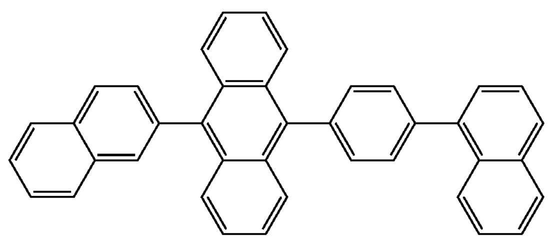
H28
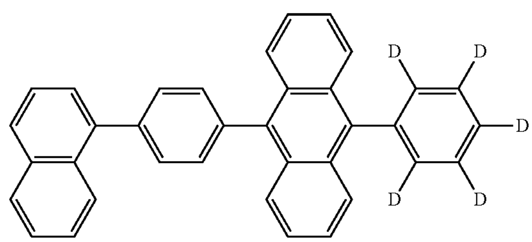
H29
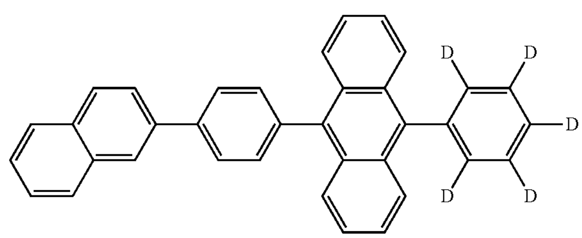
H30
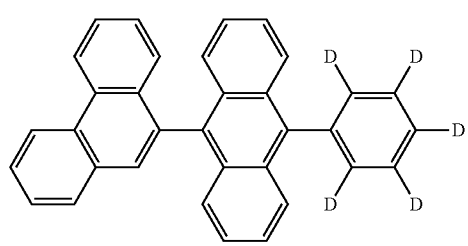

H31
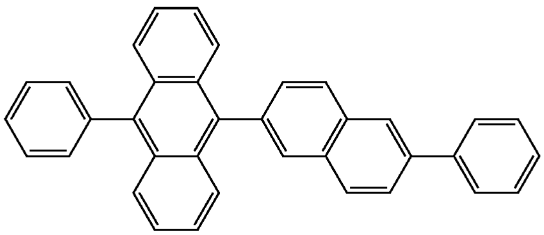
H32
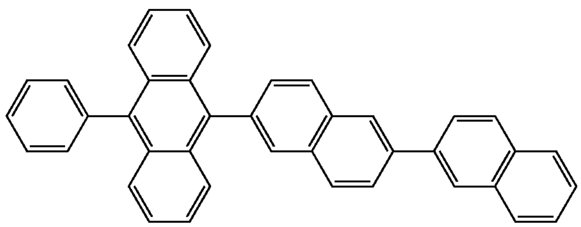
H33
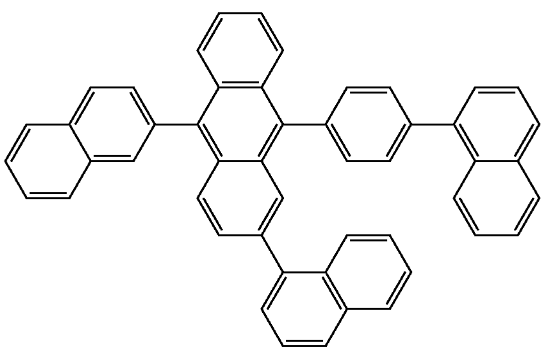
H34
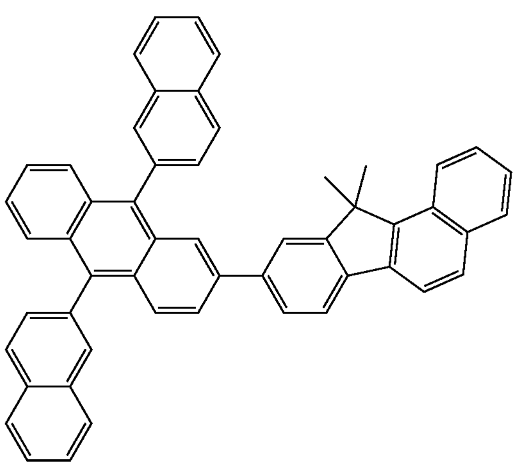
H35
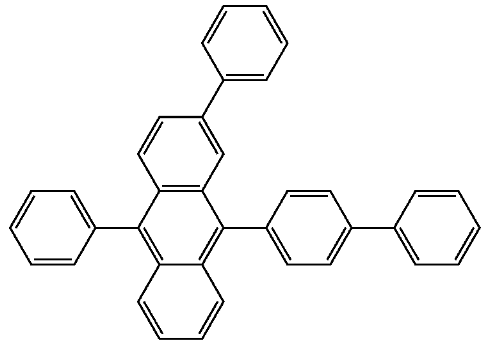
H36
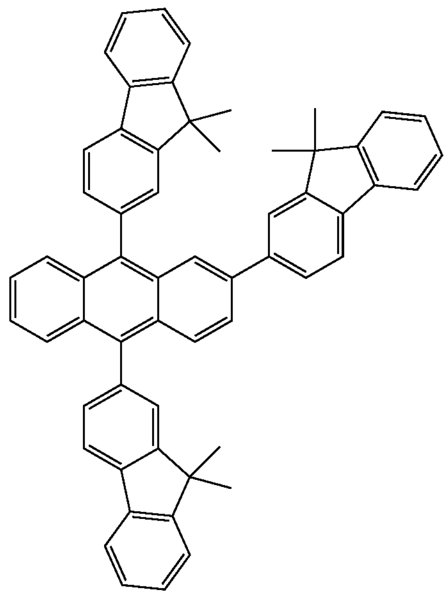
H37
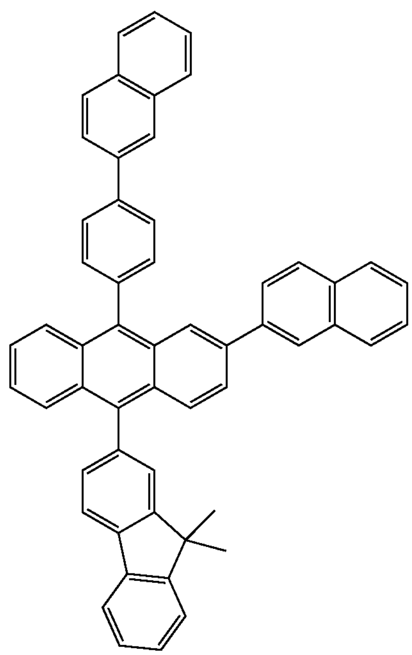

H38
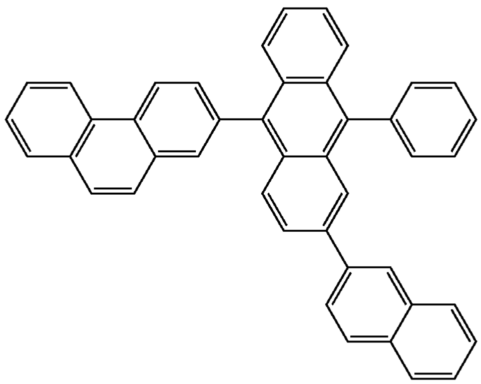
H39
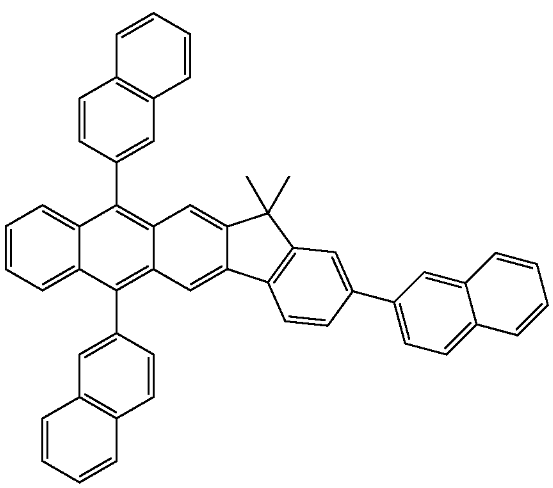
H40
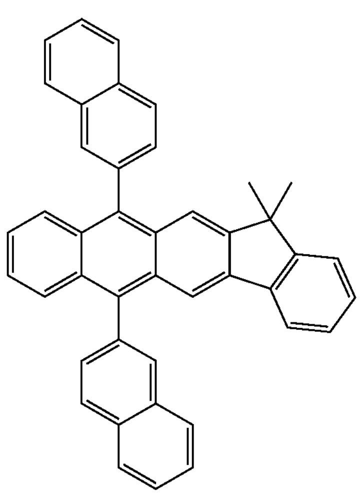
H41
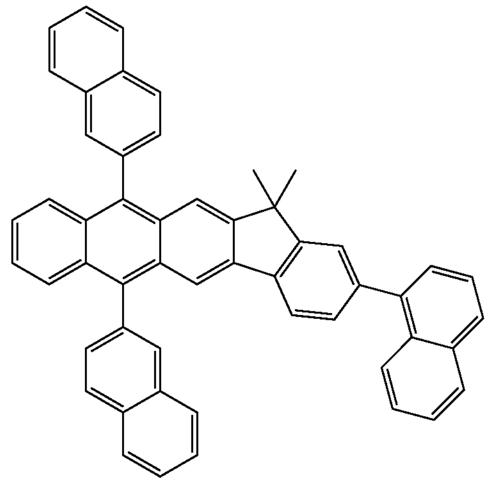
H42
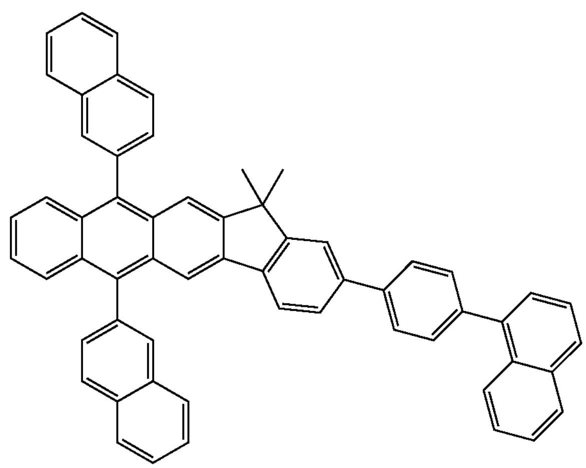
Alternatively, the host may include at least one selected from Compounds H43 to H49, but it is not limited thereto:
H43
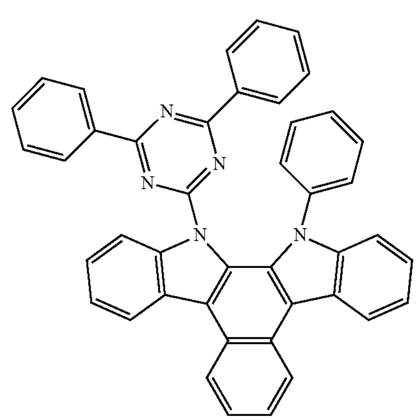

-continued
H44
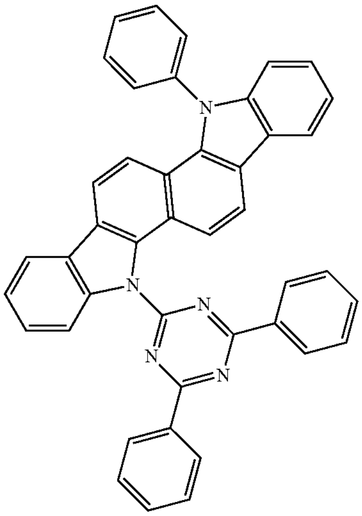
H45
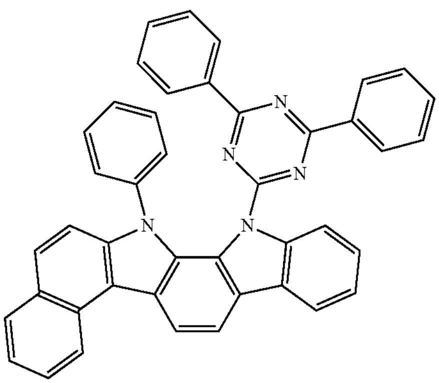
H46
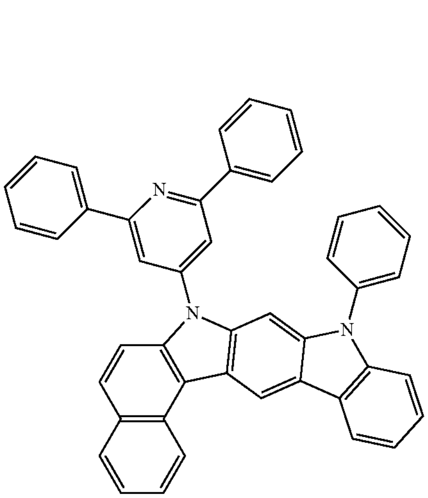
-continued
H47
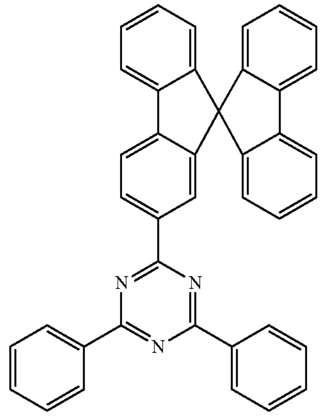
H48
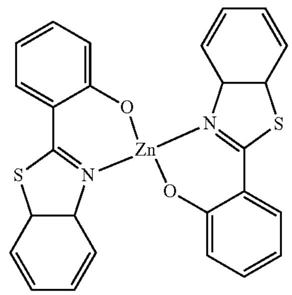
H49
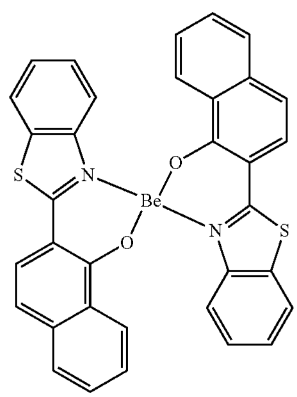
The dopant may include at least one selected from a fluorscent dopant and a phosphorescent dopant.
The phosphorescent dopant may include an organometallic complex represented by Formula 401 below:
Formula 401
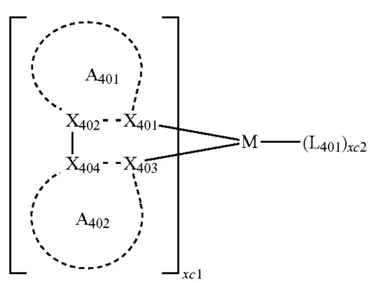

in Formula 401,

M may be selected from iridium (Ir), platinum (Pt), osmium (Os), titanium (Ti), zirconium (Zr), hafnium (Hf), europium (Eu), terbium (Tb), and thulium (Tm);

$X_{401}$ to $X_{404}$ may be each independently nitrogen or carbon;

$A_{401}$ and $A_{402}$ rings may be each independently selected from a substituted or unsubstituted benzene, a substituted or unsubstituted naphthalene, a substituted or unsubstituted fluorene, a substituted or unsubstituted spiro-fluorene, a substituted or unsubstituted indene, a substituted or unsubstituted pyrrole, a substituted or unsubstituted thiopene, a substituted or unsubstituted furan, a substituted or unsubstituted imidazole, a substituted or unsubstituted pyrazole, a substituted or unsubstituted thiazole, a substituted or unsubstituted isothiazole, a substituted or unsubstituted oxazole, a substituted or unsubstituted isooxazole, a substituted or unsubstituted pyridine, a substituted or unsubstituted pyrazine, a substituted or unsubstituted pyrimidine, a substituted or unsubstituted pyridazine, a substituted or unsubstituted quinoline, a substituted or unsubstituted isoquinoline, a substituted or unsubstituted benzoquinoline, a substituted or unsubstituted quinoxaline, a substituted or unsubstituted quinazoline, a substituted or unsubstituted carbazole, a substituted or unsubstituted benzoimidazole, a substituted or unsubstituted benzofuran, a substituted or unsubstituted benzothiopene, a substituted or unsubstituted isobenzothiopene, a substituted or unsubstituted benzooxazole, a substituted or unsubstituted isobenzooxazole, a substituted or unsubstituted triazole, a substituted or unsubstituted oxadiazole, a substituted or unsubstituted triazine, a substituted or unsubstituted dibenzofuran, and a substituted or unsubstituted dibenzothiopene;

at least one substituent of the substituted benzene, the substituted naphthalene, the substituted fluorene, the substituted spiro-fluorene, the substituted indene, the substituted pyrrole, the substituted thiopene, the substituted furan, the substituted imidazole, the substituted pyrazole, the substituted thiazole, the substituted isothiazole, the substituted oxazole, the substituted isooxazole, the substituted pyridine, the substituted pyrazine, the substituted pyrimidine, the substituted pyridazine, the substituted quinoline, the substituted isoquinoline, the substituted benzoquinoline, the substituted quinoxaline, the substituted quinazoline, the substituted carbazole, the substituted benzoimidazole, the substituted benzofuran, the substituted benzothiopene, the substituted isobenzothiopene, the substituted benzooxazole, the substituted isobenzooxazole, the substituted triazole, the substituted oxadiazole, the substituted triazine, the substituted dibenzofuran, and the substituted dibenzothiopene may be selected from:

a deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group (non-aromatic condensed polycyclic group), a monovalent non-aromatic hetero-condensed polycyclic group, —N($Q_{401}$)($Q_{402}$), —Si($Q_{403}$)($Q_{404}$)($Q_{405}$), and -B($Q_{406}$)($Q_{407}$);

a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryloxy group; a $C_6$-$C_{60}$ arythio group; a $C_1$-$C_{60}$ heteroaryl group; and a non-aromatic condensed polycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic hetero-condensed polycyclic group, —N($Q_{411}$)($Q_{412}$), —Si($Q_{413}$)($Q_{414}$)($Q_{415}$), and -B($Q_{416}$)($Q_{417}$); and —N($Q_{421}$)($Q_{422}$); —Si($Q_{423}$)($Q_{424}$)($Q_{425}$) and -B($Q_{426}$)($Q_{427}$);

$L_{401}$ is an organic ligand;

xc1 is 1, 2, or 3; and xc2 is 0, 1, 2, or 3.

$L_{401}$ may be any one selected from a monovalent, a divalent, or a trivalent organic ligand. For example, $L_{401}$ may be a halogen ligand (for example, Cl or F), a diketone ligand (for example, acetylacetonate, 1,3-diphenyl-1,3-propanedionate, 2,2,6,6-tetramethyl-3,5-heptanedionate, and hexafluoroacetonate), carboxylic acid ligand (for example, picolinate, dimethyl-3-pyrazolecarboxylate, or benzoate), a carbon monoxide ligand, an isonitrile ligand, a cyano ligand, or a phosphorus ligand (for example, may be selected from phosphine and phosphite), but it is not limited thereto.

In Formula 401, when $A_{401}$ has two or more substituents, the two or more substituents of $A_{401}$ may be coupled to each other to form a saturated or an unsaturated ring.

In Formula 401, when $A_{402}$ has two or more substituents, the two or more substituents of $A_{402}$ may be coupled to each other to form a saturated or an unsaturated ring.

In Formula 401, when xc1 is two or greater, a plurality of ligands

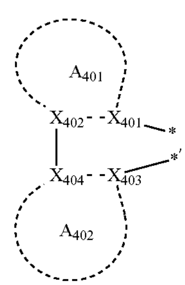

may be the same or different. In Formula 401, when xc1 is two or greater, $A_{401}$ and $A_{402}$ may be respectively connected to $A_{401}$ and $A_{402}$ of a neighboring ligand either directly or via a linking group (for example, a $C_1$-$C_5$ alkylene group or —N(R')— (wherein, R' is a $C_1$-$C_{10}$ alkyl group or a $C_6$-$C_{20}$ aryl group), or —C(═0)—) disposed therebetween.

The phosphorescent dopant may include at least one selected from Compounds PD1 to PD74, but it is not limited thereto:

PD1

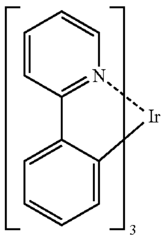

PD2

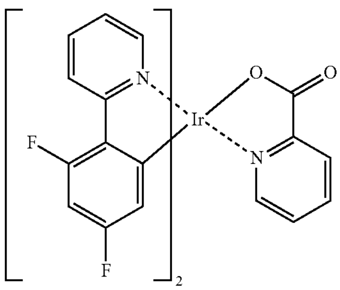

PD3

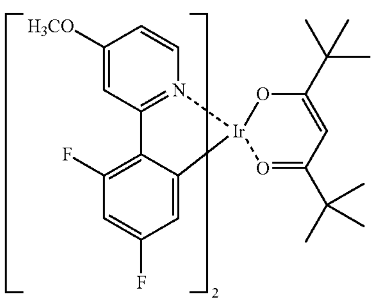

PD4

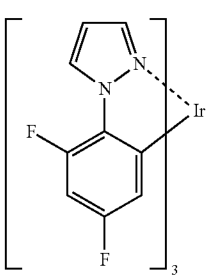

-continued

PD5

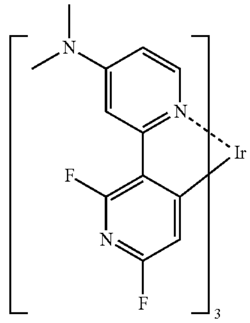

PD6

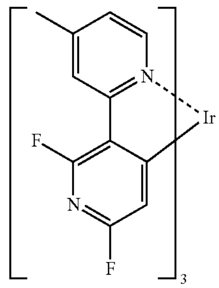

PD7

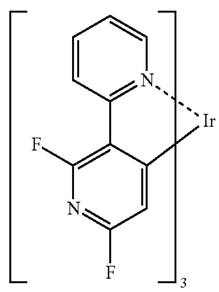

PD8

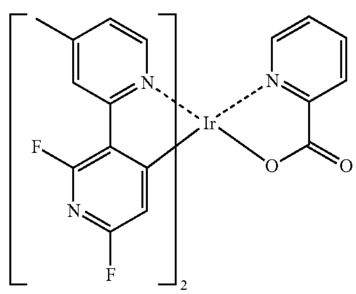

PD9

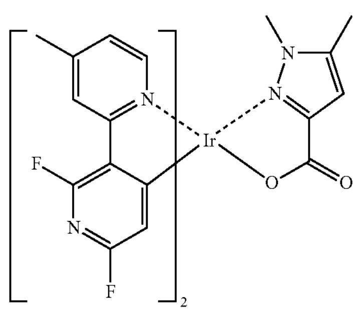

-continued
PD10
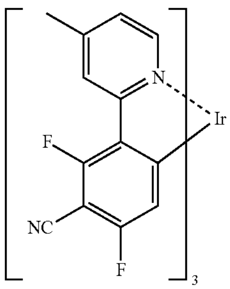
PD11
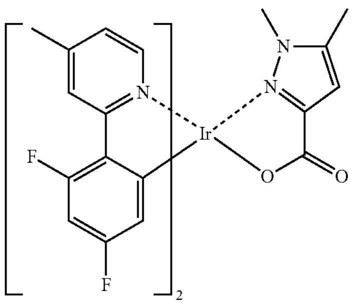
PD12
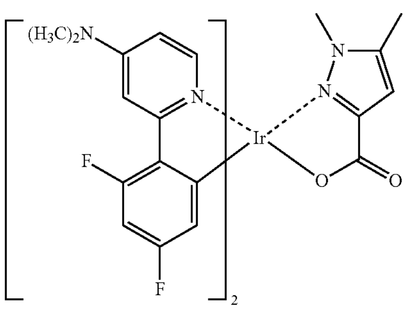
PD13
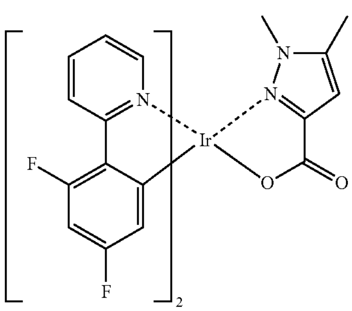
PD14
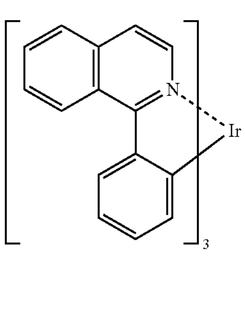
-continued
PD15
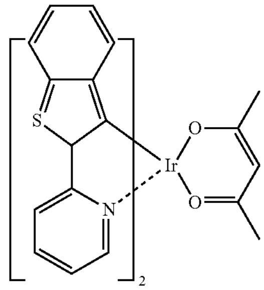
PD16
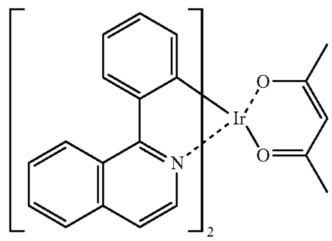
PD17
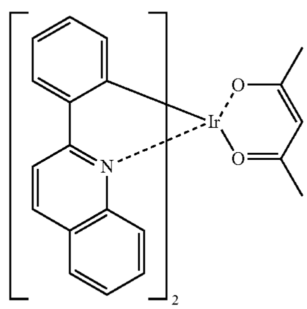
PD18
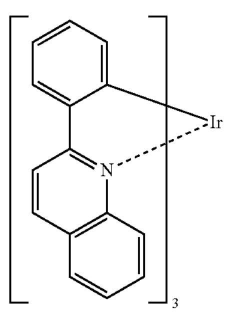
PD19
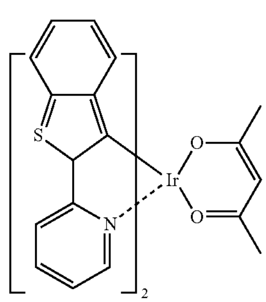

-continued
PD20
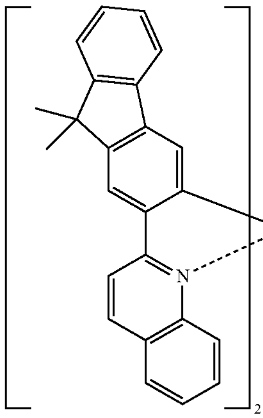
PD21
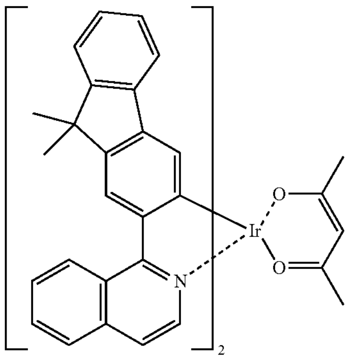
PD22
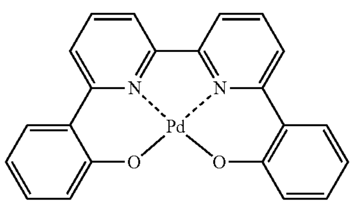
PD23
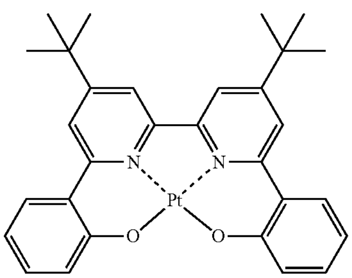
PD24
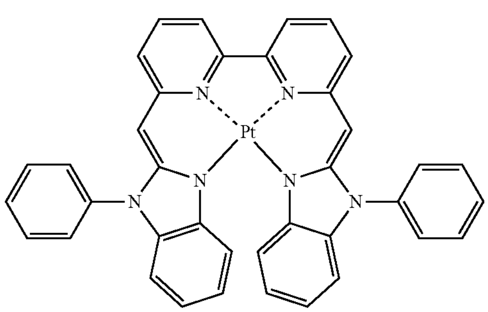
-continued
PD25
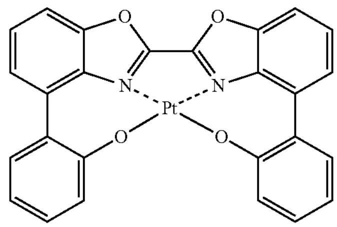
PD26
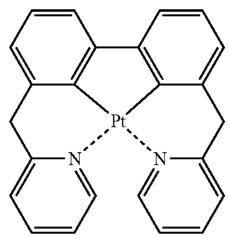
PD27
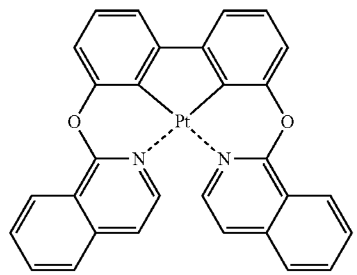
PD28
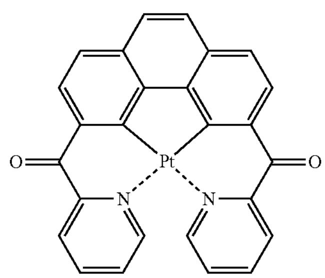
PD29
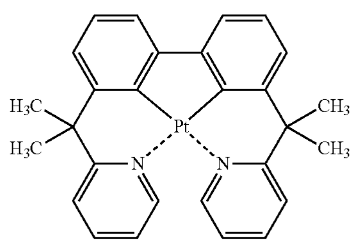
PD30
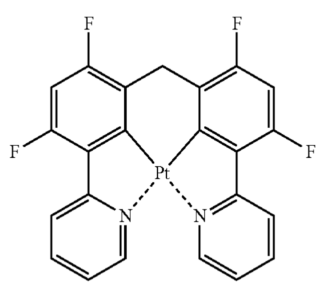

-continued
PD31
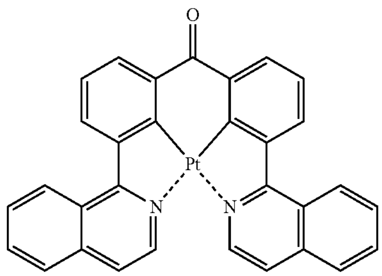
PD32
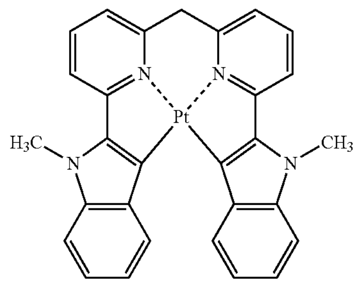
PD33
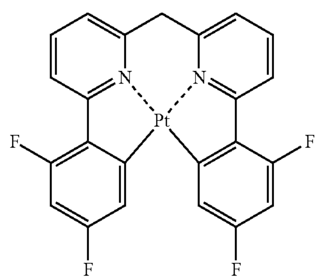
PD34
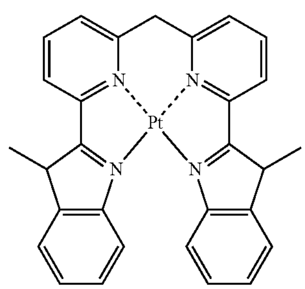
PD35
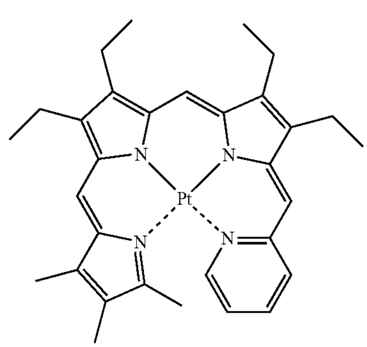
-continued
PD36
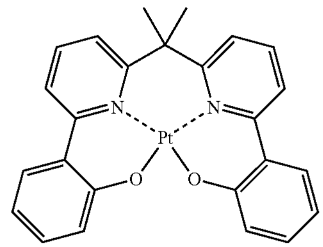
PD37
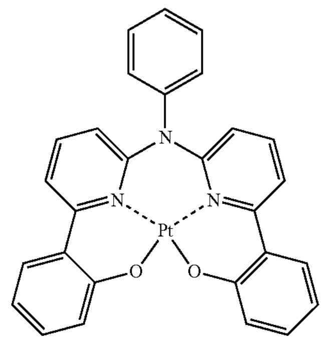
PD38
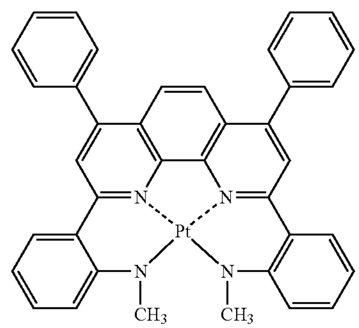
PD39
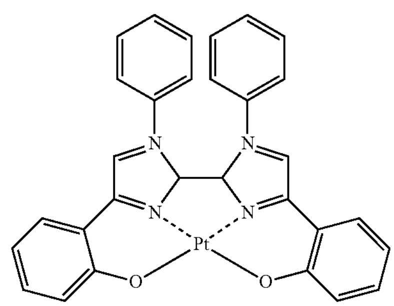
PD40
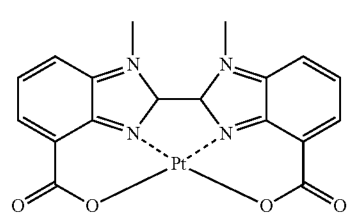
PD41
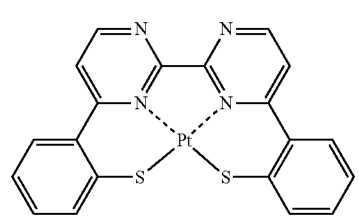

-continued
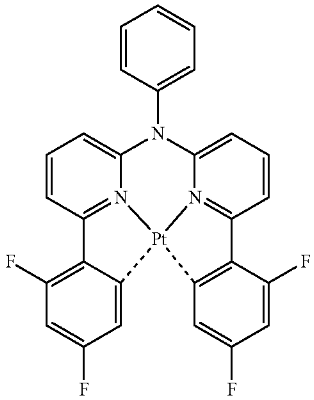
PD42
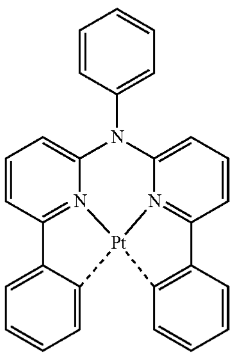
PD43
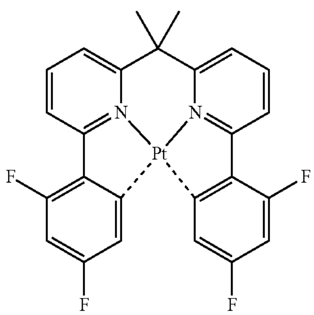
PD44
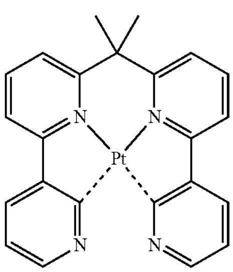
PD45
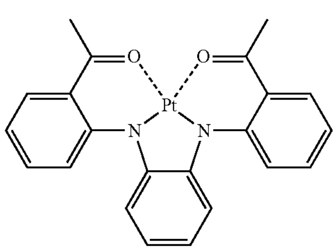
PD46
-continued
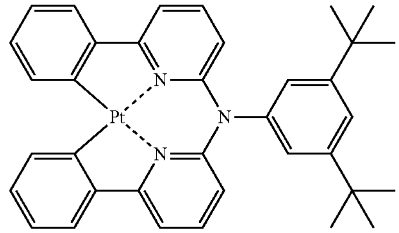
PD47
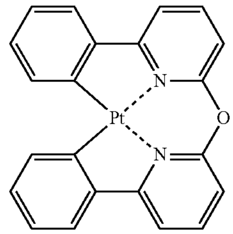
PD48
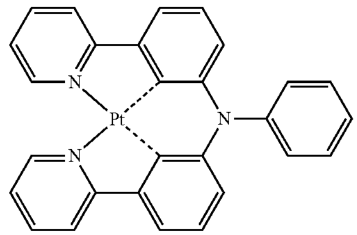
PD49
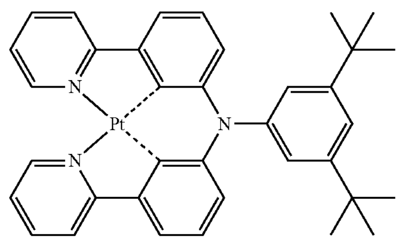
PD50
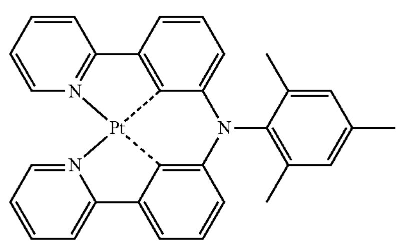
PD51
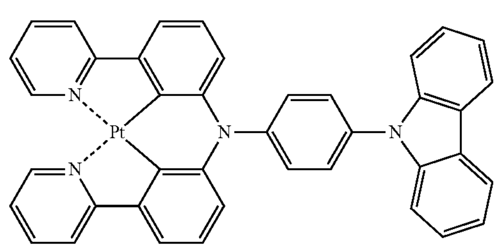
PD52

-continued
PD53
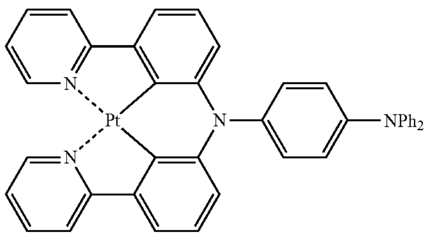
PD54
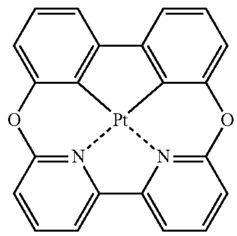
PD55
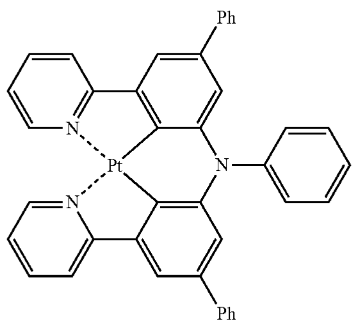
PD56
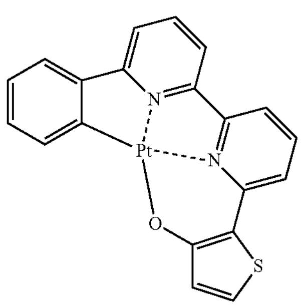
PD57
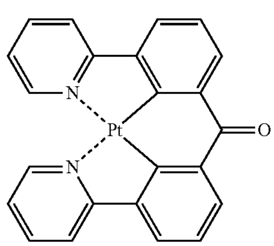
-continued
PD58
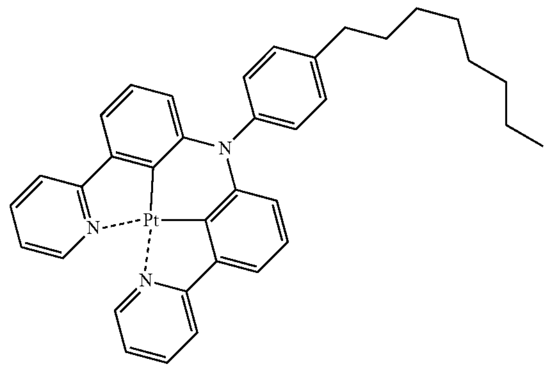
PD59
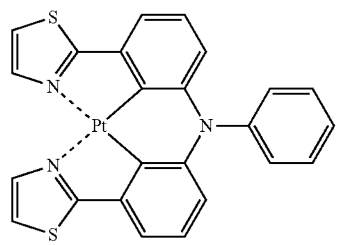
PD60
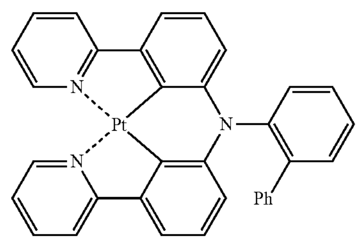
PD61
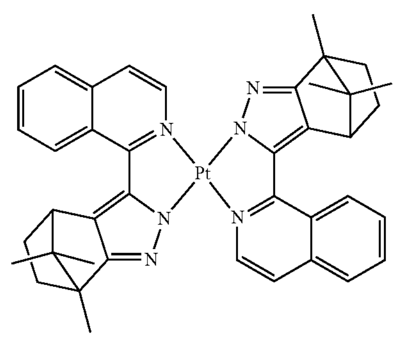
PD62
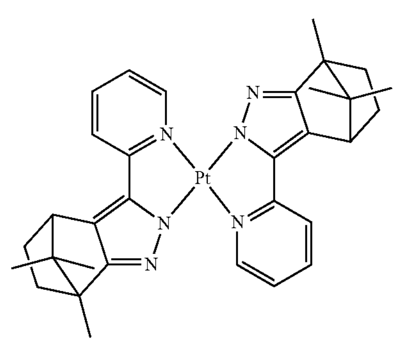

PD63
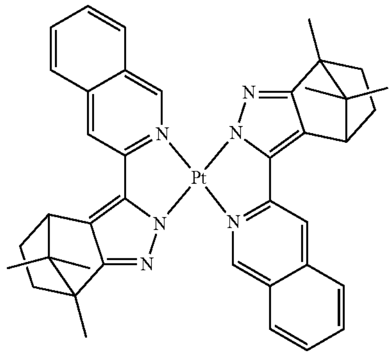
PD64
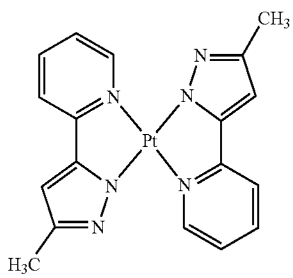
PD65
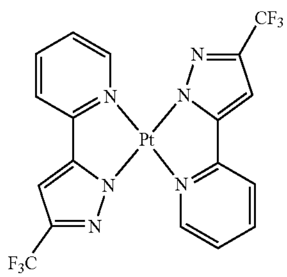
PD66
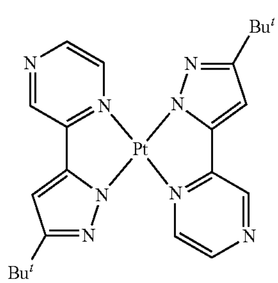
PD67
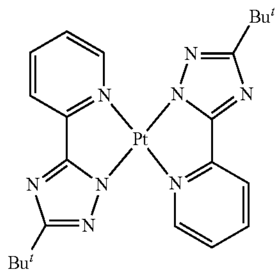
PD68
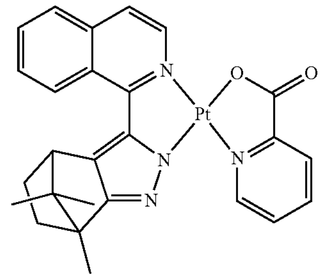
PD69
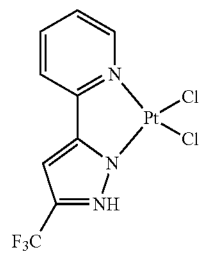
PD70
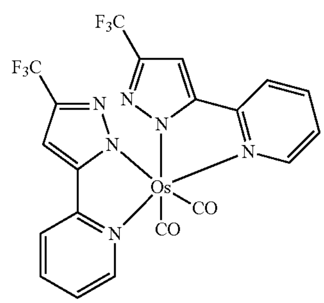
PD71
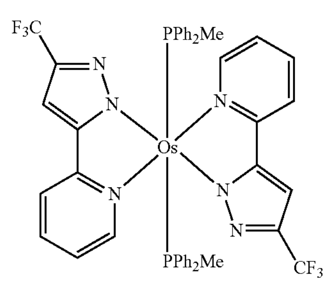
PD72
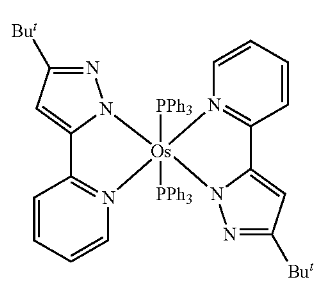

-continued
PD73
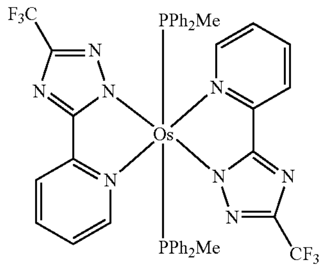
PD74
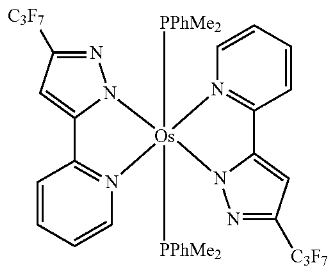
Alternatively, the phosphorescent dopant may include PtOEP below:
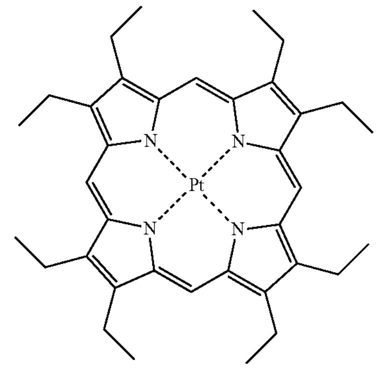
PtOEP
The fluorescent dopant may include at least one selected from DPAVBi, BDAVBi, TBPe, DCM, DCJTB, Coumarin 6, and C545T.
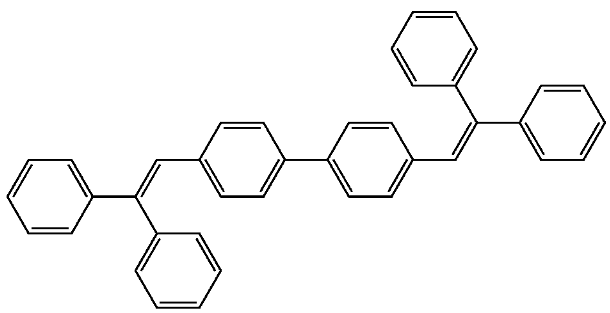
DPVBi
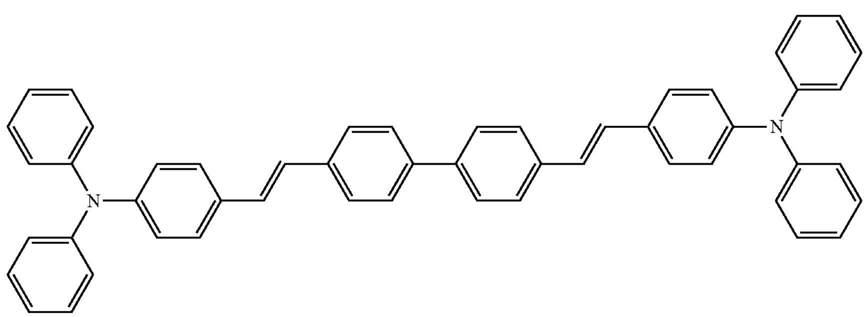
DPABi
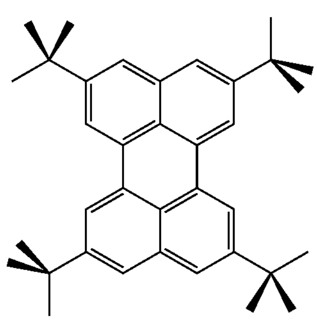
TBPe
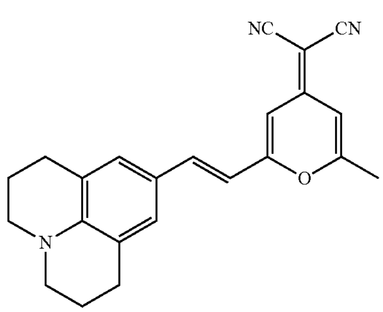
DCM
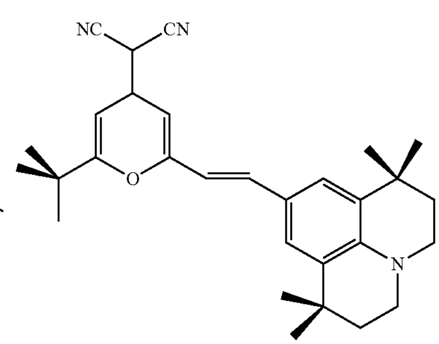
DCJTB -continued

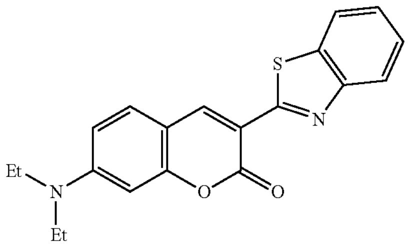
Coumarin 6

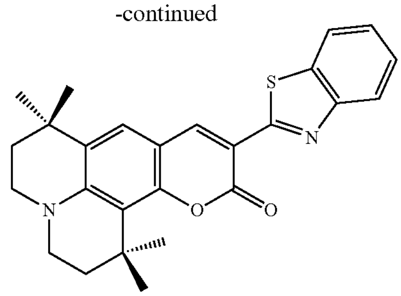
C545T

Alternatively, the fluorescent dopant may include a compound represented by Formula 501 below:

Formula 501

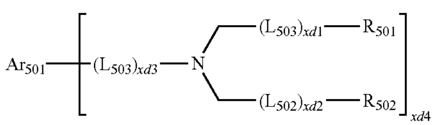

In Formula 501, $Ar_{501}$ may be selected from a naphthalene; a heptalene; a fluorene; a spiro-fluorene; a benzofluorene; a dibenzofluorene; a phenalene; a phenanthrene; an anthracene; a fluoranthene; a triphenylene; a pyrene; a chrysene; a naphthacene; a picene; a perylene; a pentaphene; and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group, and —Si($Q_{501}$)($Q_{502}$)($Q_{503}$) (wherein, $Q_{501}$ to $Q_{503}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

the descriptions of $L_{501}$ to $L_{503}$ are the same as the description of $L_{201}$ in the present specification;

$R_{501}$ and $R_{502}$ may be each independently selected from a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; a carbazole group; a triazinyl group; a dibenzofuranyl group; and a dibenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group and a dibenzofuranyl group, and a dibenzothiophenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group;

xd1 to xd3 may be each independently 0, 1, 2, or 3; and xb4 may be 1, 2, 3, or 4.

The fluorescent dopant may include at least one selected from Compounds FD1 to FD8 below:

FD1

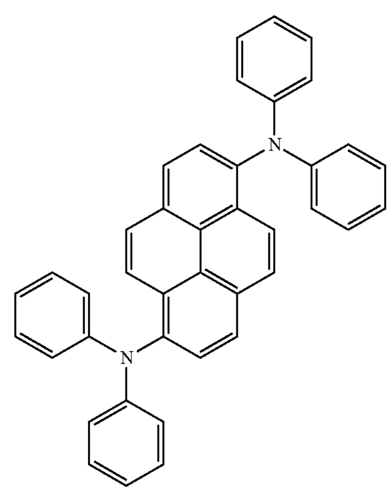

-continued
FD2
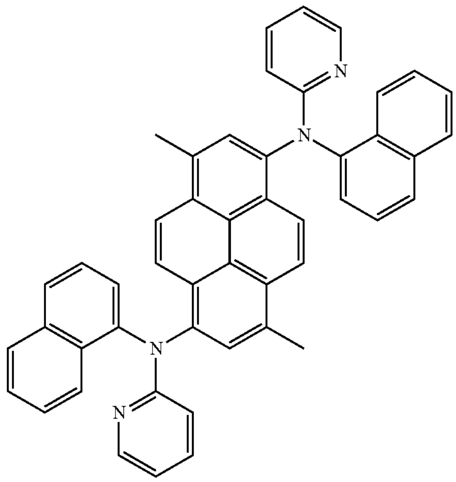
FD3
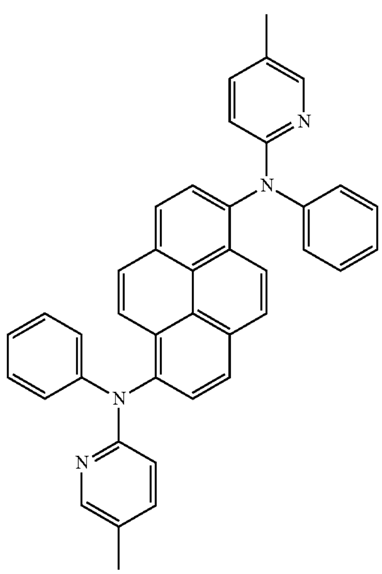
-continued
FD4
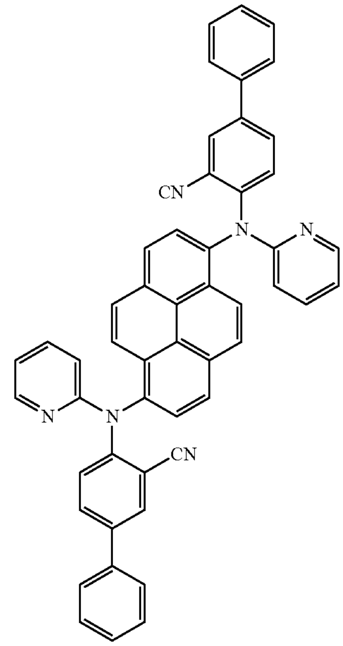
FD5
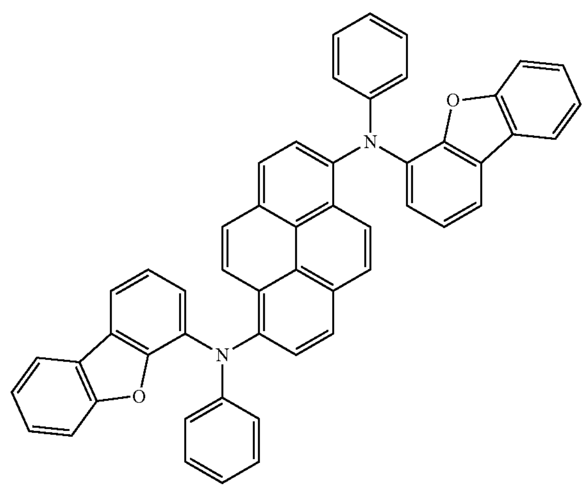
FD6
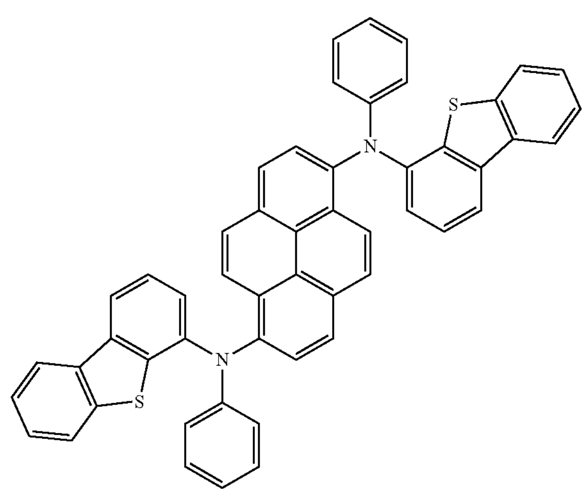

-continued

FD7

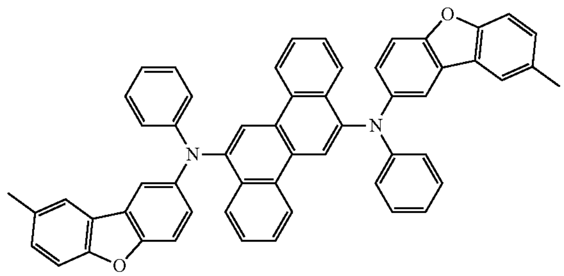

FD8

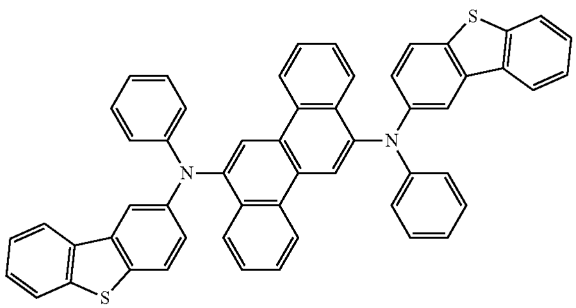

An amount of the dopant in the EML may be about 0.01 parts by weight to about 15 parts by weight based on 100 parts by weight of the host, but it is not limited thereto.

A thickness of the EML may be about 100 Å to about 1000 Å, for example, about 200 Å to about 600 Å. When the thickness of the EML is in the range described above, the EML may have excellent light emitting ability without a substantial increase in driving voltage.

A mixed layer may be disposed on the EML. The mixed layer may be formed on the EML using various suitable methods such as vacuum deposition, spin coating, casting, LB, inkjet printing, laser printing, or LITI. When the mixed layer is formed by vacuum deposition or spin coating, the deposition and coating conditions may be similar to those for forming the HIL, though the deposition and coating conditions may vary according to a compound that is used to form the mixed layer.

As described above, the mixed layer may include a first material and a second material, wherein the first material and the second material may each be a pyrrolidine-based compound, and triplet energy $Eg_{T1}$ of at least one of the first material and the second material may be 2.2 eV or greater.

A thickness of the mixed layer may be about 5 Å to about 400 Å, for example, about 50 Å to about 300 Å. When the thickness of the mixed layer is in the range described above, satisfactory device characteristics may be obtained without substantial increase in driving voltage.

For example, amounts of the first material and the second material may have a weight ratio of about 10:1 to about 1:10, but it is not limited thereto. In another embodiment, amounts of the first material and the second material may have a weight ratio of 50:50, but it is not limited thereto.

Then, the electron transport region may be disposed on the mixed layer.

The electron transport region may include at least one of the HBL, the ETL, and the EIL, but it is not limited thereto.

For example, the electron transport region may have a structure in which the ETL/EIL or HBL/ETL/EIL are sequentially layered on the emission layer, but it is not limited thereto.

According to an embodiment, the organic layer 150 of the organic light-emitting device includes an electron transport region disposed between the EML and the second electrode 190. The electron transport region may include at least one of the ETL and the EIL.

The ETL may include at least selected from BCP, Bphen, and $Alq_3$, Balq, TAZ, and NTAZ (some of which are illustrated below).

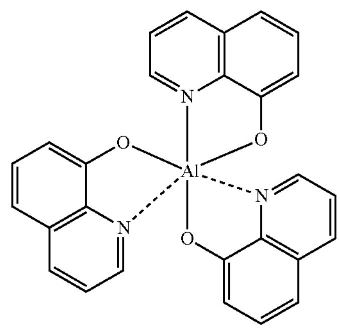

$Alq_3$

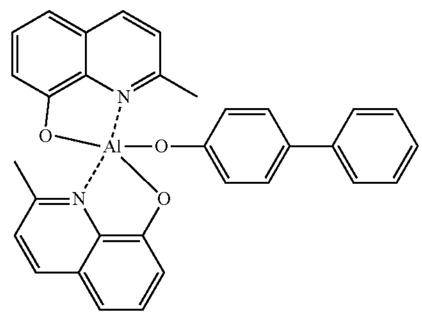

BAlq

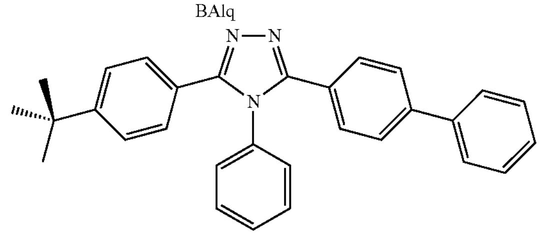

TAZ

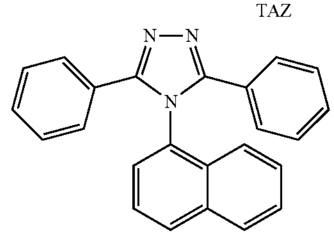

NTAZ

Alternatively, the ETL may include at least one compound selected from the compounds represented by Formula 601 below and the compounds represented by Formula 602 below:

$$Ar_{601}\text{-}[(L_{601})_{xe1}\text{-}E_{601}]_{xe2} \quad \text{Formula 601}$$

In Formula 601, $Ar_{601}$ may be selected from a naphthalene; a heptalene; a fluorene; a spiro-fluorene; a benzofluorene; a dibenzofluorene; a phenalene; a phenanthrene; an anthracene; a fluoranthene; a triphenylene; a pyrene; a chrysene; a naphthacene; a picene; a perylene; a pentaphene; and an indenoanthracene;

a naphthalene, a heptalene, a fluorene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group, and —Si($Q_{301}$)($Q_{302}$)($Q_{303}$) (wherein, $Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

the description of $L_{601}$ may be the same as the description of $L_{201}$;

$E_{601}$ may be selected from a pyrrolyl group; a thiophenyl group; a furanyl group; an imidazolyl group; a pyrazolyl group; a thiazolyl group; an isothiazolyl group; an oxazolyl group; an isooxazolyl group; a pyridinyl group; a pyrazinyl group; a pyrimidinyl group; a pyridazinyl group; an isoindolyl group; an indolyl group; an indazolyl group; a purinyl group; a quinolinyl group; an isoquinolinyl group; a benzoquinolinyl group; a phthalazinyl group; a naphthyridinyl group; a quinoxalinyl group; a quinazolinyl group; a cinnolinyl group; a carbazolyl group; a phenanthridinyl group; an acridinyl group; a phenanthrolinyl group; a phenazinyl group; a benzoimidazolyl group; a benzofuranyl group; a benzothiophenyl group; an isobenzothiazolyl group; a benzooxazolyl group; an isobenzooxazolyl group; a triazolyl group; a tetrazolyl group; an oxadiazolyl group; a triazinyl group; a dibenzofuranyl group; a dibenzothiophenyl group; a benzocarbazolyl group; a dibenzocarbazolyl group; a thiadiazolyl group; an imidazopyridinyl group; and an imidazopyrimidinyl group; and a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, an imidazopyridinyl group, and an imidazopyrimidinyl group;

xe1 may be 0, 1, 2, or 3; and xe2 may be 1, 2, 3, or 4.

Formula 602

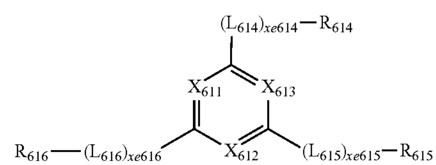

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one of $X_{611}$ to $X_{613}$ may be N;

the description for each of $L_{611}$ to $L_{616}$ is the same as the description of $L_{201}$;

$R_{611}$ to $R_{616}$ may be each independently selected from a phenyl group; a naphthyl group; a fluorenyl group; a spiro-fluorenyl group; a benzofluorenyl group; a dibenzofluorenyl group; a phenanthrenyl group; an anthracenyl group; a pyrenyl group; a chrysenyl group; a pyridinyl group; a pyrazinyl group; a pyrimidinyl group; a pyridazinyl group; a quinolinyl group; an isoquinolinyl group; a quinoxalinyl group; a quinazolinyl group; a carbazolyl group; and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently 0, 1, 2, or 3.

The compound represented by Formula 601 and the compound represented by Formula 602 may be selected from Compounds ET1 to ET15 below:

ET1

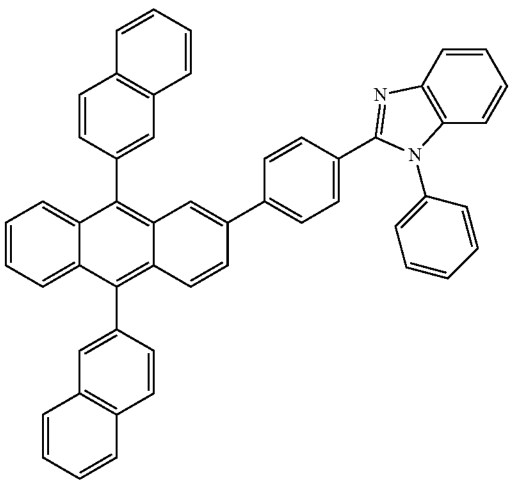

ET2

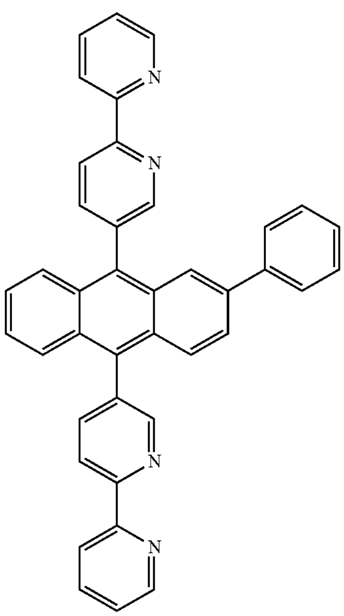

-continued

ET3

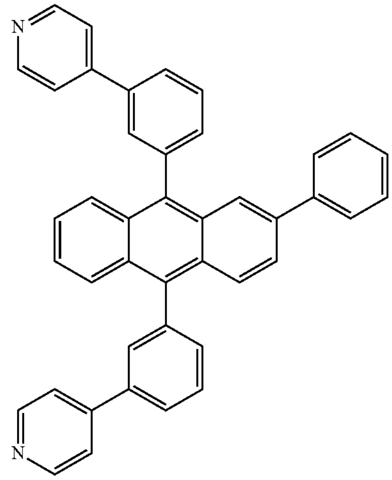

ET4

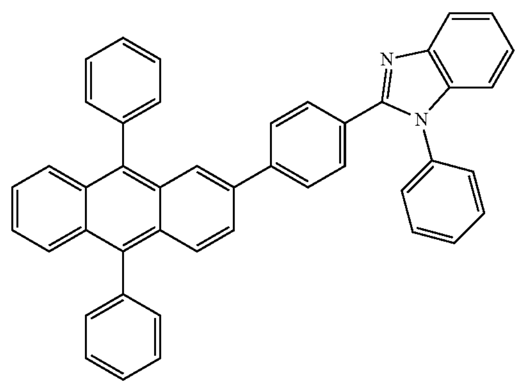

ET5

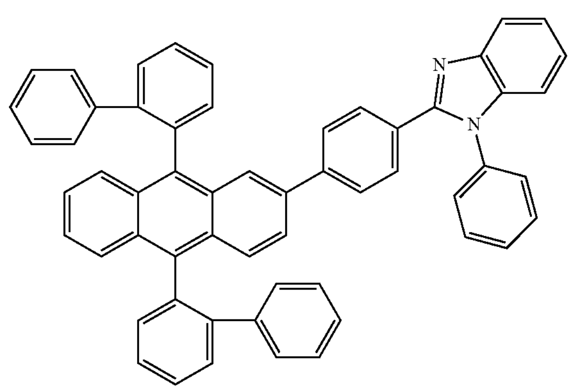

-continued
ET6
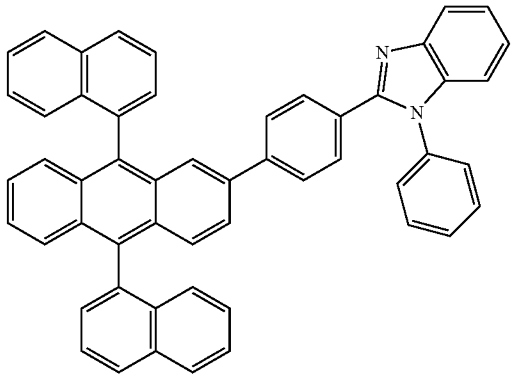
ET7
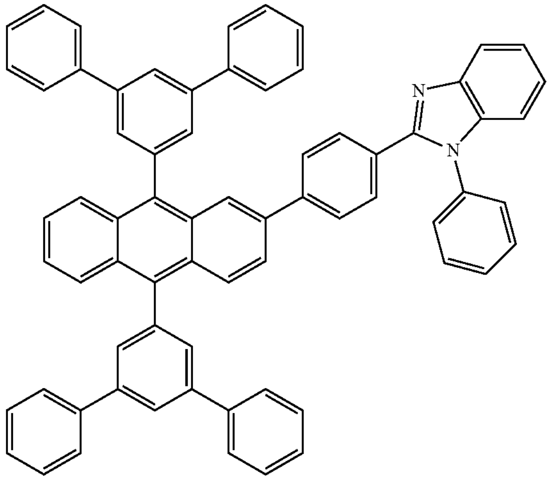
ET8
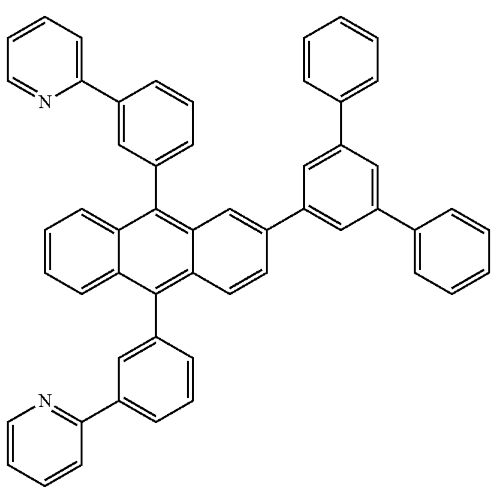
-continued
ET9
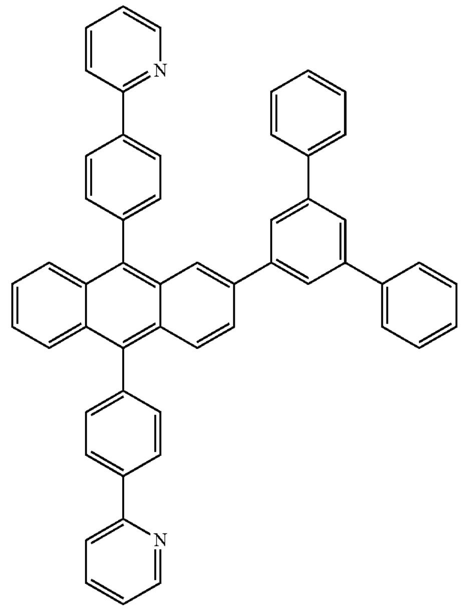
ET10
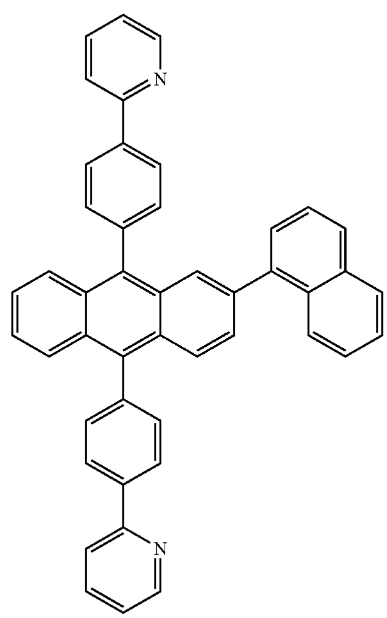

-continued

ET11

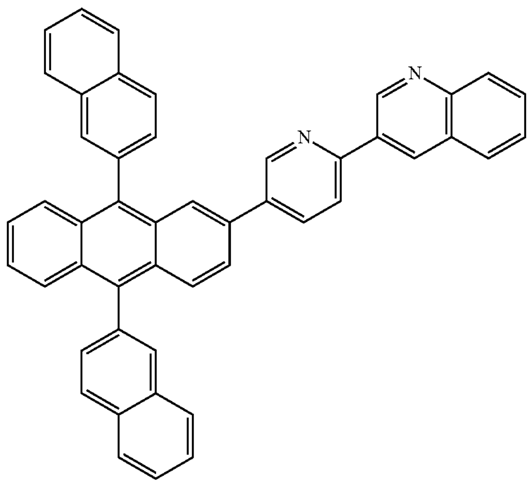

ET12

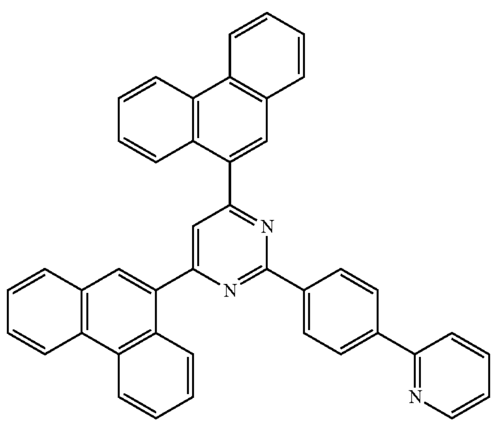

ET13

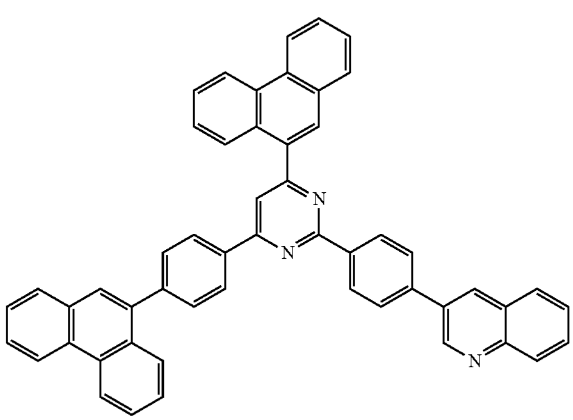

-continued

ET14

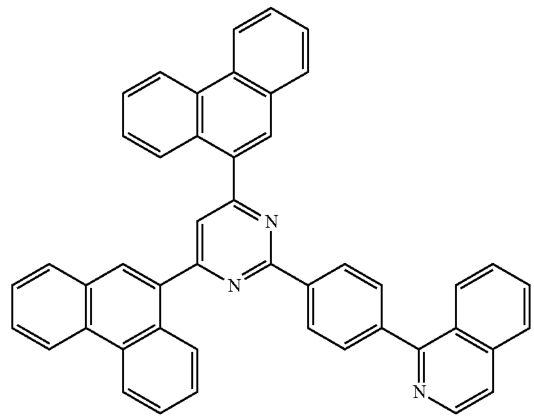

ET15

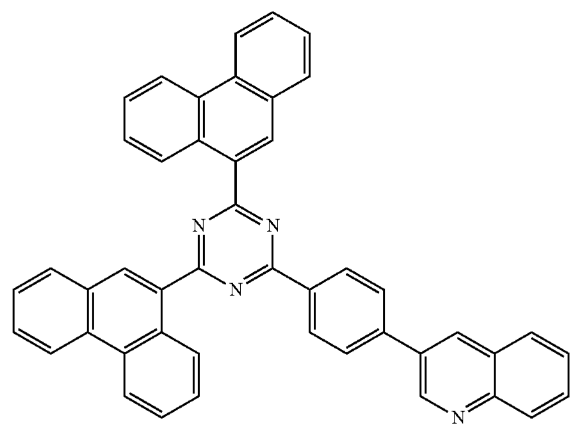

A thickness of the ETL may be about 100 Å to about 1000 Å, for example, about 150 Å to about 500 Å. When the thickness of the ETL is within the range described above, the ETL may have satisfactory electron transport characteristics without substantial increase in driving voltage.

The ETL may further include a metal-containing material in addition to the material described above.

The metal-containing material may include a Li complex. The Li complex may, for example, include compounds ET-D1 (lithium quinolate: LiQ) or ET-D2 illustrated below.

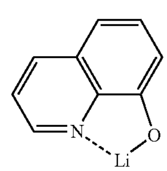

ET-D1

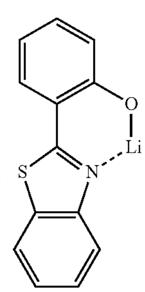

ET-D2

The electron transport region may include an HBL. When the EML includes a phosphorescent dopant, the HBL may be formed to reduce or prevent diffusion of triplet excitons or holes into the ETL.

When the electron transport region includes the HBL, the HBL may be formed on the EML using various suitable methods such as vacuum deposition, spin coating, casting, LB, inkjet printing, laser printing, or LITI. When the HBL is formed by vacuum deposition or spin coating, the deposition and coating conditions may be similar to those for forming the HIL, though the deposition and coating conditions may vary according to a compound that is used to form the HBL.

The HBL may include, for example, at least one of BCP and Bphen below, but it is not limited thereto.

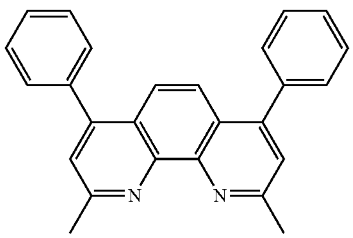

BCP

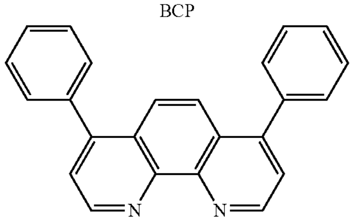

Bphen

A thickness of the HBL may be from about 20 Å to about 1,000 Å, and in some embodiments, may be from about 30 Å to about 300 Å. When the thickness of the HBL is within these ranges, the HBL may have a hole blocking transporting ability without a substantial increase in driving voltage.

Then, the ETL may be formed on the EML by various suitable methods such as vacuum deposition, spin coating, casting, LB, inkjet printing, laser printing, or LITI. When the ETL is formed by vacuum deposition or spin coating, the deposition and coating conditions may be similar to those for forming the HIL, though the deposition and coating conditions may vary according to a compound that is used to form the ETL.

The electron transport region may include the ETL that facilitates injection of electrons from the second electrode 190.

The EIL may be formed on the ETL using various suitable methods such as vacuum deposition, spin coating, casting, LB, inkjet printing, laser printing, or LITI. When the EIL is formed by vacuum deposition or spin coating, the deposition and coating conditions may be similar to those for forming the HIL.

The EIL may include at least one selected from LiF, NaCl, CsF, $Li_2O$, BaO, and LiQ.

A thickness of the EIL may be about 1 Å to about 100 Å, or about 3 Å to about 90 Å. When the thickness of the EIL is within the range described above, satisfactory electron injection characteristics may be obtained without substantial increase in driving voltage.

The second electrode 190 is disposed on the organic layer 150 described above. The second electrode 190 may be a cathode, which is an electron injection electrode, in which a material for the second electrode 190 may be a metal, an alloy, an electroconductive compound, or a mixture thereof having a low work function. Detailed examples of the material for the second electrode 190 include lithium (Li), magnesium (Mg), aluminum (Al), aluminum-lithium (Al—Li), calcium (Ca), magnesium-indium (Mg—In), and magnesium-silver (Mg—Ag). Alternatively, ITO, IZO, or the like may be used as the material for the second electrode 190. The second electrode 190 may be a reflective electrode, a transflective electrode, or a transmissive electrode.

Meanwhile, the organic layer of the organic light-emitting device according to an embodiment of the present invention may be formed by a deposition method using a compound according to an embodiment of the present invention, or may be formed by a wet method in which a compound prepared as a solution according to an embodiment is coated.

An organic light-emitting device according to an embodiment of the present invention may be provided in various flat display devices, for example, passive matrix organic light-emitting devices or active matrix organic light-emitting devices.

For example, when the organic light-emitting device is provided in the active matrix organic light-emitting device, a first electrode provided on a substrate may be electrically connected to a source electrode or a drain electrode of a thin film transistor as a pixel electrode. Also, the organic light-emitting device may be provided in a flat display device that can display images on both sides.

Hereinabove, the organic light-emitting device was described with reference to the drawing, but it is not limited thereto.

As used herein, the $C_1$-$C_{60}$ alkyl group refers to a linear or branched $C_1$-$C_{60}$ hydrocarbon monovalent group, and detailed examples thereof include a methyl group, an ethyl group, a propyl group, an isobutyl group, a sec-butyl group, a tert-butyl group, a pentyl group, an iso-amyl group, and a hexyl group. As used herein, the $C_1$-$C_{60}$ alkylene group refers to a divalent group having the same structure as the $C_1$-$C_{60}$ alkyl group.

As used herein, the $C_1$-$C_{60}$ alkoxy group refers to a monovalent group represented by the Formula $-OA_{101}$ (wherein, $A_{101}$ is the $C_1$-$C_{60}$ alkyl group), and detailed examples thereof include a methoxy group, an ethoxy group, and an isopropyloxy group.

As used herein, the $C_2$-$C_{60}$ alkenyl group (or $C_2$-$C_{60}$ alkenyl group) refers to a $C_2$-$C_{60}$ alkyl group having one or more carbon-carbon double bonds at a center or end thereof. Examples of the unsubstituted $C_2$-$C_{60}$ alkenyl group are ethenyl, propenyl, and butenyl. As used herein, the $C_2$-$C_{60}$ alkenylene group refers to a divalent group having the same structure as the $C_2$-$C_{60}$ alkenyl group.

As used herein, the $C_2$-$C_{60}$ alkynyl group (or $C_2$-$C_{60}$ alkynyl group) refers to an unsubstituted $C_2$-$C_{60}$ alkyl group having one or more carbon-carbon triple bonds at a center or end thereof. Examples of the $C_2$-$C_{60}$ alkynyl group are ethynyl, propynyl, and the like. As used herein, the $C_2$-$C_{60}$ alkynylene group refers to a divalent group having the same structure as the $C_2$-$C_{60}$ alkynyl group.

As used herein, the $C_3$-$C_{10}$ cycloalkyl group refers to a $C_3$-$C_{10}$ monovalent hydrocarbon monocyclic group, and detailed examples thereof include a cyclopropyl group, a cyclobutyl group, a cyclopentyl group, a cyclohexyl group, and a cycloheptyl group. As used herein, the $C_3$-$C_{10}$ cycloalkylene group refers to a divalent group having the same structure as the $C_3$-$C_{10}$ cycloalkyl group.

As used herein, the $C_1$-$C_{10}$ heterocycloalkyl group refers to a $C_1$-$C_{10}$ monovalent monocyclic group including at least one selected from N, O, P, and S as a ring-forming atom, and detailed examples thereof include a tetrahydrofuranyl group and a tetrahydrothiophenyl group. As used herein, the $C_1$-$C_{10}$ heterocycloalkylene group refers to a divalent group having the same structure as the $C_1$-$C_{10}$ heterocycloalkyl group.

As used herein, the $C_3$-$C_{10}$ cycloalkenyl group refers to a $C_3$-$C_{10}$ monovalent monocyclic group having at least one double bond in a ring but without aromaticity, and detailed examples thereof include a cyclopentenyl group, a cyclohexenyl group, and a cycloheptenyl group. As used herein, the $C_3$-$C_{10}$ cycloalkenylene group refers to a divalent group having the same structure as the $C_3$-$C_{10}$ cycloalkenyl group.

As used herein, the $C_1$-$C_{10}$ heterocycloalkenyl group is a $C_1$-$C_{10}$ monovalent monocyclic group including at least one selected from N, O, P, and S as a ring-forming atom, and includes at least one double bond in the ring. Detailed examples of the $C_2$-$C_{10}$ heterocycloalkenyl group include a 2,3-hydrofuranyl group, and a 2,3-hydrothiophenyl group. As used herein, the $C_1$-$C_{10}$ heterocycloalkenylene group is a divalent group having the same structure as the $C_1$-$C_{10}$ heterocycloalkenyl group.

As used herein, the $C_6$-$C_{60}$ aryl group is a $C_6$-$C_{60}$ monovalent group having a carbocyclic aromatic system, and the $C_6$-$C_{60}$ arylene group refers to a divalent group having a $C_6$-$C_{60}$ carbocyclic aromatic system. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include two or more rings, the two or more rings may be fused to each other.

As used herein, the $C_1$-$C_{60}$ heteroaryl group refers to a monovalent group having a $C_2$-$C_{60}$ carbocyclic aromatic system including at least one heteroatom selected from N, O, P, and S as a ring-forming atom, and the $C_1$-$C_{60}$ heteroarylene group refers to a divalent group having a $C_1$-$C_{60}$ carbocyclic aromatic system including at least one heteroatom selected from N, O, P, and S. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group include two or more rings, the two or more rings may be fused to each other.

As used herein, the $C_6$-$C_{60}$ aryloxy group refers to a functional group represented by $-OA_{102}$ (wherein, $A_{102}$ is the $C_6$-$C_{60}$ aryl group), and the $C_6$-$C_{60}$ arythio group refers to a functional group represented by $-SA_{103}$ (wherein, $A_{103}$ is the $C_6$-$C_{60}$ aryl group).

As used herein, the monovalent non-aromatic condensed polycyclic group refers to a monovalent group having two or more rings that are fused to each other, including only carbon as a ring forming atom (for example, carbon numbers may be 8 to 60), wherein the entire molecule does not have aromacity. Examples of the non-aromatic condensed polycyclic group include a fluorenyl group or the like. As used herein, the divalent non-aromatic condensed polycyclic group may refer to a divalent group having the same structure as the monovalent non-aromatic condensed polycyclic group.

As used herein, the monovalent non-aromatic hetero-condensed polycyclic group refers to a monovalent group having two or more rings that are fused to each other, including a heteroatom selected from N, O, P, and S as a ring-forming atom, in addition to carbon atoms (for example, carbon numbers may be 2 to 60), wherein the entire molecule does not have aromaticity. Detailed examples of the monovalent non-aromatic hetero-condensed polycyclic group include a carbazolyl group or the like. As used herein, the divalent non-aromatic hetero-condensed polycyclic group refers to a divalent group having the same structure as the monovalent non-aromatic hetero-condensed polycyclic group.

Hereinafter, an organic light-emitting device according to an embodiment of the present invention is described in greater detail, but the present invention is not limited to the embodiments below.

EXAMPLE 1-1

An ITO glass substrate was cut into a size of 50 mm×50 mm×0.5 mm, which was ultrasonically cleaned in acetone, isopropyl alcohol, and pure water for 15 minutes each, and then UV ozone cleaned for 30 minutes.

HTM was vacuum deposited on the substrate in a thickness of 1200 Å to form an HTL. Thereafter, MADN and BD were vacuum deposited on the HTL at a weight ratio of 95:5 and in a thickness of 300 Å to form an EML. Thereafter, BF1 and BF3 were vacuum deposited on the EML at a weight ratio of 50:50 and in a thickness of 200 Å to form a mixed layer.

Thereafter, Alq3 was vacuum deposited on the mixed layer in a thickness of 200 Å to form an ETL. LiF was vacuum deposited on the ETL in a thickness of 10 Å to form an EIL. Al was vacuum deposited on the EIL in a thickness of 2000 Å to manufacture an organic light-emitting device.

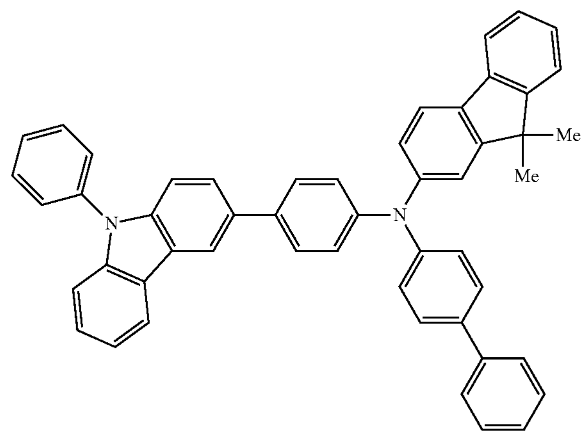

HTM

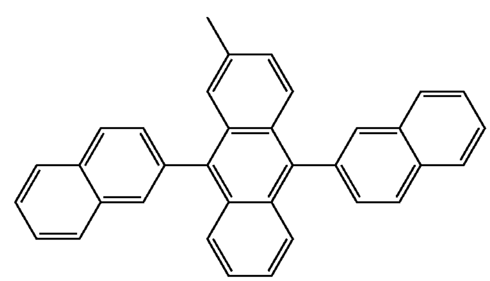

MADN

-continued

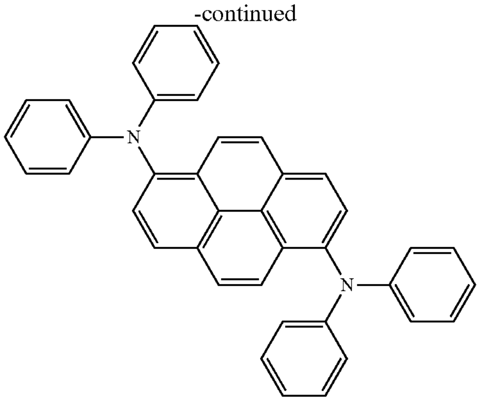

BD

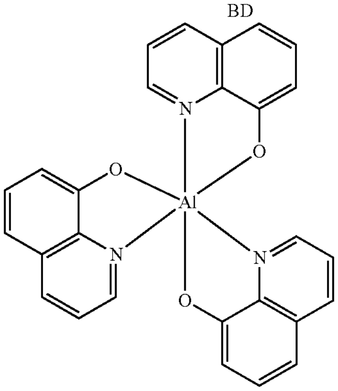

Alq3

BF1

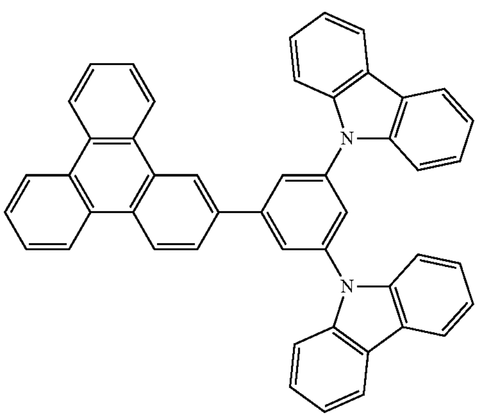

BF3

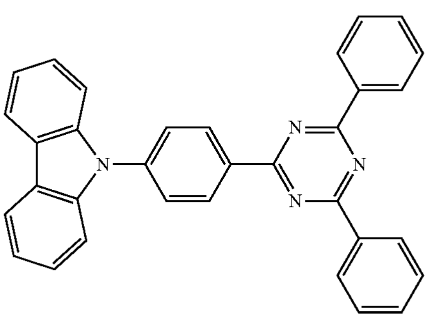

EXAMPLES 1-2 TO 1-27

An organic light-emitting device was manufactured in the same manner as in Example 1-1, except that the mixed layer was changed to the compounds disclosed in Table 1 below.

COMPARATIVE EXAMPLES 1 to 3

An organic light-emitting device was manufactured in the same manner as in Example 1-1, except that the mixed layer was changed to the compounds disclosed in Table 1 below.

TABLE 1

| | Mixed layer | | Mixed layer |
|---|---|---|---|
| Example 1-1 | BF1 + BF3 | Example 1-15 | BF2 + BF5 |
| Example 1-2 | BF1 + BF4 | Example 1-16 | BF2 + BF6 |
| Example 1-3 | BF1 + BF5 | Example 1-17 | BF2 + BF9 |
| Example 1-4 | BF1 + BF6 | Example 1-18 | BF5 + BF3 |
| Example 1-5 | BF1 + BF7 | Example 1-19 | BF5 + BF4 |
| Example 1-6 | BF1 + BF8 | Example 1-20 | BF5 + BF6 |
| Example 1-7 | BF1 + BF9 | Example 1-21 | BF5 + BF7 |
| Example 1-8 | BF1 + BF10 | Example 1-22 | BF5 + BF9 |
| Example 1-9 | BF1 + BF11 | Example 1-23 | BF13 + BF3 |
| Example 1-10 | BF1 + BF12 | Example 1-24 | BF13 + BF4 |
| Example 1-11 | BF1 + BF13 | Example 1-25 | BF13 + BF6 |
| Example 1-12 | BF2 + BF3 | Example 1-26 | BF13 + BF7 |
| Example 1-13 | BF2 + BF4 | Example 1-27 | BF13 + BF9 |
| Example 1-14 | BF2 + BF7 | | |
| Comparative Example 1 | Alq3 | | |
| Comparative Example 2 | BF1 | | |
| Comparative Example 3 | BF8 | | |

BF1

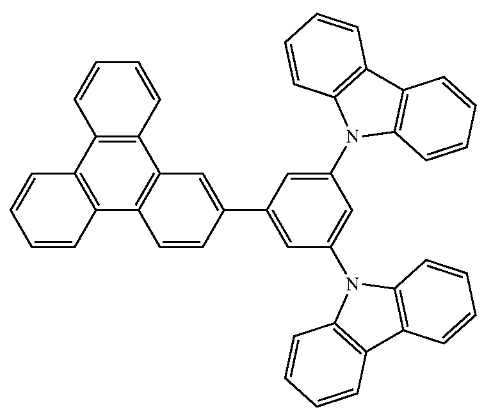

BF2

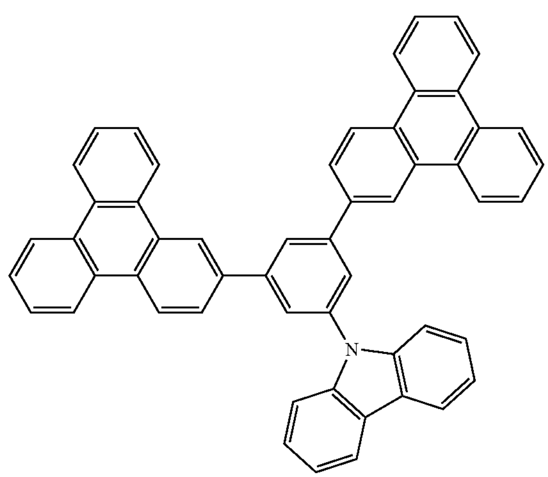

-continued
BF3
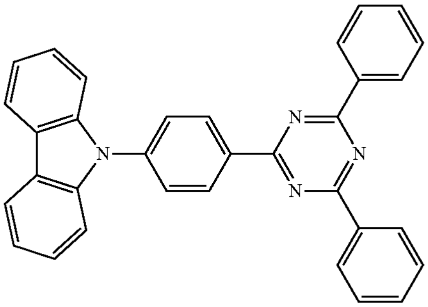
BF4
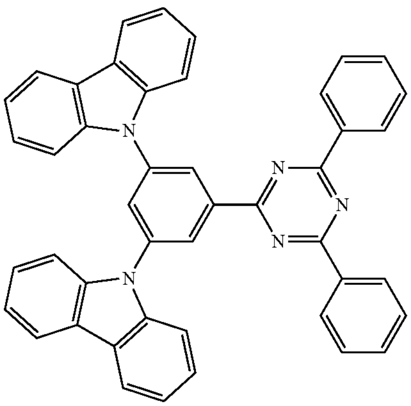
BF5
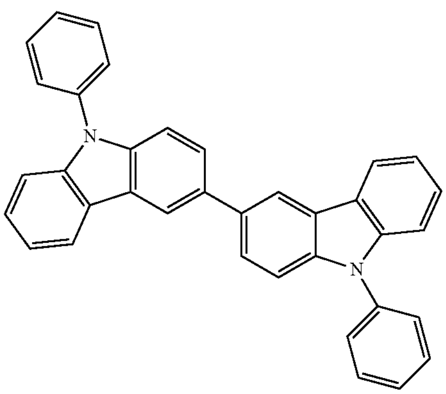
BF6
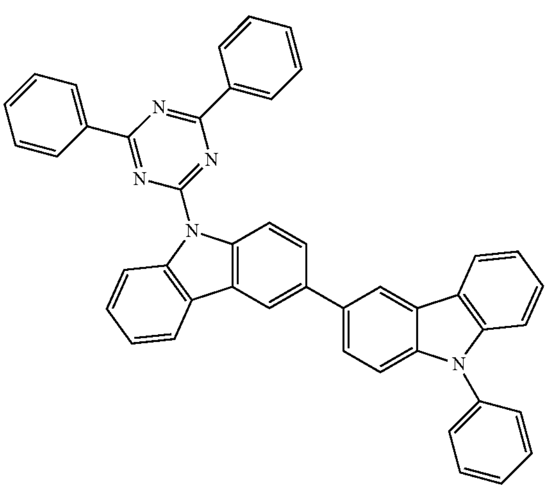
-continued
BF7
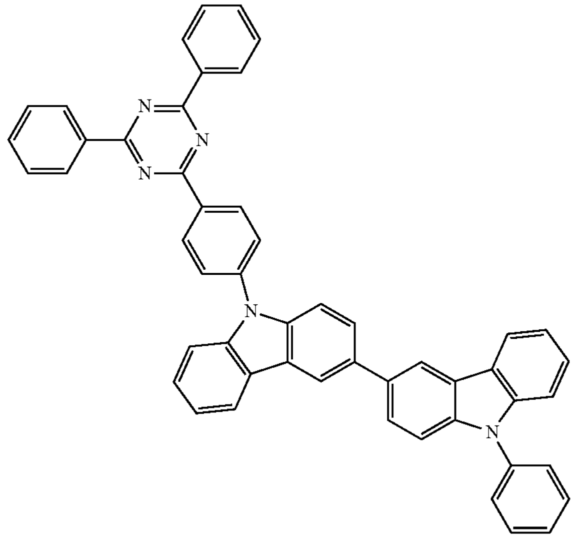
BF8
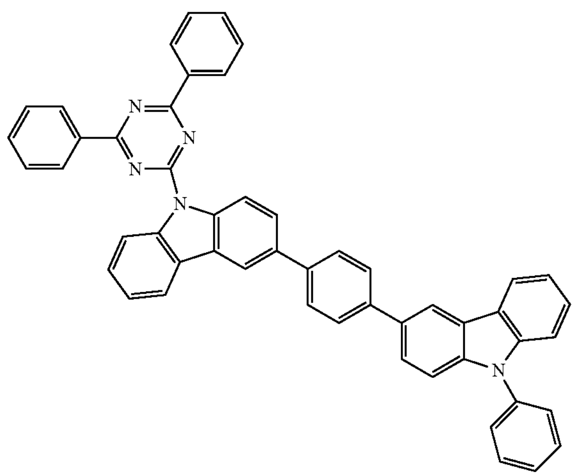
BF9
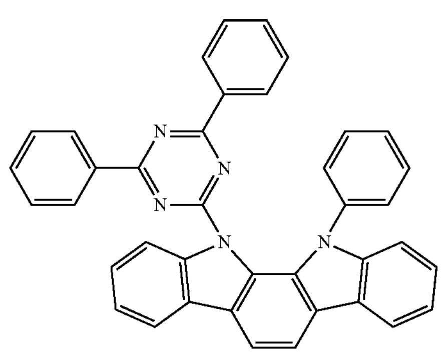

-continued

BF10

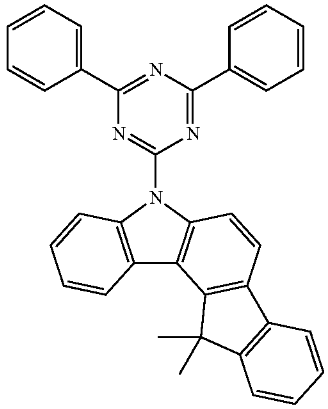

BF11

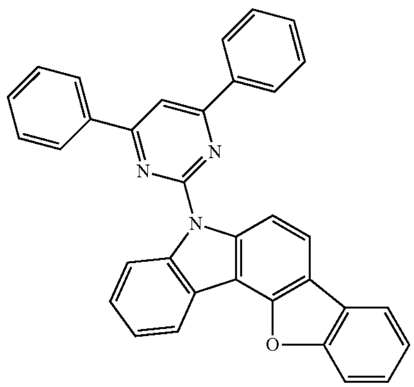

BF12

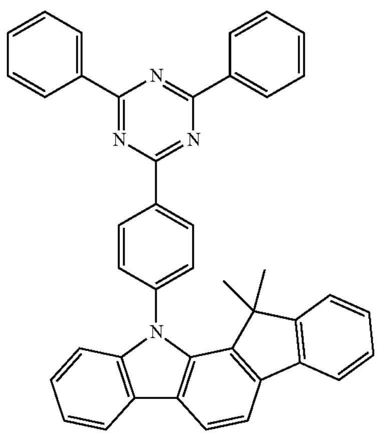

BF13

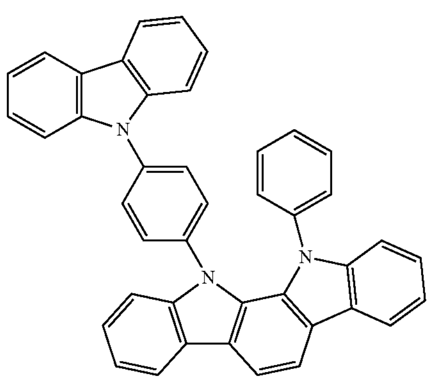

EXAMPLE 2-1

An ITO glass substrate was cut into a size of 50 mm×50 mm×0.5 mm, washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, CBP and Ir(ppy)$_3$ were vacuum deposited thereon at a weight ratio of 90:10 on the HTL and in a thickness of 300 Å to form an EML.

Thereafter, BF1 and BF3 were vacuum deposited at a weight ratio of 50:50 on the EML and in a thickness of 200 Å to form a mixed layer.

Thereafter, Alq$_3$ was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

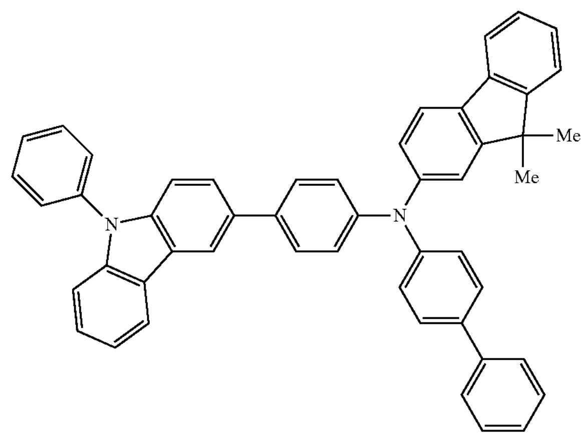

HTM

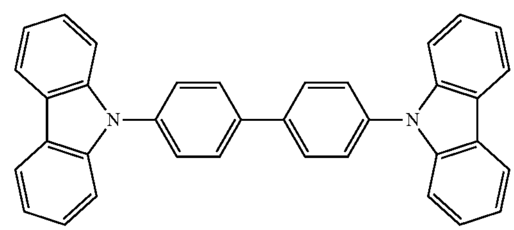

CBP

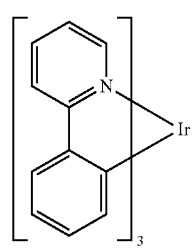

Ir(ppy)$_3$

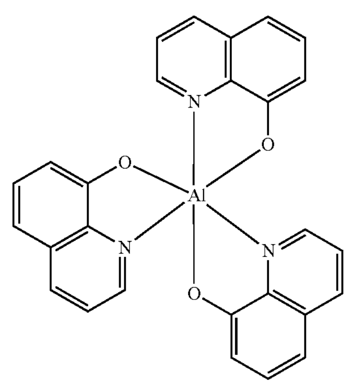

Alq3

-continued

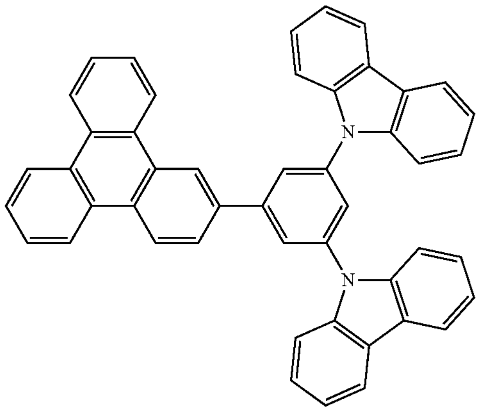

BF1

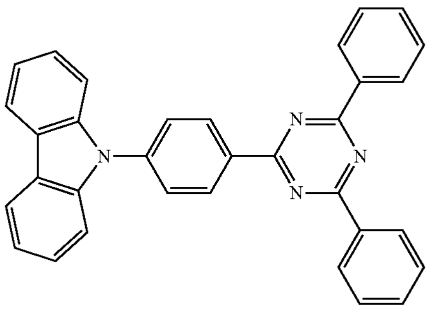

BF3

EXAMPLES 2-2 to 2-19

An organic light-emitting device was manufactured in the same manner as in Example 2-1, except that the mixed layer was changed to the compounds disclosed in Table 2 below.

COMPARATIVE EXAMPLES 4 TO 6

An organic light-emitting device was manufactured in the same manner as in Example 2-1, except that the mixed layer was changed to the compounds disclosed in Table 2 below.

TABLE 2

| | Mixed layer | | Mixed layer |
|---|---|---|---|
| Example 2-1 | BF1 + BF3 | Example 2-11 | BF1 + BF13 |
| Example 2-2 | BF1 + BF4 | Example 2-12 | BF5 + BF4 |
| Example 2-3 | BF1 + BF5 | Example 2-13 | BF5 + BF6 |
| Example 2-4 | BF1 + BF6 | Example 2-14 | BF5 + BF7 |
| Example 2-5 | BF1 + BF7 | Example 2-15 | BF5 + BF9 |
| Example 2-6 | BF1 + BF8 | Example 2-16 | BF13 + BF3 |
| Example 2-7 | BF1 + BF9 | Example 2-17 | BF13 + BF4 |
| Example 2-8 | BF1 + BF10 | Example 2-18 | BF13 + BF6 |
| Example 2-9 | BF1 + BF11 | Example 2-19 | BF13 + BF7 |
| Example 2-10 | BF1 + BF12 | | |
| Comparative Example 4 | Alq3 | | |
| Comparative Example 5 | BF1 | | |
| Comparative Example 6 | BF8 | | |

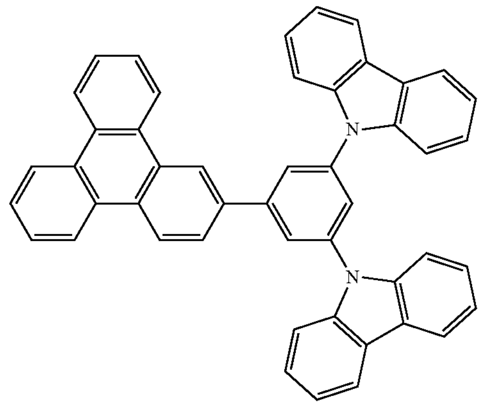

BF1

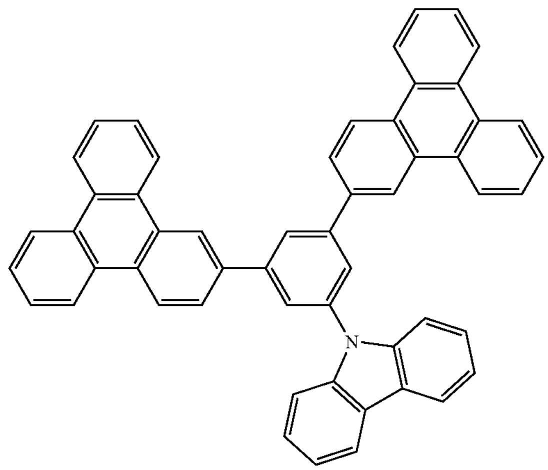

BF2

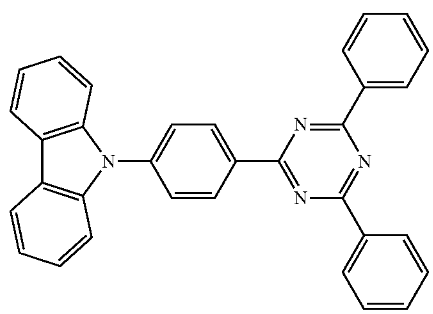

BF3

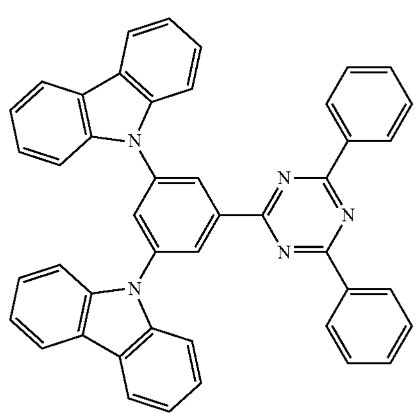

BF4

-continued
BF5
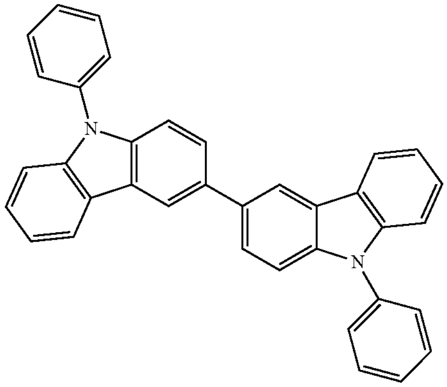
BF6
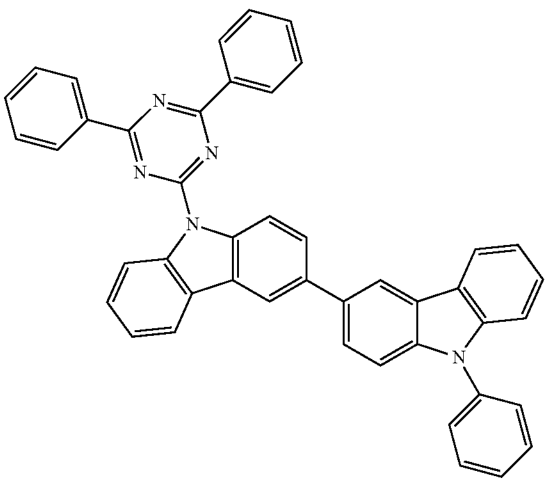
BF7
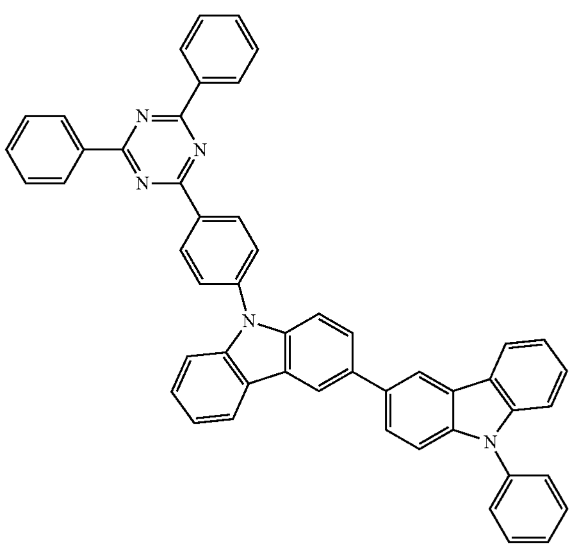
-continued
BF8
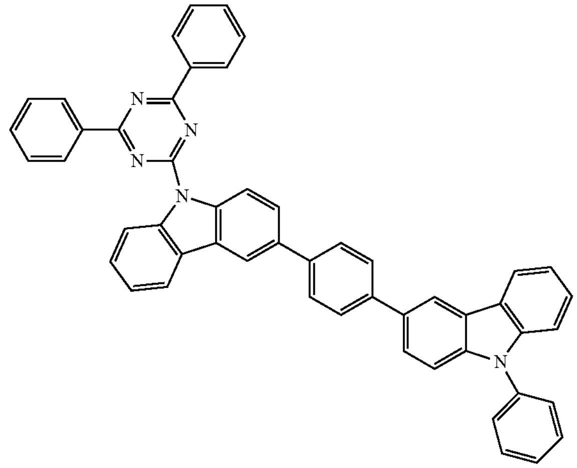
BF9
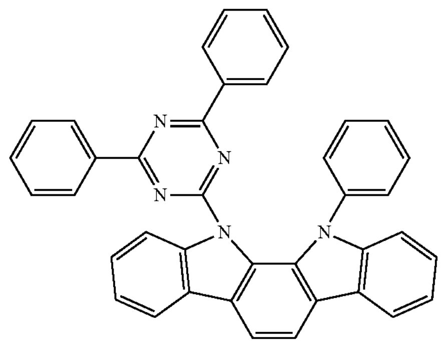
BF10
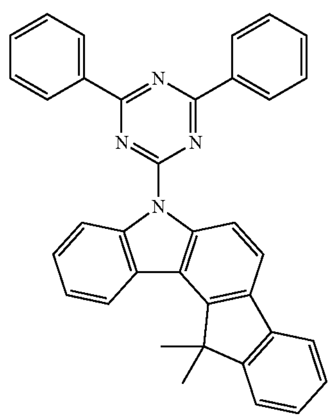
BF11
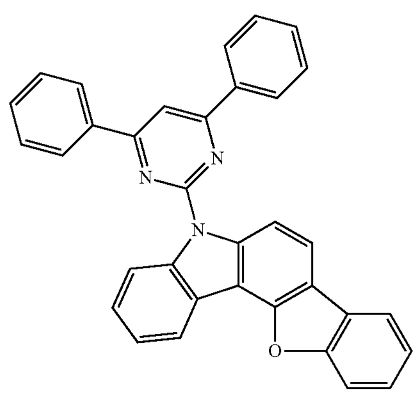

-continued

BF12

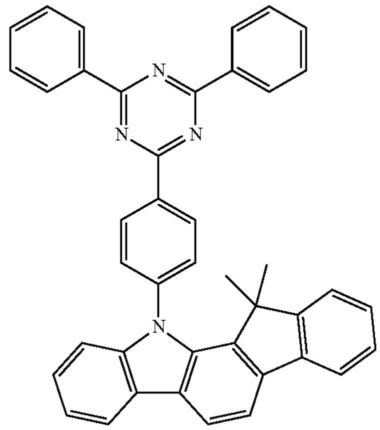

BF13

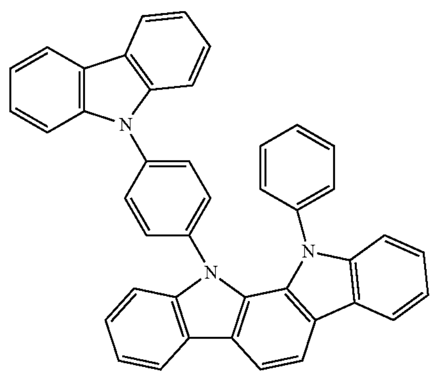

HTM

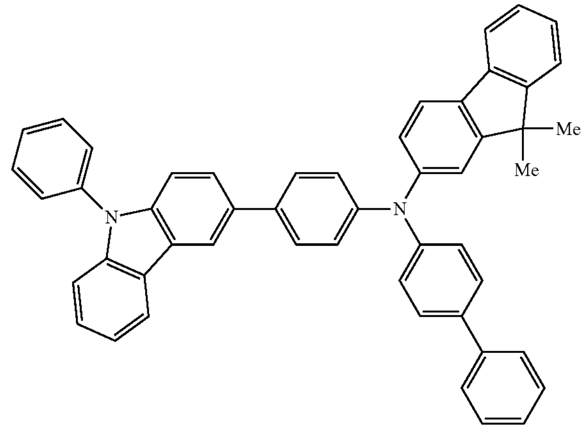

PH1

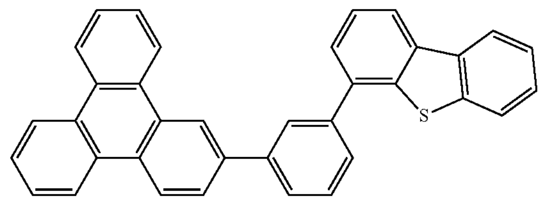

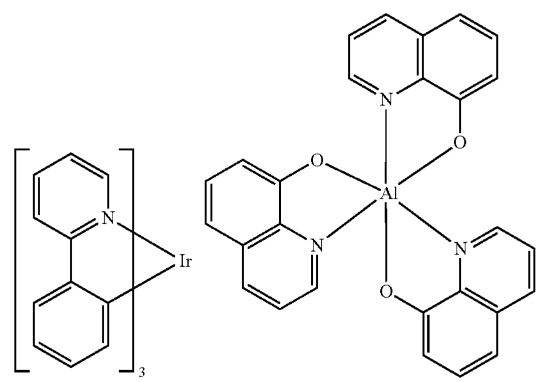

Ir(ppy)$_3$ Alq3

BF4

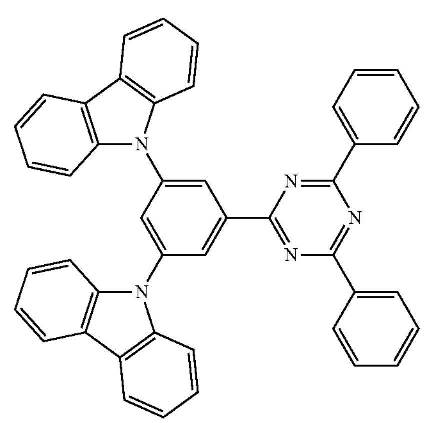

EXAMPLE 3-1

An ITO glass substrate was cut into a size of 50 mm×50 mm×0.5 mm, then washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, PH1 and Ir(ppy)$_3$ were vacuum deposited at a weight ratio of 90:10 on the HTL and in a thickness of 300 Å to form an EML. Thereafter, BF5 and BF4 were vacuum deposited thereon at a weight ratio of 50:50 on the EML and in a thickness of 200 Å to form a mixed layer.

Thereafter, Alq$_3$ was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

-continued

BF5

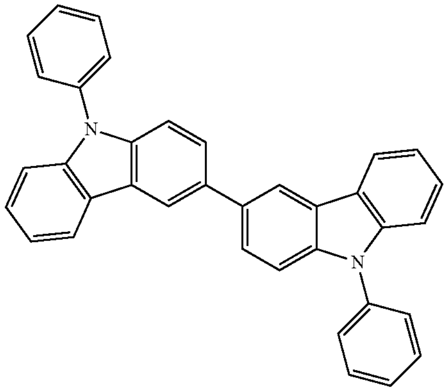

EXAMPLES 3-2 TO 3-4

An organic light-emitting device was manufactured in the same manner as in Example 3-1, except that the mixed layer was changed to the compounds disclosed in Table 3 below.

TABLE 3

| | Mixed layer |
|---|---|
| Example 3-2 | BF5 + BF6 |
| Example 3-3 | BF5 + BF7 |
| Example 3-4 | BF5 + BF9 |

BF5

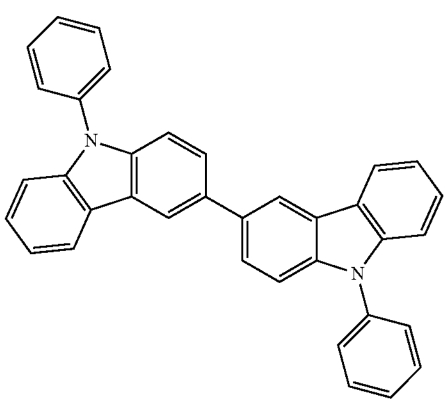

-continued

BF6

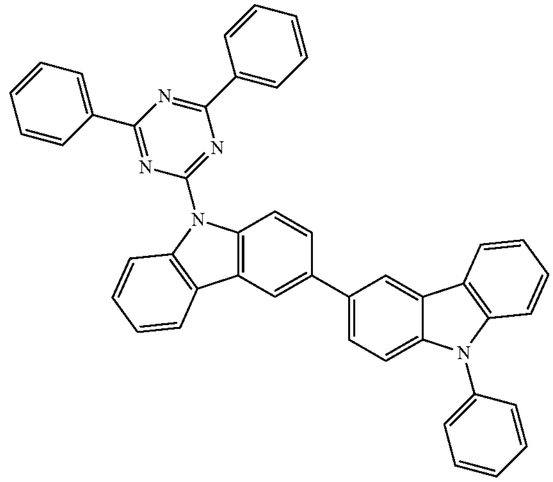

BF7

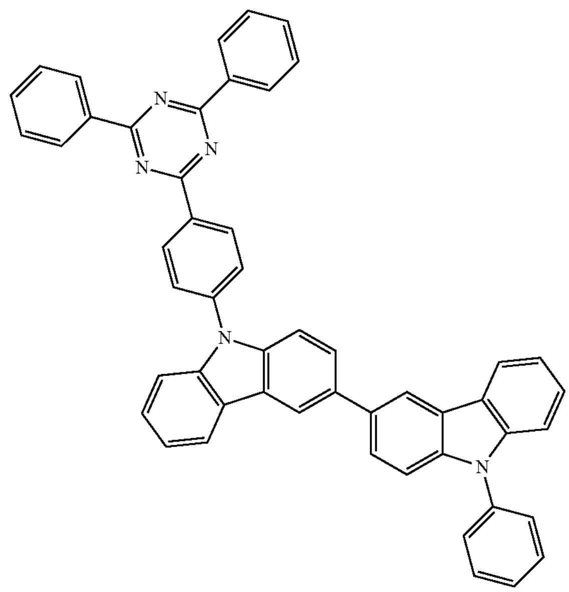

BF9

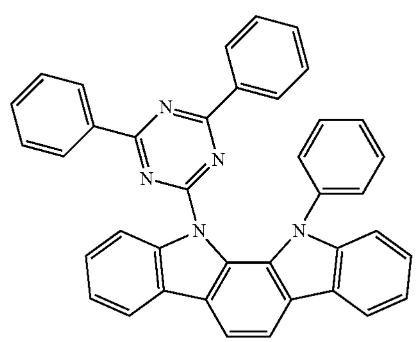

EXAMPLE 4-1

An ITO glass substrate was cut into a size of 50 mm×50 mm×0.5 mm, then washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, PH2 and $Ir(ppy)_3$ were vacuum deposited at a weight ratio of 90:10 on the HTL and in a thickness of 300 Å to form an EML. Thereafter, BF5 and BF4 were vacuum deposited thereon at a weight ratio of 50:50 on the EML and in a thickness of 200 Å to form a mixed layer.

Thereafter, $Alq_3$ was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

HTM

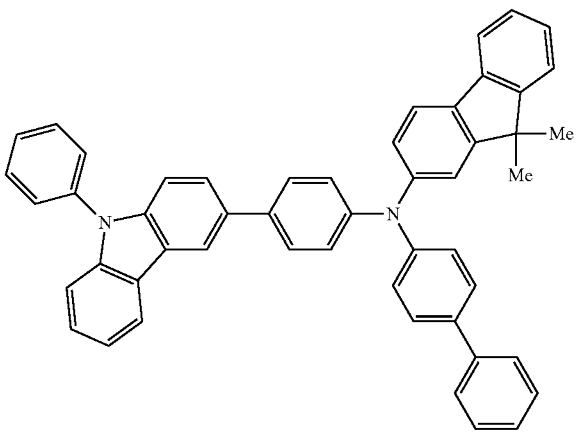

PH2

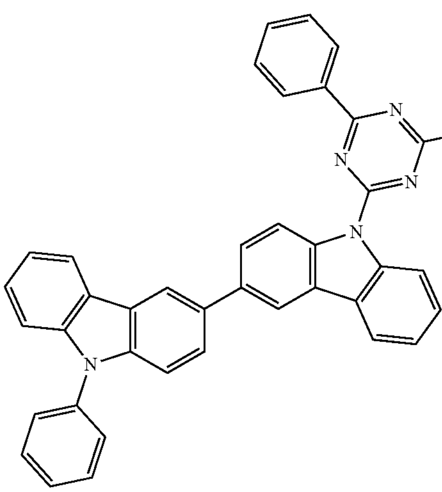

$Ir(ppy)_3$

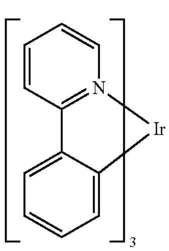

-continued

Alq3

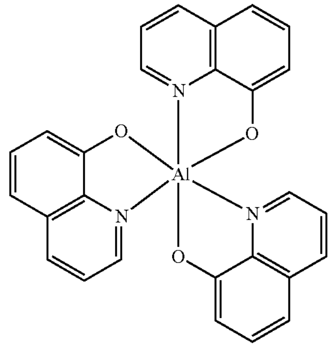

BF4

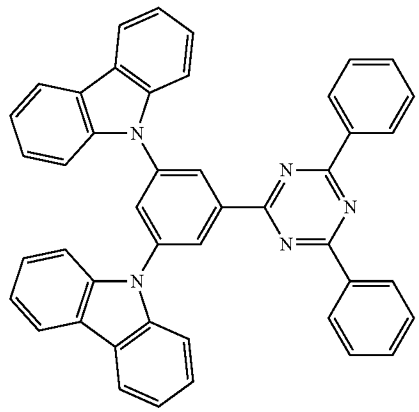

BF5

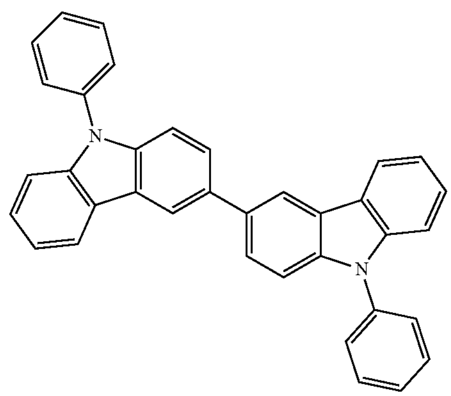

EXAMPLES 4-2 TO 4-4

An organic light-emitting device was manufactured in the same manner as in Example 4-1, except that the mixed layer was changed to the compounds disclosed in Table 4 below.

TABLE 4

| | Mixed layer |
|---|---|
| Example 4-2 | BF5 + BF6 |
| Example 4-3 | BF5 + BF7 |
| Example 4-4 | BF5 + BF9 |

EXAMPLE 5-1

An ITO glass substrate was cut into a size of 50 mm×50 mm×0.5 mm, washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, PH1, PH2, and $Ir(ppy)_3$ were vacuum deposited at a weight ratio of 45:45:10 on the HTL and in a thickness of 300 Å to form an EML. Thereafter, BF5 and BF4 were vacuum deposited thereon at a weight ratio of 50:50 on the EML and in a thickness of 200 Å to form a mixed layer.

Thereafter, $Alq_3$ was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

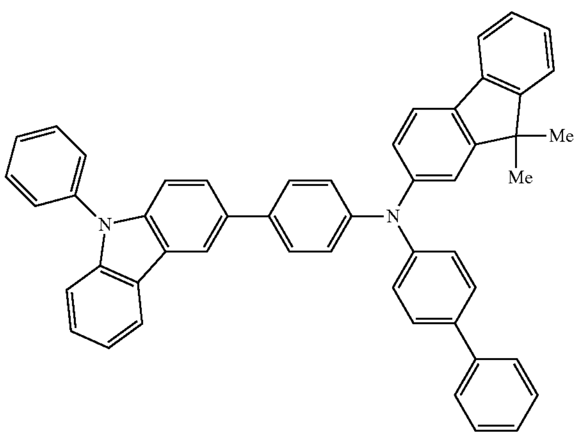

HTM

PH1

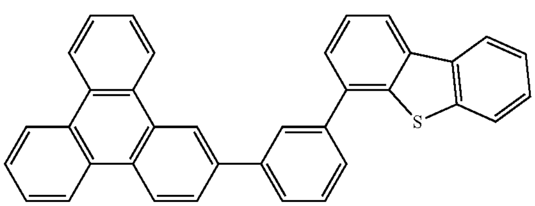

PH2

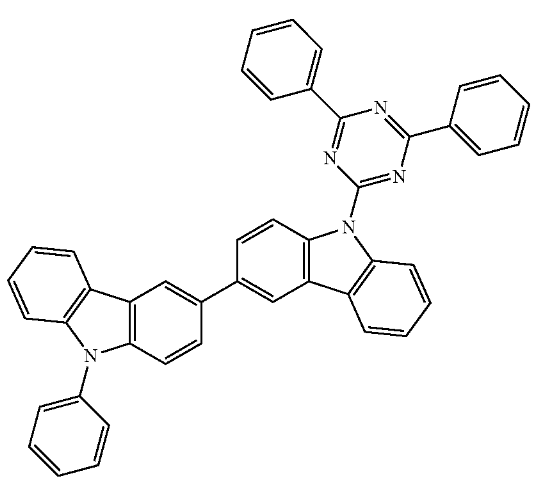

-continued

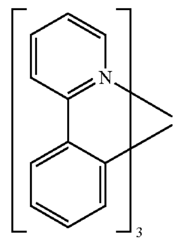

$Ir(ppy)_3$

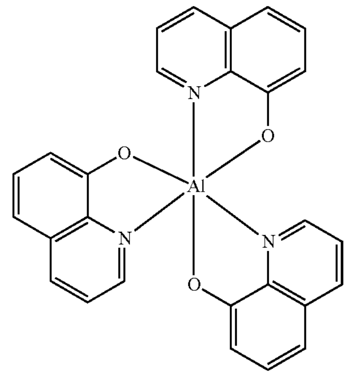

Alq3

BF4

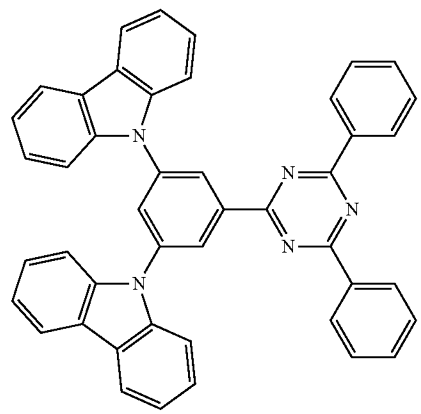

BF5

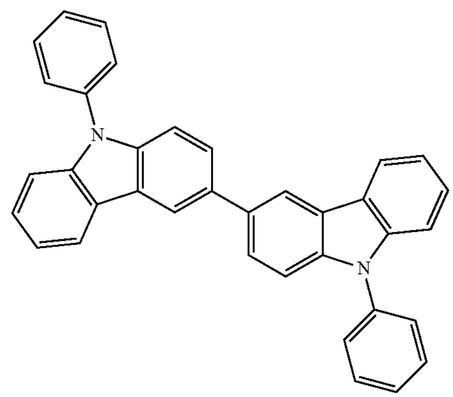

EXAMPLES 5-2 TO 5-4

An organic light-emitting device was manufactured in the same manner as in Example 5-1, except that the mixed layer was changed to the compounds disclosed in Table 5 below.

TABLE 5

| | Mixed layer |
|---|---|
| Example 5-2 | BF5 + BF6 |
| Example 5-3 | BF5 + BF7 |
| Example 5-4 | BF5 + BF9 |

EXAMPLE 6-1

An ITO glass substrate was cut into a size of 50 mm×50 mm×0.5 mm, washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, CBP and $Ir(pq)_2acac$ were vacuum deposited at a weight ratio of 95:5 on the HTL and in a thickness of 300 Å to form an EML. Thereafter, BF5 and BF4 were vacuum deposited thereon at a weight ratio of 50:50 on the EML and in a thickness of 200 Å to form a mixed layer.

Thereafter, Alq3 was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

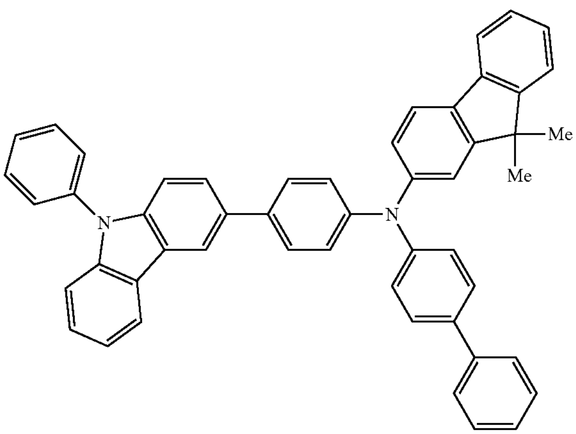

HTM

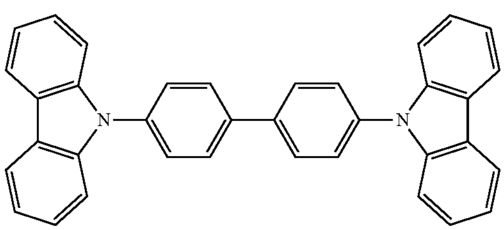

CBP

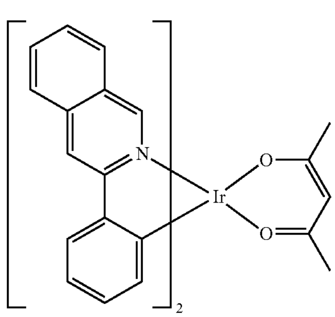

$Ir(pq)_2acac$

-continued

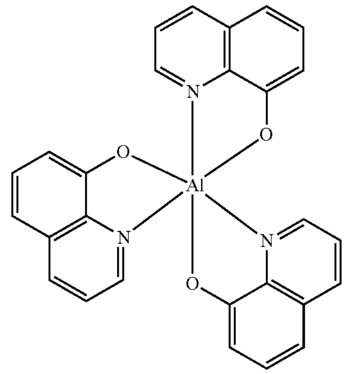

Alq3

BF4

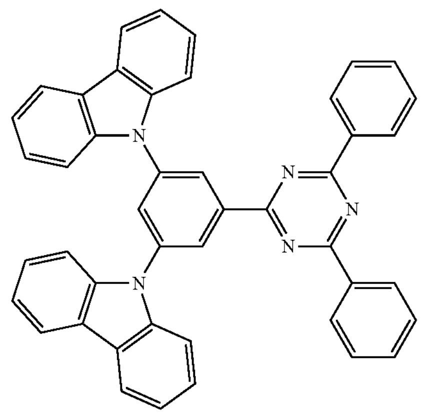

BF5

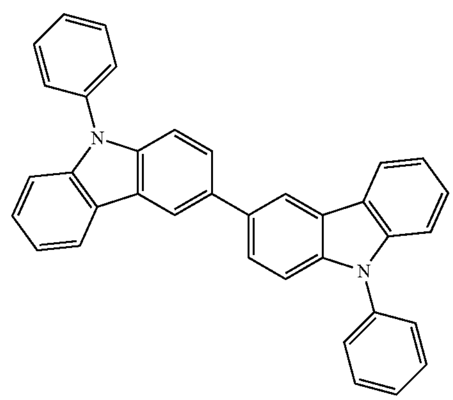

EXAMPLES 6-2 TO 6-4

An organic light-emitting device was manufactured in the same manner as in Example 6-1, except that the mixed layer was changed to the compounds disclosed in Table 6 below.

COMPARATIVE EXAMPLES 7 TO 9

An organic light-emitting device was manufactured in the same manner as in Example 6-1, except that the mixed layer was changed to the compounds disclosed in Table 6 below.

TABLE 6

| | Mixed layer | | Mixed layer |
|---|---|---|---|
| Example 6-2 | BF5 + BF6 | Comparative Example 7 | $Alq_3$ |
| Example 6-3 | BF5 + BF7 | Comparative Example 8 | BF1 |
| Example 6-4 | BF5 + BF9 | Comparative Example 9 | BF8 |

EXAMPLE 7-1

An ITO glass substrate was cut into a size of 50 mm×50 mm×0.5 mm, washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, PH1 and $Ir(pq)_2acac$ were vacuum deposited at a weight ratio of 95:5 on the HTL and in a thickness of 300 Å to form an EML. Thereafter, BF5 and BF4 were vacuum deposited thereon at a weight ratio of 50:50 on the EML and in a thickness of 200 Å to form a mixed layer.

Thereafter, $Alq_3$ was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

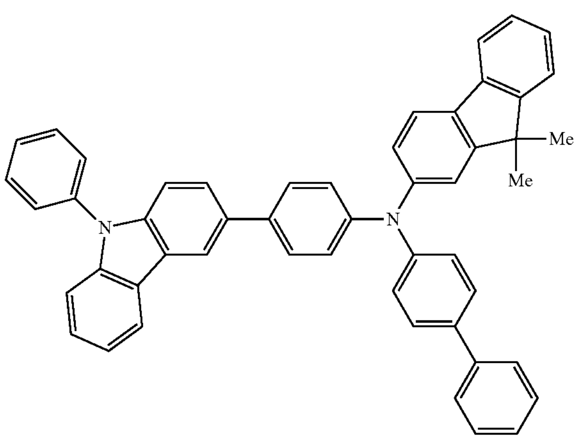

HTM

PH1

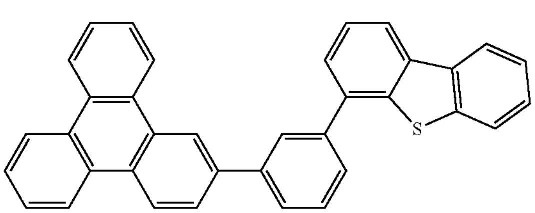

-continued

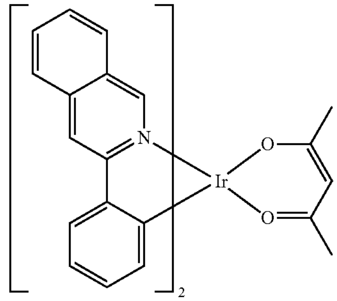

$Ir(pq)_2acac$

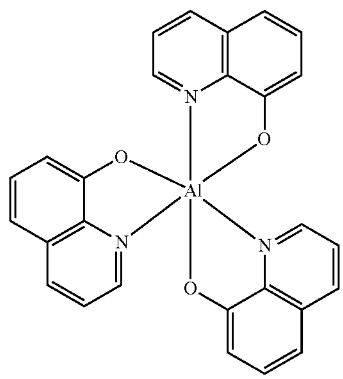

Alq3

BF4

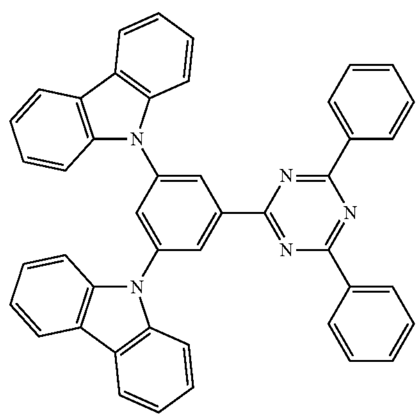

BF5

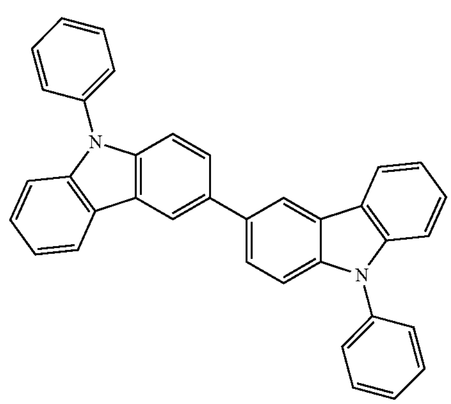

EXAMPLES 7-2 TO 7-4

An organic light-emitting device was manufactured in the same manner as in Example 7-1, except that the mixed layer was changed to the compounds disclosed in Table 7 below.

TABLE 7

| | Mixed layer |
|---|---|
| Example 7-2 | BF5 + BF6 |
| Example 7-3 | BF5 + BF7 |
| Example 7-4 | BF5 + BF9 |

BF5

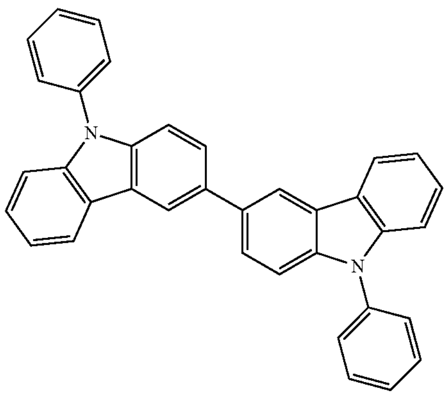

BF6

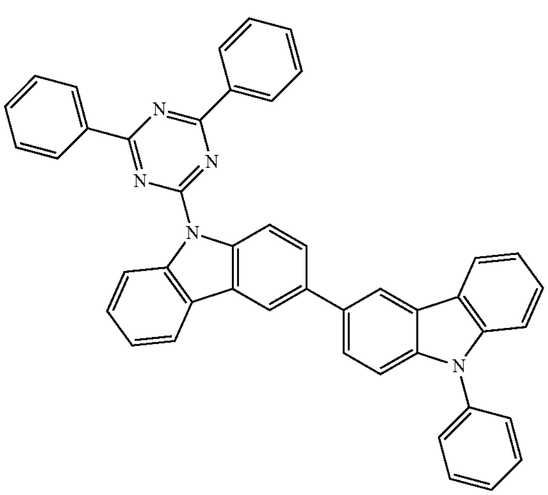

-continued

BF7

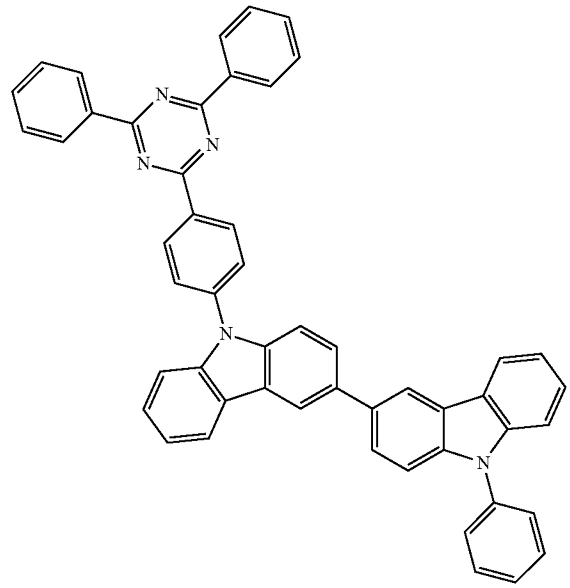

BF9

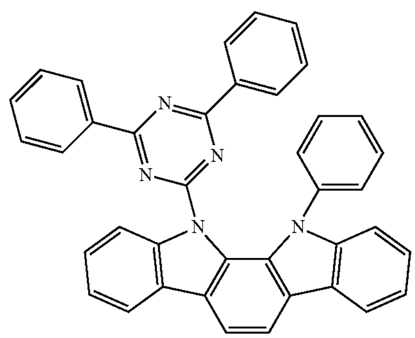

EXAMPLE 8-1

An ITO glass substrate was cut into a size of 50 mm×50 mm×0.5 mm, washed in acetone, isopropyl alcohol, and pure water for 15 minutes each, and then UV ozone cleaned for 30 minutes.

HTM was vacuum deposited on the substrate in a thickness of 1200 Å to form an HTL. Thereafter, PH2 and $Ir(pq)_2acac$ were vacuum deposited at a weight ratio of 95:5 on the HTL and in a thickness of 300 Å to form an EML. Thereafter, BF5 and BF4 were vacuum deposited thereon at a weight ratio of 50:50 on the EML and in a thickness of 200 Å to form a mixed layer.

Thereafter, $Alq_3$ was vacuum deposited in a thickness of 200 Å on the mixed layer to form an ETL. LiF was vacuum deposited on the ETL in a thickness of 10 Å to form an EIL. Al was vacuum deposited on the EIL in a thickness of 2000 Å to manufacture an organic light-emitting device.

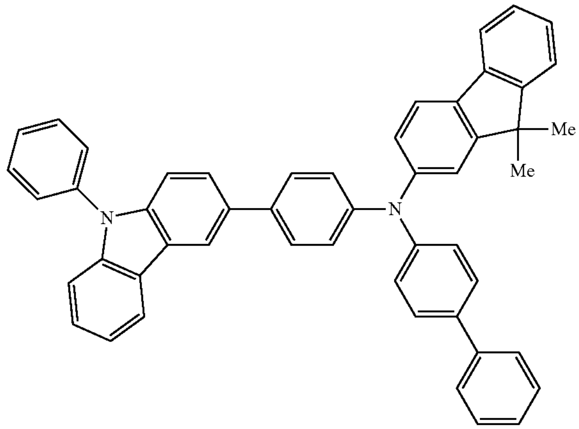

HTM

PH2

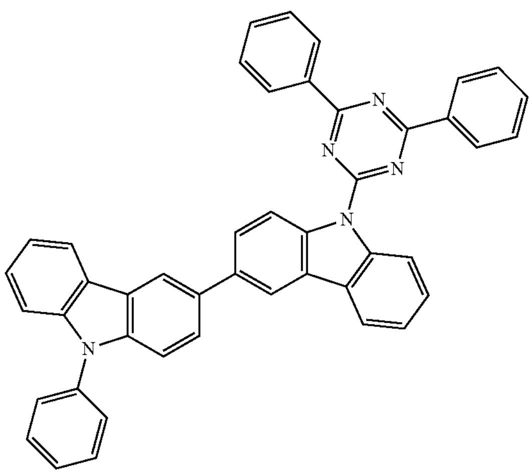

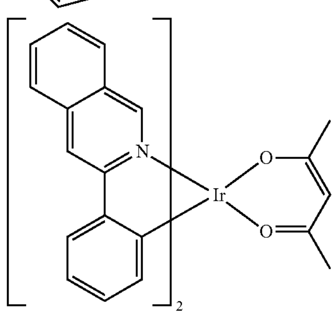

$Ir(pq)_2acac$

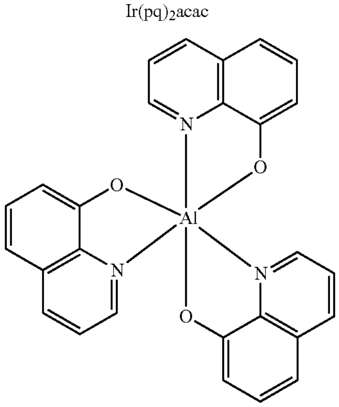

Alq3

-continued

BF4

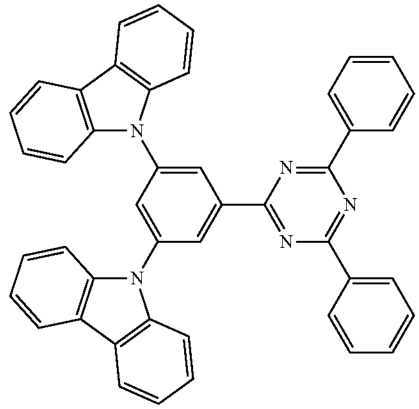

BF5

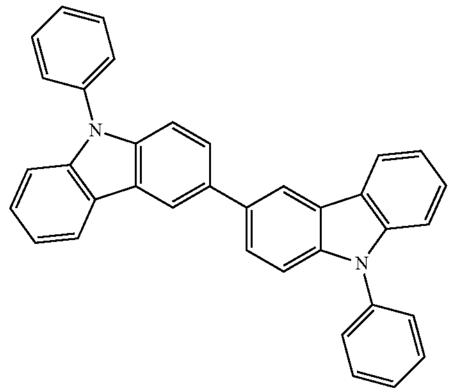

EXAMPLES 8-2 TO 8-4

An organic light-emitting device was manufactured in the same manner as in Example 8-1, except that the mixed layer was changed to the compounds disclosed in Table 8 below.

TABLE 8

| | Mixed layer |
|---|---|
| Example 8-2 | BF5 + BF6 |
| Example 8-3 | BF5 + BF7 |
| Example 8-4 | BF5 + BF9 |

COMPARATIVE EXAMPLE 10

An organic light-emitting device was manufactured in the same manner as in Example 1, except that the mixed layer was changed to CBP and BCP.

EVALUATION EXAMPLE 1

Efficiencies and lifespans (T95) of the organic light-emitting devices manufactured in Examples 1-1 to 8-4 and Comparative Examples 1 to 10 were measured and results obtained therefrom are shown in Table 9 below. T90 refers to the amount of time taken for the brightness to decrease from an initial brightness value to 90% of the initial brightness value.

TABLE 9

| | Efficiency (cd/A) | T90 (hr) | | Efficiency (cd/A) | T90 (hr) |
|---|---|---|---|---|---|
| Example1-1 | 5.2 | 130 | Example1-15 | 5.5 | 120 |
| Example1-2 | 5.0 | 120 | Example1-16 | 5.4 | 130 |
| Example1-3 | 5.1 | 120 | Example1-17 | 5.3 | 110 |
| Example1-4 | 5.6 | 110 | Example1-18 | 5.4 | 100 |
| Example1-5 | 5.5 | 130 | Example1-19 | 5.3 | 110 |
| Example1-6 | 5.4 | 110 | Example1-20 | 5.4 | 140 |
| Example1-7 | 5.5 | 120 | Example1-21 | 5.5 | 120 |
| Example1-8 | 5.6 | 130 | Example1-22 | 5.5 | 130 |
| Example1-9 | 5.4 | 120 | Example1-23 | 5.3 | 120 |
| Example1-10 | 5.3 | 130 | Example1-24 | 5.2 | 110 |
| Example1-11 | 5.1 | 100 | Example1-25 | 5.6 | 140 |
| Example1-12 | 5.2 | 120 | Example1-26 | 5.5 | 120 |
| Example1-13 | 5.1 | 120 | Example1-27 | 5.4 | 100 |
| Example1-14 | 5.2 | 130 | | | |
| Comparative Example1 | 4.5 | 35 | | | |
| Comparative Example2 | 4.4 | 50 | | | |
| Comparative Example3 | 4.7 | 60 | | | |
| Example2-1 | 51 | 120 | Example2-11 | 49 | 100 |
| Example2-2 | 52 | 140 | Example2-12 | 53 | 120 |
| Example2-3 | 49 | 110 | Example2-13 | 55 | 140 |
| Example2-4 | 54 | 140 | Example2-14 | 56 | 110 |
| Example2-5 | 53 | 130 | Example2-15 | 55 | 140 |
| Example2-6 | 54 | 120 | Example2-16 | 52 | 110 |
| Example2-7 | 55 | 140 | Example2-17 | 50 | 110 |
| Example2-8 | 55 | 130 | Example2-18 | 55 | 130 |
| Example2-9 | 52 | 120 | Example2-19 | 54 | 120 |
| Example2-10 | 53 | 130 | | | |
| Example3-1 | 55 | 150 | Example3-3 | 56 | 160 |
| Example3-2 | 58 | 190 | Example3-4 | 59 | 180 |
| Example4-1 | 56 | 140 | Example4-3 | 56 | 130 |
| Example4-2 | 59 | 160 | Example4-4 | 58 | 160 |
| Example5-1 | 61 | 210 | Example5-3 | 60 | 190 |
| Example5-2 | 63 | 220 | Example5-4 | 64 | 220 |
| Comparative Example4 | 44 | 50 | | | |
| Comparative Example5 | 43 | 40 | | | |
| Comparative Example6 | 48 | 90 | | | |
| Example6-1 | 20 | 150 | Example6-3 | 22 | 170 |
| Example6-2 | 23 | 180 | Example6-4 | 23 | 190 |
| Example7-1 | 21 | 190 | Example7-3 | 23 | 200 |
| Example7-2 | 22 | 210 | Example7-4 | 23 | 220 |
| Example8-1 | 24 | 240 | Example8-3 | 25 | 260 |
| Example8-2 | 26 | 250 | Example8-4 | 25 | 260 |
| Comparative Example7 | 15 | 120 | | | |
| Comparative Example8 | 11 | 50 | | | |
| Comparative Example9 | 18 | 130 | | | |
| Comparative Example10 | 16 | 140 | | | |

It may be concluded that results from Examples 1-1 to 8-4 are better than results from Comparative Examples 1 to 10.

As described above, according to the one or more of the above embodiments of the present invention, an organic light-emitting device according to an embodiment may have characteristics such as high efficiency, long lifespan, or low driving voltage.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the drawing, it will be understood by those of ordinary skill in the art that various changes in form and details may be made therein without departing from the spirit and scope of the present invention as defined by the following claims, and equivalents thereof.

The invention claimed is:

1. An organic light-emitting device comprising:

a first electrode;

a second electrode facing the first electrode; and an organic layer between the first electrode and the second electrode;

wherein the organic layer comprises:

an emission layer;

an electron transport region between the second electrode and the emission layer;

a mixed layer between the emission layer and the electron transport region and comprising a first material and a second material, wherein the first material and the second material are pyrrolidine-based compounds, and a triplet energy $Eg_{T1}$ of at least one of the first material or the second material is 2.2 eV or greater.

2. The organic light-emitting device of claim 1, wherein the electron transport region comprises an electron transport layer; and the emission layer and the electron transport layer are adjacent to each other.

3. The organic light-emitting device of claim 1, wherein each of the first material and the second material is independently a pyrrolidine-based compound represented by one of Formulae 1 or 2:

Formula 1

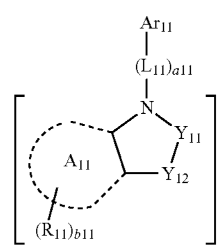

Formula 2

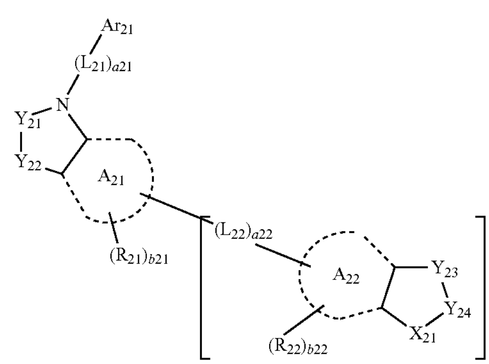

where each of two neighboring groups $Y_{11}$ and $Y_{12}$, $Y_{21}$ and $Y_{22}$, and $Y_{23}$ and $Y_{24}$ are independently represented by one of Formulae 9-1 to 9-6 where the *s represent the bonding position for the respective neighboring group:

Formula 9-1

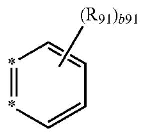

Formula 9-2

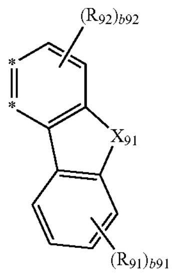

Formula 9-3

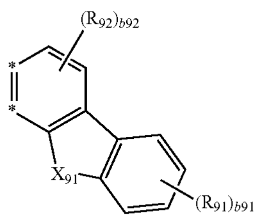

Formula 9-4

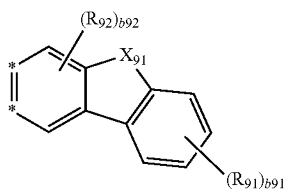

Formula 9-5

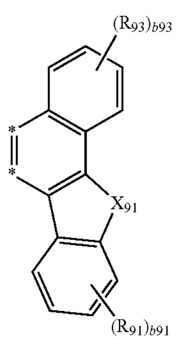

Formula 9-6

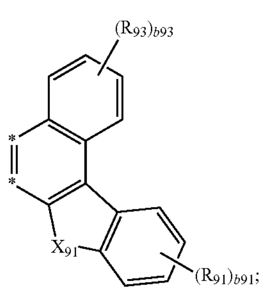

each of $X_{21}$ and $X_{91}$ is independently an oxyen atom, a sulfur atom, $N(Q_1)$, $C(Q_1)(Q_2)$, or $Si(Q_1)(Q_2)$;

each of $A_{11}$, $A_{21}$ and $A_{22}$ is independently benzene, naphthalene, dibenzofuran, dibenzothiopene, carbazole, fluorene, benzofuran, benzothiopene, indole, or indene;

each of $L_{11}$, $L_{21}$ and $L_{22}$ is independently a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic hetero-condensed polycyclic group;

each of a11, a21, and a22 is independently 0, 1, 2, or 3;

each of $Ar_{11}$, $Ar_{21}$, $R_{11}$, $R_{21}$, $R_{22}$, and $R_{91}$ to $R_{93}$ is independently a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arythio group, a substituted or unsubstituted $C_1$-$C_{60}$ heteroaryl group, a substituted or unsubstituted a monovalent non-aromatic condensed polycyclic group, or a substituted or unsubstituted monovalent non-aromatic hetero-condensed polycyclic group;

each of b11, b21, b22, b91, and b93 is independently 1, 2, 3, or 4;

b92 is 1 or 2;

each of m11 and m21 is independently 1, 2, or 3;

at least one substituent of the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic hetero-condensed polycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arythio group, the substituted $C_1$-$C_{60}$ heteroaryl group, the substituted monovalent non-aromatic condensed polycyclic group, or the substituted monovalent non-aromatic hetero-condensed polycyclic group is selected from: a deuterium; —F; —Cl; —Br; —I; a hydroxyl group; a cyano group; a nitro group; an amino group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group, —$N(Q_{11})(Q_{12})$, —$Si(Q_{13})(Q_{14})(Q_{15})$, or -$B(Q_{16})(Q_{17})$; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group; a $C_6$-$C_{60}$ aryloxy group; a $C_6$-$C_{60}$ arythio group; a $C_1$-$C_{60}$ heteroaryl group; a monovalent non-aromatic condensed polycyclic group; a monovalent non-aromatic hetero-condensed polycyclic group; a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, or a monovalent non-aromatic hetero-condensed polycyclic group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic hetero-condensed polycyclic group, —$N(Q_{21})(Q_{22})$, —$Si(Q_{23})(Q_{24})(Q_{25})$, or -$B(Q_{26})(Q_{27})$; —$N(Q_{31})(Q_{32})$; —$Si(Q_{33})(Q_{34})(Q_{35})$; or -$B(Q_{36})(Q_{37})$; wherein each of $Q_1$, $Q_2$, $Q_{11}$ to $Q_{17}$, $Q_{21}$ to $Q_{27}$, and $Q_{31}$ to $Q_{37}$ is independently a hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, or a monovalent non-aromatic hetero-condensed polycyclic group.

4. The organic light-emitting device of claim 3, wherein each of $L_{11}$ , $L_{21}$ and $L_{22}$ is independently a phenylene group; a pentalenylene group; an indenylene group; a naphthylene group; an azulenylene group; a heptalenylene group; an indacenylene group; an acenaphthylene group; a fluorenylene group; a spiro-fluorenylene group; a benzofluorenylene group; a dibenzofluorenylene group; a phenalenylene group; a phenanthrenylene group; an anthracenylene group; a fluoranthenylene group; a triphenylenylene group; a pyrenylene group; a chrysenylene group; a naphthacenylene group; a picenylene group; a perylenylene group; a pentaphenylene group; a hexacenylene group; a pentacenylene group; a rubicenylene group; a coronenylene group; an ovalenylene group; a pyrrolylene group; a thiophenylene group; a furanylene group; an imidazolylene group; a pyrazolylene group; a thiazolylene group; an isothiazolylene group; an oxazolylene group; an isooxazolylene group; a pyridinylene group; a pyrazinylene group; a pyrimidinylene group; a pyridazinylene group; an isoindolylene group; an indolylene group; an indazolylene group; a purinylene group; a quinolinylene group; an isoquinolinylene group; a benzoquinolinylene group; a phthalazinylene group; a naphthyridinylene group; a quinoxalinylene group; a quinazolinylene group; a benzoquinazolinylene group; a cinnolinylene group; a carbazolylene group; a phenanthridinylene group; an acridinylene group; a phenanthrolinylene group; a phenazinylene group; a benzoimidazolylene group; a benzofuranylene group; a benzothiophenylene group; a benzothiazolylene group; an isobenzothiazolylene group; a benzooxazolylene group; an isobenzooxazolylene group; a triazolylene group; a tetrazolylene group; an oxadiazolylene group; a triazinylene group; a dibenzofuranylene group; a dibenzothiophenylene group; a benzocarbazolylene group; a dibenzocarbazolylene group; a phenylene group, a pentalenylene group, an indenylene group, a naphthylene group, an azulenylene group, a heptalenylene group, an indacenylene group, an acenaphthylene group, a fluorenylene group, a spiro-fluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a pyrrolylene group, a thiophenylene group, a furanylene group, an imidazolylene group, a pyrazolylene group, a thiazolylene group, an isothiazolylene group, an oxazolylene group, an isooxazolylene group, a pyridinylene group, a pyrazinylene group, a pyrimidinylene group, a pyridazinylene group, an isoindolylene group, an indolylene group, an indazolylene group, a purinylene group, a quinolinylene group, an isoquinolinylene group, a benzoquinolinylene group, a phthalazinylene group, a naphthyridinylene group, a quinoxalinylene group, a quinazolinylene group, a benzoquinazolinylene group, a cinnolinylene group, a carbazolylene group, a phenanthridinylene group, an acridinylene group, a phenanthrolinylene group, a phenazinylene group, a benzoimidazolylene group, a benzofuranylene group, a benzothiophenylene group, a benzothiazolylene group, an isobenzothiazolylene group, a benzooxazolylene group, an isobenzooxazolylene group, a triazolylene group, a tetrazolylene group, an oxadiazolylene group, a triazinylene group, a dibenzofuranylene group, a dibenzothiophenylene group, a benzocarbazolylene group, or a dibenzocarbazolylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, or an imidazopyridinyl group.

5. The organic light-emitting device of claim 3, wherein each of a11, a21, and a22 is independently 0 or 1.

6. The organic light-emitting device of claim 3, wherein each of $Ar_{11}$, $Ar_{21}$, $Q_1$, and $Q_2$ is independently a methyl group; an ethyl group; an n-propyl group; an isopropyl group; an n-butyl group; an iso-butyl group; a sec-butyl group; a tert-butyl group; a methoxy group; an ethoxy group; a cyclopentyl group; a cyclohexyl group; a phenyl group; a pentalenyl group; an indenyl group; a naphthyl group; an azulenyl group; a heptalenyl group; an indacenyl group; an acenaphthyl group; a fluorenyl group; a spiro-fluorenyl group; a benzofluorenyl group; a dibenzofluorenyl group; a phenalenyl group; a phenanthrenyl group; an anthracenyl group; a fluoranthenyl group; a triphenylenyl group; a pyrenyl group; a chrysenyl group; a naphthacenyl group; a picenyl group; a perylenyl group; a pentaphenyl group; a hexacenyl group; a pentacenyl group; a rubicenyl group; a coronenyl group; an ovalenyl group; a pyrrolyl group; a thiophenyl group; a furanyl group; an imidazolyl group; a pyrazolyl group; a thiazolyl group; an isothiazolyl group; an oxazolyl group; an isooxazolyl group; a pyridinyl group; a pyrazinyl group; a pyrimidinyl group; a pyridazinyl group; an isoindolyl group; an indolyl group; an indazolyl group; a purinyl group; a quinolinyl group; an isoquinolinyl group; a carbazolyl group; a benzoquinolinyl group; a phthalazinyl group; a naphthyridinyl group; a quinoxalinyl group; a quinazolinyl group; a benzoquinazolinyl group; a cinnolinyl group; a phenanthridinyl group; an acridinyl group; a phenanthrolinyl group; a phenazinyl group; a benzimidazolyl group; a benzofuranyl group; a benzothiophenyl group; an isobenzothiazolyl group; a benzooxazolyl group; an isobenzooxazolyl group; a triazolyl group; a tetrazolyl group; an oxadiazolyl group; a triazinyl group; a dibenzofuranyl group; a dibenzothiophenyl group; a dibenzosilolyl group; a benzocarbazolyl; a dibenzocarbazolyl group; a methyl group, an ethyl group, an n-propyl group, an isopropyl group, an n-butyl group, an iso-butyl group, a sec-butyl group, a tert-butyl group, a methoxy group, an ethoxy group, a cyclopentyl group, a cyclohexyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a benzoquinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, or a dibenzocarbazolyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isooxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzooxazolyl group, an isobenzooxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, —N($Q_{31}$)($Q_{32}$), or —Si($Q_{33}$)($Q_{34}$)($Q_{35}$), wherein each of $Q_{31}$ to $Q_{35}$ is independently a $C_1$-$C_{60}$ alkyl group, a $C_6$-$C_{60}$ aryl group, or a $C_1$-$C_{60}$ heteroaryl group.

7. The organic light-emitting device of claim 3, wherein each of $R_{11}$, $R_{21}$, $R_{22}$, and $R_{91}$ to $R_{93}$ is independently a hydrogen, a deuterium, —F, —Cl, —Br, —I, a $C_1$-$C_{60}$ alkyl group, a $C_6$-$C_{60}$ aryl group, a $C_1$-$C_{60}$ heteroaryl group, a monovalent non-aromatic condensed polycyclic group, or a monovalent non-aromatic hetero-condensed polycyclic group.

8. The organic light-emitting device of claim 3, wherein each of m11 and m21 is independently 1 or 2.

9. The organic light-emitting device of claim 3, wherein each of the first material and the second material is independently a pyrrolidine-based compound represented by one of Formulae 1-1 to 1-11:

Formula 1-1
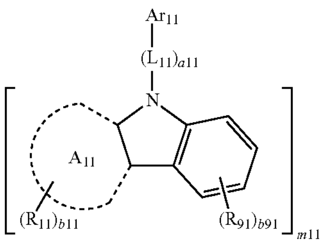
Formula 1-2
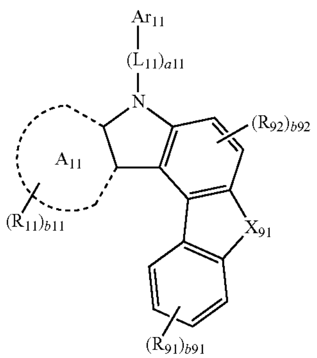
Formula 1-3
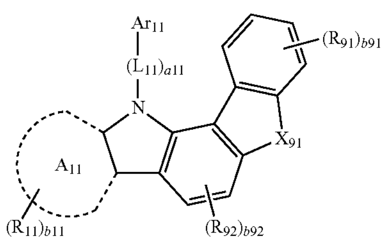
Formula 1-4
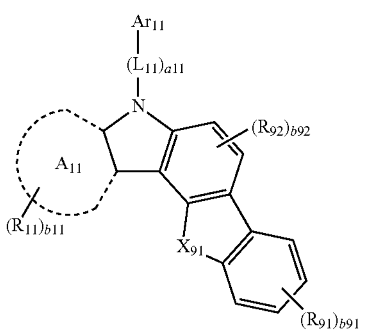
Formula 1-5
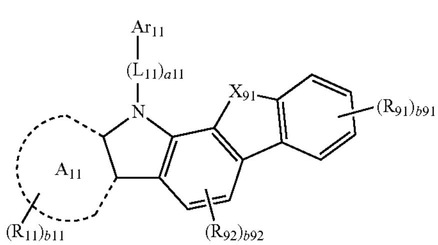
-continued
Formula 1-6
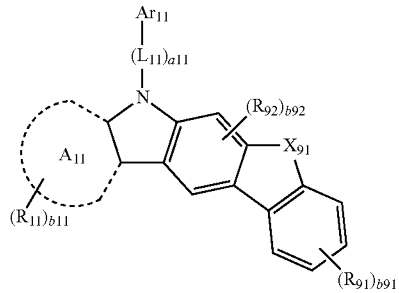
Formula 1-7
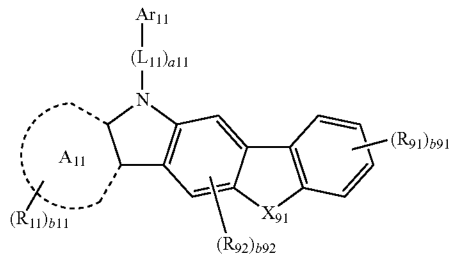
Formula 1-8
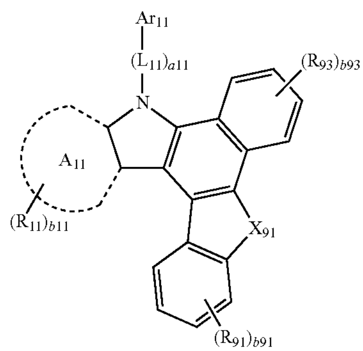
Formula 1-9
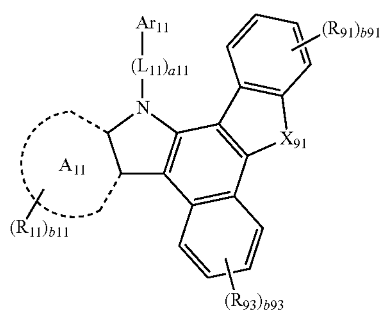
Formula 1-10
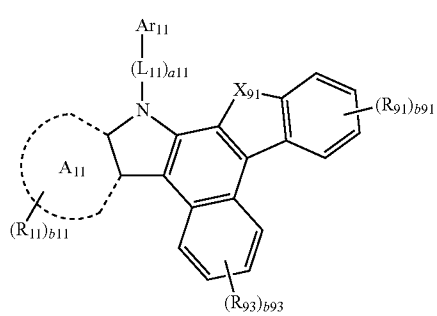

-continued
Formula 1-11
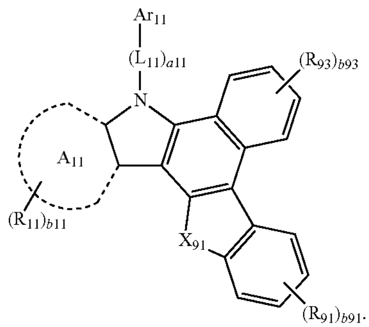
10. The organic light-emitting device of claim 3, wherein each of the first material and the second material is independently a pyrrolidine-based compound represented by one of Formulae 1-1 to 1-11:
Formula 1-1
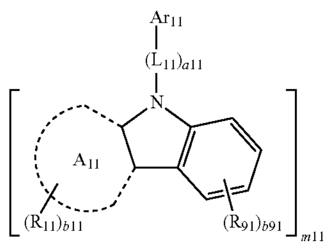
Formula 1-2
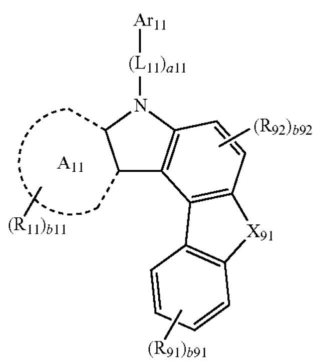
Formula 1-3
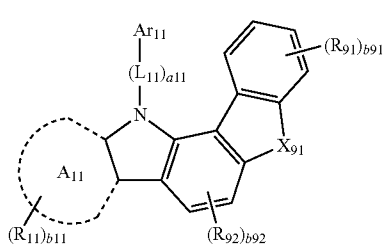
-continued
Formula 1-4
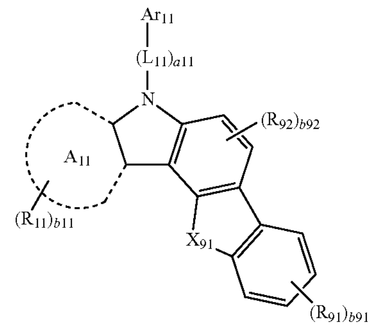
Formula 1-5
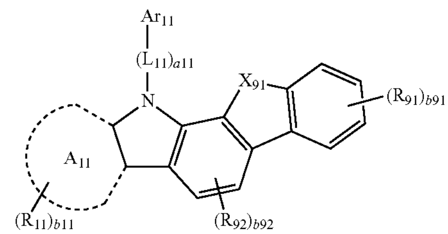
Formula 1-6
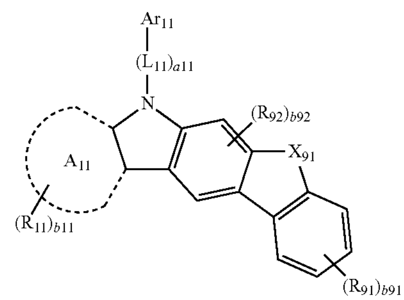
Formula 1-7
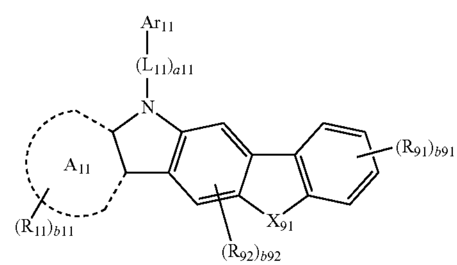
Formula 1-8
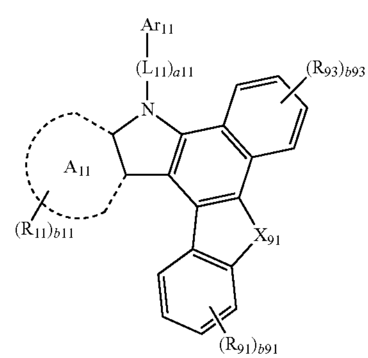

-continued
Formula 1-9
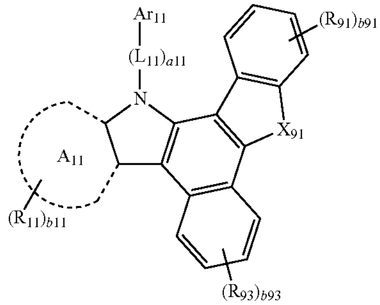
Formula 1-10
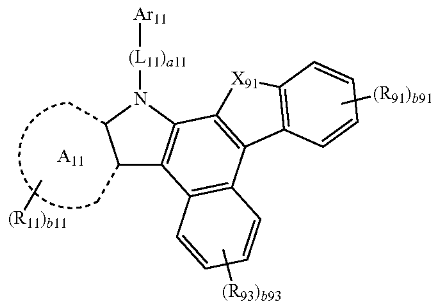
-continued
Formula 1-11
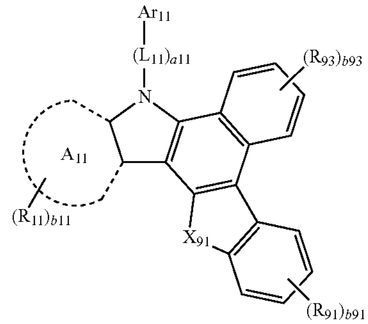
where $A_{11}$ is benzene or naphthalene.
11. The organic light-emitting device of claim 3, wherein each of the first material and the second material is independently a pyrrolidine-based compound represented by one of Formulae 2-1 to 2-7:
Formula 2-1
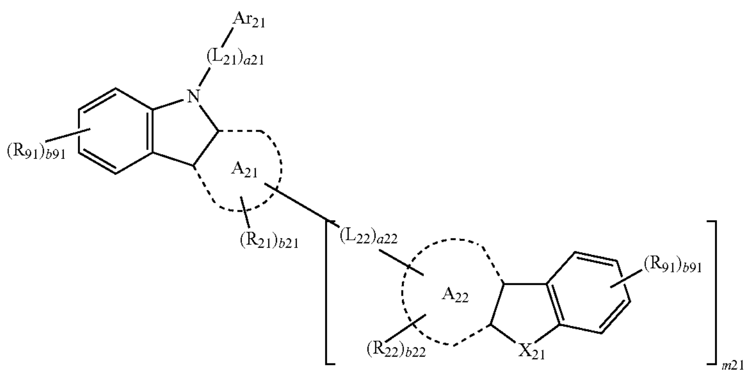
Formula 2-2
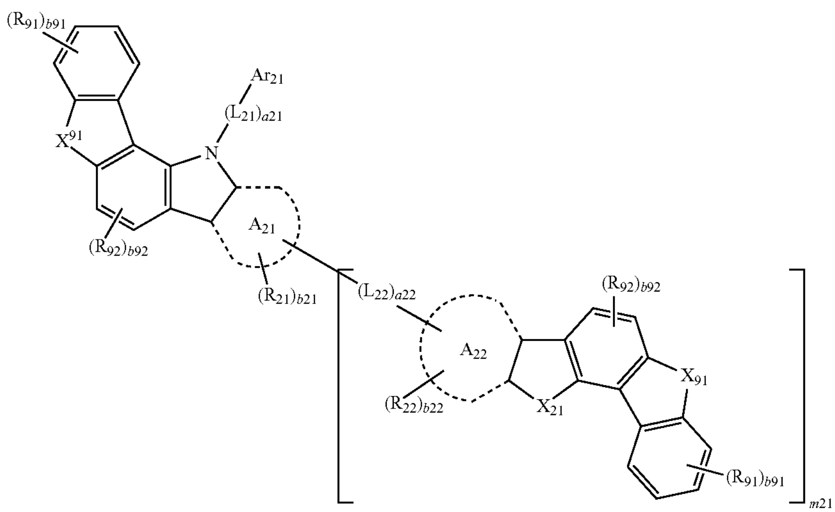

-continued
Formula 2-3
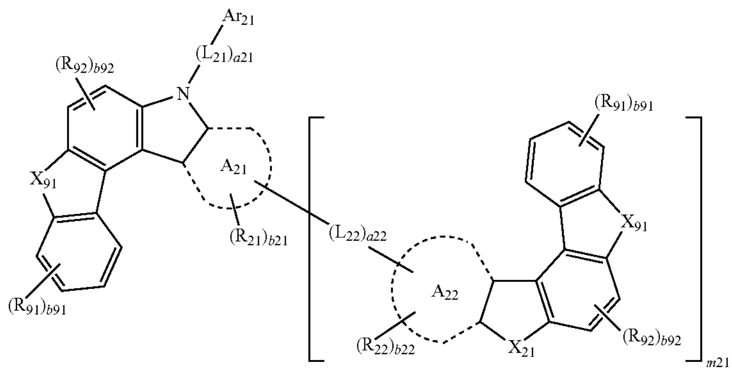
Formula 2-4
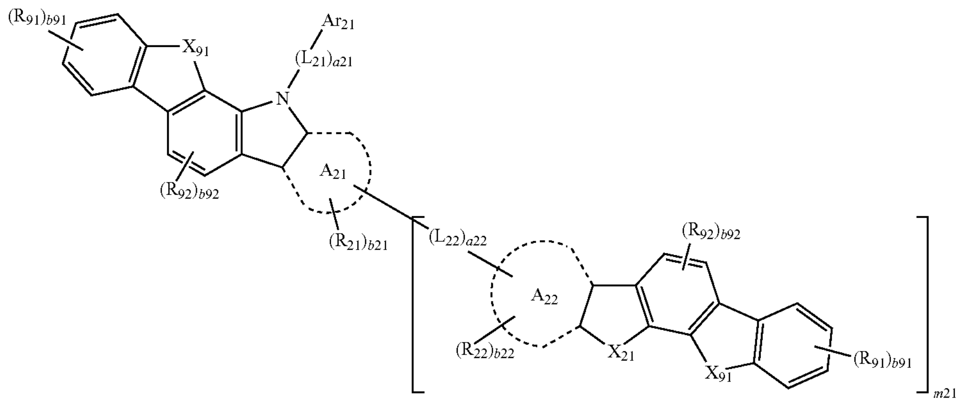
Formula 2-5
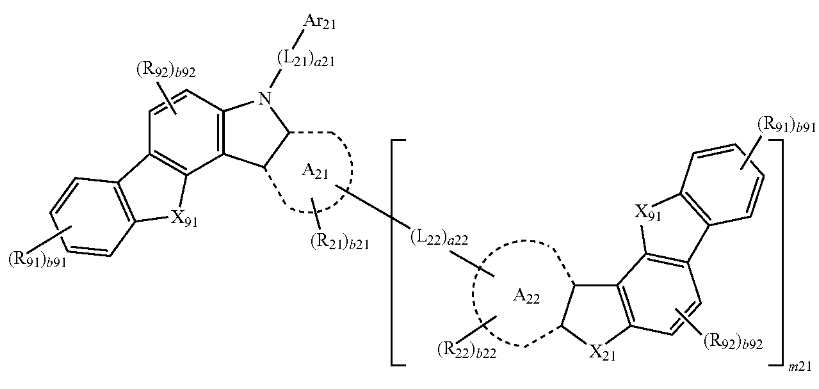
Formula 2-6
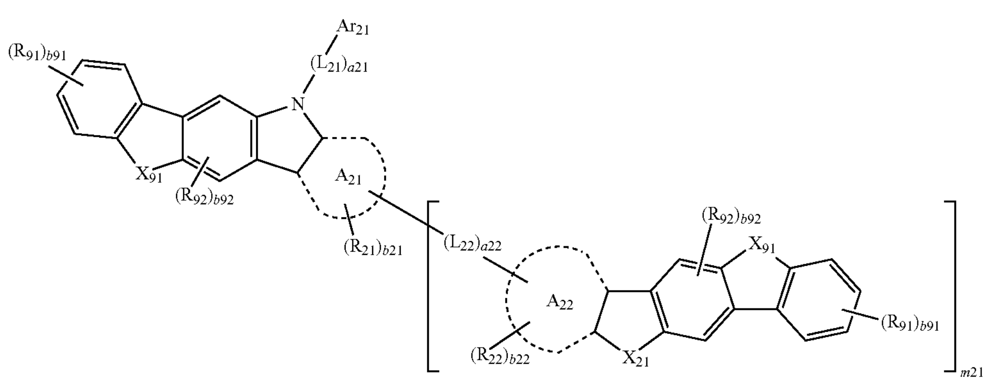

-continued
Formula 2-7
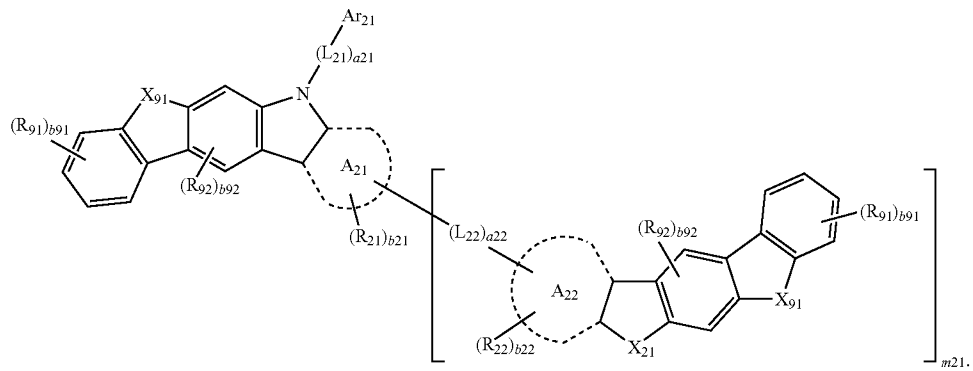
12. The organic light-emitting device of claim 3, wherein each of the first material and the second material is independently a pyrrolidine-based compound represented by one of Formulae 2-1A to 2-7A:
Formula 2-1A
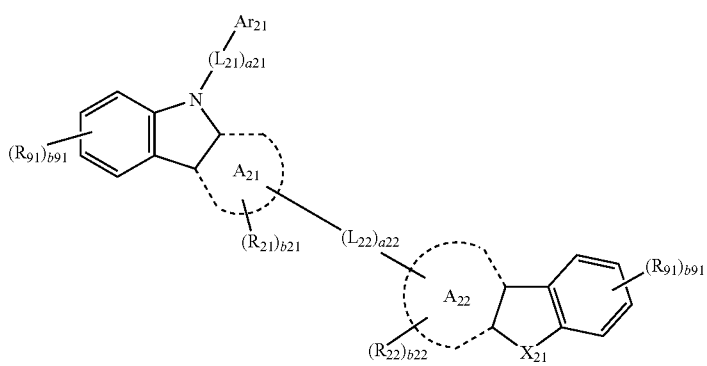
Formula 2-2A
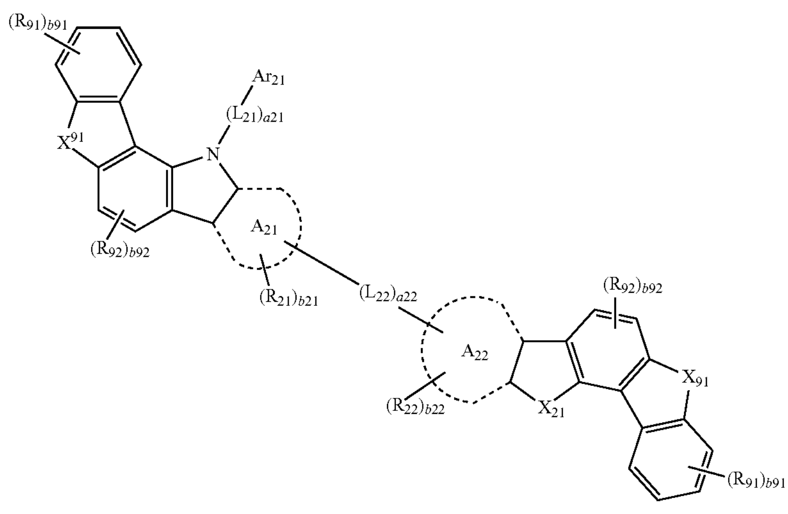

-continued
Formula 2-3A
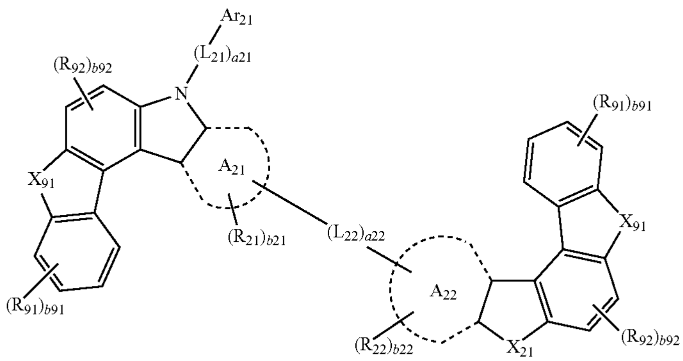
Formula 2-4A
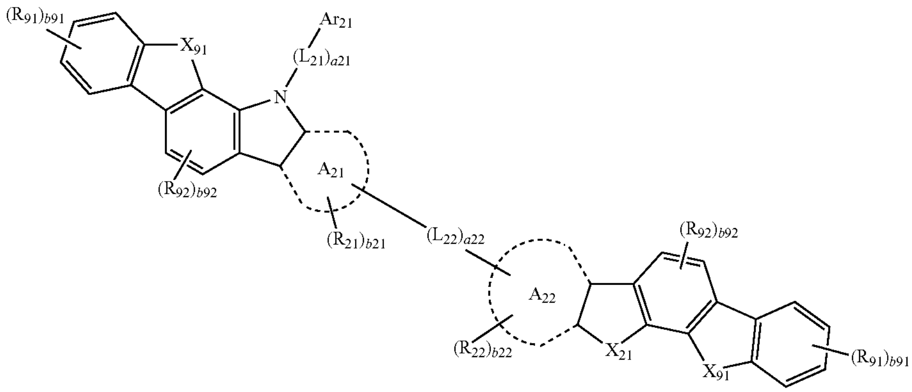
Formula 2-5A
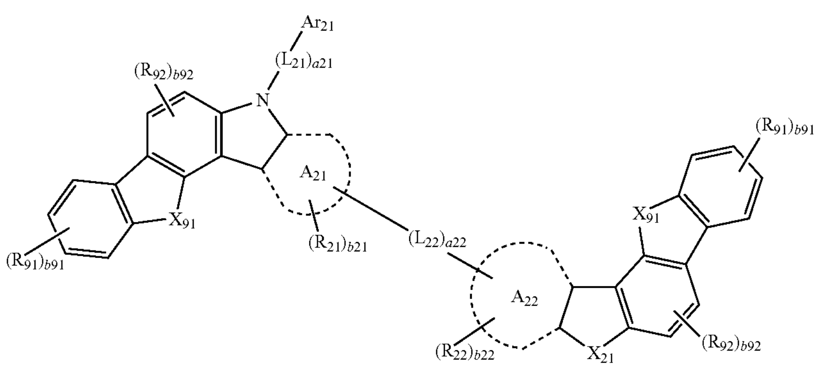
Formula 2-6A
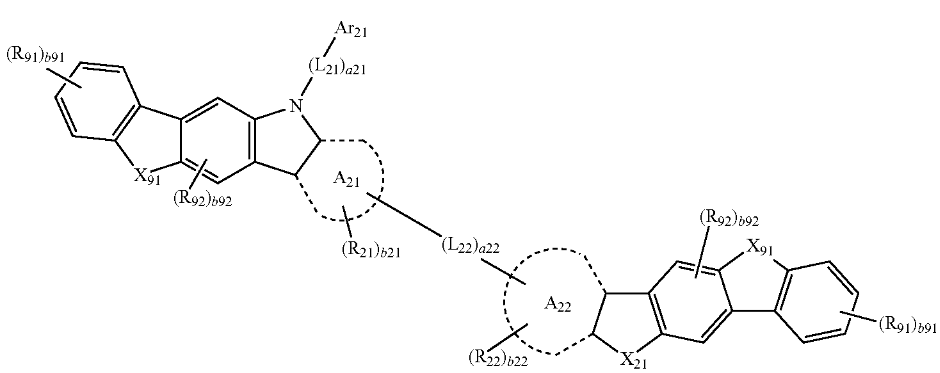

-continued
Formula 2-7A
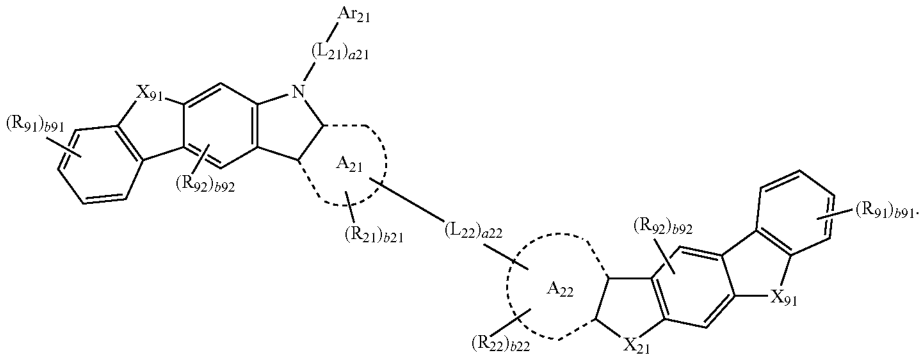
13. The organic light-emitting device of claim 1, wherein each of the first material and the second material is independently one of Compounds BF1 to BF13:
BF1
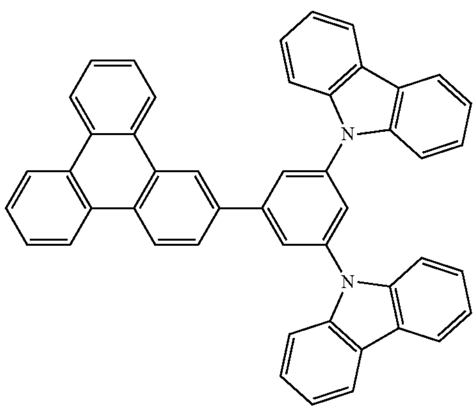
BF2
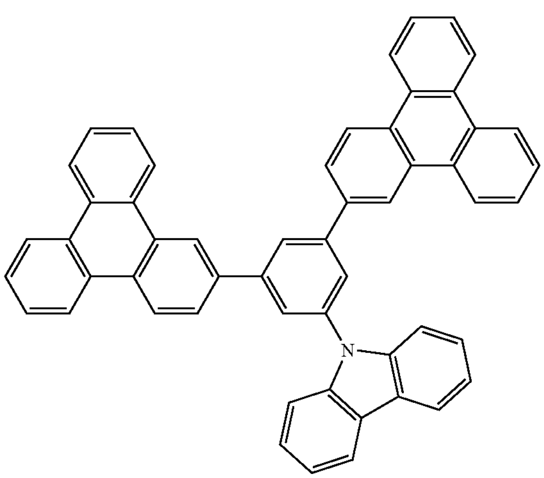
-continued
BF3
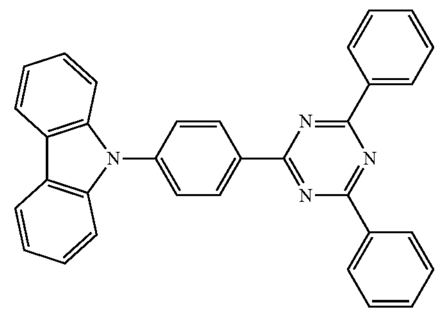
BF4
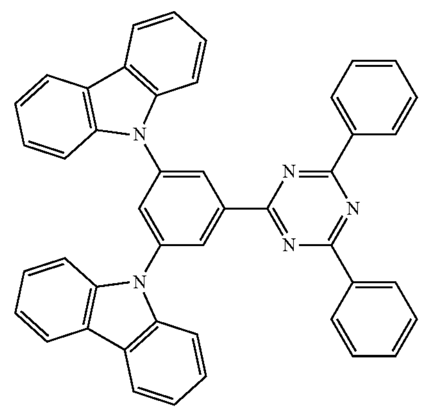
BF5
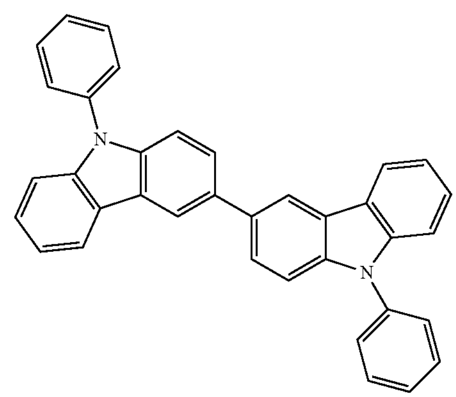

-continued
BF6
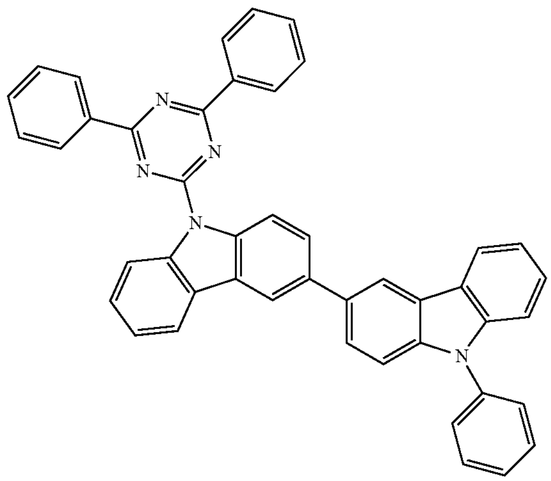
BF7
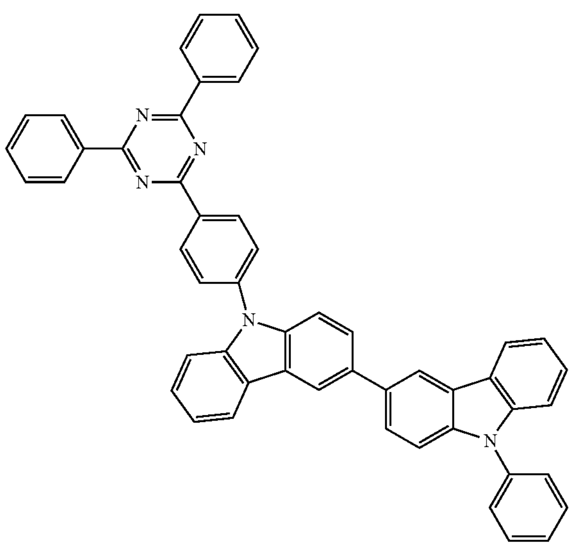
BF8
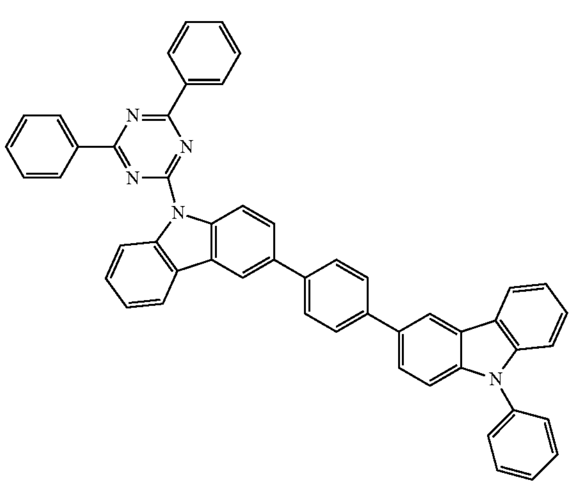
-continued
BF9
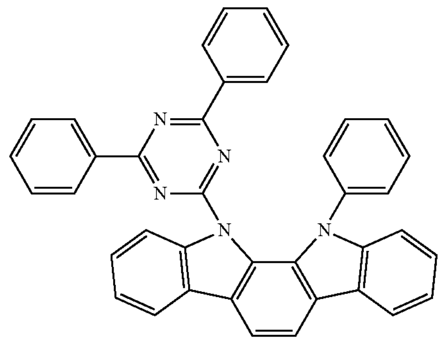
BF10
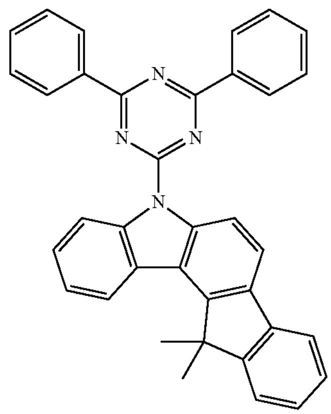
BF11
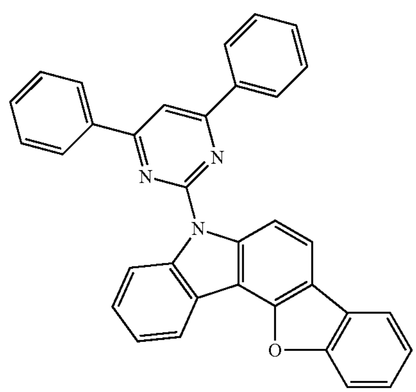
BF12
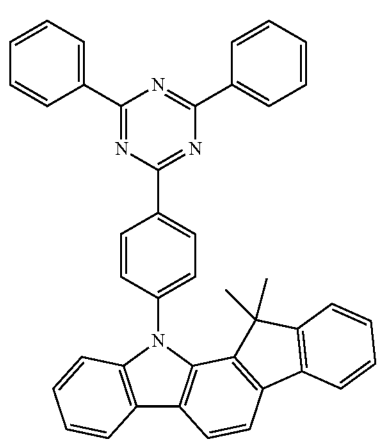

-continued

BF13

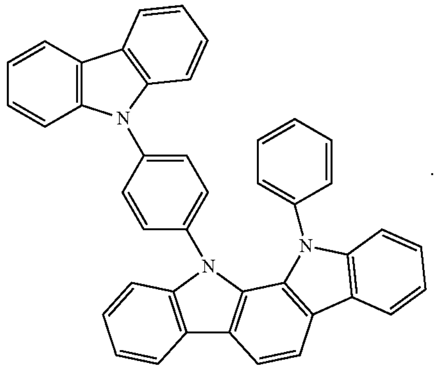

14. The organic light-emitting device of claim 1, wherein one of the first material and the second material is an electron transporting compound or a hole transporting compound.

15. The organic light-emitting device of claim 1, wherein each of the first material and the second material is independently an electron transporting compound or a hole transporting compound.

16. The organic light-emitting device of claim 1, wherein electron mobility of the first material or the second material is $10^{-7}$ to $10^{-3}$ $cm^2/Vs$.

17. The organic light-emitting device of claim 1, wherein a hole mobility of the first material or the second material is $10^{-7}$ to $10^{-3}$ $cm^2/Vs$.

18. The organic light-emitting device of claim 1, wherein an electron affinity $EA_1$ of the first material and an electron affinity $EA_2$ of the the second material satisfy Equation 1:

$$EA_1 < EA_2. \quad \text{Equation 1}$$

19. The organic light-emitting device of claim 1, wherein the emission layer comprises a host and a dopant, and a triplet energy $Eg_{DT2}$ of the dopant satisfies Equation 2:

$$Eg_{T1} > Eg_{DT2}. \quad \text{Equation 2}$$

20. The organic light-emitting device of claim 1, wherein the emission layer comprises a host and a dopant, and a triplet energy $Eg_{HT2}$ of the host satisfies Equation 3:

$$Eg_{T1} > Eg_{HT2}. \quad \text{Equation 3}$$

* * * * *